US009223215B2

(12) United States Patent
Yokokawa et al.

(10) Patent No.: US 9,223,215 B2
(45) Date of Patent: Dec. 29, 2015

(54) ACTINIC RAY-SENSITIVE OR RADIATION-SENSITIVE COMPOSITION, ACTINIC RAY-SENSITIVE OR RADIATION-SENSITIVE FILM USING THE SAME, PATTERN FORMING METHOD, MANUFACTURING METHOD OF ELECTRONIC DEVICE, ELECTRONIC DEVICE AND RESIN

(71) Applicant: FUJIFILM Corporation, Tokyo (JP)

(72) Inventors: Natsumi Yokokawa, Shizuoka (JP); Takeshi Kawabata, Shizuoka (JP); Hiroo Takizawa, Shizuoka (JP); Hideaki Tsubaki, Shizuoka (JP); Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/289,718

(22) Filed: May 29, 2014

(65) Prior Publication Data

US 2014/0272692 A1 Sep. 18, 2014

Related U.S. Application Data

(63) Continuation of application No. PCT/JP2012/081717, filed on Nov. 30, 2012.

(30) Foreign Application Priority Data

Nov. 30, 2011 (JP) ................................ 2011-263004

(51) Int. Cl.
*G03F 7/004* (2006.01)
*G03F 7/038* (2006.01)
(Continued)

(52) U.S. Cl.
CPC ................ *G03F 7/0388* (2013.01); *C08F 8/00* (2013.01); *C08F 212/00* (2013.01);
(Continued)

(58) Field of Classification Search
CPC ..... G03F 7/004; G03F 7/0045; G03F 7/0046; C09D 125/18; C08F 212/00; C08F 222/10
USPC .............. 430/270.1, 913; 526/287; 525/328.8
See application file for complete search history.

(56) References Cited

U.S. PATENT DOCUMENTS

2006/0177763 A1 8/2006 Matsuoka et al.
2007/0148584 A1 6/2007 Takeda et al.
(Continued)

FOREIGN PATENT DOCUMENTS

JP 09-179300 A 7/1997
JP 2000241975 A 9/2000
(Continued)

OTHER PUBLICATIONS

English language machine translation of JP 2004-348014 (no date).*
(Continued)

*Primary Examiner* — Amanda C Walke
(74) *Attorney, Agent, or Firm* — Sughrue Mion, PLLC

(57) ABSTRACT

There is provided an actinic ray-sensitive or radiation-sensitive composition comprising (P) a compound having a phenolic hydroxyl group and a group formed by substituting for the hydrogen atom in a phenolic hydroxyl group by a group represented by the specific formula, a resist film formed using the specific actinic ray-sensitive or radiation-sensitive composition, a pattern forming method containing steps of exposing and developing the resist film, a manufacturing method of an electronic device, containing the pattern forming method, and an electronic device manufactured by the specific manufacturing method of an electronic device.

16 Claims, 5 Drawing Sheets

(51) Int. Cl.

| | |
|---|---|
| ***C09D 125/18*** | (2006.01) |
| ***C08F 212/00*** | (2006.01) |
| ***C08F 222/10*** | (2006.01) |
| ***C08F 8/00*** | (2006.01) |
| ***G03F 7/039*** | (2006.01) |

(52) U.S. Cl.

CPC ........... *C08F 222/10* (2013.01); *C09D 125/18* (2013.01); *G03F 7/0045* (2013.01); *G03F 7/0046* (2013.01); *G03F 7/039* (2013.01); *G03F 7/0392* (2013.01); *G03F 7/0397* (2013.01)

(56) References Cited

U.S. PATENT DOCUMENTS

| | | | | |
|---|---|---|---|---|
| 2011/0159433 | A1* | 6/2011 | Takahashi et al. | 430/286.1 |
| 2011/0200940 | A1* | 8/2011 | Ichikawa et al. | 430/281.1 |
| 2011/0269074 | A1* | 11/2011 | Aqad et al. | 430/311 |
| 2012/0052443 | A1* | 3/2012 | Masuyama et al. | 430/281.1 |
| 2012/0070778 | A1* | 3/2012 | Ichikawa et al. | 430/270.1 |
| 2012/0172555 | A1* | 7/2012 | Coley et al. | 526/243 |
| 2012/0301817 | A1* | 11/2012 | Inasaki et al. | 430/5 |
| 2012/0301823 | A1* | 11/2012 | Prokopowicz et al. | 430/270.1 |
| 2013/0288180 | A1* | 10/2013 | Hatakeyama et al. | 430/285.1 |
| 2014/0162188 | A1* | 6/2014 | Hatakeyama et al. | 430/270.1 |
| 2014/0178820 | A1* | 6/2014 | Hatakeyama et al. | 430/285.1 |
| 2014/0212797 | A1* | 7/2014 | Kawabata et al. | 430/9 |
| 2014/0212810 | A1* | 7/2014 | Hatakeyama et al. | 430/285.1 |

FOREIGN PATENT DOCUMENTS

| | | | |
|---|---|---|---|
| JP | 2004-348014 | A | 12/2004 |
| JP | 2004348014 | A | * 12/2004 |
| JP | 2005-232396 | A | 9/2005 |
| WO | 2005023880 | A1 | 3/2005 |

OTHER PUBLICATIONS

International Search Report for PCT/JP2012/081717 [PCT/ISA/210]; issued Jan. 15, 2013.

Written Opinion for PCT/JP2012/081717 [PCT/ISA/237]; issued Jan. 15, 2013.

Communication issued Feb. 24, 2015, by the JPO in related Application No. 2012-261119.

* cited by examiner

ACTINIC RAY-SENSITIVE OR RADIATION-SENSITIVE COMPOSITION, ACTINIC RAY-SENSITIVE OR RADIATION-SENSITIVE FILM USING THE SAME, PATTERN FORMING METHOD, MANUFACTURING METHOD OF ELECTRONIC DEVICE, ELECTRONIC DEVICE AND RESIN

CROSS REFERENCE TO RELATED APPLICATION

This is a continuation of International Application No. PCT/JP2012/081717 filed on Nov. 30, 2012, and claims priority from Japanese Patent Application No. 2011-263004 filed on Nov. 30, 2011, the entire disclosures of which are incorporated therein by reference.

TECHNICAL FIELD

The present invention relates to an actinic ray-sensitive or radiation-sensitive composition, an actinic ray-sensitive or radiation-sensitive film using the same, a pattern forming method, a manufacturing method of an electronic device, an electronic device and a resin. More specifically, the present invention relates to an actinic ray-sensitive or radiation-sensitive composition suitably used for the ultramicrolithography process applicable to the production process of VLSI and a high-capacity microchip, the preparation process of a nanoimprint mold, the production process of a high-density information recording medium, and the like, and for other photofabrication processes, an actinic ray-sensitive or radiation-sensitive film using the same, a pattern forming method, a manufacturing method of an electronic device, an electronic device and a resin.

BACKGROUND ART

In the process of producing a semiconductor device such as IC and LSI, microfabrication by lithography using a photoresist composition has been conventionally performed. Recently, with increase in the integration degree of an integrated circuit, formation of an ultrafine pattern in the submicron or quarter-micron region is required. To cope with this requirement, the exposure wavelength also tends to become shorter, for example, from g line to i line or further to KrF excimer laser light. Furthermore, other than the excimer laser light, development of lithography using electron beam, X-ray or EUV light is proceeding at present.

In particular, the electron beam lithography is positioned as a next-generation or next-next-generation pattern formation technology, and a high-sensitivity and high-resolution positive resist is being demanded. Among others, elevation of the sensitivity is a very important task so as to shorten the wafer processing time, but in the positive resist for electron beam, there arises a problem that when elevation of the sensitivity is sought for, reduction of resolution is liable to occur.

In this way, high sensitivity is in a trade-off relationship with high resolution and further with good pattern profile, and it is very important how satisfy both of these at the same time.

Also in the lithography using X-ray or EUV light, it is similarly an important task to satisfy high sensitivity, high resolution and good pattern profile all at the same time, and this task needs to be solved.

In order to solve these problems, for example, in JP-A-9-179300 (the term "JP-A" as used herein means an "unexamined published Japanese patent application"), International Publication No. 2005/23880, JP-A-2005-232396 and JP-A-2004-348014, a resist composition using a resin having an acetal-type protective group is disclosed, and it is supposed that the resolution and sensitivity are improved by the composition.

However, more improvements are required in the resolution and sensitivity and furthermore, in terms of pattern profile and exposure latitude (EL).

SUMMARY OF INVENTION

An object of the present invention is to provide an actinic ray-sensitive or radiation-sensitive composition satisfying all of high resolution (e.g., high resolving power), high sensitivity, good pattern profile and good exposure latitude (EL) at the same time, an actinic ray-sensitive or radiation-sensitive film using the composition, a pattern forming method, a manufacturing method of an electronic device, an electronic device and a resin.

That is, the present invention is as follows.

[1] An actinic ray-sensitive or radiation-sensitive composition comprising (P) a compound having a phenolic hydroxyl group and a group formed by substituting for the hydrogen atom in a phenolic hydroxyl group by a group represented by the following formula (1):

(1)

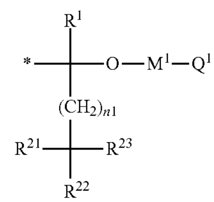

wherein $R^1$ represents a hydrogen atom or an alkyl group;

each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group;

at least two of $R^{21}$ to $R^{23}$ may combine with each other to form a ring, provided that it is not allowed to form a ring by combining at least one of $R^{21}$ to $R^{23}$ with $M^1$ or $Q^1$;

n1 represents an integer of 1 or more;

$M^1$ represents a single bond or a divalent linking group;

$Q^1$ represents an alkyl group, a cycloalkyl group, an aryl group or a heterocyclic group;

when $M^1$ is a divalent linking group, $Q^1$ may combine with $M^1$ through a single bond or another linking group to form a ring; and

* represents a bond to the oxygen atom in the phenolic hydroxyl group.

[2] The actinic ray-sensitive or radiation-sensitive composition as described in [1], wherein the compound (P) is a resin having a repeating unit represented by the following formula (2):

(2)

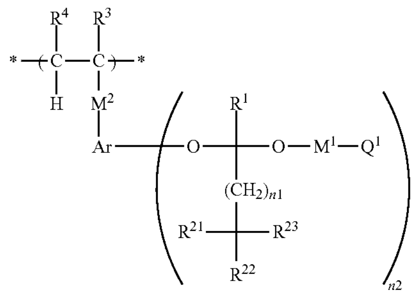

wherein $R^1$, $R^2$, $R^{22}$, $R^{23}$, $M^1$, $Q^1$ and n1 have the same meanings as $R^1$, $R^{21}$, $R^{22}$, $R^{23}$, $M^1$, $Q^1$ and n1 in formula (1), respectively, and each of at least two members of $R^{21}$ to $R^{23}$ independently represents an alkyl group, a cycloalkyl group, an aryl group, an aralkyl group or a heterocyclic group;

at least two of $R^{21}$ to $R^{23}$ may combine with each other to form a ring, provided that it is not allowed to form a ring by combining at least one of $R^{21}$ to $R^{23}$ with $M^1$ or $Q^1$;

when $M^1$ is a divalent linking group, $Q^1$ may combine with $M^1$ through a single bond or another linking group to form a ring;

$R^3$ represents a hydrogen atom or an alkyl group;

$R^4$ represents a hydrogen atom or an alkyl group, $R^4$ and $M^2$ or Ar may combine with each other to form a ring, and in this case, $R^4$ represents an alkylene group;

$M^2$ represents a single bond or a divalent linking group and in the case of combining with $R^4$ to form a ring, represents a trivalent linking group;

Ar represents a (n2+1)-valent aromatic ring group and in the case of combining with $R^4$ to form a ring, represents a (n2+2)-valent aromatic ring group;

n2 represents an integer of 1 to 5; and when n2 is an integer of 2 or more, each of n2 groups in the parenthesis may be the same as or different from every other group.

[3] The actinic ray-sensitive or radiation-sensitive composition as described in [1] or [2], wherein in formula (1), each of $R^{21}$ to $R^{23}$ independently an alkyl group.

[4] The actinic ray-sensitive or radiation-sensitive composition as described in any one of [1] to [3], wherein in formula (1), at least two of $R^{21}$ to $R^{23}$ combine with each other to form a ring or at least one of $R^{21}$ to $R^{23}$ is a cycloalkyl group.

[5] The actinic ray-sensitive or radiation-sensitive composition as described in any one of [1] to [4], wherein in formula (1), $R^1$ is a hydrogen atom.

[6] The actinic ray-sensitive or radiation-sensitive composition as described in any one of [1] to [5], wherein in formula (1), n1 is 1.

[7] The actinic ray-sensitive or radiation-sensitive composition as described in any one of [1] to [6], wherein in formula (1), the group represented by $-M^1-Q^1$ is an unsubstituted alkyl group, a cycloalkyl group-substituted alkyl group, a cycloalkyl group, an aralkyl group, an aryloxyalkyl group or a heterocyclic group.

[8] The actinic ray-sensitive or radiation-sensitive composition as described in any one of [1] to [7], wherein the compound (P) is a resin having a repeating unit represented by the following formula (5) or (6):

(5)

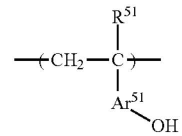

(6)

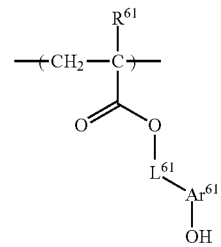

wherein each of $R^{51}$ and $R^{61}$ independently represents a hydrogen atom or a methyl group, each of $Ar^{51}$ and $Ar^{61}$ independently represents an arylene group, and $L^{61}$ represents a single bond or an alkylene group.

[9] The actinic ray-sensitive or radiation-sensitive composition as described in any one of [1] to [8], wherein the compound (P) further contains a non-decomposable repeating unit represented by the following formula (3):

(3)

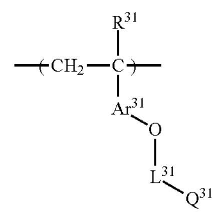

wherein $R^{31}$ represents a hydrogen atom or a methyl group, $Ar^{31}$ represents an arylene group, $L^{31}$ represents a single bond or a divalent linking group, and $Q^{31}$ represents a cycloalkyl group or an aryl group.

[10] The actinic ray-sensitive or radiation-sensitive composition as described in any one of [1] to [9], wherein the compound (P) is a resin further containing a repeating unit represented by the following formula (4):

(4)

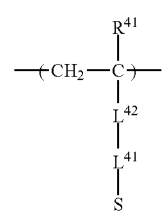

wherein $R^{41}$ represents a hydrogen atom or a methyl group, $L^{41}$ represents a single bond or a divalent linking group, $L^{42}$ represents a divalent linking group, and S represents a structural moiety capable of decomposing upon irradiation with an actinic ray or radiation to generate an acid on the side chain.

[11] A resist film formed using the actinic ray-sensitive or radiation-sensitive composition as described in any one of [1] to [10].

[12] A pattern forming method comprising steps of exposing and developing the resist film as described in [11].

[13] A manufacturing method of an electronic device, comprising the pattern forming method as described in [12].

[14] An electronic device manufactured by the manufacturing method of an electronic device as described in [13].

[15] A resin having a repeating unit represented by the following formula (2A) and a repeating unit represented by the following formula (5A):

(5A)

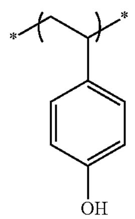

(2A)

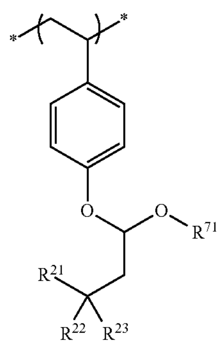

wherein in formula (2A), each of $R^{21}$ to $R^{23}$ independently represents a hydrogen atom, an alkyl group, a cycloalkyl group, an aryl group, an aralkyl group or a heterocyclic group, each of at least two members of $R^{21}$ to $R^{23}$ independently represents an alkyl group, a cycloalkyl group, an aryl group, an aralkyl group or a heterocyclic group, at least two of $R^{21}$ to $R^{23}$ may combine with each other to form a ring, provided that it is not allowed to form a ring by combining at least one of $R^{21}$ to $R^{23}$ with $R^{71}$, and $R^{71}$ represents an unsubstituted alkyl group, a cycloalkyl group-substituted alkyl group, a cycloalkyl group, an aralkyl group, an aryloxyalkyl group or a heterocyclic group.

The present invention preferably further includes the following configurations.

[16] The actinic ray-sensitive or radiation-sensitive composition as described in any one of [1] to [10] above, further containing a compound capable of generating an acid upon irradiation with an actinic ray or radiation.

[17] The actinic ray-sensitive or radiation-sensitive composition as described in any one of [1] to [10] and [16] above, further containing a basic compound.

[18] The actinic ray-sensitive or radiation-sensitive composition as described in any one of [1] to [10], [16] and [17] above, further containing a solvent.

[19] The actinic ray-sensitive or radiation-sensitive composition as described in any one of [1] to [10] and [16] to [18] above, further containing a surfactant.

[20] The actinic ray-sensitive or radiation-sensitive composition as described in any one of [1] to [10] and [16] to [19] above, wherein the exposure is exposure to KrF excimer laser light, EUV light or an electron beam.

According to the present invention, an actinic ray-sensitive or radiation-sensitive composition satisfying all of high resolution (e.g., high resolving power), high sensitivity, good pattern profile and good exposure latitude (EL) at the same time, an actinic ray-sensitive or radiation-sensitive film using the composition, a pattern forming method, a manufacturing method of an electronic device, an electronic device and a resin, can be provided.

DESCRIPTION OF EMBODIMENTS

Figure 1:
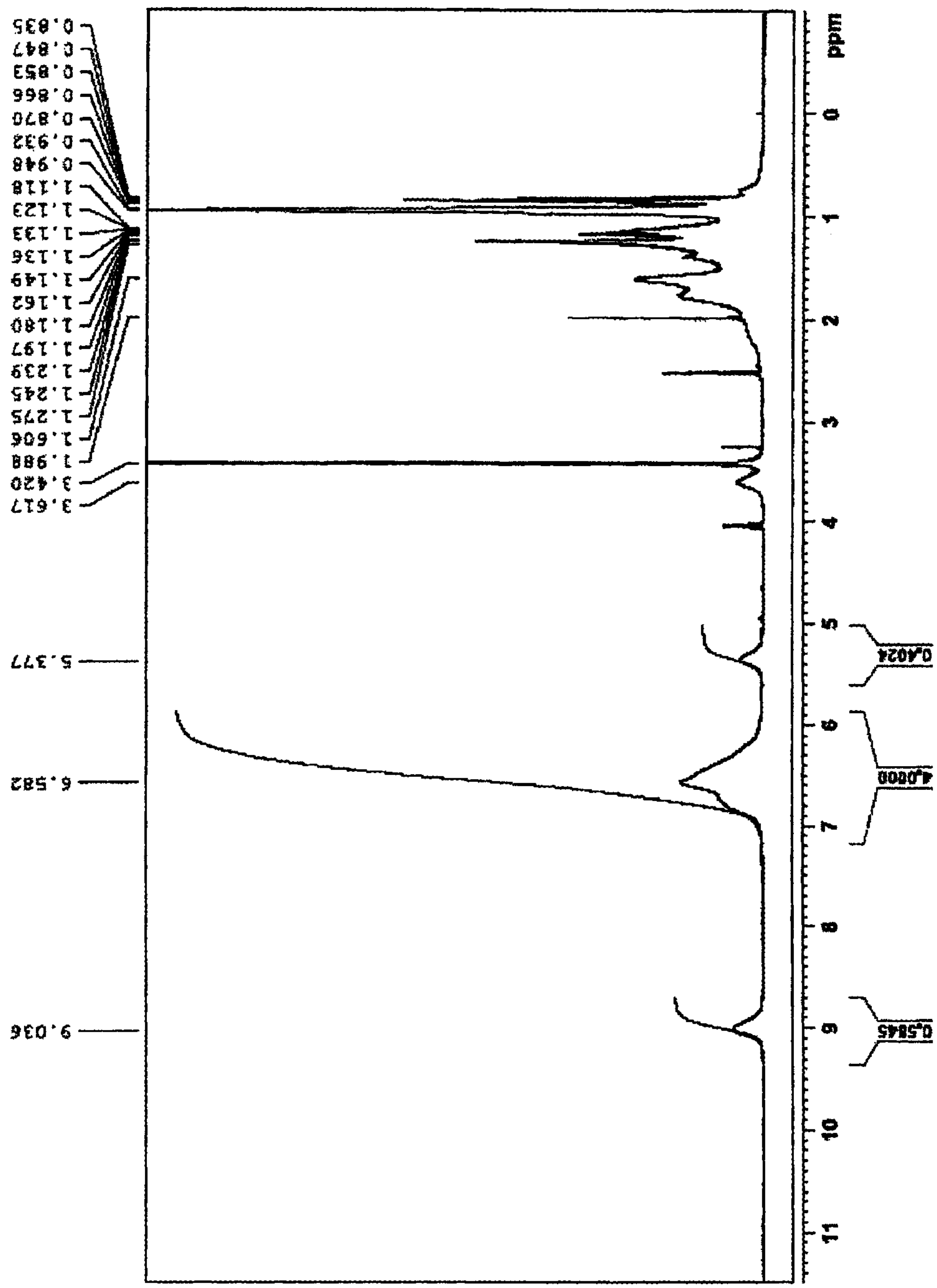
FIG. 1 is a view showing a $^{1}$H-NMR chart of Resin (P-3) synthesized in Example.

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" with no designation of substituted or unsubstituted encompasses not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam (EB). Also, in the present invention, the "light" means an actinic ray or radiation.

Furthermore, in the description of the present invention, unless otherwise indicated, the "exposure" encompasses not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive composition according to the present invention is, for example, a positive composition and is typically a positive resist composition. The configuration of this composition is described below.

[1] Compound (P)

The actinic ray-sensitive or radiation-sensitive composition of the present invention contains (P) a compound having a phenolic hydroxyl group and a group formed by substituting for the hydrogen atom in a phenolic hydroxyl group by a group represented by the following formula (1):

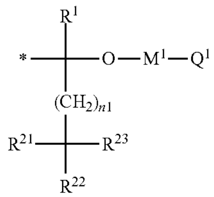

(1)

In formula (1), $R^1$ represents a hydrogen atom or an alkyl group.

Each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group.

At least two of $R^{21}$ to $R^{23}$ may combine with each other to form a ring, provided that it is not allowed to form a ring by combining at least one of $R^{21}$ to $R^{23}$ with $M^1$ or $Q^1$.

n1 represents an integer of 1 or more.

$M^1$ represents a single bond or a divalent linking group.

$Q^1$ represents an alkyl group, a cycloalkyl group, an aryl group or a heterocyclic group.

When $M^1$ is a divalent linking group, $Q^1$ may combine with $M^1$ through a single bond or another linking group to form a ring.

* represents a bond to the oxygen atom in the phenolic hydroxyl group.

The compound (P) having a group formed by substituting for the hydrogen atom in a phenolic hydroxyl group by a group represented by formula (1) is a compound having a structure where a phenolic hydroxyl group as an alkali-soluble group is protected by a group capable of decomposing and leaving by the action of an acid, and this is a compound capable of increasing the solubility for an alkali developer by the action of an acid (acid-decomposable compound).

Thanks to the configuration where the actinic ray-sensitive or radiation-sensitive composition of the present invention contains (P) a compound having a phenolic hydroxyl group and a group formed by substituting for the hydrogen atom in a phenolic hydroxyl group by a group represented by formula (1), all of high resolution (e.g., high resolving power), high sensitivity, good pattern profile and good exposure latitude (EL) can be satisfied at the same time. The reason therefor is not clearly known but is presumed as follows.

As described above, the group represented by —$C(R^{21})(R^{22})(R^{23})$ in formula (1) requires each of at least two members of $R^{21}$ to $R^{23}$ to independently represent an alkyl group, a cycloalkyl group, an aryl group, an aralkyl group or a heterocyclic group and at the same time, allows at least two of $R^{21}$ to $R^{23}$ to combine with each other and form a ring. That is, the group represented by —$C(R^{21})(R^{22})(R^{23})$ has a branched structure or a cyclic structure.

Therefore, as compared with the case where the group represented by —$C(R^{21})(R^{22})(R^{23})$ has a linear structure, the group represented by —$C(R^{21})(R^{22})(R^{23})$ in the present invention has a bulky structure, and the glass transition temperature (Tg) of the compound (P) having this group is high. This is considered to be responsible for the fact that when a resist composition containing the compound (P) is used, in the formation of a fine line pattern, a line is less likely to be broken and the resolution is enhanced.

Also, in formula (1), n1 in the group represented by —$(CH_2)_{n1}$— is an integer of 1 or more. Accordingly, although the carbon atom capable of reacting with an acid generated from an acid generator in the exposed area (that is, the carbon atom connected to $R^1$) is connected to the above-described bulky structure, at least one non-bulky methylene group intervenes between the carbon atom and the bulky structure, as a result. contact of the acid with the above-described carbon atom is facilitated and the reaction by the acid can efficiently proceed. This is considered to contribute to not only elevating the sensitivity but also improving the pattern profile and the resolution.

Furthermore, the above-described high efficiency of the reaction by the acid is considered to lead to reducing the dependency on the exposure dose change when forming a pattern having a desired profile and in turn, to realizing excellent exposure latitude.

In formula (1), the alkyl group of $R^1$ is preferably an alkyl group having a carbon number of 1 to 10, more preferably an alkyl group having a carbon number of 1 to 5, still more preferably an alkyl group having a carbon number of 1 to 3, yet still more preferably an alkyl group having a carbon number of 1 or 2 (that is, a methyl group or an ethyl group). Specific examples of the alkyl group of $R^1$ include a methyl group, an ethyl group, an n-propyl group, an isopropyl group, an n-butyl group, an isobutyl group, a sec-butyl group, and a tert-butyl group.

$R^1$ is preferably a hydrogen atom or an alkyl group having a carbon number of 1 to 5, more preferably a hydrogen atom or an alkyl group having a carbon number of 1 to 3, still more preferably a hydrogen atom, a methyl group or an ethyl group, yet still more preferably a hydrogen atom.

The alkyl group of $R^{21}$ to $R^{23}$ is preferably an alkyl group having a carbon number of 1 to 15, more preferably an alkyl group having a carbon number of 1 to 10, still more preferably an alkyl group having a carbon number of 1 to 6. Specific examples of the alkyl group or $R^{21}$ to $R^{23}$ include a methyl group, an ethyl group, a propyl group, an isopropyl group, an n-butyl group, a sec-butyl group, a tert-butyl group, a neopentyl group, a hexyl group, a 2-ethylhexyl group, an octyl group, and a dodecyl group. The alkyl group of $R^{21}$ to $R^{23}$ is preferably a methyl group, an ethyl group, a propyl group, an isopropyl group or a tert-butyl group.

As described above, each of at least two members of $R^{21}$ to $R^{23}$ independently represents an alkyl group, a cycloalkyl group, an aryl group, an aralkyl group or a heterocyclic group, and it is preferred that all of $R^{21}$ to $R^{23}$ represent an alkyl group, a cycloalkyl group, an aryl group, an aralkyl group or a heterocyclic group.

The cycloalkyl group of $R^{21}$ to $R^{23}$ may be monocyclic or polycyclic and is preferably a cycloalkyl group having a carbon number of 3 to 15, more preferably a cycloalkyl group having a carbon number of 3 to 10, still more preferably a cycloalkyl group having a carbon number of 3 to 6. Specific examples of the cycloalkyl group of $R^{21}$ to $R^{23}$ include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of $R^{21}$ to $R^{23}$ is preferably a cyclopropyl group, a cyclopentyl group or a cyclohexyl group.

The aryl group of $R^{21}$ to $R^{23}$ is preferably an aryl group having a carbon number of 6 to 15, more preferably an aryl group having a carbon number of 6 to 12, and contains a structure where a plurality of aromatic rings are connected to each other through a single bond (for example, a biphenyl group or a terphenyl group). Specific examples of the aryl group of $R^{21}$ to $R^{23}$ include a phenyl group, a naphthyl group, an anthranyl group, a biphenyl group, and a terphenyl group. The aryl group of $R^{21}$ to $R^{23}$ is preferably a phenyl group, a naphthyl group or a biphenyl group.

The aralkyl group of $R^{21}$ to $R^{23}$ is preferably an aralkyl group having a carbon number of 6 to 20, more preferably an aralkyl group having a carbon number of 7 to 12. Specific examples of the aralkyl group of $R^{21}$ to $R^{23}$ include a benzyl group, a phenethyl group, a naphthylmethyl group, and a naphthylethyl group.

The heterocyclic group of $R^{21}$ to $R^{23}$ is preferably a heterocyclic group having a carbon number of 6 to 20, more preferably a heterocyclic group having a carbon number of 6 to 12. Specific examples of the heterocyclic group of $R^{21}$ to $R^{23}$ include a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

The alkyl group as $R^1$ and the alkyl group, cycloalkyl group, aryl group, aralkyl group and heterocyclic group as $R^{21}$ to $R^{23}$ may further have a substituent.

Examples of the substituent which the alkyl group as $R^1$ and $R^{21}$ to $R^{23}$ may further have include a cycloalkyl group, an aryl group, an amino group, an amido group, an ureido group, a urethane group, a hydroxy group, a carboxy group, a halogen atom, an alkoxy group, an aralkyloxy group, a thioether group, an acyl group, an acyloxy group, an alkoxycarbonyl group, a cyano group, and a nitro group.

Examples of the substituent which the cycloalkyl group as $R^{21}$ to $R^{23}$ may further have include an alkyl group and the groups described above as specific examples of the substituent which may be further substituted on the alkyl group.

Incidentally, each of the carbon number of the alkyl group and the carbon number of the substituent which the cycloalkyl group may further have is preferably from 1 to 8.

Examples of the substituent which the aryl group, aralkyl group and heterocyclic group as $R^{21}$ to $R^{23}$ may further have include a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

At least two of $R^{21}$ to $R^{23}$ may together form a ring.

In the case where at least two of $R^{21}$ to $R^{23}$ combine with each other to form a ring, examples of the ring formed include a cyclopentane ring, a cyclohexane ring, an adamantane ring, a norbornene ring, and a norbornane ring. These rings may have a substituent, and examples of the substituent which may be substituted on the ring include an alkyl group and the groups described above as specific examples of the substituent which the alkyl group may further have.

In the case where all of $R^{21}$ to $R^{23}$ combine with each other to form a ring, examples of the ring formed include an adamantane ring, a norbornane ring, a norbornene ring, a bicyclo[2,2,2]octane ring, and a bicyclo[3,1,1]heptane ring. Among these, an adamantane ring is preferred. These rings may have a substituent, and examples of the substituent which may be substituted on the ring include an alkyl group and the groups described above as specific examples of the substituent which the alkyl group may further have.

From the standpoint that the compound (P) can have a high glass transition temperature and the resolution can be enhanced, it is preferred that each of $R^{21}$ to $R^{23}$ is independently an alkyl group.

Furthermore, from the standpoint that the compound (P) can have a high glass transition temperature and the resolution can be enhanced, at least two of $R^{21}$ to $R^{23}$ preferably combine with each other to form a ring or at least one of $R^{21}$ to $R^{23}$ is preferably a cycloalkyl group, and it is more preferred that all of $R^{21}$ to $R^{23}$ combine with each other to form a ring.

The carbon number of the group represented by —C($R^{21}$)($R^{22}$)($R^{23}$) in formula (1) is preferably 15 or less. By satisfying this range, the resist film obtained can exhibit sufficient affinity for a developer, and the exposed area can be more reliably removed with a developer (that is, adequate developability can be obtained).

Also, for the reason that one of performances required of the resist performance is a performance of causing little gas generation during exposure (so-called outgas performance) and as the boiling point of an aldehyde compound or alcohol compound that is a compound (deprotection product) caused to leave from the compound by an acid is higher, the performance above tends to become better, the carbon number of the group represented by —C($R^{21}$)($R^{22}$)($R^{23}$, is preferably 7 or more.

Specific examples of the group represented by —C($R^{21}$)($R^{22}$)($R^{23}$) are illustrated below, but the present invention is not limited thereto. In specific examples, * indicates a bond to the group represented by —$(CH_2)_{n1}$— in formula (1).

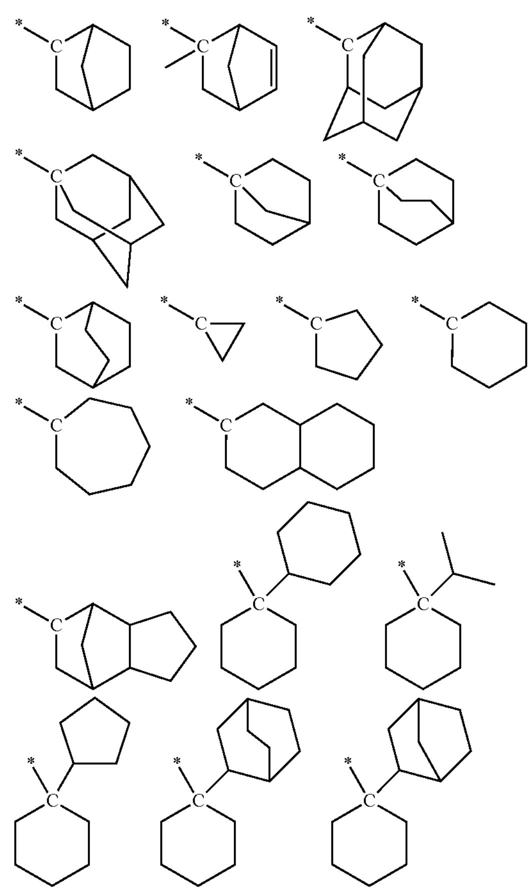

-continued

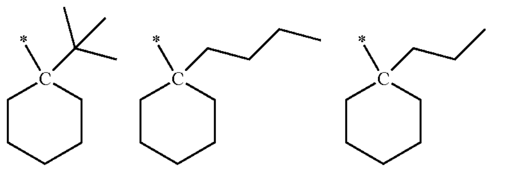

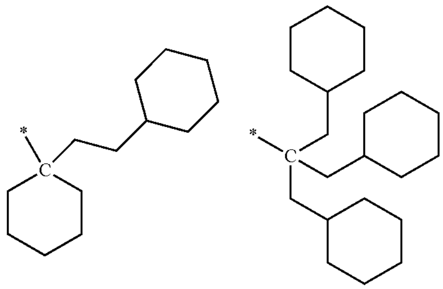

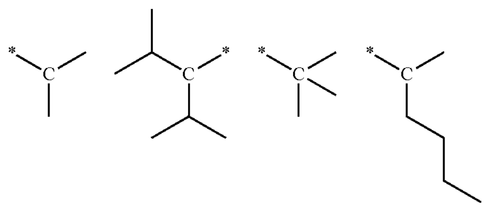

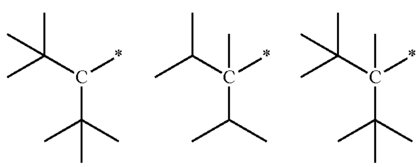

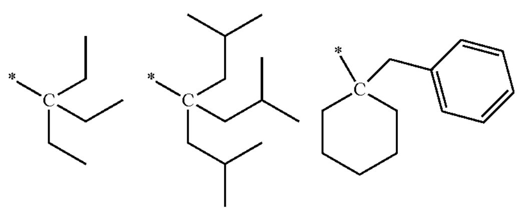

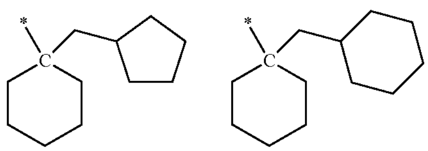

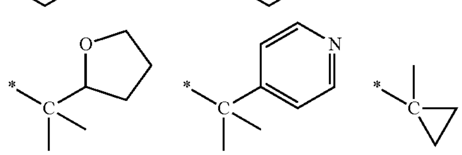

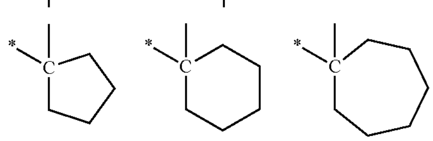

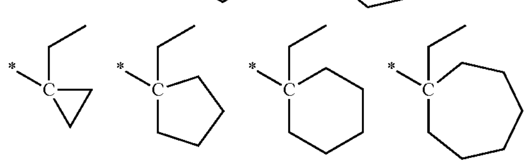

-continued

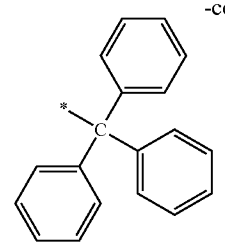

The divalent linking group as $M^1$ is, for example, an alkylene group (preferably an alkylene group having a carbon number of 1 to 8, such as methylene group, ethylene group, propylene group, butylene group, hexylene group or octylene group), a cycloalkylene group (preferably a cycloalkylene group having a carbon number of 3 to 15, such as cyclopentylene group or cyclohexylene group), —S—, —O—, —CO—, —CS—, $—SO_2—$, $—N(R_0)—$, or a combination of two or more thereof, and a linking group having a total carbon number of 20 or less is preferred. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group, and an octyl group).

n1 preferably represents an integer of 1 to 5, more preferably an integer of 1 to 3, still more preferably 1 or 2, yet still more preferably 1, and by satisfying this range, the resolution can be more enhanced.

$M^1$ is preferably a single bond, an alkylene group or a divalent linking group formed by a combination of an alkylene group and at least one of —O—, —CO—, —CS— and $—N(R_0)—$, more preferably a single bond, an alkylene group or a divalent linking group formed by a combination of an alkylene group and —O—. Here, $R_0$ has the same meaning as $R_0$ above.

$M^1$ may further have a substituent, and examples of the substituent which $M^1$ may further have are the same as those of the substituent which the alkyl group of $R^{21}$ above may have.

Specific examples and preferred examples of the alkyl group as $Q^1$ are the same, for example, as those described for the alkyl group of $R^{21}$ above.

The cycloalkyl group as $Q^1$ may be monocyclic or polycyclic. The carbon number of the cycloalkyl group is preferably from 3 to 10. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[$6.2.1.1^{3,6}.0^{2,7}$]dodecyl group, a 8-tricyclo[$5.2.1.0^{2,6}$]decyl group, and a 2-bicyclo[2.2.1]heptyl group. Among these, a cyclopentyl group, a cyclohexyl group, a 2-adamantyl group, a 8-tricyclo[$5.2.1.0^{2,6}$]decyl group and a 2-bicyclo[2.2.1]heptyl group are preferred.

Specific examples and preferred examples of the aryl group as $Q^1$ are the same, for example, as those described for the aryl group of $R^{21}$ above.

Specific examples and preferred examples of the heterocyclic group as $Q^1$ are the same, for example, as those described for the heterocyclic group of $R^{21}$ above.

The alkyl group, cycloalkyl group, aryl group and heterocyclic group as $Q^1$ may have a substituent, and examples of the substituent include an alkyl group, a cycloalkyl group, a cyano group, a halogen atom, a hydroxyl group, an alkoxy group, a carboxyl group, and an alkoxycarbonyl group.

The group represented by $-M^1-Q^1$ is preferably an unsubstituted alkyl group, a cycloalkyl group-substituted alkyl group, a cycloalkyl group, an aralkyl group, an aryloxyalkyl group or a heterocyclic group. Specific examples and preferred examples of the unsubstituted alkyl group as the group represented by $-M^1-Q^1$, the "cycloalkyl group" and the cycloalkyl group in the "cycloalkyl group-substituted alkyl group" as the group represented by $-M^1-Q^1$, and the aryl group in the "aralkyl group (arylalkyl group)" and "aryloxyalkyl group" as the group represented by $-M^1-Q^1$ are the same as those described for the alkyl group, the cycloalkyl group and the aryl group of $Q^1$, respectively.

Specific examples and preferred examples of the alkyl moiety in the "cycloalkyl group-substituted alkyl group", "aralkyl group (arylalkyl group)" and "aryloxyalkyl group" as the group represented by $-M^1-Q^1$ are the same as those described for the alkylene group of $M^1$.

Specific examples and preferred examples of the heterocyclic group as the group represented by $-M^1-Q^1$ are the same as those described for the heterocyclic group of $Q^1$.

Specific examples of the group represented by $-M^1-Q^1$ include a methyl group, an ethyl group, an isopropyl group, a cyclopentyl group, a cyclohexyl group, a cyclohexylethyl group, a 2-adamantyl group, a 8-tricyclo[5.2.1.$0^{2,6}$]decyl group, a 2-bicyclo[2.2.1]heptyl group, a benzyl group, a 2-phenethyl group, and a 2-phenoxyethylene group.

Also, as described above, when $M^1$ is a divalent linking group, $Q^1$ may combine with $M^1$ through a single bond or another linking group to form a ring. The another linking group includes an alkylene group (preferably an alkylene group having a carbon number of 1 to 3), and the ring formed is preferably a 5- or 6-membered ring.

Specific examples of the group represented by $-M^1-Q^1$ are illustrated below, but the present invention is not limited thereto. In specific examples, * indicates a bond to the oxygen atom in formula (1), Me stands for a methyl group, Et stands for an ethyl group, and Pr stands for an n-propyl group.

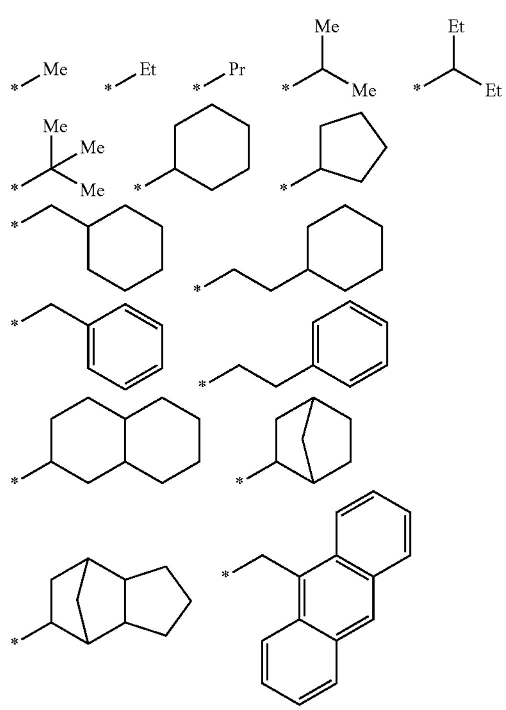

-continued

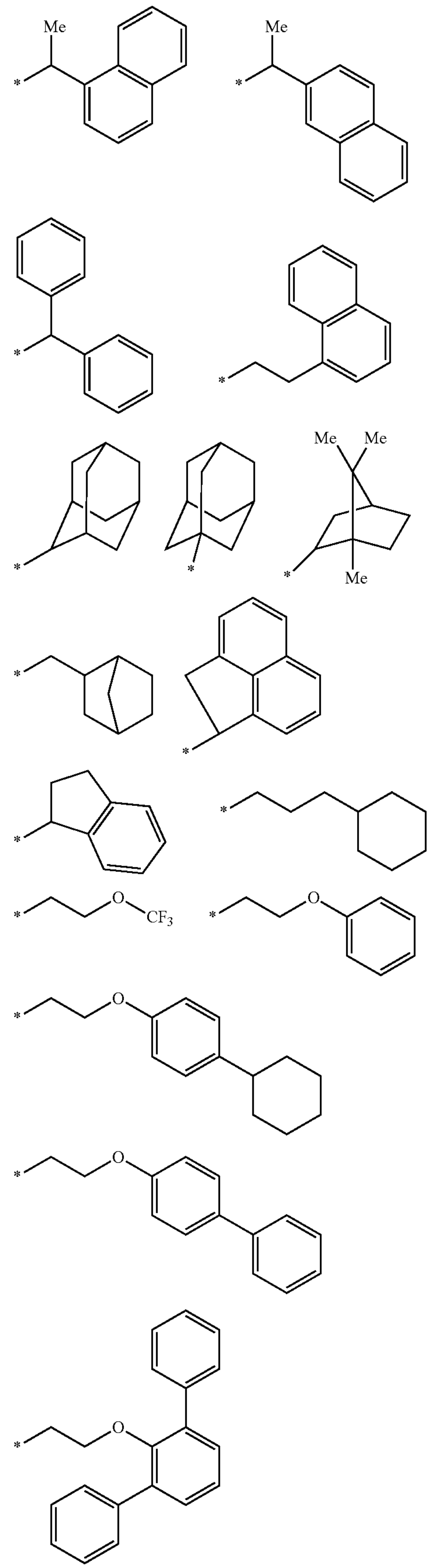

-continued
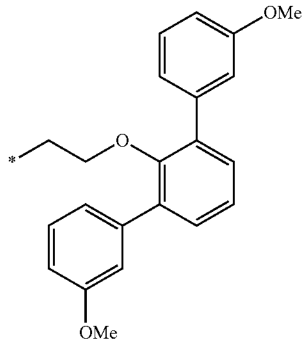
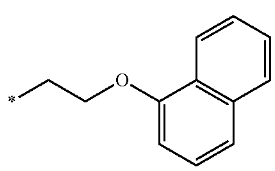
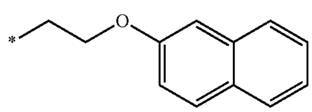
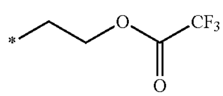
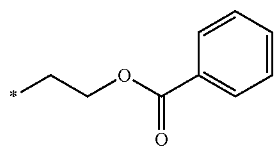
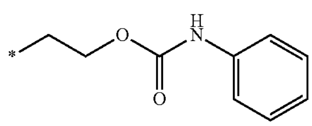
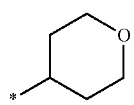
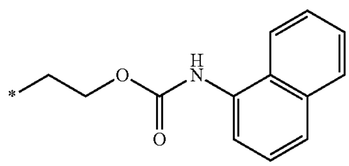
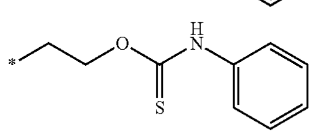
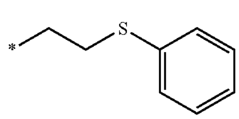
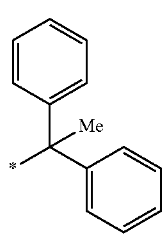
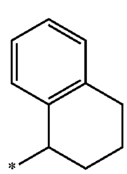
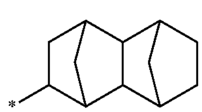
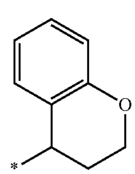
-continued
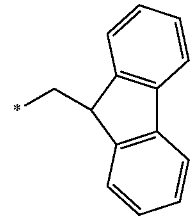
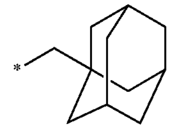
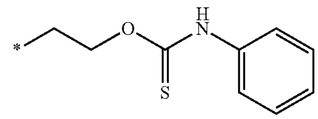
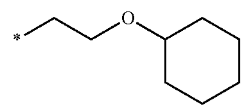
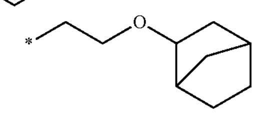
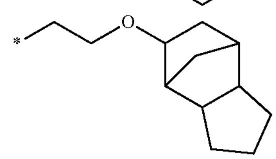
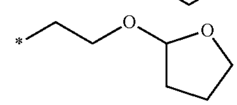
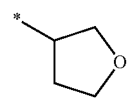
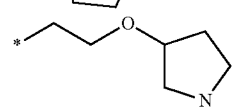
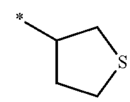
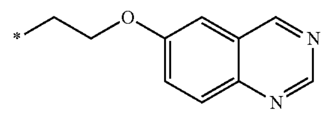
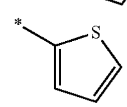
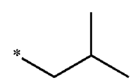
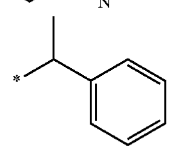
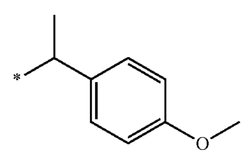
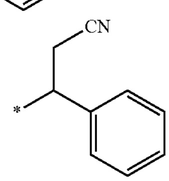
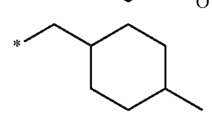
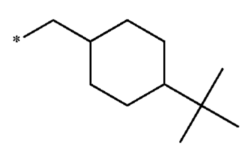
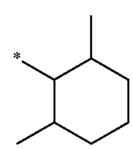
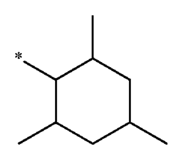
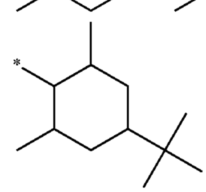
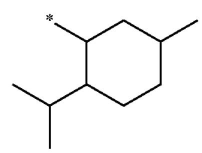
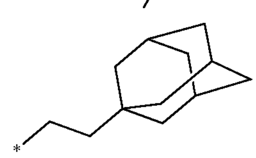
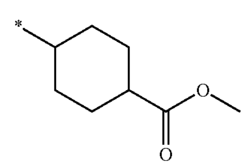

-continued

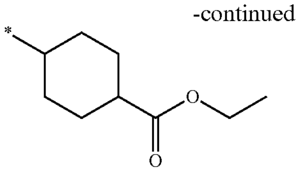

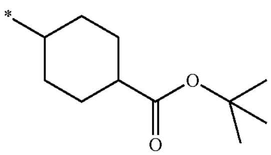

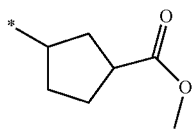

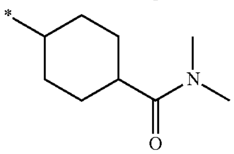

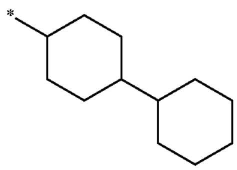

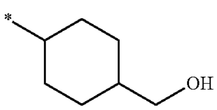

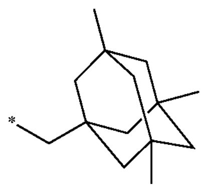

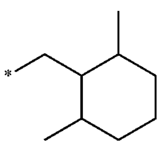

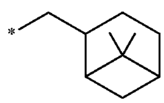

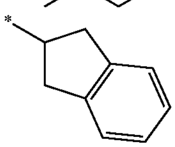

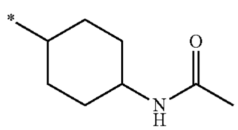

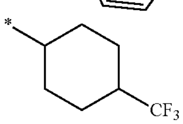

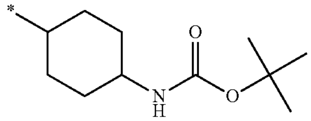

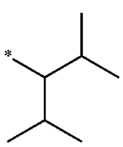

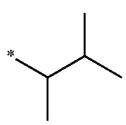

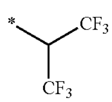

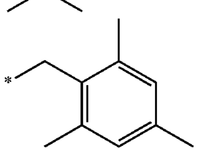

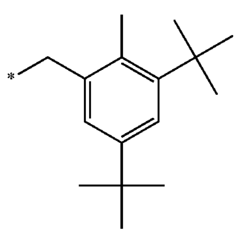

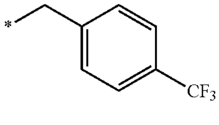

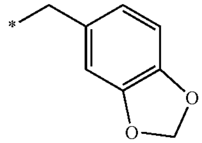

Furthermore, as described above, it is not allowed to form a ring by combining at least one of $R^{21}$ to $R^{23}$ with $M^1$ or $Q^1$, because the effects of the present invention cannot be provided. Specifically, the structures shown below are not encompassed by formula (1). As to the reason therefor, it is presumed that in the following structures, an alkyl group extending from the carbon atom sandwiched between two oxygen atoms is fixed as a ring structure and this prevents the glass transition temperature of the compound from becoming as high as providing the effects of the present invention.

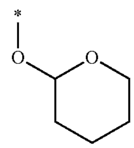

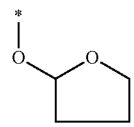

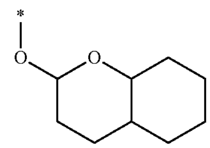

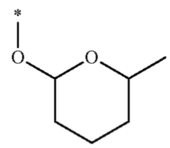

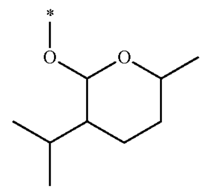

Specific examples of the group represented by formula (1) are illustrated below, but the present invention is not limited thereto. In the following specific examples, * indicates a bond to the oxygen atom in a phenolic hydroxyl group.

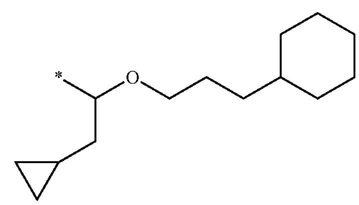

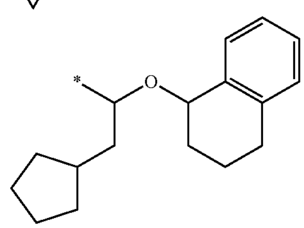

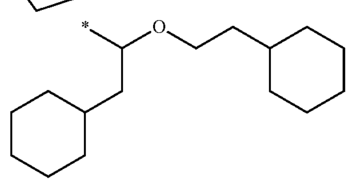

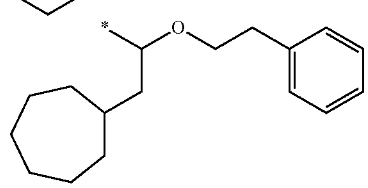

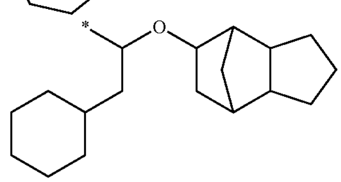

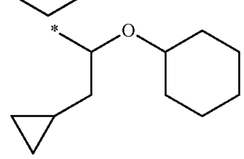

-continued
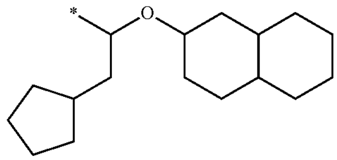
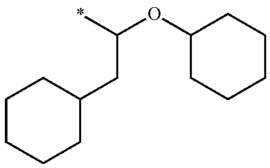
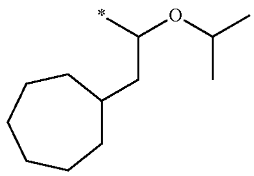
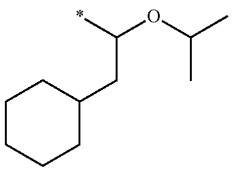
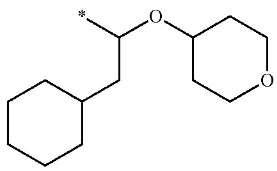
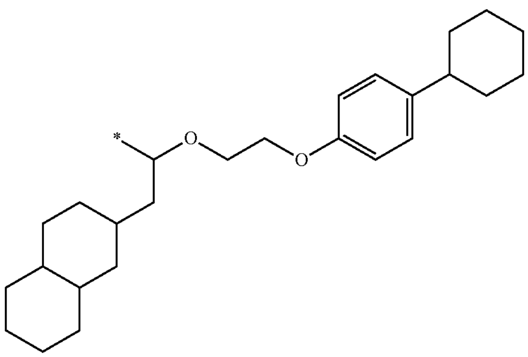
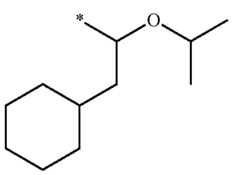
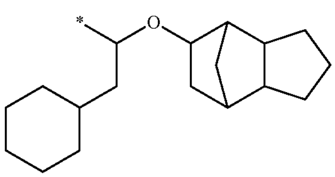
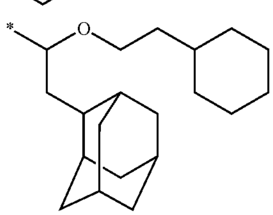
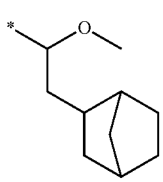
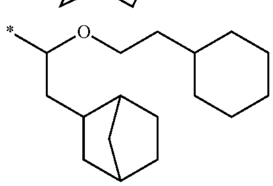
-continued
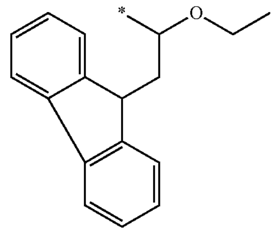
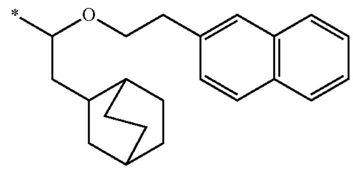
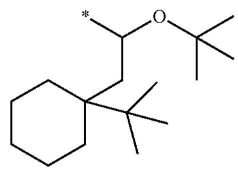
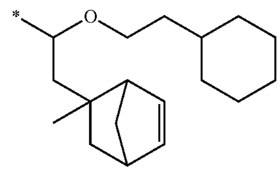
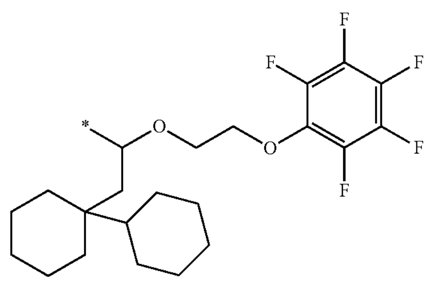
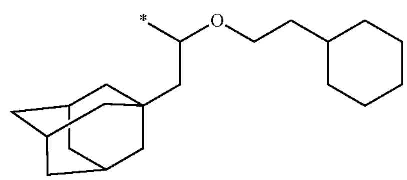
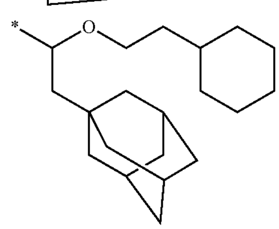
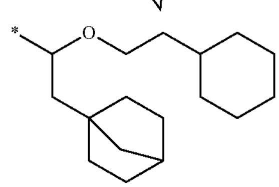
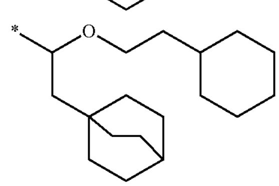

-continued
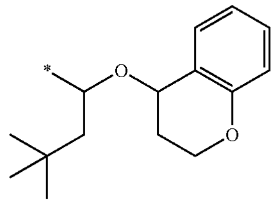
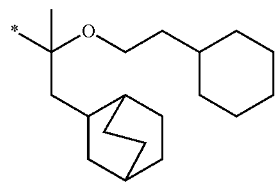
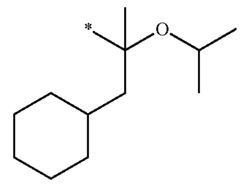
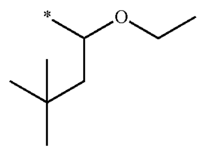
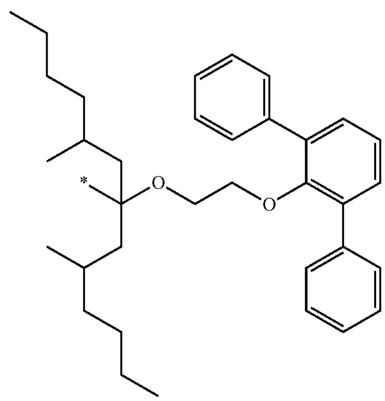
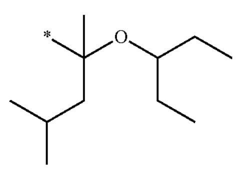
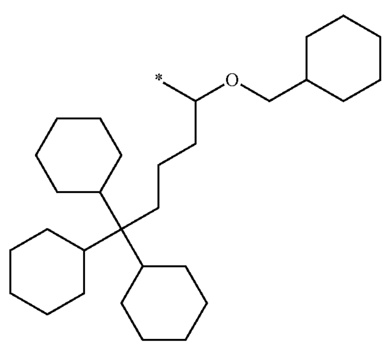
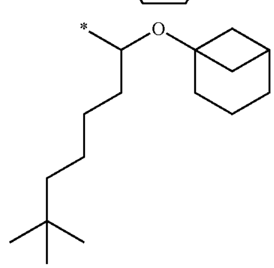
-continued
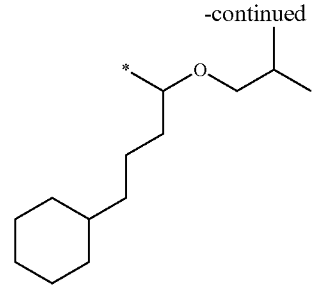
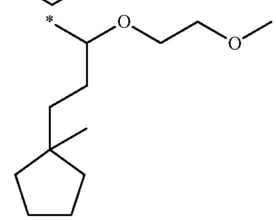
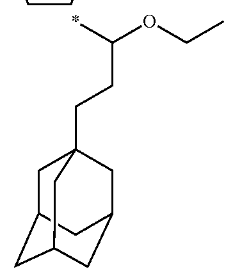
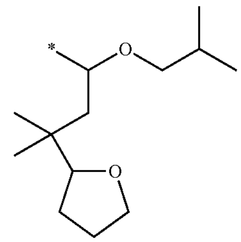
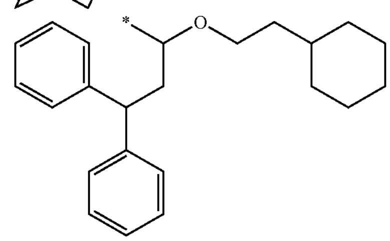
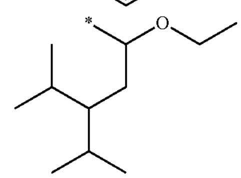
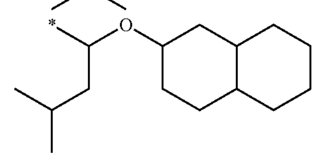
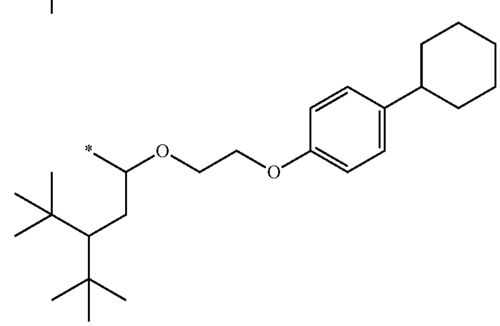
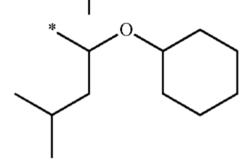

-continued
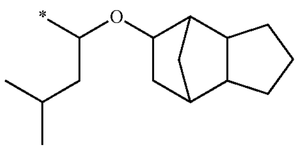
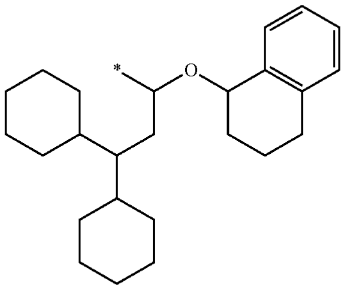
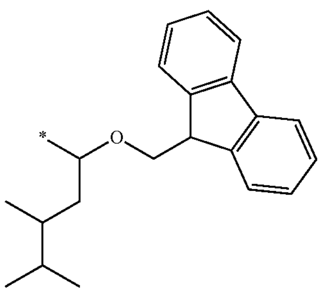
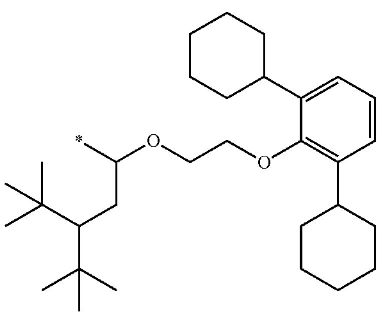
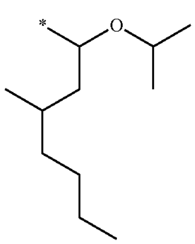
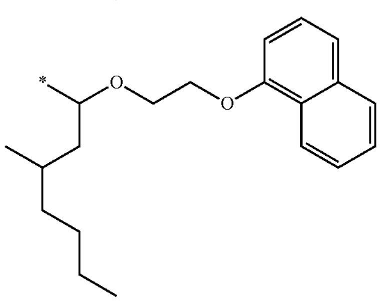
-continued
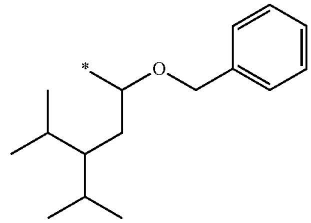
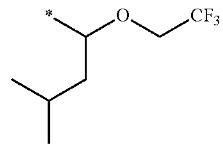
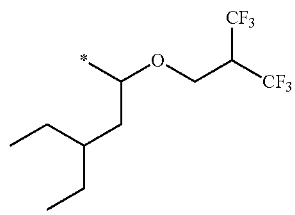
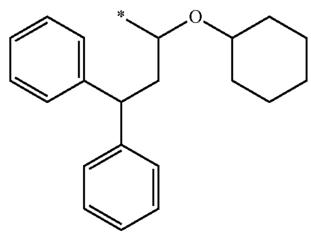
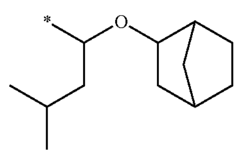
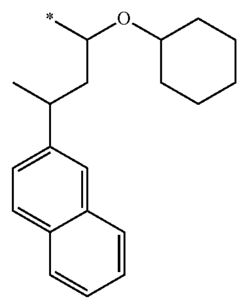
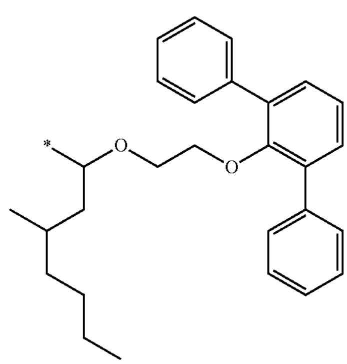
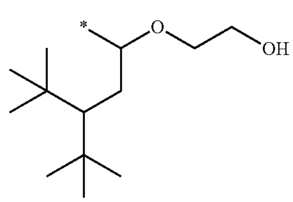
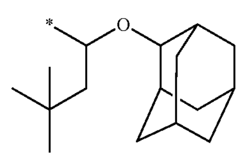

-continued

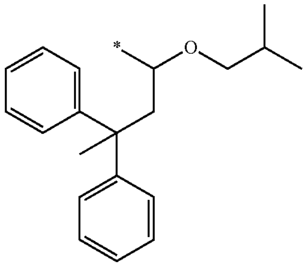

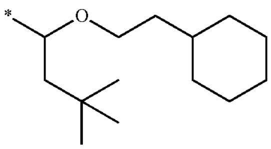

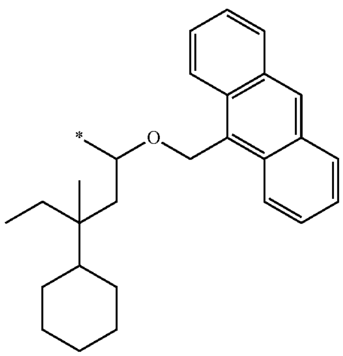

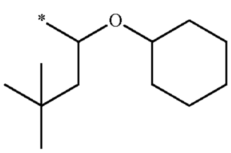

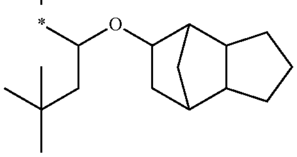

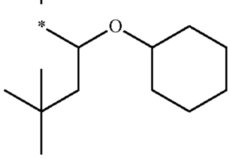

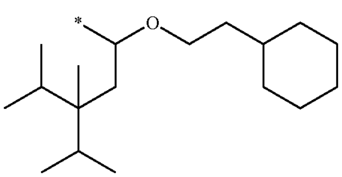

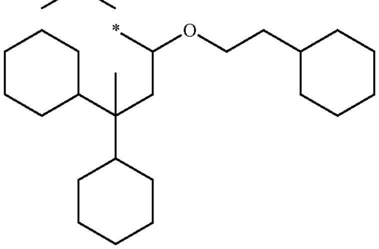

-continued

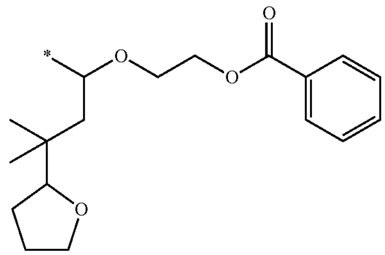

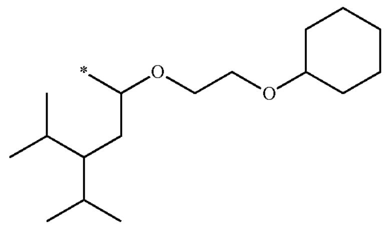

In the compound (P) for use in the present invention, the group formed by substituting for the hydrogen atom in a phenolic hydroxyl group by a group represented by formula (1) is preferably present in a ratio of 1 to 90 mol %, more preferably from 5 to 70 mol %, still more preferably from 15 to 50 mol %, based on the total amount of the group substituted with a group represented by formula (1) and the phenolic hydroxyl group (that is, a phenolic hydroxyl group not substituted with a protective group).

In one embodiment, the compound (P) may be a resin having a phenolic hydroxyl group and a group formed by substituting for the hydrogen atom in a phenolic hydroxyl group by a group represented by formula (1), and in this case, the resin is a resin containing a repeating unit having a phenolic hydroxyl group and a repeating unit having a group formed by substituting for the hydrogen atom in a phenolic hydroxyl group by a group represented by formula (1).

In another embodiment, the compound (P) may be a low molecular compound where the hydrogen atom of a part of the phenolic hydroxyl group in a parent compound having a plurality of phenolic hydroxyl groups is substituted for by a group represented by formula (1).

The case where the compound (P) is a resin (hereinafter, this resin is sometimes referred to as resin (P)) is described below.

The repeating unit having a phenolic hydroxyl group includes, for example, a repeating unit represented by the following formula (5) or (6), and a repeating unit represented by formula (5) is preferred.

(5)

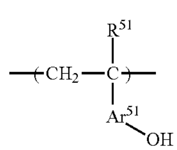

-continued (6)

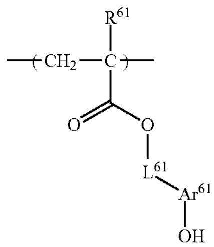

In formulae (5) and (6), each of $R^{51}$ and $R^{61}$ independently represents a hydrogen atom or a methyl group, and each of $Ar^{51}$ and $Ar^{61}$ independently represents an arylene group. $L^{61}$ represents a single bond or an alkylene group.

$R^{51}$ is preferably a hydrogen atom, and $R^{61}$ is preferably a methyl group.

The arylene group represented by $Ar^{51}$ and $Ar^{61}$ may have a substituent. The arylene group is preferably an arylene group having a carbon number of 6 to 18, which may have a substituent, more preferably a phenylene or naphthylene group which may have a substituent, and most preferably a phenylene group which may have a substituent. Examples of the substituent which such a group may have include an alkyl group, a halogen atom, a hydroxyl group, an alkoxy group, a carboxyl group, and an alkoxycarbonyl group.

As described above, $L^{61}$ represents a single bond or an alkylene group. The alkylene group is preferably an alkylene group having a carbon number of 1 to 8, more preferably an alkylene group having a carbon number of 1 to 4, and examples thereof include a methylene group, an ethylene group, a propylene group, a butylene group, a hexylene group and an octylene group, with a methylene group and an ethylene group being preferred.

Specific examples of the repeating unit represented by formula (5) are illustrated below, but the present invention is not limited thereto.

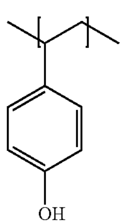
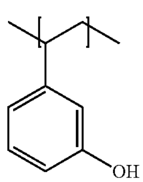
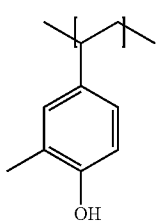
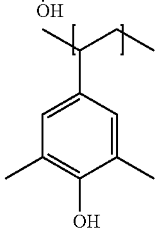
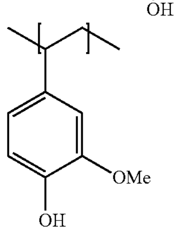
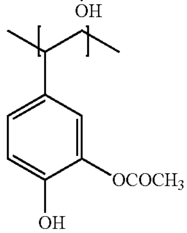
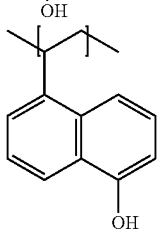

-continued

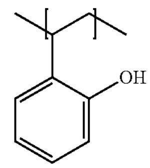
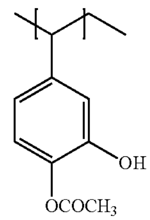
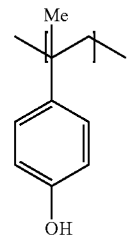
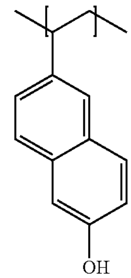
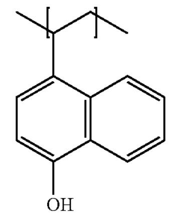
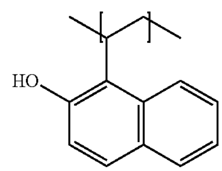
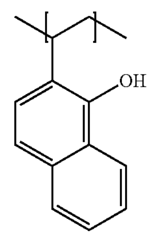

Specific examples of the repeating unit represented by formula (6) are illustrated below, but the present invention is not limited thereto.

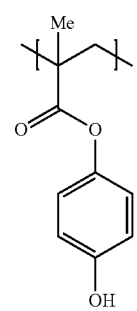
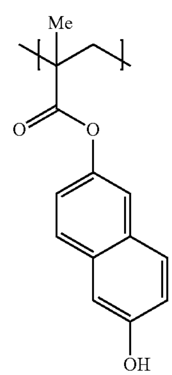
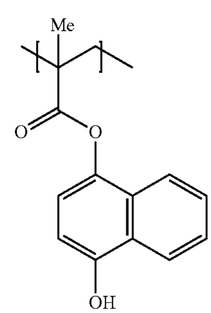
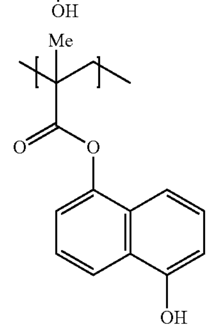

-continued

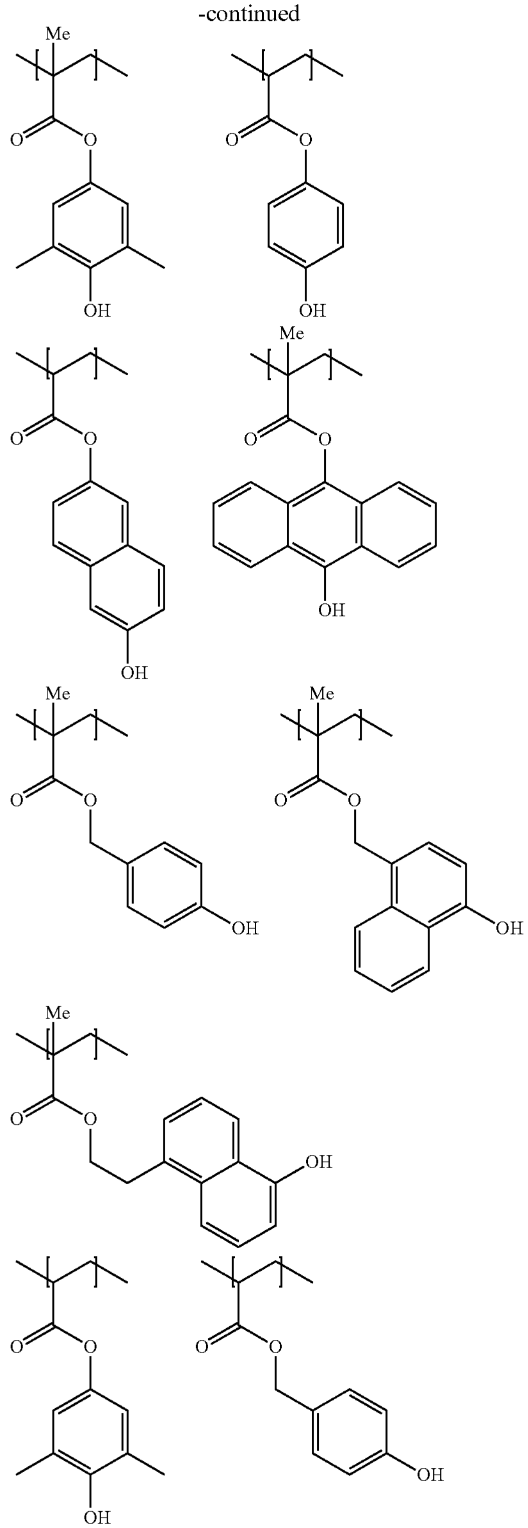

The content of the repeating unit represented by formula (5) or (6) in the resin (P) is preferably from 10 to 85 mol %, more preferably from 15 to 80 mol %, still more preferably from 25 to 75 mol %, based on all repeating units in the resin (P).

The resin (P) is preferably a resin containing a repeating unit represented by the following formula (2) as the repeating unit having a group formed by substituting for the hydrogen atom in a phenolic hydroxyl group by a group represented by formula (1).

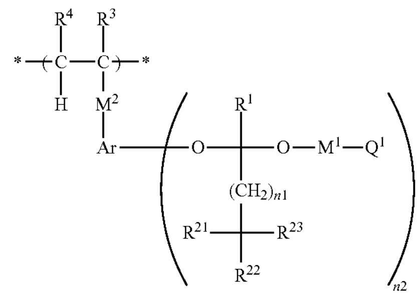

(2)

In formula (2), $R^1$, $R^{21}$, $R^{22}$, $R^{23}$, $M^1$, $Q^1$ and n1 have the same meanings as $R^1$, $R^{21}$, $R^{22}$, $R^{23}$, $M^1$, $Q^1$ and n1 in formula (1), respectively, and each of at least two members of $R^{21}$ to $R^{23}$ independently represents an alkyl group, a cycloalkyl group, an aryl group, an aralkyl group or a heterocyclic group.

At least two of $R^{21}$ to $R^{23}$ may combine with each other to form a ring, provided that it is not allowed to form a ring by combining at least one of $R^{21}$ to $R^{23}$ with $M^1$ or $Q^1$.

When $M^1$ is a divalent linking group, $Q^1$ may combine with $M^1$ through a single bond or another linking group to form a ring.

$R^3$ represents a hydrogen atom or an alkyl group.

$R^4$ represents a hydrogen atom or an alkyl group, $R^4$ and $M^2$ or Ar may combine with each other to form a ring, and in this case, $R^4$ represents an alkylene group.

$M^2$ represents a single bond or a divalent linking group and in the case of combining with $R^4$ to form a ring, represents a trivalent linking group.

Ar represents a (n2+1)-valent aromatic ring group and in the case of combining with $R^4$ to form a ring, represents a (n2+2)-valent aromatic ring group.

n2 represents an integer of 1 to 5.

When n2 is an integer of 2 or more, each of n2 groups in the parenthesis may be the same as or different from every other group.

Specific examples and preferred examples of $R^1$, $R^{21}$, $R^{22}$, $R^{23}$, $M^1$, $Q^1$ and n1 are the same as those described for $R^1$, $R^{21}$, $R^{22}$, $R^{23}$, $M^1$, $Q^1$ and n1 in formula (1).

The alkyl group of $R^3$ and $R^4$ may have a substituent (preferably a fluorine atom) and is preferably an alkyl group having a carbon number of 1 to 5, more preferably an alkyl group having a carbon number of 1 to 3, still more preferably a methyl group or a trifluoromethyl group.

Each of $R^3$ and $R^4$ is independently preferably a hydrogen atom, a methyl group or a trifluoromethyl group, more preferably a hydrogen atom.

At least one of $R^3$ and $R^4$ is preferably a hydrogen atom, and it is more preferred that both are a hydrogen atom.

The alkylene group of $R^4$ when $R^4$ and $M^2$ or Ar combine with each other to form a ring is preferably an alkylene group having a carbon number of 1 to 3, more preferably an alkylene group having a carbon number of 1 or 2.

The divalent linking group as $M^2$ is preferably an alkylene group, —O—, —CO—, —$N(R_0)$—, or a group formed by combining two or more thereof. $R_0$ in —$N(R_0)$— is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group, and an octyl group).

Specific examples of the divalent linking group include —COO—, $—COOCH_2—$, $—COO—CH_2—CH_2—$, —O—, and —CONH—.

$M^2$ is preferably a single bond or —COO—.

Ar represents a (n2+1)-valent aromatic ring group. The divalent aromatic ring group when n2 is 1 may have a substituent, and preferred examples of the group include an arylene group having a carbon number of 6 to 18 (more preferably a carbon number of 6 to 10) such as phenylene group, tolylene group and naphthylene group, and a divalent aromatic ring group containing a heterocyclic ring such as triazine, furan, pyrrole, benzothiophene, benzofuran, benzopyrrole, triazine, imidazole, benzimidazole, triazole, thiadiazole and thiazole.

Specific preferred examples of the (n2+1)-valent aromatic ring group when n2 is an integer of 2 or more include groups formed by removing arbitrary (n2-1) hydrogen atoms from the above-described specific examples of the divalent aromatic ring group.

Specific preferred examples of the (n2+2)-valent aromatic ring group as Ar when Ar combines with $R^4$ to form a ring include groups formed by removing arbitrary n2 hydrogen atoms from the above-described specific examples of the divalent aromatic ring group.

Specific examples of the substituent which the alkylene group of $R^4$ and $M^2$ may have include a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group.

Specific examples of the substituent which each group of Ar may have include the above-described specific examples of the substituent which may be substituted on the alkylene group of $R^4$ and $M^2$.

The carbon number of the substituent which the alkylene group of $R^4$ and $M^2$ may have and the carbon number of the substituent which each group of Ar may have are preferably 8 or less.

n2 is preferably an integer of 1 to 3, more preferably 1.

Specific examples of the structure represented by the following formula (2A) in the repeating unit represented by formula (2) are illustrated below, but the present invention is not limited thereto. In the following specific examples, "•" indicates a bond to the acetal structure in the parenthesis of formula (2), and, for example, when two bonds are present as the bond above, this means that n2 is 2.

(2A)

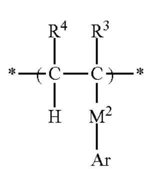

-continued

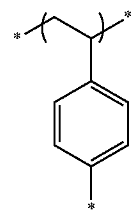

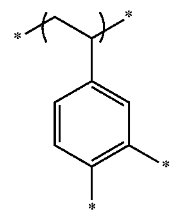

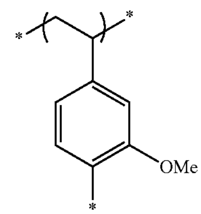

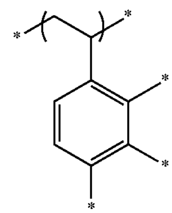

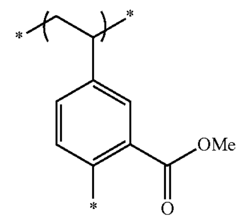

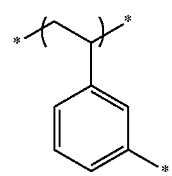

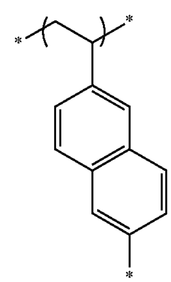

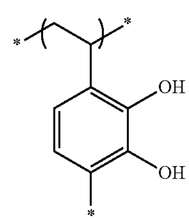

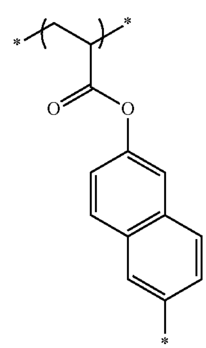

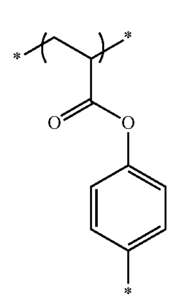

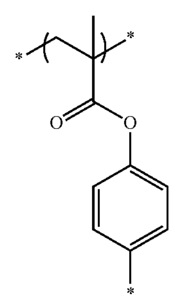

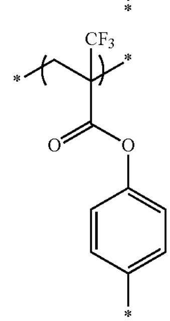

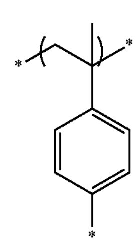

-continued
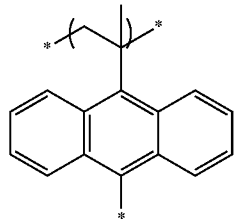
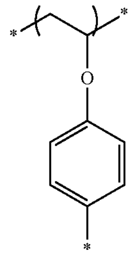
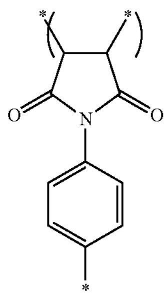
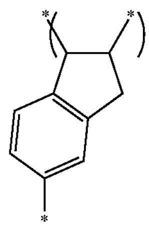
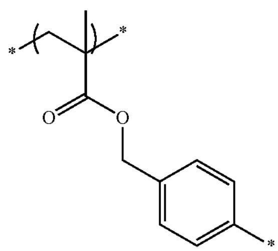
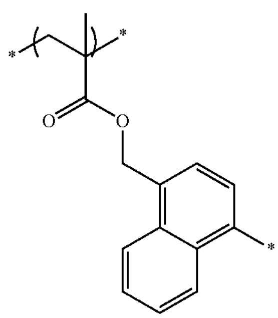
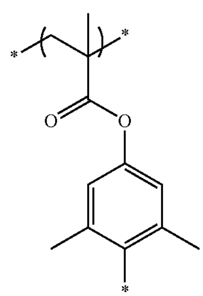
Specific examples of the repeating unit represented by formula (2) are illustrated below, but the present invention is not limited thereto. In the following specific examples, * in the group represented by P indicates a bond to the oxygen atom in a phenolic hydroxyl group.
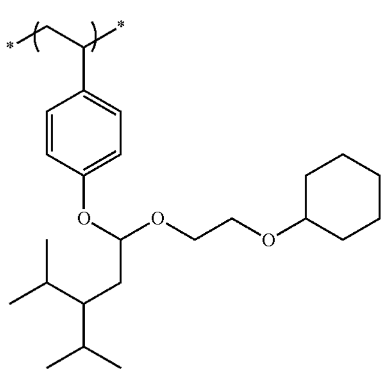
-continued
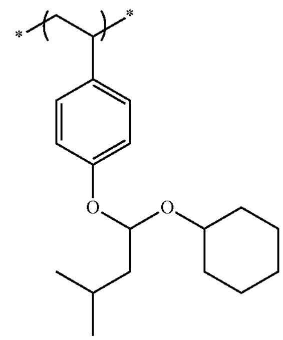
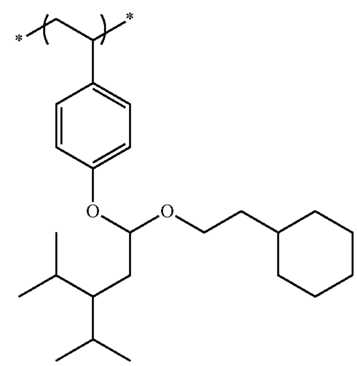
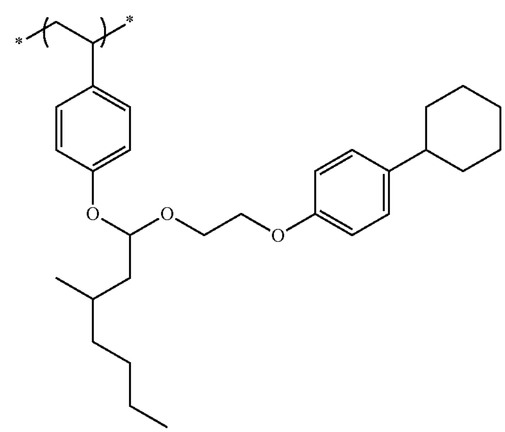
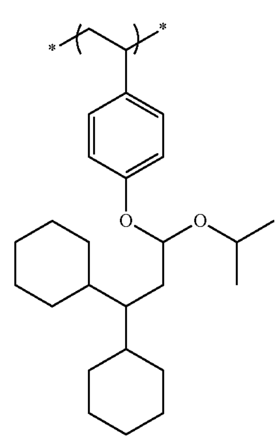

-continued
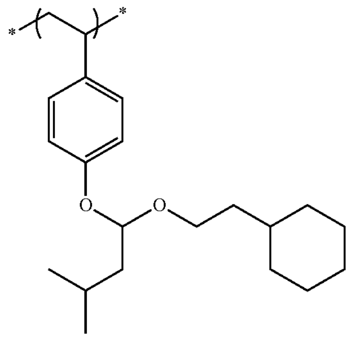
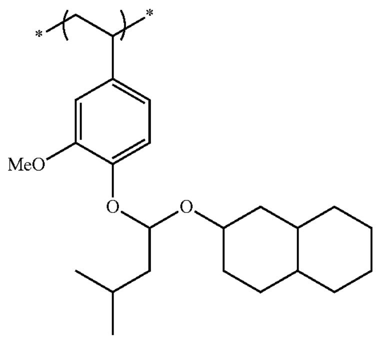
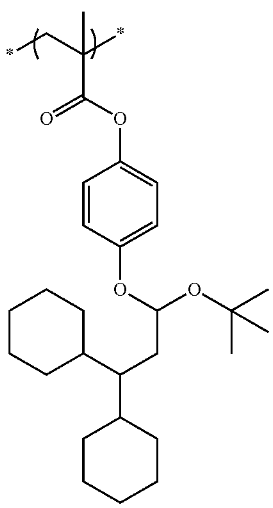
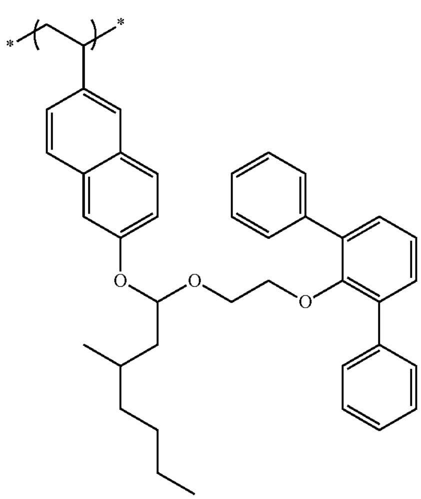
-continued
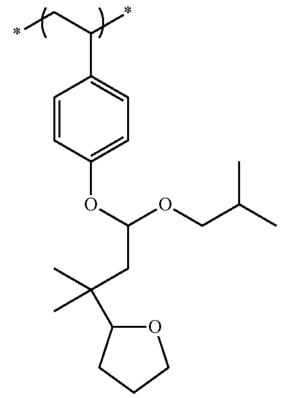
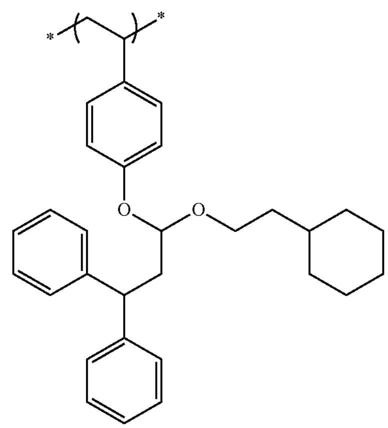
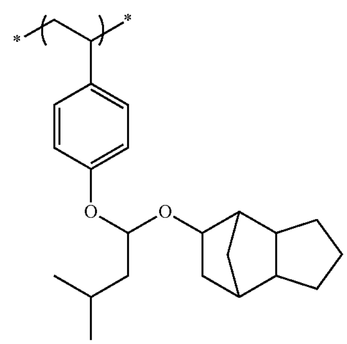
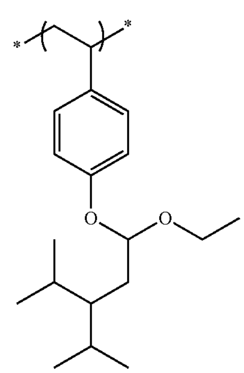
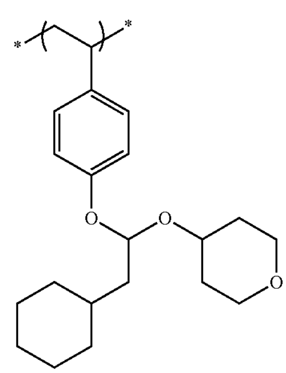

-continued
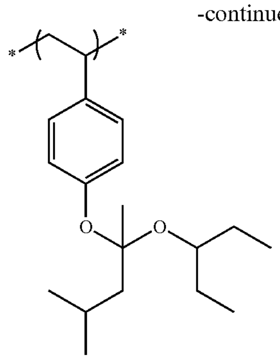
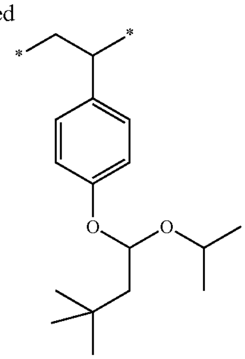
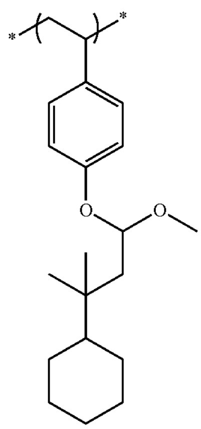
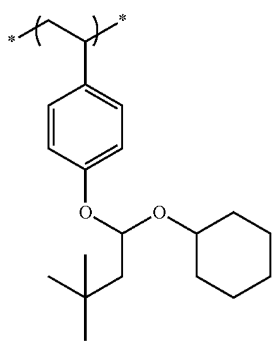
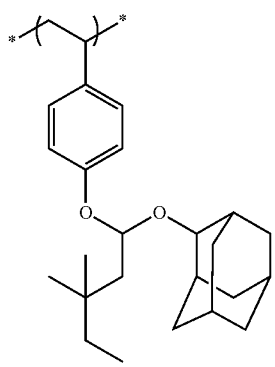
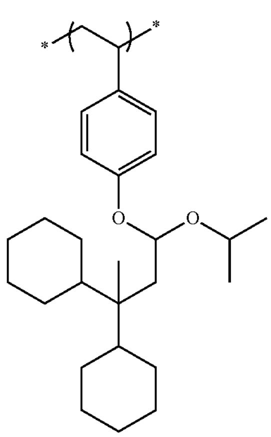
-continued
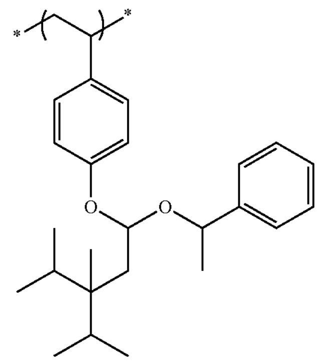
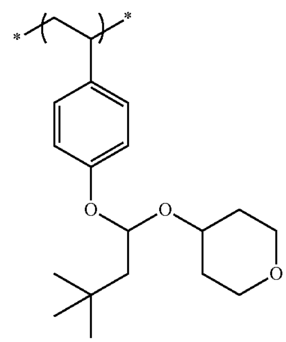
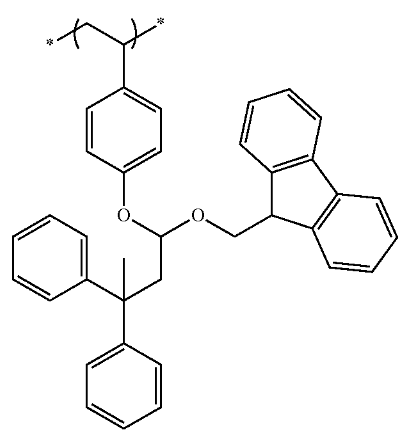
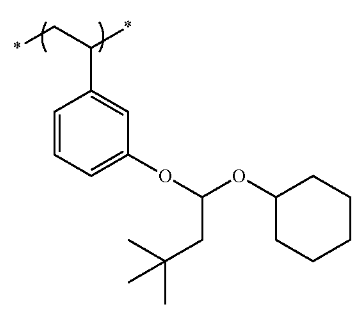

-continued
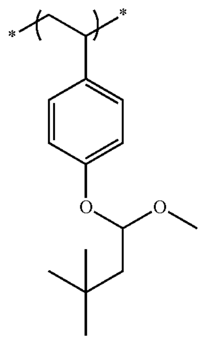
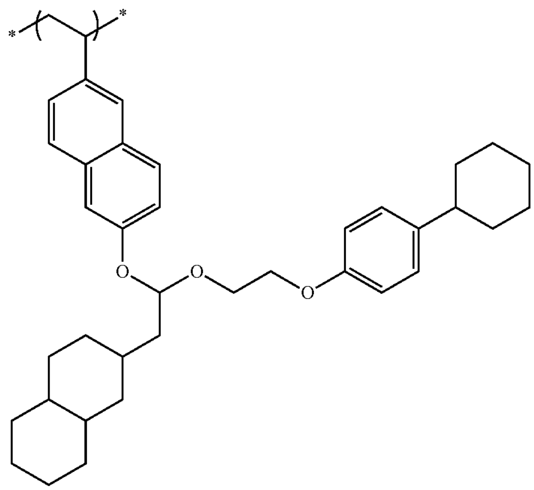
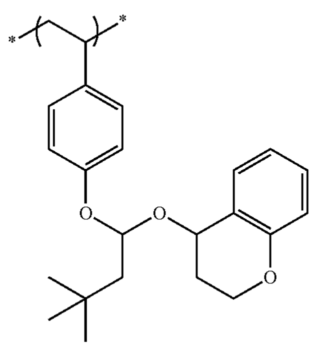
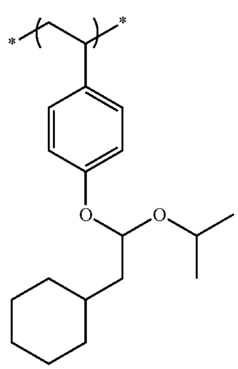
-continued
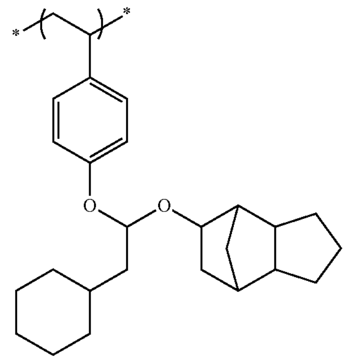
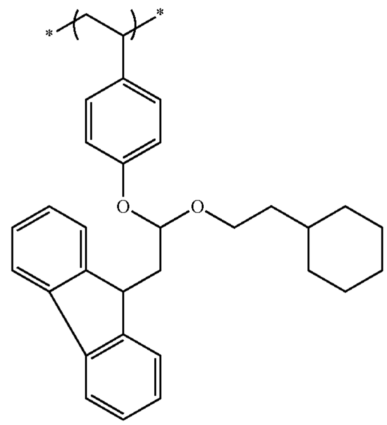
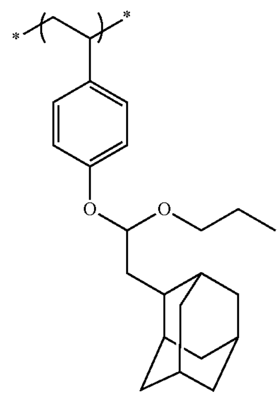
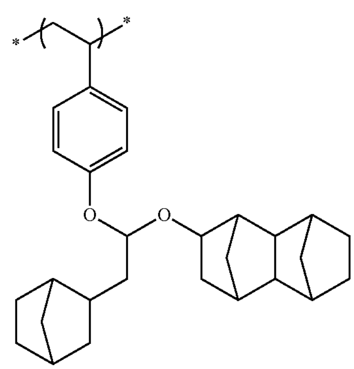

-continued
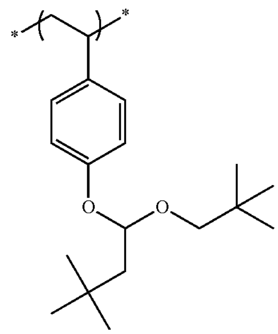
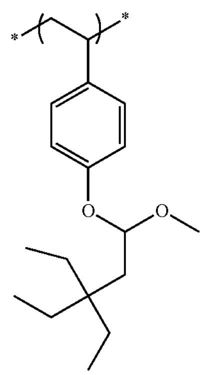
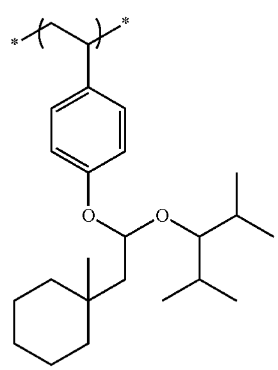
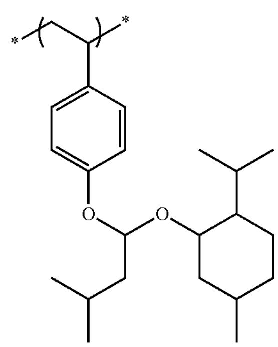
-continued
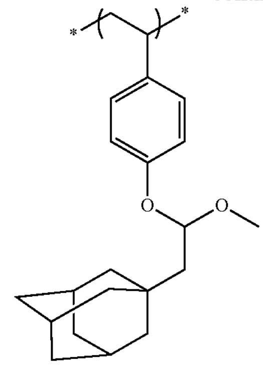
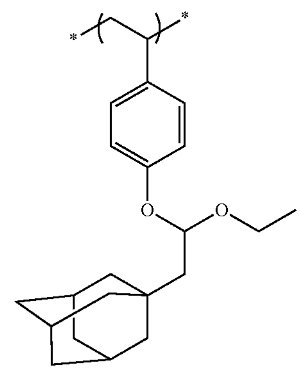
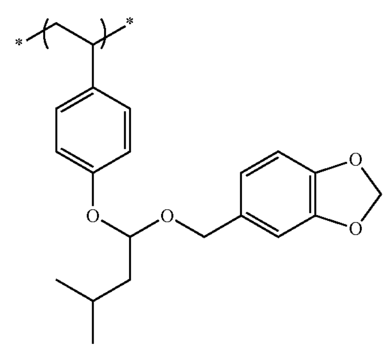
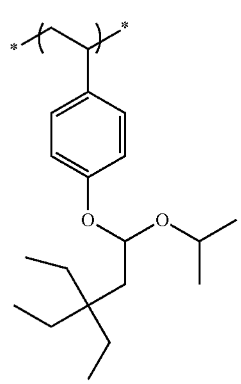
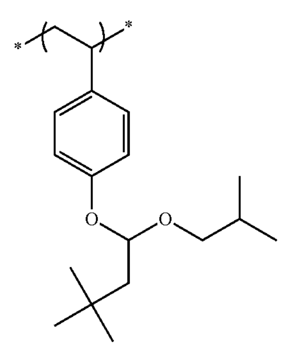

-continued
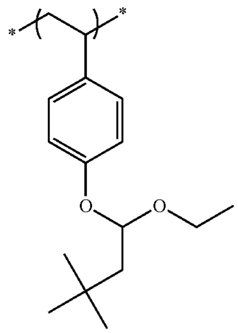
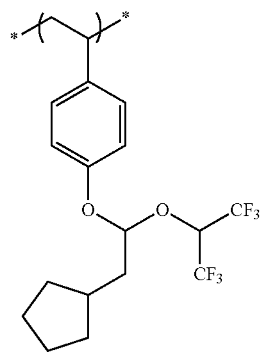
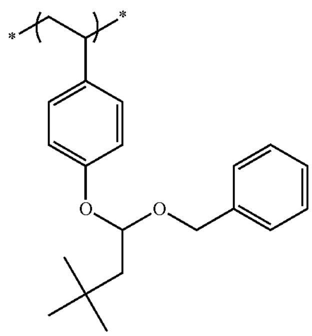
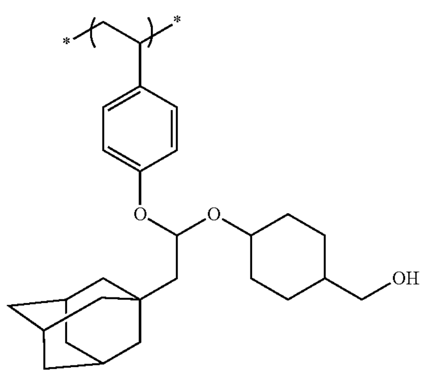
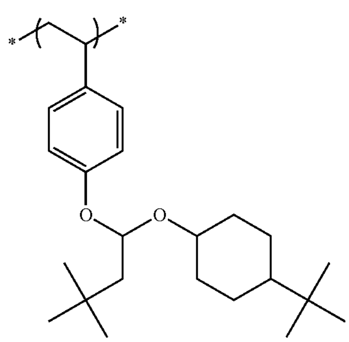
-continued
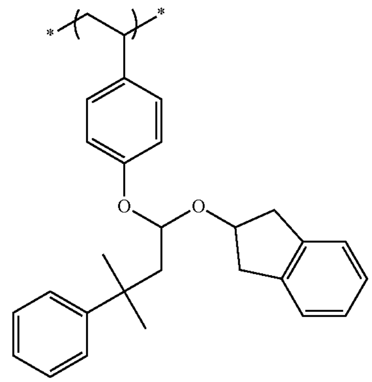
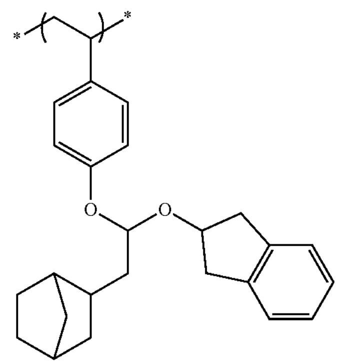
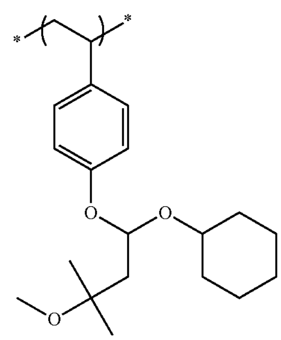
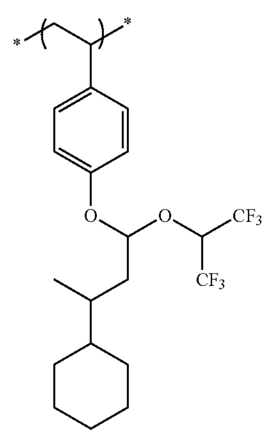

-continued
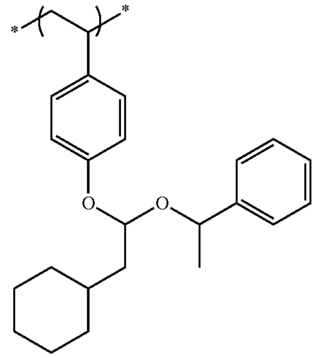
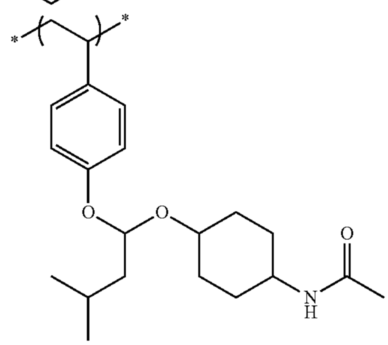
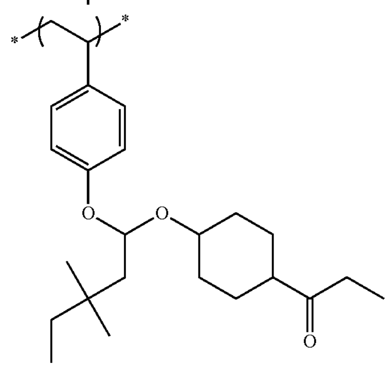
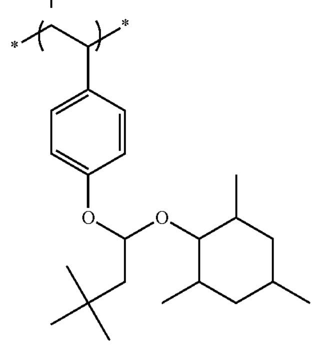
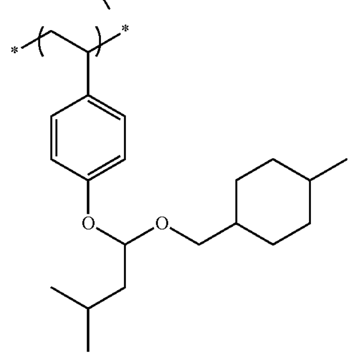
-continued
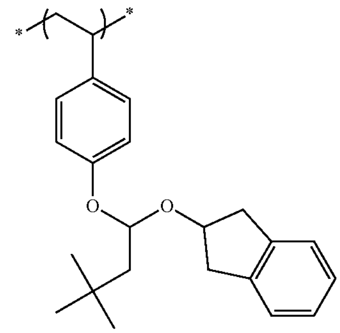
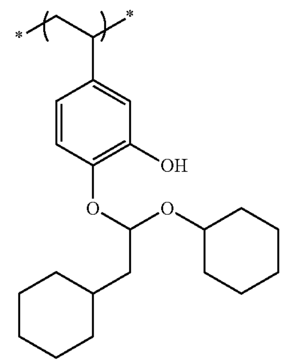
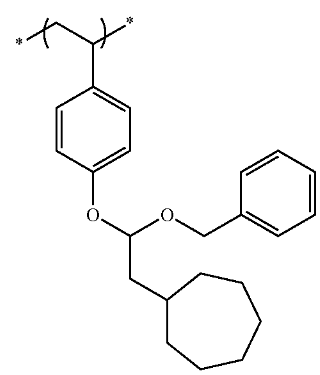
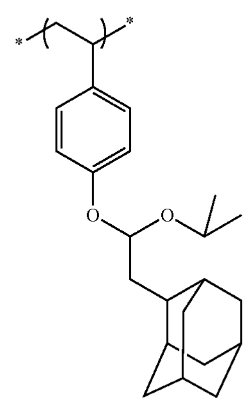

-continued
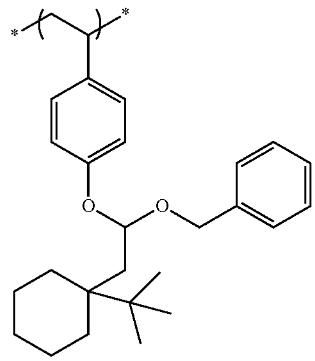
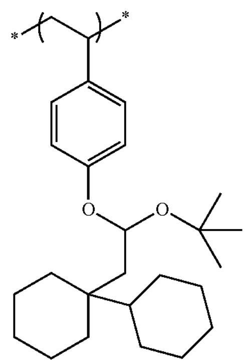
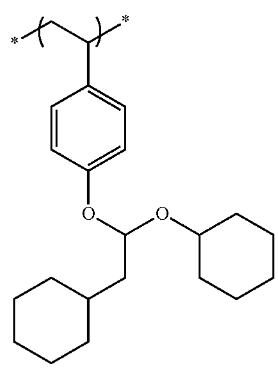
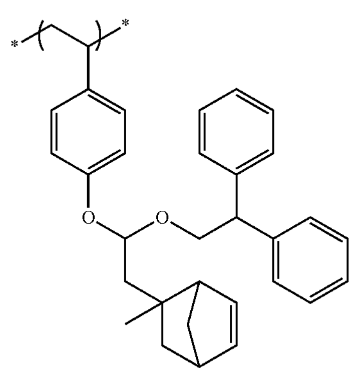
-continued
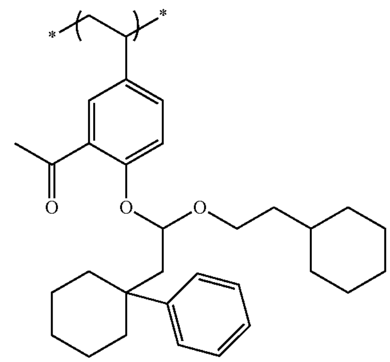
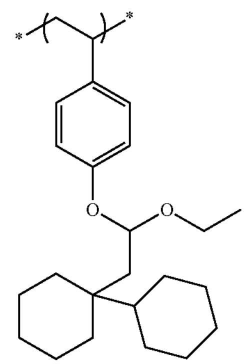
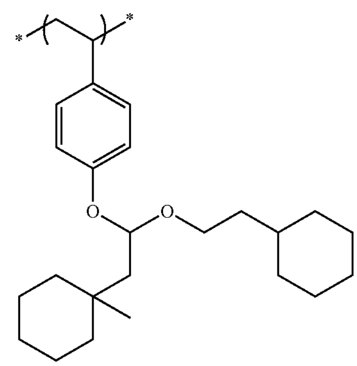
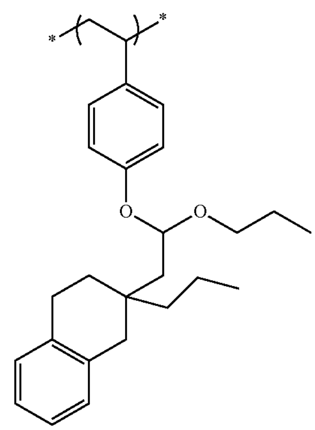

-continued
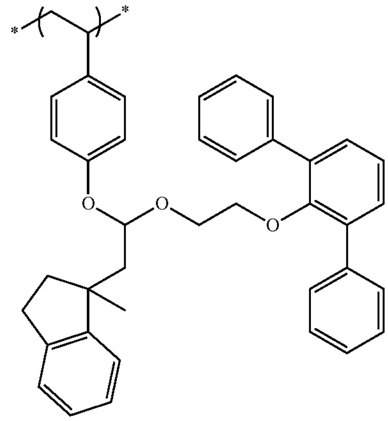
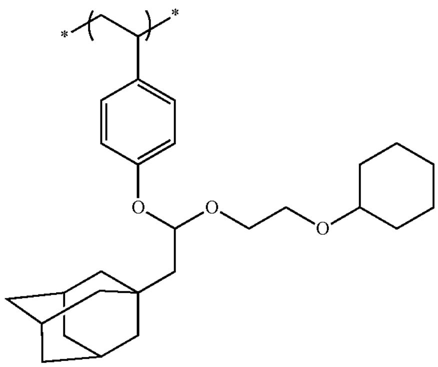
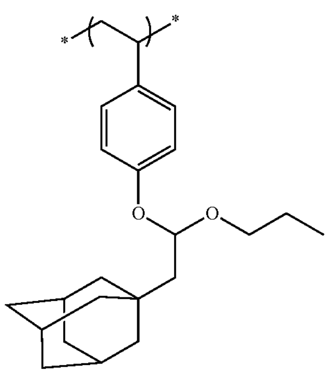
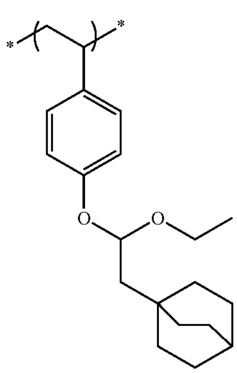
-continued
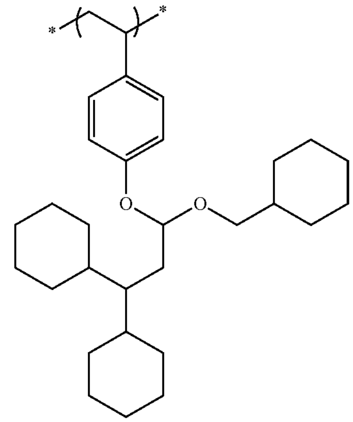
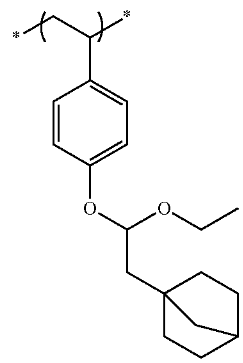
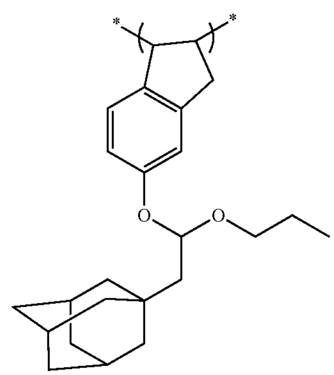
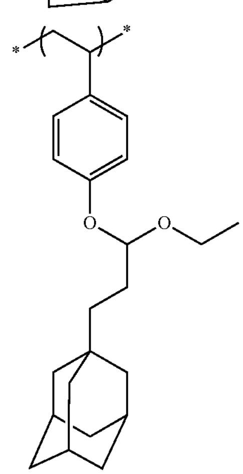

-continued
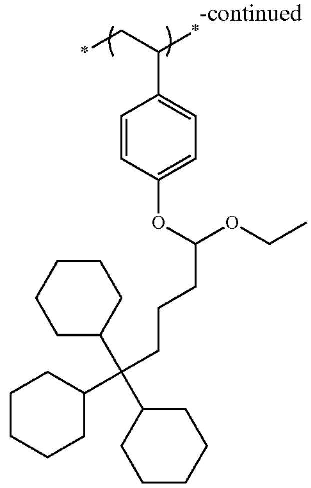
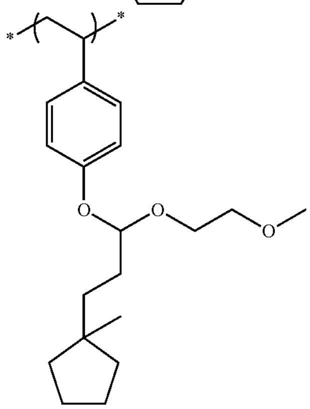
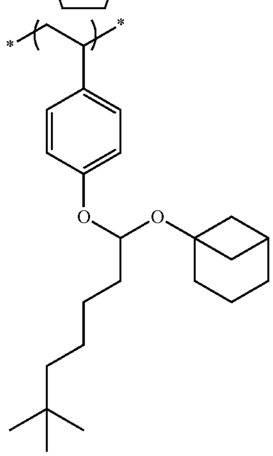
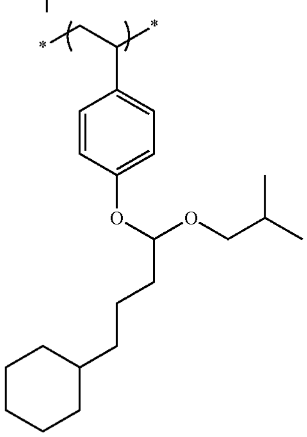
-continued
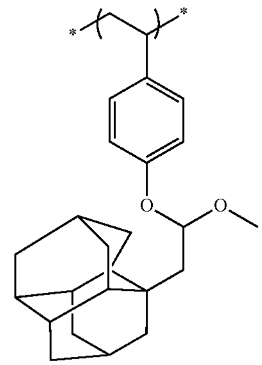
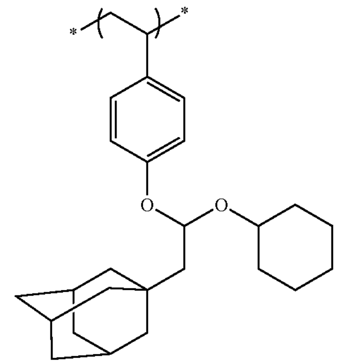
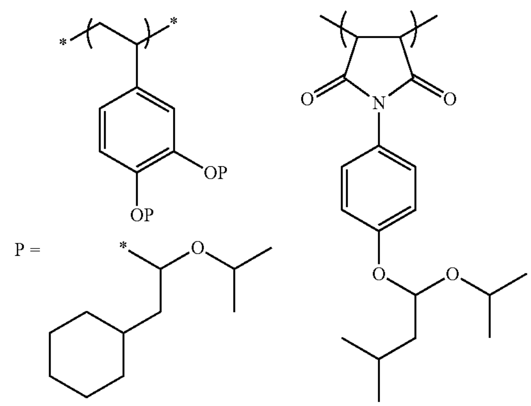
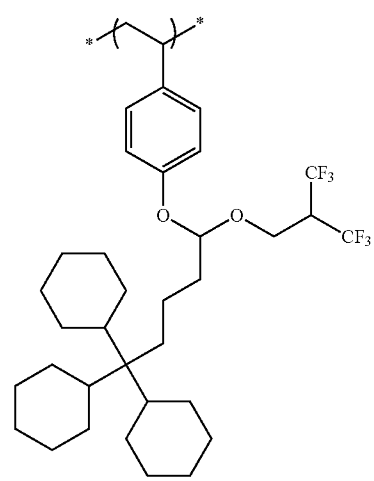

-continued

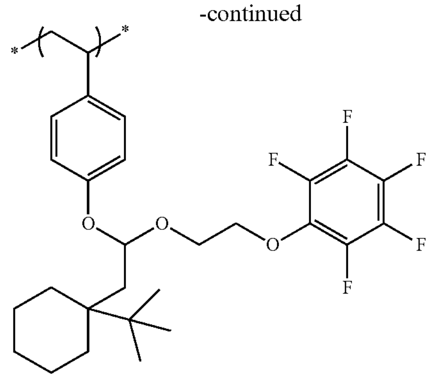

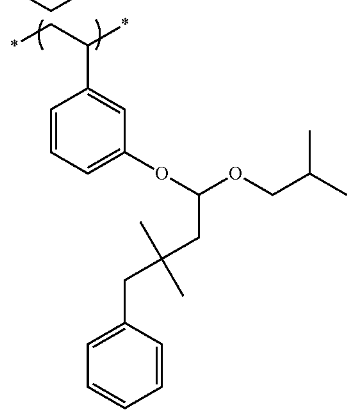

As for the repeating unit represented by formula (2), one repeating may be used or two or more repeating units may be used in combination, but it is preferred to use one repeating unit.

The content of the repeating unit represented by formula (2) in the resin (P) is preferably from 5 to 70 mol %, more preferably from 7 to 60 mol %, still more preferably from 10 to 55 mol %, based on all repeating units in the resin (P).

The resin (P) may further contain a repeating unit represented by the following formula (A1), (A2) or (A3):

(A1)

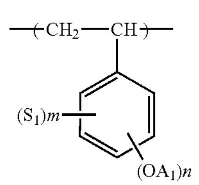

(A2)

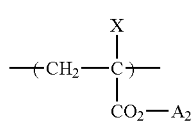

(A3)

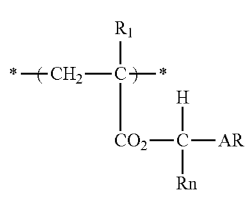

In formula (A1), n represents an integer of 1 to 5, and m represents an integer of 0 to 4 satisfying the relationship of $1 \leq m+n \leq 5$.

$S_1$ represents a substituent (excluding a hydrogen atom) and when m is 2 or more, each $S_1$ may be the same as or different from every other $S_1$.

$A_1$ represents a hydrogen atom or a group represented by the following formula (a1) or (a2):

(a1)

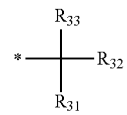

(a2)

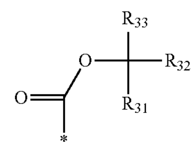

Each of $R_{31}$ to $R_{33}$ independently represents an alkyl group, a cycloalkyl group, an aryl group or a heterocyclic group. Specific examples and preferred examples of the alkyl group, cycloalkyl group, aryl group and heterocyclic group of $R_{31}$ to $R_{33}$ are the same as those of the alkyl group, cycloalkyl group, aryl group and heterocyclic group of $R^{21}$ to $R^{23}$ in formula (1).

When n is 2 or more, each $A_1$ may be the same as or different from every other $A_1$.

Specific examples of the repeating unit represented by formula (A1) are illustrated below, but the present invention is not limited thereto.

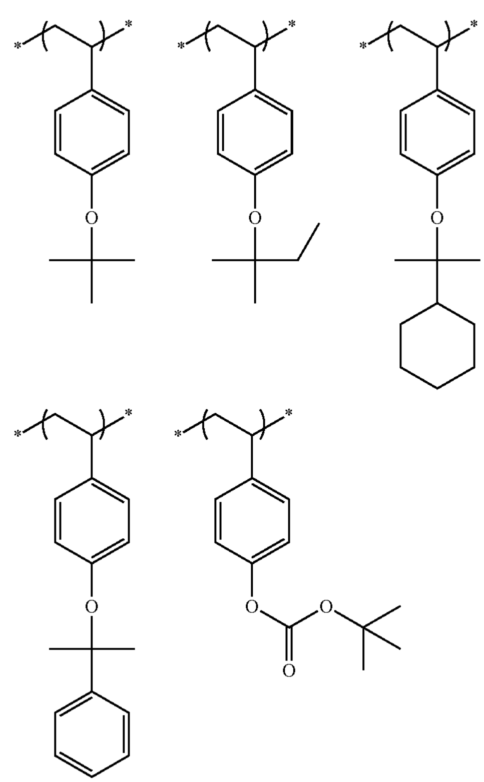

-continued

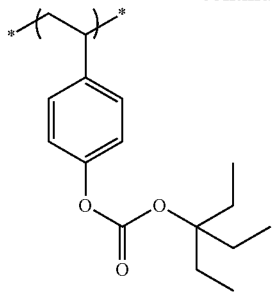

In formula (A2), X represents a hydrogen atom or an alkyl group.

$A_2$ represents a group capable of leaving by the action of an acid.

The repeating unit represented by formula (A2) is described below.

Specific examples and preferred examples of the alkyl group of X are the same as specific examples and preferred examples of the alkyl group of $R^3$ in formula (2).

Examples of $A_2$ are the same as those of the group represented by formula (a1) or (A2) of $A_1$ in formula (A1).

Specific examples of the monomer corresponding to the repeating unit represented by formula (A2) are illustrated below, but the present invention is not limited thereto.

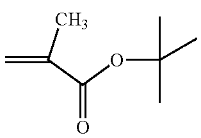

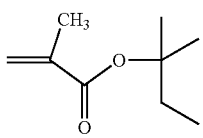

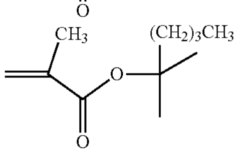

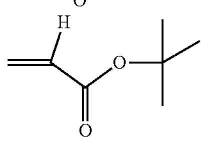

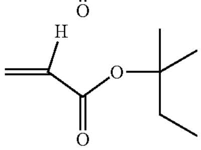

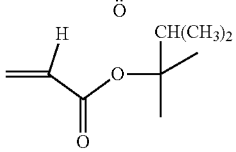

1

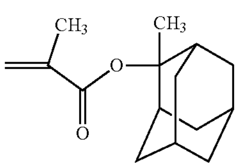

2

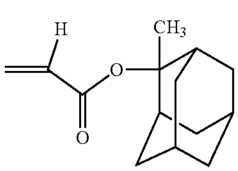

3

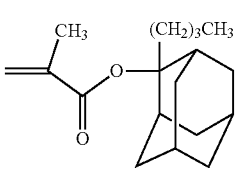

-continued

4

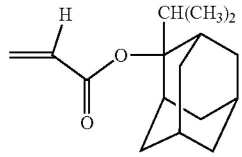

5

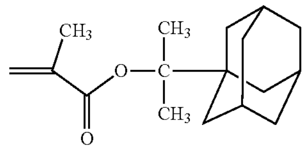

6

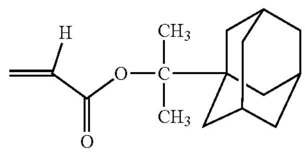

7

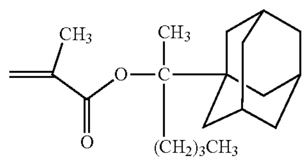

8

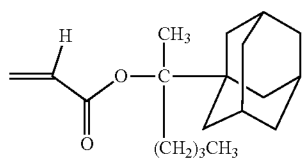

9

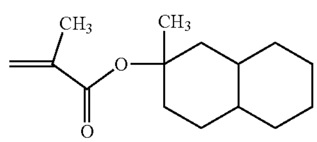

10

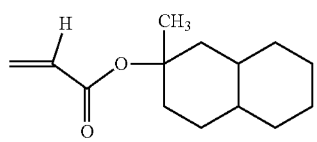

11

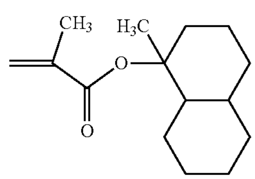

12

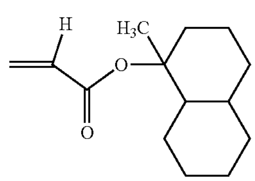

13

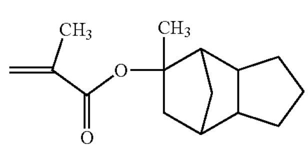

-continued
14
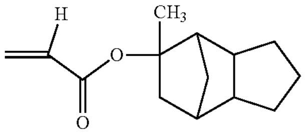
15
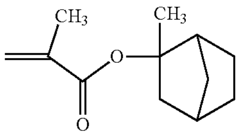
16
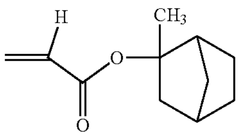
17
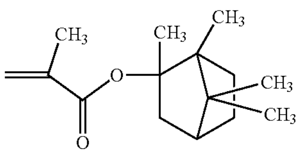
18
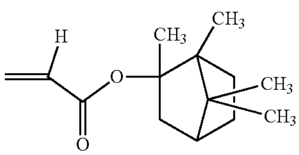
19
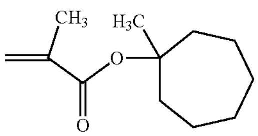
20
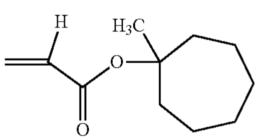
21
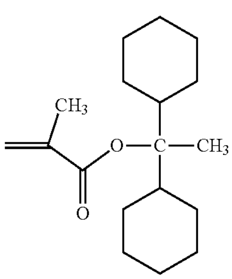
22
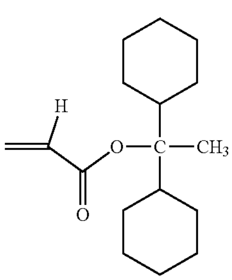
-continued
23
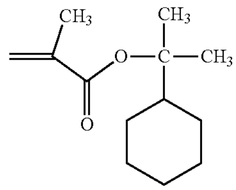
24
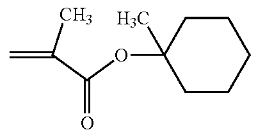
25
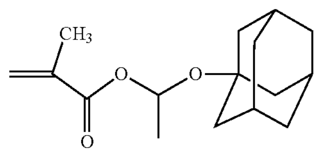
26
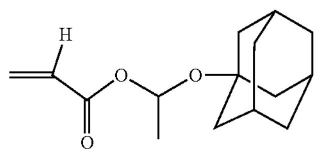
27
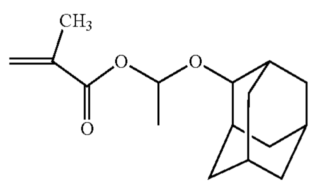
28
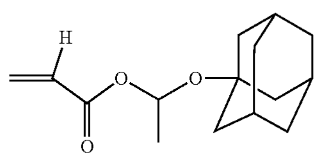
29
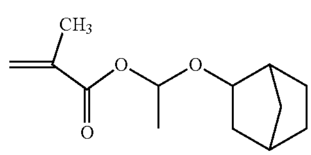
30
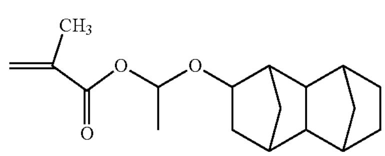
31
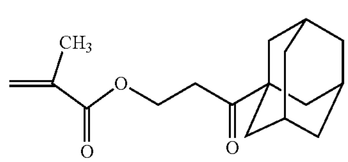

-continued
32
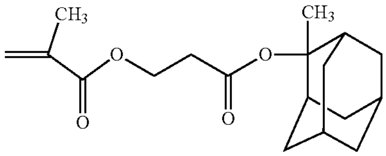
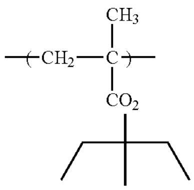
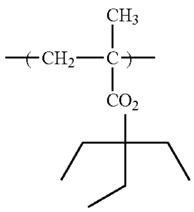
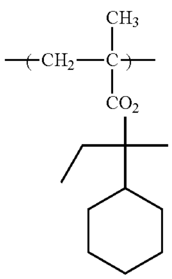
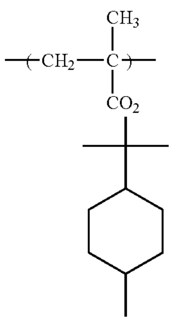
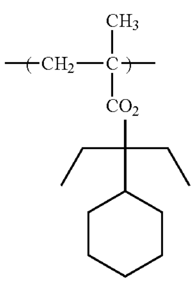
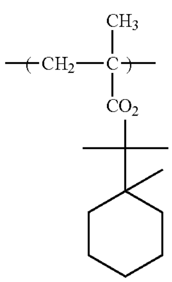
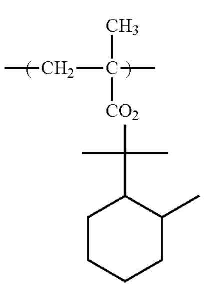
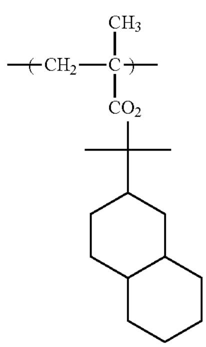
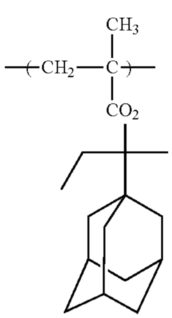
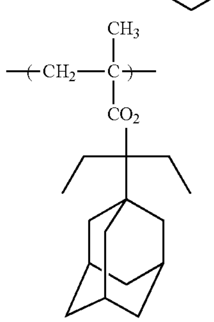
-continued
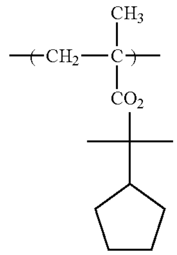
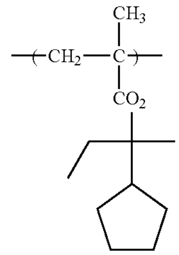
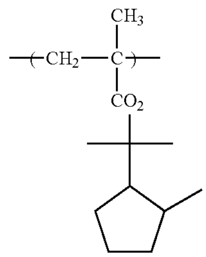
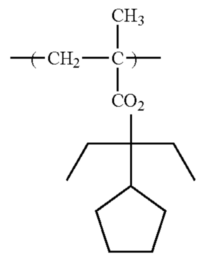
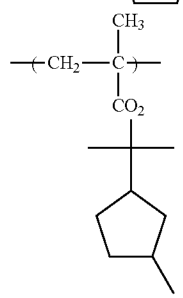
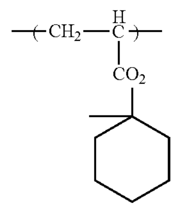
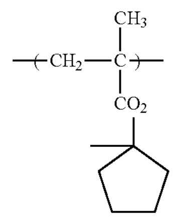
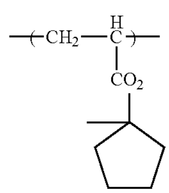
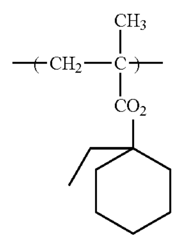
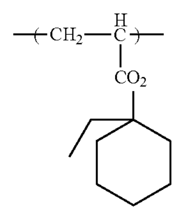
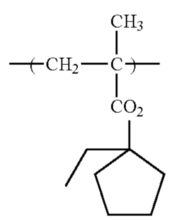
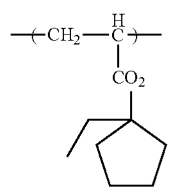
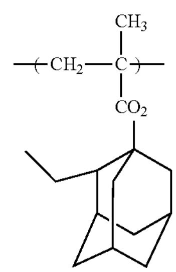
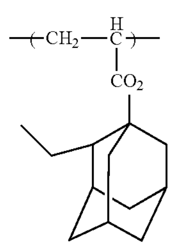
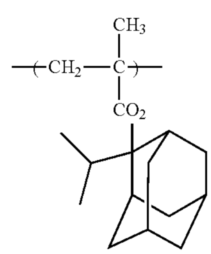
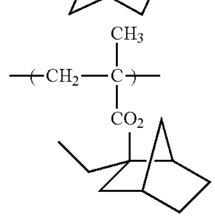
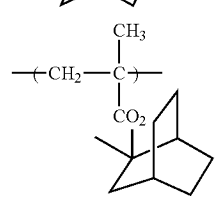

-continued

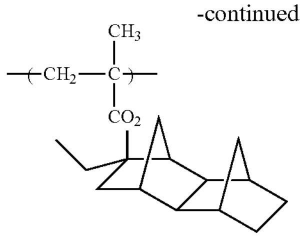

The repeating unit represented by formula (A3) is described below.

In formula (A3), AR represents an aryl group.

Rn represents an alkyl group, a cycloalkyl group or an aryl group. Rn and AR may combine with each other to form a non-aromatic ring.

$R_1$ represents a hydrogen atom, an alkyl group, a cycloalkyl group, a halogen atom, a cyano group or an alkyloxycarbonyl group.

The repeating unit represented by formula (A3) is described in detail.

As described above, AR represents an aryl group. The aryl group of AR is preferably an aryl group having a carbon number of 6 to 20, such as phenyl group, naphthyl group, anthryl group and fluorene group, more preferably an aryl group having a carbon number of 6 to 15.

When AR is a naphthyl group, an anthryl group or a fluorene group, the bonding position between the carbon atom to which Rn is bonded and AR is not particularly limited. For example, when AR is a naphthyl group, the carbon atom may be bonded to the α-position or β-position of the naphthyl group. Also, when AR is an anthryl group, the carbon atom may be bonded to the 1-position, 2-position or 9-position of the anthryl group.

The aryl group of AR may have one or more substituents. Specific examples of the substituent include a linear or branched alkyl group having a carbon number of 1 to 20, such as methyl group, ethyl group, propyl group, isopropyl group, n-butyl group, isobutyl group, tert-butyl group, pentyl group, hexyl group, octyl group and dodecyl group, an alkoxy group containing such an alkyl group moiety, a cycloalkyl group such as cyclopentyl group and cyclohexyl group, a cycloalkoxy group containing such a cycloalkyl group moiety, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. The substituent is preferably a linear or branched alkyl group having a carbon number of 1 to 5, or an alkoxy group containing such an alkyl group moiety, more preferably a paramethyl group or a paramethoxy group.

In the case where the aryl group of AR has a plurality of substituents, at least two members out of the plurality of substituents may combine with each other to form a ring. The ring is preferably a 5- to 8-membered ring, or a 5- or 6-membered ring. Also, the ring may be a heterocyclic ring containing, as a ring member, a heteroatom such as oxygen atom, nitrogen atom and sulfur atom.

Furthermore, the ring may have a substituent. Examples of the substituent are the same as the those described later for the substituent which Rn may further have.

In view of roughness performance, the repeating unit represented by formula (A3) preferably contains two or more aromatic rings. Usually, the number of aromatic rings contained in the repeating unit is preferably 5 or less, more preferably 3 or less.

Also, in the repeating unit represented by formula (A3), from the standpoint of roughness performance, AR preferably contains two or more aromatic rings, and it is more preferred that AR is a naphthyl group or a biphenyl group. Usually, the number of aromatic rings contained in AR is preferably 5 or less, more preferably 3 or less.

As described above, Rn represents an alkyl group, a cycloalkyl group or an aryl group.

The alkyl group of Rn may be a linear alkyl group or a branched alkyl group. Preferred examples of the alkyl group include an alkyl group having a carbon number of 1 to 20, such as methyl group, ethyl group, propyl group, isopropyl group, n-butyl group, isobutyl group, tert-butyl group, pentyl group, hexyl group, cyclohexyl group, octyl group and dodecyl group. The alkyl group of Rn is preferably an alkyl group having a carbon number of 1 to 5, more preferably an alkyl group having a carbon number of 1 to 3.

Examples of the cycloalkyl group of Rn include a cycloalkyl group having a carbon number of 3 to 15, such as cyclopentyl group and cyclohexyl group.

The aryl group of Rn is preferably, for example, an aryl group having a carbon number of 6 to 14, such as phenyl group, xylyl group, toluoyl group, cumenyl group, naphthyl group and anthryl group.

Each of the alkyl group, cycloalkyl group and aryl group of Rn may further have a substituent. Examples of the substituent include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue such as pyrrolidone residue. Among these, an alkoxy group, a hydroxyl group, a halogen atom, a nitro group, an acyl group, an acyloxy group, an acylamino group and a sulfonylamino group are preferred.

As described above, $R_1$ represents a hydrogen atom, an alkyl group, a cycloalkyl group, a halogen atom, a cyano group or an alkyloxycarbonyl group.

Examples of the alkyl group and cycloalkyl group of $R_1$ are the same as those described above for Rn. Each of the alkyl group and the cycloalkyl group may have a substituent. Examples of the substituent are the same as those described above for Rn.

In the case where $R_1$ is an alkyl or cycloalkyl group having a substituent, particularly preferred examples of $R_1$ include a trifluoromethyl group, an alkyloxycarbonylmethyl group, an alkylcarbonyloxymethyl group, a hydroxymethyl group, and an alkoxymethyl group.

The halogen atom of $R_1$ includes a fluorine atom, a chlorine atom, a bromine atom and an iodine atom. Among others, a fluorine atom is preferred.

As the alkyl group moiety contained in the alkyloxycarbonyl group of $R_1$, for example, a configuration described above as the alkyl group of $R_1$ may be employed.

It is preferred that Rn and AR are combined with each other to form a non-aromatic ring, and in particular, the roughness performance can be thereby enhanced.

The non-aromatic ring that may be formed by combining Rn and AR with each other is preferably a 5- to 8-membered ring, more preferably a 5- or 6-membered ring.

The non-aromatic ring may be an aliphatic ring or a heterocyclic ring containing, as a ring member, a heteroatom such as oxygen atom, nitrogen atom and sulfur atom.

The non-aromatic ring may have a substituent. Examples of the substituent are the same as those described above for the substituent which Rn may further have.
Specific examples of the structure of the repeating unit represented by formula (A3) are illustrated below, but the present invention is not limited thereto.
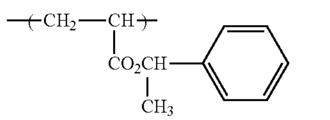
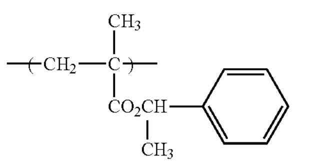
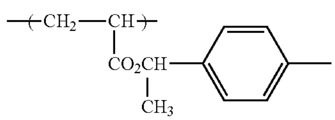
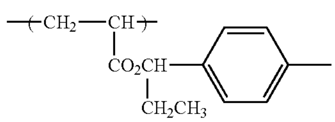
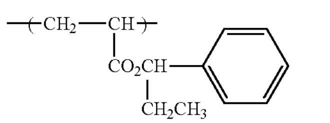
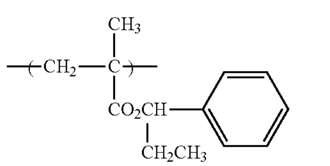
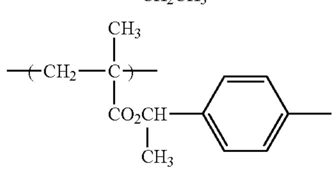
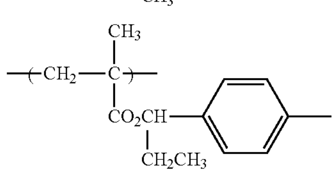
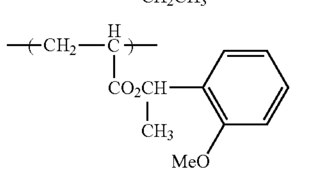
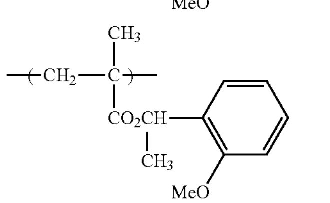
-continued
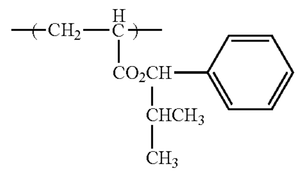
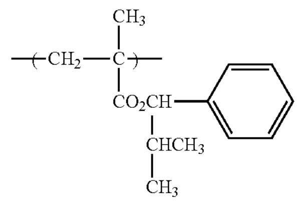
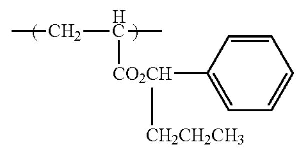
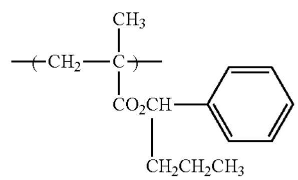
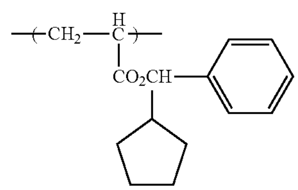
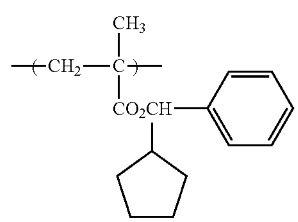
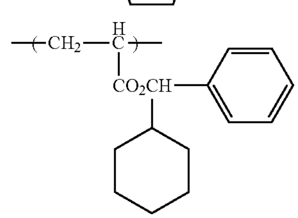
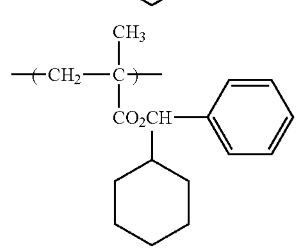
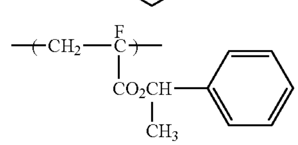

-continued
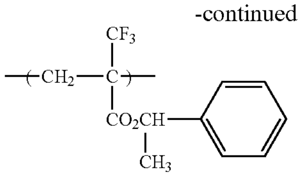
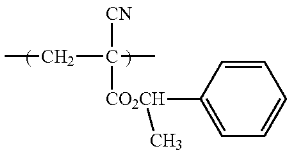
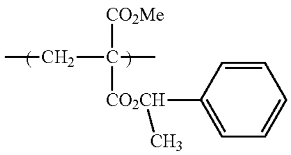
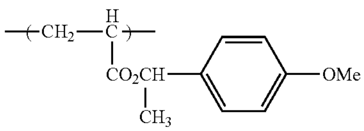
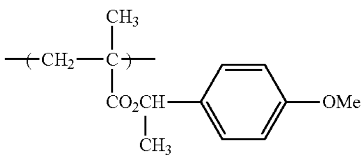
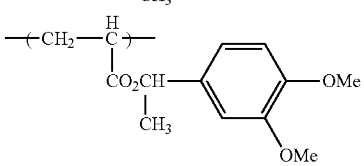
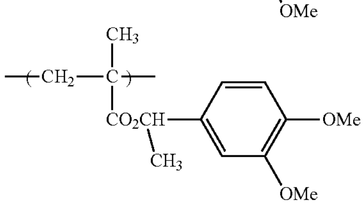
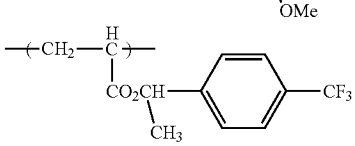
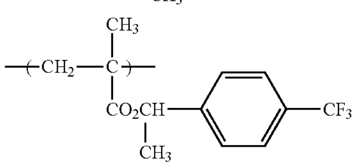
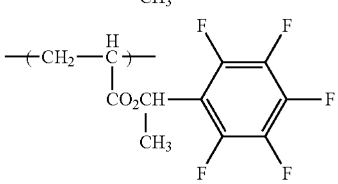
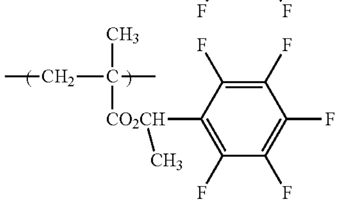
-continued
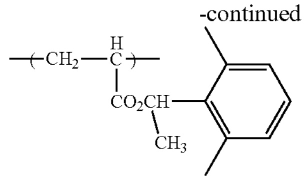
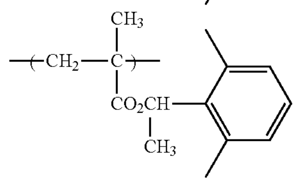
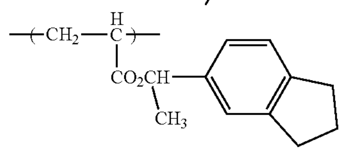
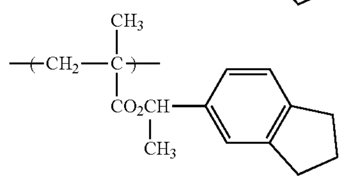
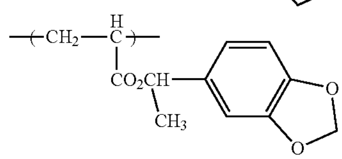
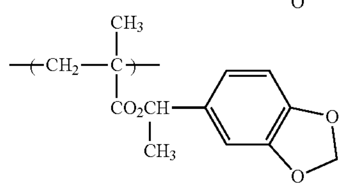
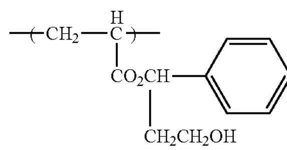
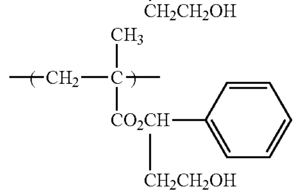
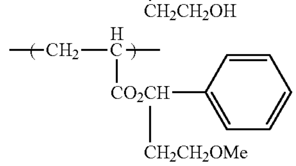
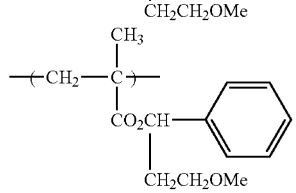
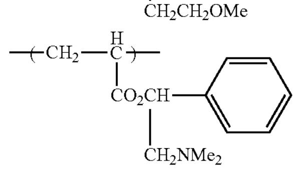

-continued
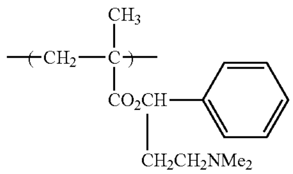
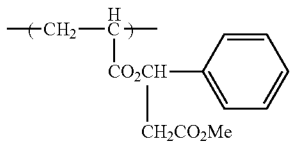
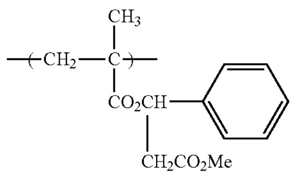
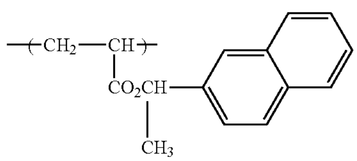
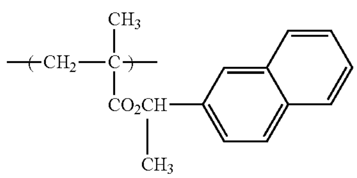
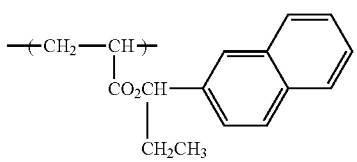
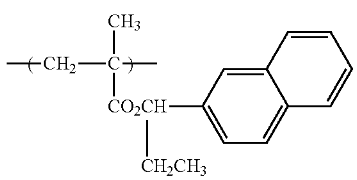
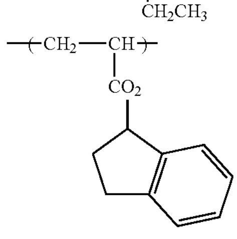
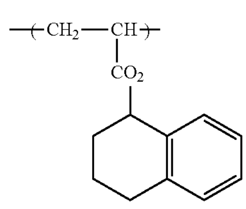
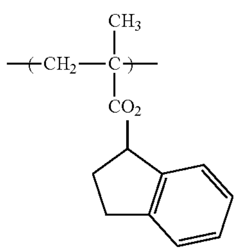
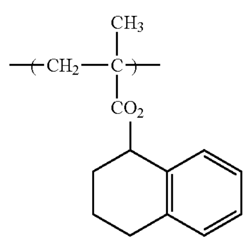
-continued
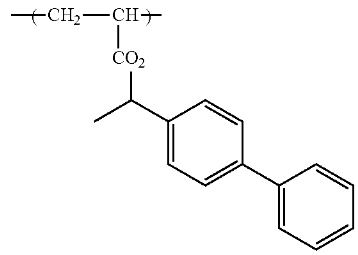
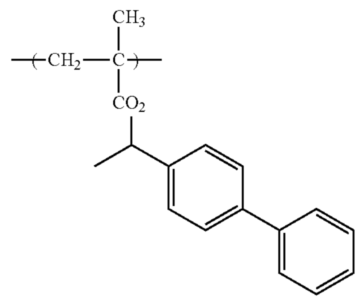
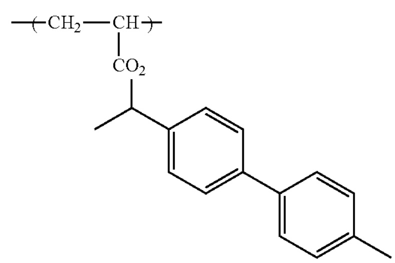
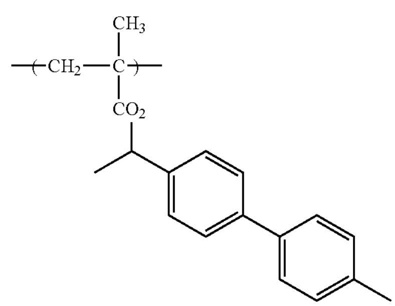
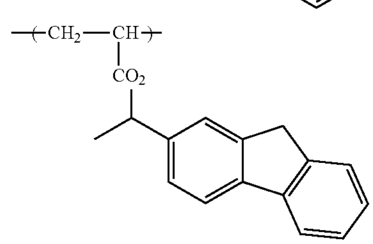
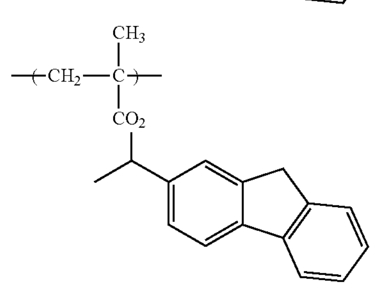

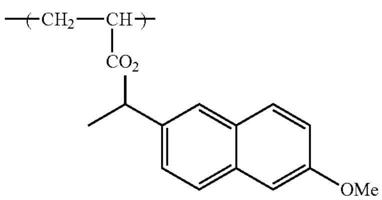
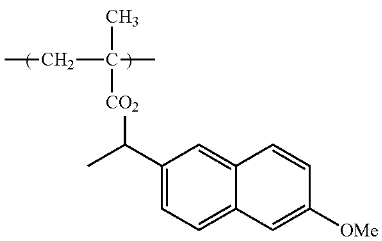
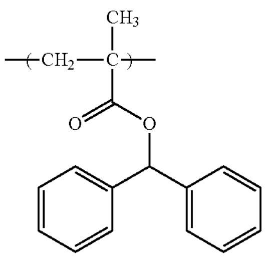
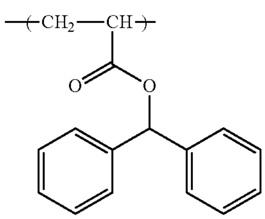
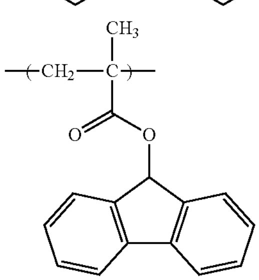
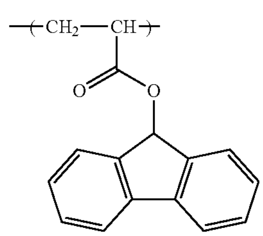
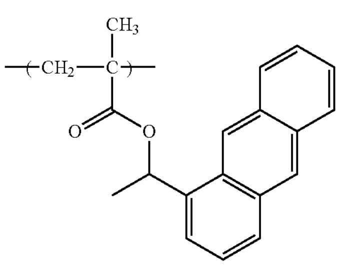
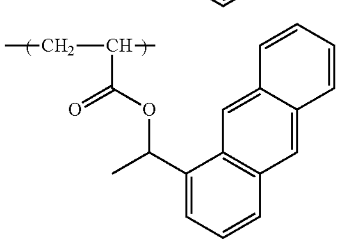
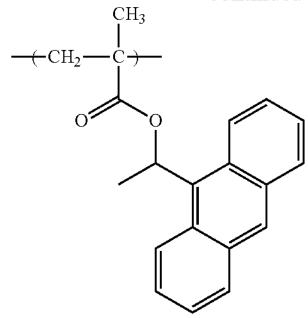
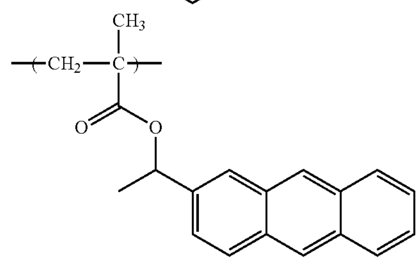
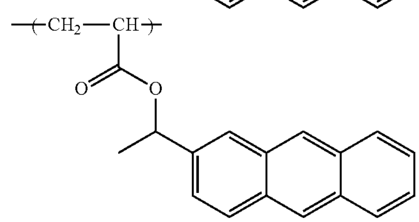
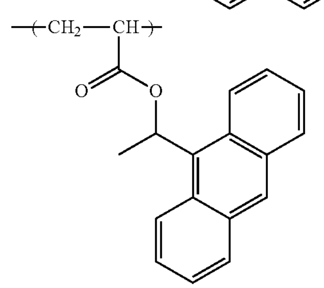
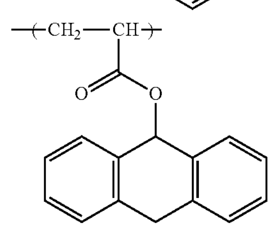
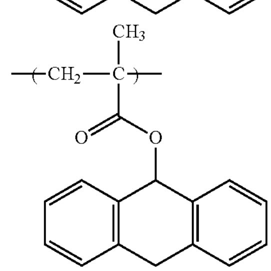
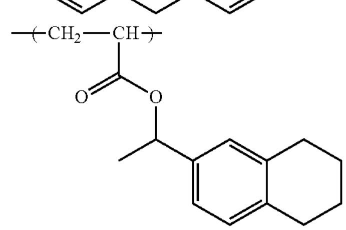

-continued

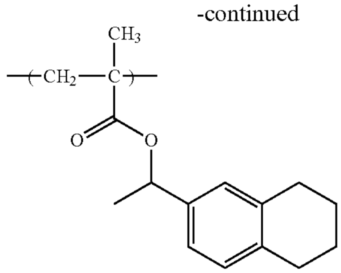

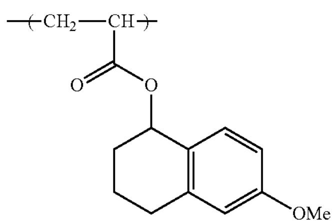

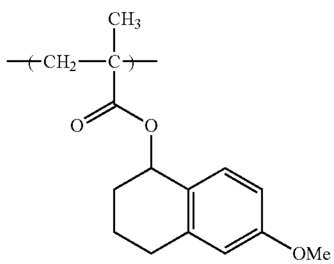

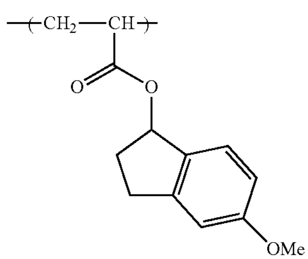

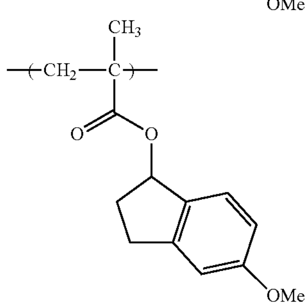

The resin (P) may or may not contain a repeating unit represented by formula (A1), (A2) or (A3), but in the case of containing a repeating unit represented by formula (A1), (A2) or (A3), the content thereof is preferably from 1 to 50 mol %, more preferably from 1 to 40 mol %, still more preferably from 1 to 30 mol %, based on all repeating units in the resin (P).

The resin (P) may further contain a non-decomposable repeating unit represented by the following formula (3):

(3)

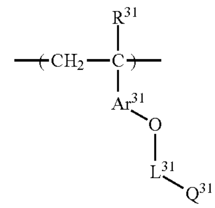

$R^{31}$ represents a hydrogen atom or a methyl group.

$Ar^{31}$ represents an arylene group.

$L^{31}$ represents a single bond or a divalent linking group.

$Q^{31}$ represents a cycloalkyl group or an aryl group.

The "non-decomposable" as used herein means that breakage of a chemical bond is not caused by the action of, for example, an acid generated upon exposure or an alkali developer.

$R^{31}$ is a hydrogen atom or a methyl group as described above and is preferably a hydrogen atom. $Ar^{31}$ represents an arylene group as described above, and specific examples and preferred ranges thereof are the same as specific examples and preferred ranges of the arylene group when in formula (2), Ar is an arylene group.

Examples of the divalent linking group of $L^{31}$ include an alkylene group, an alkenylene group, —O—, —CO—, —$NR^{32}$—, —S—, —CS—, and a combination thereof. Here, $R^{32}$ represents a hydrogen atom, an alkyl group, a cycloalkyl group, an aryl group or an aralkyl group. The total carbon number of the divalent organic group of $L^{31}$ is preferably from 1 to 15, more preferably from 1 to 10.

The alkylene group is preferably an alkylene group having a carbon number of 1 to 8, more preferably a carbon number of 1 to 4, and examples thereof include a methylene group, an ethylene group, a propylene group, a butylene group, a hexylene group and an octylene group.

The alkenylene group is preferably an alkenylene group having a carbon number of 2 to 8, more preferably a carbon number of 2 to 4.

Specific examples and preferred ranges of the alkyl group, cycloalkyl group, aryl group and aralkyl group represented by $R^{32}$ are the same as specific examples and preferred ranges of the alkyl group, cycloalkyl group, aryl group and aralkyl group represented by $R^{21}$ in formula (1).

The group as $L^{31}$ is preferably a carbonyl group, a methylene group, *—CO—$NR^{32}$—, *—CO—$(CH_2)_n$—O—, *—CO—$(CH_2)_n$—O—CO—, *—$(CH_2)_n$—COO—, *—$(CH_2)_n$—$CONR^{32}$— or *—CO—$(CH_2)_n$—$NR^{32}$—, more preferably a carbonyl group, a methylene group, *—CO—$NR^{32}$—, *—$CH_2$—COO—, *—CO—$CH_2$—O—, *—CO—$CH_2$—O—CO—, *—$CH_2$—$CONR^{32}$— or *—CO—$CH_2$—$NR^{32}$—, still more preferably a carbonyl group, a methylene group, *—CO—$NR^{32}$— or *—$CH_2$—COO—. Here, n represents an integer of 1 to 10, and * indicates a connecting site on the main chain side, that is, a connecting site to the O atom in the formula.

$Q^{31}$ represents a cycloalkyl group or an aryl group as described above and my have a substituent, and preferred examples and preferred ranges of the cycloalkyl group and aryl group are the same as specific examples and preferred ranges described for $Q^1$ in formula (1).

Specific examples of the repeating unit represented by formula (3) are illustrated below, but the present invention is not limited thereto.

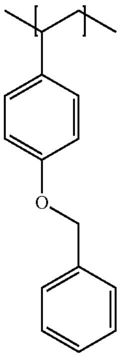
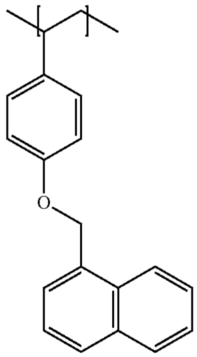
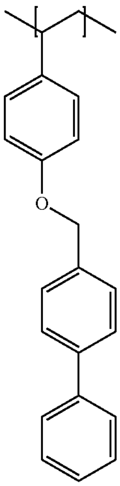
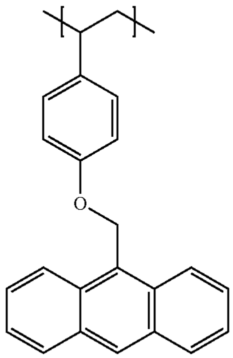
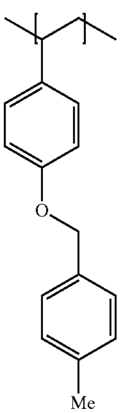
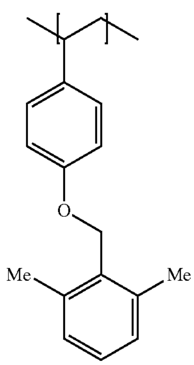
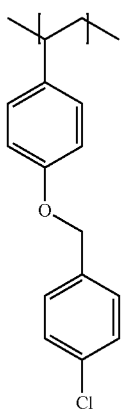
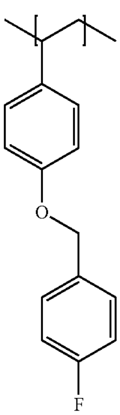
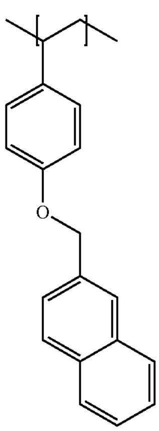
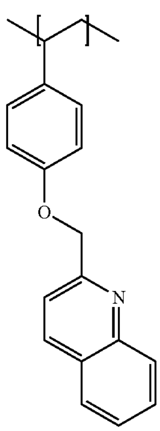
-continued
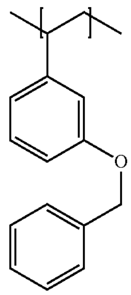
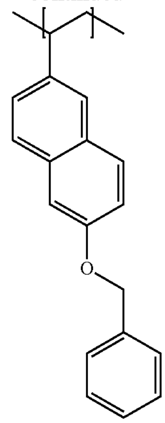
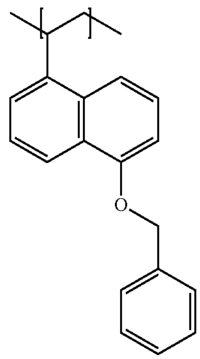
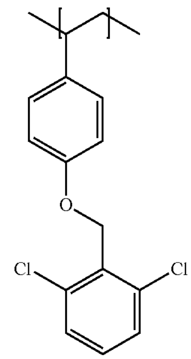
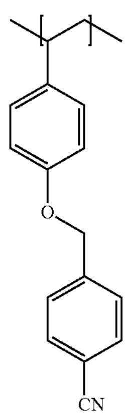
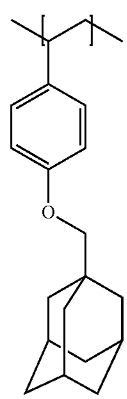
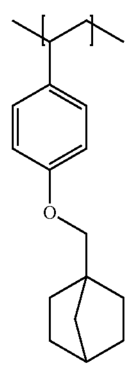
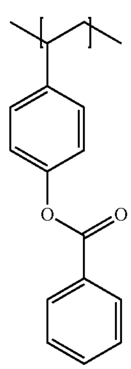
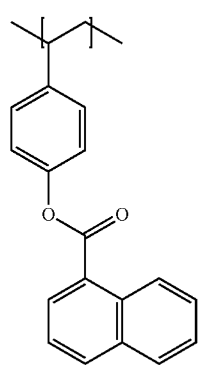

-continued
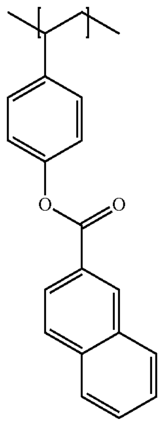
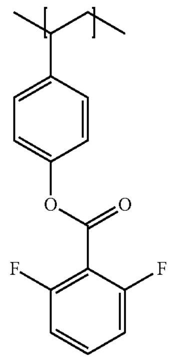
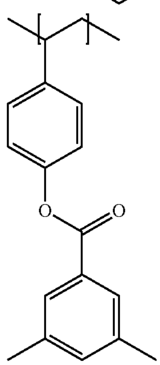
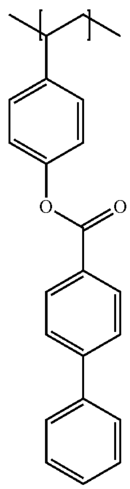
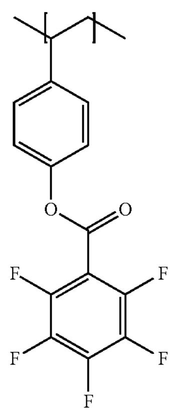
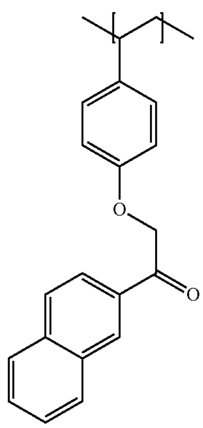
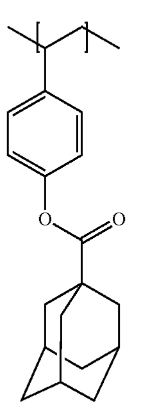
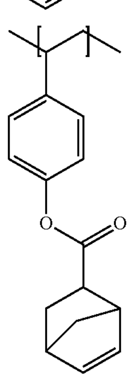
-continued
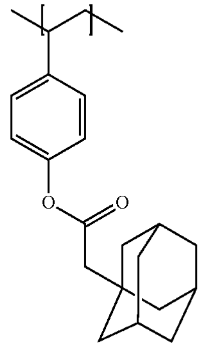
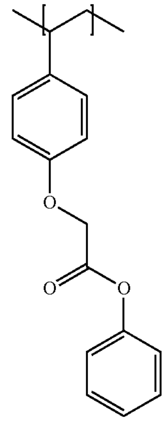
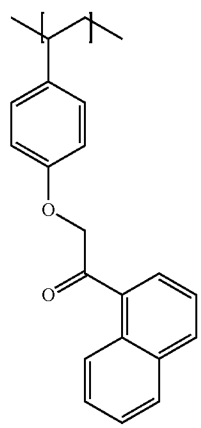
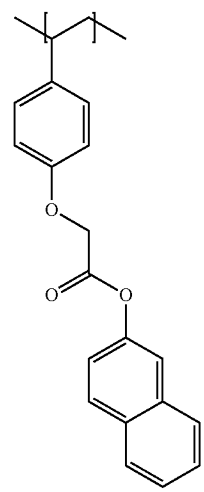
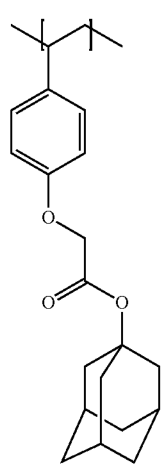
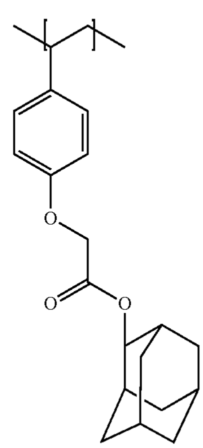

-continued

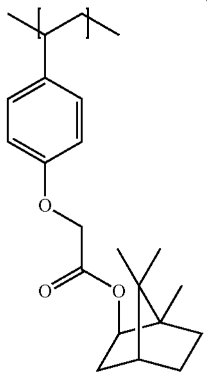

The content of the repeating unit represented by formula (3) in the resin (P) is preferably from 1 to 30 mol %, more preferably from 2 to 20 mol %, still more preferably from 2 to 10 mol %, based on all repeating units in the resin (P).

The resin (P) for use in the present invention may further contain a repeating unit represented by the following formula (4):

(4)

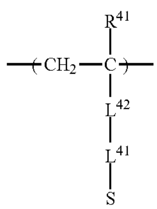

$R^{41}$ represents a hydrogen atom or a methyl group. $L^{41}$ represents a single bond or a divalent linking group. $L^{42}$ represents a divalent linking group. S represents a structural moiety capable of decomposing upon irradiation with an actinic ray or radiation to generate an acid on the side chain.

$R^{41}$ is a hydrogen atom or a methyl group as described above and is preferably a hydrogen atom.

Examples of the divalent linking group of $L^{41}$ and $L^{42}$ include an alkylene group, a cycloalkylene group, an arylene group, —O—, —$SO_2$—, —CO—, —N(R)—, —S—, —CS—, and a combination of two or more thereof, and a linking group having a total carbon number of 20 or less is preferred. Here, R represents an aryl group, an alkyl group or a cycloalkyl group.

The divalent linking group of $L^{42}$ is preferably an arylene group, and specific examples and preferred ranges thereof are the same as specific examples and preferred ranges of the arylene group when in formula (2), Ar is an arylene group.

In the case where the resin (P) contains a repeating unit represented by formula (4), for example, at least one of resolution, roughness characteristics and EL (exposure latitude) is more improved.

The alkylene group of $L^{41}$ and $L^{42}$ is preferably an alkylene group having a carbon number of 1 to 12, such as methylene group, ethylene group, propylene group, butylene group, hexylene group, octylene group, and a dodecanylene group.

The cycloalkylene group of $L^{41}$ and $L^{42}$ is preferably a cycloalkylene group having a carbon number of 5 to 8, such as cyclopentylene group and cyclohexylene group.

The arylene group of $L^{41}$ and $L^{42}$ is preferably an arylene group having a carbon number of 6 to 14, such as phenylene group and naphthylene group.

These alkylene group, cycloalkylene group and arylene group may further have a substituent. Examples of the substituent include an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group, and a nitro group.

S represents a structural moiety capable of decomposing upon irradiation with an actinic ray or radiation to generate an acid on the side chain.

S is preferably a structural moiety capable of decomposing upon irradiation with an actinic ray or radiation to generate an acid anion on the side chain of the resin, and the structural moiety is preferably a structural moiety contained in a photoinitiator for cationic photopolymerization, a photoinitiator for radical photopolymerization, a photodecoloring agent for dyes, a photodiscoloring agent, or a known compound capable of generating an acid by light, more preferably an ionic structural moiety.

S is more preferably an ionic structural moiety containing a sulfonium salt or an iodonium salt. More specifically, S is preferably a group represented by the following formula (PZI) or (PZII):

(PZI)

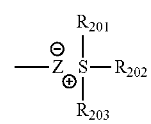

(PZII)

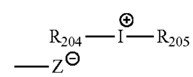

In formula (PZI), each of $R_{201}$ to $R_{203}$ independently represents an organic group.

The carbon number of the organic group as $R_{201}$ to $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amido bond or a carbonyl group. Examples of the group formed by combining two members out of $R_{201}$ to $R_{203}$ include an alkylene group (e.g., butylene group, pentylene group). When a repeating unit where two members out of $R_{201}$ to $R_{203}$ are combined to form a ring structure is used, it can be advantageously expected that the exposure machine can be kept from contamination by a decomposition product during exposure.

$Z^-$ represents an acid anion generated resulting from decomposition upon irradiation with an actinic ray or radiation and is preferably a non-nucleophilic anion. Examples of the non-nucleophilic anion include sulfonate anion, carboxylate anion, sulfonylimide anion, bis(alkylsulfonyl)imide anion, and tris(alkylsulfonyl)methyl anion.

The non-nucleophilic anion is an anion having an extremely low ability of causing a nucleophilic reaction, and this anion can suppress the decomposition with aging due to intramolecular nucleophilic reaction. Thanks to this anion, the aging stability of the resin and in turn, the aging stability of the composition are enhanced.

Examples of the organic group of $R_{201}$ to $R_{203}$ include an aryl group, an alkyl group, a cycloalkyl group, a cycloalkenyl group, and an indolyl group. Here, in the cycloalkyl group and the cycloalkenyl group, at least one of carbon atoms forming the ring may be a carbonyl carbon.

At least one of $R_{201}$ to $R_{203}$ is preferably an aryl group, and it is more preferred that those three members all are an aryl group.

The aryl group in $R_{201}$, $R_{202}$ and $R_{203}$ is preferably a phenyl group or a naphthyl group, more preferably a phenyl group.

The alkyl group, cycloalkyl group and cycloalkenyl group of $R_{201}$, $R_{202}$ and $R_{203}$ are preferably a linear or branched alkyl group having a carbon number of 1 to 10 (e.g., methyl group, ethyl group, propyl group, butyl group, pentyl group), a cycloalkyl group having a carbon number of 3 to 10 (e.g., cyclopentyl group, cyclohexyl group, norbornyl group), and a cycloalkenyl group having a carbon number of 3 to 10 (e.g., pentadienyl group, cyclohexenyl group).

The organic group as $R_{201}$, $R_{202}$ and $R_{203}$, such as aryl group, alkyl group, cycloalkyl group, cycloalkenyl group and indolyl group, may further have a substituent. Examples of the substituent include, but are not limited to, a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an arylthio group (preferably having a carbon number of 6 to 14), a hydroxyalkyl group (preferably having a carbon number of 1 to 15), an alkylcarbonyl group (preferably having a carbon number of 2 to 15), a cycloalkylcarbonyl group (preferably having a carbon number of 4 to 15), an arylcarbonyl group (preferably having a carbon number of 7 to 14), a cycloalkenyloxy group (preferably having a carbon number of 3 to 15), and a cycloalkenylalkyl group (preferably having a carbon number of 4 to 20).

In the cycloalkyl group and cycloalkenyl group as the substituent which may be substituted on each of the groups of $R_{201}$, $R_{202}$ and $R_{203}$, at least one of carbon atoms forming the ring may be a carbonyl carbon.

The substituent which may be substituted on each of the groups of $R_{201}$, $R_{202}$ and $R_{203}$ may further have a substituent, and examples of this further substituent are the same as examples of the substituent which may be substituted on each of the groups of $R_{201}$, $R_{202}$ and $R_{203}$, but an alkyl group and a cycloalkyl group are preferred.

The preferred structure when at least one of $R_{201}$ to $R_{203}$ is not an aryl group includes cation structures such as compounds illustrated in paragraphs 0046 and 0047 of JP-A-2004-233661 and paragraphs 0040 to 0046 of JP-A-2003-35948, Compounds (I-1) to (I-70) illustrated in U.S. Patent Application Publication No. 2003/0224288, and Compounds (IA-1) to (IA-54) and (IB-1) to (IB-24) illustrated in U.S. Patent Application Publication No. 2003/0077540.

In formula (PZII), each of $R_{204}$ and $R_{205}$ independently represents an aryl group, an alkyl group or a cycloalkyl group. These aryl, alkyl and cycloalkyl groups are the same as the aryl, alkyl and cycloalkyl groups of $R_{201}$ to $R_{203}$ in the compound (PZI).

The aryl group of $R_{204}$ and $R_{205}$ may be an aryl group having a heterocyclic structure containing an oxygen atom, a nitrogen atom or a sulfur atom. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran), and a benzothiophene residue (a group formed by removing one hydrogen atom from a benzothiophene).

The aryl group, alkyl group and cycloalkyl group of $R_{204}$ and $R_{205}$ may have a substituent. Examples of the substituent include those of the substituent which the aryl group, alkyl group and cycloalkyl group of $R_{201}$ to $R_{203}$ in the compound (PZI) may have.

$Z^-$ represents an acid anion generated resulting from decomposition upon irradiation with an actinic ray or radiation and is preferably a non-nucleophilic anion, and examples thereof are the same as those for $Z^-$ in formula (PZI).

Specific preferred examples of S are illustrated below, but the present invention is not limited thereto. Incidentally, the mark * indicates a bond to $L^{41}$.

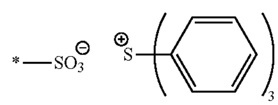

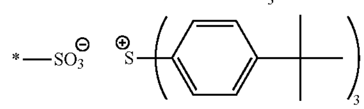

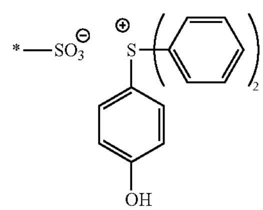

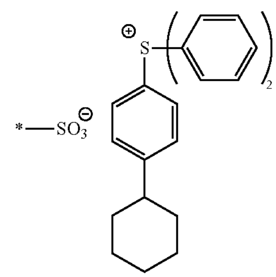

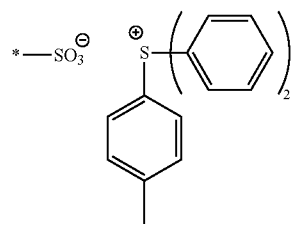

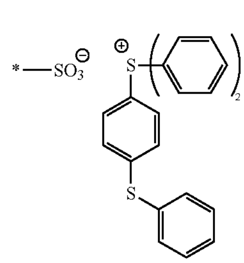

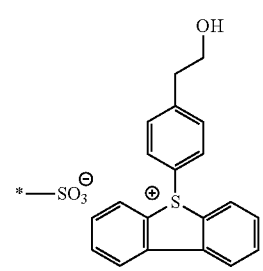

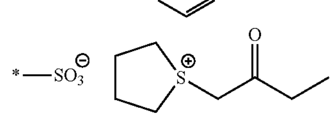

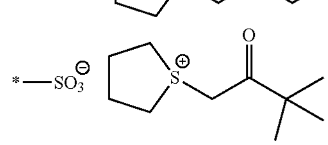

-continued
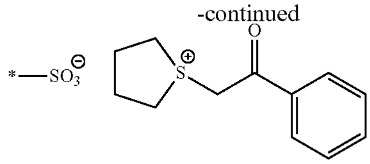
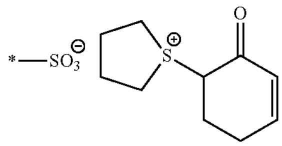
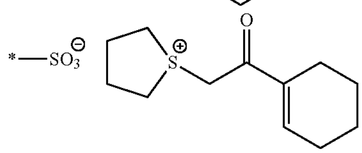
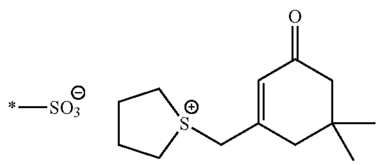
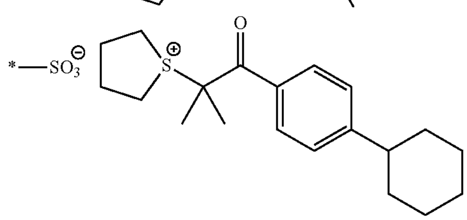
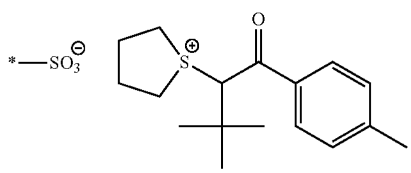
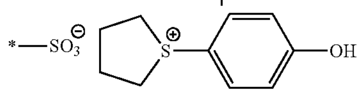
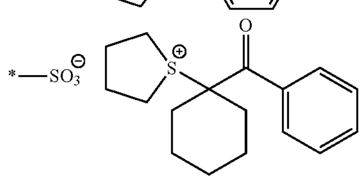
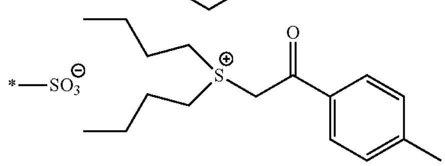
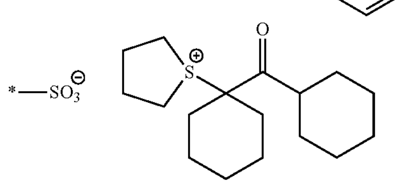
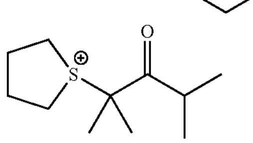
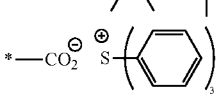
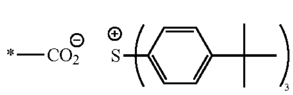
-continued
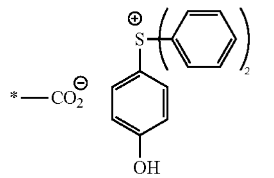
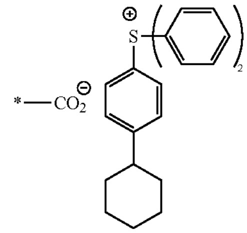
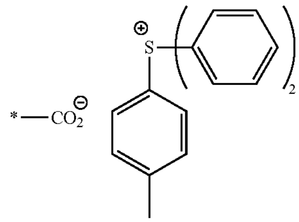
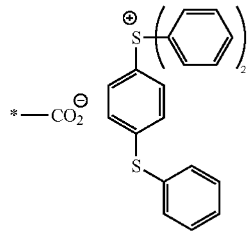
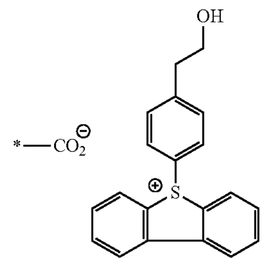
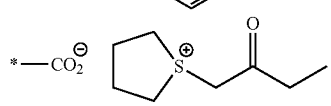
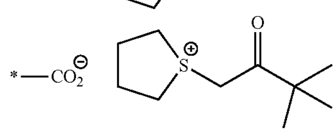
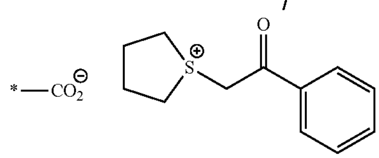
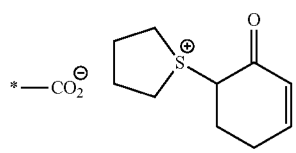
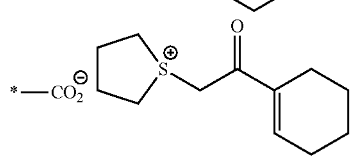
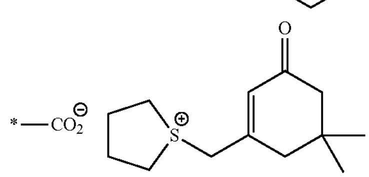
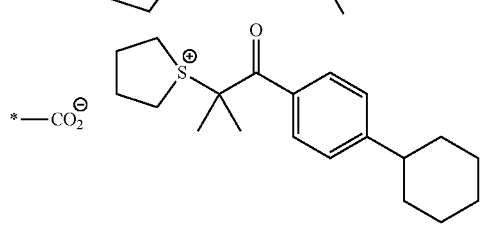

-continued
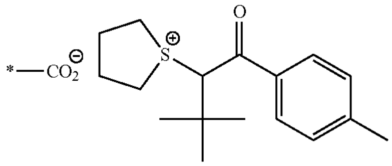
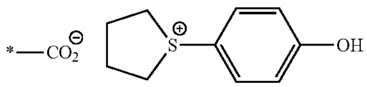
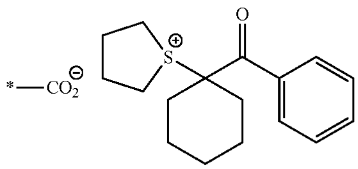
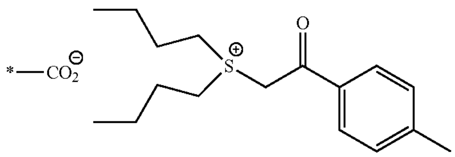
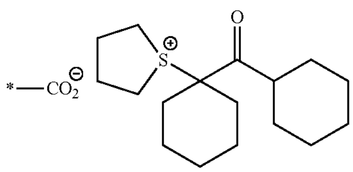
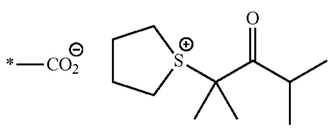
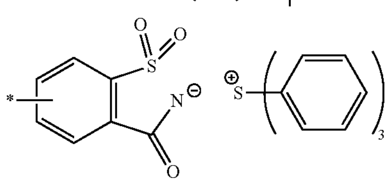
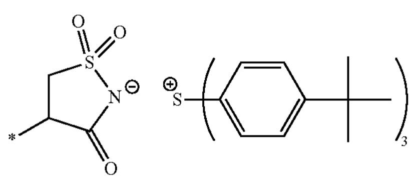
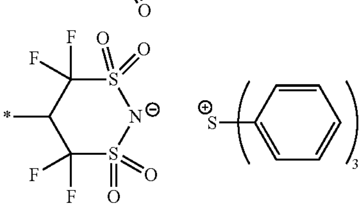
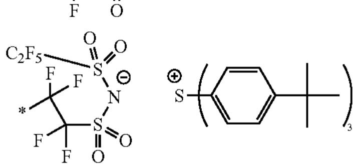
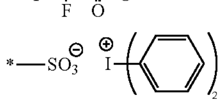
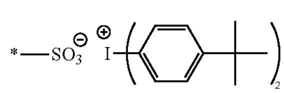
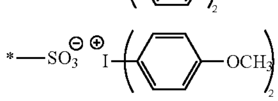
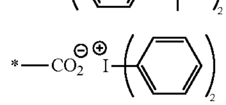
-continued
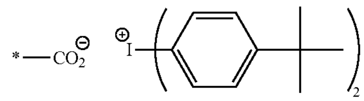
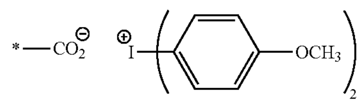
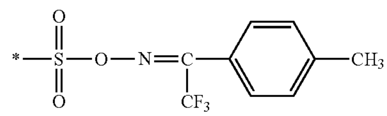
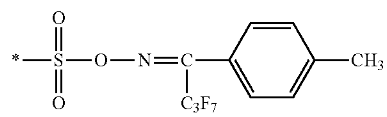
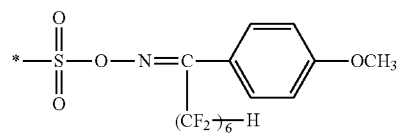
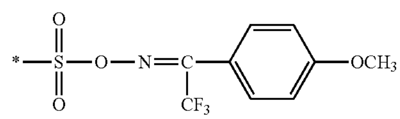
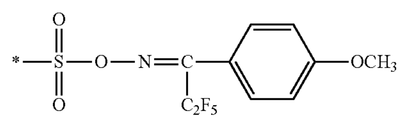
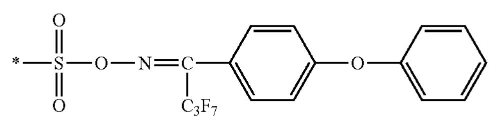
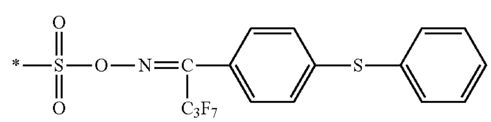
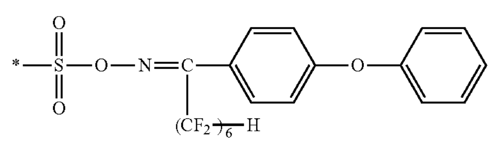
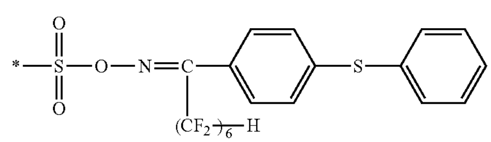
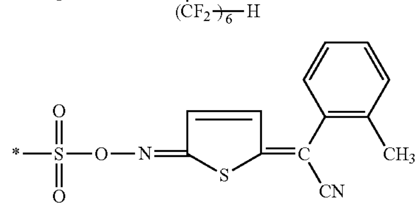
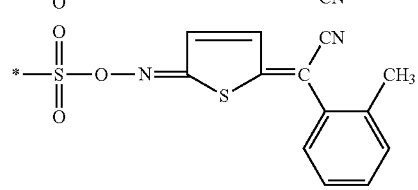

-continued

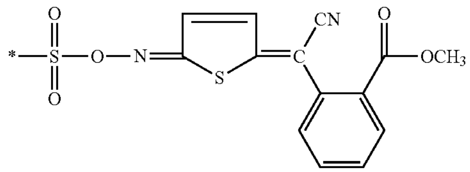

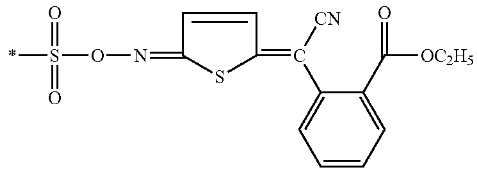

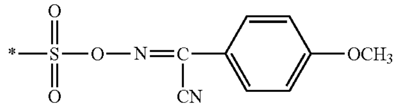

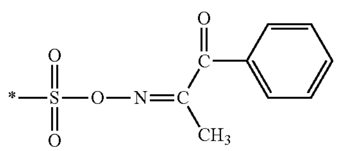

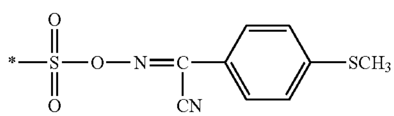

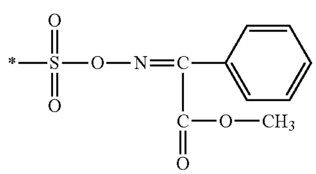

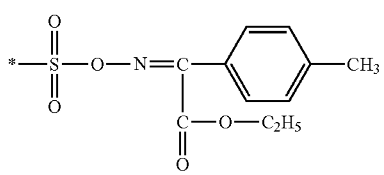

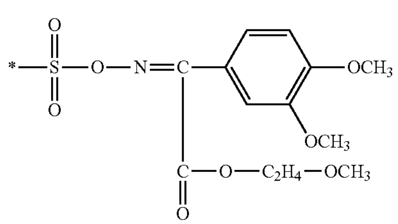

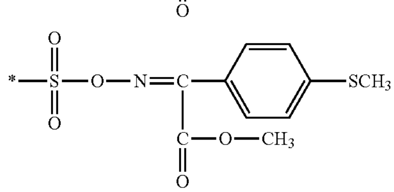

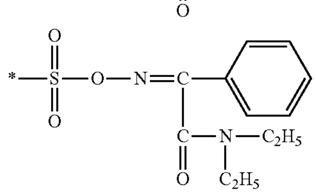

-continued

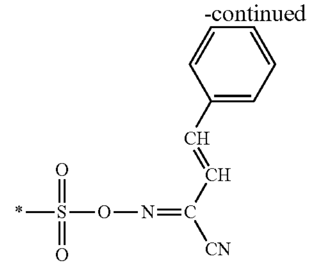

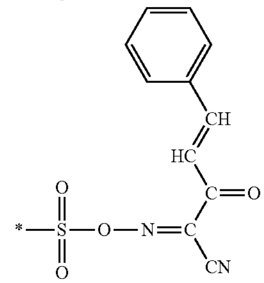

The moiety corresponding to ($-L^{41}-S$) of the repeating unit represented by formula (4) is preferably represented by the following formula (6):

$$—O—L^{61}—Ar^{61}—SO_3^- \quad R_{201}S^{+}(R_{202})R_{203} \tag{6}$$

In the formula, $L^{61}$ represents a divalent linking group, and $Ar^{61}$ represents an arylene group. $R_{201}$, $R_{202}$ and $R_{203}$ have the same meanings as $R_{201}$, $R_{202}$ and $R_{203}$ in formula (PZI), respectively.

Examples of the divalent linking group of $L^{61}$ include an alkylene group, a cycloalkylene group, —O—, —$SO_2$—, —CO—, —N(R)—, —S—, —CS—, and a combination thereof. Here, R has the same meaning as R in $L^{41}$ of formula (4). The total carbon number of the divalent organic group of $L^{61}$ is preferably from 1 to 15, more preferably from 1 to 10.

Examples of the alkylene group and cycloalkylene group of $L^{61}$ are the same as those of the alkylene group and cycloalkylene group of $L^{41}$ in formula (4), and preferred examples are also the same.

The group as $L^{61}$ is preferably a carbonyl group, a methylene group, *—CO—$(CH_2)_n$—O—, *—CO—$(CH_2)_n$—O—CO—, *—$(CH_2)_n$—COO—, *—$(CH_2)_n$—CONR— or *—CO—$(CH_2)_n$—NR—, more preferably a carbonyl group, *—$CH_2$—COO—, *—CO—$CH_2$—O—, *—CO—$CH_2$—O—CO—, *—$CH_2$—CONR— or *—CO—$CH_2$—NR—. Here, n represents an integer of 1 to 10. n is preferably an integer of 1 to 6, more preferably an integer of 1 to 3, and most preferably 1. Also, * indicates a connecting site on the main chain side, that is, a connecting site to the O atom in the formula.

$Ar^{61}$ represents an arylene group and may have a substituent. The substituent which $Ar^{61}$ may have is an alkyl group (preferably having a carbon number of 1 to 8, more preferably a carbon number of 1 to 4), an alkoxy group (preferably having a carbon number of 1 to 8, more preferably a carbon number of 1 to 4), or a halogen atom (preferably a fluorine atom, a chlorine atom, a bromide atom or an iodine atom, more preferably a fluorine atom). The aromatic ring of $Ar^{61}$ may be an aromatic hydrocarbon ring (for example, a benzene ring or a naphthalene ring) or an aromatic heterocyclic ring (for example, a quinoline ring) and preferably has a carbon number of 6 to 18, more preferably a carbon number of 6 to 12.

$Ar^{61}$ is preferably an unsubstituted arylene group or an arylene group substituted with an alkyl group or a fluorine atom, more preferably a phenylene group or a naphthylene group.

Specific examples and preferred examples of $R_{201}$, $R_{202}$ and $R_{203}$ are the same as those described for $R_{201}$, $R_{202}$ and $R_{203}$ in formula (PZI).

The synthesis method of the monomer corresponding to the repeating unit represented by formula (4) is not particularly limited but, for example, in the case of an onium structure, includes a method of exchanging an acid anion having a polymerizable unsaturated bond corresponding to the repeating unit with a halide of a known onium salt.

More specifically, a metal ion salt (for example, sodium ion or potassium ion) or ammonium salt (such as ammonium or triethylammonium salt) of an acid having a polymerizable unsaturated bond corresponding to the repeating unit and an onium salt having a halogen ion (such as chloride ion, bromide ion or iodide ion) are stirred in the presence of water or methanol to perform an anion exchange reaction, and the reaction product is subjected to separation and washing operations with an organic solvent such as dichloromethane, chloroform, ethyl acetate, methyl isobutyl ketone and tetrahydroxyfuran, and water, whereby the objective monomer corresponding to the repeating unit represented by formula (4) can be synthesized The monomer can be also synthesized by stirring the compounds above in the presence of an organic solvent separable from water, such as dichloromethane, chloroform, ethyl acetate, methyl isobutyl ketone and tetrahydroxyfuran, and water to perform an anion exchange reaction, and subjecting the reaction product to separation and washing operations with water.

Furthermore, the repeating unit represented by formula (4) can be also synthesized by introducing an acid anion moiety into the side chain by a polymer reaction and introducing an onium salt through salt exchange.

Specific examples of the repeating unit represented by formula (4) are illustrated below, but the present invention is not limited thereto.

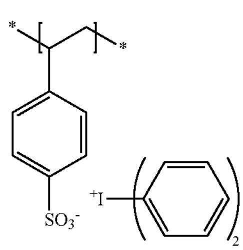

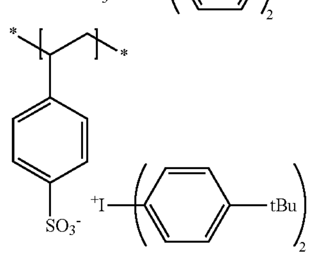

-continued

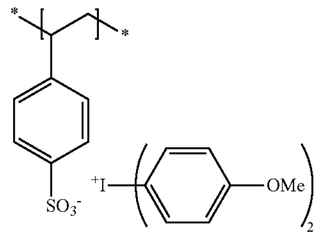

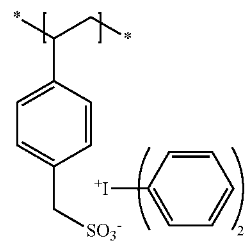

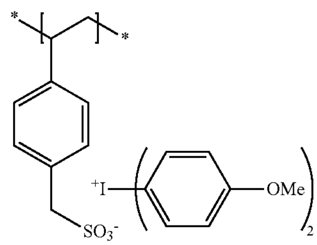

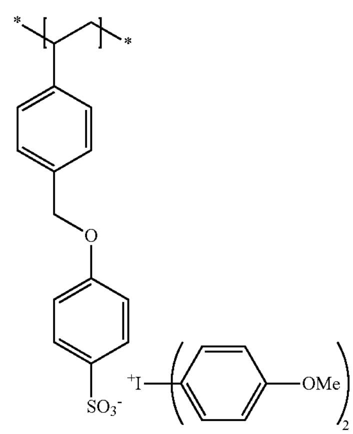

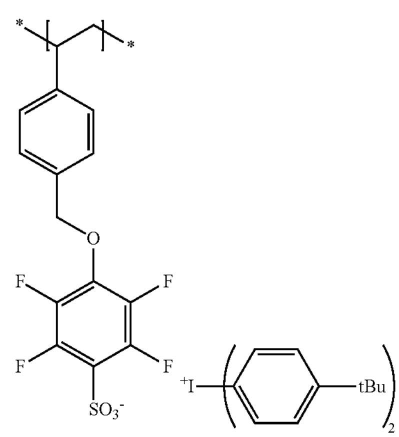

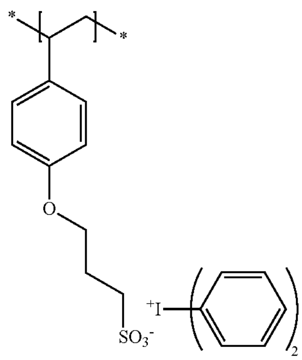
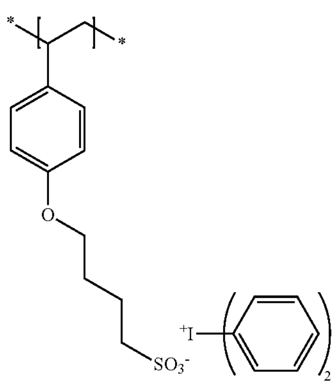
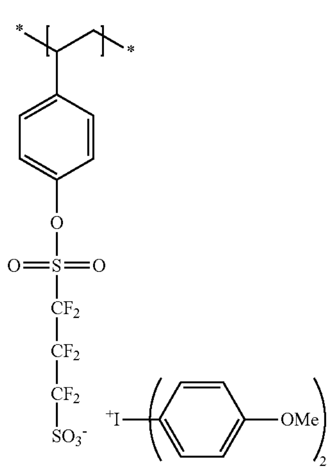
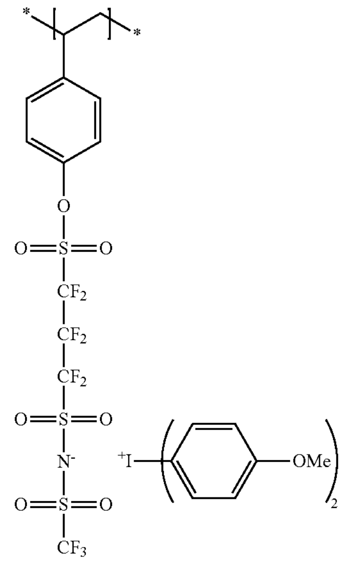
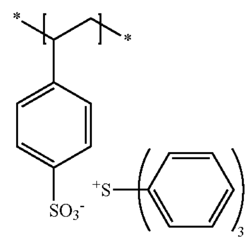
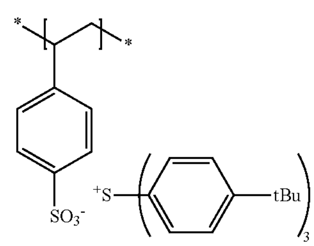
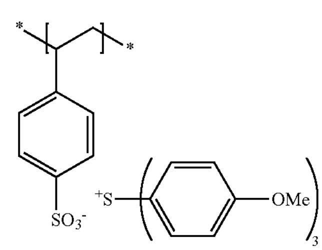
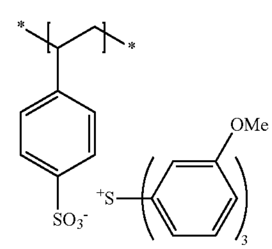

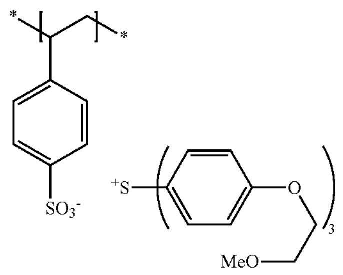
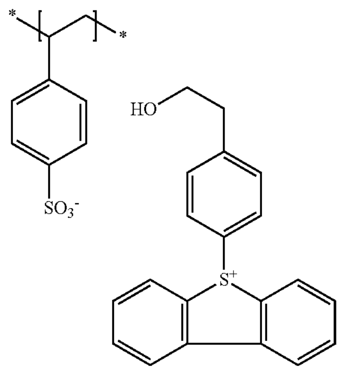
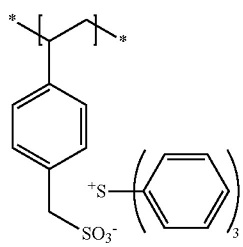
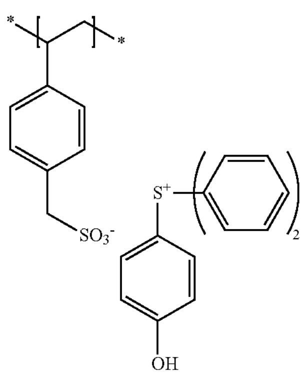
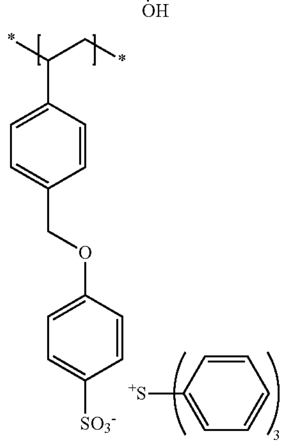
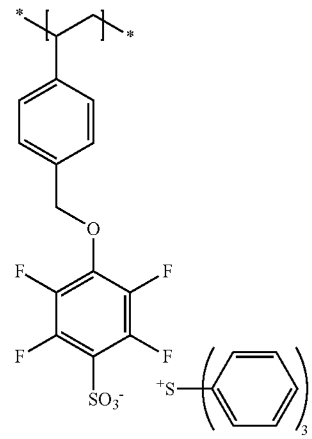
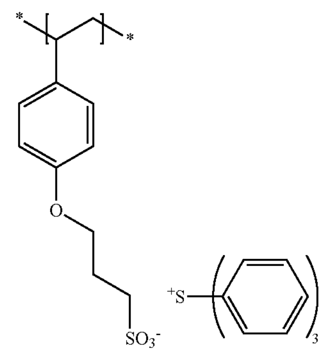
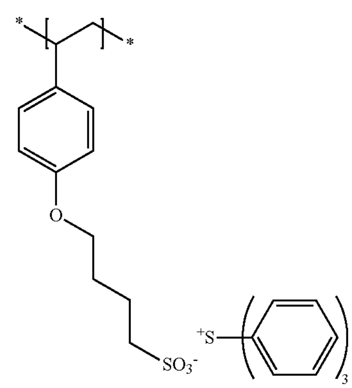
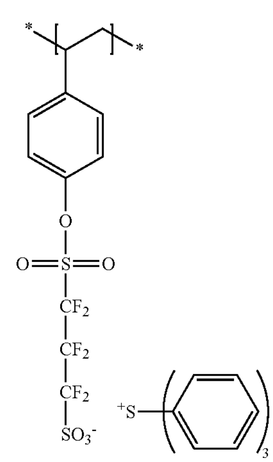

-continued
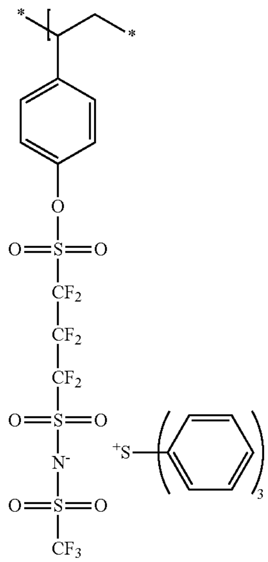
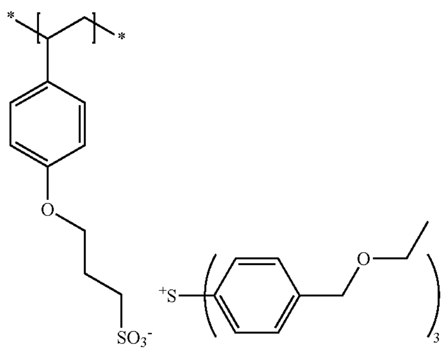
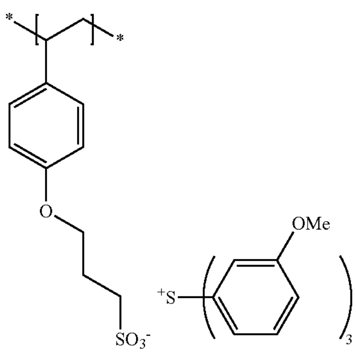
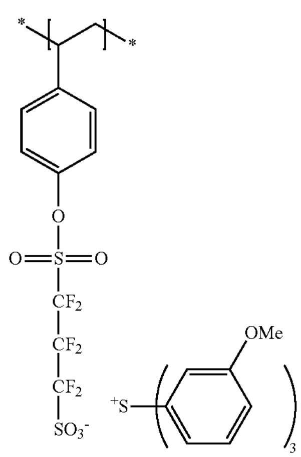
-continued
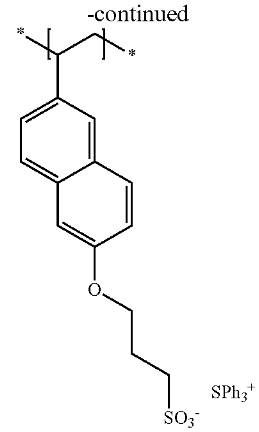
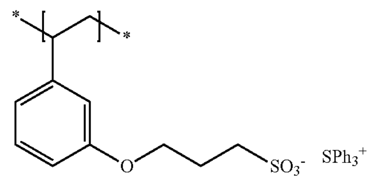
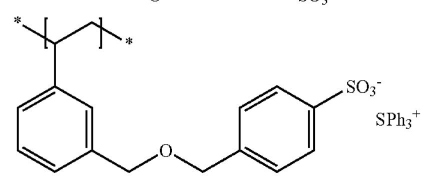
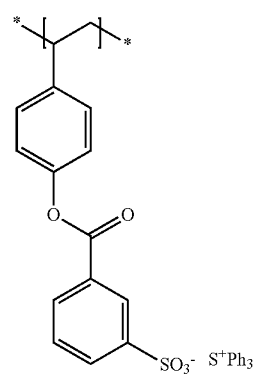
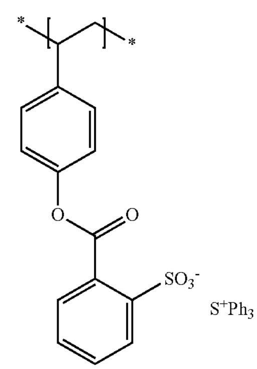
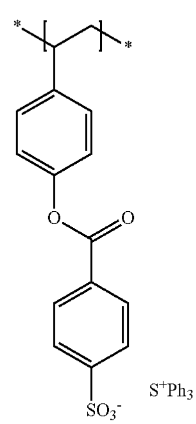
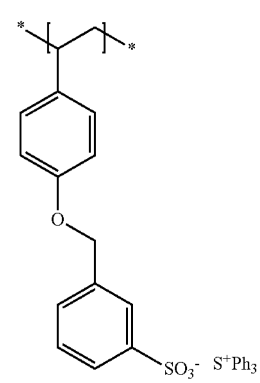

-continued
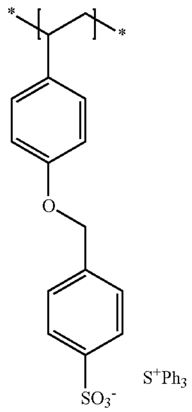
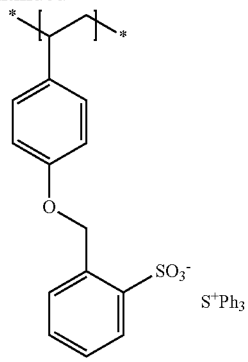
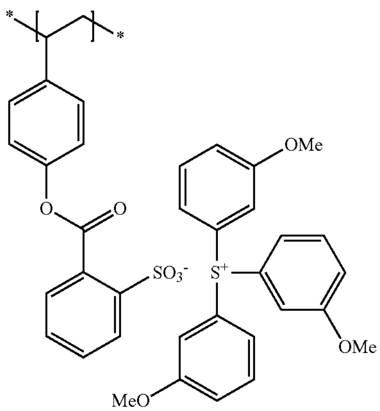
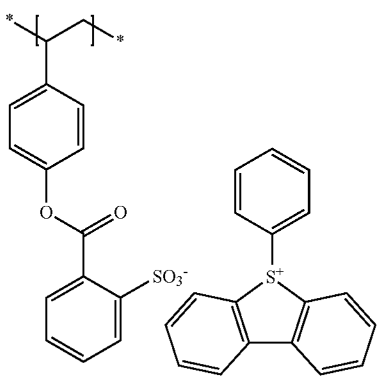
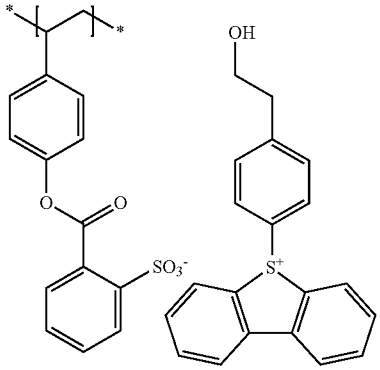
-continued
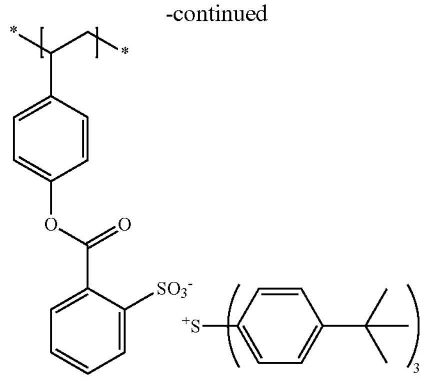
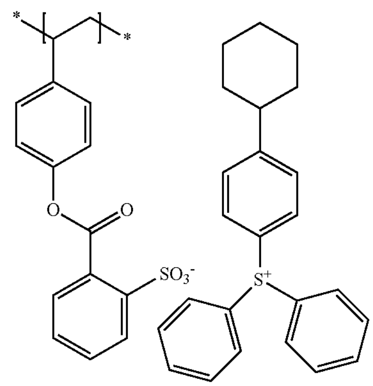
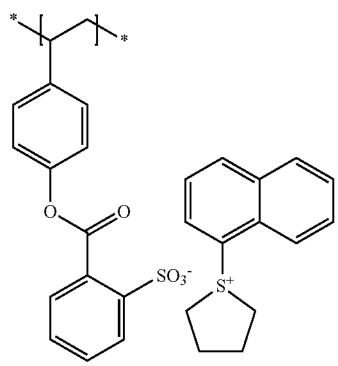
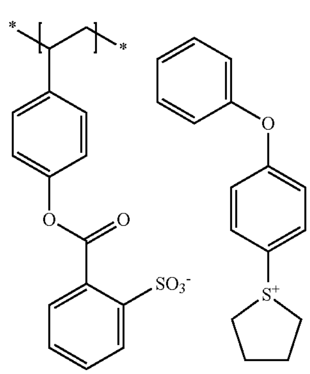

-continued
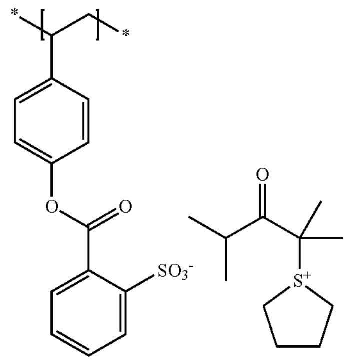
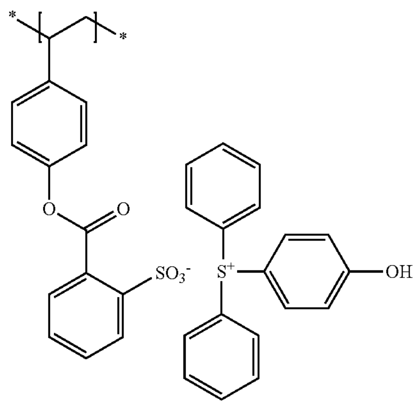
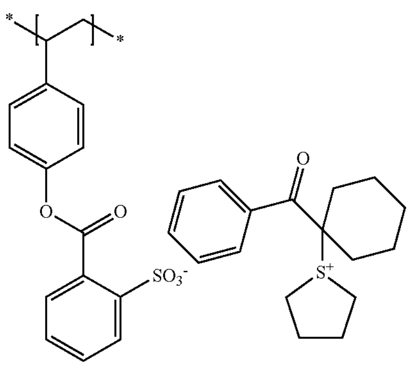
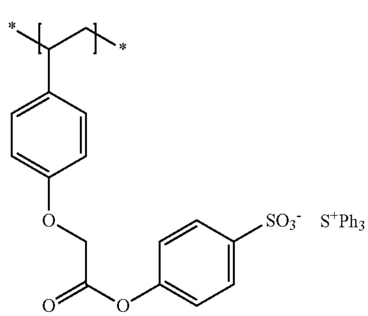
-continued
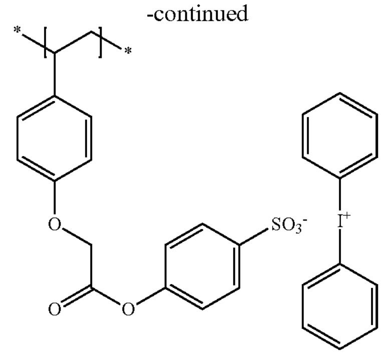
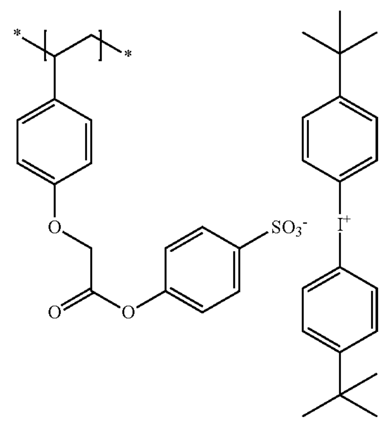
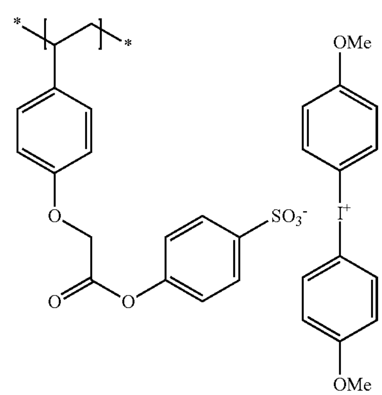
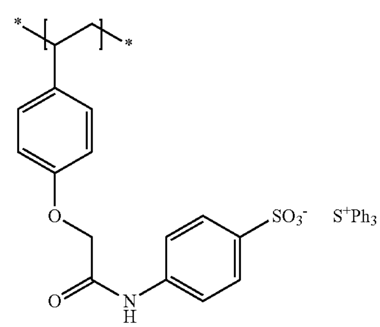

-continued
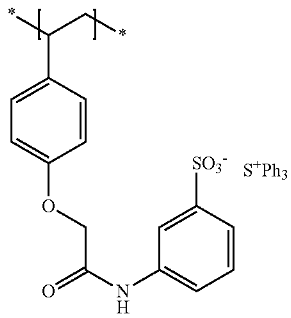
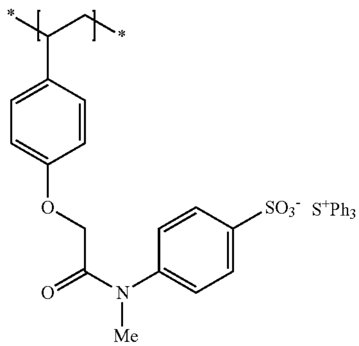
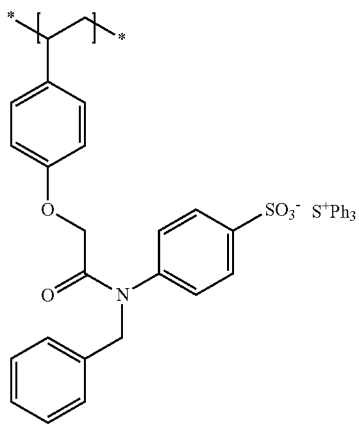
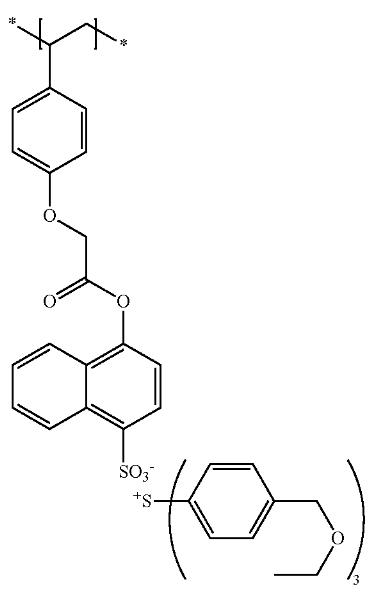
-continued
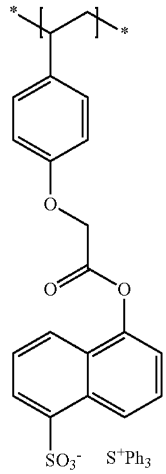
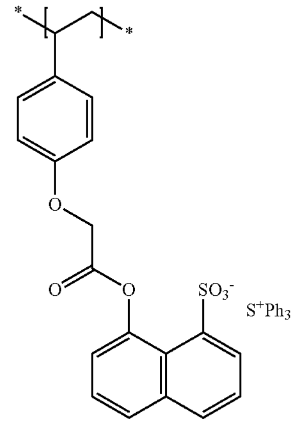
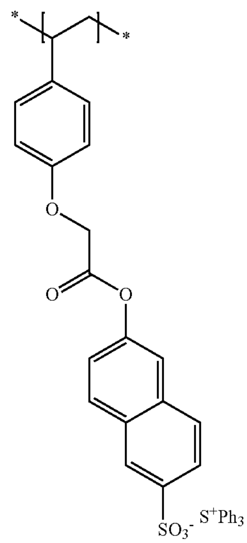
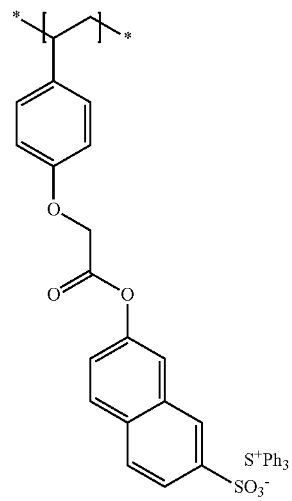
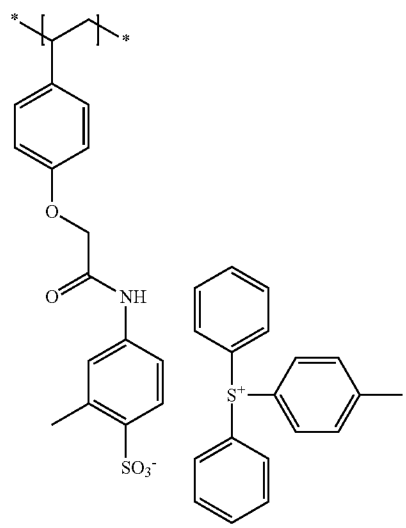

-continued
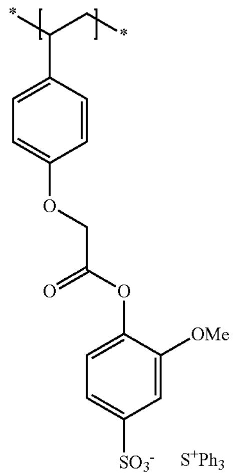
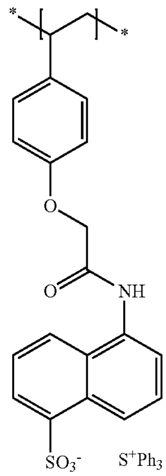
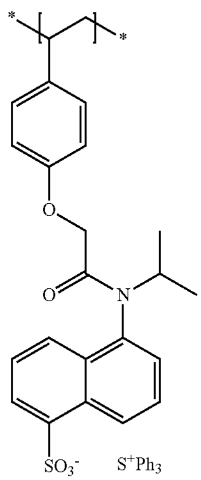
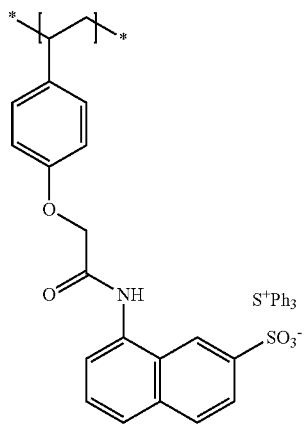
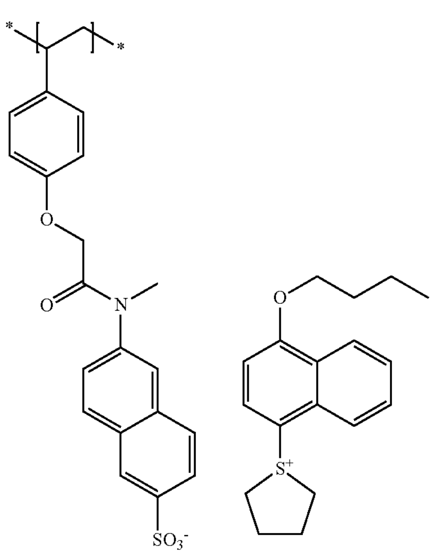
-continued
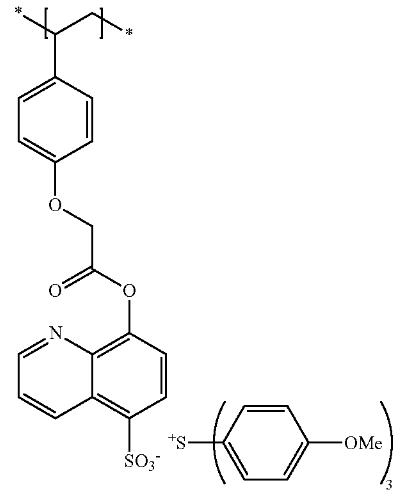
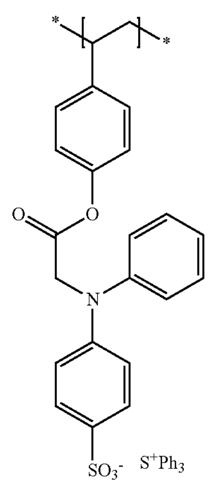
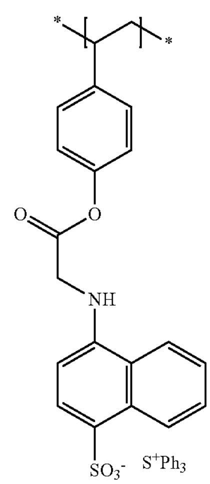
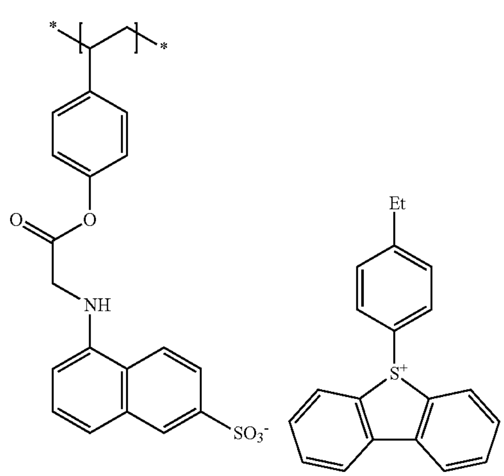

-continued
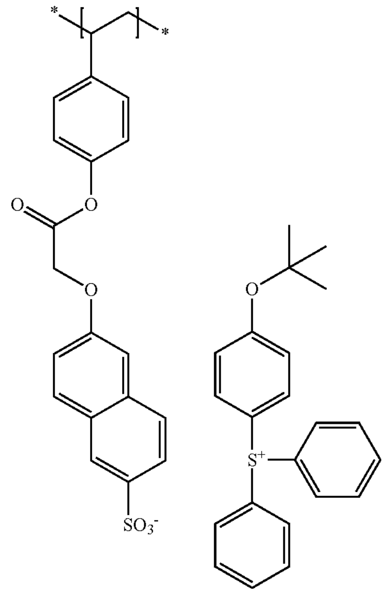
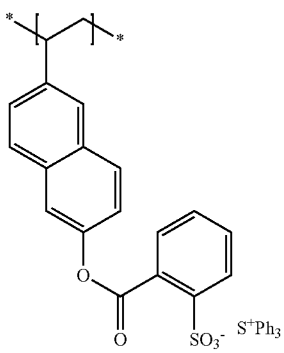
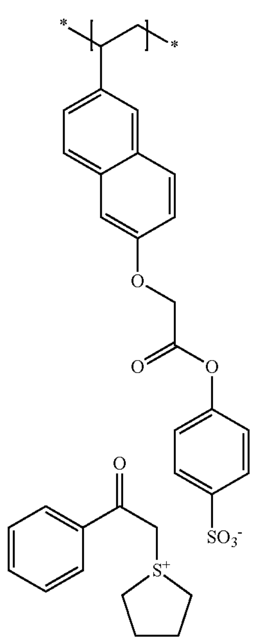
-continued
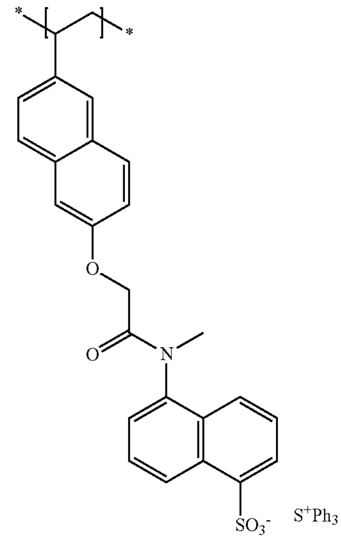
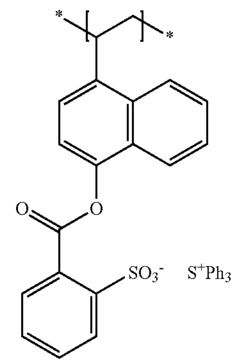
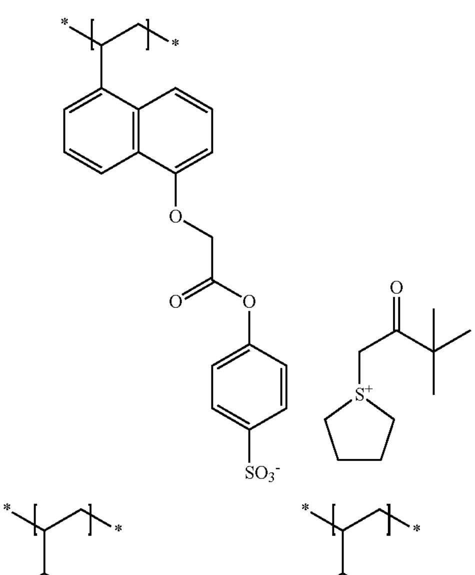
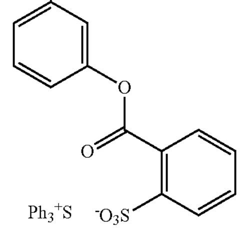
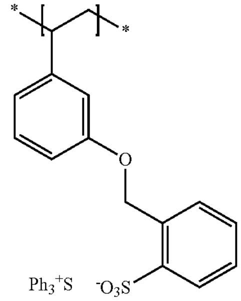

-continued
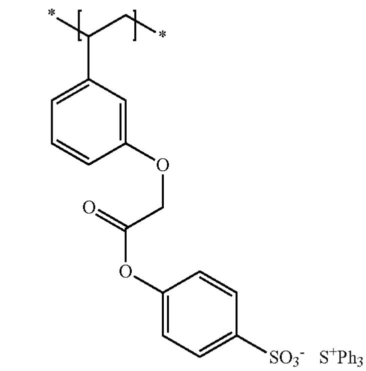
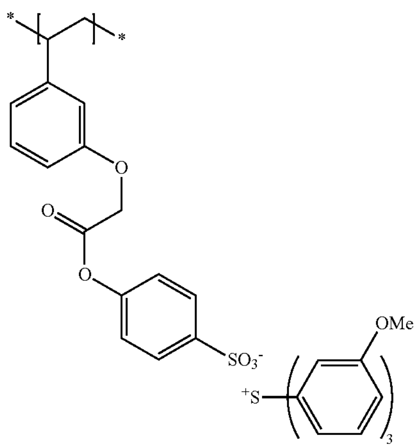
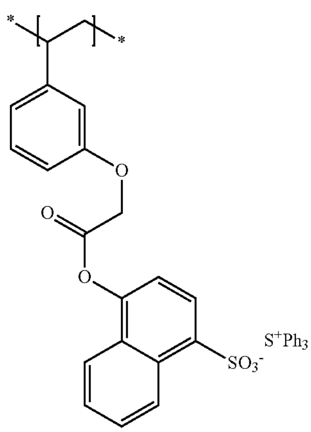
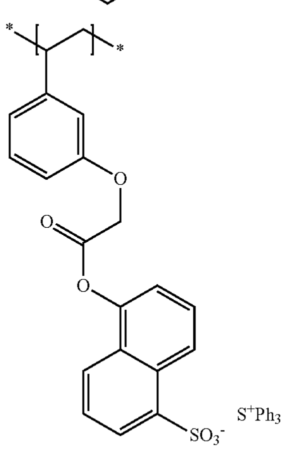
-continued
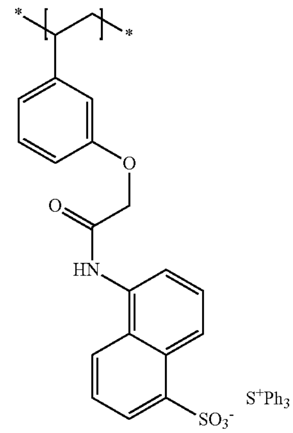
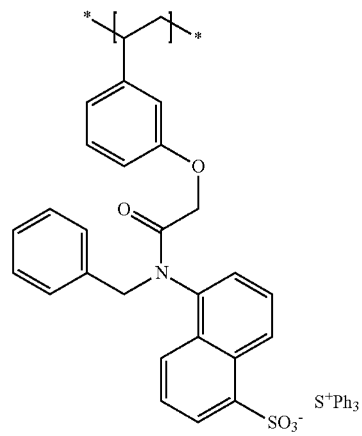
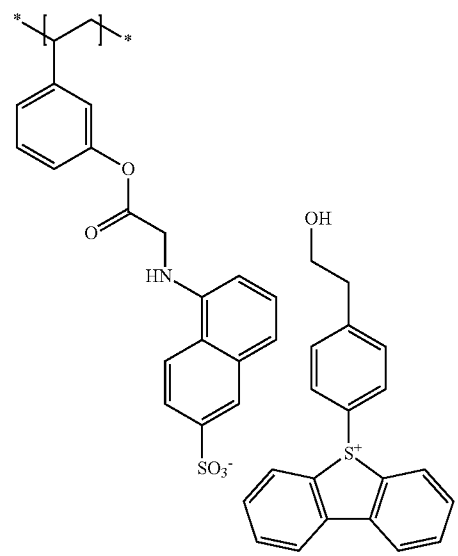
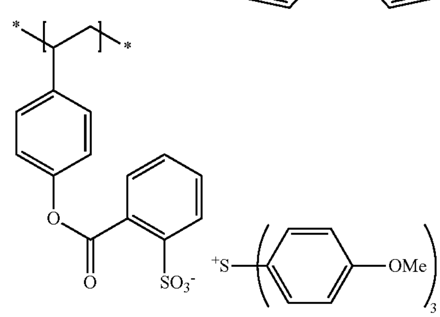

-continued
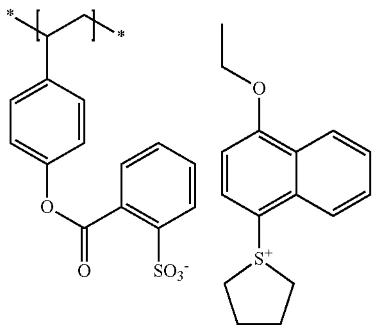
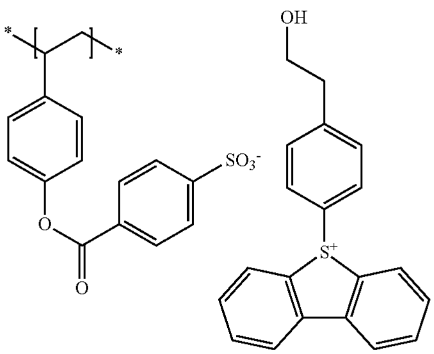
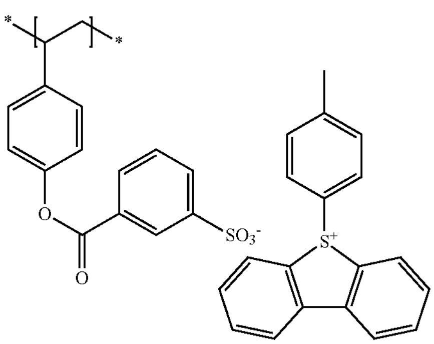
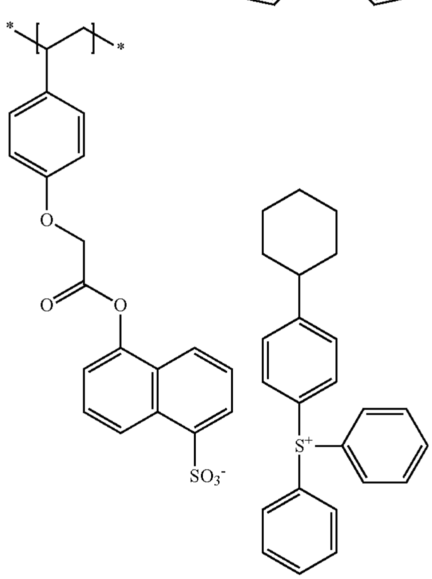
-continued
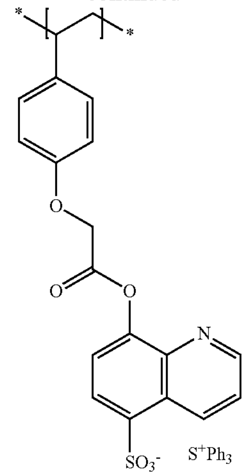
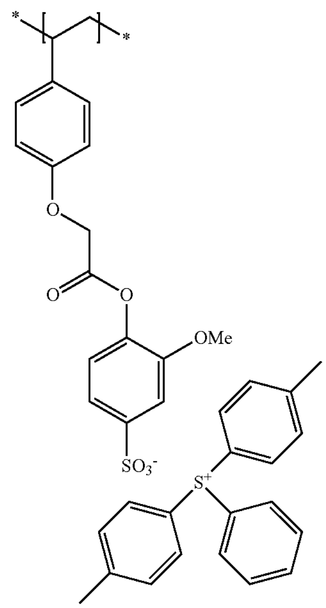
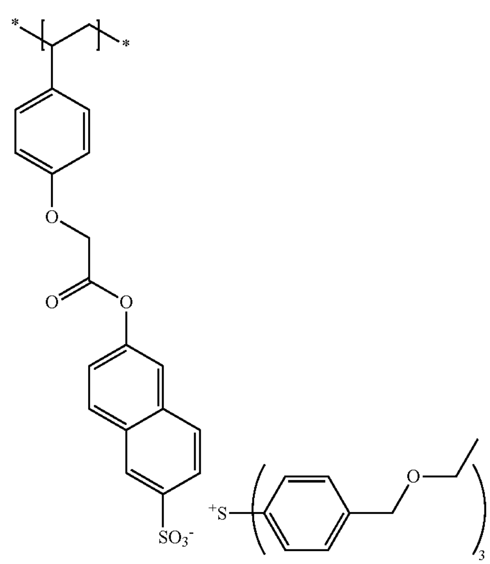

-continued
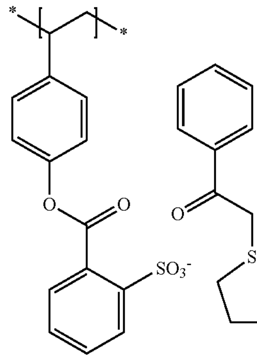
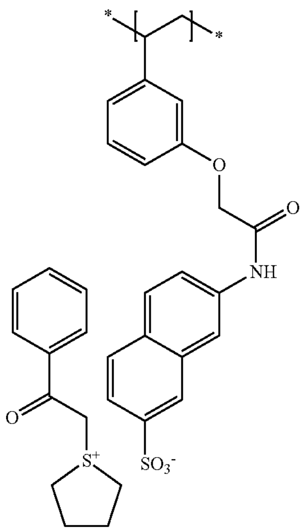
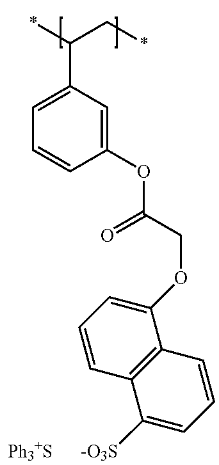
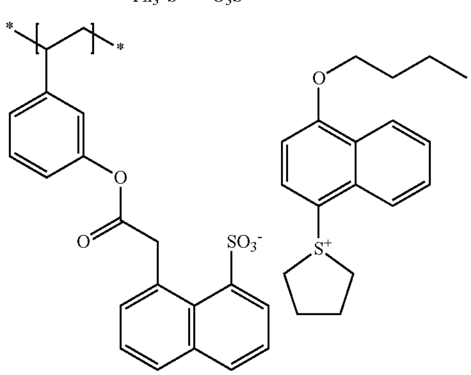
-continued
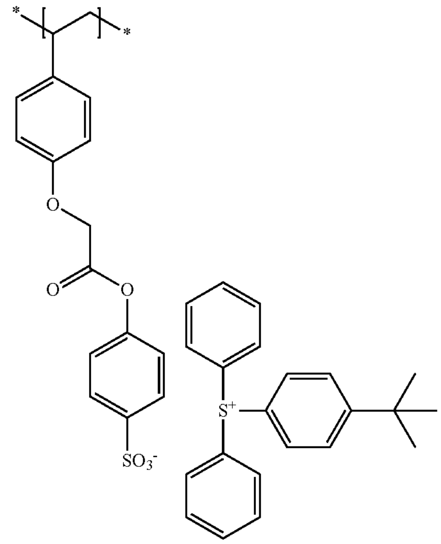
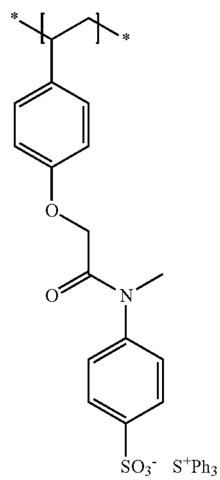
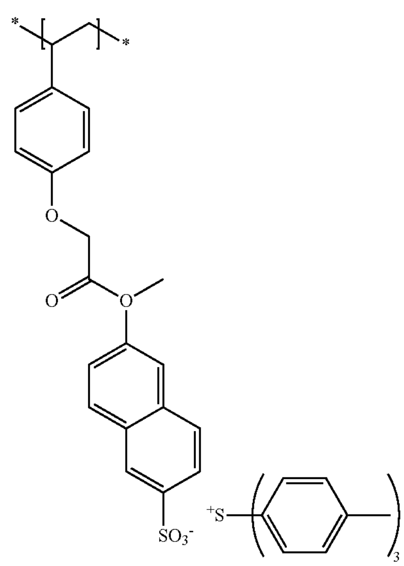

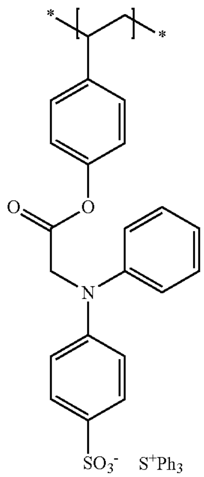
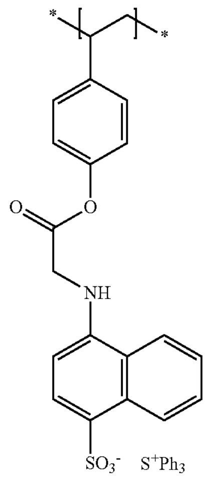
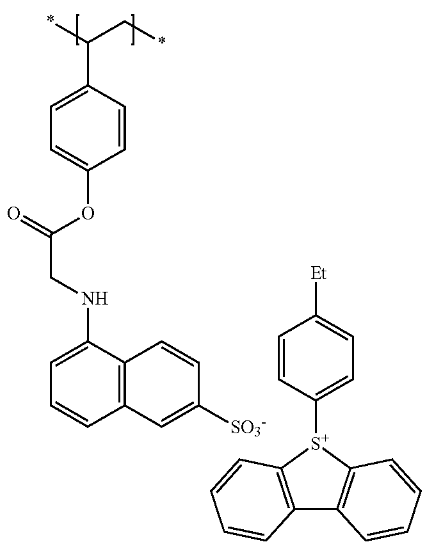
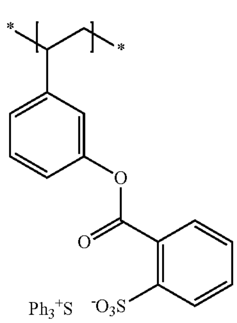
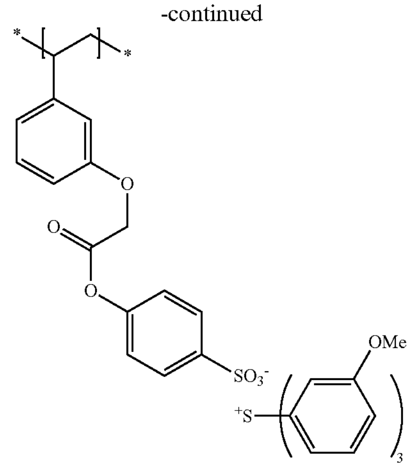
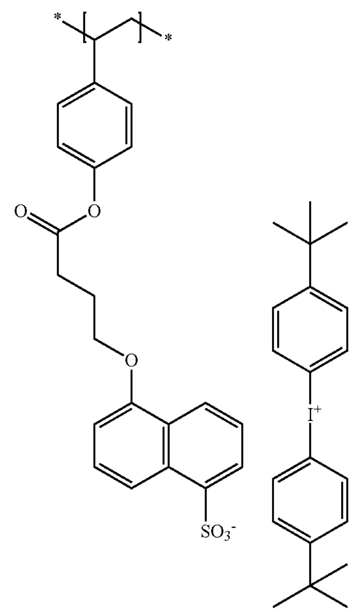
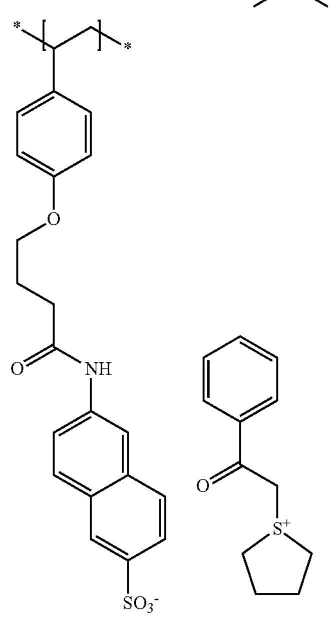

-continued
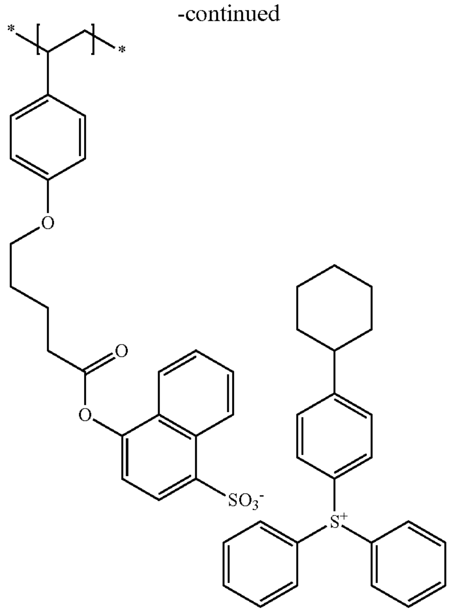
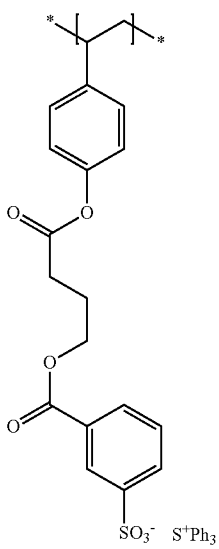
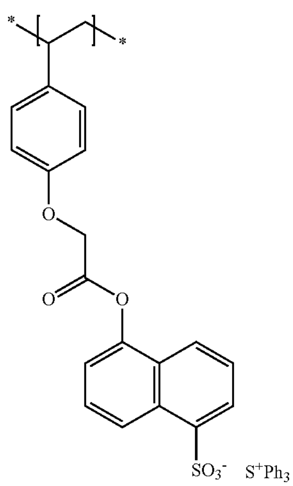
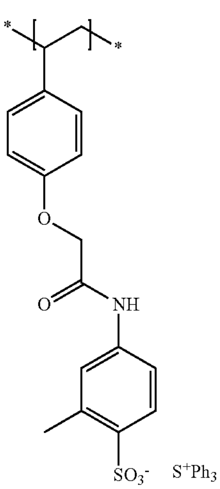
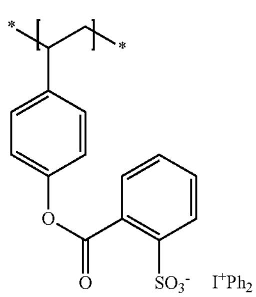
-continued
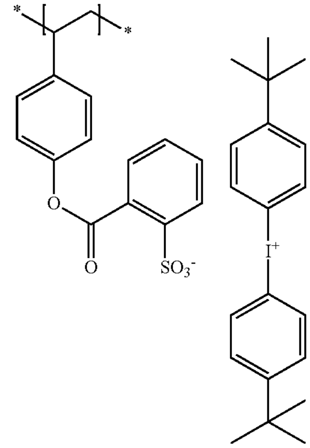
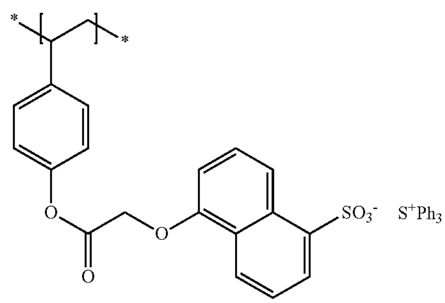
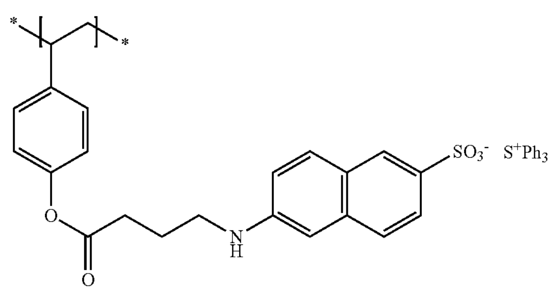
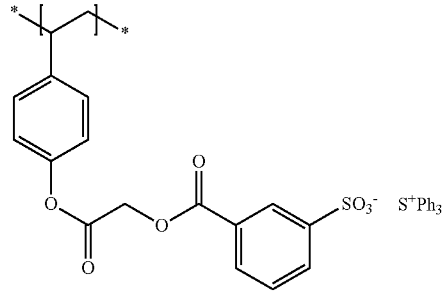

-continued
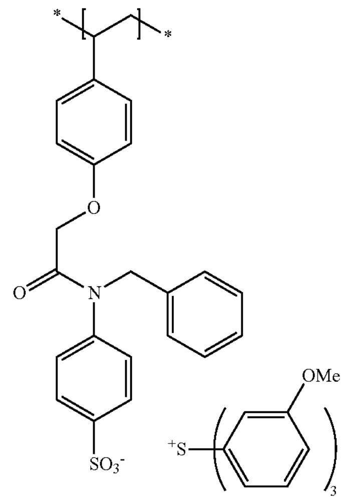
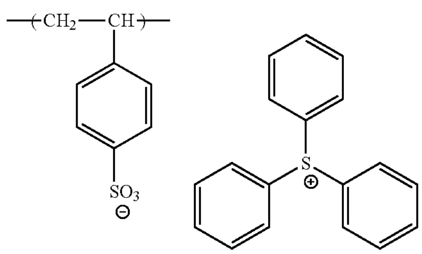
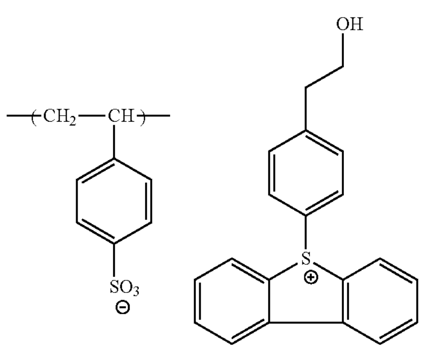
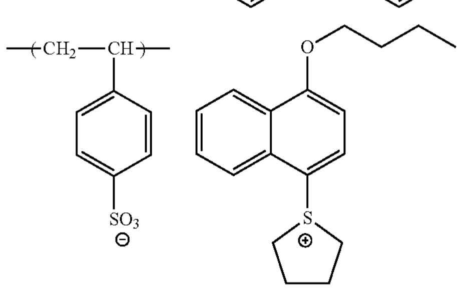
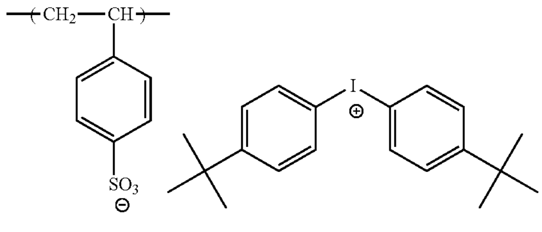
-continued
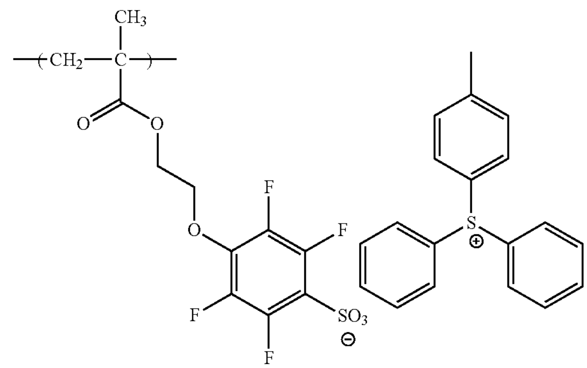
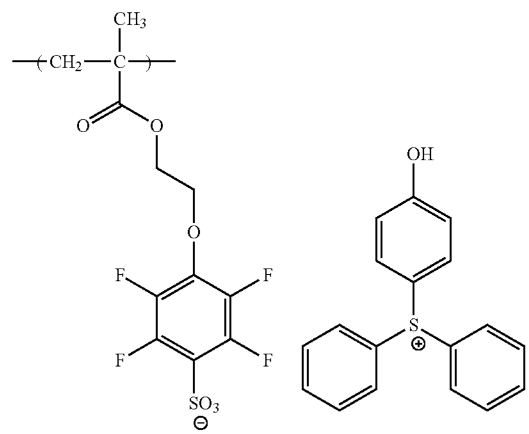
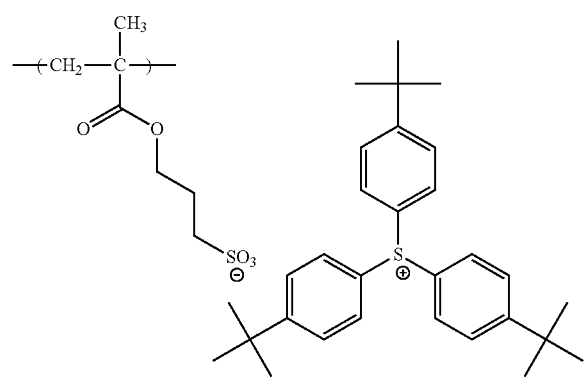
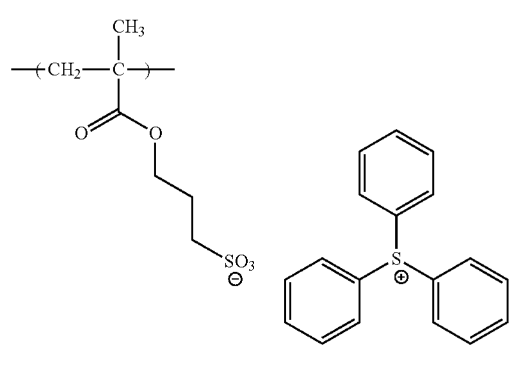

-continued
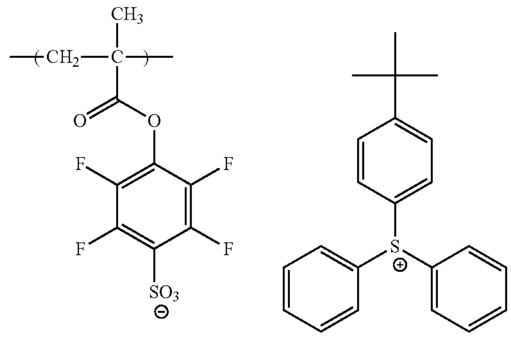
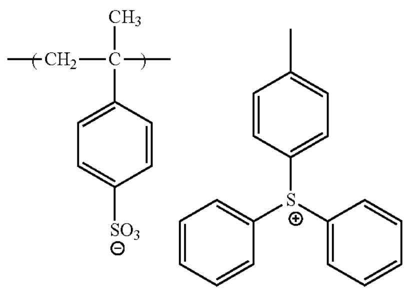
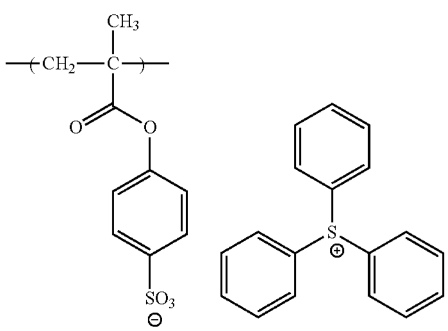
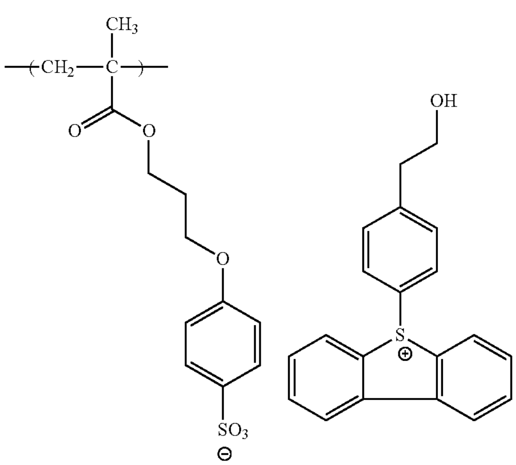
-continued
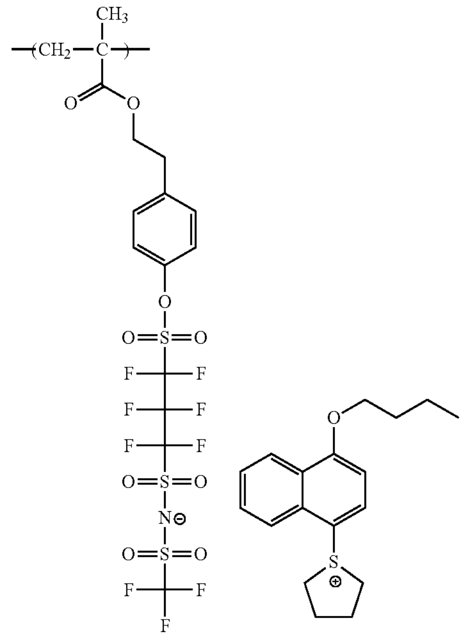
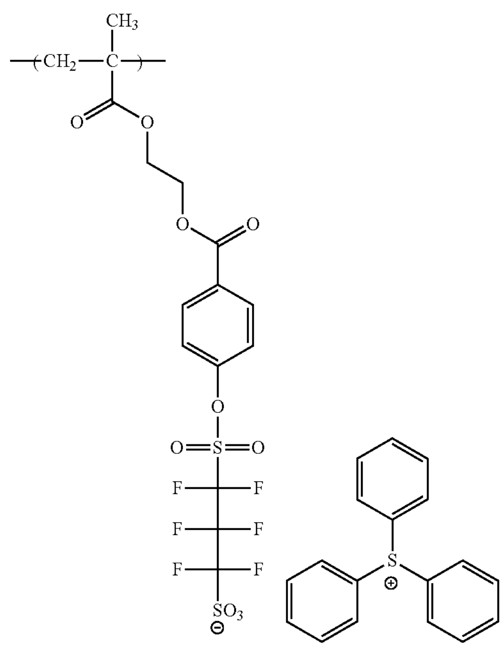

-continued
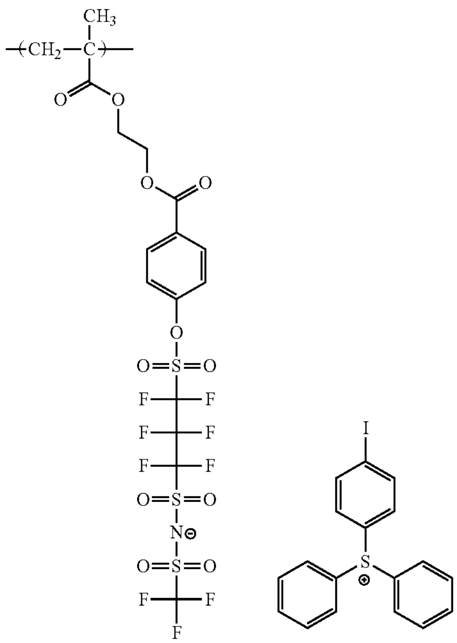
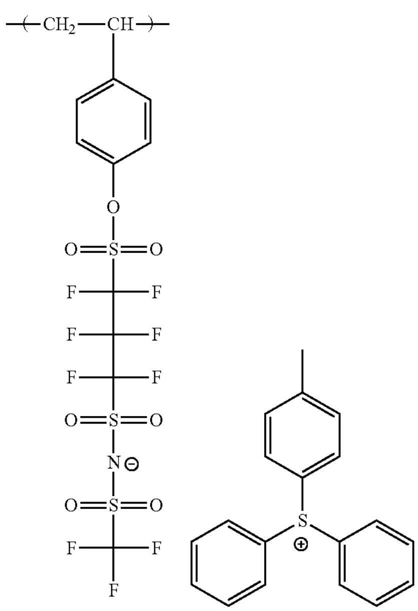
-continued
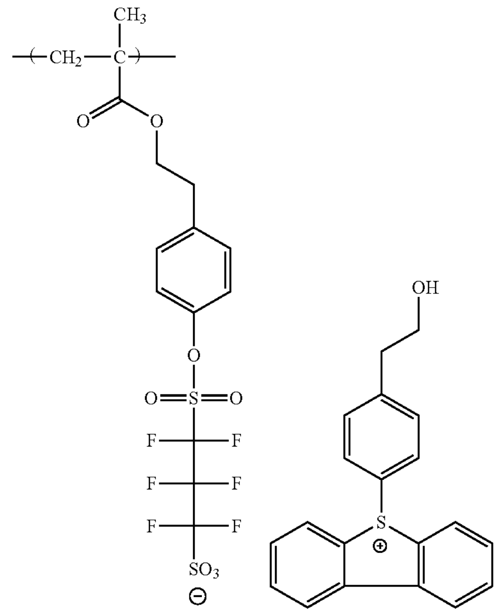
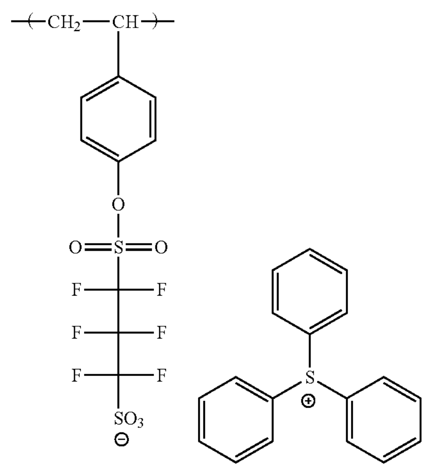
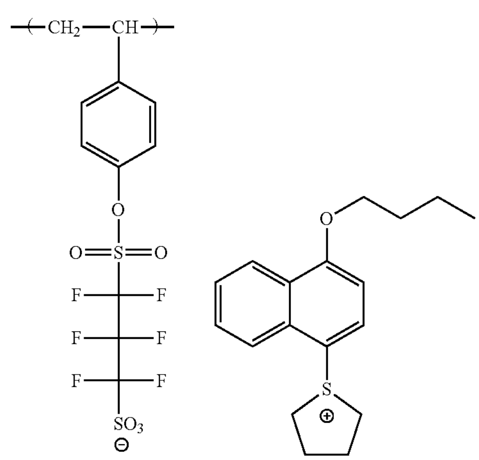

-continued
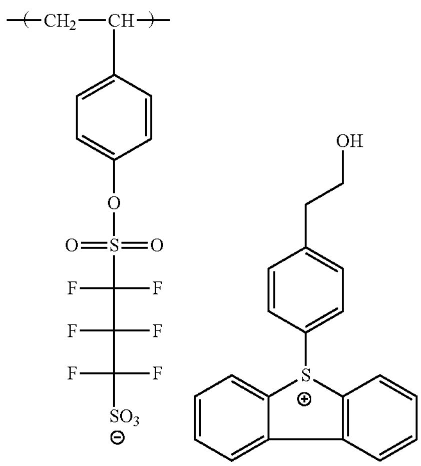
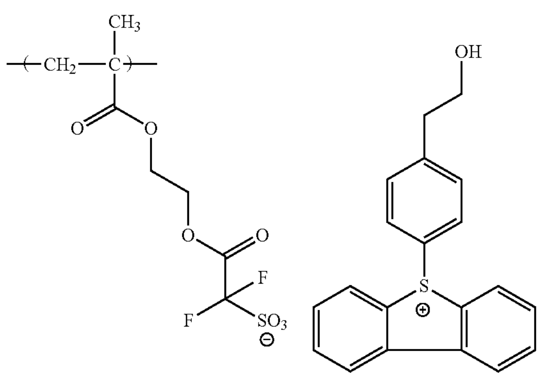
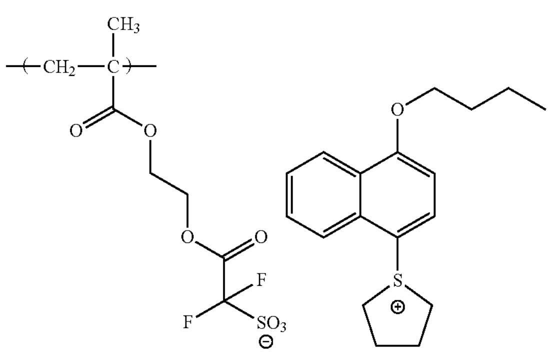
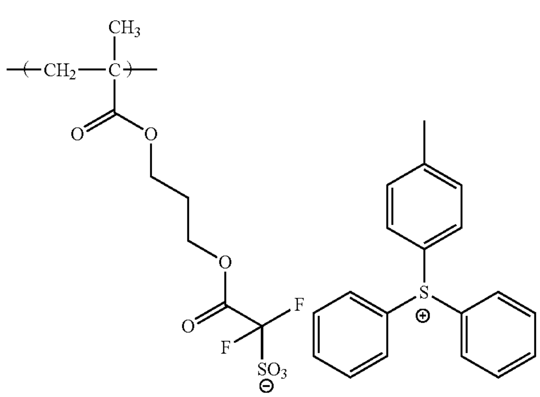
-continued
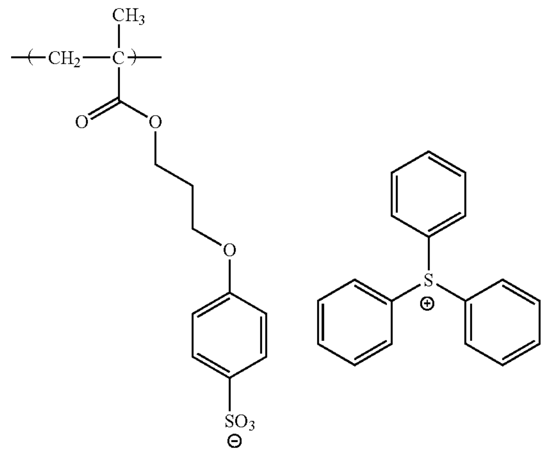
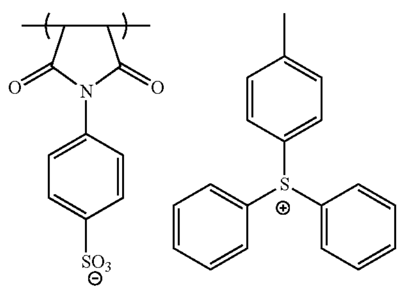
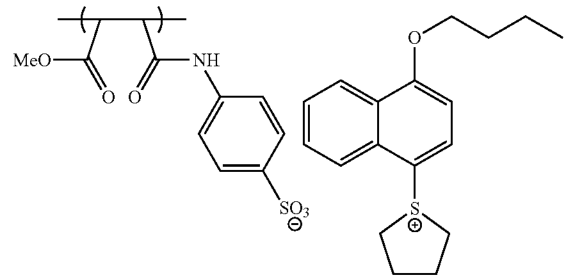
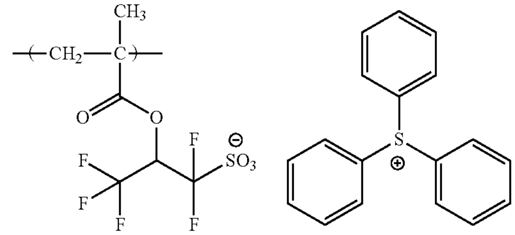
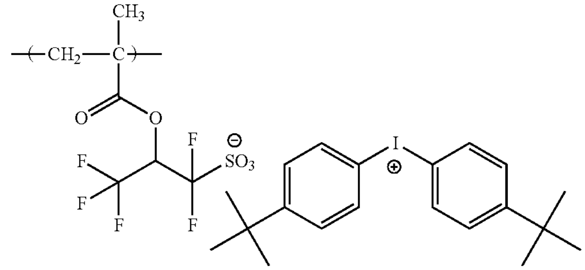

-continued
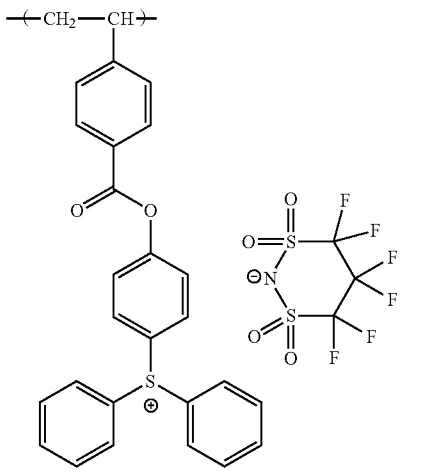
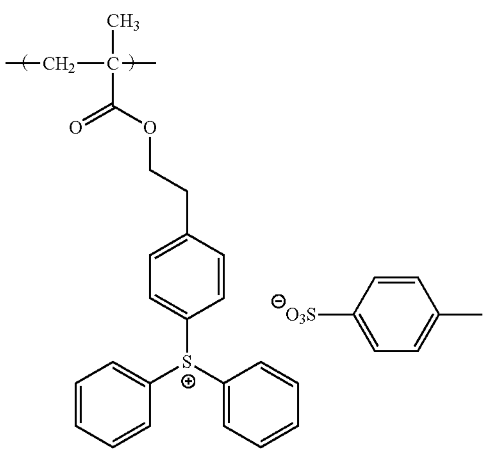
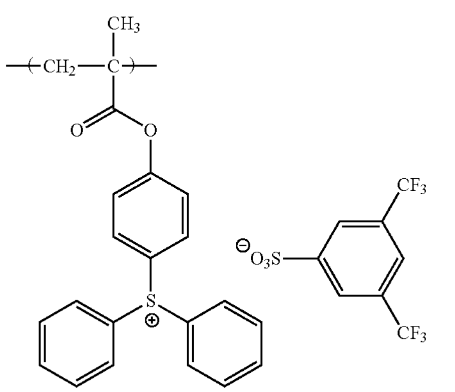
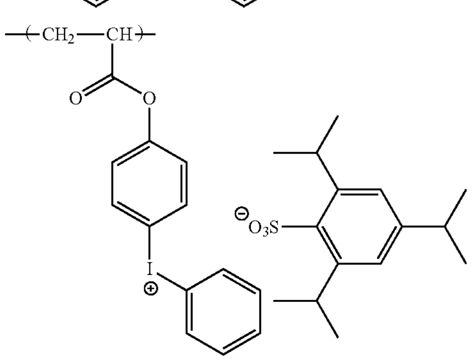
-continued
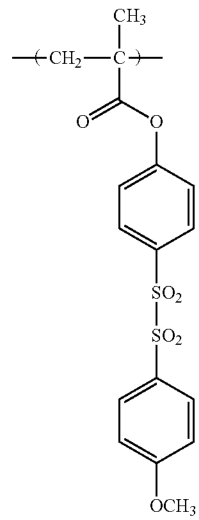
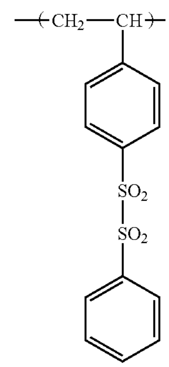
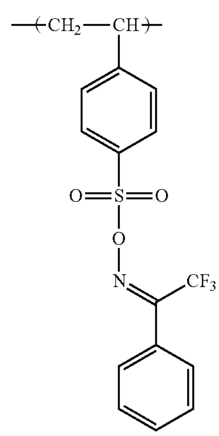
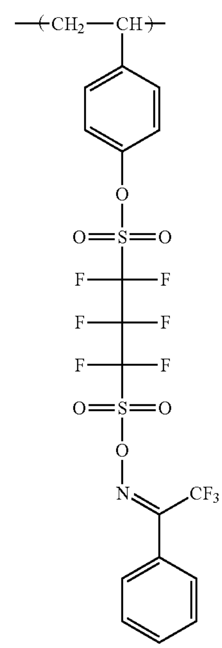
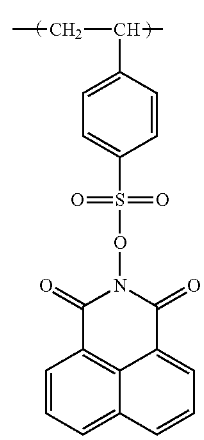
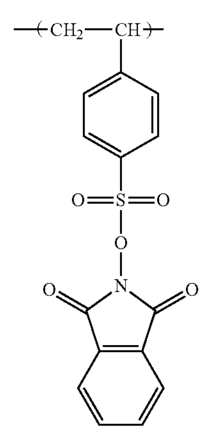

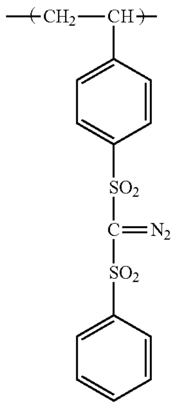
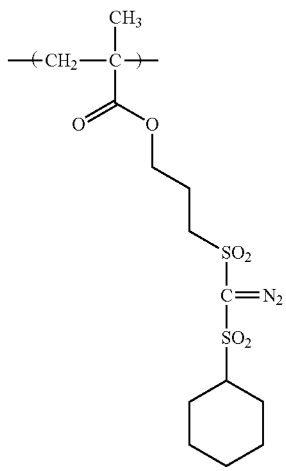
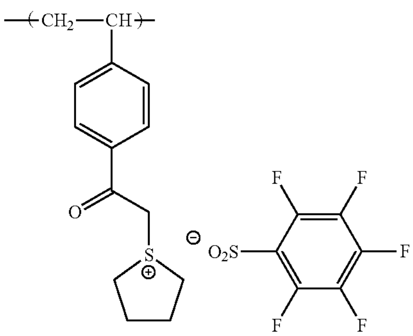
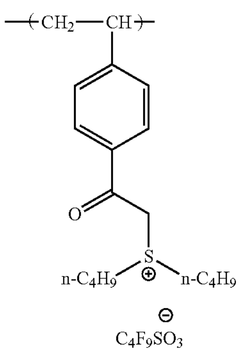
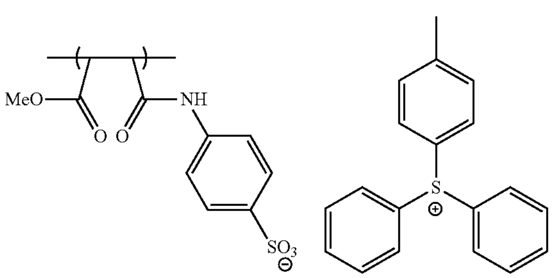
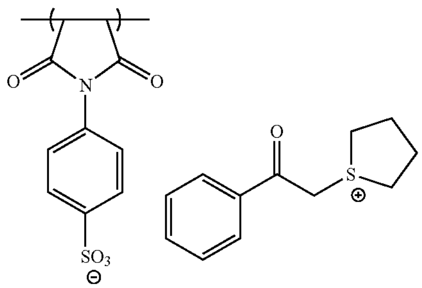
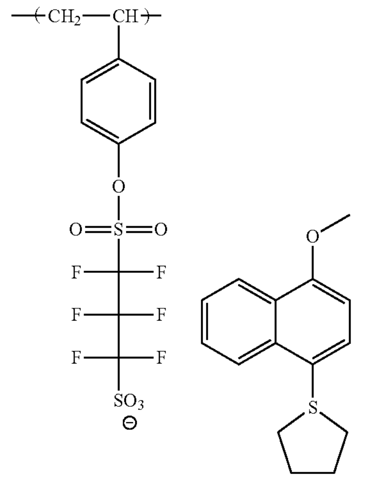
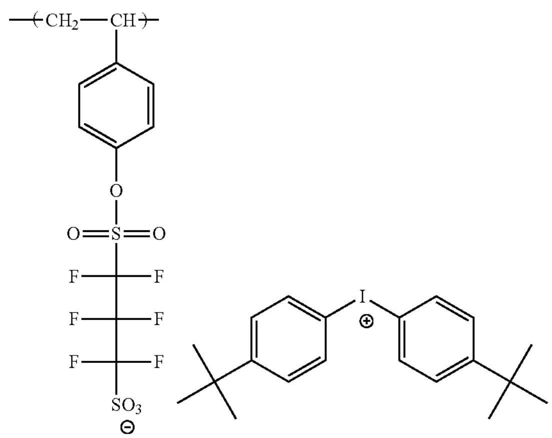
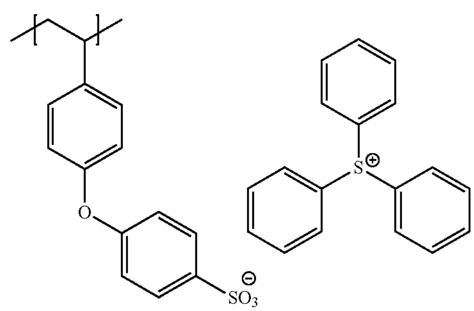
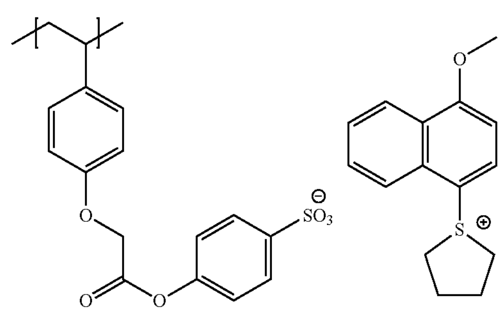

-continued
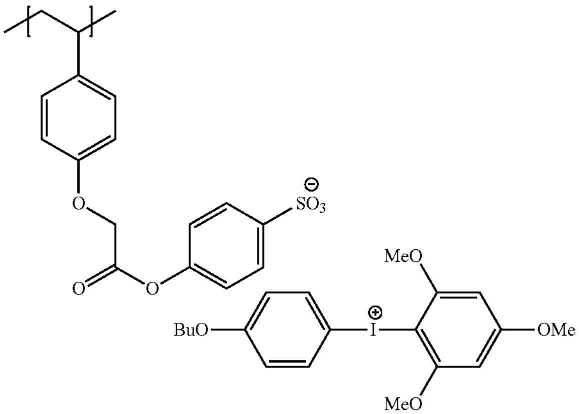
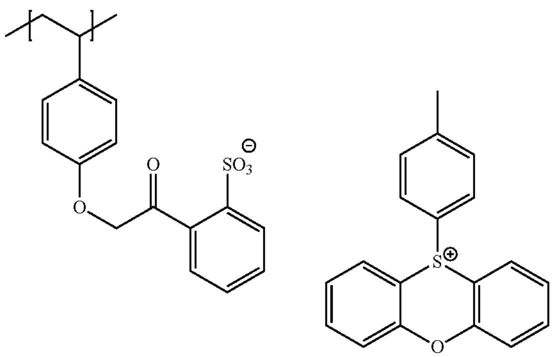
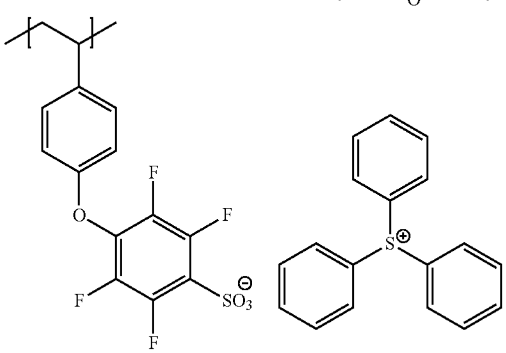
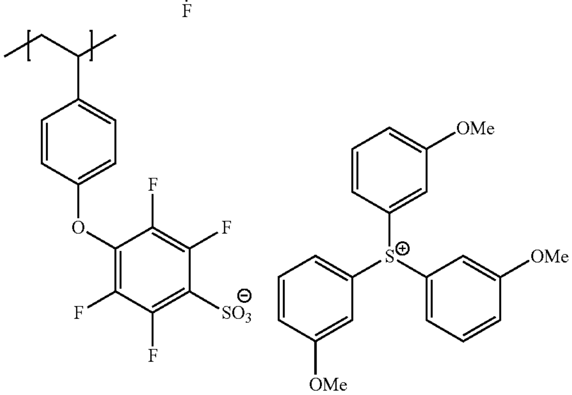
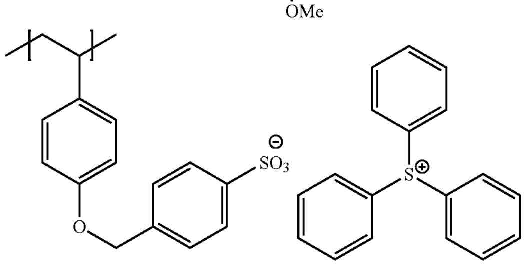
-continued
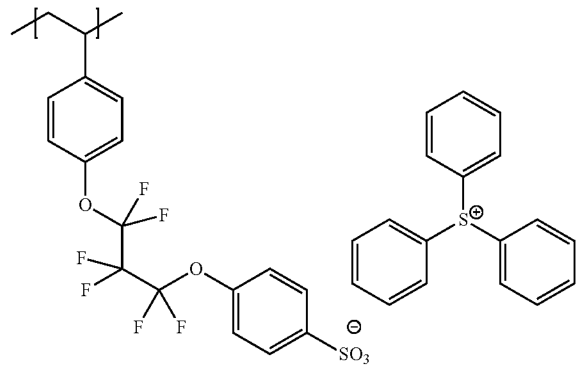
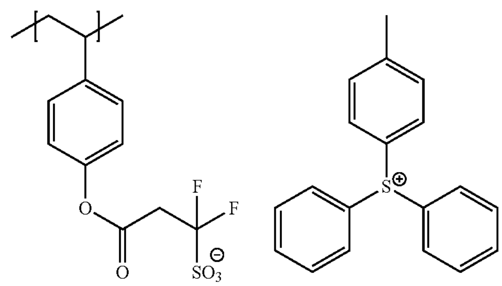
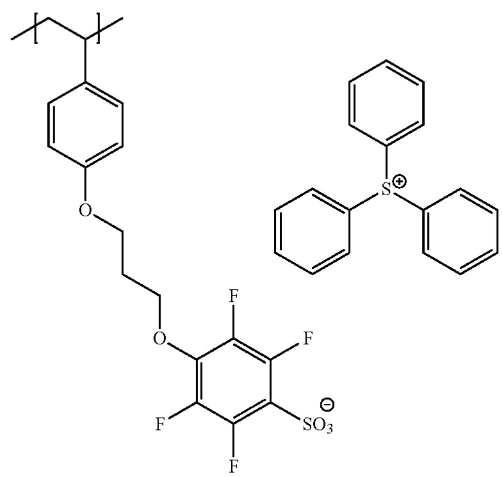
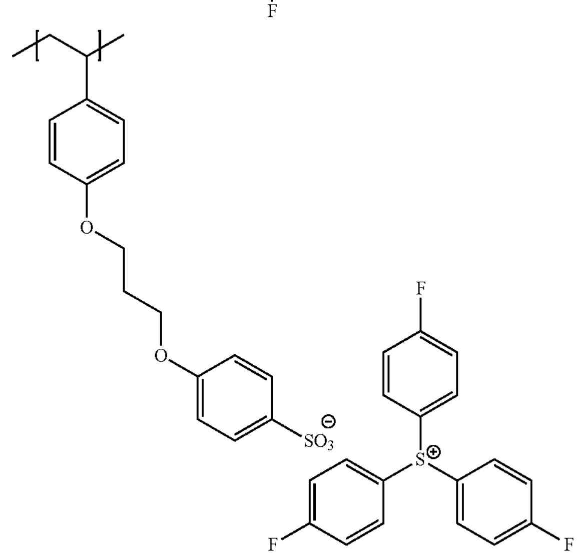

-continued

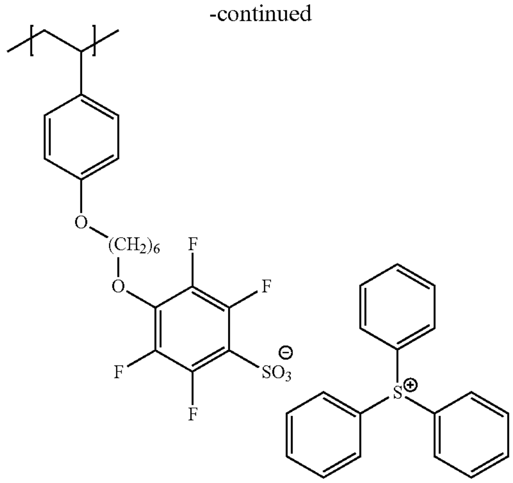

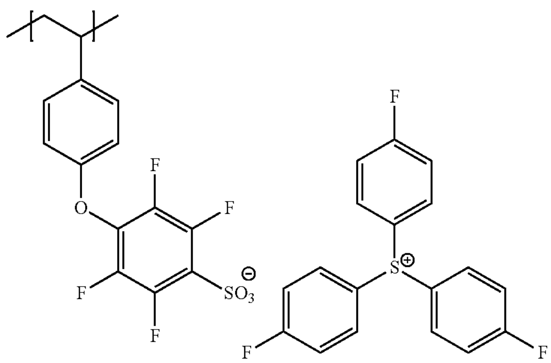

The content of the repeating unit represented by formula (4) in the resin (P) is preferably from 1 to 40 mol %, more preferably from 2 to 30 mol %, still more preferably from 5 to 25 mol %, based on all repeating units in the resin (P).

It is also preferred that the resin (P) further contains the following repeating units as other repeating units.

Such a repeating unit includes, for example, a repeating unit having a group capable of decomposing by the action of an alkali developer to increase the dissolution rate in the alkali developer. Examples of the group above include a group having a lactone structure and a group having a phenyl ester structure, and the repeating unit having a group capable of decomposing by the action of an alkali developer to increase the dissolution rate in the alkali developer is preferably a repeating unit represented by the following formula (AII):

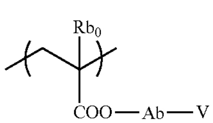

(AII)

In formula (AII), V represents a group capable of decomposing by the action of an alkali developer to increase the dissolution rate in the alkali developer, $Rb_0$ represents a hydrogen atom or a methyl group, and Ab represents a single bond or a divalent linking group.

The group V capable of decomposing by the action of an alkali developer is a group having an ester bond and, among other, is preferably a group having a lactone structure. As for the group having a lactone structure, any group may be used as long as it has a lactone structure, but a 5- to 7-membered ring lactone structure is preferred, and a 5- to 7-membered ring lactone structure to which another ring structure is fused to form a bicyclo structure or a Spiro structure is preferred.

Ab is preferably a single bond or a divalent linking group represented by -AZ—$CO_2$— (wherein AZ is an alkylene group or an aliphatic ring group). AZ is preferably a methylene group, an ethylene group, a cyclohexylene group, an adamantylene group or a norbornylene group.

Specific examples are illustrated below. In the formulae, Rx represents H or $CH_3$.

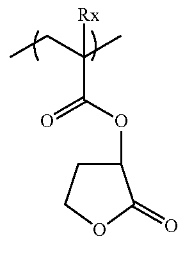

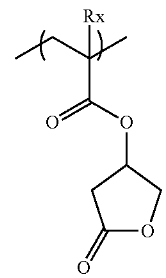

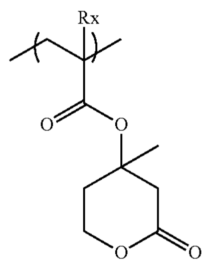

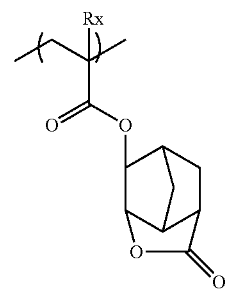

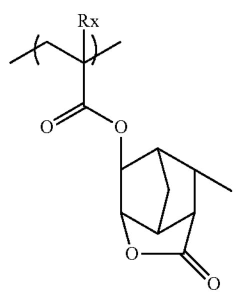

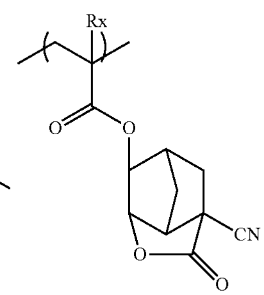

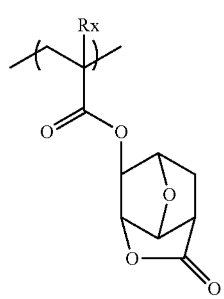

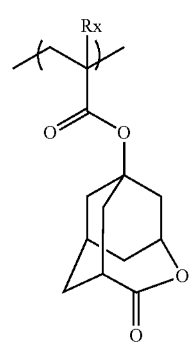

-continued
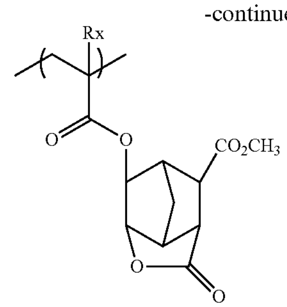
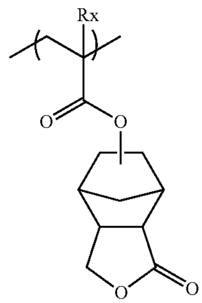
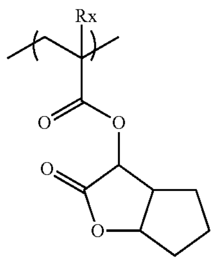
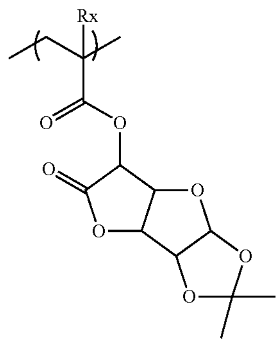
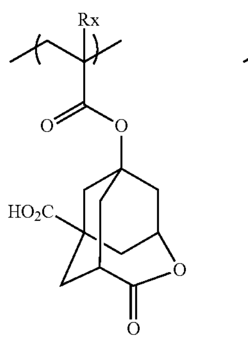
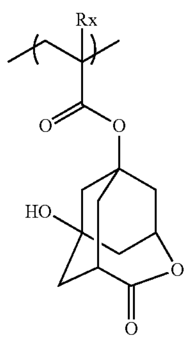
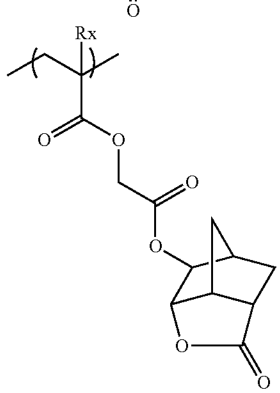
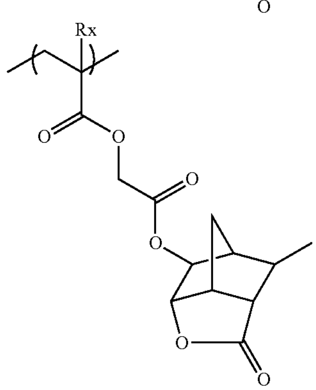
-continued
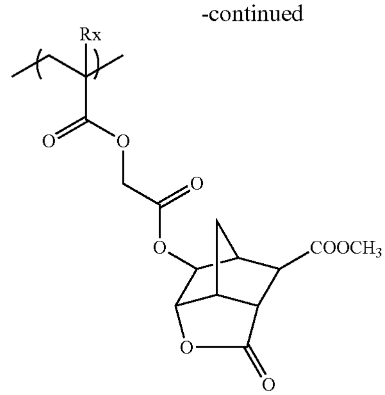
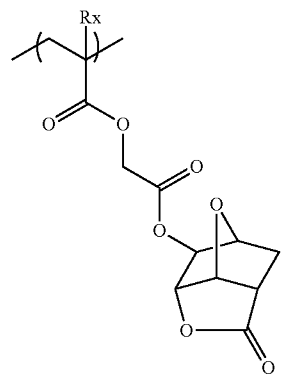
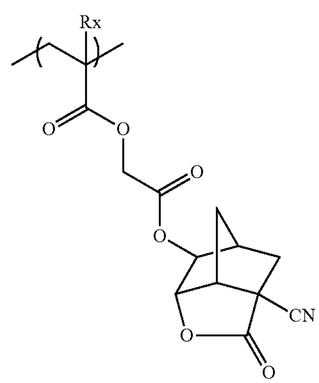
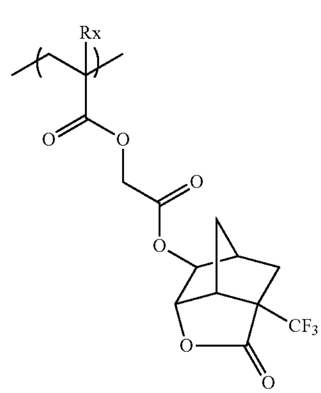

-continued
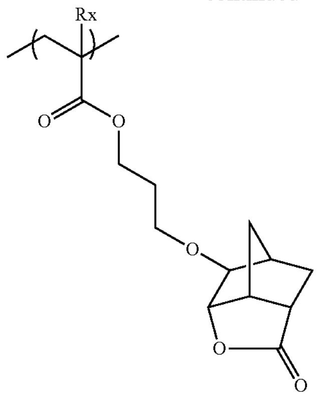
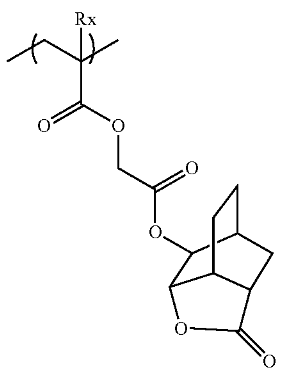
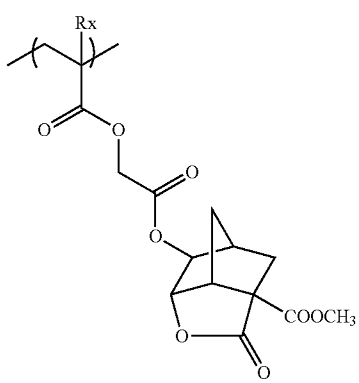
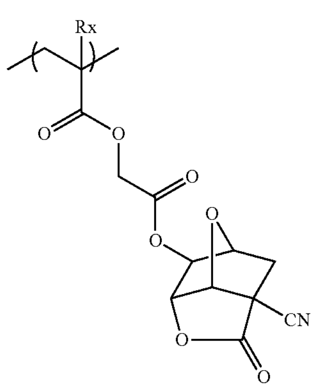
-continued
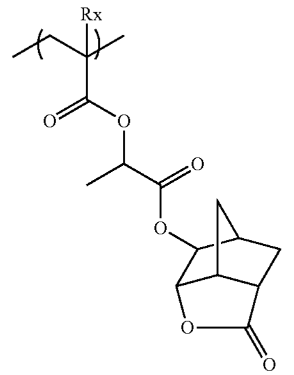
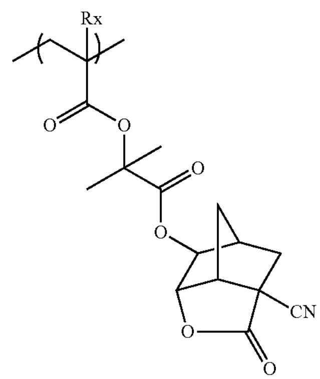
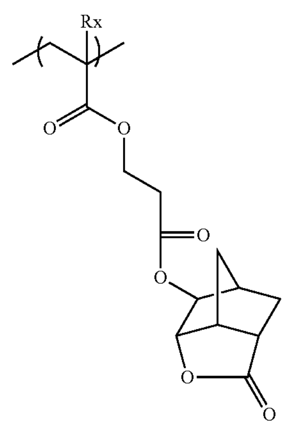
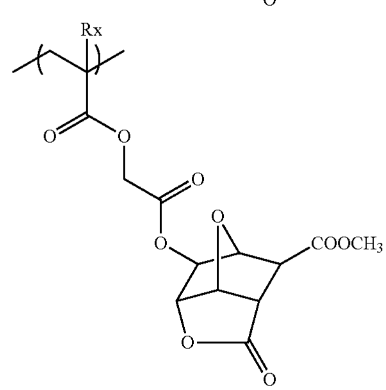
The resin (P) may or may not contain a repeating unit having a group capable of decomposing by the action of an alkali developer to increase the dissolution rate in the alkali developer, but in the case of containing the repeating unit having the group, the content thereof is preferably from 5 to 60 mol %, more preferably from 7 to 50 mol %, still more preferably from 10 to 40 mol %, based on all repeating units in the resin (P).

The resin (P) may further contain a fluorine atom-containing repeating unit. This fluorine atom-containing repeating unit is preferably different from the repeating unit represented by formula (4).

The fluorine atom may be contained in the main chain on the resin (P) or may be substituted on the side chain. The fluorine atom-containing repeating unit is preferably, for example, a (meth)acrylate-based repeating unit or a styryl-based repeating unit.

In one embodiment, the fluorine atom-containing repeating unit is preferably a repeating unit having, as a partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably a carbon number of 1 to 4) is a linear or branched alkyl group with at least one hydrogen atom being substituted for by a fluorine atom and may further have other substituents.

The fluorine atom-containing cycloalkyl group is a monocyclic or polycyclic cycloalkyl group with at least one hydrogen atom being substituted for by a fluorine atom and may further have other substituents.

The fluorine atom-containing aryl group is an aryl group (such as phenyl group or naphthyl group) with at least one hydrogen atom being substituted for by a fluorine atom and may further have other substituents.

As the fluorine atom-containing alkyl group, fluorine atom-containing cycloalkyl group and fluorine atom-containing aryl group, the groups represented by the following formulae (F2) to (F4) are preferred, but the present invention is not limited thereto.

(F2)

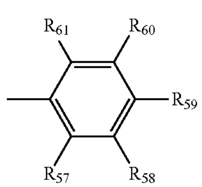

(F3)

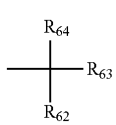

(F4)

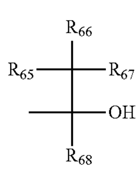

In formulae (F2) to (F4), each of $R_{57}$ to $R_{68}$ independently represents a hydrogen atom, a fluorine atom, or an alkyl group (chain), provided that at least one of $R_{57}$ to $R_{61}$, at least one of $R_{62}$ to $R_{64}$, and at least one of $R_{65}$ to $R_{68}$ each represents a fluorine atom or a fluoroalkyl group. $R_{62}$ and $R_{63}$ may combine with each other to form a ring.

Specific examples of the group represented by formula (F2) include a p-fluorophenyl group, a pentafluorophenyl group, and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Among these, a hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

The fluorine atom-containing partial structure may be bonded directly to the main chain or may be bonded to the main chain through a sole group selected from the group consisting of an alkylene group, a phenylene group, an ether bond, a thioether bond, a carbonyl group, an ester bond, an amide bond, a urethane bond and a ureylene bond, or a combination of two or more thereof.

Suitable fluorine atom-containing repeating units include the followings.

(C-Ia)

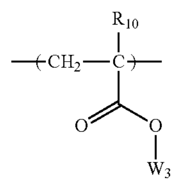

(C-Ib)

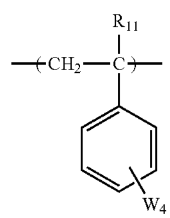

(C-Ic)

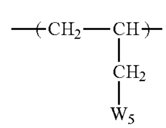

(C-Id)

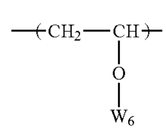

In the formulae, each of $R_{10}$ and $R_{11}$ independently represents a hydrogen atom, a fluorine atom or an alkyl group (preferably a linear or branched alkyl group having a carbon number of 1 to 4, and the alkyl group having a substituent includes, in particular, a fluorinated alkyl group).

Each of $W_3$ to $W_6$ independently represents an organic group having at least one or more fluorine atoms, and the organic group specifically includes the atomic groups of formulae (F2) to (F4).

In another embodiment, the resin (Aa) may contain a unit represented by formula (C-II) or (C-III):

(C-II)

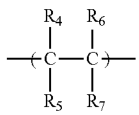

(C-III)

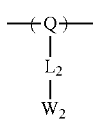

In the formula (C-II), each of $R_4$ to $R_7$ independently represents a hydrogen atom, a fluorine atom or an alkyl group (preferably a linear or branched alkyl group having a carbon number of 1 to 4, and the alkyl group having a substituent includes, in particular, a fluorinated alkyl group), provided that at least one of $R_4$ to $R_7$ represents a fluorine atom. $R_4$ and $R_5$, or $R_6$ and $R_7$ may form a ring.

In formula (C-III), Q represents an alicyclic structure. The alicyclic structure may be monocyclic or polycyclic and may have a substituent. The monocyclic structure is preferably a cycloalkyl group having a carbon number of 3 to 9, and examples thereof include a cyclopentyl group, a cyclohexyl group, a cyclobutyl group, and a cyclooctyl group. The polycyclic structure includes a group having a bicyclo, tricyclo or tetracyclo structure with a carbon number of 5 or more and is preferably a cycloalkyl group having a carbon number of 6 to 20, and examples thereof include an adamantyl group, a norbornyl group, a dicyclopentyl group, a tricyclodecanyl group, and a tetracyclododecyl group. A part of carbon atoms in the cycloalkyl group may be substituted with a heteroatom such as oxygen atom. The alicyclic structure of Q is more preferably an alicyclic structure having a carbon number of 5 to 9.

$W_2$ represents an organic group having at least one fluorine atom, and the organic group specifically includes the atomic groups of formulae (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or an alkyl group), —$NHSO_2$—, or a divalent linking group formed by combining a plurality of these groups.

Specific examples of the fluorine-containing repeating unit are illustrated below, but the present invention is not limited thereto. In specific examples, $X_1$ represents a hydrogen atom, —$CH_3$, —F or —$CF_3$, and $X_2$ represents —F or —$CF_3$.

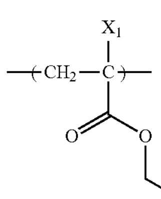

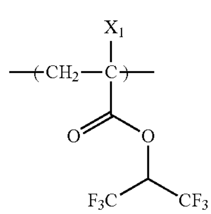

-continued

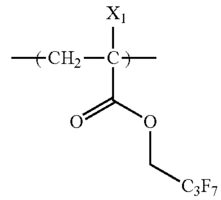

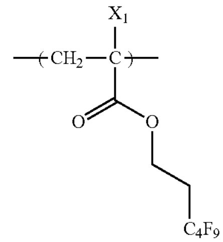

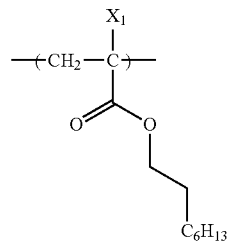

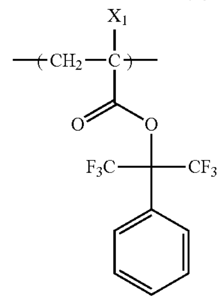

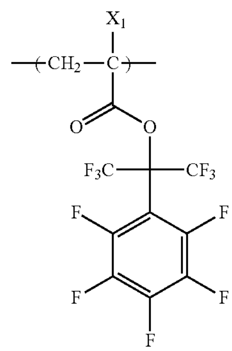

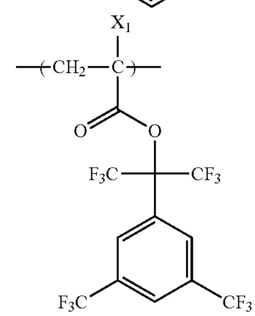

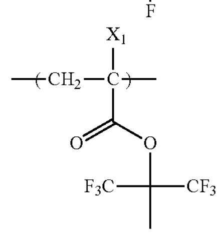

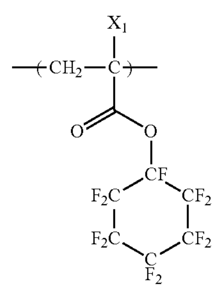

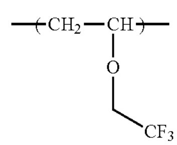

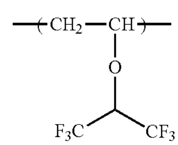

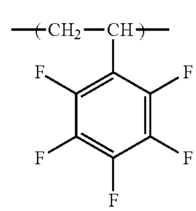

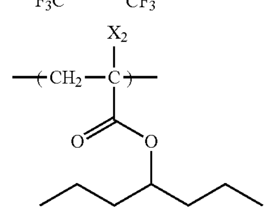

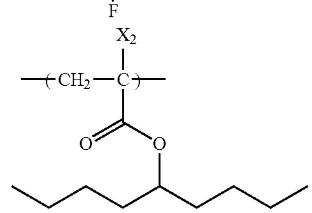

-continued
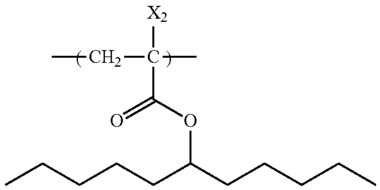
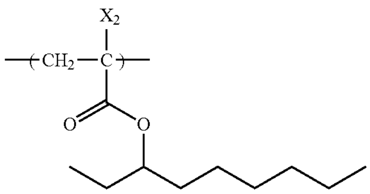
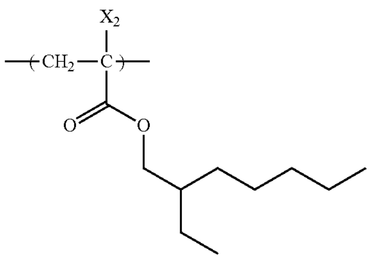
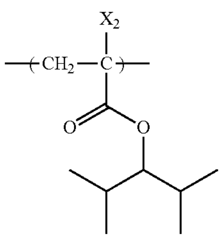
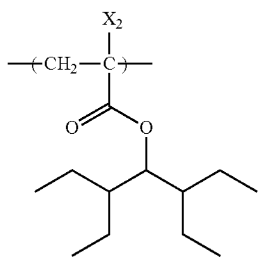
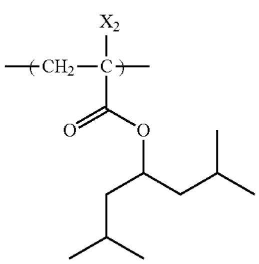
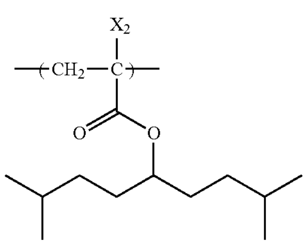
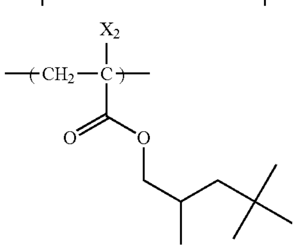
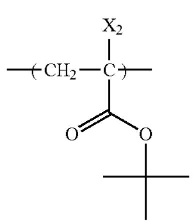
-continued
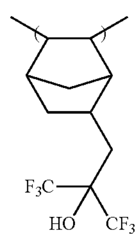
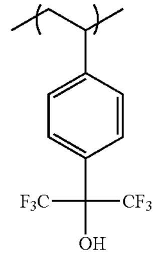
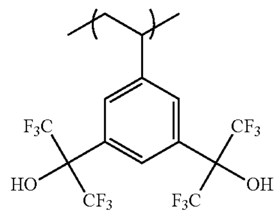
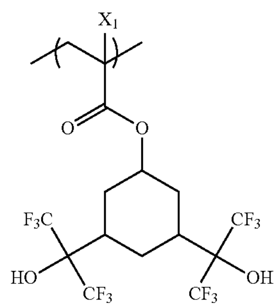
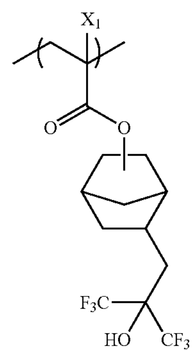
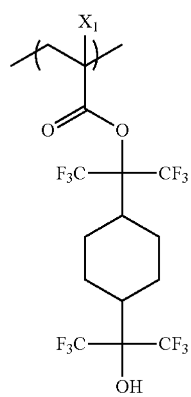
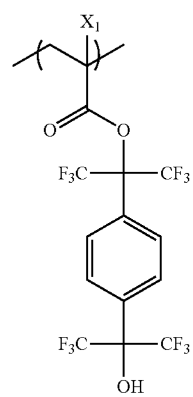
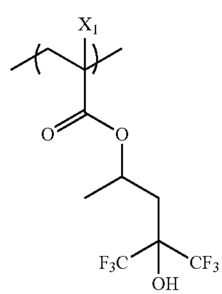
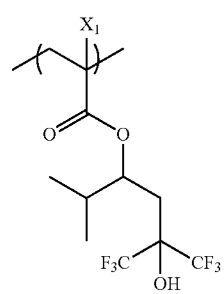

-continued

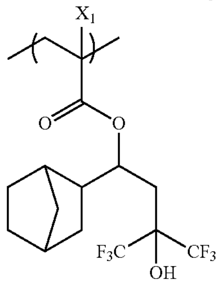

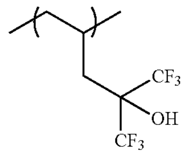

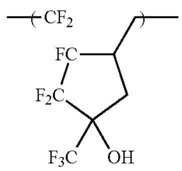

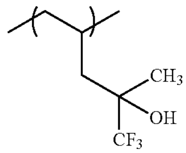

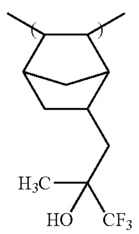

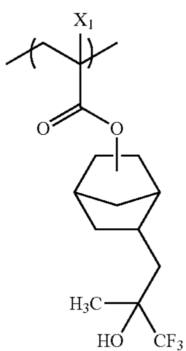

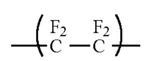

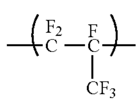

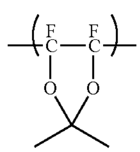

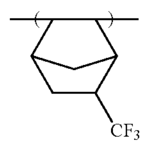

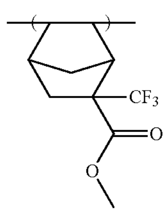

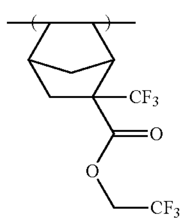

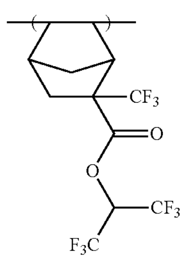

The resin (P) may or may not contain a fluorine atom-containing repeating unit, but in the case of containing a fluorine-containing repeating unit, the content thereof is preferably from 1 to 90 mol %, more preferably from 5 to 85 mol %, still more preferably from 10 to 80 mol %, yet still more preferably from 15 to 75 mol %, based on all repeating units in the resin.

Examples of the polymerizable monomer for forming a repeating unit other than those described above in the resin (P) include a styrene, an alkyl-substituted styrene, an alkoxy-substituted styrene, an O-alkylated styrene, an O-acylated styrene, a hydrogenated hydroxystyrene, a maleic anhydride, an acrylic acid derivative (e.g., acrylic acid, acrylic acid ester), a methacrylic acid derivative (e.g., methacrylic acid, methacrylic acid ester), an N-substituted maleimide, an acrylonitrile, a methacrylonitrile, a vinylnaphthalene, a vinylanthracene, an acenaphthylene, and an indene which may have a substituent. Preferred examples of the substituted styrene include 4-(1-naphthylmethoxy)styrene, 4-benzyloxystyrene, 4-(4-chlorobenzyloxy)styrene, 3-(1-naphthylmethoxy)styrene, 3-benzyloxystyrene, and 3-(4-chlorobenzyloxy)styrene.

The resin (P) may or may not contain such a repeating unit, but in the case of containing such a repeating unit, the content thereof in the resin (P) is generally from 1 to 20 mol %, preferably from 2 to 10 mol %, based on all repeating units constituting the resin (P).

The present invention also relates to (P') a resin having a repeating unit represented by the following formula (2A) and a repeating unit represented by the following formula (5A):

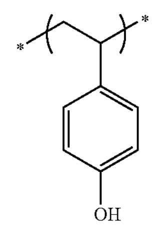

(5A)

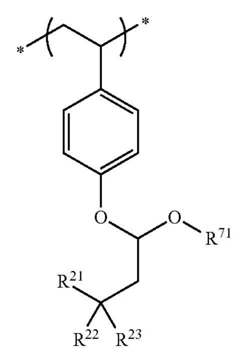

(2A)

In formula (2A), each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group.

At least two of $R^{21}$ to $R^{23}$ may combine with each other to form a ring, provided that it is not allowed to form a ring by combining at least one of $R^{21}$ to $R^{23}$ with $R^{71}$.

$R^{71}$ represents an unsubstituted alkyl group, a cycloalkyl group-substituted alkyl group, a cycloalkyl group, an aralkyl group, an aryloxyalkyl group or a heterocyclic group.

Specific examples and preferred examples of the alkyl group, cycloalkyl group, aryl group, aralkyl group and heterocyclic group of $R^{21}$ to $R^{23}$ are the same as those described for the alkyl group, cycloalkyl group, aryl group, aralkyl group and heterocyclic group of $R^{21}$ to $R^{23}$ in formula (1).

Specific examples and preferred examples of the unsubstituted alkyl group, cycloalkyl group-substituted alkyl group, cycloalkyl group, aralkyl group and aryloxyalkyl group of $R^{71}$ are the same as those described for the unsubstituted alkyl group, cycloalkyl group-substituted alkyl group, cycloalkyl group, aralkyl group and aryloxyalkyl group as the group represented by $-M^1-Q^1$ in formula (1).

Specific examples and preferred examples of the heterocyclic group of $R^{71}$ are the same as specific examples and preferred examples of the heterocyclic group of $Q^1$ in formula (1).

The preferred range of the content of the repeating unit represented by formula (5A) based on all repeating units in the resin (P') is the same as the preferred range described above for the repeating unit represented by formula (5) based on all repeating units in the resin (P).

The preferred range of the content of the repeating unit represented by formula (2A) based on all repeating units in the resin (P') is the same as the preferred range described above for the repeating unit represented by formula (2) based on all repeating units in the resin (P).

The resin (P) and the resin (P') can be synthesized, for example, by radical, cationic or anionic polymerization of unsaturated monomers corresponding to respective repeating units. The resins may be also synthesized by polymerizing a polymer using unsaturated monomers corresponding to precursors of respective repeating units, and modifying the synthesized polymer with a low molecular compound to cause conversion into desired repeating units. In either case, living polymerization such as living anionic polymerization is preferably used, because the molecular weight distribution of the obtained polymer compound becomes uniform.

The weight average molecular weight of the resin (P) and resin (P') for use in the present invention is preferably from 1,000 to 200,000, more preferably from 2,000 to 50,000, still more preferably from 2,000 to 15,000. The polydispersity (molecular weight distribution) (Mw/Mn) of the resin (P) is preferably from 1.0 to 1.7, more preferably from 1.0 to 1.3. The weight average molecular weight and polydispersity of the resin (P) are defined as values in terms of polystyrene by GPC measurement.

Specific examples of the resin (P) are illustrated below, but the present invention is not limited thereto. In the following specific examples, * in the group represented by P is a bond to the oxygen atom in a phenolic hydroxyl group.

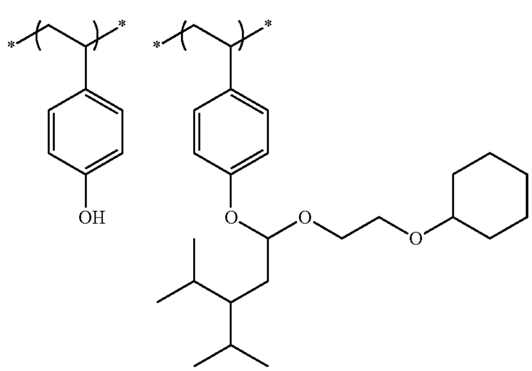

-continued

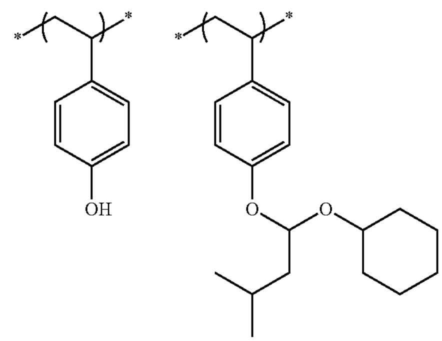

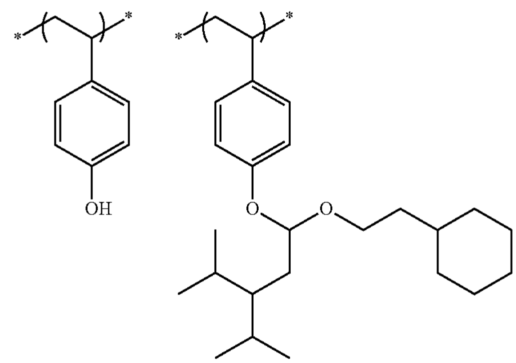

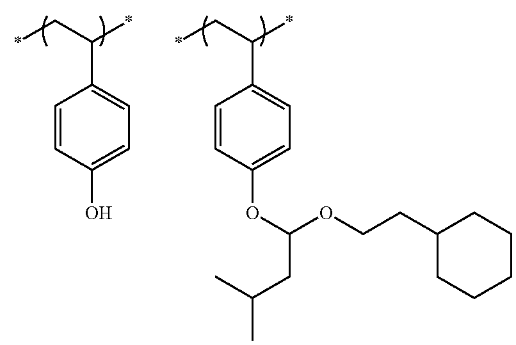

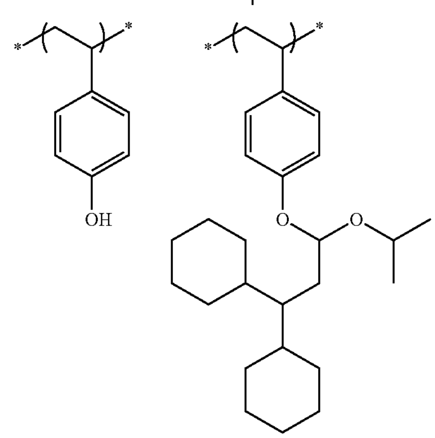

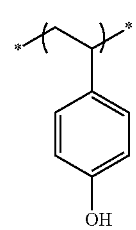

-continued
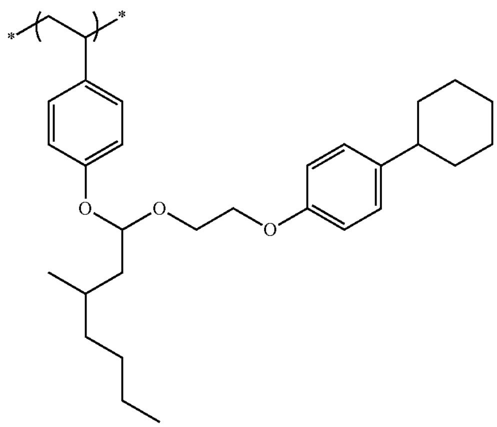
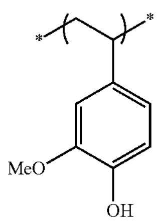
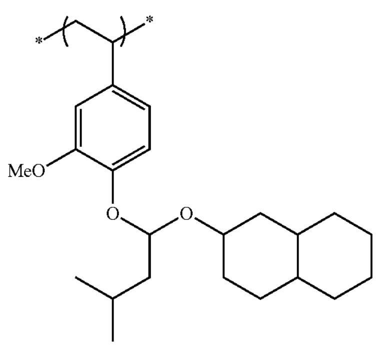
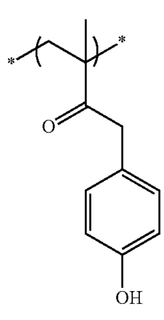
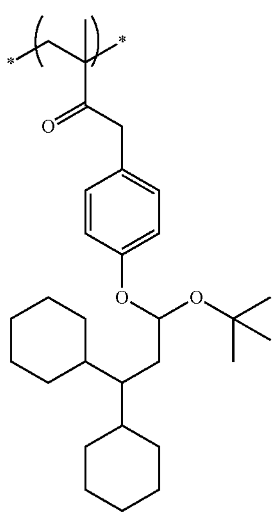
-continued
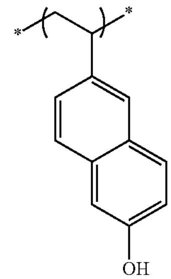
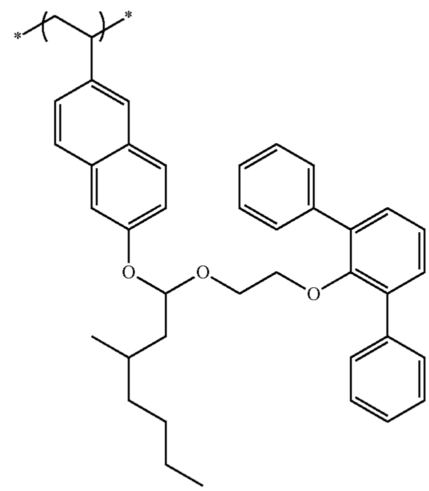
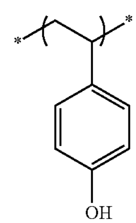
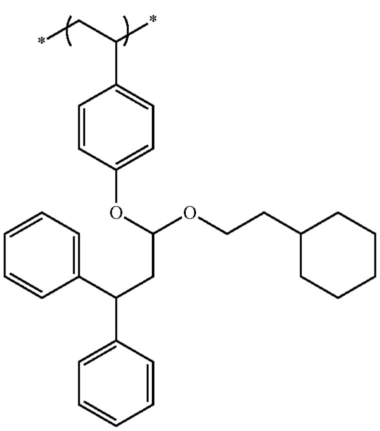
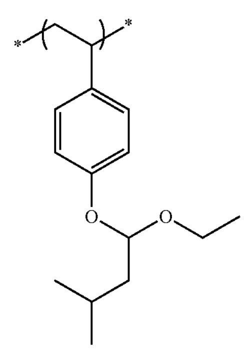

-continued
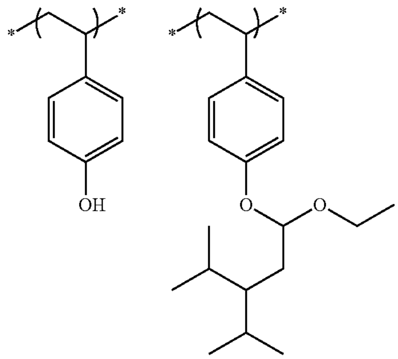
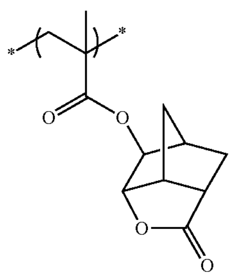
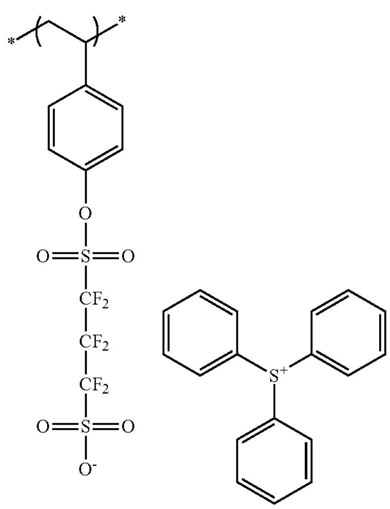
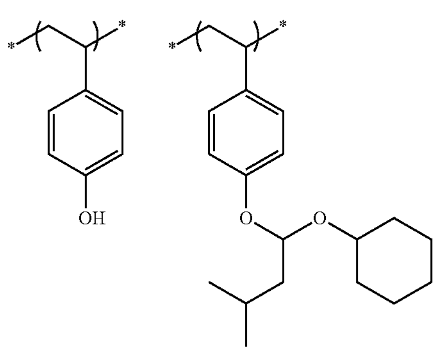
-continued
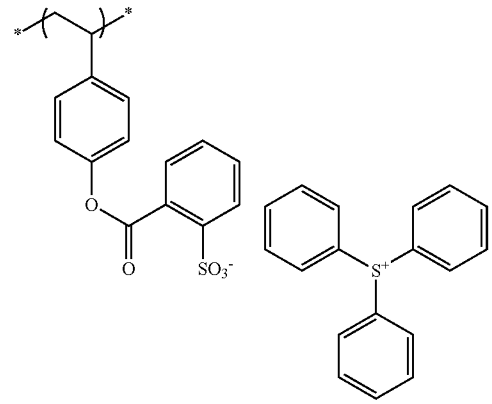
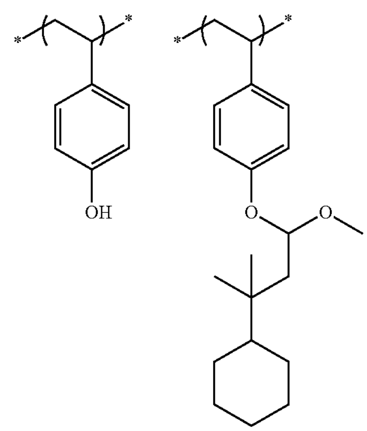
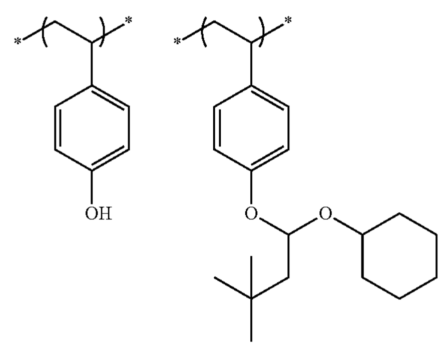
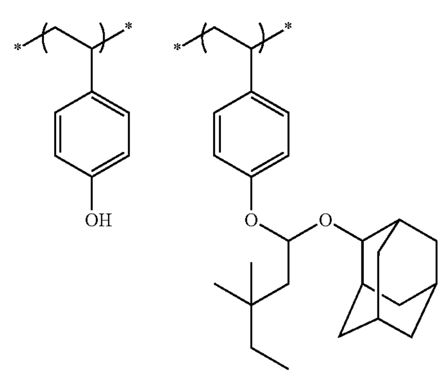

-continued
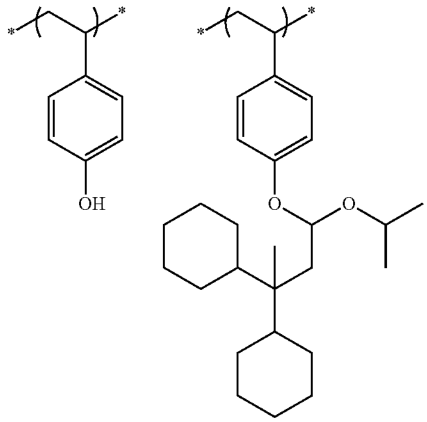
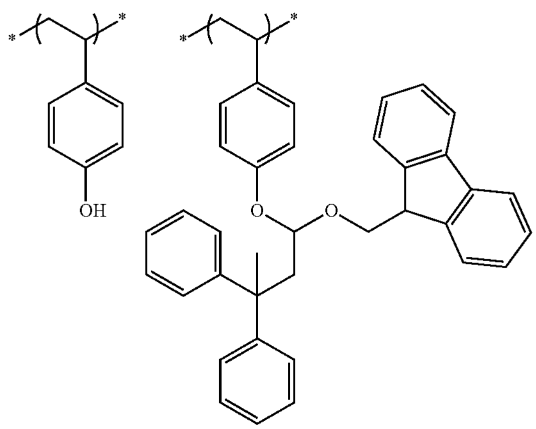
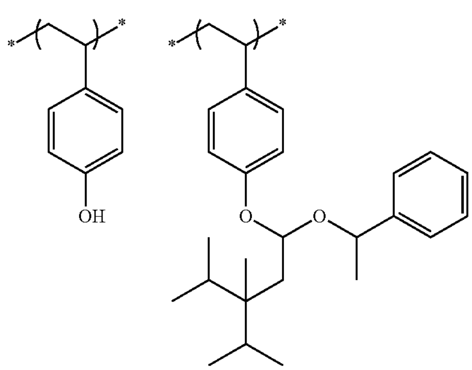
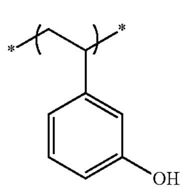
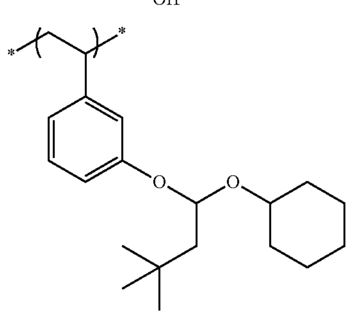
-continued
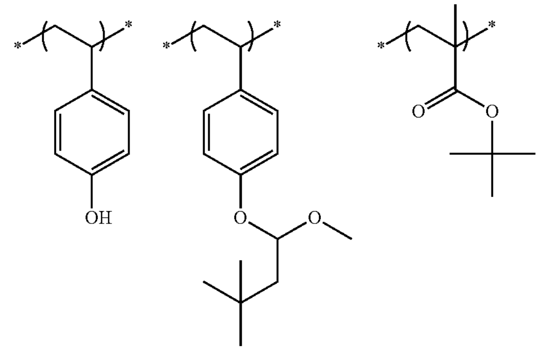
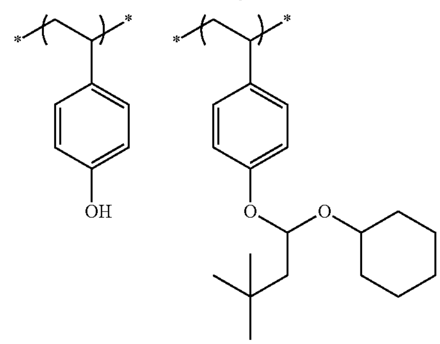
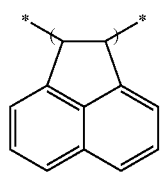
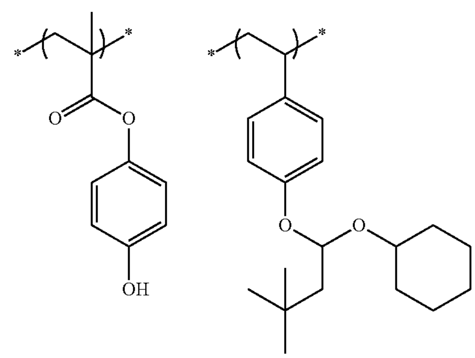
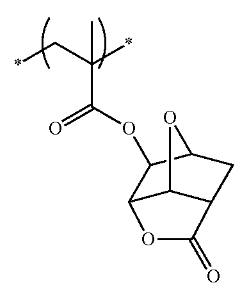
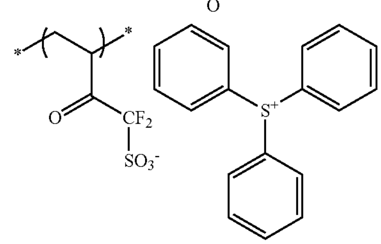

-continued
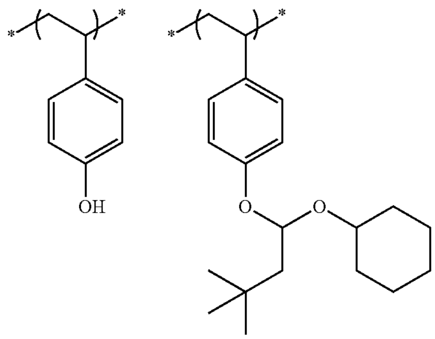
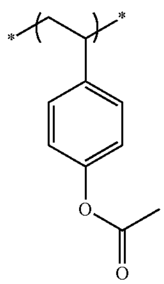
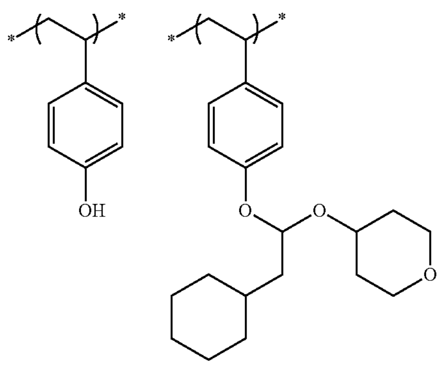
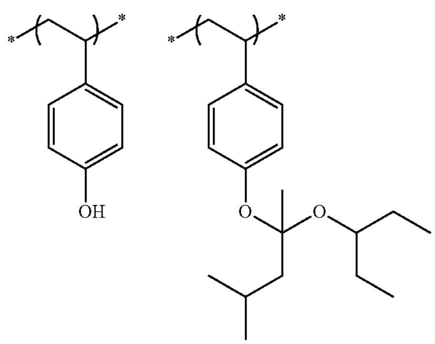
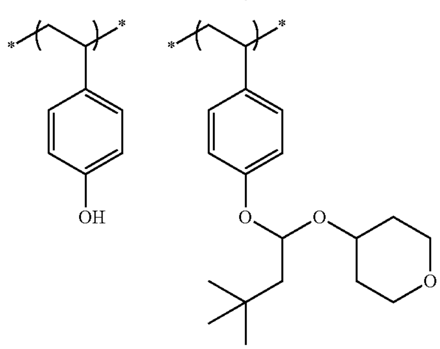
-continued
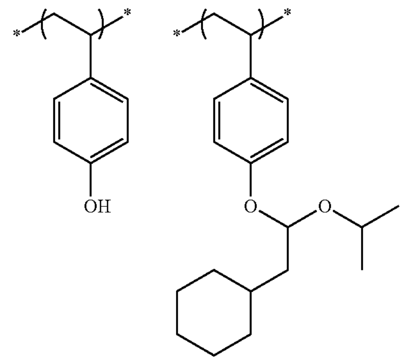
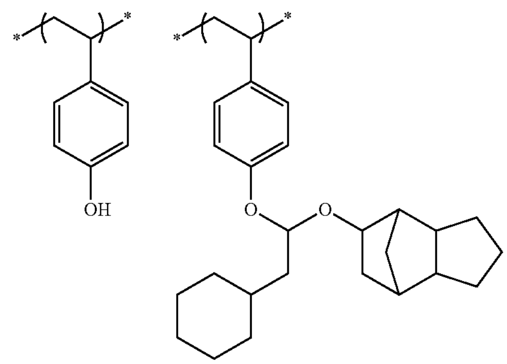
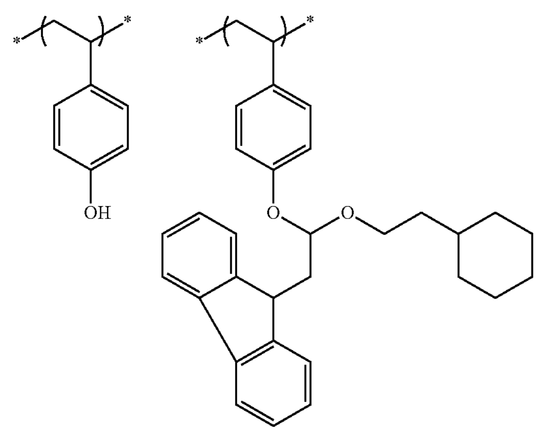
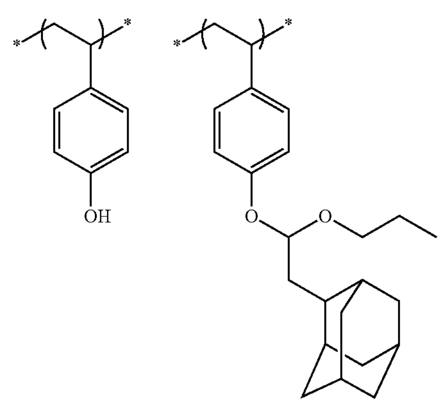

-continued
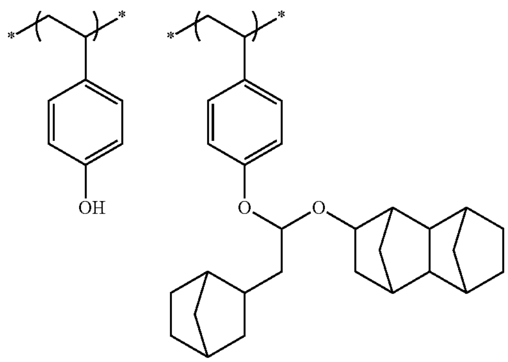
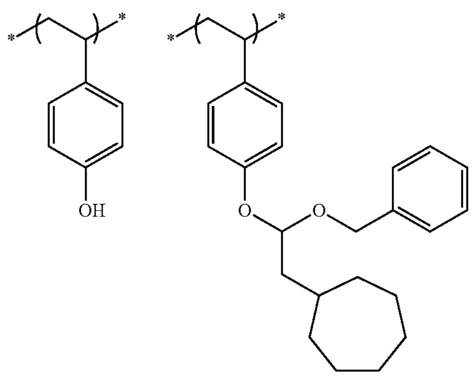
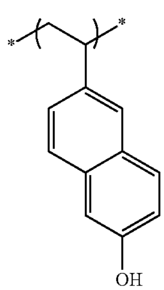
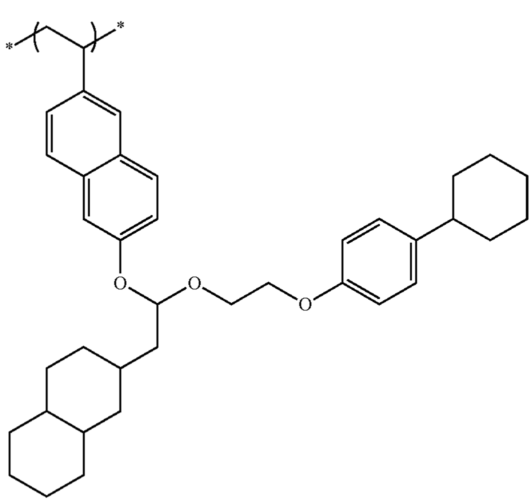
-continued
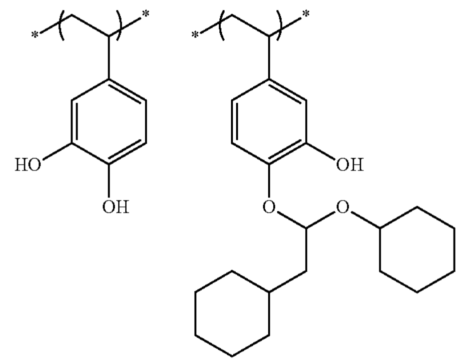
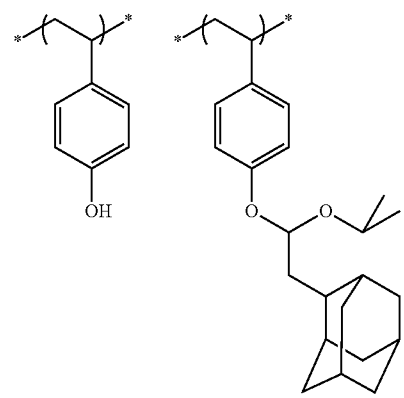
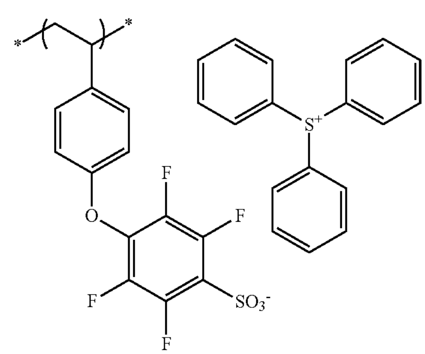
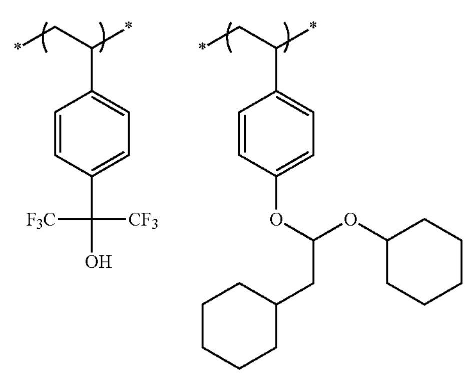

-continued
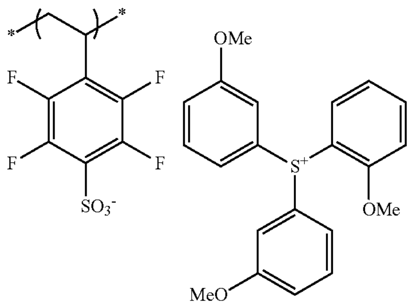
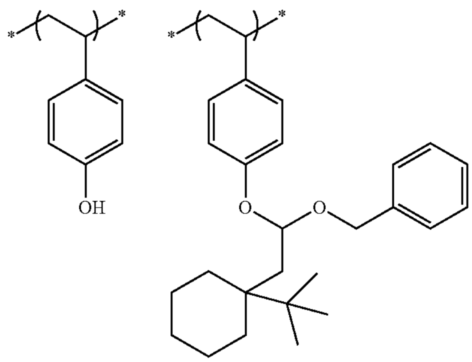
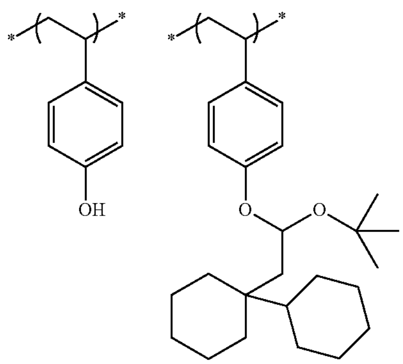
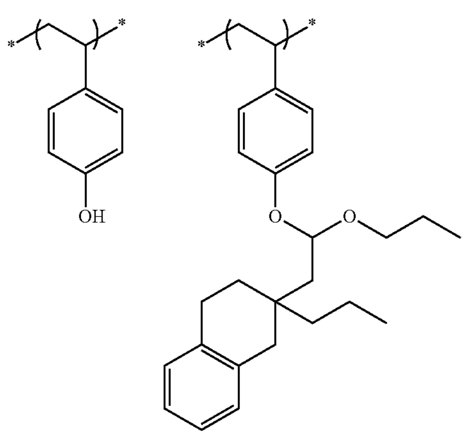
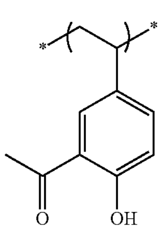
-continued
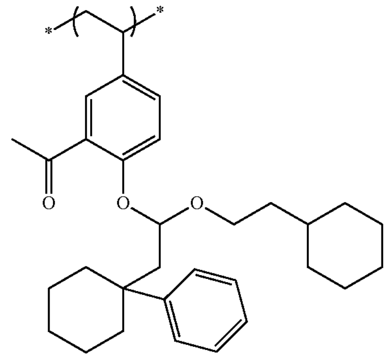
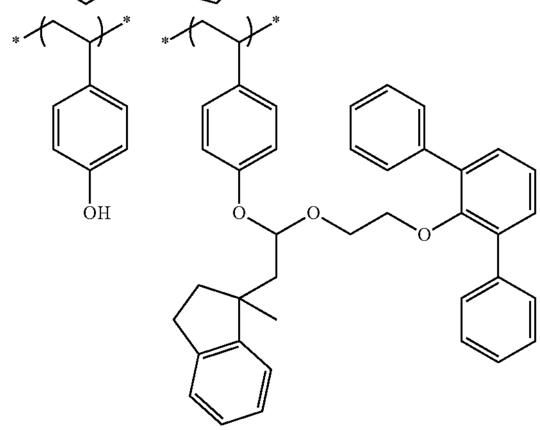
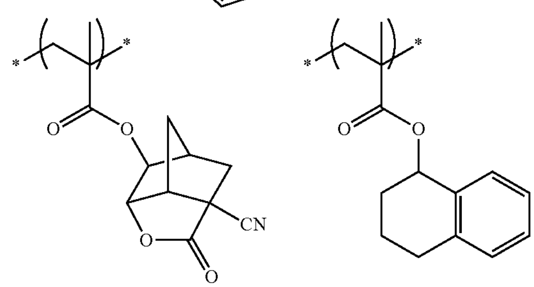
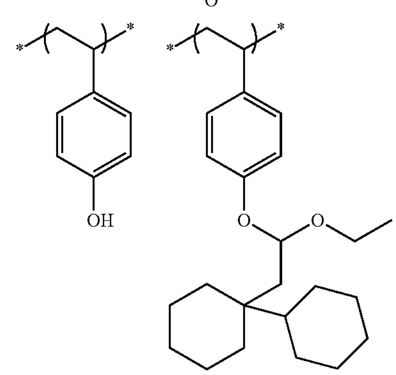
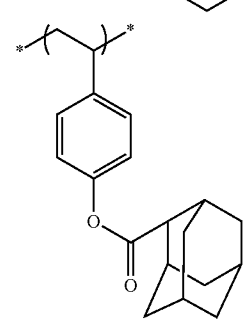

-continued
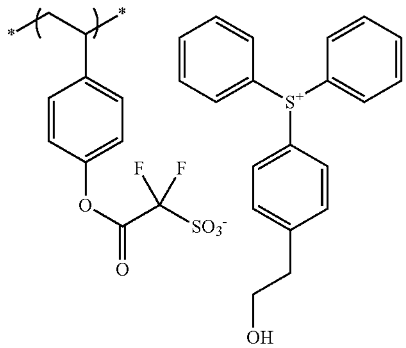
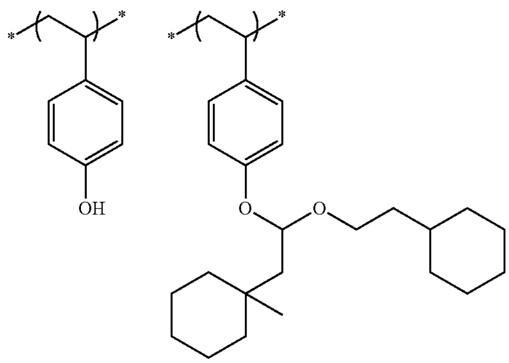
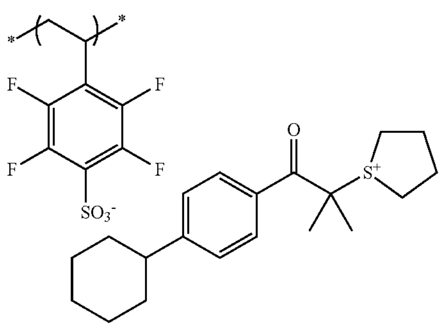
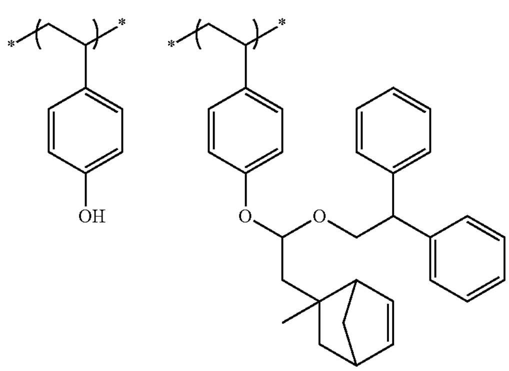
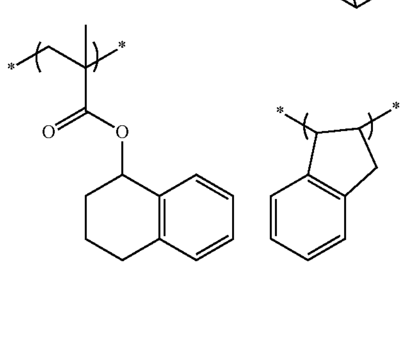
-continued
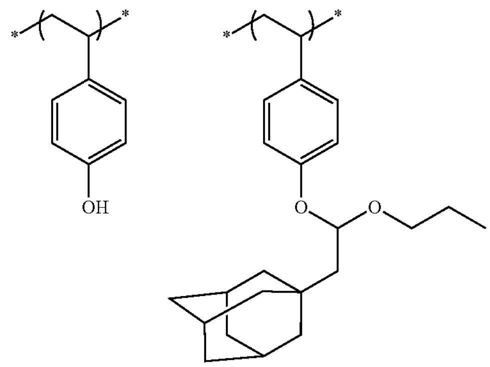
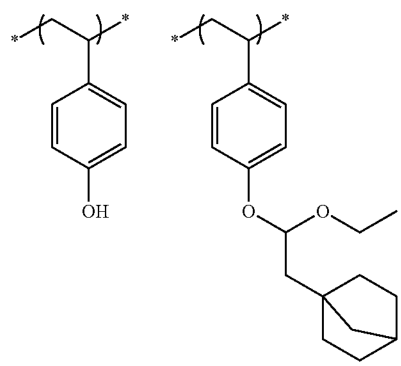
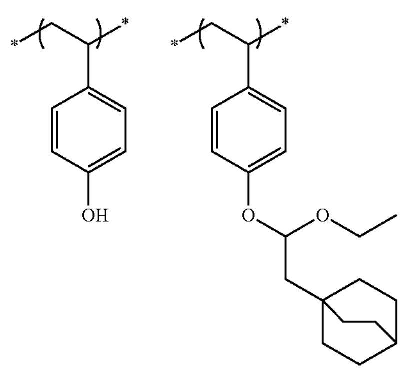
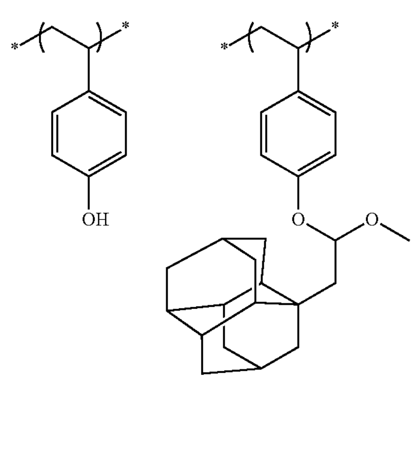

-continued
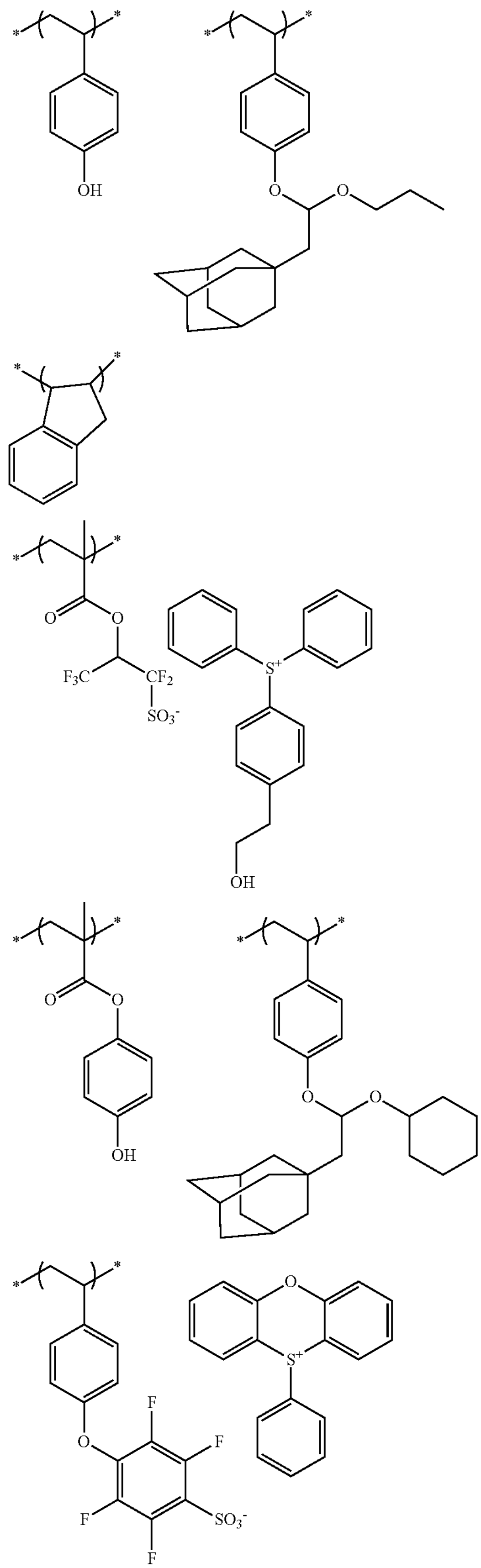
-continued
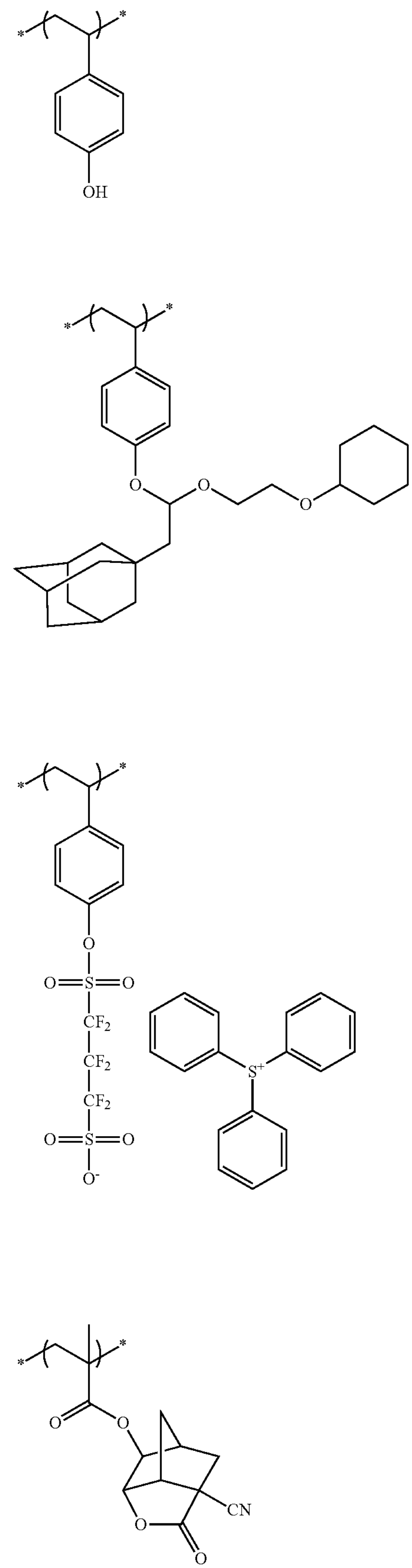

-continued
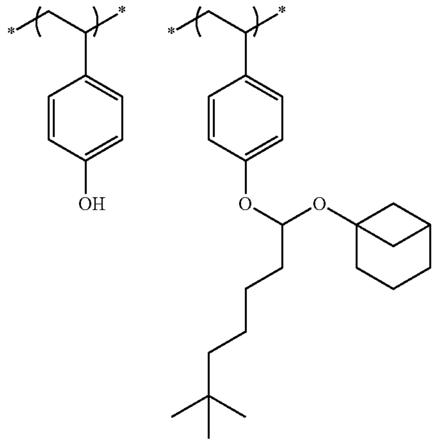
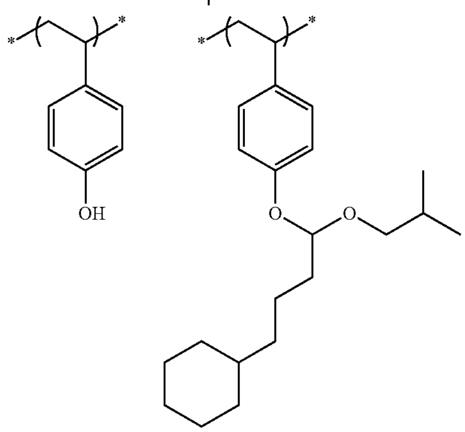
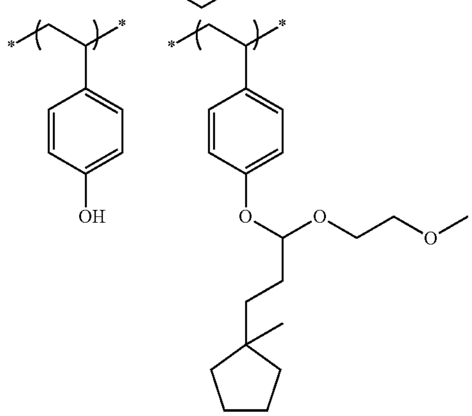
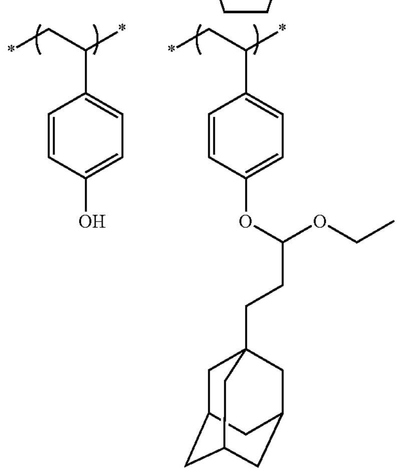
-continued
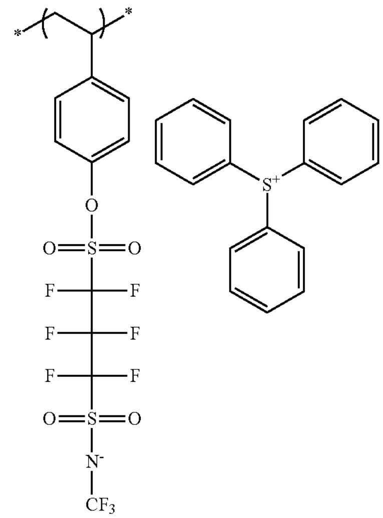
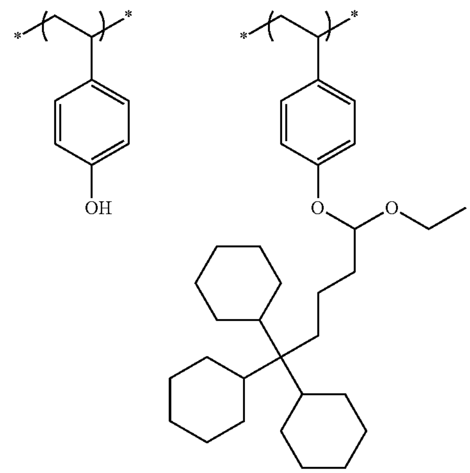
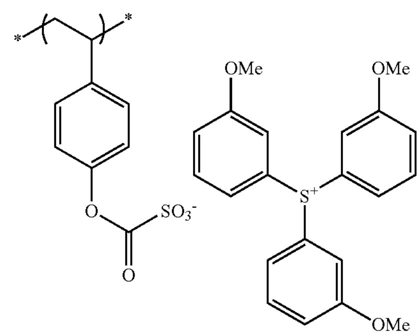
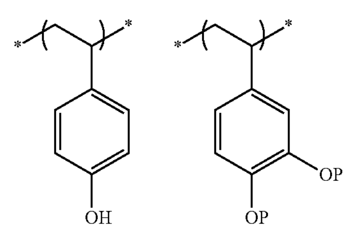
P =
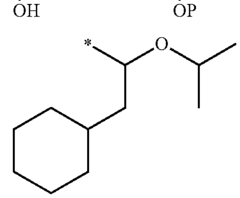

-continued

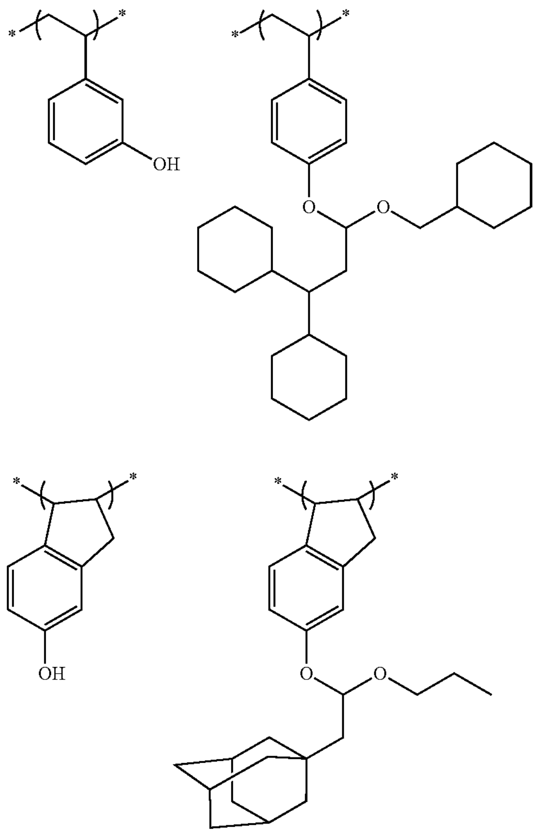

The case where the compound (P) is a low molecular compound is described below.

As described above, the compound (P) may be a low molecular compound where the hydrogen atom of a part of the phenolic hydroxyl group in a parent compound composed of a single molecular framework having a plurality of phenolic hydroxyl groups is substituted for by a group represented by formula (1).

The "low molecular compound" as used herein means a compound where the number of the polymerizable monomer-derived repeating units is less than 10, and the molecular weight thereof is, for example, 3,000 or less, preferably from 300 to 2,000, more preferably from 500 to 1,500.

In one embodiment, the low molecular compound (P) has a structure represented by the following formula (T-I) or (T-II):

(T-I)

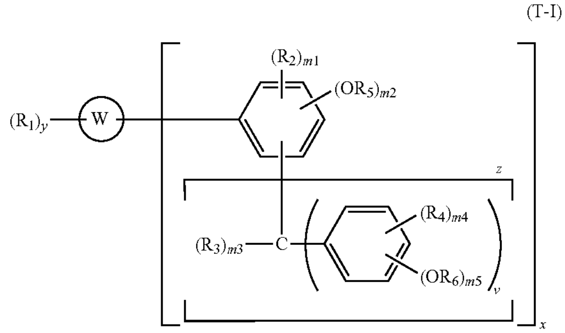

-continued (T-II)

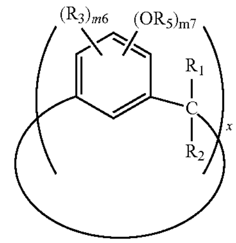

In formulae (T-I) and (T-II), each of $R_1$, $R_2$, $R_3$ and $R_4$ independently represents a hydrogen atom, an alkyl group or a cycloalkyl group. A plurality of $R_1$s may combine to form a ring. A plurality of $R_2$s may combine to form a ring. A plurality of $R_3$s may combine to form a ring. A plurality of $R_4$s may combine to form a ring. Also, each $R_1$, $R_2$, $R_3$ or $R_4$ may be the same as or different from every other $R_1$, $R_2$, $R_3$ or $R_4$.

Each of $R_5$ and $R_6$ independently represents a hydrogen atom or an organic group, and each $R_5$ or $R_6$ may be the same as or different from every other $R_5$ or $R_6$. Also, at least one of the plurality of $R_5$s and $R_6$s is a group represented by formula (1).

W represents a single bond, an alkylene group, an arylene group, and a group composed of an arbitrary combination thereof.

x represents a positive integer.

y represents an integer of 0 or more and when W is a single bond, y is 0.

z represents an integer of 0 or more.

v represents an integer of 0 or more.

Each of m1, m3, m4 and m6 represents a positive integer.

Each of m2, m5 and m7 represents an integer of 0 or more. However, these suffixes satisfy the relationships of $m1+m2+z=5$, $m3+v=3$, $m4+m5=5$, $m2+m5\geq 2$. Also, $m6+m7=4$.

Incidentally, the compound (P) represented by formula (T-1) is preferably a compound represented by any one of formulae (T-III) to (T-V).

The compound (P) can be synthesized by reacting a phenolic hydroxyl group of a compound working out to a mother nucleus (parent compound), such as polyvalent phenol compound, with a protectant/reactant agent to protect the hydrogen atom of the phenolic hydroxyl group of the mother compound by a group represented by formula (1). The protectant/reactant agent as used herein indicates a compound used when performing a reaction of introducing a protective group. Incidentally, the ratio of the phenolic hydroxyl group whose hydrogen atom is protected by a group represented by formula (1) to the total number of phenolic hydroxyl groups contained in the parent compound is referred to as a protection ratio.

Specific examples of the parent compound of the compound (P) represented by formula (T-1) are illustrated below, but the present invention is not limited thereto.

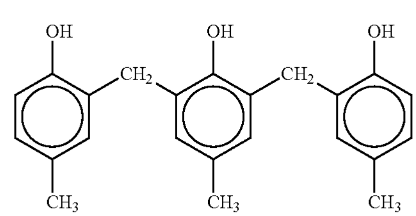

-continued
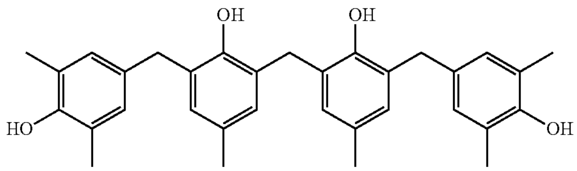
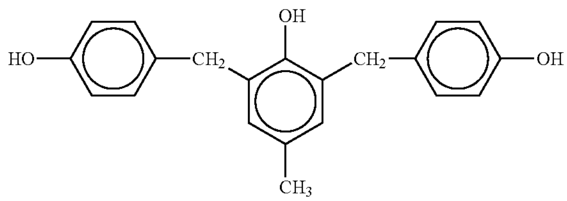
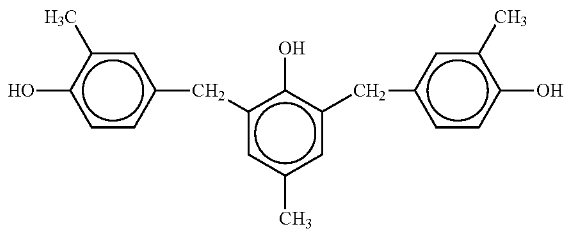
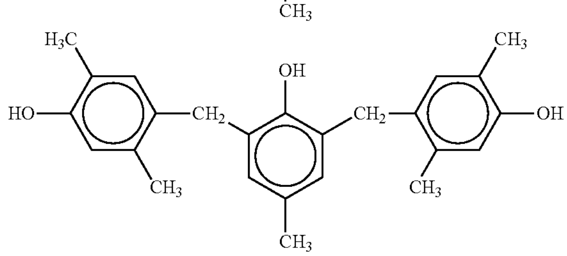
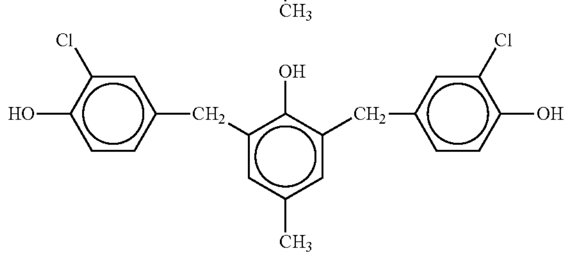
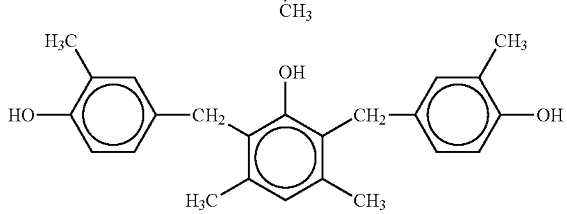
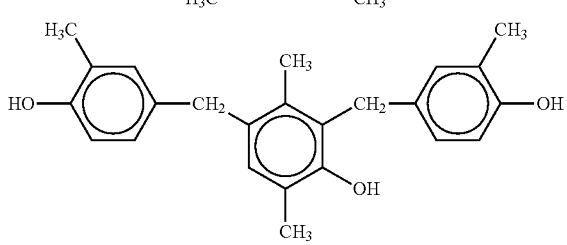
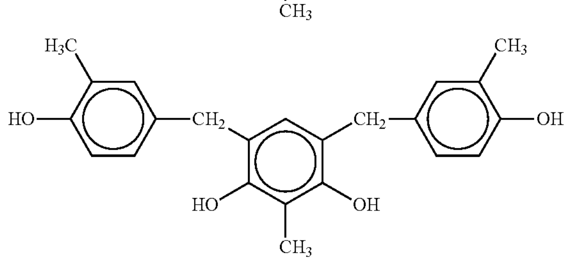
-continued
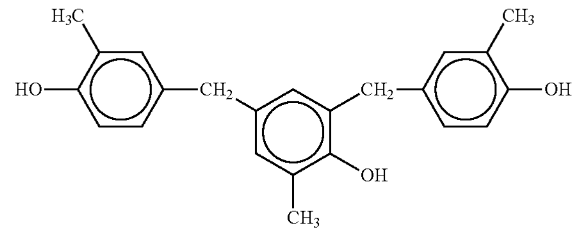
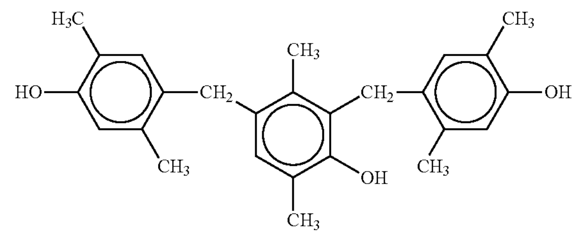
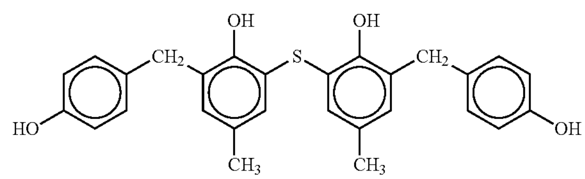
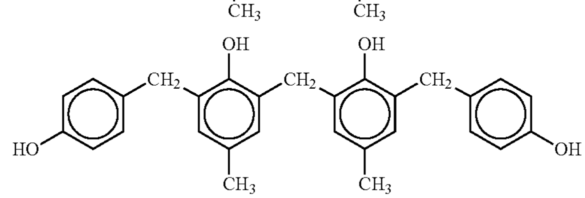
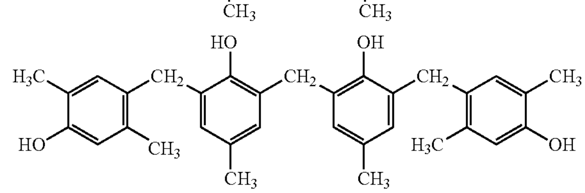
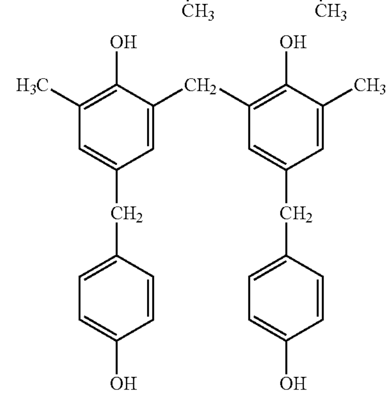
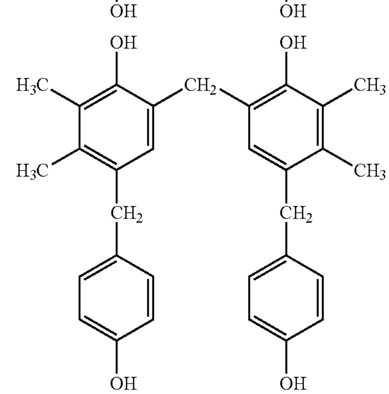

-continued
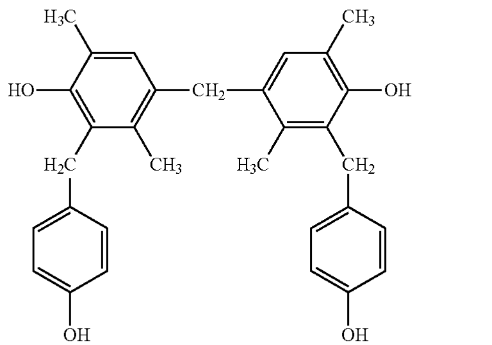
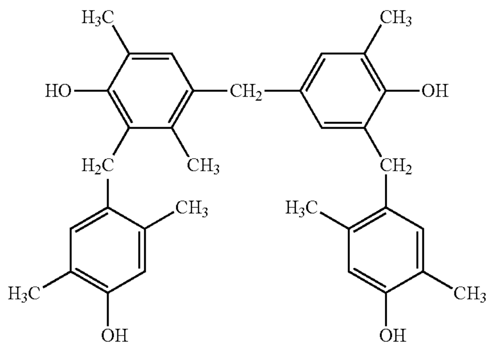
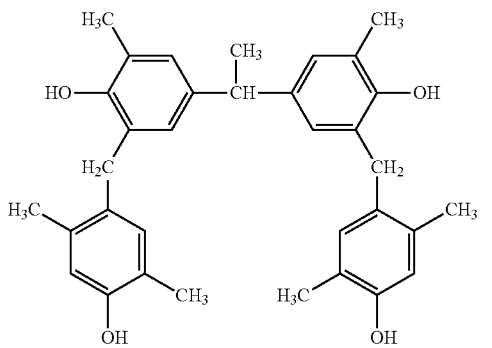
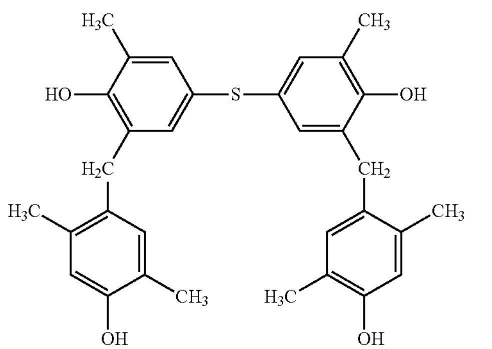
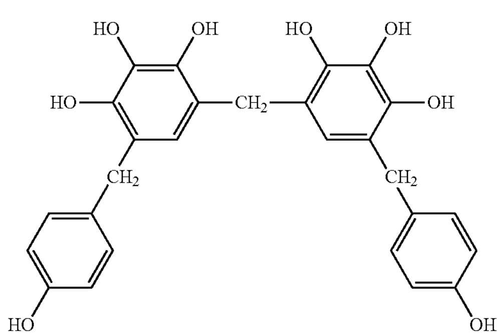
-continued
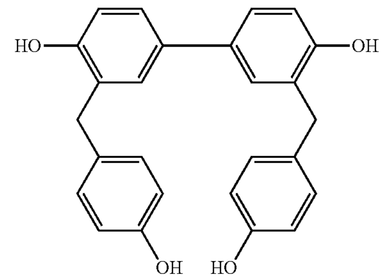
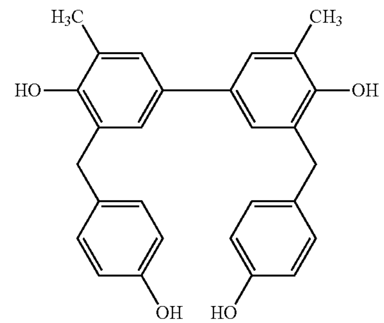
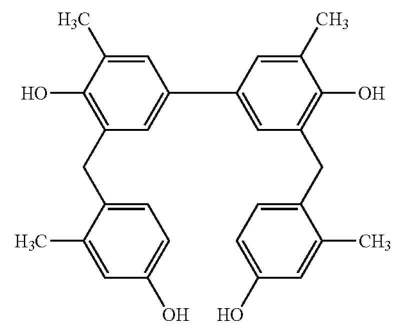
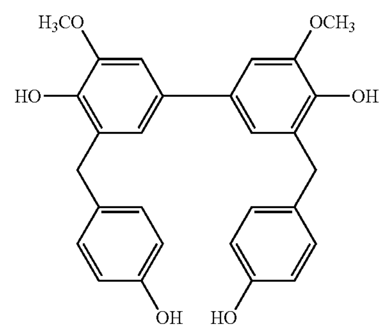
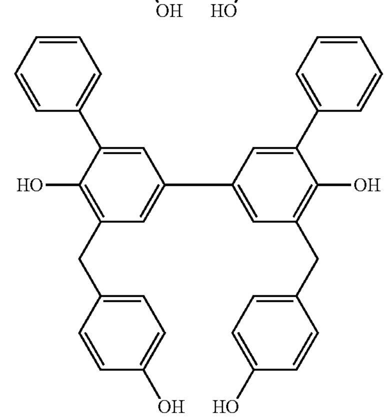

-continued
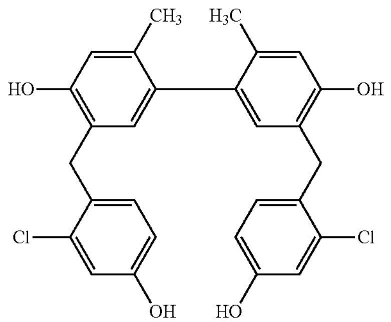
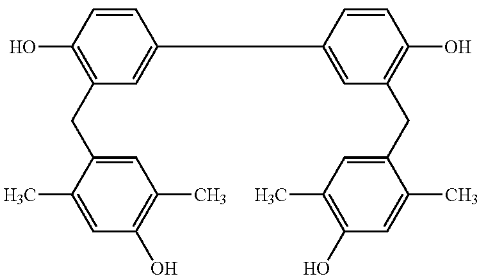
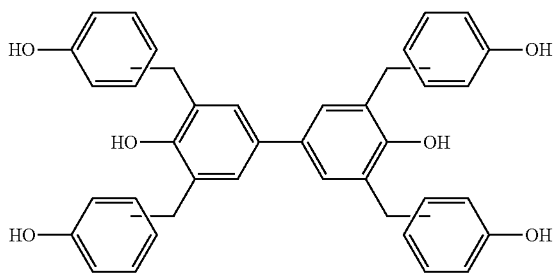
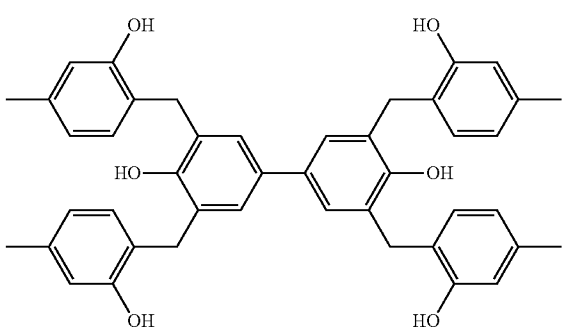
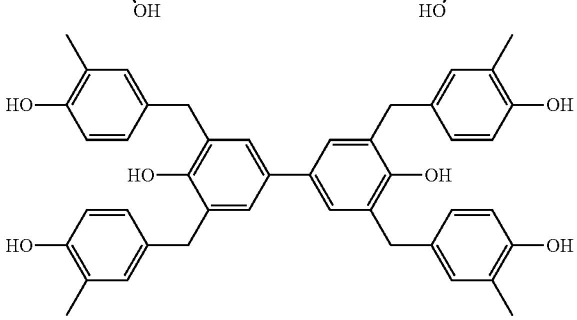
Mixture of Ortho-Substitution Product/Para-Substitution Product
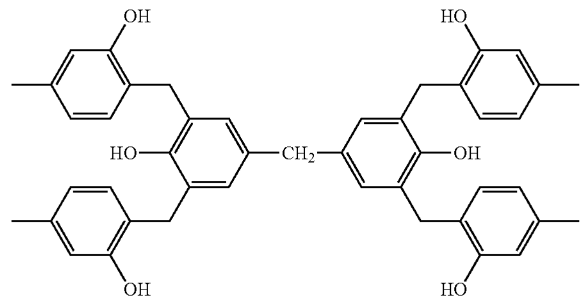
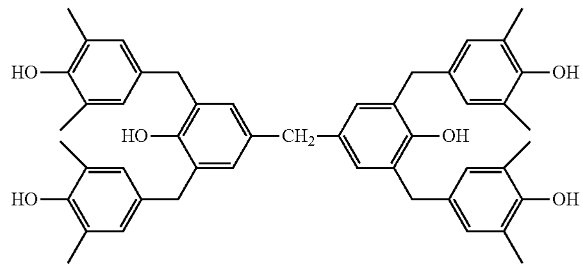
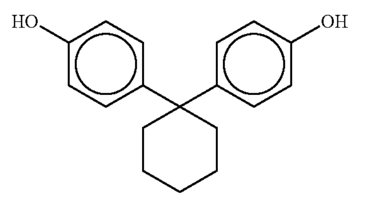
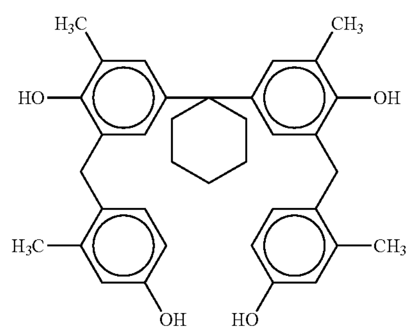
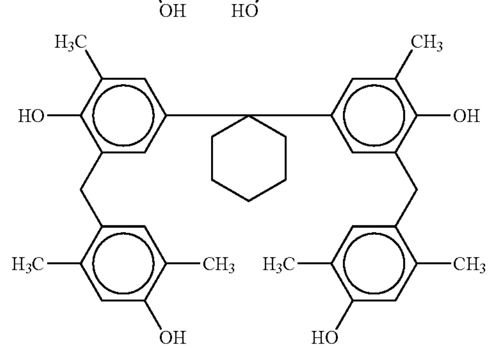

-continued
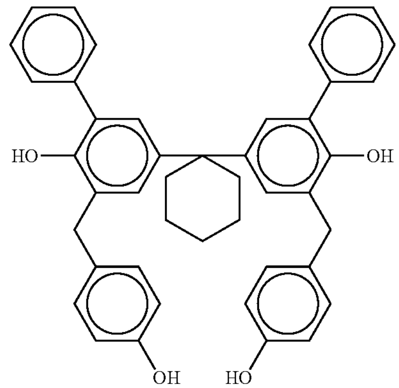
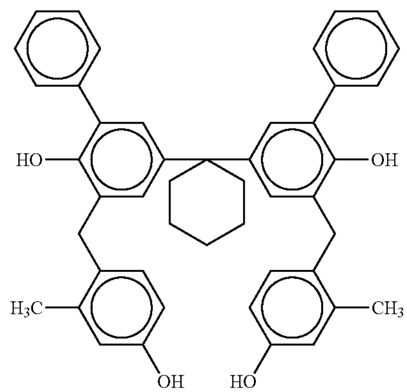
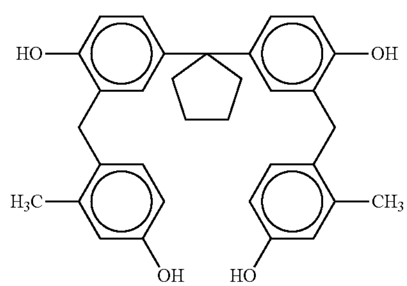
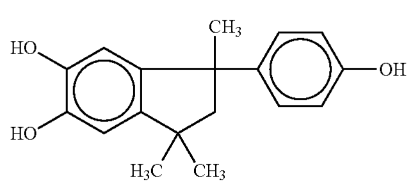
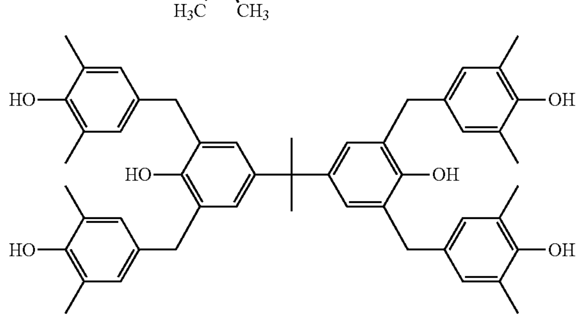
-continued
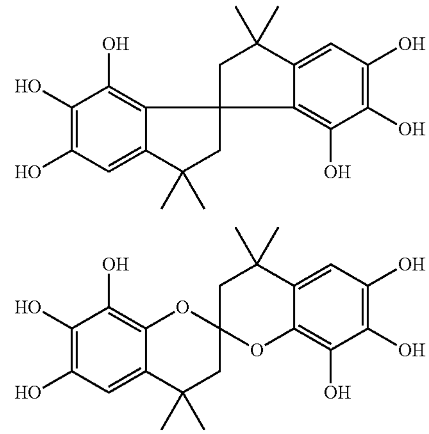
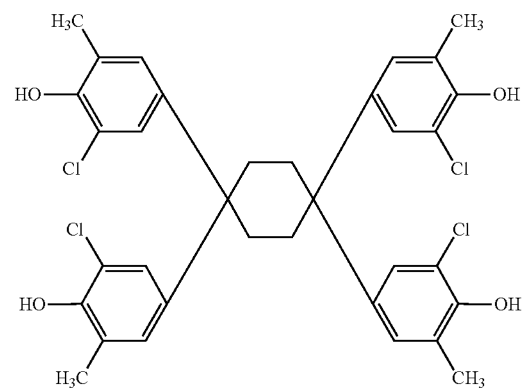
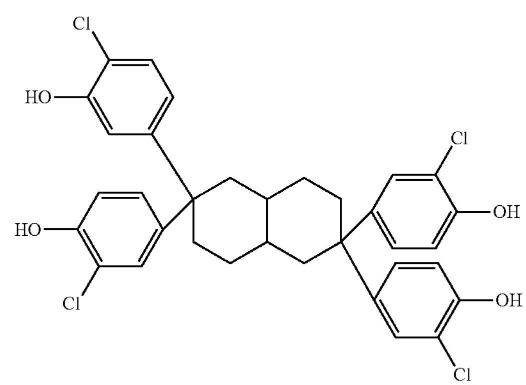
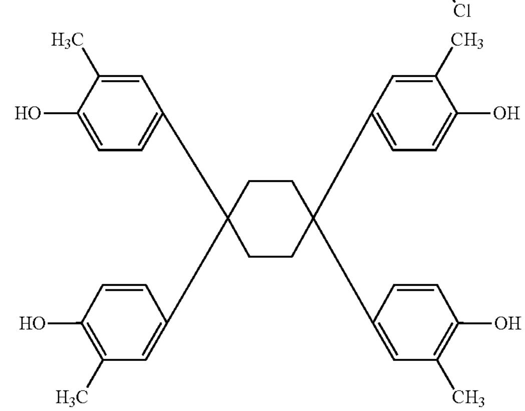

-continued
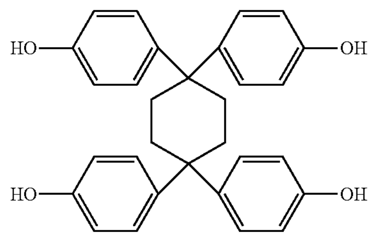
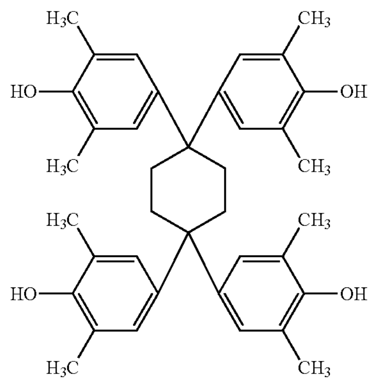
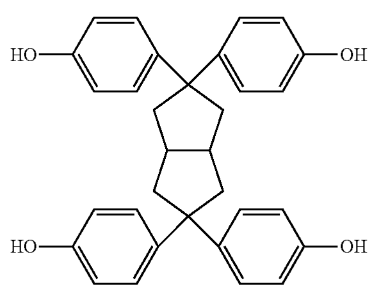
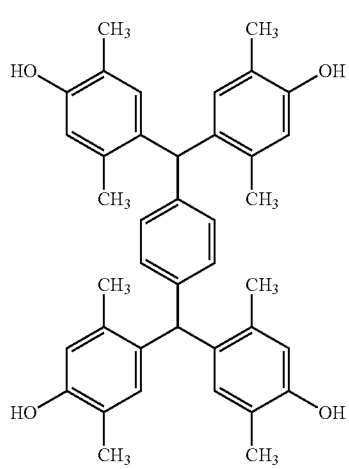
-continued
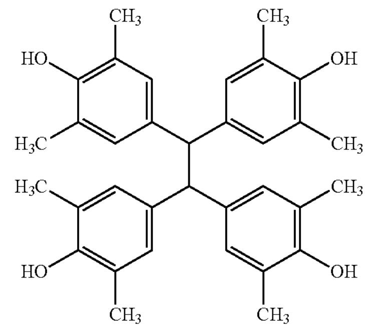
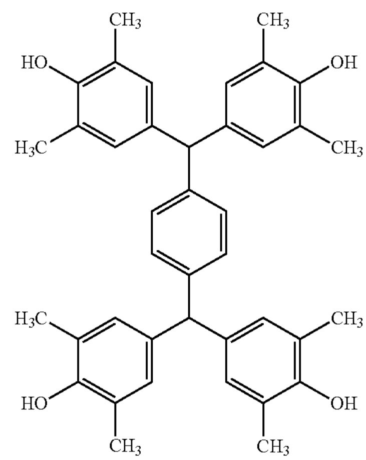
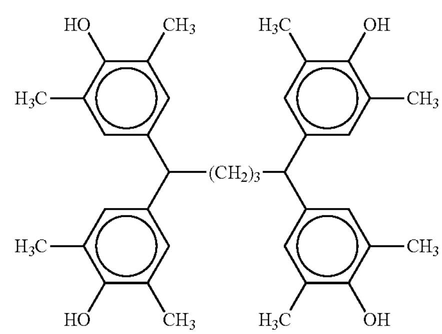
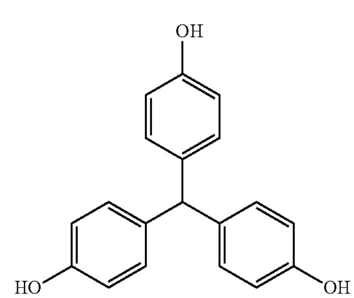

-continued
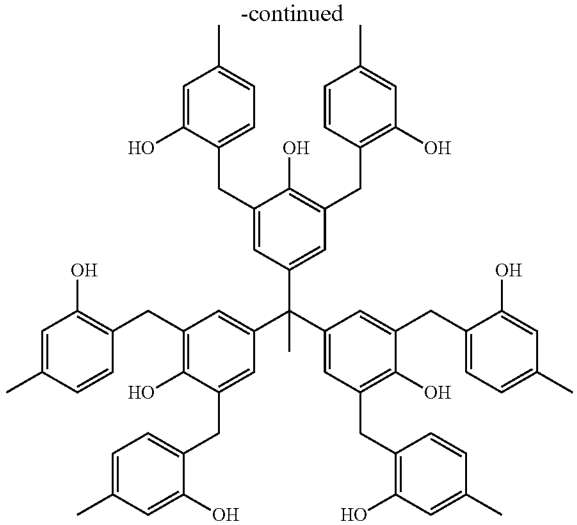
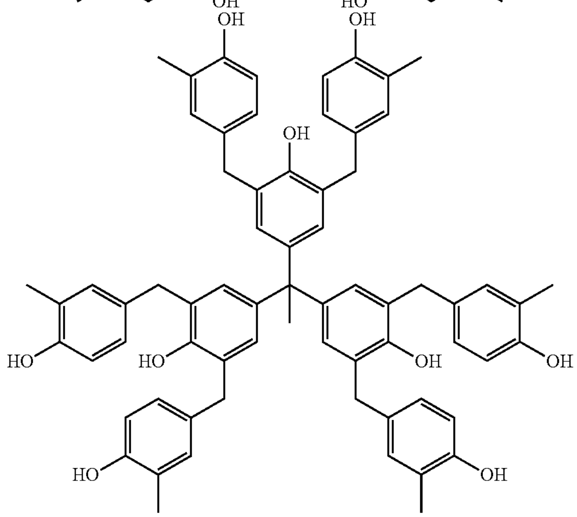
-continued
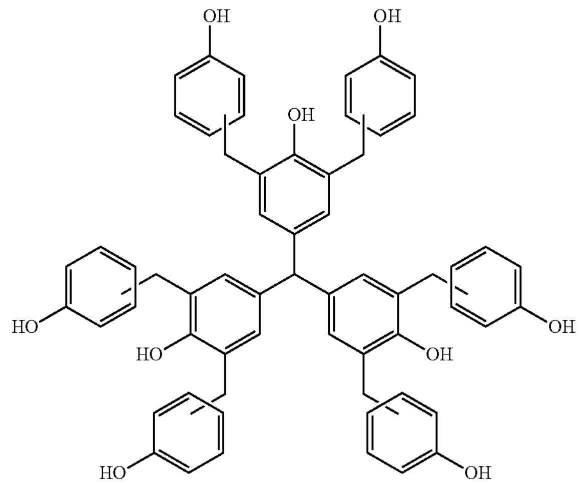
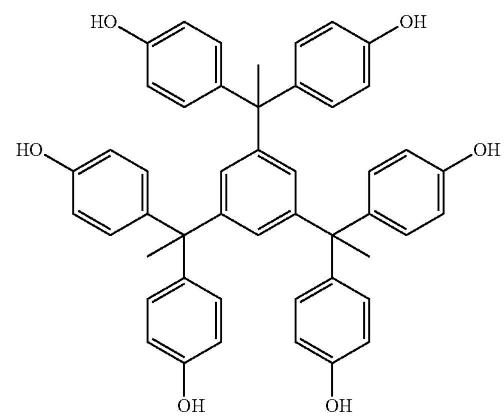
Mixture of Ortho-Substitution Product/Para-Substitution Product
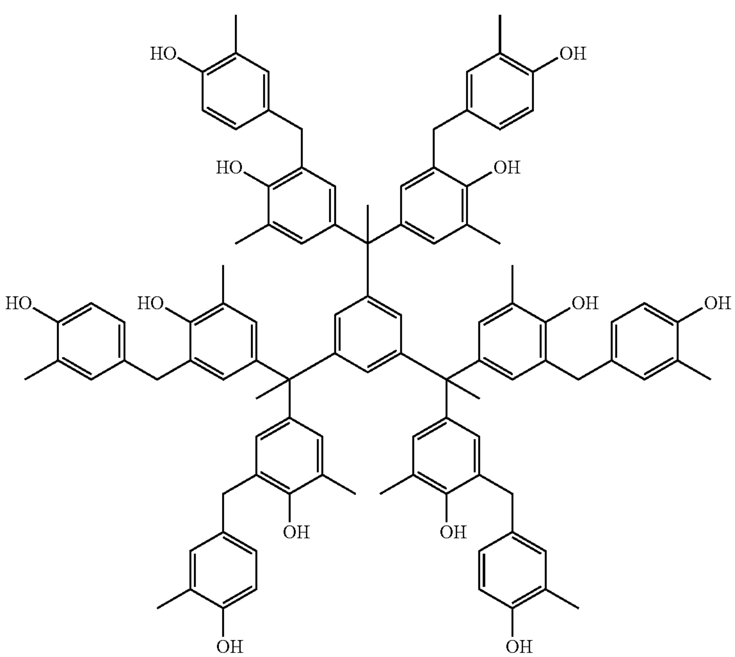

-continued
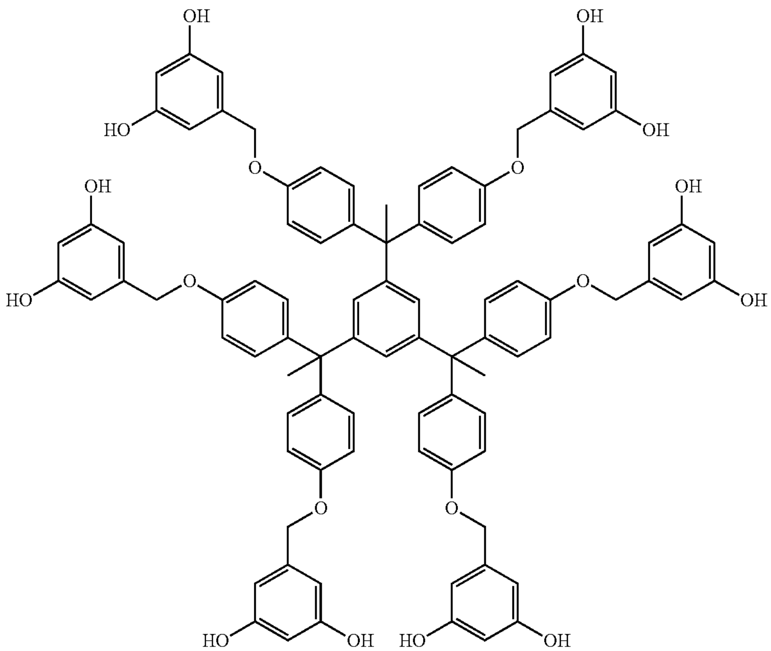
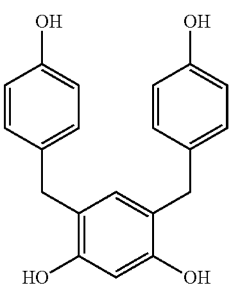
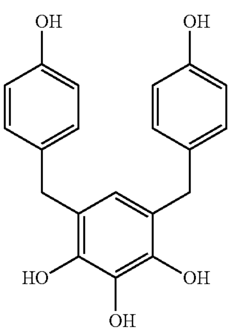
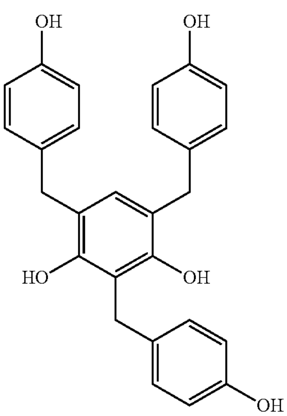
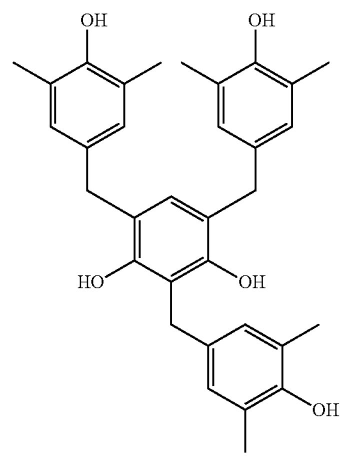
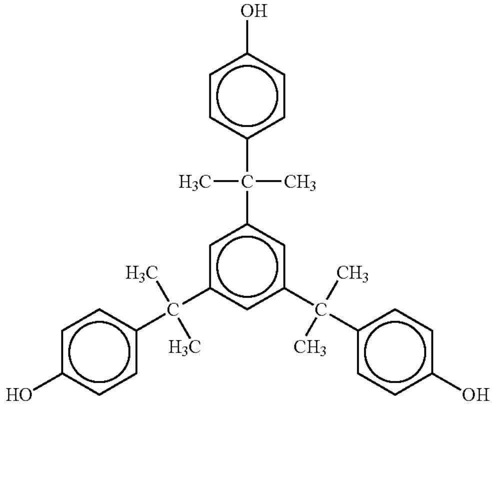
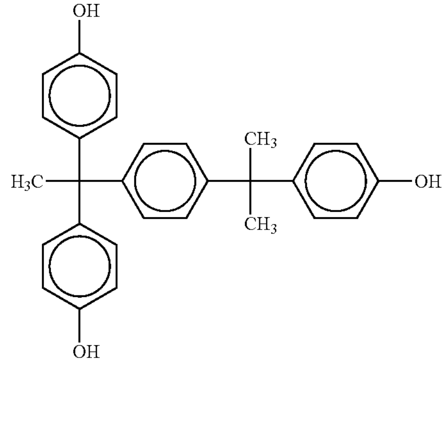

-continued
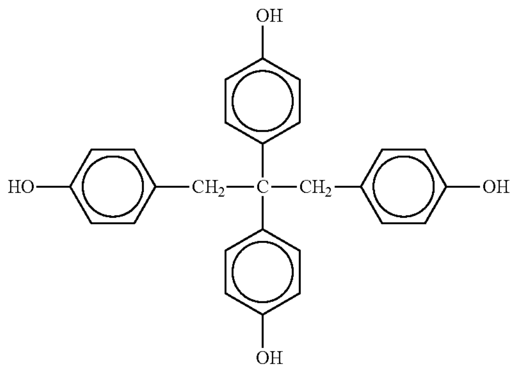
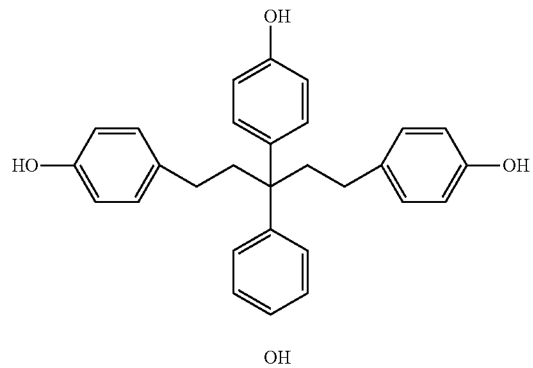
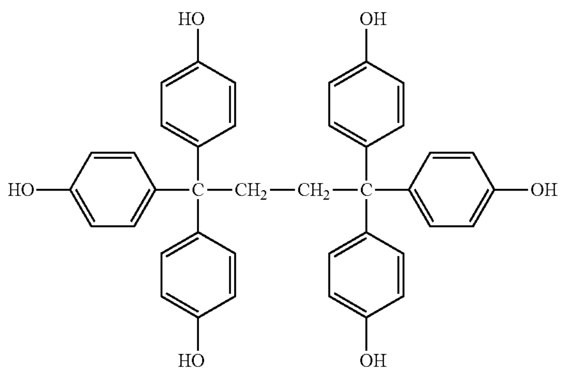
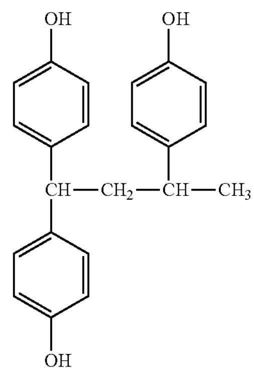
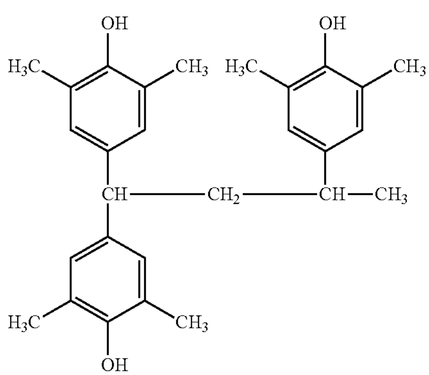
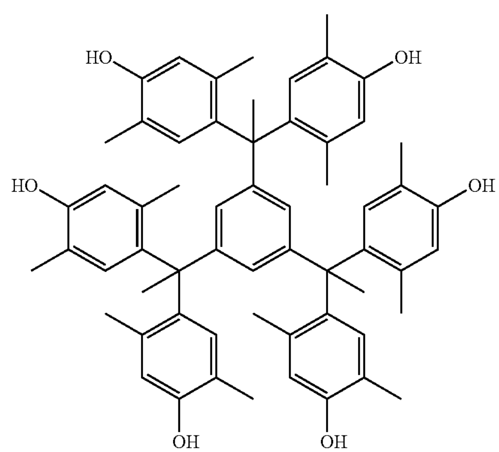
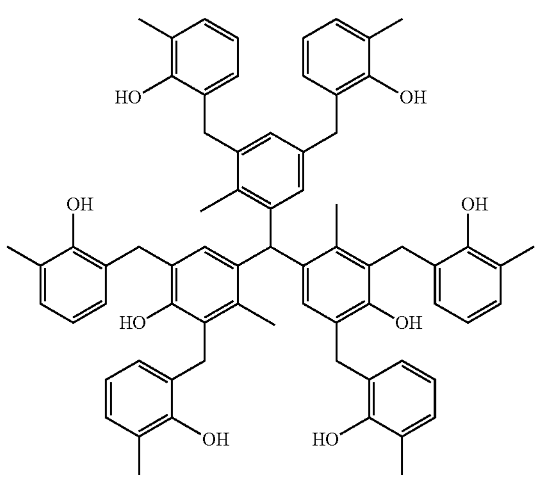
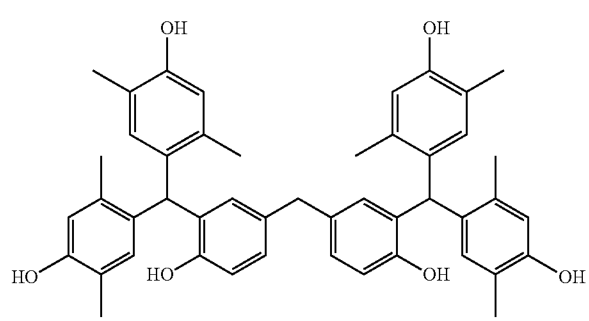

-continued
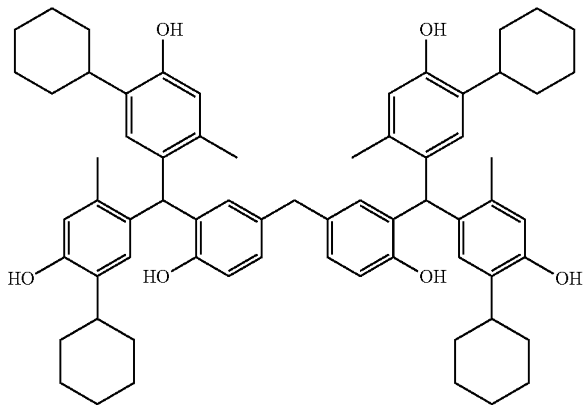
Specific examples of the parent compound of the compound (P) represented by formula (T-II) are illustrated below, but the present invention is not limited thereto.
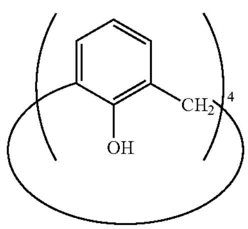
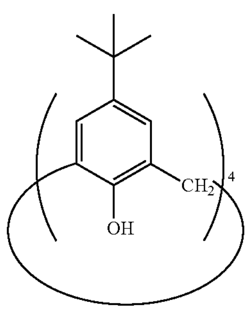
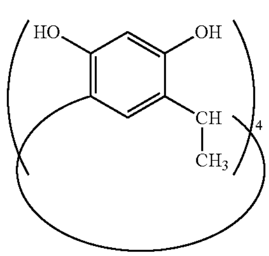
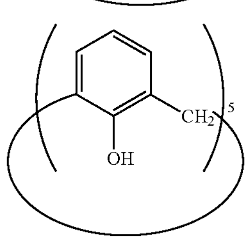
-continued
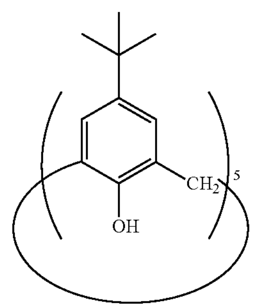
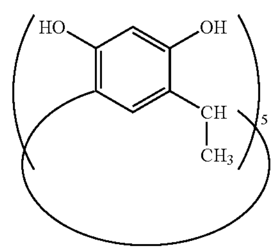
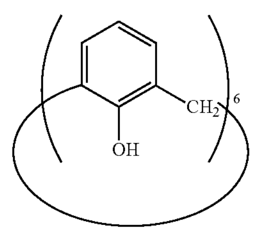
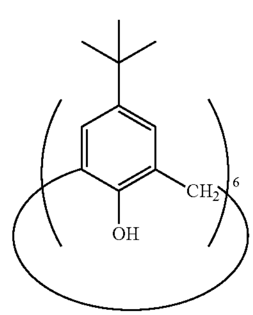

-continued

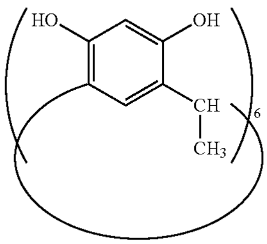

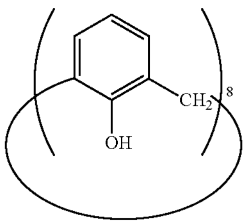

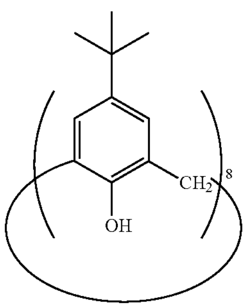

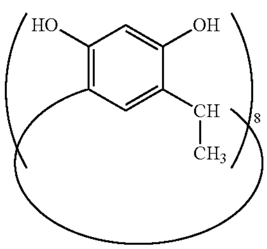

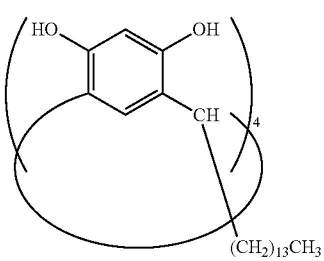

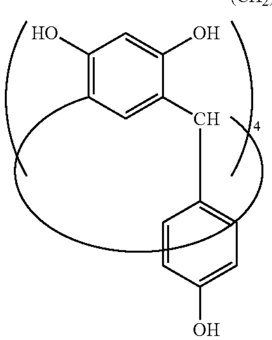

-continued

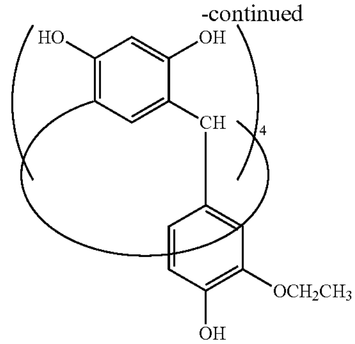

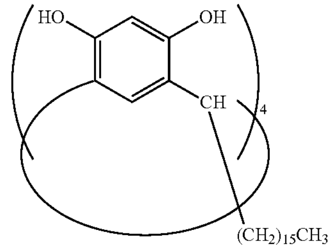

[2] (B) Resin Capable of Increasing the Solubility for an Alkali Developer by the Action of an Acid, which is Different from the Compound (P)

The actinic ray-sensitive or radiation-sensitive composition of the present invention may contain a resin capable of increasing the solubility for an alkali developer by the action of an acid, which is different from the compound (P) (hereinafter, the resin is sometimes referred to as "resin (B)").

The resin (B) is a resin that is changed in the alkali solubility by the action of an acid.

The resin (B) is preferably insoluble or sparingly soluble in an alkali developer.

The resin (B) preferably contains a repeating unit having an acid-decomposable group.

Examples of the acid-decomposable group include a group where the hydrogen atom of an alkali-soluble group such as carboxyl group, phenolic hydroxyl group, sulfonic acid group and thiol group is protected by a group capable of leaving by the action of an acid.

Examples of the group capable of leaving by the action of an acid include —C($R_{36}$)($R_{37}$)($R_{38}$), —C($R_{36}$)($R_{37}$)($OR_{39}$), —C(═O)—O—C($R_{36}$)($R_{37}$)($R_{38}$), —C($R_{01}$)($R_{02}$)($OR_{39}$), and —C($R_{01}$)($R_{02}$)—C(═O)—O—C($R_{36}$)($R_{37}$)($R_{38}$).

In the formulae above, each of $R_{36}$ to $R_{39}$ independently represents an alkyl group, a cycloalkyl group, an aryl group, an aralkyl group or an alkenyl group, and $R_{36}$ and $R_{37}$ may combine with each other to form a ring structure. Each of $R_{01}$ and $R_{02}$ independently represents a hydrogen atom, an alkyl group, a cycloalkyl group, an aryl group, an aralkyl group or an alkenyl group.

The resin (B) may be synthesized by a conventional method (for example, radical polymerization).

The weight average molecular weight of the resin (B) is preferably from 1,000 to 200,000, more preferably from 2,000 to 20,000, still more preferably from 3,000 to 15,000, yet still more preferably from 3,000 to 10,000, in terms of polystyrene as measured by the GPC method. When the weight average molecular weight is from 1,000 to 200,000, degradation of the heat resistance and dry etching resistance can be prevented and at the same time, the film-forming property can be prevented from deterioration due to degraded developability or increased viscosity.

The polydispersity (molecular weight distribution) is usually from 1 to 3, preferably from 1 to 2.6, more preferably from 1 to 2, still more preferably from 1.4 to 1.7. As the molecular weight distribution is narrower, the resolution and resist profile are more excellent, the side wall of the resist pattern is smoother, and the roughness is more improved.

As for the resin (B), two or more kinds of resins may be used in combination.

The actinic ray-sensitive or radiation-sensitive composition of the present invention may or may not contain the resin (B), but in the case of containing the resin (B), the content thereof is usually from 1 to 50 mass %, preferably from 1 to 30 mass %, more preferably from 1 to 15 mass %, based on the total solid content of the actinic ray-sensitive or radiation-sensitive composition. (In this specification, mass ratio is equal to weight ratio.)

Examples of the resin (B) include those described in paragraphs [0214] to [0594] of Japanese Patent Application No. 2011-217048.

Preferred examples of the resin (B) are illustrated below, but the present invention is not limited thereto.

(Ab-1)

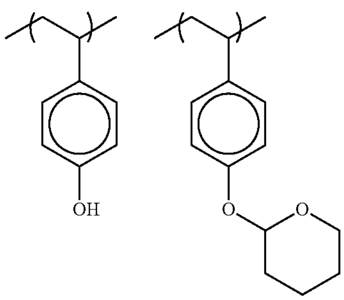

(Ab-5)

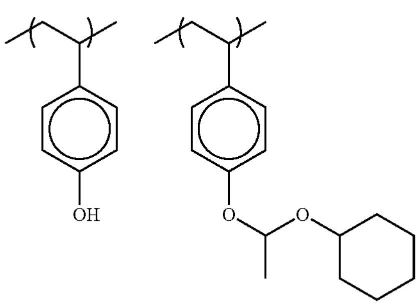

(Ab-8)

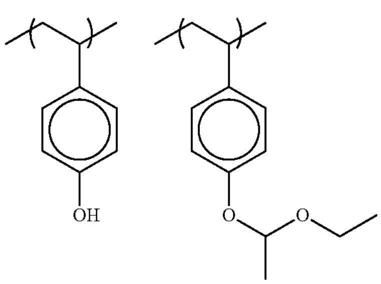

-continued

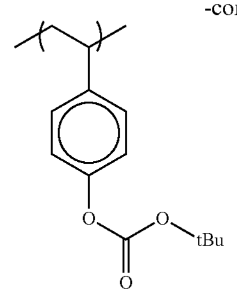

(Ab-12)

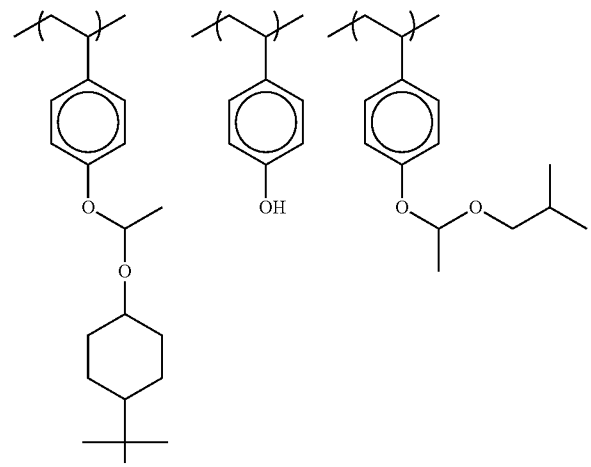

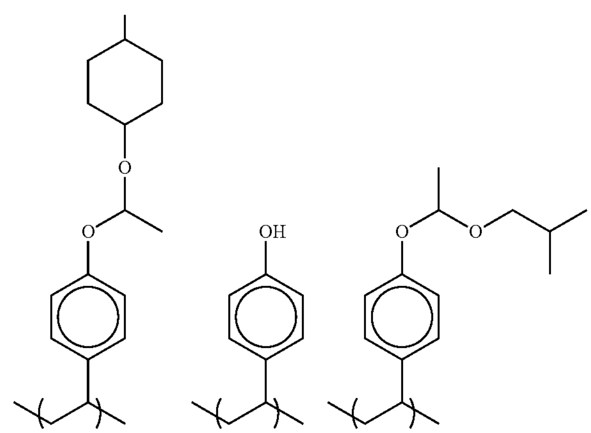

(Ab-14)

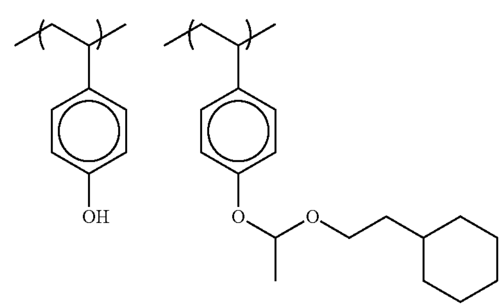

-continued
(Ab-20)
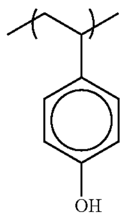
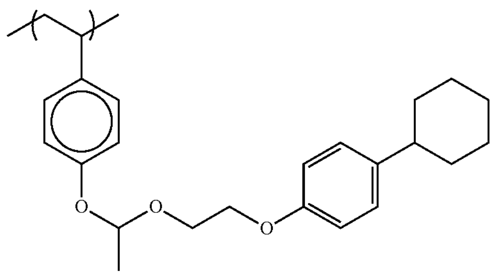
(Ab-21)
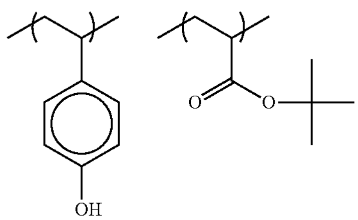
(Ab-22)
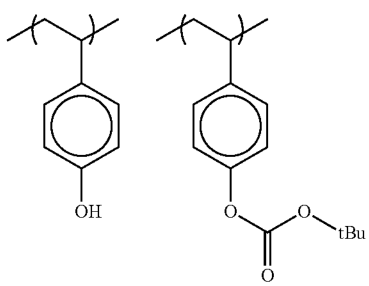
(Ab-30)
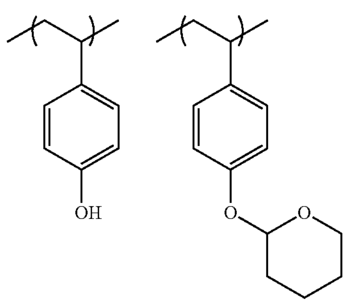
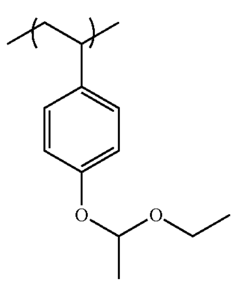
-continued
(Ab-33)
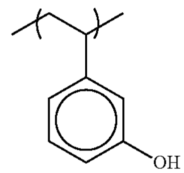
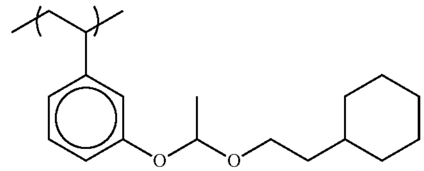
(Ab-35)
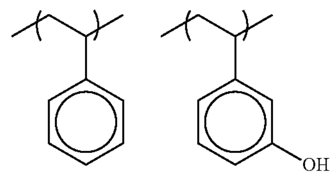
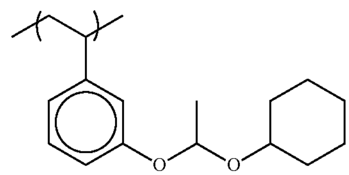
(Ab-39)
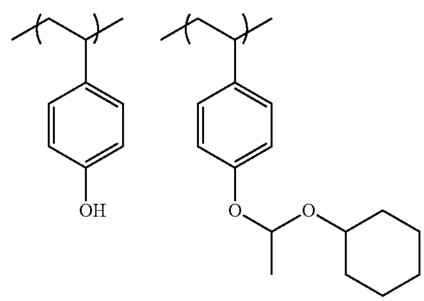
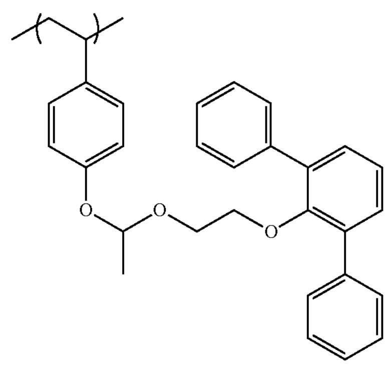
(Ab-41)
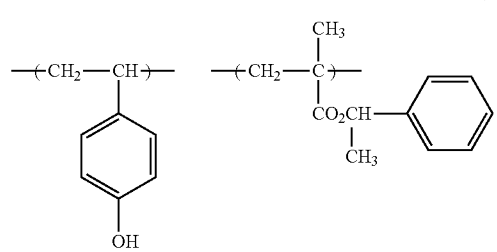

-continued
(Ab-57)
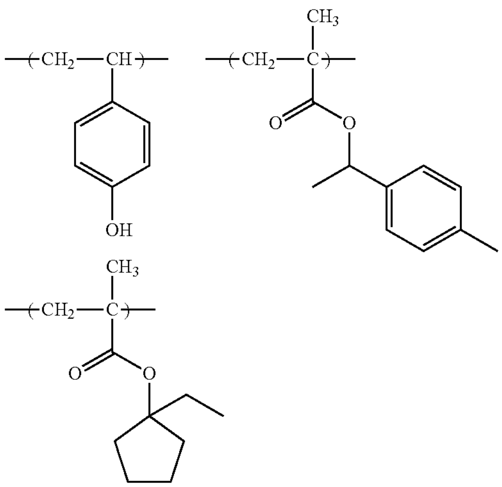
(Ab-58)
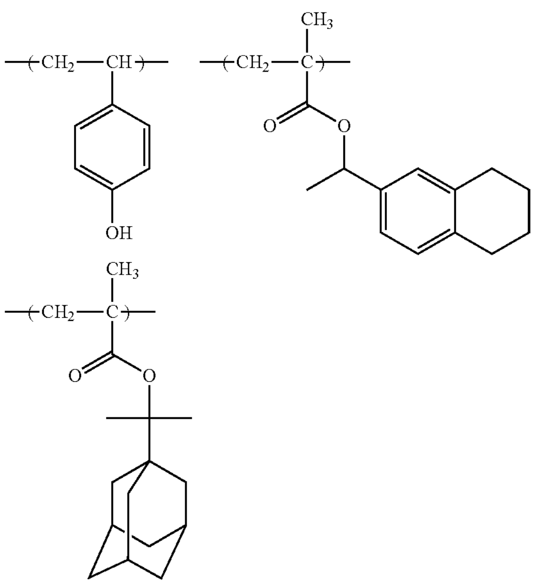
(Ab-60)
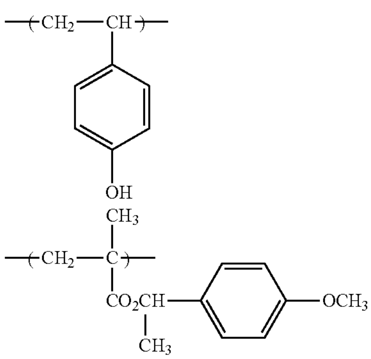
(Ab-64)
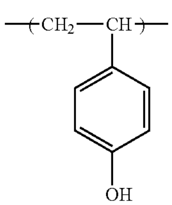
-continued
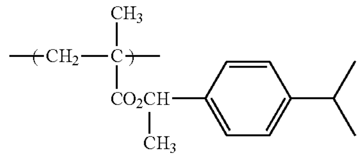
(Ab-71)
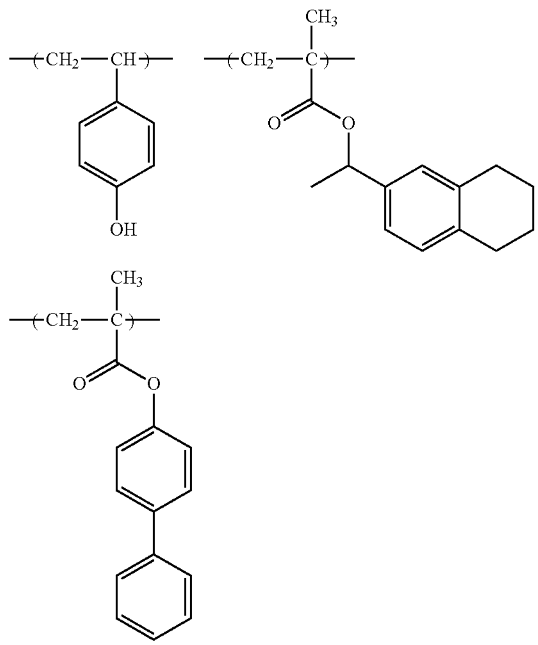
(Ab-73)
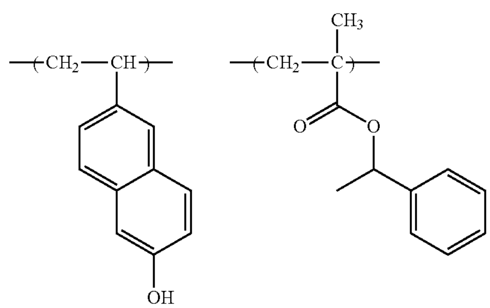
(Ab-80)
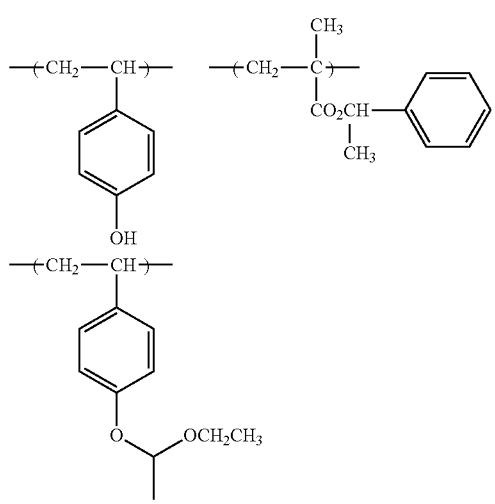

-continued
(Ab-86)
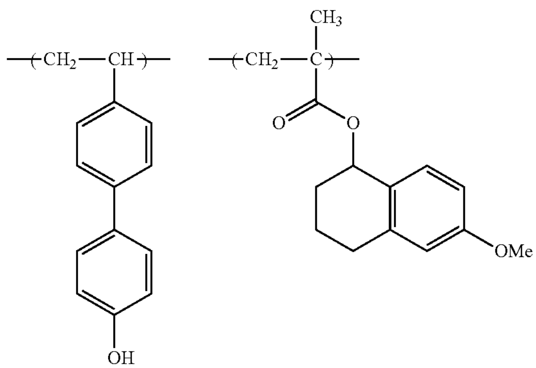
(Ab-87)
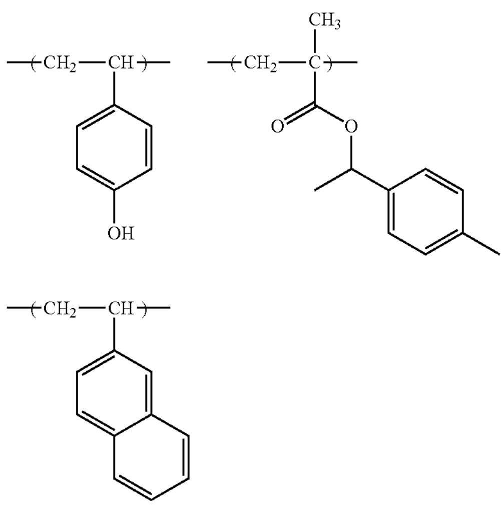
(Ab-88)
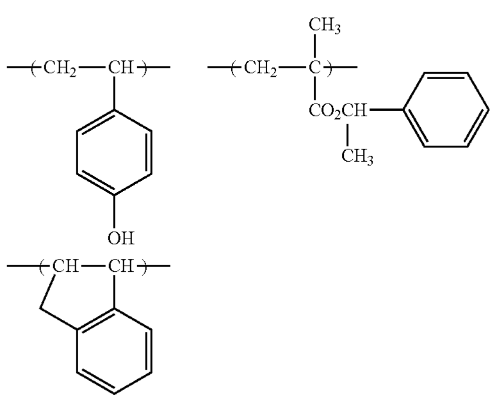
(Ab-91)
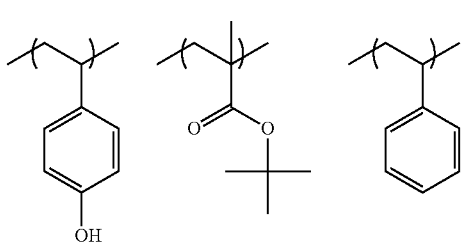
-continued
(Ab-93)
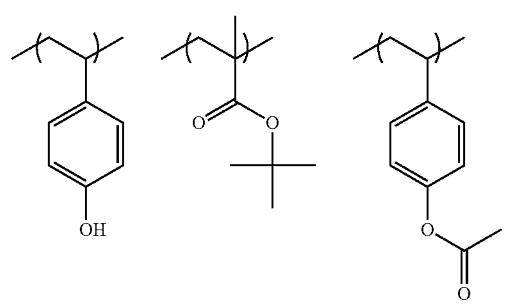
(Ab-106)
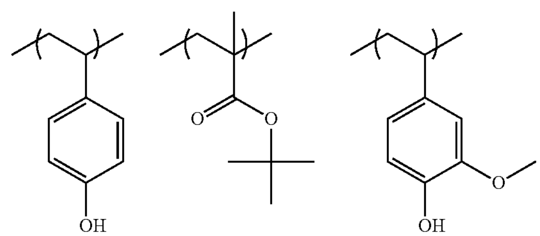
(Ab-110)
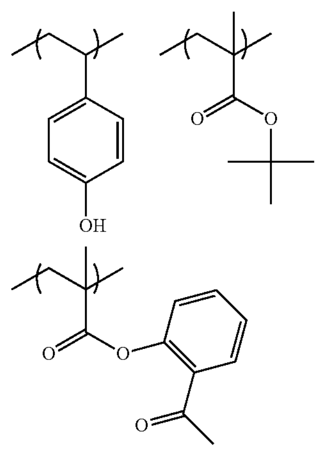
(Ab-120
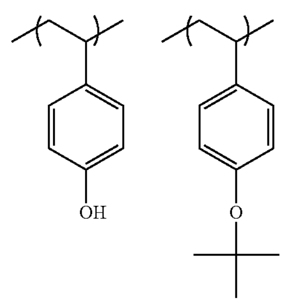
(Ab-121)
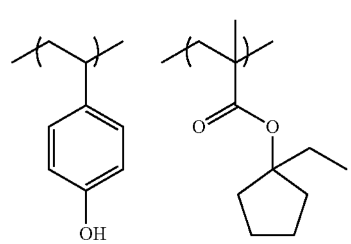

-continued
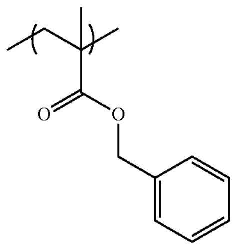
(Ab-128)
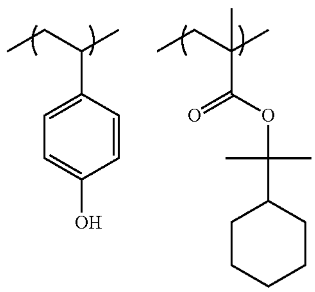
(Ab-131)
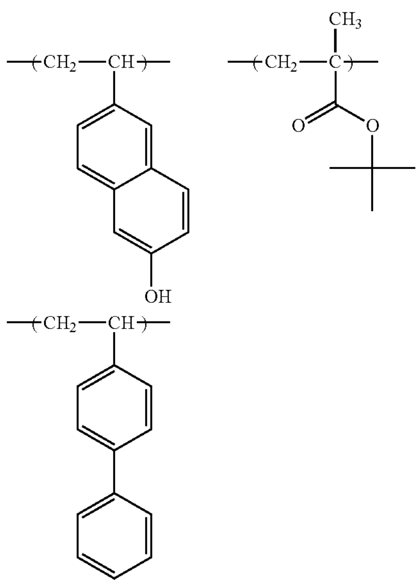
(Ab-133)
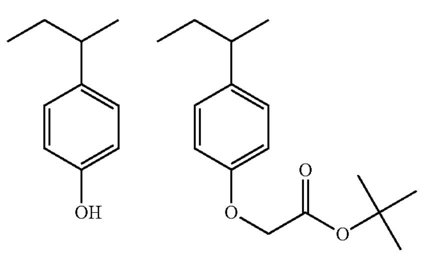
(Ab-135)
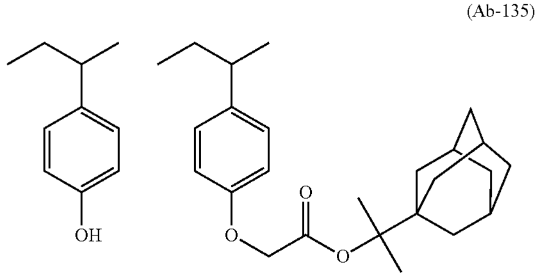
-continued
(Ab-143)
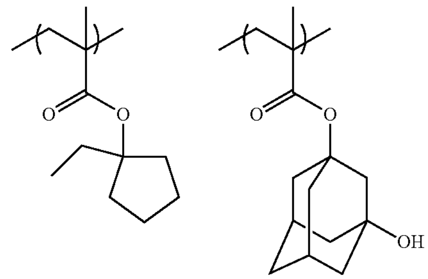
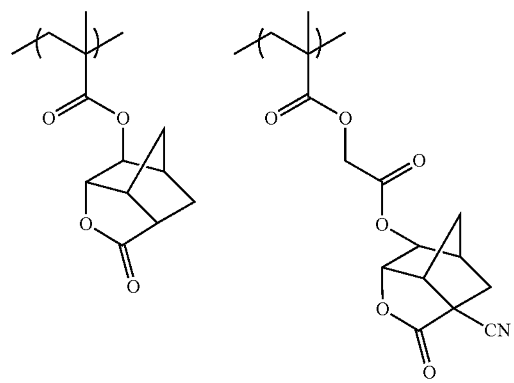
(Ab-149)
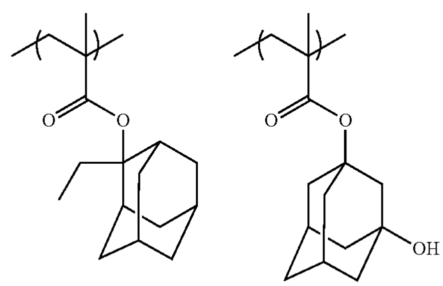
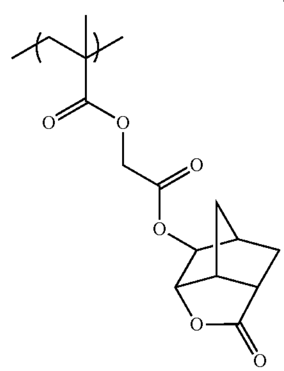
(Ab-160)
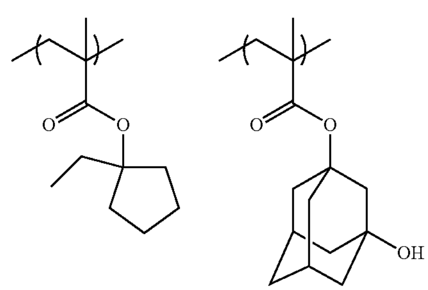

-continued
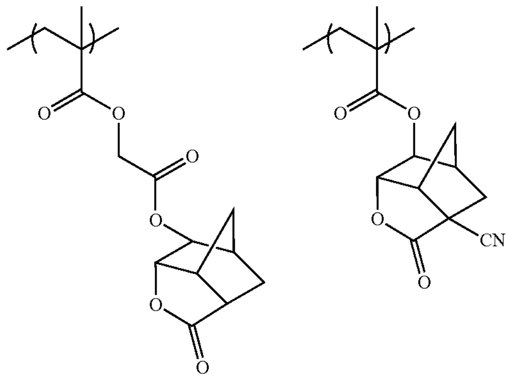
(Ab-165)
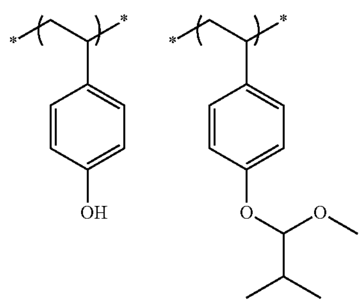
(Ab-166)
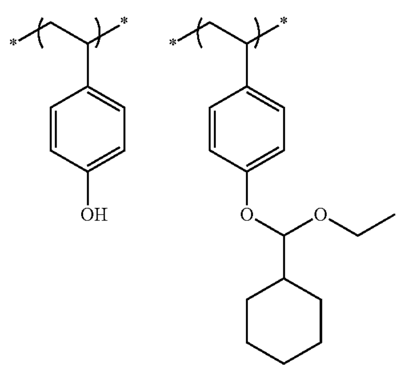
(Ab-167)
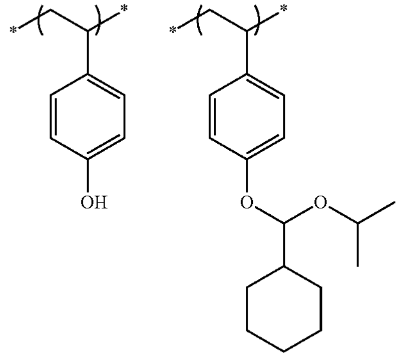
-continued
(Ab-168)
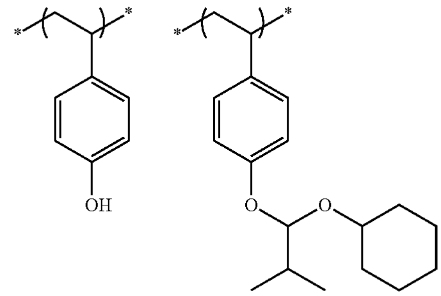
(Ab-169)
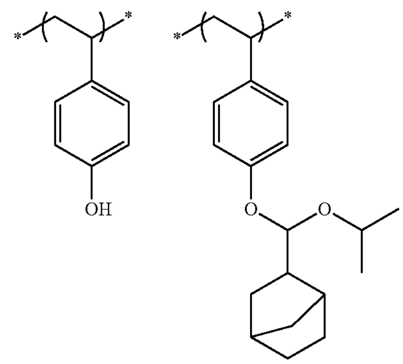
(Ab-170)
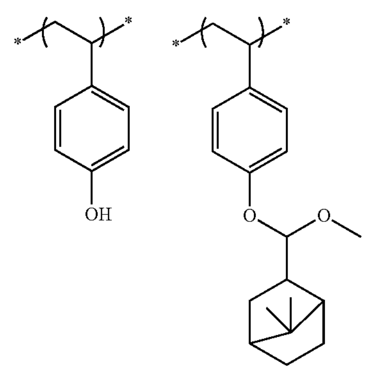
(Ab-171)
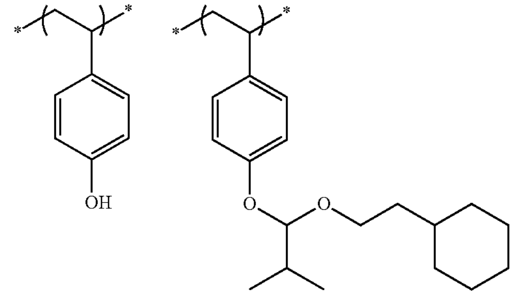

-continued
(Ab-172)
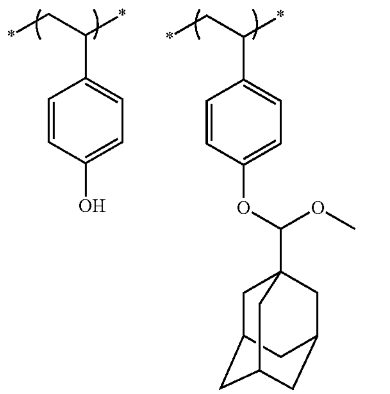
(Ab-173)
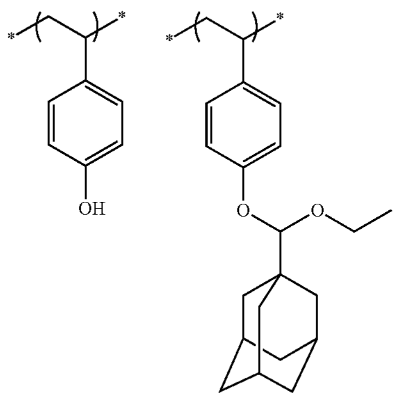
(Ab-174)
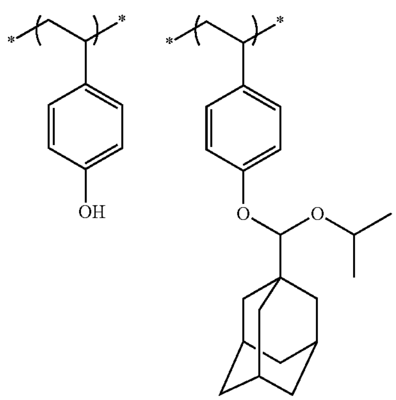
(Ab-175)
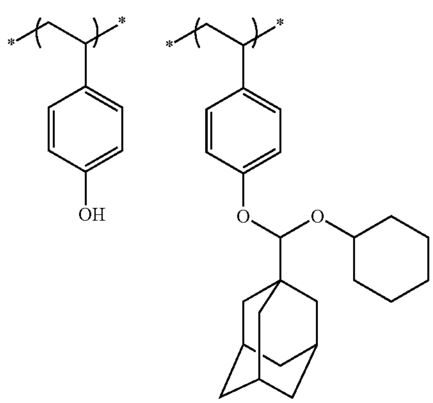
-continued
(Ab-176)
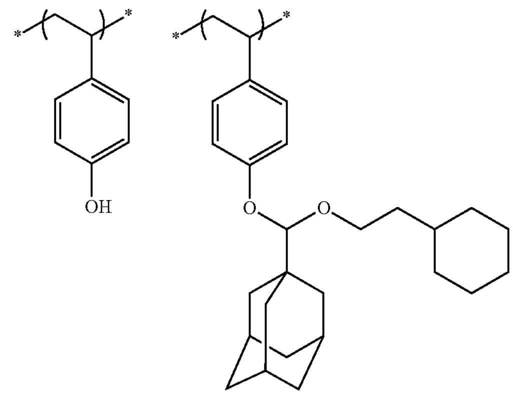
Ab-177
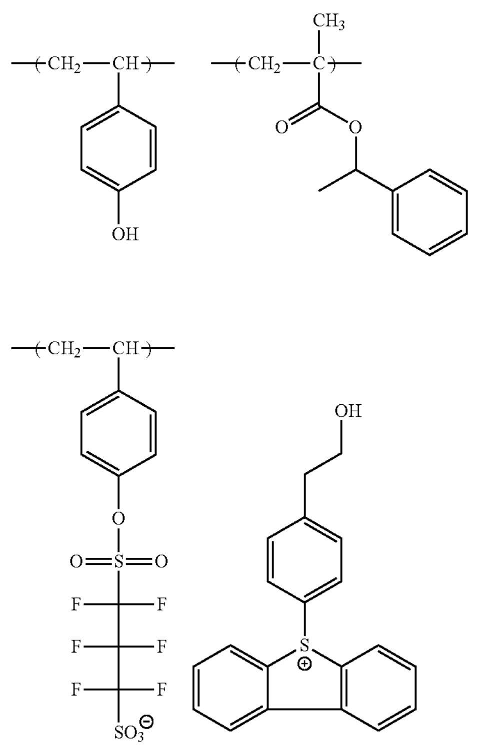
Ab-178
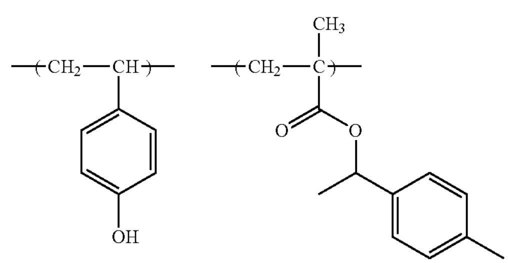

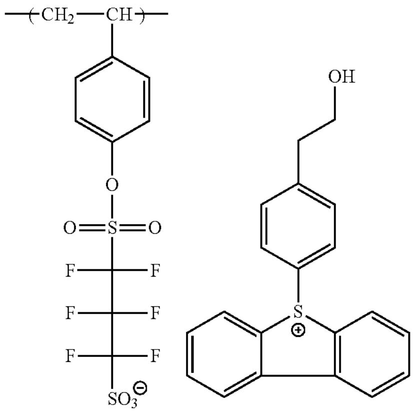
Ab-187
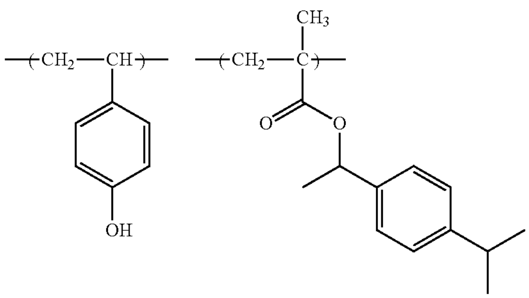
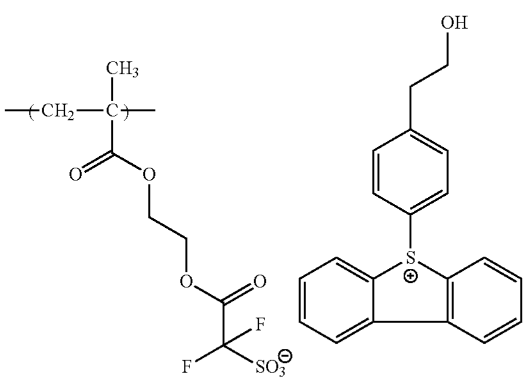
Ab-200
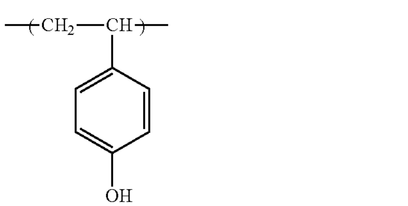
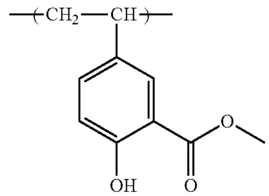
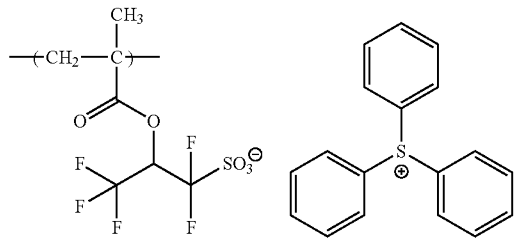
Ab-203
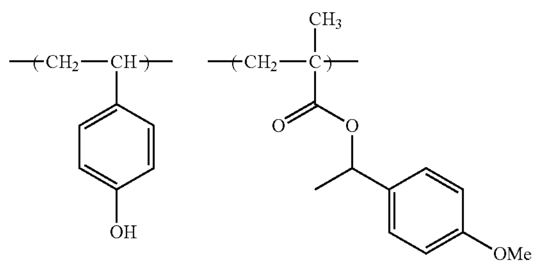
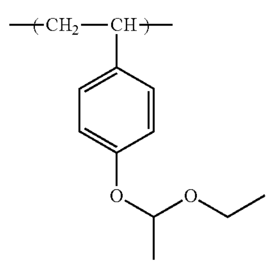
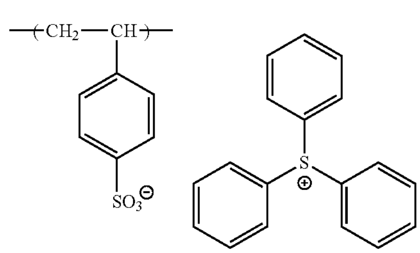
Ab-207
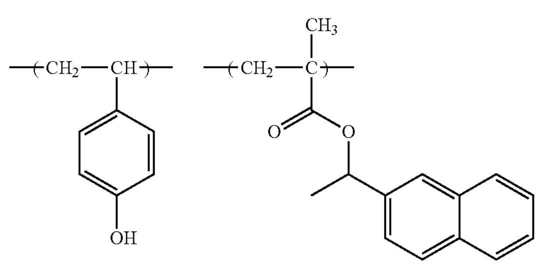
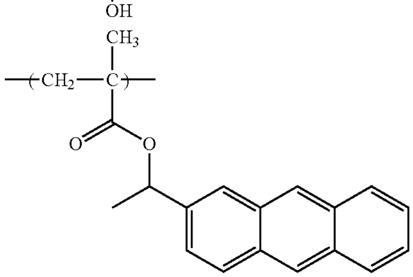

-continued
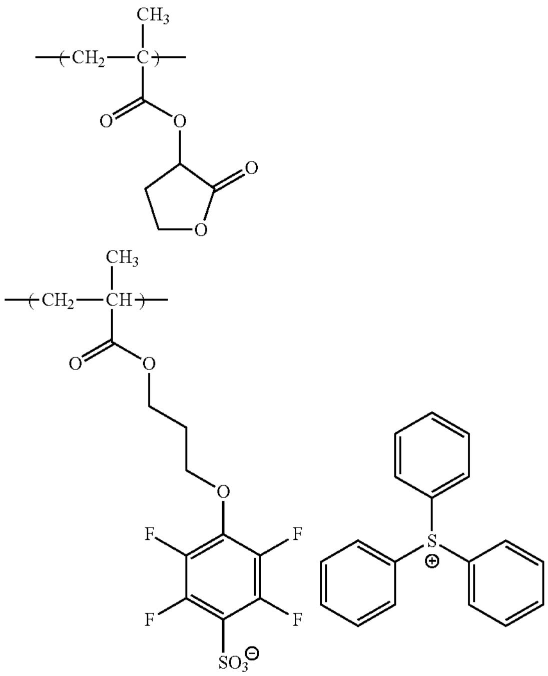
Ab-229
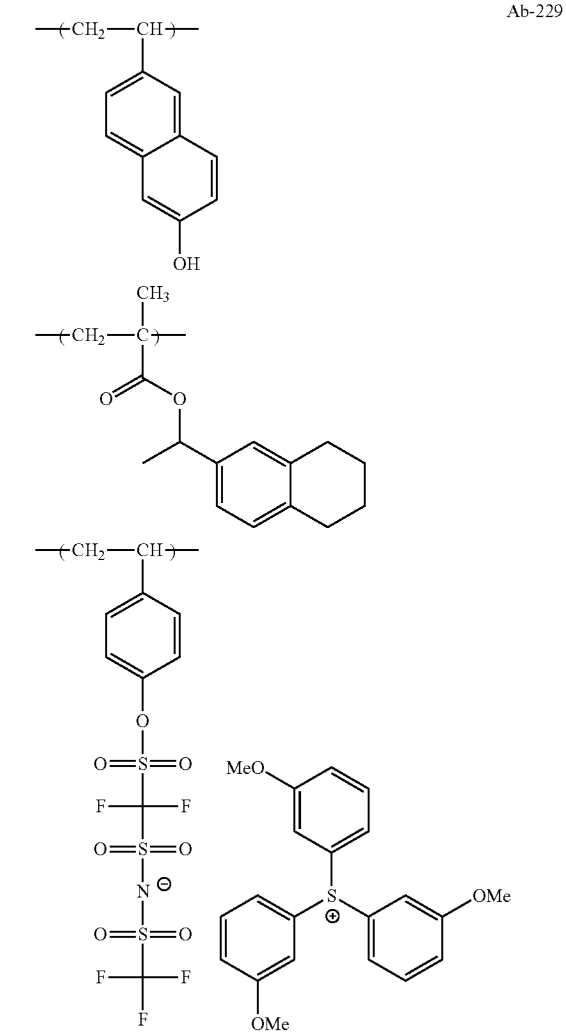
-continued
Ab-237
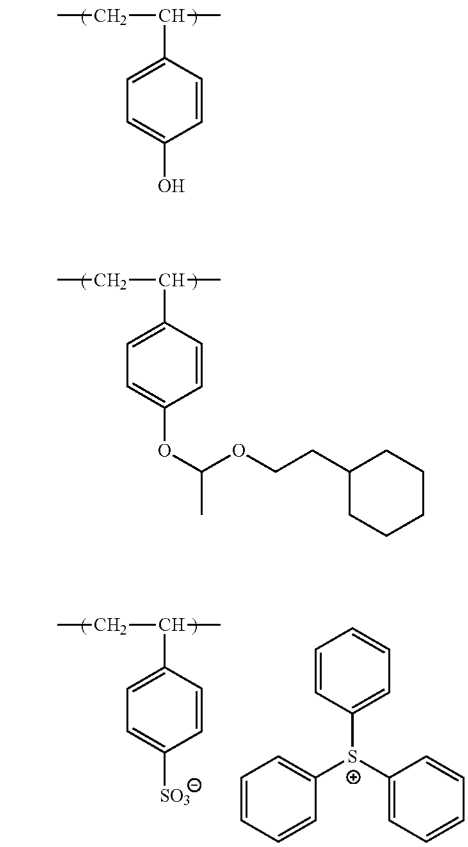
Ab-244
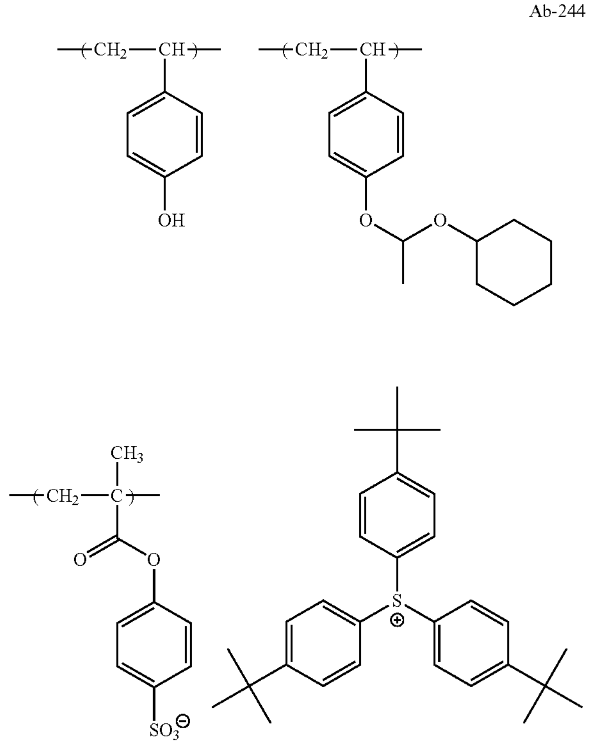

-continued

Ab-252

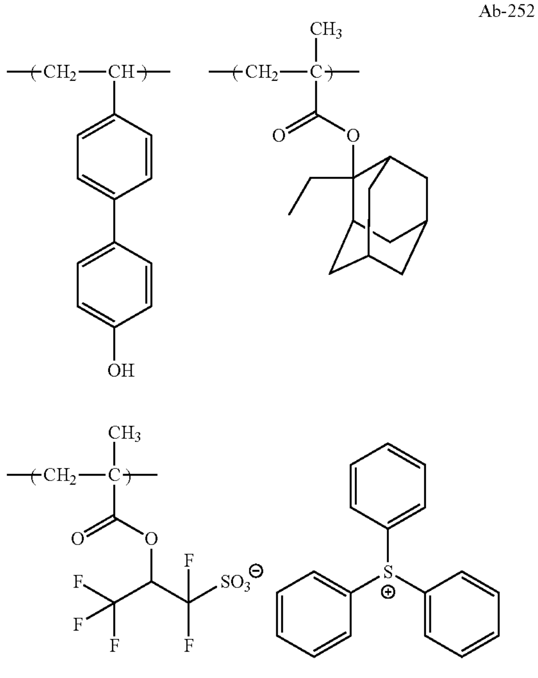

Ab-264

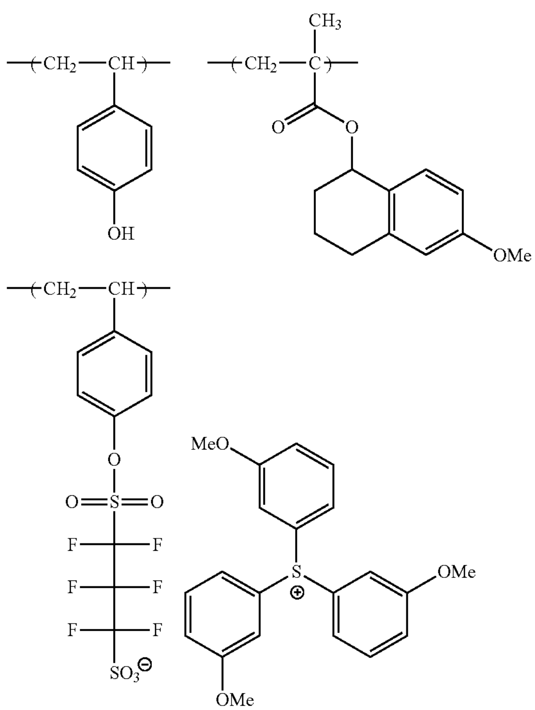

Ab-265

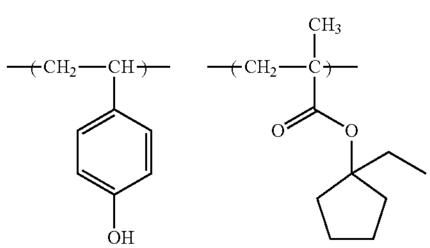

-continued

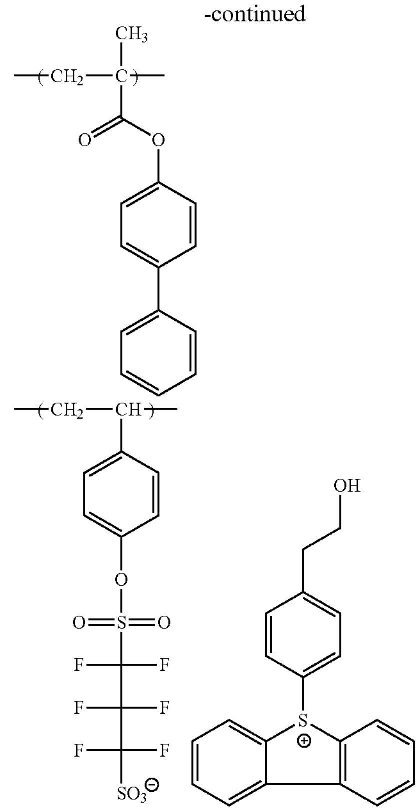

The actinic ray-sensitive or radiation-sensitive resin composition of the present invention may have a hydrophobic resin (HR) separately from the resin (P). By the addition of such a resin, an effect of making the pattern profile close to rectangular or an effect of suppressing the outgassing can be expected. In the case of performing the exposure by filling the space between the photosensitive film and the lens with a liquid (e.g., pure water) having a refractive index higher than that of air, that is, in the case of performing immersion exposure, or in the case of obtaining a negative pattern by using an organic solvent as the developer, the composition preferably has the above-described hydrophobic resin (HR).

The hydrophobic resin (HR) preferably contains a fluorine atom-containing group, a silicon atom-containing group, or a hydrocarbon group having a carbon number of 5 or more, so as to be unevenly distributed to the film surface. Such a group may be contained in the main chain of the resin or may be substituted on the side chain. Specific examples of the hydrophobic resin (HR) are illustrated below.

(HR-1)

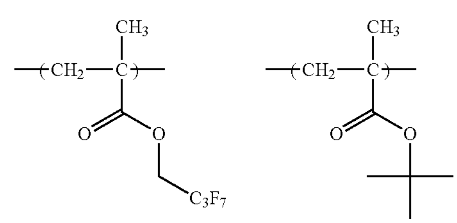

-continued
(HR-2)
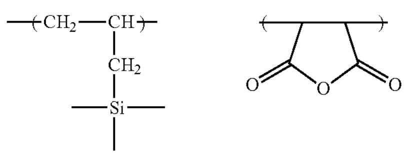
(HR-3)
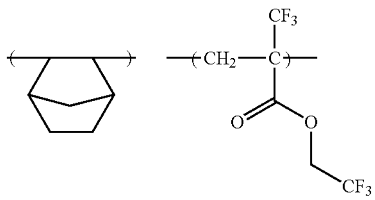
(HR-4)
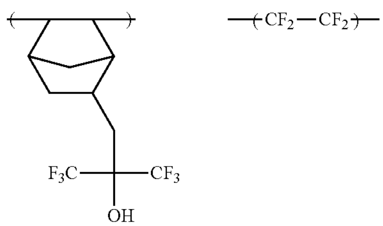
(HR-5)
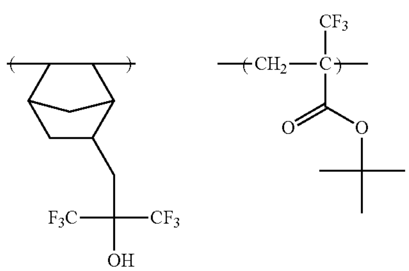
(HR-6)
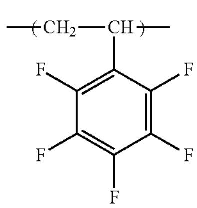
(HR-7)
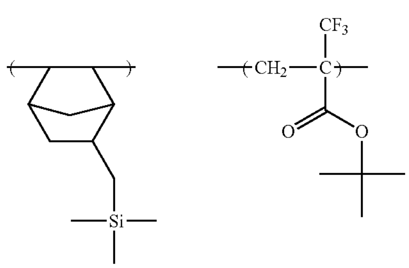
(HR-8)
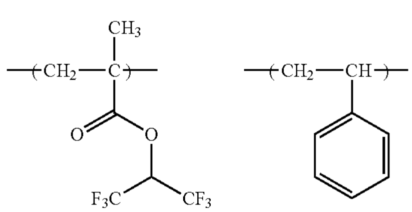
-continued
(HR-9)
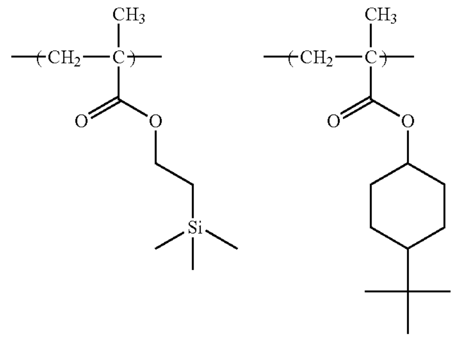
(HR-10)
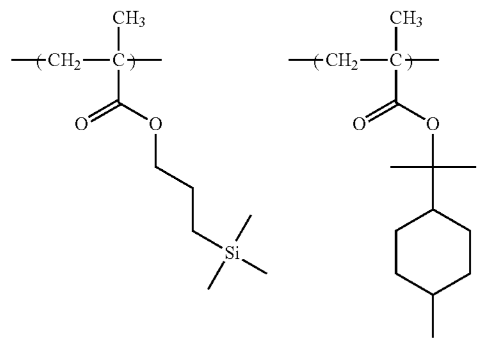
(HR-11)
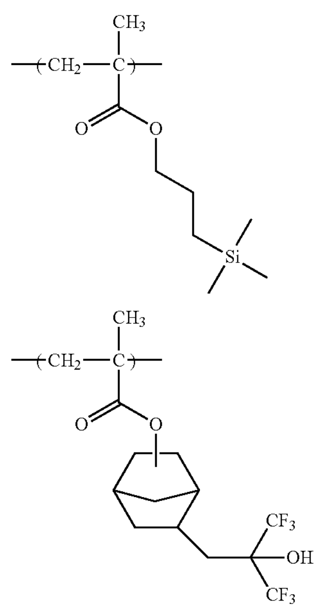
(HR-12)
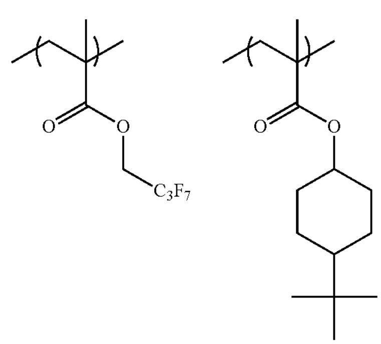

-continued
(HR-13)
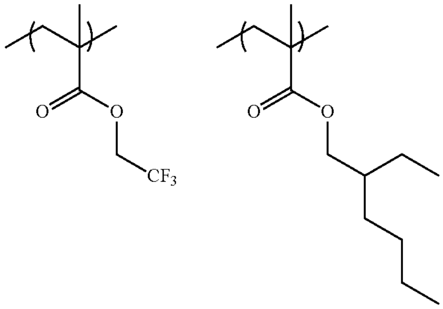
(HR-14)
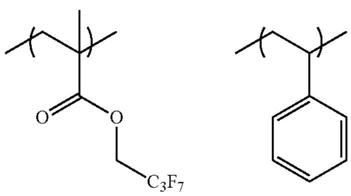
(HR-15)
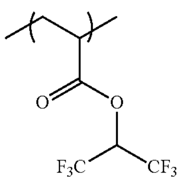
(HR-16)
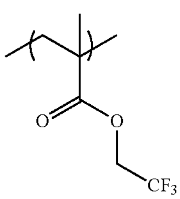
(HR-17)
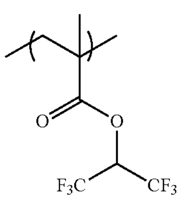
(HR-18)
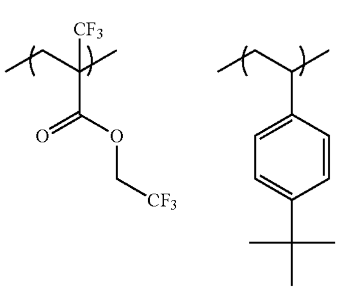
-continued
(HR-19)
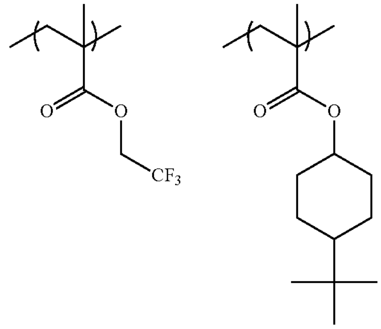
(HR-20)
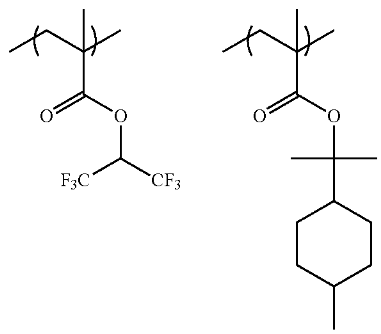
(HR-21)
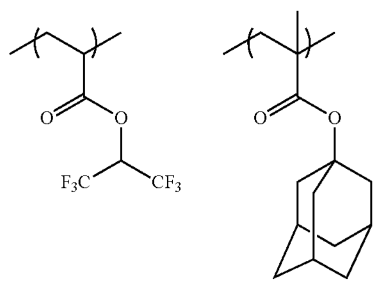
(HR-22)
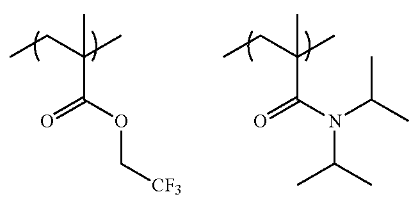
(HR-23)
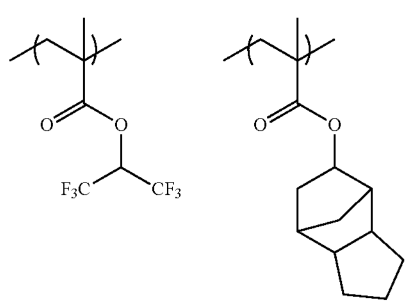

-continued (HR-24)

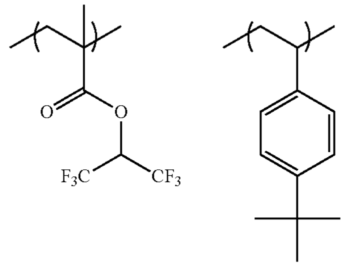

(HR-25)

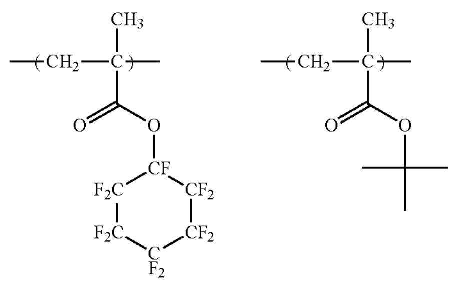

(HR-26)

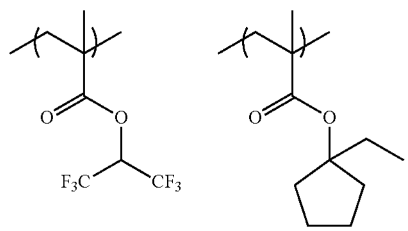

HR-27

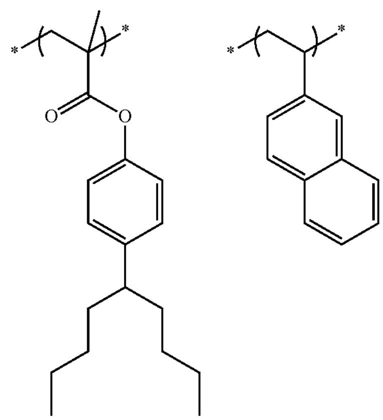

HR-28

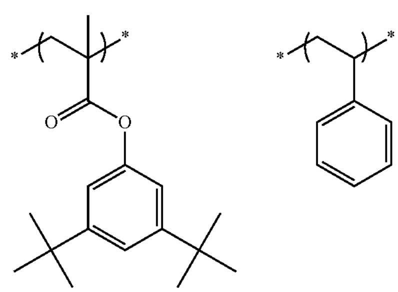

[3] Compound Capable of Generating an Acid Upon Irradiation with an Actinic Ray or Radiation The actinic ray-sensitive or radiation-sensitive composition of the present invention may further contain a compound capable of generating an acid upon irradiation with an actinic ray or radiation (hereinafter, sometimes referred to as "photoacid generator"). Above all, when the actinic ray-sensitive or radiation-sensitive composition does not contain, as the compound (P), a resin having a repeating unit represented by formula (4), the actinic ray-sensitive or radiation-sensitive composition usually further contains a photoacid generator.

The photoacid generator which can be used may be appropriately selected from, for example, a photo-initiator for cationic photopolymerization, a photo-initiator for radical photopolymerization, a photo-decoloring agent, a photo-discoloring agent, a known compound capable of generating an acid upon irradiation with an actinic ray or radiation, which is used for microresist or the like, and a mixture thereof. Examples thereof include an onium salt such as sulfonium salt and iodonium salt, and a diazodisulfone compound such as bis(alkylsulfonyldiazomethane).

Preferred examples of the photoacid generator include compounds represented by the following formulae (ZI), (ZII) and (ZIII):

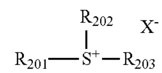

(ZI)

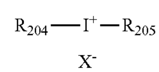

(ZII)

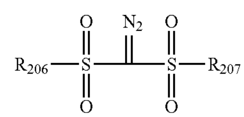

(ZIII)

In formula (ZI), each of $R_{201}$, $R_{202}$ and $R_{203}$ independently represents an organic group. The carbon number of the organic group as $R_{201}$, $R_{202}$ and $R_{203}$ is, for example, from 1 to 30, preferably from 1 to 20.

Two members out of $R_{201}$ to $R_{203}$ may combine through a single bond or a linking group to form a ring structure. Examples of the linking group include an ether bond, a thioether bond, an ester bond, an amido bond, a carbonyl group, a methylene group, and an ethylene group. Examples of the group formed by combining two members out of $R_{201}$ to $R_{203}$ include an alkylene group such as butylene group and pentylene group.

Specific examples of $R_{201}$, $R_{202}$ and $R_{203}$ include corresponding groups in the later-described compounds (ZI-1), (ZI-2) and (ZI-3).

$X^-$ represents a non-nucleophilic anion. Examples of $X^-$ include a sulfonate anion, a bis(alkylsulfonyl)amide anion, a tris(alkylsulfonyl)methide anion, $BF_4^-$, $PF_6^-$ and $SbF_6^-$. $X^-$ is preferably an organic anion containing a carbon atom. Preferred examples of the organic anion include organic anions represented by the following formulae AN1 to AN3:

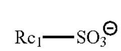

AN1

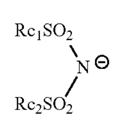

AN2

-continued

AN3

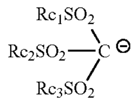

In formulae AN1 to AN3, each of $Rc_1$ to $Rc_3$ independently represents an organic group. This organic group includes, for example, an organic group having a carbon number of 1 to 30 and is preferably an alkyl group, an aryl group, or a group formed by connecting a plurality of these groups through a linking group. Examples of the linking group include a single bond, —O—, —$CO_2$—, —S—, —$SO_3$—, and —$SO_2N(Rd_1)$—, wherein $Rd_1$ represents a hydrogen atom or an alkyl group and may form a ring structure together with the alkyl or aryl group to which $Rd_1$ is bonded.

The organic group of $Rc_1$ to $Rc_3$ may be an alkyl group substituted with a fluorine atom or a fluoroalkyl group at the 1-position, or a phenyl group substituted with a fluorine atom or a fluoroalkyl group. By virtue of incorporating a fluorine atom or a fluoroalkyl group, the acidity of the acid generated upon irradiation with light can be increased and in turn, the sensitivity of the actinic ray-sensitive or radiation-sensitive resin composition can be enhanced. Incidentally, $Rc_1$ to $Rc_3$ may combine with another alkyl group, aryl group or the like to form a ring.

Preferred $X^-$ includes a sulfonate anion represented by the following formula (SA1) or (SA2):

(SA1)

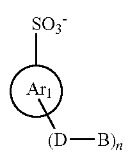

In formula (SA1), $Ar_1$ represents an aromatic ring and may further have a substituent other than the sulfonic acid group and the -(D-B) group.

n represents an integer of 1 or more. n is preferably from 1 to 4, more preferably 2 or 3, and most preferably 3.

D represents a single bond or a divalent linking group. The divalent linking group is preferably an ether group, a thioether group, a carbonyl group, a sulfoxide group, a sulfone group, a sulfonic acid ester bond or an ester group.

B represents a hydrocarbon group.

(SA2)

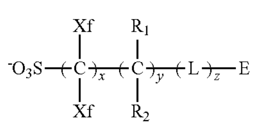

In formula (SA2), each Xf independently represents a fluorine atom or an alkyl group with at least one hydrogen atom being substituted for by a fluorine atom.

Each of $R_1$ and $R_2$ independently represents a hydrogen atom, a fluorine atom or an alkyl group, and when a plurality of $R_1$s or $R_2$s are present, each $R_1$ or $R_2$ may be the same as or different from every other $R_1$ or $R_2$.

L represents a divalent linking group, and when a plurality of L's are present, each L may be the same as or different from every other L.

E represents a cyclic organic group.

x represents an integer of 1 to 20, y represents an integer of 0 to 10, and z represents an integer of 0 to 10.

The sulfonate anion represented by formula (SA1) is described in detail below.

In formula (SA1), $Ar_1$ is preferably an aromatic ring having a carbon number of 6 to 30. Specifically, $Ar_1$ is, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring and among others, from the standpoint of both improving the roughness and increasing the sensitivity, is preferably a benzene ring, a naphthalene ring or an anthracene ring, more preferably a benzene ring.

In the case where $Ar_1$ further has a substituent other than the sulfonic acid group and -(D-B) group, examples of the substituent include the followings. That is, examples of the substituent include a halogen atom such as fluorine atom, chlorine atom, bromine atom and iodine atom; an aryloxy group such as phenoxy group and p-tolyloxy group; an arylthioxy group such as phenylthioxy group and p-tolylthioxy group; an aryl group such as phenyl group and tolyl group; a hydroxy group; a carboxy group; and a sulfonic acid group.

In formula (SA1), D is preferably a single bond, an ether group or an ester group. D is more preferably a single bond.

In formula (SA1), the hydrocarbon group of B is, for example, an alkyl group, an alkenyl group, an alkynyl group, an aryl group or a cycloalkyl group. B is preferably an alkyl group or a cycloalkyl group. The alkyl group, alkenyl group, alkynyl group, aryl group or cycloalkyl group as B may have a substituent.

The alkyl group as B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethylpentyl group, and a 2-ethylhexyl group.

The cycloalkyl group as B may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

In the case where the alkyl group, alkenyl group, alkynyl group, aryl group or cycloalkyl group as B has a substituent, examples of this substituent include the followings. That is, examples of the substituent include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear alkyl group such as methyl group, ethyl group, propyl group, butyl group, heptyl group, hexyl group, dodecyl group and 2-ethylhexyl group; a branched alkyl group; a cycloalkyl group such as cyclohexyl group; an alkenyl group such as vinyl group, propenyl group and hexenyl group; an acetylene group; an alkynyl group such as propynyl group and hexynyl group; an aryl group such as phenyl group and tolyl group; a hydroxy group; a carboxy group; a sulfonic acid group; and a carbonyl group. Among these, from the standpoint of both improving the roughness and increasing the sensitivity, a linear alkyl group and a branched alkyl group are preferred.

The sulfonate anion represented by formula (SA2) is described in detail below.

In formula (SA2), Xf is a fluorine atom or an alkyl group with at least one hydrogen atom being substituted for by a fluorine atom. The alkyl group is preferably an alkyl group having a carbon number of 1 to 10, more preferably an alkyl group having a carbon number of 1 to 4. The alkyl group substituted with a fluorine atom is preferably a perfluoroalkyl group.

Xf is preferably a fluorine atom or a perfluoroalkyl group having a carbon number of 1 to 4. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and most preferably a fluorine atom.

In formula (SA2), each of $R_1$ and $R_2$ is a hydrogen atom, a fluorine atom or an alkyl group. The alkyl group of $R_1$ and $R_2$ may have a substituent (preferably a fluorine atom) and is preferably an alkyl group having a carbon number of 1 to 4. Specific examples of the alkyl group having a substituent of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Among these, $CF_3$ is preferred.

In formula (SA2), x is preferably from 1 to 8, more preferably from 1 to 4. y is preferably from 0 to 4, more preferably 0. z is preferably from 0 to 8, more preferably from 0 to 4.

In formula (SA2), L represents a single bond or a divalent linking group. Examples of the divalent linking group include —COO—, —OCO—, —CO—, —O—, —S—, —SO—, —$SO_2$—, an alkylene group, a cycloalkylene group, an alkenylene group, and a linking group formed by connecting a plurality of these members. Among these, —COO—, —OCO—, —CO—, —O—, —S—, —SO— and —$SO_2$— are preferred, and —COO—, —OCO— and —$SO_2$— are more preferred.

In formula (SA2), E represents a cyclic organic group. Examples of E include a cyclic aliphatic group, an aryl group, and a heterocyclic group.

The cyclic aliphatic group as E may have a monocyclic structure or a polycyclic structure. The cyclic aliphatic group having a monocyclic structure is preferably a monocyclic cycloalkyl group such as cyclopentyl group, cyclohexyl group and cyclooctyl group. The cyclic aliphatic group having a polycyclic structure is preferably a polycyclic cycloalkyl group such as norbornyl group, tricyclodecanyl group, tetracyclodecanyl group, tetracyclododecanyl group and adamantyl group. In particular, when a cyclic aliphatic group having a bulky structure of 6-membered or higher membered ring is employed as E, diffusion into the film can be suppressed in the PEB (post-exposure baking) step, and resolution and EL (exposure latitude) can be further enhanced.

The ring in the aryl group as E is, for example, a benzene ring, a naphthalene ring, a phenanthrene ring or an anthracene ring.

The heterocyclic group as E may or may not have aromaticity. The heteroatom contained in heterocyclic group is preferably a nitrogen atom or an oxygen atom. Specific examples of the ring in the heterocyclic group include a furan ring, a thiophene ring, a benzofuran ring, a benzothiophene ring, a dibenzofuran ring, a dibenzothiophene ring, a pyridine ring, a piperidine ring, and a morpholine ring. Among these, a furan ring, a thiophene ring, a pyridine ring, a piperidine ring and a morpholine ring are preferred.

E may have a substituent. Examples of the substituent include an alkyl group (may be linear, branched or cyclic; preferably having a carbon number of 1 to 12), a cycloalkyl group (may be monocyclic, polycyclic or spirocyclic; preferably having a carbon number of 3 to 20), an aryl group (preferably having a carbon number of 6 to 14), a hydroxy group, an alkoxy group, an ester group, an amido group, a urethane group, a ureido group, a thioether group, a sulfonamido group, and a sulfonic acid ester group. In E, the carbon constituting the ring (the carbon contributing to ring formation) may be a carbonyl carbon.

Examples of the sulfonate anion represented by formula (SA1) or (SA2) include the followings.

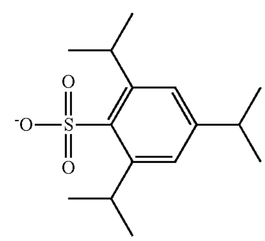

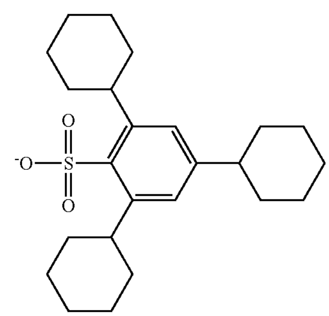

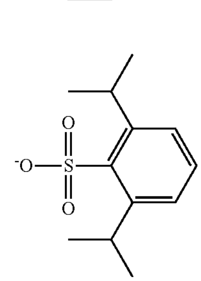

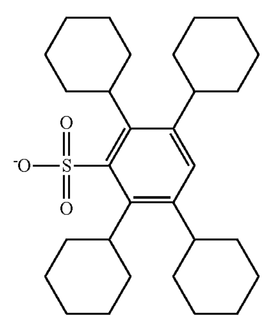

-continued
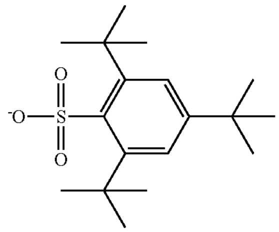
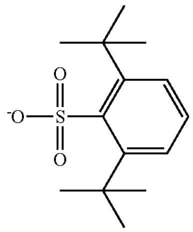
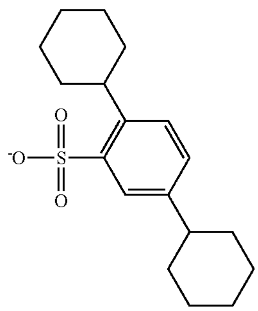
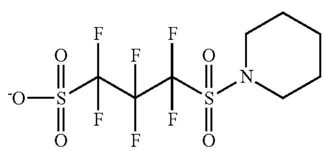
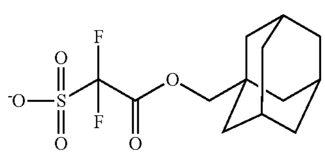
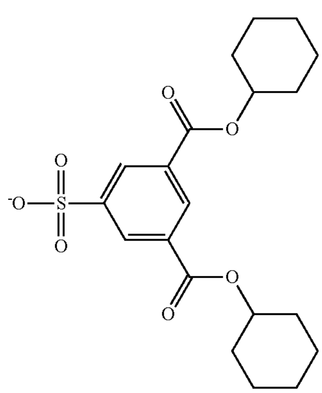
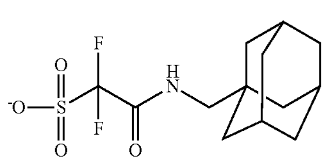
-continued
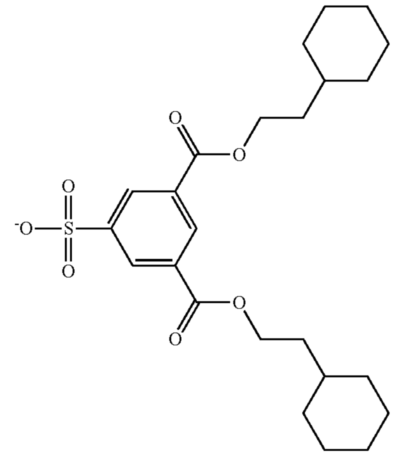
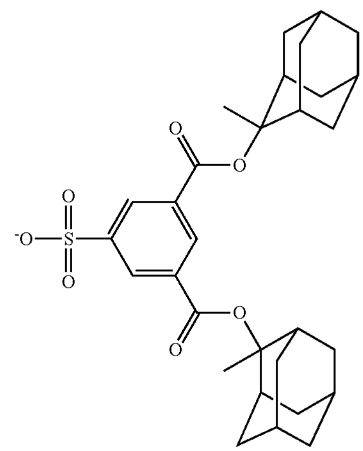
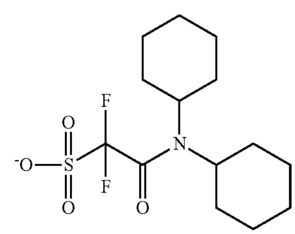
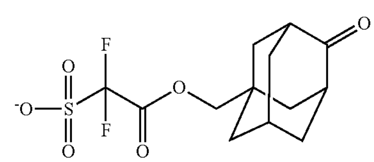
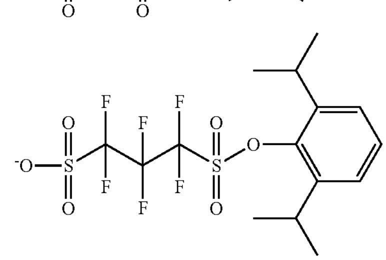
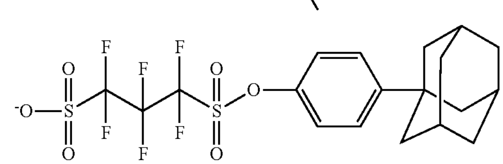

-continued

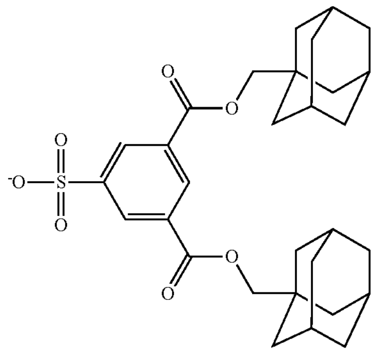

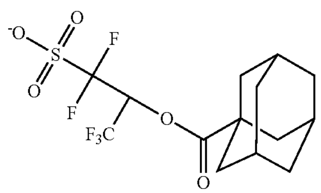

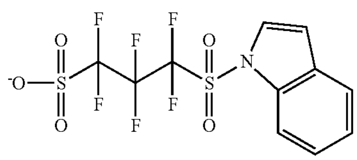

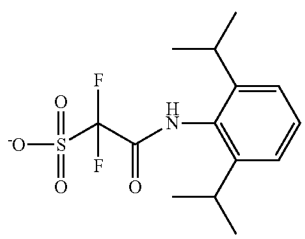

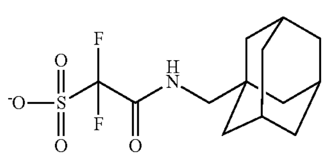

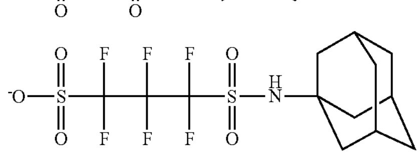

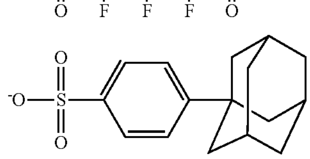

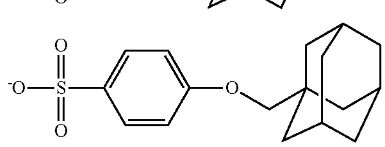

-continued

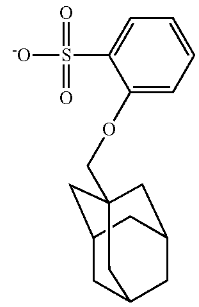

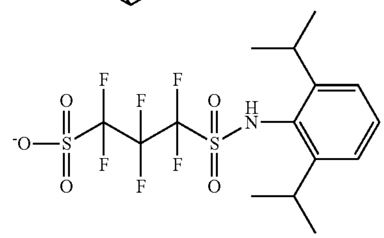

As the photoacid generator, a compound having a plurality of structures represented by formula (ZI) may be used. For example, the photoacid generator may be a compound having a structure where at least one of $R_{201}$ to $R_{203}$ in a compound represented by formula (ZI) is bonded to at least one of $R_{201}$ to $R_{203}$ in another compound represented by formula (ZI).

Compounds (ZI-1) to (ZI-4) described below are more preferred as the component (ZI).

The compound (ZI-1) is a compound where at least one of $R_{201}$ to $R_{203}$ in formula (ZI) is an aryl group. In other words, the compound (ZI-1) is an arylsulfonium compound, that is, a compound having an arylsulfonium as the cation.

In the compound (ZI-1), all of $R_{201}$ to $R_{203}$ may be an aryl group or a part of $R_{201}$ to $R_{203}$ may be an aryl group with the remaining being an alkyl group. Incidentally, in the case where the compound (ZI-1) has a plurality of aryl groups, each aryl group may be the same as or different from every other aryl group.

Examples of the compound (ZI-1) include a triarylsulfonium compound, a diarylalkylsulfonium compound, and an aryldialkylsulfonium compound.

The aryl group in the compound (ZI-1) is preferably a phenyl group, a naphthyl group or a heteroaryl group such as indole residue and pyrrole residue, more preferably a phenyl group, a naphthyl group or an indole residue.

The alkyl group which is contained, if desired, in the compound (ZI-1) is preferably a linear, branched or cyclo alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group, and a cyclohexyl group.

These aryl group and alkyl group may have a substituent. Examples of the substituent include an alkyl group (preferably having a carbon number of 1 to 15), an aryl group (preferably having a carbon number of 6 to 14), an alkoxy group (preferably having a carbon number of 1 to 15), a halogen atom, a hydroxyl group, and a phenylthio group.

The substituent is preferably a linear, branched or cyclic alkyl group having a carbon number of 1 to 12 or a linear, branched or cyclic alkoxy group having a carbon number of 1 to 12, more preferably an alkyl group having a carbon number of 1 to 6 or an alkoxy group having a carbon number of 1 to 6. The substituent may be substituted on any one of three members $R_{201}$ to $R_{203}$ or may be substituted on all of these three members. In the case where $R_{201}$ to $R_{203}$ are a phenyl group, the substituent is preferably substituted at the p-position of the aryl group.

An embodiment where one or two of $R_{201}$, $R_{202}$ and $R_{203}$ are an aryl group which may have a substituent and the remaining groups are a linear, branched or cyclic alkyl group is also preferred. Specific examples of this structure include structures described in paragraphs 0141 to 0153 of JP-A-2004-210670.

At this time, the aryl group above is specifically the same as the aryl group as $R_{201}$, $R_{202}$ and $R_{203}$ and is preferably a phenyl group or a naphthyl group. The aryl group preferably has, as a substituent, any of a hydroxyl group, an alkoxy group and an alkyl group. The substituent is more preferably an alkoxy group having a carbon number of 1 to 12, still more preferably an alkoxy group having a carbon number of 1 to 6.

The linear, branched or cyclic alkyl group as the remaining group is preferably an alkyl group having a carbon number of 1 to 6. Such a group may further have a substituent. Also, in the case where two groups are present as the remaining group, these two groups may combine with each other to form a ring structure.

The compound (ZI-1) is, for example, a compound represented by the following formula (ZI-1A):

(ZI-1A)

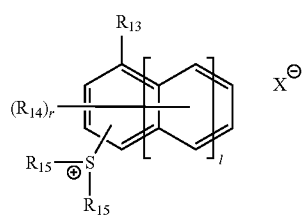

In formula (ZI-1A), $R_{13}$ represents a hydrogen atom, a fluorine atom, a hydroxyl group, an alkyl group, a cycloalkyl group, an alkoxy group, a cycloalkyloxy group or an alkoxycarbonyl group.

$R_{14}$ represents, when a plurality of $R_{14}$s are present, each independently represents, an alkyl group, a cycloalkyl group, an alkoxy group, an alkylsulfonyl group or a cycloalkylsulfonyl group.

Each $R_{15}$ independently represents an alkyl group or a cycloalkyl group, and two $R_{15}$s may combine with each other to form a ring structure.

l represents an integer of 0 to 2.

r represents an integer of 0 to 8.

$X^-$ represents a non-nucleophilic anion, and examples thereof are the same as those for $X^-$ in formula (ZI).

The alkyl group of $R_{13}$, $R_{14}$ and $R_{15}$ may be a linear alkyl group or a branched alkyl group. This alkyl group is preferably an alkyl group having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group, and an n-decyl group. Among these, a methyl group, an ethyl group, an n-butyl group and a tert-butyl group are preferred.

The cycloalkyl group of $R_{13}$, $R_{14}$ and $R_{15}$ includes a monocyclic or polycyclic cycloalkyl group (preferably a cycloalkyl group having a carbon number of 3 to 20), and examples thereof include a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group, and a cyclooctadienyl group. Among these, a cyclopropyl group, a cyclopentyl group, a cyclohexyl group, a cycloheptyl group and a cyclooctyl are preferred.

Examples of the alkoxy group moiety in the alkoxy group of $R_{13}$ or $R_{14}$ include those enumerated above as the alkyl group of $R_{13}$, $R_{14}$ or $R_{15}$. The alkoxy group is preferably a methoxy group, an ethoxy group, an n-propoxy group or an n-butoxy group.

Examples of the cycloalkyl group moiety in the cycloalkyloxy group of $R_{13}$ include those enumerated above as the cycloalkyl group of $R_{13}$, $R_{14}$ or $R_{15}$. The cycloalkyloxy group is preferably a cyclopentyloxy group or a cyclohexyloxy group.

Examples of the alkoxy group moiety in the alkoxycarbonyl group of $R_{13}$ include those enumerated above as the alkoxy group of $R_{13}$ or $R_{14}$. The alkoxycarbonyl group is preferably a methoxycarbonyl group, an ethoxycarbonyl group or an n-butoxycarbonyl group.

Examples of the alkyl group moiety in the alkylsulfonyl group of $R_{14}$ include those enumerated above as the alkyl group of $R_{13}$, $R_{14}$ or $R_{15}$. Examples of the cycloalkyl group moiety in the cycloalkylsulfonyl group of $R_{14}$ include those enumerated above as the cycloalkyl group of $R_{13}$, $R_{14}$ or $R_{15}$. The alkylsulfonyl or cycloalkylsulfonyl group is preferably a methanesulfonyl group, an ethanesulfonyl group, an n-propanesulfonyl group, an n-butanesulfonyl group, a cyclopentanesulfonyl group or a cyclohexanesulfonyl group.

l is preferably 0 or 1, more preferably 1. r is preferably from 0 to 2.

Each of the groups of $R_{13}$, $R_{14}$ and $R_{15}$ may further have a substituent. Examples of the substituent include a halogen atom such as fluorine atom, a hydroxy group, a carboxy group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group, and a cycloalkyloxycarbonyloxy group.

The alkoxy group may be linear or branched. The alkoxy group includes, for example, an alkoxy group having a carbon number of 1 to 20, such as methoxy group, ethoxy group, n-propoxy group, i-propoxy group, n-butoxy group, 2-methylpropoxy group, 1-methylpropoxy group and tert-butoxy group.

The cycloalkyloxy group includes, for example, a cycloalkyloxy group having a carbon number of 3 to 20, such as cyclopentyloxy group and cyclohexyloxy group.

The alkoxyalkyl group may be linear or branched. The alkoxyalkyl group includes, for example, an alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The cycloalkyloxyalkyl group includes, for example, a cycloalkyloxyalkyl group having a carbon number of 4 to 21, such as cyclohexyloxymethyl group, cyclopentyloxymethyl group and cyclohexyloxyethyl group.

The alkoxycarbonyl group may be linear or branched. The alkoxycarbonyl group includes, for example, an alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group and tert-butoxycarbonyl group.

The cycloalkyloxycarbonyl includes, for example, a cycloalkyloxycarbonyl group having a carbon number of 4 to 21, such as cyclopentyloxycarbonyl group and cyclohexyloxycarbonyl group.

The alkoxycarbonyloxy group may be linear or branched. The alkoxycarbonyloxy group includes, for example, an alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group and tert-butoxycarbonyloxy group.

The cycloalkyloxycarbonyloxy group includes, for example, a cycloalkyloxycarbonyloxy group having a carbon number of 4 to 21, such as cyclopentyloxycarbonyloxy group and cyclohexyloxycarbonyloxy group.

The ring structure which may be formed by combining two $R_{15}$s with each other is preferably a structure capable of forming a 5- or 6-membered ring, preferably a 5-membered ring (that is, a tetrahydrothiophene ring), together with the S atom in formula (ZI-1A).

The ring structure may further have a substituent. Examples of the substituent include a hydroxy group, a carboxy group, a cyano group, a nitro group, an alkoxy group, an alkoxyalkyl group, an alkoxycarbonyl group, and an alkoxycarbonyloxy group.

$R_{15}$ is preferably a methyl group, an ethyl group, or a divalent group capable of forming a tetrahydrothiophene ring structure together with the sulfur atom when two $R_{15}$s are combined with each other.

The alkyl group, cycloalkyl group, alkoxy group and alkoxycarbonyl group of $R_{13}$ and the alkyl group, cycloalkyl group, alkoxy group, alkylsulfonyl group and cycloalkylsulfonyl group of $R_{14}$ may further have a substituent. The substituent is preferably a hydroxy group, an alkoxy group, an alkoxycarbonyl group or a halogen atom (particularly a fluorine atom).

Specific preferred examples of the cation in the compound represented by formula (ZI-1A) are illustrated below.

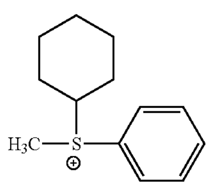

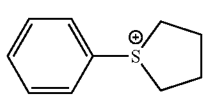

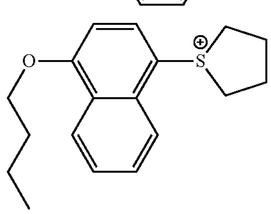

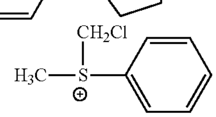

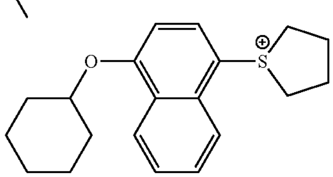

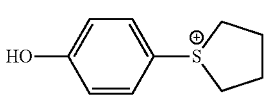

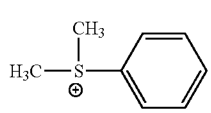

-continued

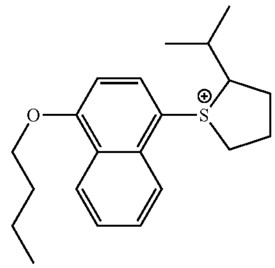

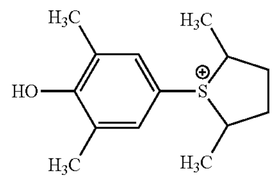

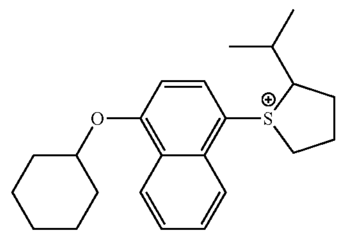

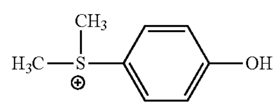

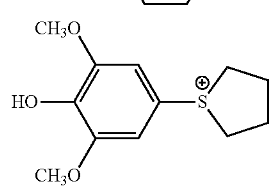

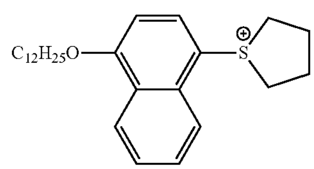

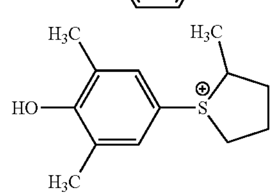

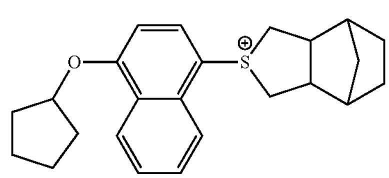

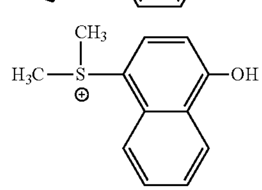

-continued

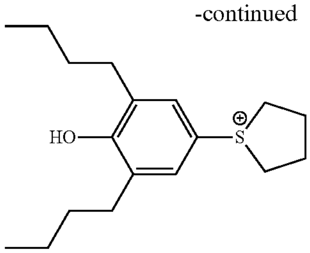

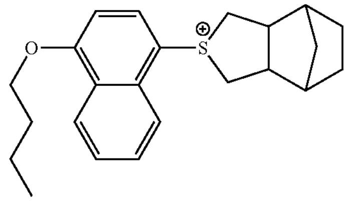

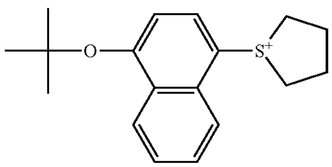

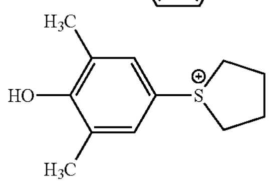

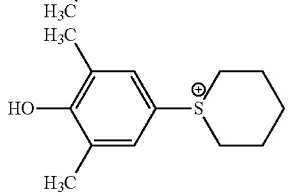

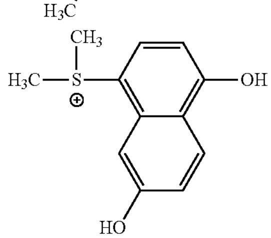

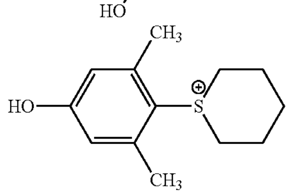

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of, for example, from 1 to 30, preferably from 1 to 20.

Each of $R_{201}$ to $R_{203}$ independently represents preferably an alkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be linear, branched or cyclic, and preferred examples thereof include a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group).

The 2-oxoalkyl group as $R_{201}$ to $R_{203}$ may be linear, branched or cyclic and is preferably a group having >C═O at the 2-position of the above-described alkyl group.

Preferred examples of the alkoxy group in the alkoxycarbonylmethyl group as $R_{201}$ to $R_{203}$ include an alkoxy group having a carbon number of 1 to 5 (e.g., methoxy group, ethoxy group, propoxy group, butoxy group, pentoxy group).

Each of $R_{201}$ to $R_{203}$ may be further substituted, for example, with a halogen atom, an alkoxy group (for example, having a carbon number of 1 to 5), a hydroxyl group, a cyano group and/or a nitro group.

Two members out of $R_{201}$ to $R_{203}$ may combine with each other to form a ring structure. This ring structure may contain an oxygen atom, a sulfur atom, an ester bond, an amido bond and/or a carbonyl group in the ring. Examples of the group formed by combining two members out of $R_{201}$ to $R_{203}$ include an alkylene group (e.g., butylenes group, pentylene group).

The compound (ZI-3) is described below.

The compound (ZI-3) is a compound represented by the following formula (ZI-3), and this is a compound having a phenacylsulfonium salt structure.

(ZI-3)

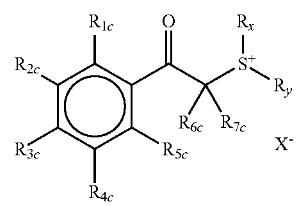

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ represents independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine with each other to form a ring structure. This ring structure may contain an oxygen atom, a sulfur atom, a ketone group, an ester bond or an amido bond.

The ring structure above includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members of $R^{10}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$X^-$ represents a non-nucleophilic anion, and examples thereof are the same as those of the non-nucleophilic anion of $X^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (such as methyl group, ethyl group, linear or branched propyl group, linear or branched butyl group, or linear or branched pentyl group). The cycloalkyl group includes, for example, a cycloalkyl group having a carbon number of 3 to 10 (such as cyclopentyl group and cyclohexyl group).

The aryl group as $R_{1c}$ to $R_{7c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group, or linear or branched pentoxy group), or a cyclic alkoxy group having a carbon number of 3 to 10 (such as cyclopentyloxy group or cyclohexyloxy group).

Specific examples of the alkoxy group in the alkoxycarbonyl group as $R_{1c}$ to $R_{5c}$ are the same as specific examples of the alkoxy group of $R_{1c}$ to $R_{5c}$.

Specific examples of the alkyl group in the alkylcarbonyloxy group and alkylthio group as $R_{1c}$ to $R_{5c}$ are the same as specific examples of the alkyl group of $R_{1c}$ to $R_{5c}$.

Specific examples of the cycloalkyl group in the cycloalkylcarbonyloxy group as $R_{1c}$ to $R_{5c}$ are the same as specific examples of the cycloalkyl group of $R_{1c}$ to $R_{5c}$.

Specific examples of the aryl group in the aryloxy group and arylthio group as $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a configuration, the solvent solubility is more enhanced and production of particles during storage can be suppressed.

The ring structure which may be formed by combining any two or more members of $R_{1c}$ to $R_{5c}$ with each other is preferably a 5- or 6-membered ring, more preferably a 6-membered ring (such as phenyl ring).

The ring structure which may be formed by combining $R_{5c}$ and $R_{6c}$ with each other includes a 4-membered or higher membered ring (preferably a 5- or 6-membered ring) formed together with the carbonyl carbon atom and carbon atom in formula (ZI-3) by combining $R_{5c}$ and $R_{6c}$ with each other to constitute a single bond or an alkylene group (such as methylene group or ethylene group).

An embodiment where both of $R_{6c}$ and $R_{7c}$ are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group of $R_{1c}$ to $R_{7c}$.

Examples of the 2-oxoalkyl group and 2-oxocycloalkyl group as $R_x$ and $R_y$ include a group having >C=O at the 2-position of the alkyl group or cycloalkyl group as $R_{1c}$ to $R_{7c}$.

Examples of the alkoxy group in the alkoxycarbonylalkyl group as $R_x$ and $R_y$ are the same as those of the alkoxy group of $R_{1c}$ to $R_{5c}$. The alkyl group is, for example, an alkyl group having a carbon number of 1 to 12, preferably a linear alkyl group having a carbon number of 1 to 5 (such as methyl group or ethyl group).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5-membered or higher membered ring (preferably a 5-membered ring) formed together with the sulfur atom and carbonyl carbon atom in formula (ZI-3) by combining $R_{5c}$ and $R_x$ with each other to constitute a single bond or an alkylene group (such as methylene group or ethylene group).

The ring structure which may be formed by combining $R_x$ and $R_y$ with each other includes a 5- or 6-membered ring, preferably a 5-membered ring (that is, tetrahydrothiophene ring), formed by divalent $R_x$ and $R_y$ (for example, a methylene group, an ethylene group or a propylene group) together with the sulfur atom in formula (ZI-3).

Each of $R_x$ and $R_y$ is preferably an alkyl or cycloalkyl group having a carbon number of 4 or more, more preferably 6 or more, still more preferably 8 or more.

Each of $R_{1c}$ to $R_{7c}$, $R_x$ and $R_y$ may further have a substituent, and examples of such a substituent include a halogen atom (e.g., fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

The alkyl group above includes, for example, a linear or branched alkyl group having a carbon number of 1 to 12, such as methyl group, ethyl group, n-propyl group, i-propyl group, n-butyl group, 2-methylpropyl group, 1-methylpropyl group and tert-butyl group.

The cycloalkyl group above includes, for example, a cycloalkyl group having a carbon number of 3 to 10, such as cyclopentyl group and cyclohexyl group.

The aryl group above includes, for example, an aryl group having a carbon number of 6 to 15, such as phenyl group and naphthyl group.

The alkoxy group above includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The aryloxy group above includes, for example, an aryloxy group having a carbon number of 6 to 10, such as phenyloxy group and naphthyloxy group.

The acyl group above includes, for example, a linear or branched acyl group having a carbon number of 2 to 12, such as acetyl group, propionyl group, n-butanoyl group, i-butanoyl group, n-heptanoyl group, 2-methylbutanoyl group, 1-methylbutanoyl group and tert-heptanoyl group.

The arylcarbonyl group above includes, for example, an arylcarbonyl group having a carbon number of 6 to 10, such as phenylcarbonyl group and naphthylcarbonyl group.

The alkoxyalkyl group above includes, for example, a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The aryloxyalkyl group above includes, for example, an aryloxyalkyl group having a carbon number of 7 to 12, such as phenyloxymethyl group, phenyloxyethyl group, naphthyloxymethyl group and naphthyloxyethyl group.

The alkoxycarbonyl group above includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The aryloxycarbonyl group above includes, for example, an aryloxycarbonyl group having a carbon number of 7 to 11, such as phenyloxycarbonyl group and naphthyloxycarbonyl group.

The alkoxycarbonyloxy group above includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The aryloxycarbonyloxy group above includes, for example, an aryloxycarbonyloxy group having a carbon number of 7 to 11, such as phenyloxycarbonyloxy group and naphthyloxycarbonyloxy group.

In formula (ZI-3), it is more preferred that each of $R_{1c}$, $R_{2c}$, $R_{4c}$ and $R_{5c}$ independently represents a hydrogen atom and $R_{3c}$ represents a group except for a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Specific examples of the compound (ZI-3) include compounds illustrated in paragraphs 0047 and 0048 of JP-A-2004-233661 and paragraphs 0040 to 0046 of JPA-2003-35948.

The compound (ZI-4) is described below.

The compound (ZI-4) is a compound having a cation represented by the following formula (ZI-4). The compound (ZI-4) is effective to suppress outgassing.

(ZI-4)

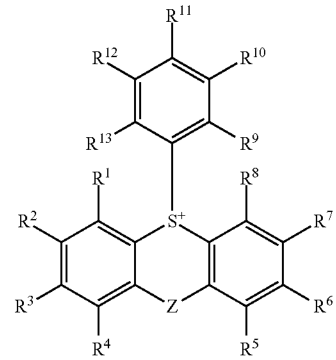

In formula (ZI-4), each of $R^1$ to $R^{13}$ independently represents a hydrogen atom or a substituent, and at least one of $R^1$ to $R^{13}$ is preferably a substituent containing an alcoholic hydroxyl group. The "alcoholic hydroxyl group" as used herein means a hydroxyl group bonded to a carbon atom of an alkyl group.

Z represents a single bond or a divalent linking group.

In the case where $R^1$ to $R^{13}$ are a substituent containing an alcoholic hydroxyl group, each of $R^1$ to $R^{13}$ is preferably a group represented by —(W—Y), wherein Y is an alkyl group substituted with a hydroxyl group and W is a single bond or a divalent linking group.

Preferred examples of the alkyl group represented by Y include an ethyl group, a propyl group and an isopropyl group. In particular, Y preferably contains a structure represented by $—CH_2CH_2OH$.

The divalent linking group represented by W is not particularly limited but is preferably a single bond or a divalent group formed by substituting a single bond for an arbitrary hydrogen atom in an alkoxyl group, an acyloxy group, an acylamino group, an alkyl- or aryl-sulfonylamino group, an alkylthio group, an alkylsulfonyl group, an acyl group, an alkoxycarbonyl group or a carbamoyl group, more preferably a single bond or a divalent group formed by substituting a single bond for an arbitrary hydrogen atom in an acyloxy group, an alkylsulfonyl group, an acyl group or an alkoxycarbonyl group.

In the case where $R^1$ to $R^{13}$ are a substituent containing an alcoholic hydroxyl group, the number of carbons contained therein is preferably from 2 to 10, more preferably from 2 to 6, still more preferably from 2 to 4.

The alcoholic hydroxyl group-containing substituent as $R^1$ to $R^{13}$ may have two or more alcoholic hydroxyl groups. The number of alcoholic hydroxyl groups in the alcoholic hydroxyl group-containing substituent as $R^1$ to $R^{13}$ is from 1 to 6, preferably from 1 to 3, more preferably 1.

The number of alcoholic hydroxyl groups in the compound represented by formula (ZI-4) is, in total of all of $R^1$ to $R^{13}$, from 1 to 10, preferably from 1 to 6, more preferably from 1 to 3.

In the case where $R^1$ to $R^{13}$ are free of an alcoholic hydroxyl group, examples of the substituent as $R^1$ to $R^{13}$ include a halogen atom, an alkyl group, a cycloalkyl group, an alkenyl group, a cycloalkenyl group, an alkynyl group, an aryl group, a heterocyclic group, a cyano group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic azo group, an imido group, a phosphino group, a phosphinyl group, a phosphinyloxy group, a phosphinylamino group, a phosphono group, a silyl group, a hydrazino group, a ureido group, a boronic acid group [—B(OH)$_2$], a phosphato group [—OPO(OH)$_2$], a sulfato group (—OSO$_3$H), and other known substituents.

In the case where $R^1$ to $R^{13}$ are free of an alcoholic hydroxyl group, each of $R^1$ to $R^{13}$ is preferably a hydrogen atom, a halogen atom, an alkyl group, a cycloalkyl group, an alkenyl group, a cycloalkenyl group, an alkynyl group, an aryl group, a cyano group, a carboxy group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or aryl-sulfonylamino group, an alkylthio group, an arylthio group, a sulfamoyl group, an alkyl- or aryl-sulfonyl group, an aryloxycarbonyl group, an alkoxycarbonyl group, a carbamoyl group, an imido group, a silyl group or a ureido group.

In the case where $R^1$ to $R^{13}$ are free of an alcoholic hydroxyl group, each of $R^1$ to $R^{13}$ is more preferably a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or aryl-sulfonylamino group, an alkylthio group, a sulfamoyl group, an alkyl- or aryl-sulfonyl group, an alkoxycarbonyl group or a carbamoyl group.

In the case where $R^1$ to $R^{13}$ are free of an alcoholic hydroxyl group, each of $R^1$ to $R^{13}$ is still more preferably a hydrogen atom, an alkyl group, a cycloalkyl group, a halogen atom or an alkoxy group.

Two adjacent members out of $R^1$ to $R^{13}$ may combine with each other to form a ring. This ring includes an aromatic or non-aromatic hydrocarbon ring and a heterocyclic ring. These rings may further combine to form a condensed ring.

The compound (ZI-4) preferably has a structure where at least one of $R^1$ to $R^{13}$ contains an alcoholic hydroxyl group, more preferably a structure where at least one of $R^9$ to $R^{13}$ contains an alcoholic hydroxyl group.

Z represents, as described above, a single bond or a divalent linking group. Examples of the divalent linking group include an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH═CH—, an aminocarbonylamino group, and an aminosulfonylamino group.

The divalent linking group may have a substituent. Examples of the substituent thereon are the same as those enumerated for $R^1$ to $R^{13}$.

Z is preferably a single bond or a non-electron-withdrawing bond or group such as alkylene group, arylene group, ether group, thioether group, amino group, —CH═CH—, aminocarbonylamino group and aminosulfonylamino group, more preferably a single bond, an ether group or a thioether group, still more preferably a single bond.

Formulae (ZII) and (ZIII) are described below.

In formulae (ZII) and (ZIII), each of $R_{204}$ to $R_{207}$ independently represents an aryl group, an alkyl group or a cycloalkyl group. These aryl group, alkyl group and cycloalkyl group may have a substituent.

Preferred examples of the aryl group as $R_{204}$ to $R_{207}$ are the same as those enumerated for $R_{201}$ to $R_{203}$ in the compound (ZI-1).

Preferred examples of the alkyl group and cycloalkyl group as $R_{204}$ to $R_{207}$ include linear, branched or cyclo alkyl groups enumerated for $R_{201}$ to $R_{203}$ in the compound (ZI-2).

$X^-$ in formula (ZII) has the same meaning as $X^-$ in formula (ZI).

Other preferred examples of the photoacid generator include compounds represented by the following formulae (ZIV), (ZV) and (ZVI):

$$Ar_3—SO_2—SO_2—Ar_4 \quad \text{ZIV}$$

ZV

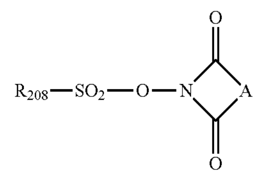

ZVI

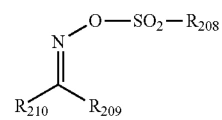

In formulae (ZIV) to (ZVI), each of $Ar_3$ and $Ar_4$ independently represents a substituted or unsubstituted aryl group.

A represents an alkylene group, an alkenylene group or an arylene group.

$R_{208}$ represents an alkyl group, a cycloalkyl group or an aryl group independently of each other between formulae (ZV) and (ZVI). These alkyl group, cycloalkyl group and aryl group may or may not be substituted.

Such a group is preferably substituted with a fluorine atom. In this case, the strength of the acid generated from the photoacid generator can be enhanced.

Each of $R_{209}$ and $R_{210}$ independently represents an alkyl group, a cycloalkyl group, an aryl group or an electron-withdrawing group. These alkyl group, cycloalkyl group, aryl group and electron-withdrawing group may or may not be substituted.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

$R_{209}$ is preferably a substituted or unsubstituted aryl group.

$R_{210}$ is preferably an electron-withdrawing group. The electron-withdrawing group is preferably a cyano group or a fluoroalkyl group.

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group). These alkylene group, alkenylene group and arylene group may have a substituent.

A compound having a plurality of structures represented by formula (ZVI) is also preferred as the photoacid generator. Examples of such a compound include a compound having a structure where $R_{209}$ or $R_{210}$ in a compound represented by formula (ZVI) is bonded to $R_{209}$ or $R_{210}$ in another compound represented by formula (ZVI).

As the photoacid generator, the compounds represented by formulae (ZI) to (ZIII) are preferred, the compound represented by formula (ZI) is more preferred, and compounds (ZI-1) to (ZI-3) are still more preferred.

As the photoacid generator for use in the present invention, a compound having a group capable of decomposing by the action of an acid to increase the solubility for an alkali developer may be also preferably used. Examples of such an acid generator include compounds described in JP-A-2005-97254 and JP-A-2007-199692.

Specific examples of the photoacid generator are illustrated below, but the present invention is not limited thereto.

B-1

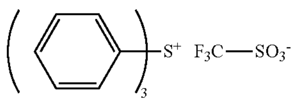

B-2

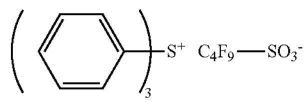

B-3

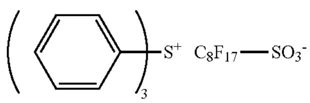

B-4

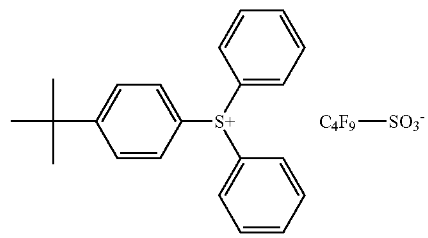

B-5

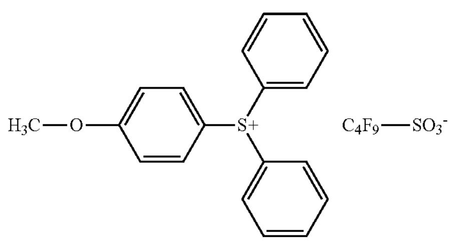

B-6

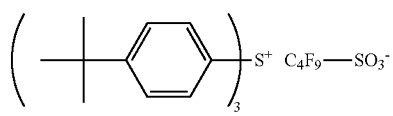

B-7

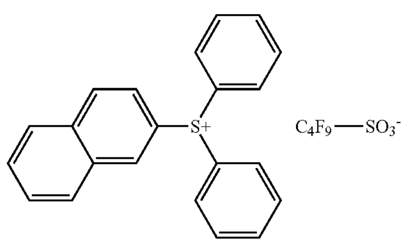

B-8

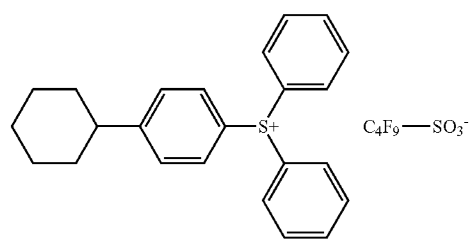

B-9

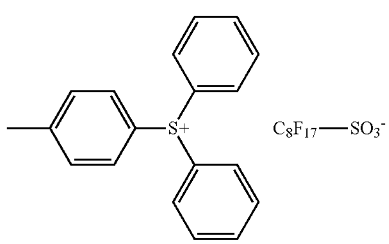

B-10

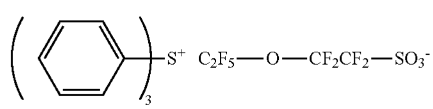

B-11

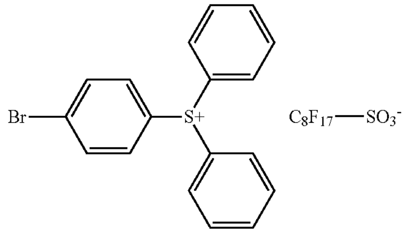

B-12

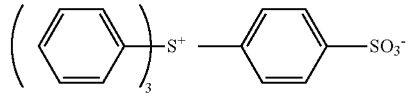

-continued
B-13
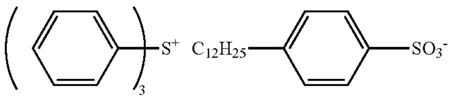
B-14
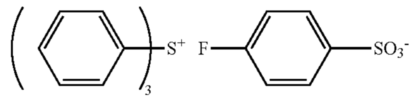
B-15
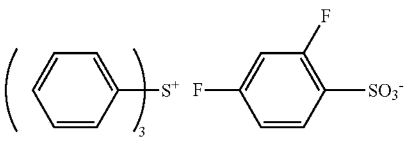
B-16
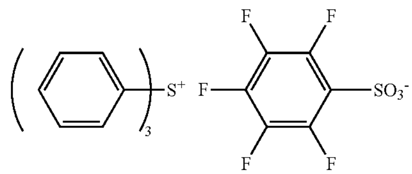
B-17
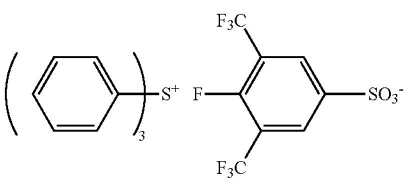
B-18
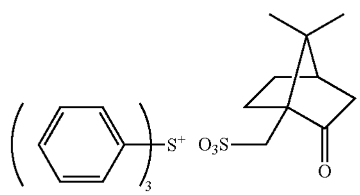
B-19
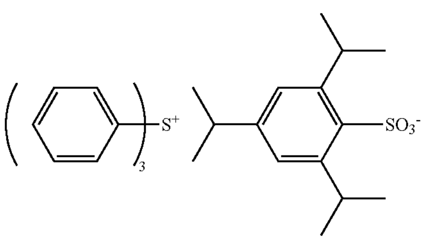
B-20
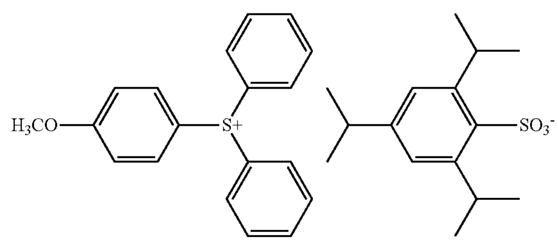
B-21
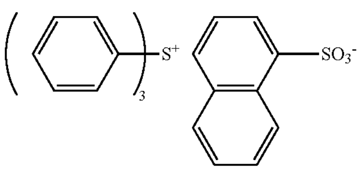
B-22
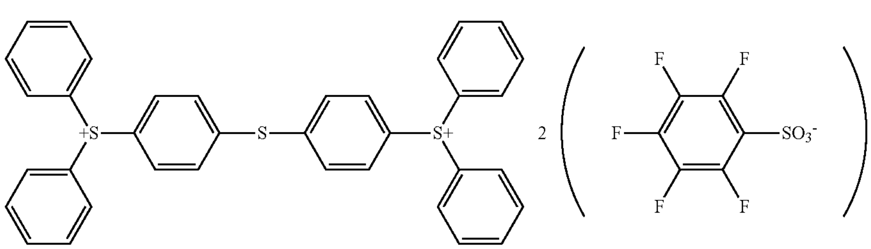
B-23
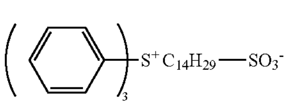
B-24
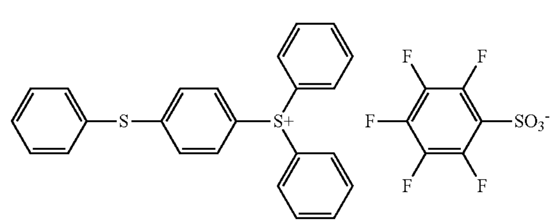

-continued
B-25
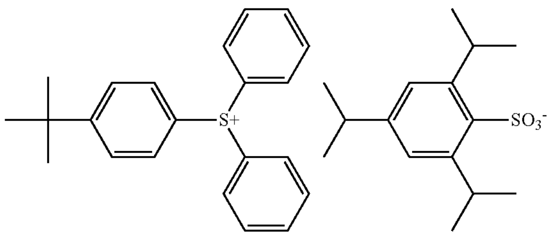
B-26
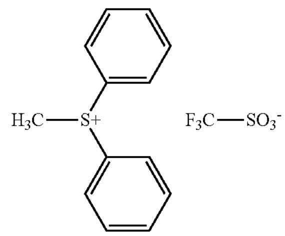
B-27
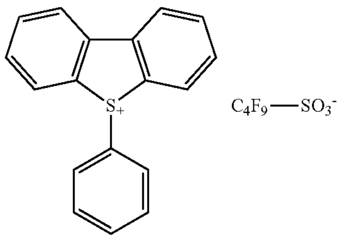
B-28
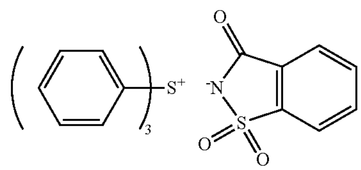
B-29
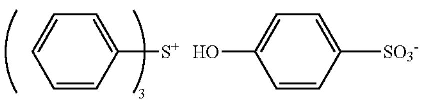
B-30
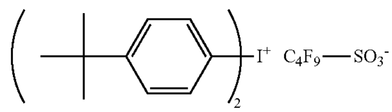
B-31
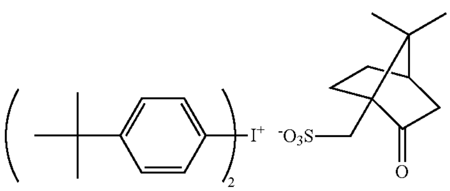
B-32
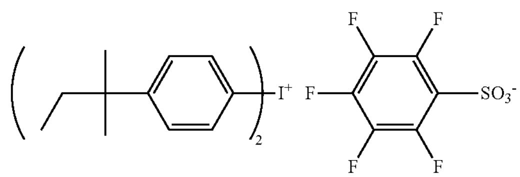
B-33
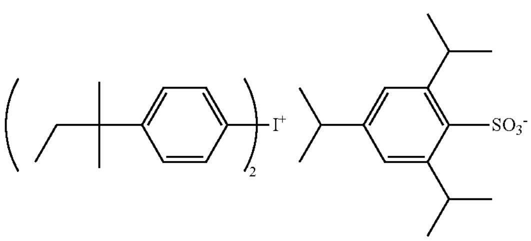
B-34
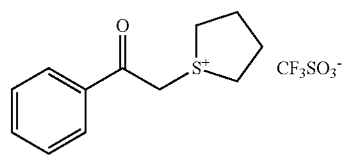
B-35
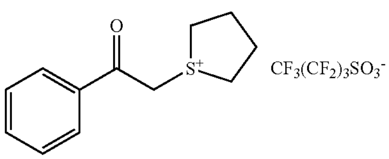
B-36
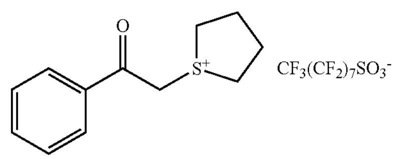
B-37
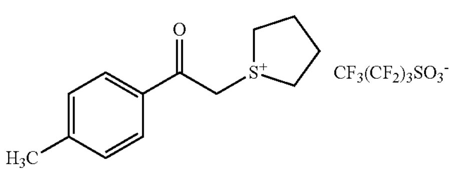
B-38
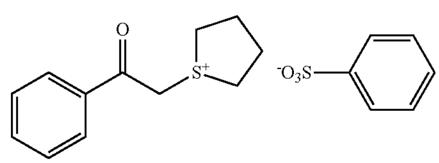
B-39
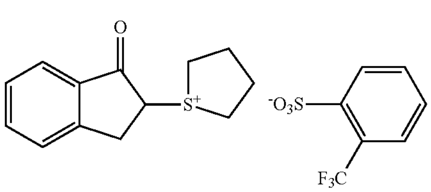
B-40
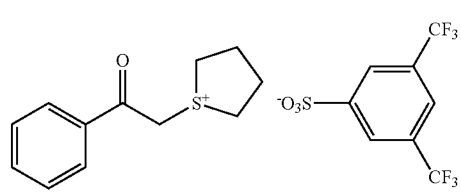

-continued
B-41
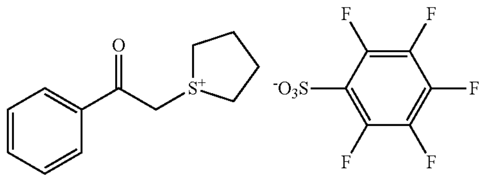
B-42
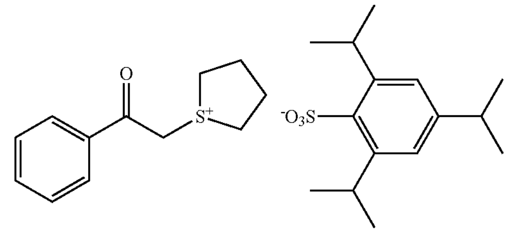
B-43
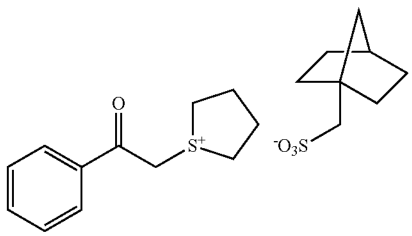
B-44
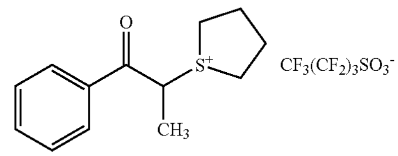
B-45
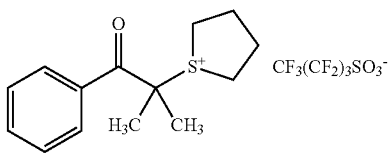
B-46
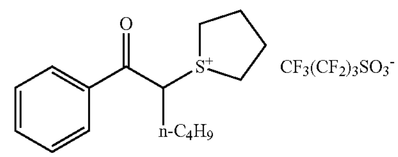
B-47
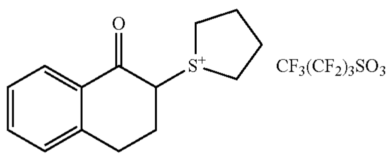
B-48
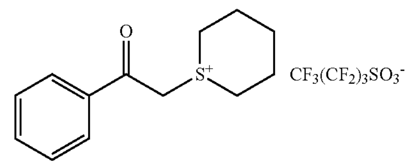
B-49
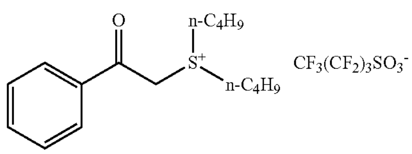
B-50
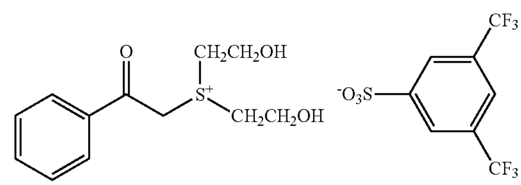
B-51
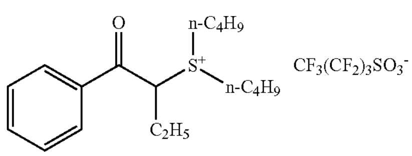
B-52
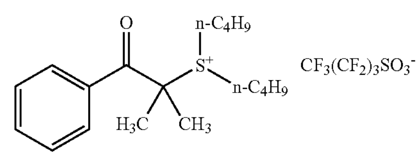
B-53
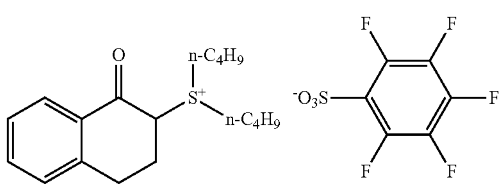
B-54
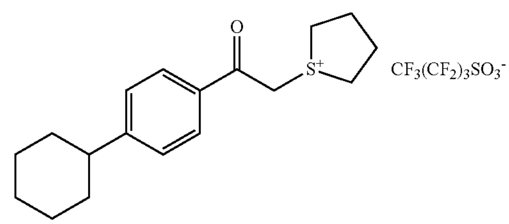
B-55
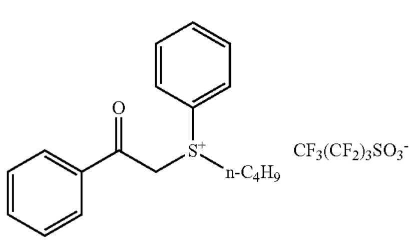
B-56
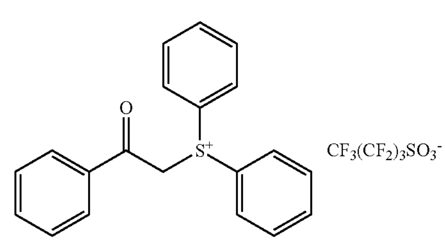

-continued
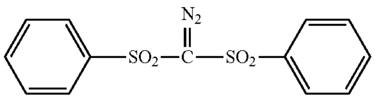
B-57
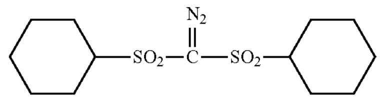
B-58
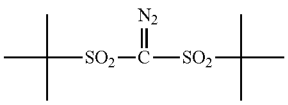
B-59
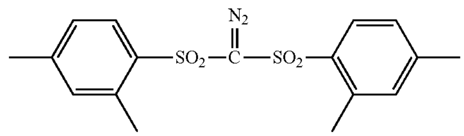
B-60
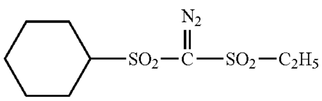
B-61
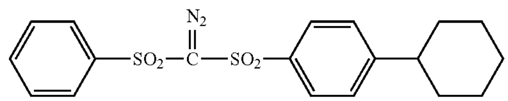
B-62
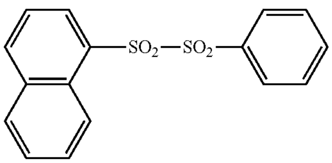
B-63
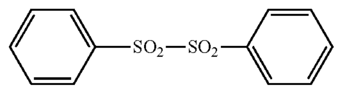
B-64
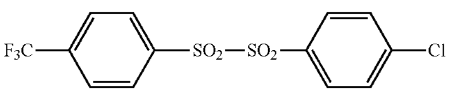
B-65
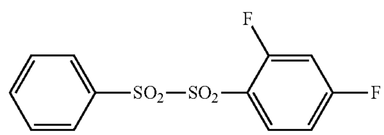
B-66
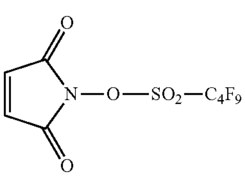
B-67
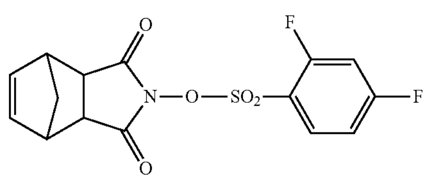
B-68
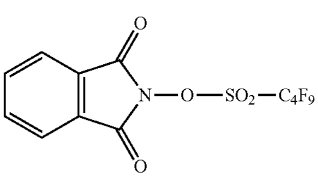
B-69
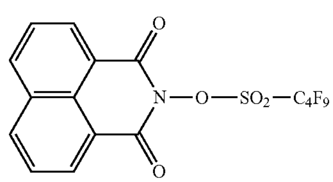
B-70
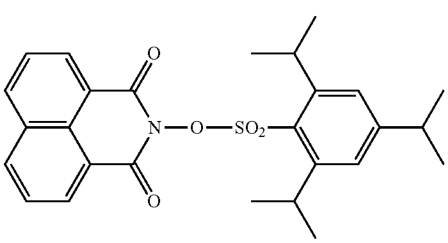
B-71
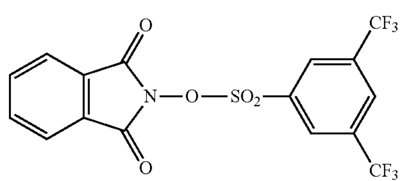
B-72
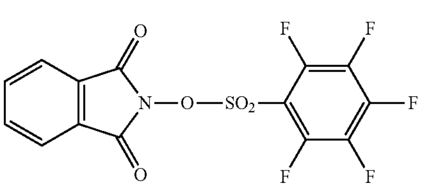
B-73
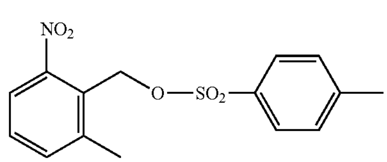
B-74

-continued
B-75
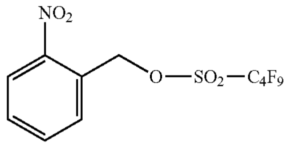
B-76
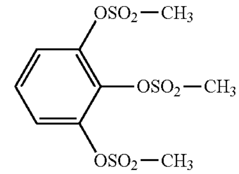
B-77
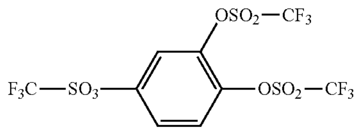
B-78
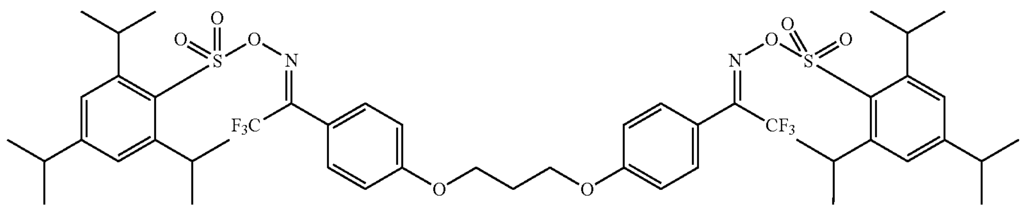
B-79
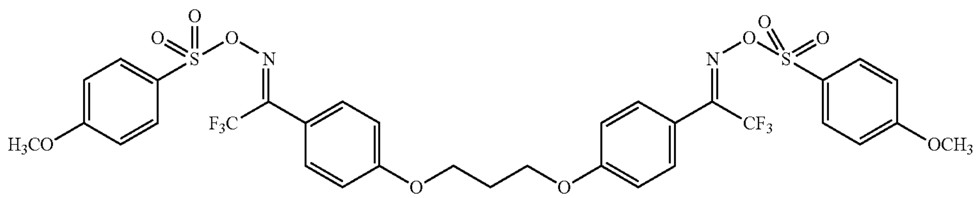
B-80
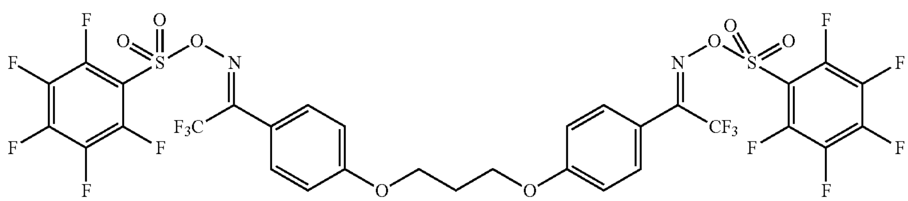
B-81
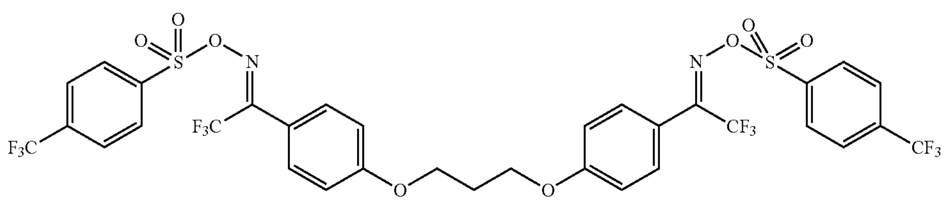
B-82
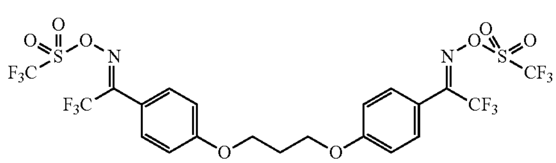
B-83
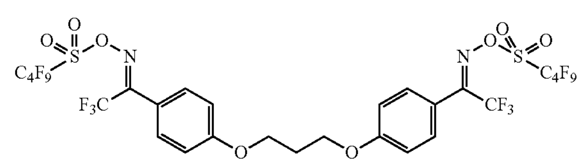
B-84
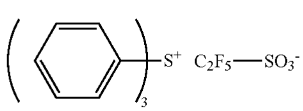
B-85
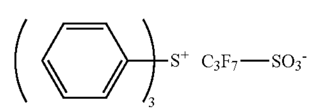
B-86
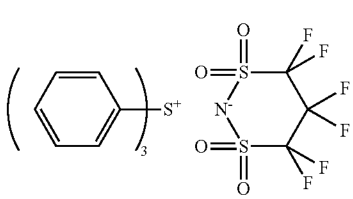
B-87
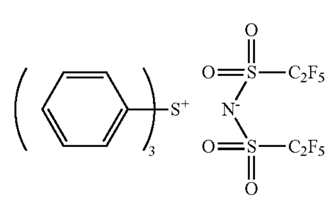

-continued
B-88
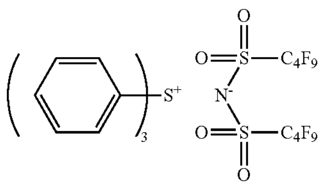
B-89
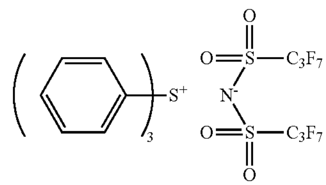
B-90
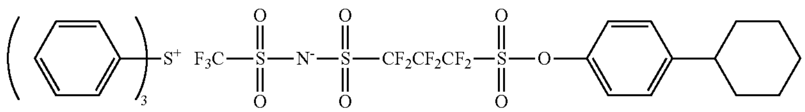
B-91
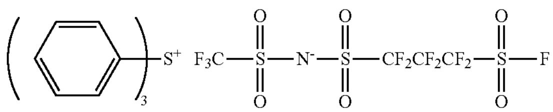
B-92
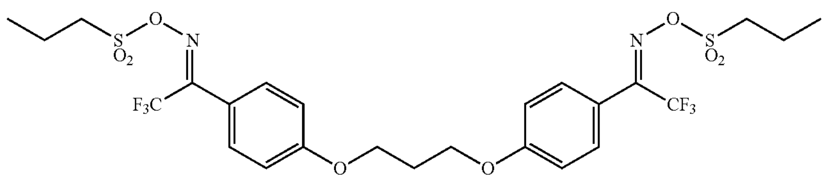
B-93
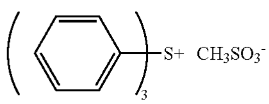
B-94
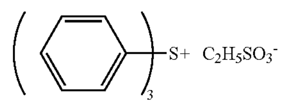
B-95
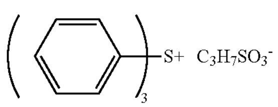
B-96
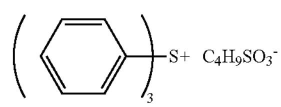
B-97
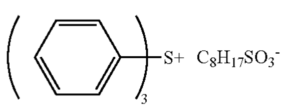
B-98
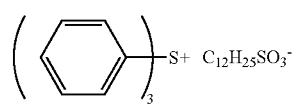
B-99
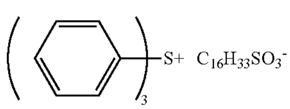
B-100
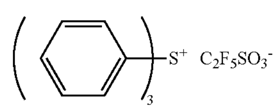
B-101
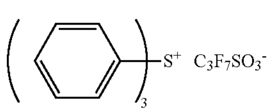
B-102
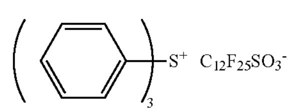
B-103
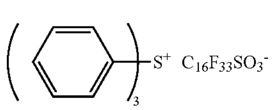
B-104
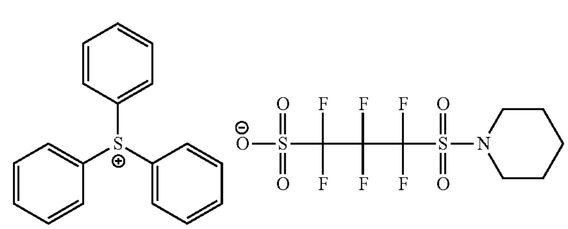

-continued
B-105
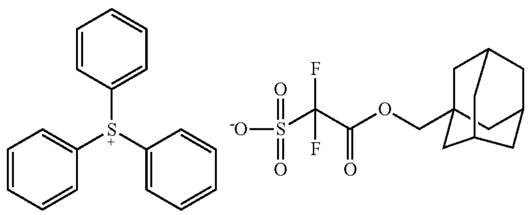
B-106
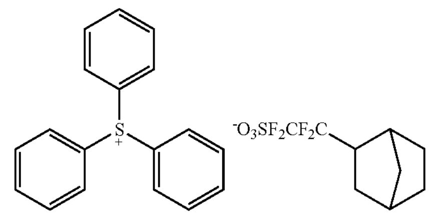
B-107
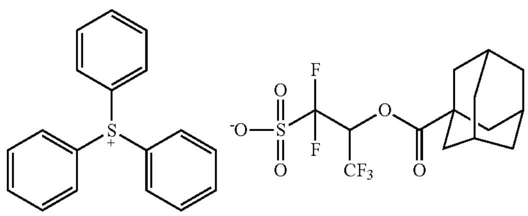
B-108
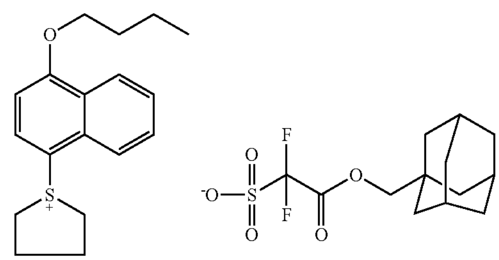
B-109
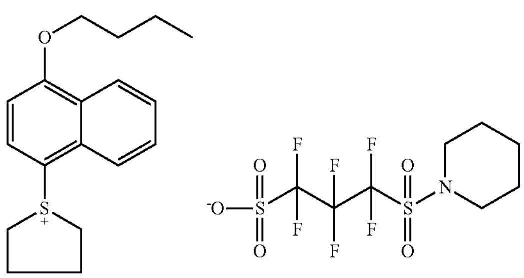
B-110
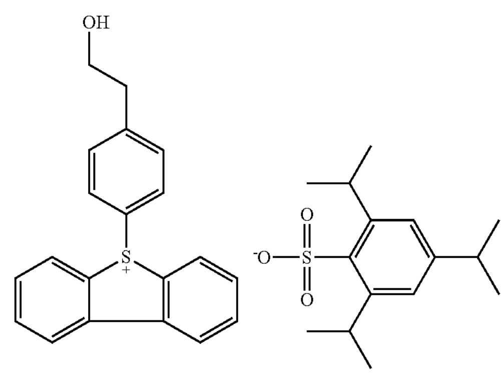
B-111
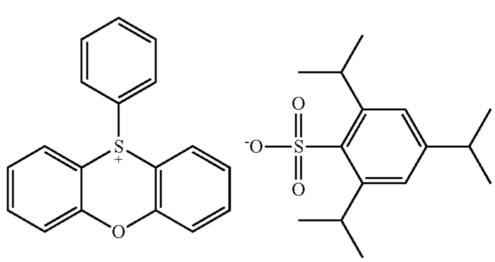
B-112
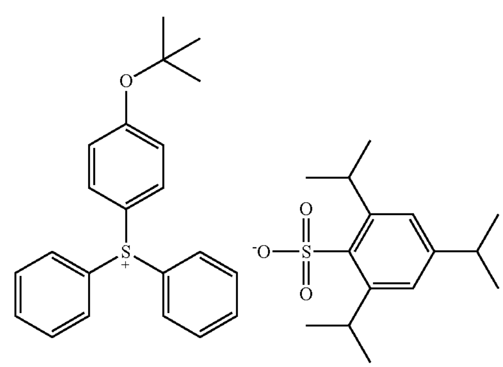
B-113
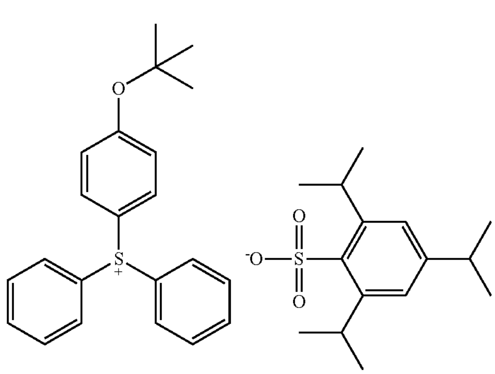
B-114
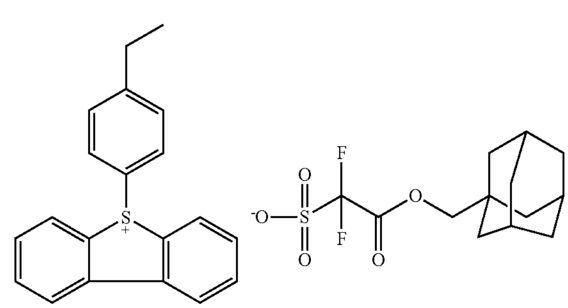

-continued
B-115
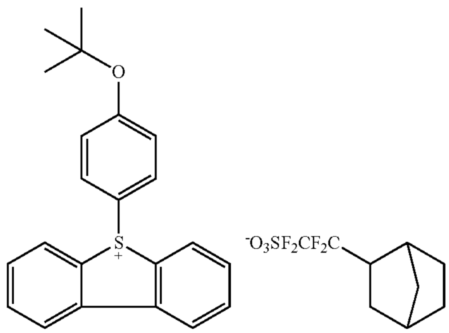
B-116
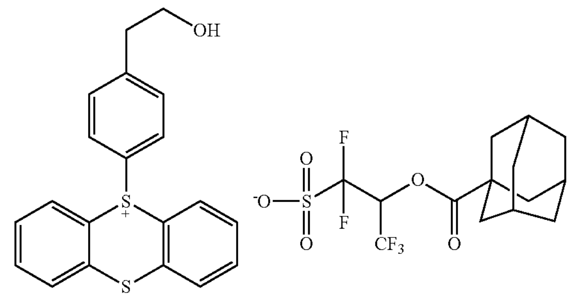
B-117
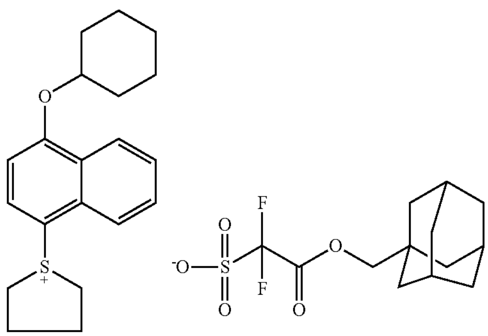
B-118
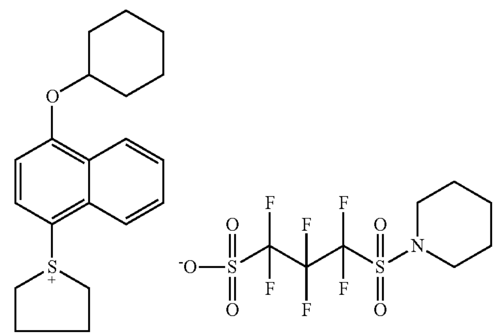
B-119
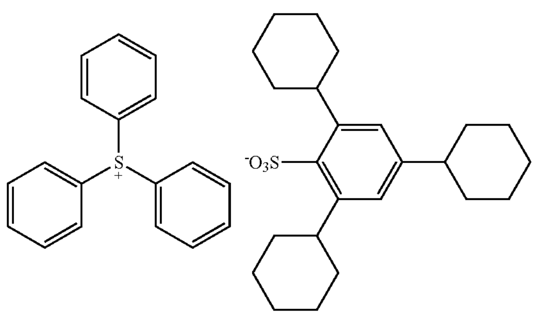
B-120
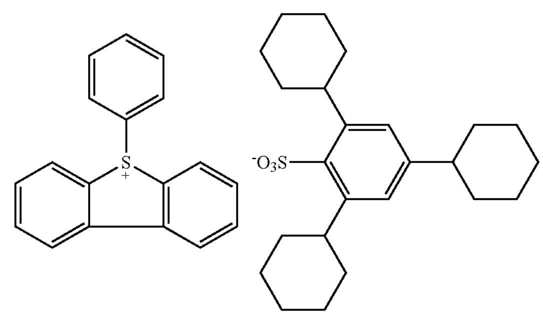
B-121
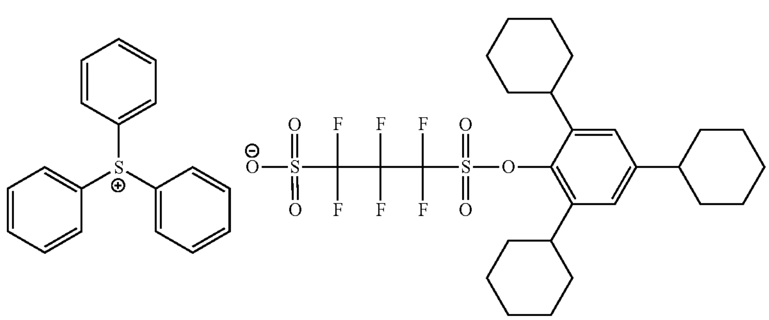
B-122
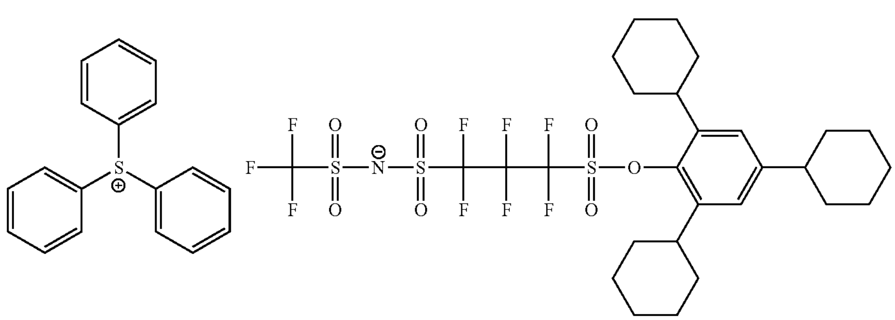

-continued
B-123
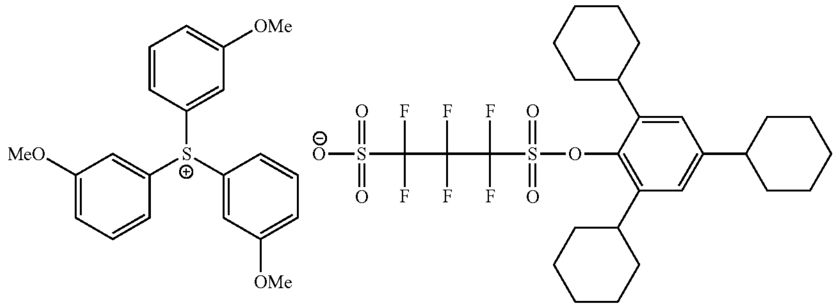
B-124
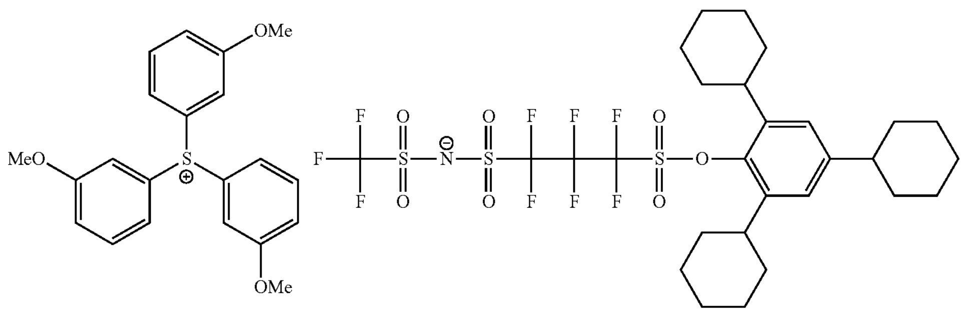
B-125
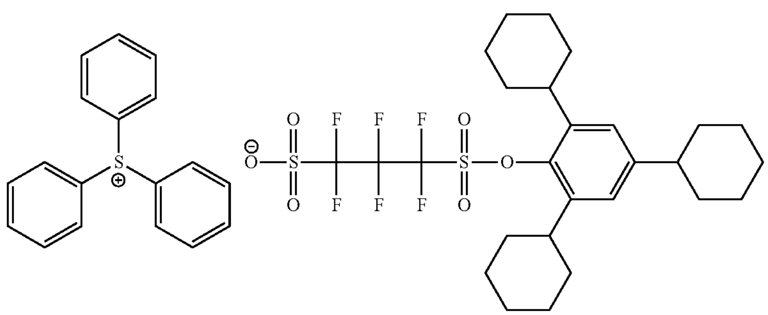
B-126
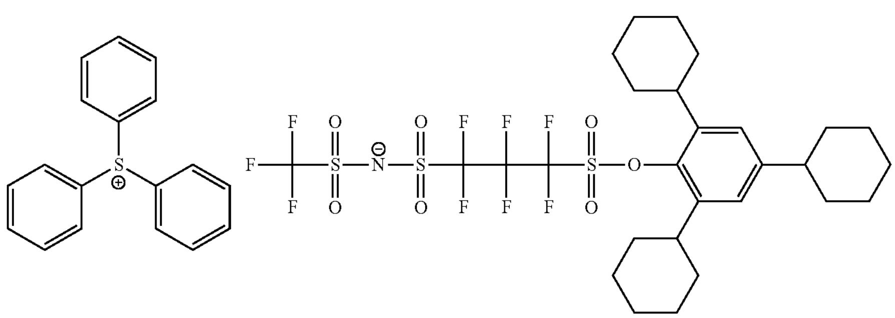
B-127
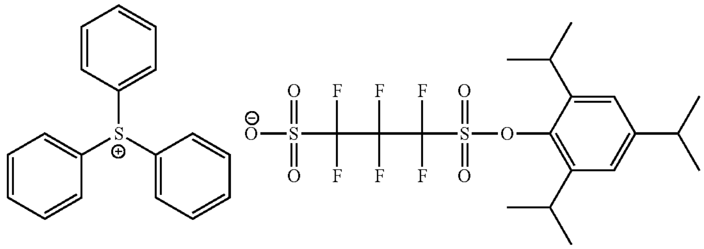

-continued
B-128
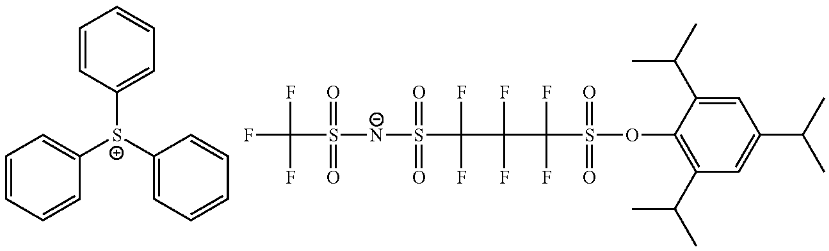
B-129
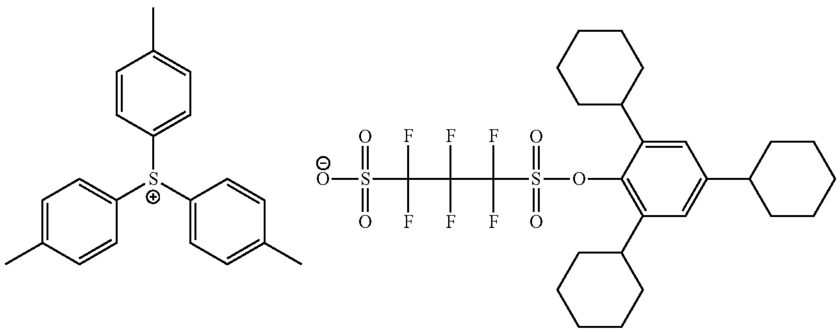
B-130
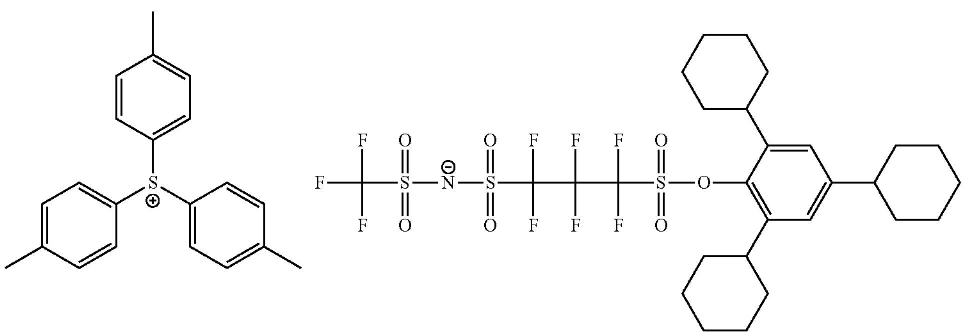
B-131
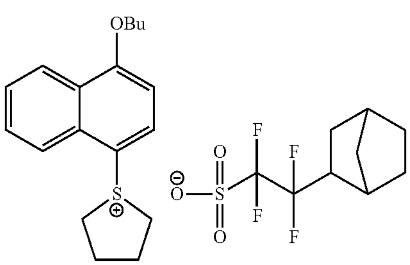
B-132
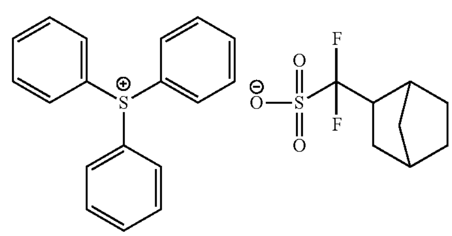
B-133
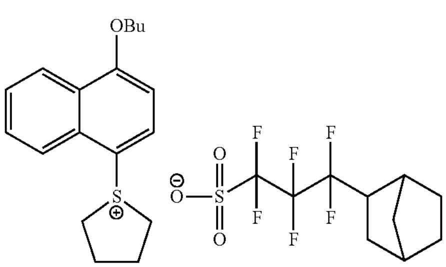
B-134
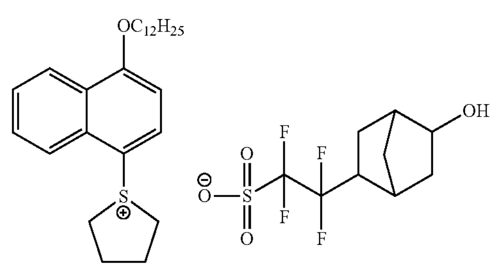

-continued
B-135
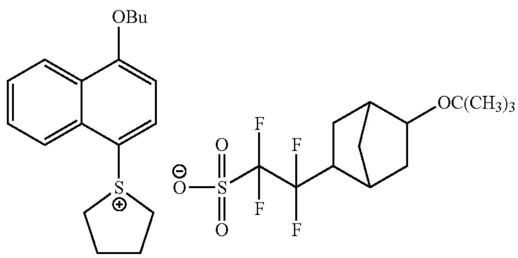
B-136
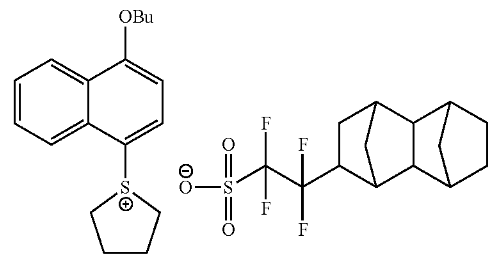
B-137
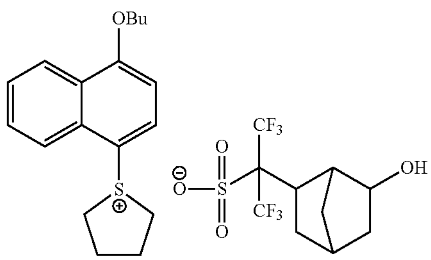
B-138
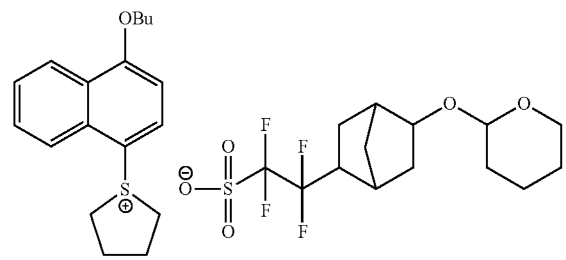
B-139
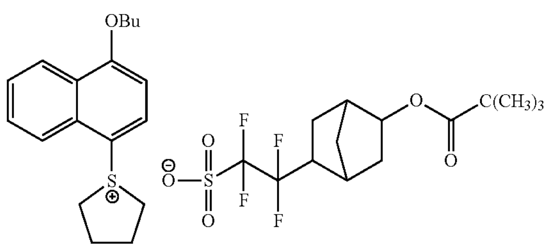
B-140
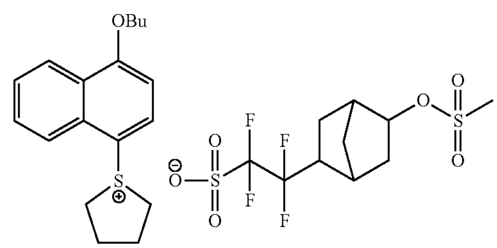
B-141
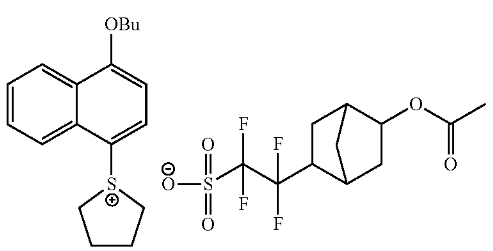
B-142
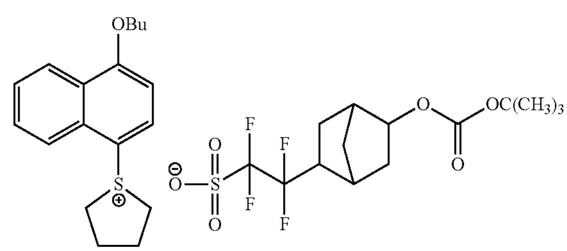
B-143
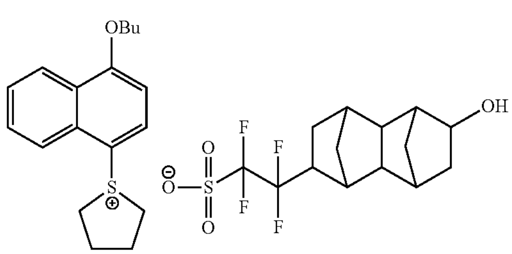
B-144
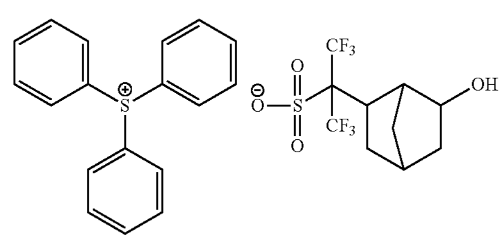
B-145
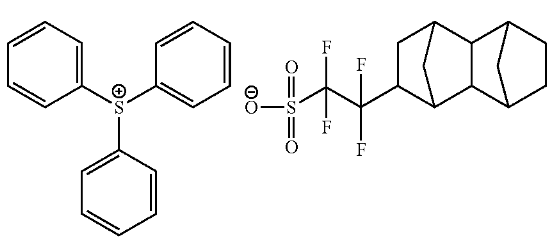
B-146
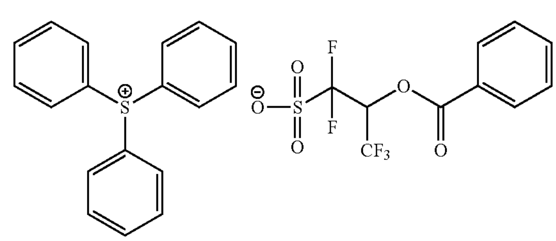

-continued
B-147
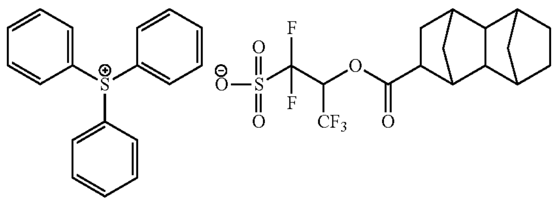
B-148
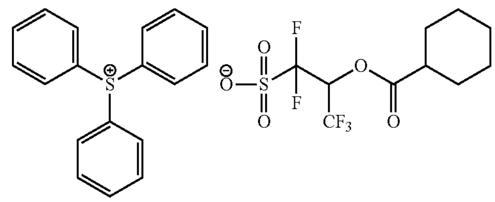
B-149
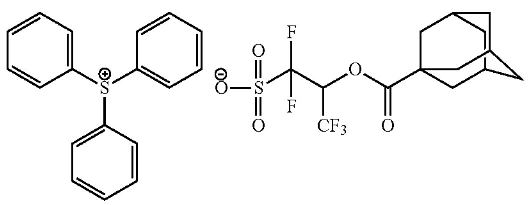
B-150
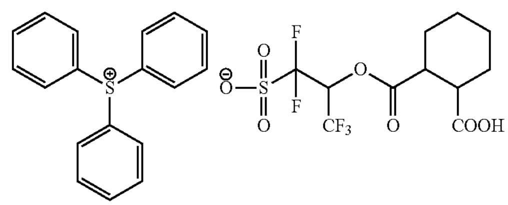
B-151
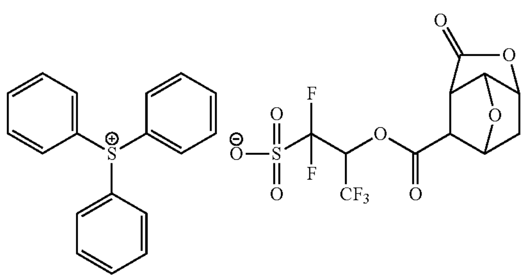
B-152
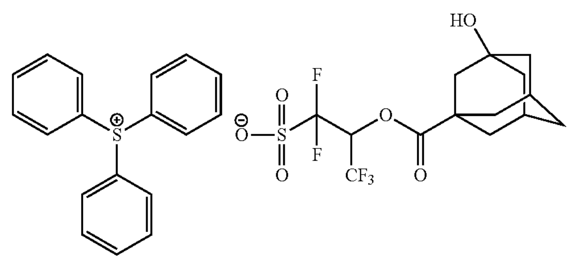
B-153
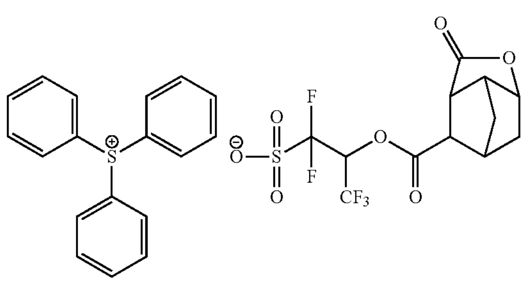
B-154
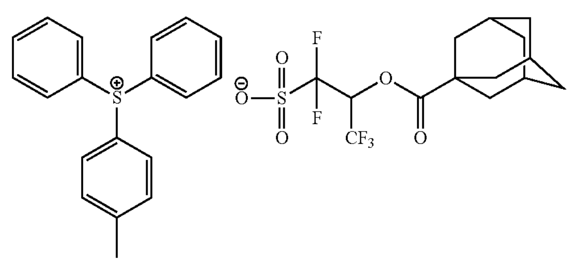
B-155
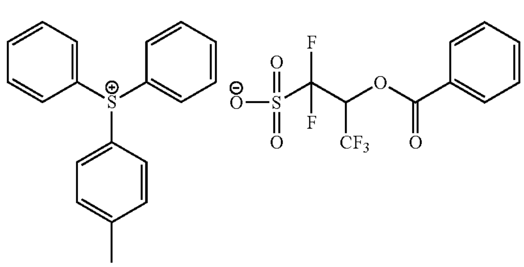
B-156
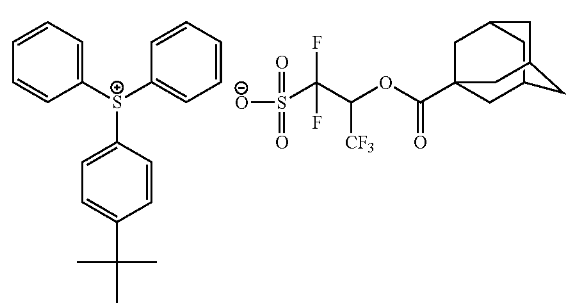

-continued
B-157
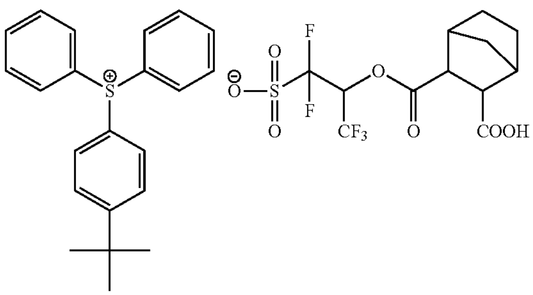
B-158
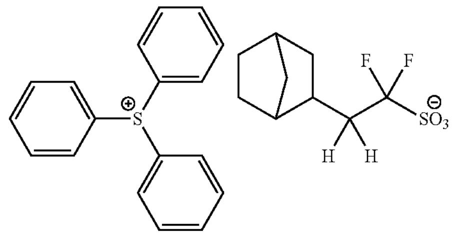
B-159
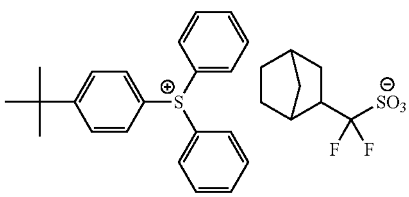
B-160
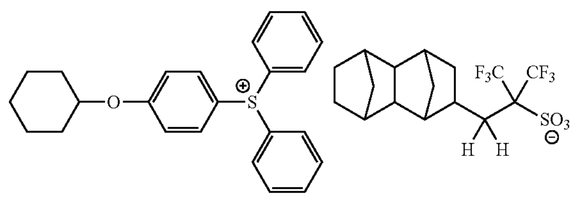
B-161
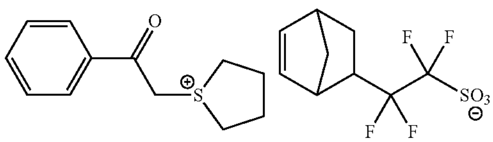
B-162
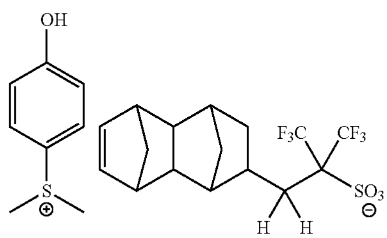
B-163
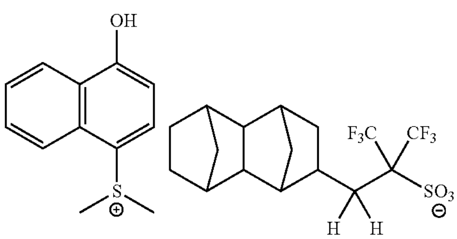
B-164
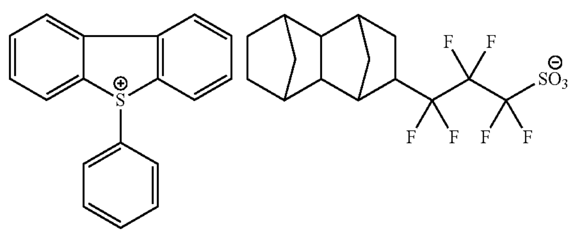
B-165
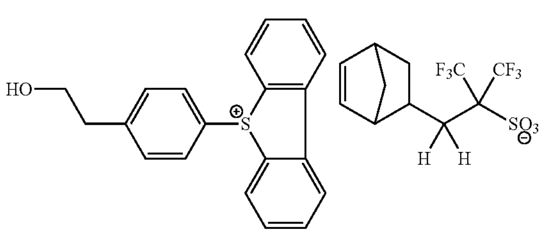
B-166
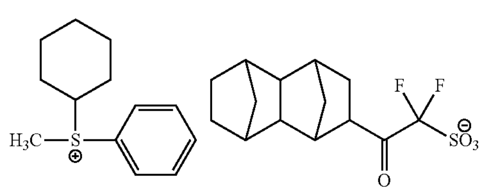
B-167
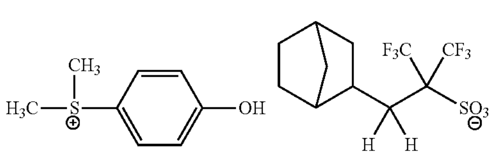
B-168
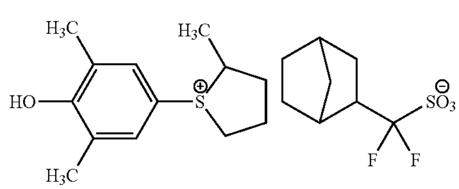

-continued
B-169
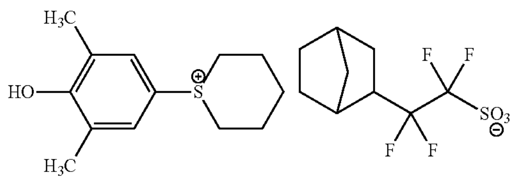
B-170
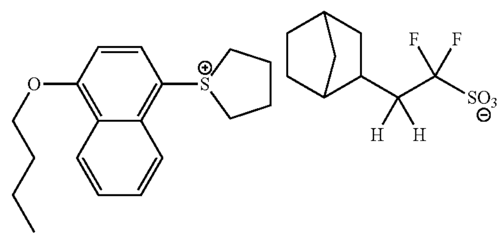
B-171
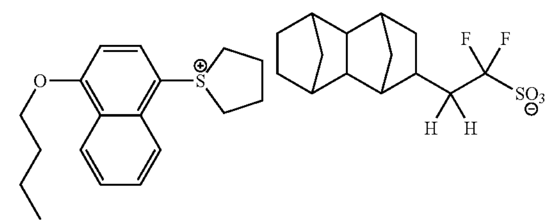
B-172
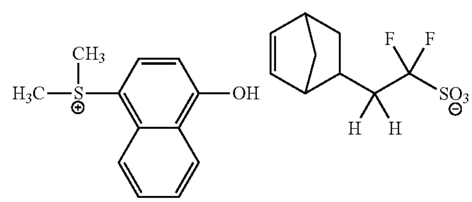
B-173
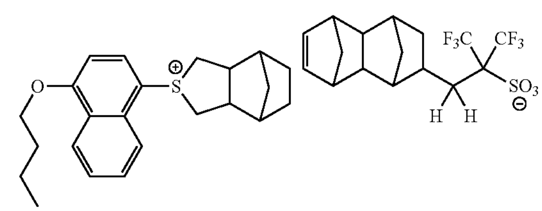
B-174
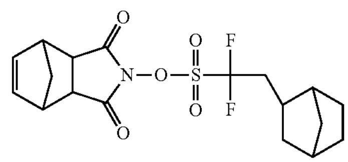
B-175
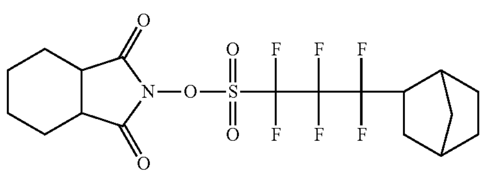
B-176
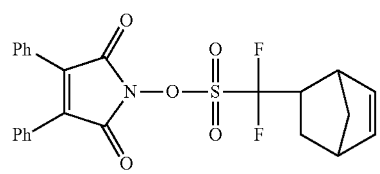
B-177
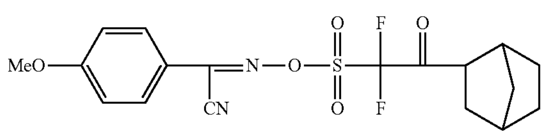
B-178
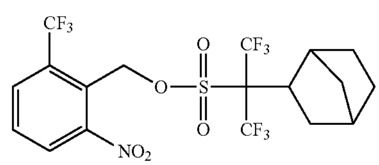
(Y-1)
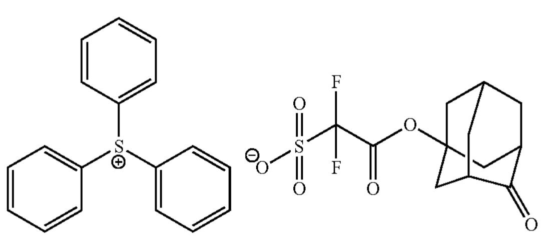
(Y-2)
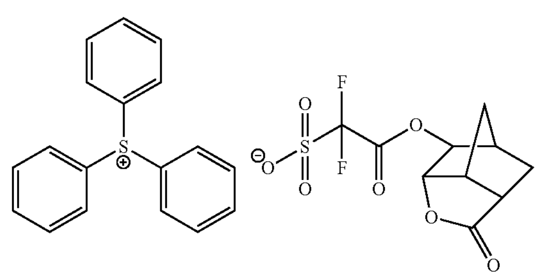
(Y-3)
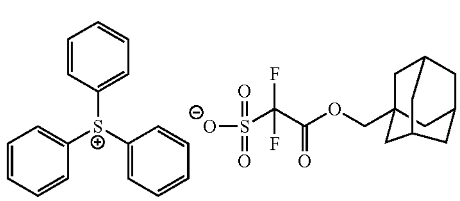
(Y-4)
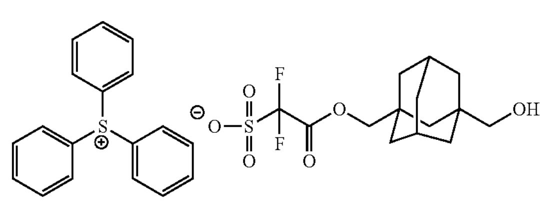

-continued
(Y-5)
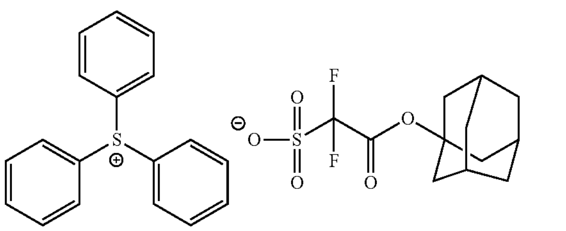
(Y-6)
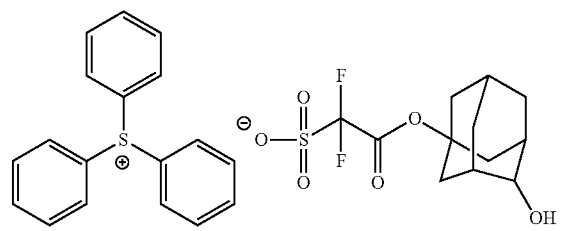
(Y-7)
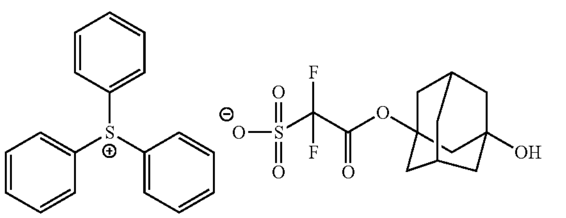
(Y-8)
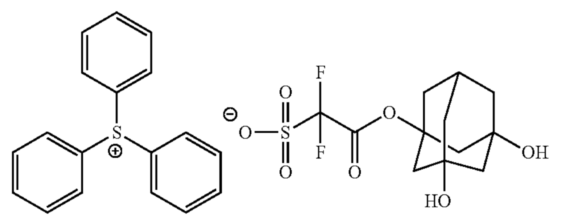
(Y-9)
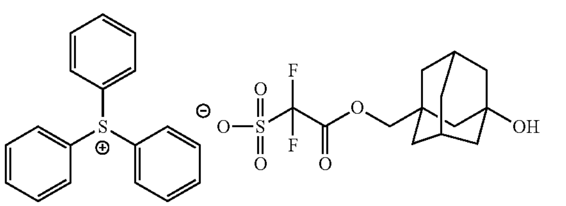
(Y-10)
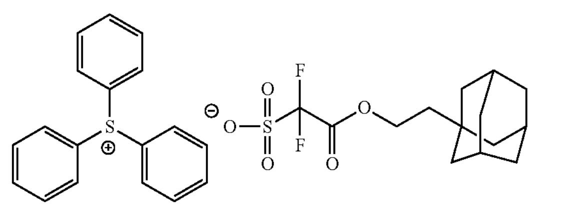
(Y-11)
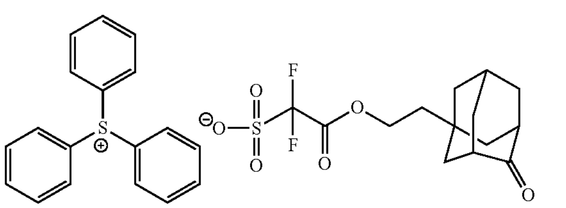
(Y-12)
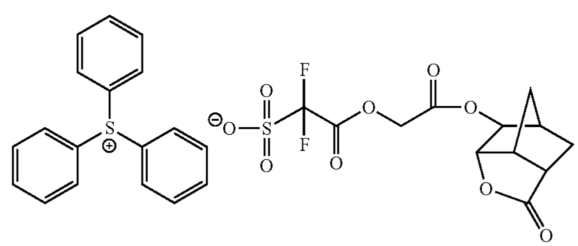
(Y-13)
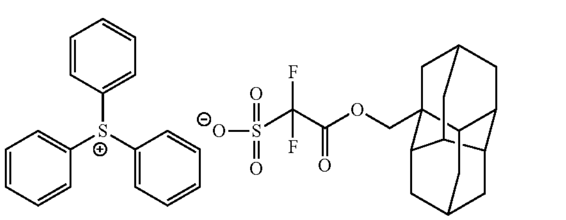
(Y-14)
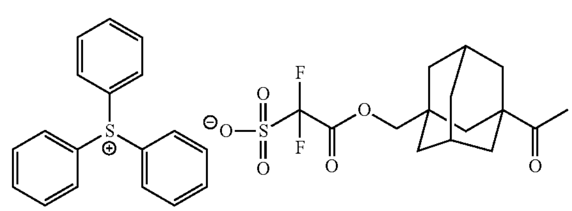
(Y-15)
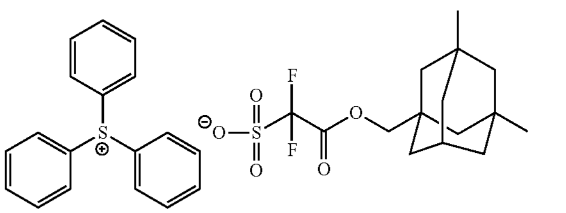
(Y-16)
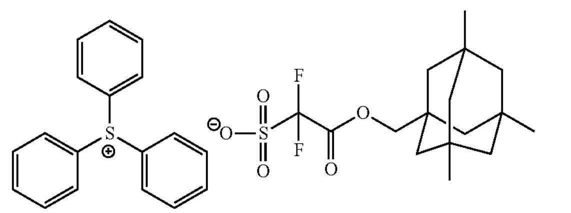

-continued
(Y-17)
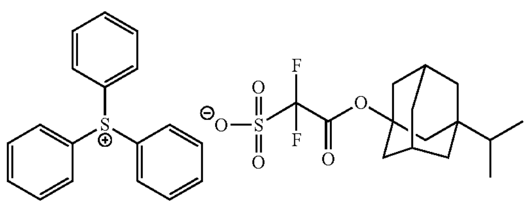
(Y-18)
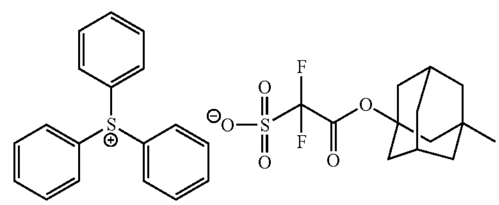
(Y-19)
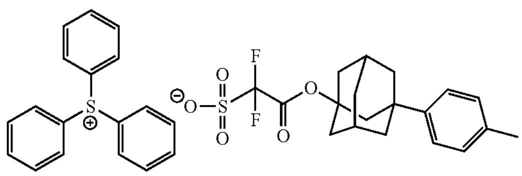
(Y-20)
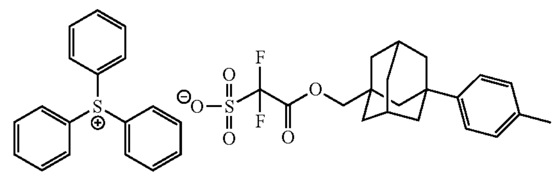
(Y-21)
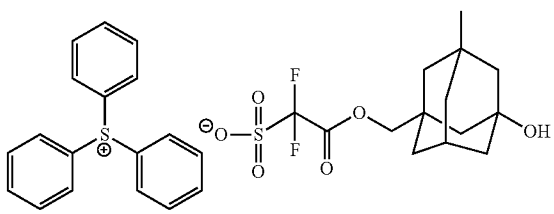
(Y-22)
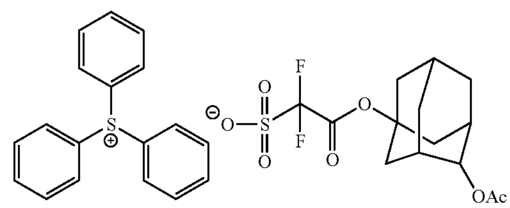
(Y-23)
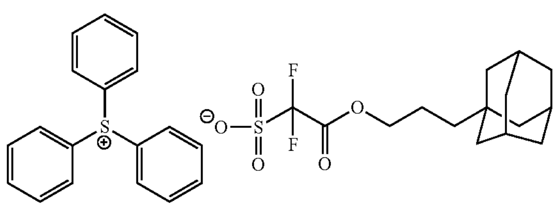
(Y-24)
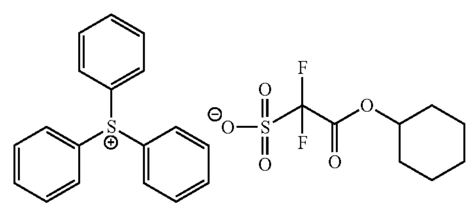
(Y-25)
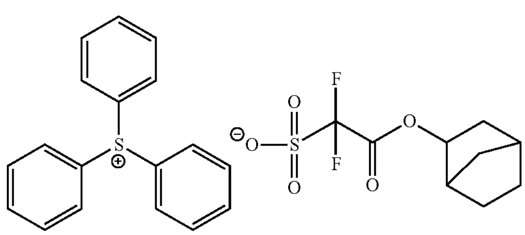
(Y-26)
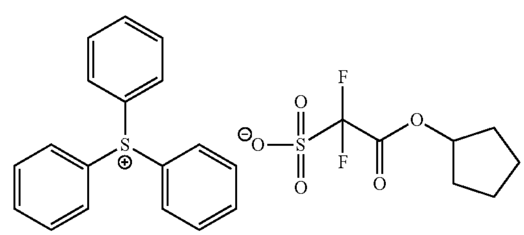
(Y-27)
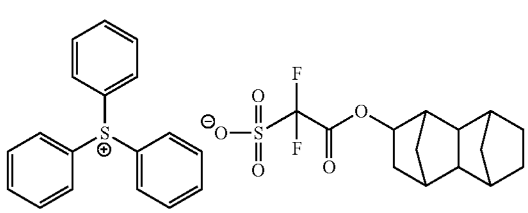
(Y-28)
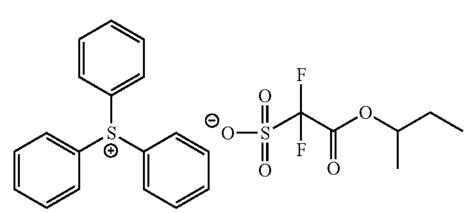
(Y-29)
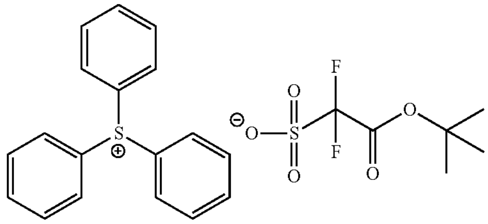
(Y-30)
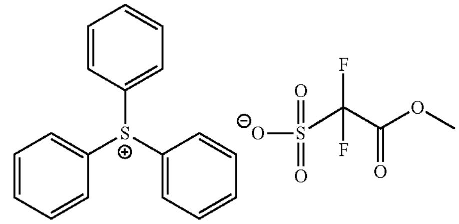

-continued
(Y-31)
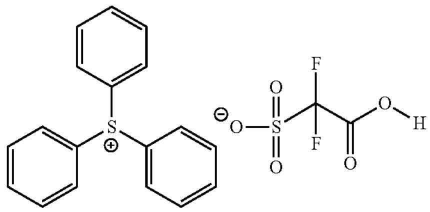
(Y-32)
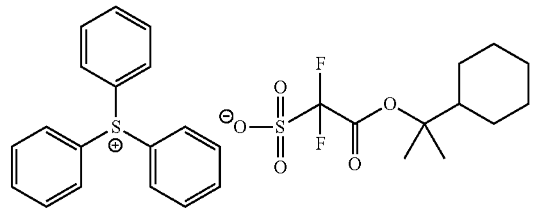
(Y-33)
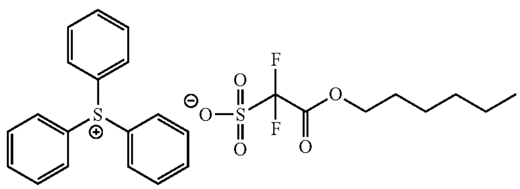
(Y-34)
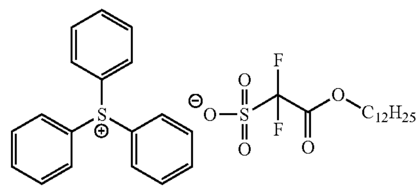
(Y-35)
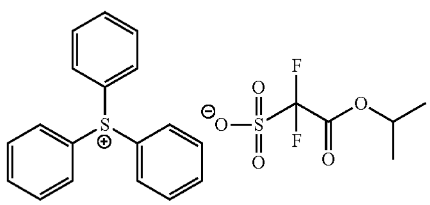
(Y-36)
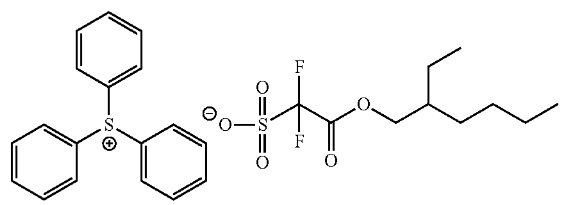
(Y-37)
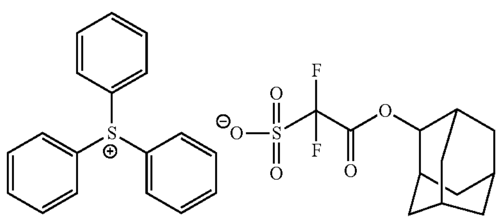
(Y-38)
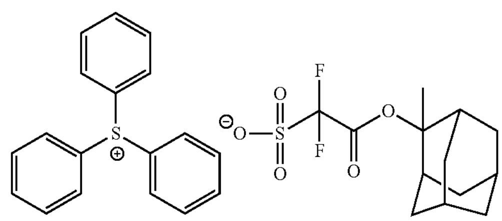
(Y-39)
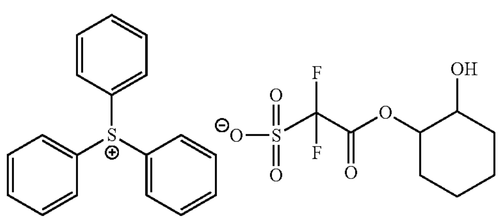
(Y-40)
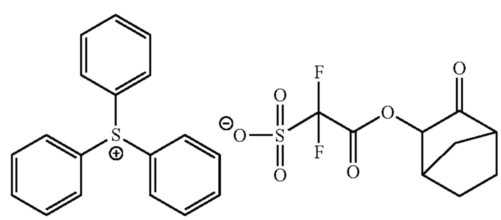
(Y-41)
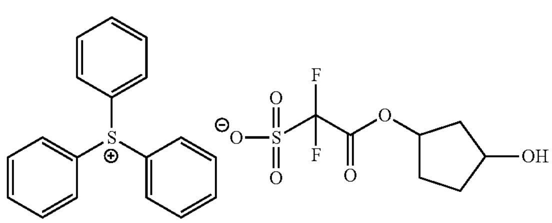
(Y-42)
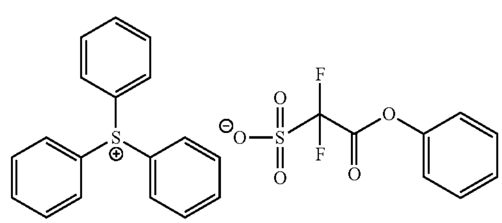
(Y-43)
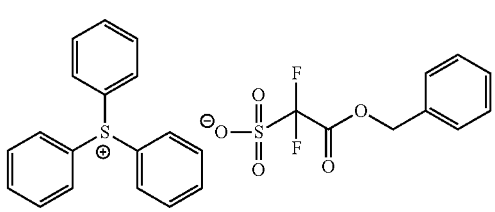
(Y-44)
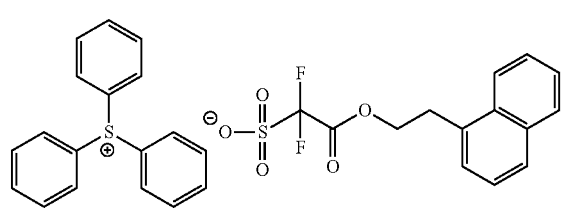

-continued
(Y-45)
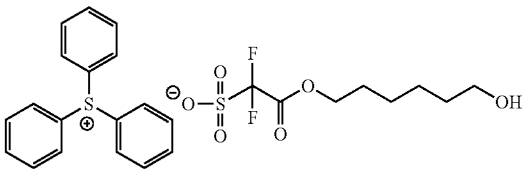
(Y-46)
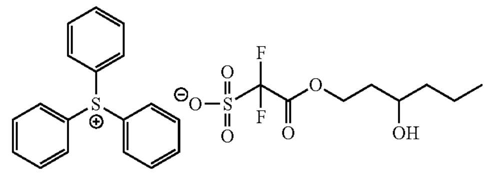
(Y-47)
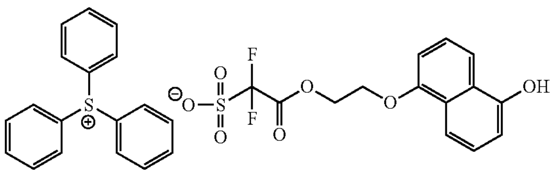
(Y-48)
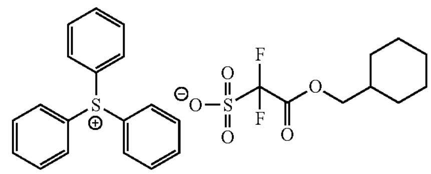
(Y-49)
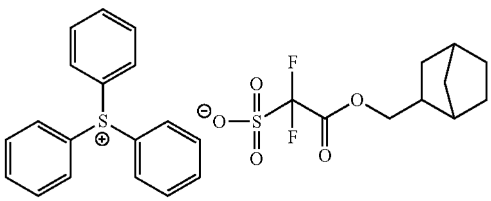
(Y-50)
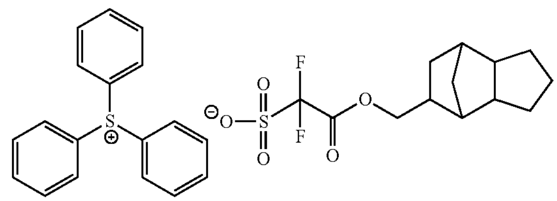
(Y-51)
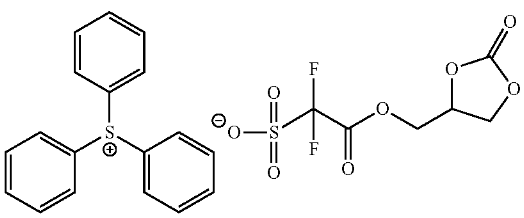
(Y-52)
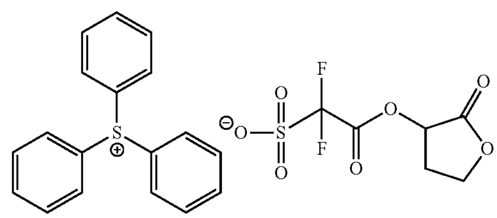
(Y-53)
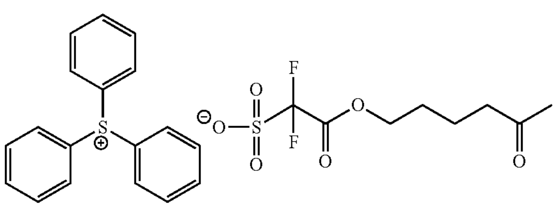
(Y-54)
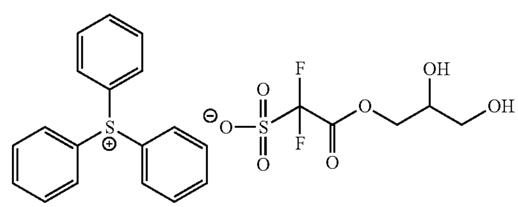
(Y-55)
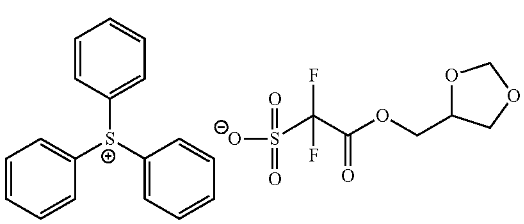
(Y-56)
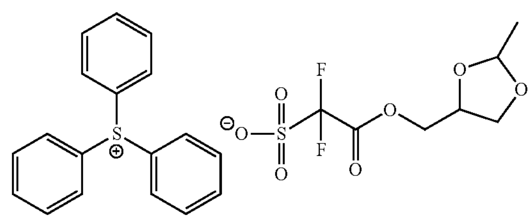
(Y-57)
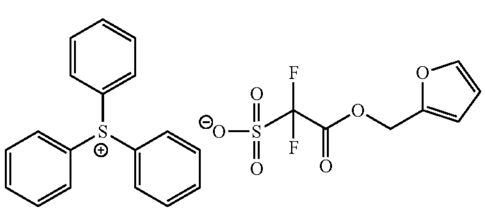
(Y-58)
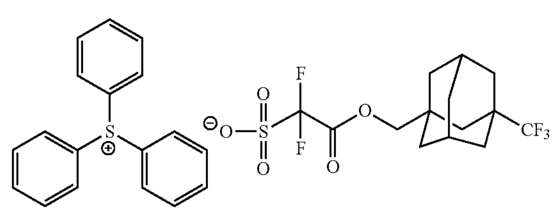

-continued
(Y-59)
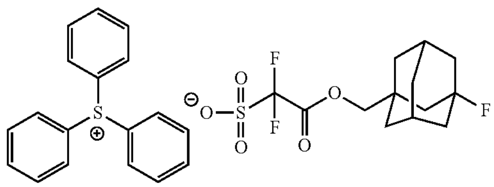
(Y-60)
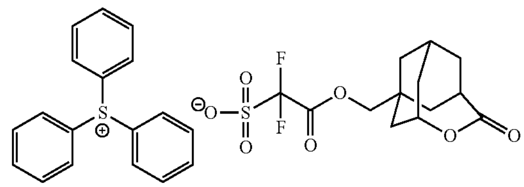
(Y-61)
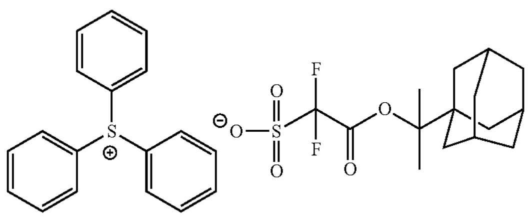
(Y-62)
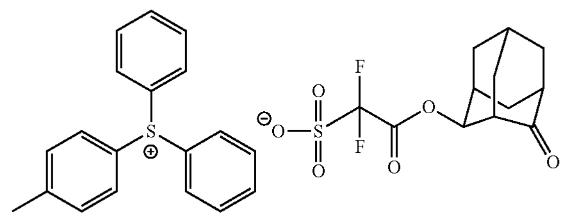
(Y-63)
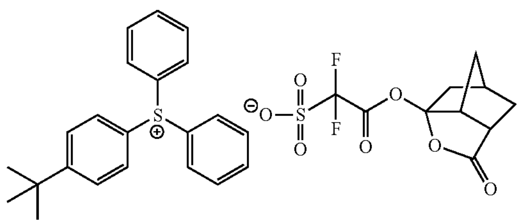
(Y-64)
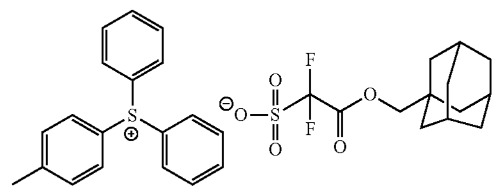
(Y-65)
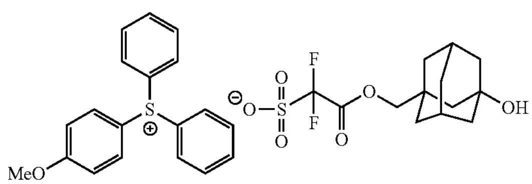
(Y-66)
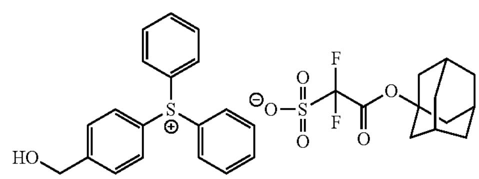
(Y-67)
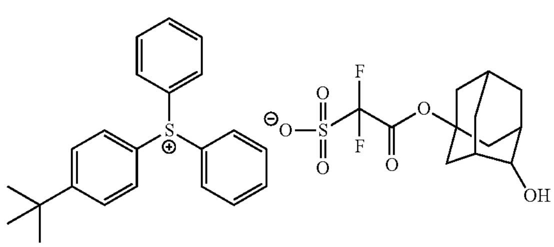
(Y-68)
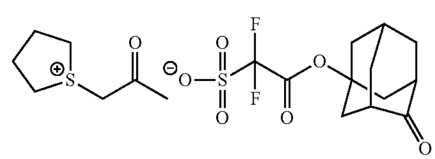
(Y-69)
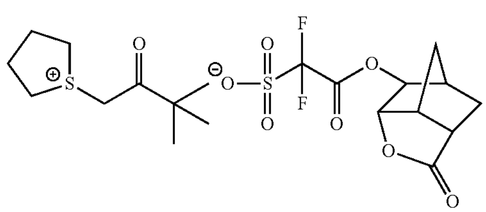
(Y-70)
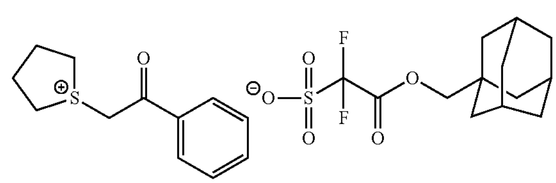
(Y-71)
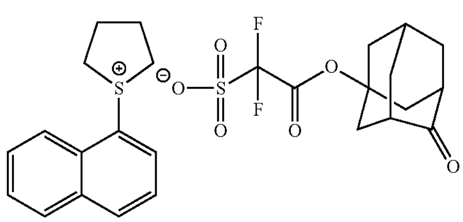
(Y-72)
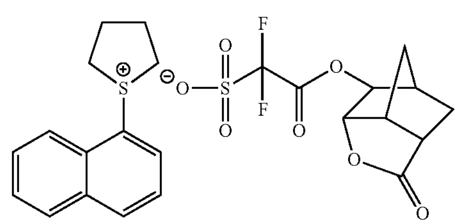

-continued (Y-73)

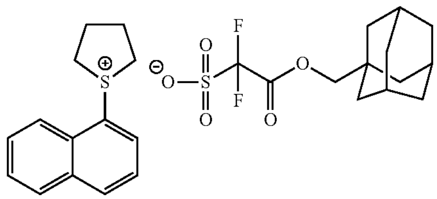

(Y-74)

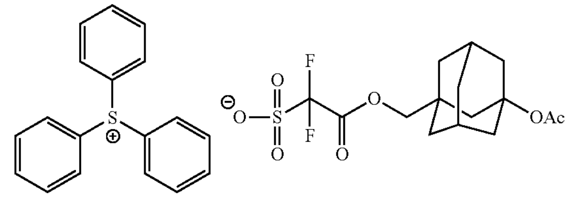

(Y-75)

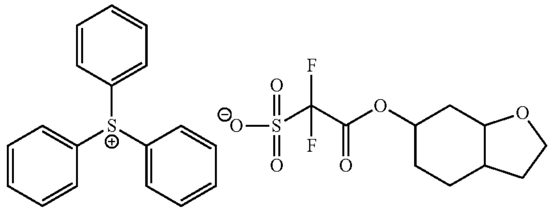

One kind of a photoacid generator may be used alone, or two or more kinds of photoacid generators may be used in combination. In the latter case, compounds capable of generating two kinds of organic acids differing in the total number of atoms excluding hydrogen atom by 2 or more are preferably combined.

The content of the photoacid generator is preferably from 0.1 to 50 mass %, more preferably from 0.5 to 45 mass %, still more preferably from 1 to 40 mass %, based on the total solid content of the composition.

[4] Basic Compound

The actinic ray-sensitive or radiation-sensitive composition of the present invention may further contain a basic compound. The basic compound is preferably a compound having basicity stronger than that of phenol. The basic compound is preferably an organic basic compound, more preferably a nitrogen-containing basic compound.

The nitrogen-containing basic compound which can be used is not particularly limited, but, for example, compounds classified into the following (1) to (7) may be used.

(1) Compound Represented by the Following Formula (BS-1):

(BS-1)

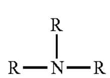

In formula (BS-1), each R independently represents a hydrogen atom or an organic group, provided that at least one of three R's is an organic group. The organic group is a linear or branched alkyl group, a monocyclic or polycyclic cycloalkyl group, an aryl group or an aralkyl group.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples thereof include a phenyl group and a naphthyl group.

The carbon number of the aralkyl group as R is not particularly limited but is usually from 7 to 20, preferably from 7 to 11. Specific examples thereof include a benzyl group.

In the alkyl group, cycloalkyl group, aryl group and aralkyl group as R, a hydrogen atom may be substituted for by a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

In the compound represented by formula (BS-1), it is preferred that at least two R's are an organic group.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, and 2,4,6-tri(tert-butyl)aniline.

Also, the preferred basic compound represented by formula (BS-1) includes a compound where at least one R is an alkyl group substituted with a hydrophilic group. Specific examples thereof include triethanolamine and N,N-dihydroxyethylaniline.

The alkyl group as R may have an oxygen atom in the alkyl chain. That is, an oxyalkylene chain may be formed. The oxyalkylene chain is preferably —$CH_2CH_2O$—. Specific examples thereof include tris(methoxyethoxyethyl)amine and compounds illustrated in column 3, line 60 et seq. of U.S. Pat. No. 6,040,112.

Examples of the basic compound represented by formula (BS-1) include the followings.

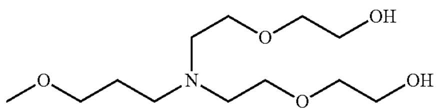

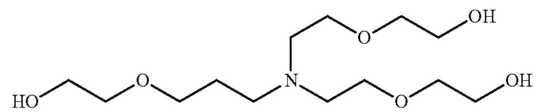

-continued

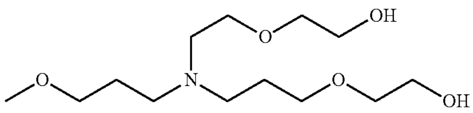

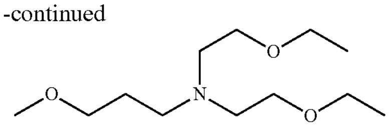

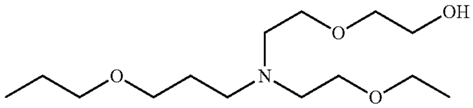

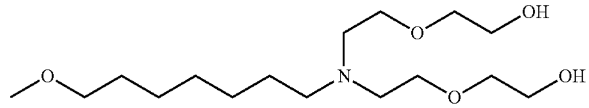

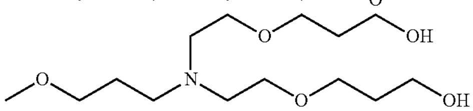

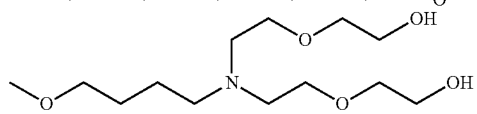

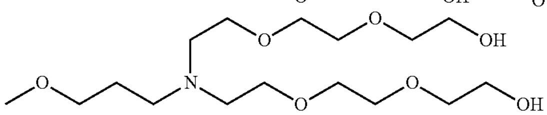

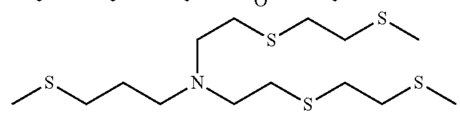

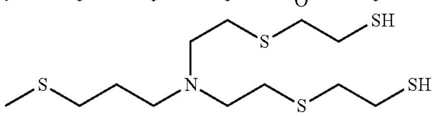

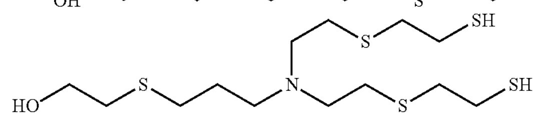

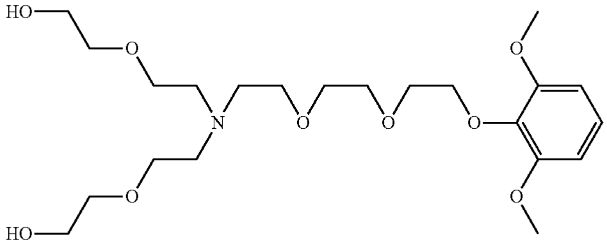

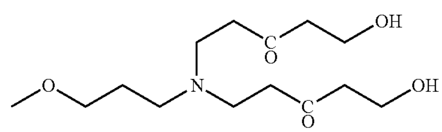

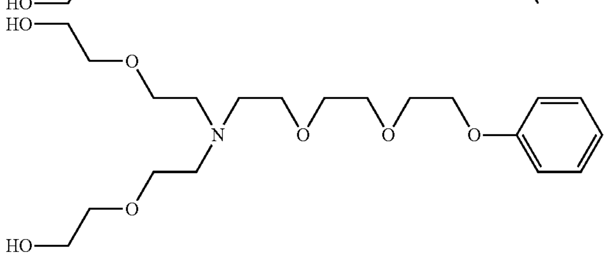

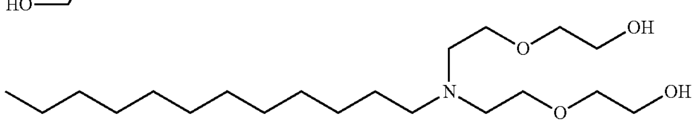

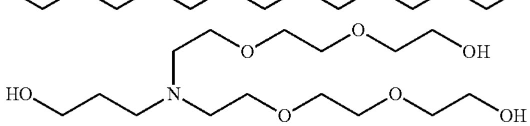

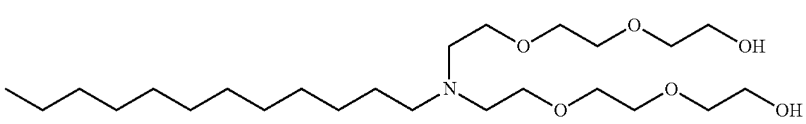

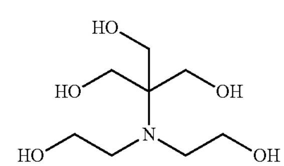

(2) Compound Having a Nitrogen-Containing Heterocyclic Structure

The nitrogen-containing heterocyclic ring may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure [e.g., N-hydroxyethylpiperidine, bis(1,2,2,6,6-pentamethyl-4-piperidyl)sebacate], a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group contained in an amine compound has a phenoxy group at the terminal opposite the N atom. The phenoxy group may have a substituent such as alkyl group, alkoxy group, halogen atom, cyano group, nitro group, carboxy group, carboxylic acid ester group, sulfonic acid ester group, aryl group, aralkyl group, acyloxy group and aryloxy group.

The compound preferably has at least one oxyalkylene chain between the phenoxy group and the nitrogen atom. The number of oxyalkylene chains per molecule is preferably from 3 to 9, more preferably from 4 to 6. Among oxyalkylene chains, —$CH_2CH_2O$— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

The phenoxy group-containing amine compound is obtained, for example, by reacting a primary or secondary amine having a phenoxy group with a haloalkyl ether under heating and after adding an aqueous solution of a strong base such as sodium hydroxide, potassium hydroxide and tetraalkylammonium, extracting the reaction product with an organic solvent such as ethyl acetate and chloroform. The phenoxy group-containing amine compound may be also obtained by reacting a primary or secondary amine with a haloalkyl ether having a phenoxy group at the terminal under heating and after adding an aqueous solution of a strong base such as sodium hydroxide, potassium hydroxide and tetraalkylammonium, extracting the reaction product with an organic solvent such as ethyl acetate and chloroform.

(4) Ammonium Salt

An ammonium salt may be also appropriately used as the basic compound. Examples of the anion of the ammonium salt include a halide, a sulfonate, a borate and a phosphate. Among these, a halide and a sulfonate are preferred.

The halide is preferably chloride, bromide or iodide.

The sulfonate is preferably an organic sulfonate having a carbon number of 1 to 20. Examples of the organic sulfonate include an alkylsulfonate having a carbon number of 1 to 20, and an arylsulfonate.

The alkyl group contained in the alkylsulfonate may have a substituent, and examples of the substituent include a fluorine atom, a chlorine atom, a bromine atom, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate.

Examples of the aryl group contained in the arylsulfonate include a phenyl group, a naphthyl group and an anthryl group. Such an aryl group may have a substituent. The substituent is preferably, for example, a linear or branched alkyl group having a carbon number of 1 to 6, or a cycloalkyl group having a carbon number of 3 to 6. Specific preferred examples thereof include methyl, ethyl, n-propyl, isopropyl, n-butyl, i-butyl, tert-butyl, n-hexyl and cyclohexyl. Other substituents include an alkoxy group having a carbon number of 1 to 6, a halogen atom, cyano, nitro, an acyl group, and an acyloxy group.

The ammonium salt may be a hydroxide or a carboxylate. In this case, the ammonium salt is preferably a tetraalkylammonium hydroxide having a carbon number of 1 to (e.g., tetramethylammonium hydroxide, tetraethylammonium hydroxide, tetra-(n-butyl)ammonium hydroxide).

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These compounds may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

More preferred examples of the basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

(5) (PA) Compound Having a Proton Acceptor Functional Group and Undergoing Decomposition Upon Irradiation with an Actinic Ray or Radiation to Generate a Compound Reduced in or Deprived of the Proton Acceptor Property or Changed from Proton Acceptor-Functioning to Acidic The composition of the present invention may further contain, as a basic compound, a compound having a proton acceptor functional group and undergoing decomposition upon irradiation with an actinic ray or radiation to generate a compound reduced in or deprived of the proton acceptor property or changed from proton acceptor-functioning to acidic [hereinafter, sometimes referred to as "compound (PA)"].

The proton acceptor functional group is a functional group having a group or electron capable of electrostatically interacting with a proton and means, for example, a functional group having a macrocyclic structure such as cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following formulae:

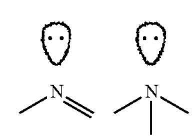

unshared electron pair

Preferred examples of the partial structure for the proton acceptor functional group include a crown ether structure, an aza-crown ether structure, a primary to tertiary amine structure, a pyridine structure, an imidazole structure, and a pyrazine structure.

The compound (PA) decomposes upon irradiation with an actinic ray or radiation to generate a compound reduced in or deprived of the proton acceptor property or changed from proton acceptor-functioning to acidic. The "reduced in or deprived of the proton acceptor property or changed from proton acceptor-functioning to acidic" as used herein indicates a change in the proton acceptor property due to addition of a proton to the proton acceptor functional group and specifically means that when a proton adduct is produced from the proton acceptor functional group-containing compound (PA) and a proton, the equilibrium constant in the chemical equilibrium decreases.

The proton acceptor property can be confirmed by measuring the pH. In the present invention, the acid dissociation constant pKa of the compound generated resulting from decomposition of the compound (PA) upon irradiation with an actinic ray or radiation preferably satisfies pKa<−1, more preferably −13<pKa<−1, still more preferably −13<pKa<−3.

In the present invention, the acid dissociation constant pKa indicates an acid dissociation constant pKa in an aqueous solution and is a value described, for example, in *Kagaku Binran* (*Chemical Handbook*) (*II*) (4th revised edition, compiled by The Chemical Society of Japan, Maruzen (1993)). As this value is lower, the acid strength is higher. Specifically, the acid dissociation constant at 25° C. is measured using an aqueous infinite dilution solution, whereby the acid dissociation constant pKa in an aqueous solution can be actually measured. Alternatively, a value based on Hammett's substituent constants and data base containing values known in publications can be determined by computation using the following software package 1. The pKa values referred to in the description of the present invention all are a value determined by computation using this software package.

Software Package 1: Advanced Chemistry Development (ACD/Labs) Software V8.14 for Solaris (1994-2007 ACD/Labs)

The compound (PA) decomposes upon irradiation with an actinic ray or radiation to produce, for example, a compound represented by the following formula (PA-1) as the above-described proton adduct. The compound represented by formula (PA-1) is a compound having an acidic group together with a proton acceptor functional group and thereby being reduced in or deprived of the proton acceptor property or changed from proton acceptor-functioning to acidic, as compared with the compound (PA).

$$Q\text{-}A\text{-}(X)_n\text{—}B\text{—}R \qquad \text{(PA-1)}$$

In formula (PA-1), Q represents —$SO_3H$, —$CO_2H$ or —$X_1NHX_2Rf$, wherein Rf represents an alkyl group, a cycloalkyl group or an aryl group and each of $X_1$ and $X_2$ independently represents —$SO_2$— or —CO—.

A represents a single bond or a divalent linking group.

X represents —$SO_2$— or —CO—.

n represents 0 or 1.

B represents a single bond, an oxygen atom or —N(Rx)Ry-, wherein Rx represents a hydrogen atom or a monovalent organic group, Ry represents a single bond or a divalent organic group, and Rx may combine with Ry to form a ring or combine with R to form a ring.

R represents a monovalent organic group having a proton acceptor functional group.

Formula (PA-1) is described in detail below.

The divalent linking group in A is preferably a divalent linking group having a carbon number of 2 to 12, and examples thereof include an alkylene group and a phenylene group. An alkylene group having at least one fluorine atom is preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of hydrogen atoms are substituted for by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group in Rx preferably has a carbon number of 1 to 30, and examples thereof include an alkyl group, a cycloalkyl group, an aryl group, an aralkyl group, and an alkenyl group. These groups may further have a substituent.

The alkyl group in Rx may have a substituent and is preferably a linear or branched alkyl group having a carbon number of 1 to 20, and the alkyl chain may contain an oxygen atom, a sulfur atom or a nitrogen atom.

The divalent organic group in Ry is preferably an alkylene group.

The ring structure which may be formed by combining Rx and Ry with each other includes a 5- to 10-membered ring, preferably a 6-membered ring, containing a nitrogen atom.

The alkyl group having a substituent includes particularly a group where a cycloalkyl group is substituted on a linear or branched alkyl group (for example, an adamantylmethyl group, an adamantylethyl group, a cyclohexylethyl group and a camphor residue).

The cycloalkyl group in Rx, which may have a substituent, is preferably a cycloalkyl group having a carbon number of 3 to 20 and may contain an oxygen atom in the ring.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent and includes, for example, a group having a double bond at an arbitrary position of the alkyl group described as Rx.

The proton acceptor functional group of R is as described above and includes a group containing, for example, a nitrogen-containing heterocyclic aromatic structure such as azacrown ether, primary to tertiary amine, pyridine and imidazole.

The group containing such a structure preferably has a carbon number of 4 to 30, and examples thereof include an alkyl group, a cycloalkyl group, an aryl group, an aralkyl group, and an alkenyl group.

Examples of the alkyl group, cycloalkyl group, aryl group, aralkyl group and alkenyl group in the proton acceptor functional group- or ammonium group-containing alkyl group, cycloalkyl group, aryl group, aralkyl group and alkenyl group of R are the same as those of the alkyl group, cycloalkyl group, aryl group, aralkyl group and alkenyl group described for Rx.

Examples of the substituent which may be substituted on each of the above-described groups include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). The cyclic structure in the aryl group, cycloalkyl group and the like and the aminoacyl group may further have an alkyl group (preferably having a carbon number of 1 to 20) as a substituent.

When B is —N(Rx)Ry-, R and Rx preferably combine with each other to form a ring. By forming a ring structure, the stability is enhanced and the composition using this compound is also increased in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4-membered ring, a 5-membered ring, a 6-membered ring, a 7-membered ring and a 8-membered ring each containing a nitrogen atom. Examples of the polycyclic structure include a structure comprising a combination of two monocyclic structures or three or more monocyclic structures. The monocyclic structure and the polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). The cyclic structure in the aryl group, cycloalkyl group and the like may further have an alkyl group (preferably having a carbon number of 1 to 15) as a substituent. The aminoacyl group may further have an alkyl group (preferably having a carbon number of 1 to 15) as a substituent.

Rf in —$X_1NHX_2$Rf represented by Q is preferably an alkyl group having a carbon number of 1 to 6, which may have a fluorine atom, more preferably a perfluoroalkyl group having a carbon number of 1 to 6. Also, at least one of $X_1$ and $X_2$ is preferably —$SO_2$—, and it is more preferred that both of $X_1$ and $X_2$ are —$SO_2$—.

Out of the compounds represented by formula (PA-1), the compound where the Q site is a sulfonic acid can be synthesized by using a general sulfonamidation reaction. For example, the compound may be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through a reaction with an amine compound.

The compound (PA) is preferably an ionic compound. The proton acceptor functional group may be contained in either the anion moiety or the cation moiety but is preferably contained in the anion moiety.

The compound (PA) is preferably a compound represented by the following formula (4) to (6):

$$R_f—X_2—N^-—X_1\text{-}A\text{-}(X)_n—B—R[C]^+ \quad (4)$$

$$R—SO_3^-[C]^+ \quad (5)$$

$$R—CO_2^-[C]^+ \quad (6)$$

In formulae (4) to (6), A, X, n, B, R, Rf, $X_1$ and $X_2$ have the same meanings as those in formula (PA-1).

$C^+$ represents a counter cation.

The counter cation is preferably an onium cation. More specifically, preferred examples thereof include a sulfonium cation described above as $S^+(R_{201}')(R_{202}')(R_{203}')$ in formula (ZI) and an iodonium cation described as $I^+(R_{204}')(R_{205}')$ in formula (ZII), which are compounds used as a photoacid generator.

Specific examples of compound (PA) are illustrated below, but the present invention is not limited thereto.

(PA-1)

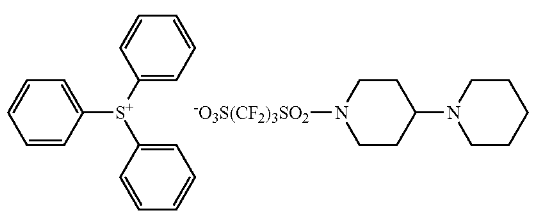

(PA-2)

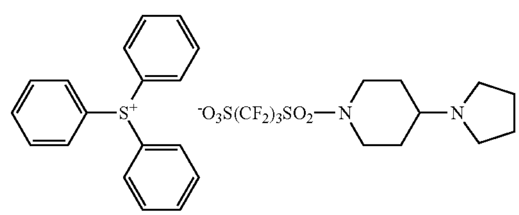

(PA-3)

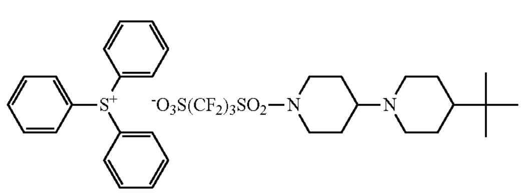

(PA-4)

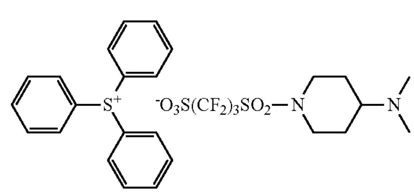

(PA-5)

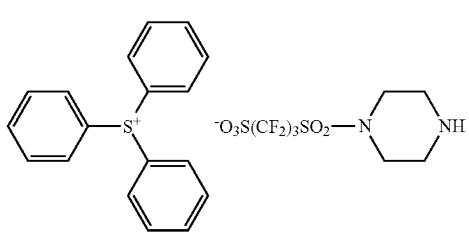

(PA-6)

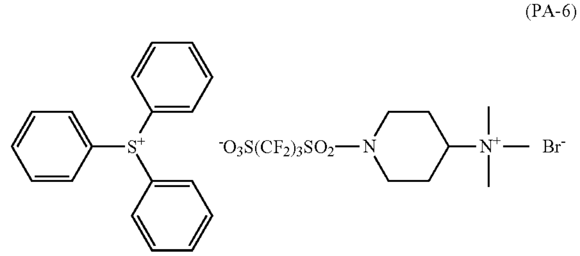

-continued
(PA-7)
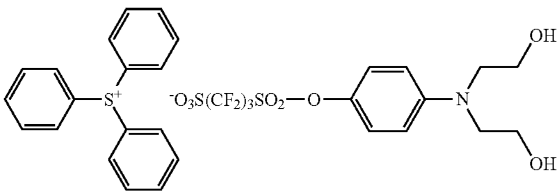
(PA-8)
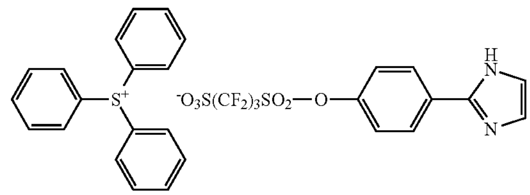
(PA-9)
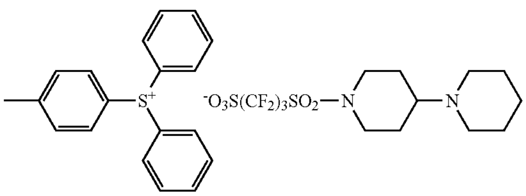
(PA-10)
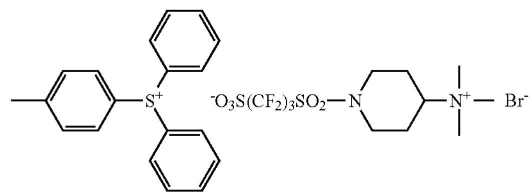
(PA-11)
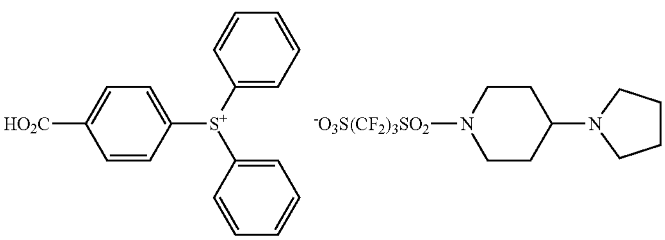
(PA-12)
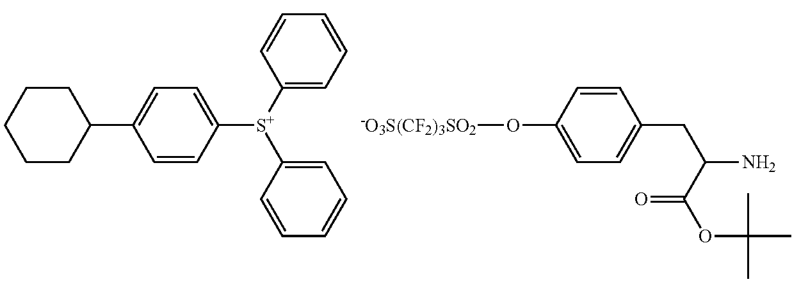
(PA-13)
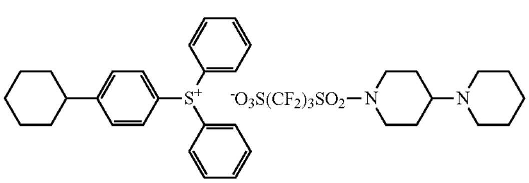
(PA-14)
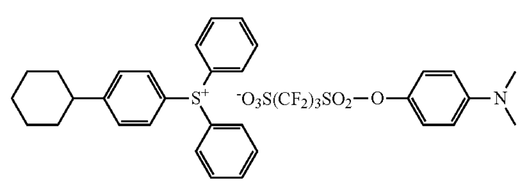
(PA-15)
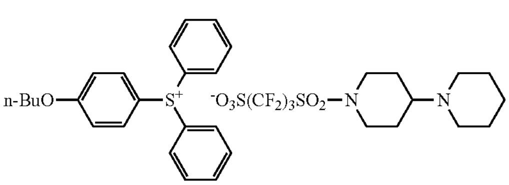
(PA-16)
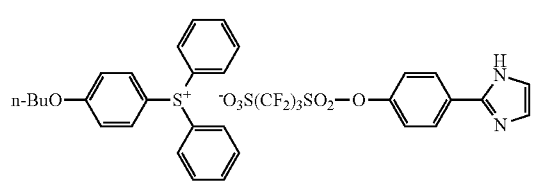
(PA-17)
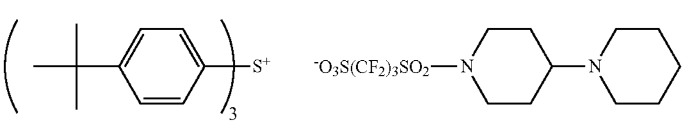

-continued
(PA-18)
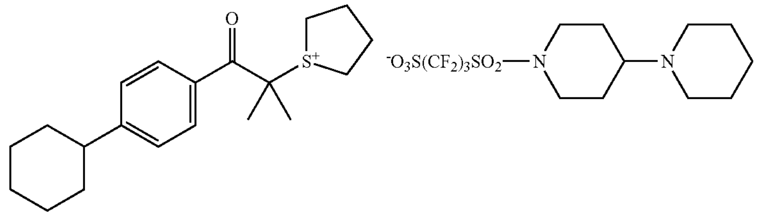
(PA-19)
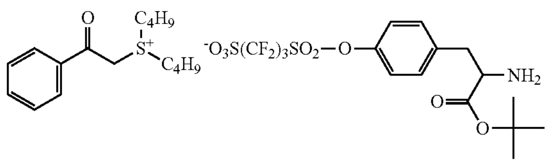
(PA-20)
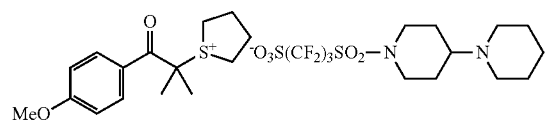
(PA-21)
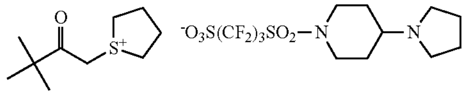
(PA-22)
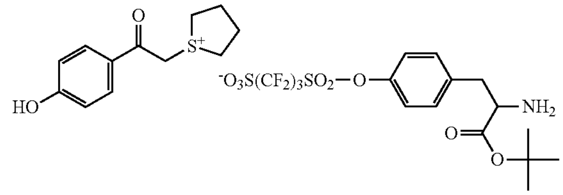
(PA-23)
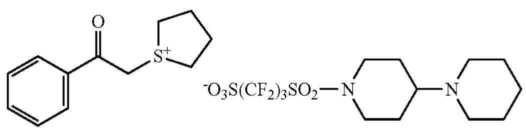
(PA-24)
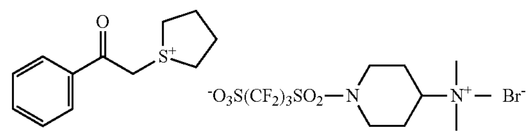
(PA-25)
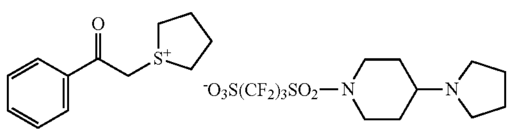
(PA-26)
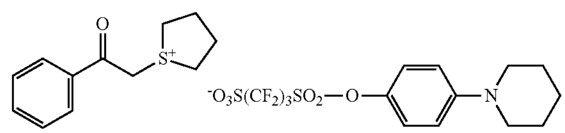
(PA-27)
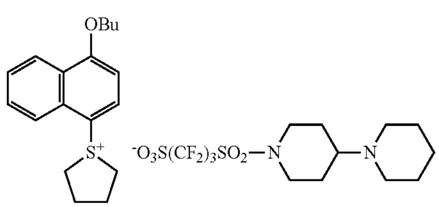
(PA-28)
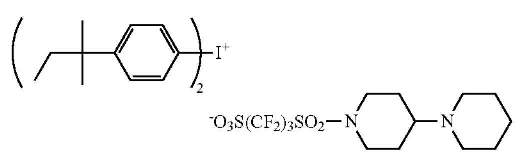
(PA-29)
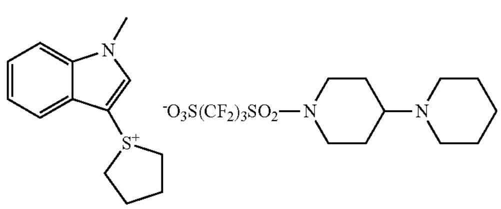
(PA-30)
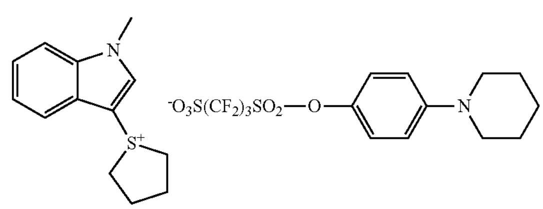
(PA-31)
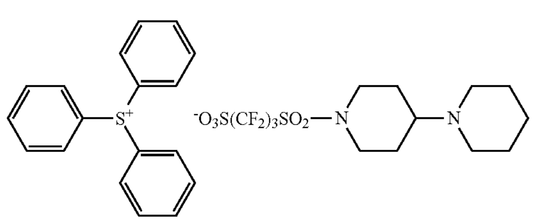
(PA-32)
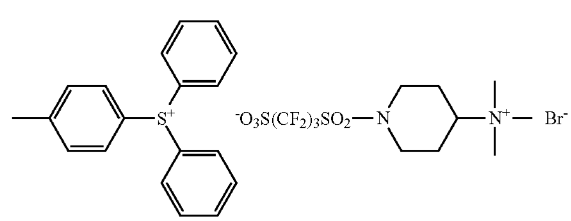

-continued
(PA-33)
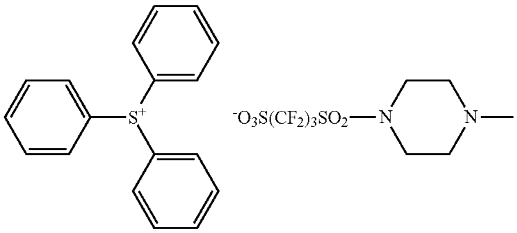
(PA-34)
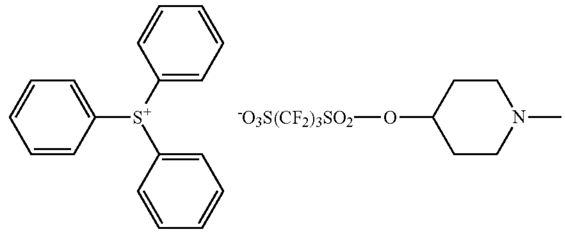
(PA-35)
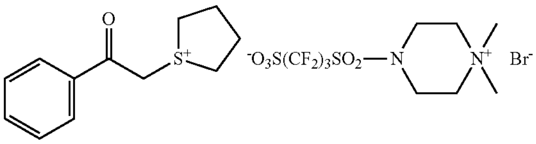
(PA-36)
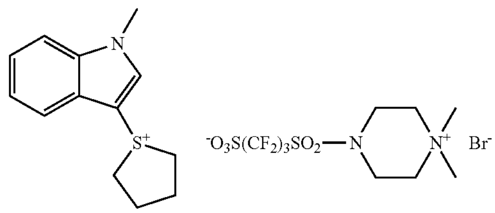
(PA-37)
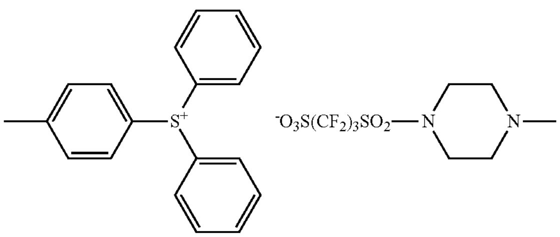
(PA-38)
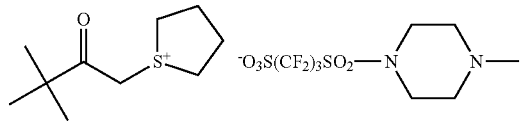
(PA-39)
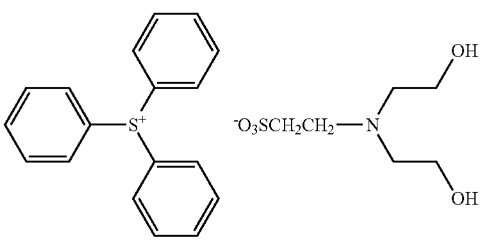
(PA-40)
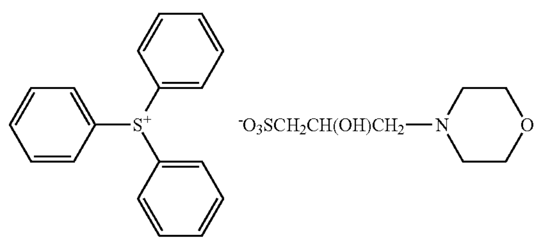
(PA-41)
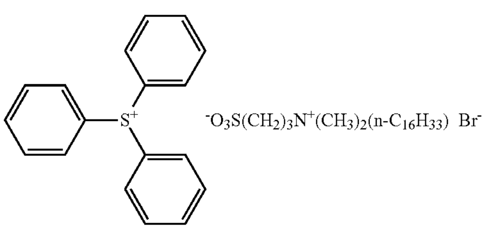
(PA-42)
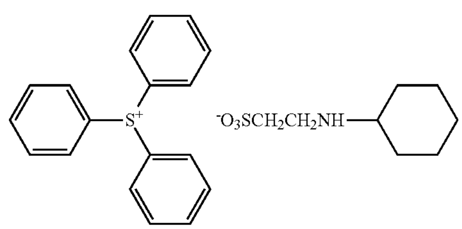
(PA-43)
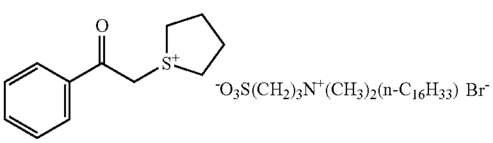
(PA-44)
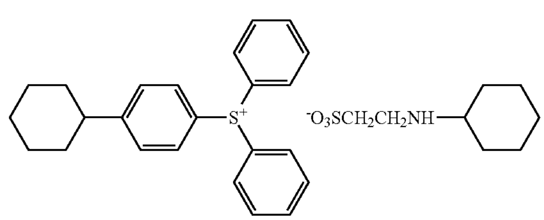

-continued
(PA-45)
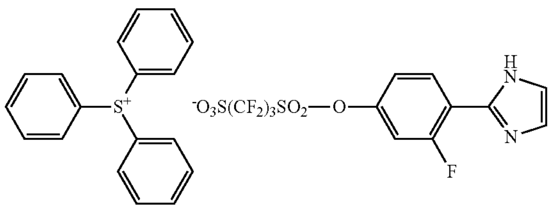
(PA-46)
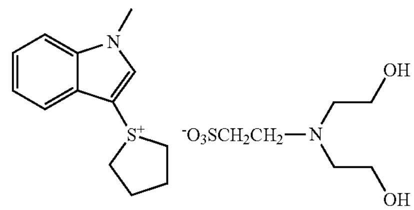
(PA-47)
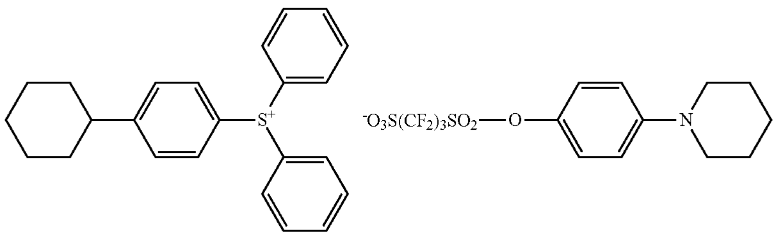
(PA-48)
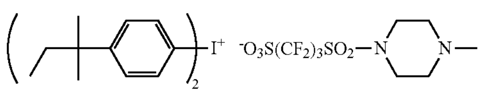
(PA-49)
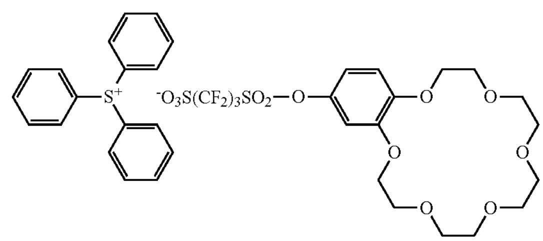
(PA-50)
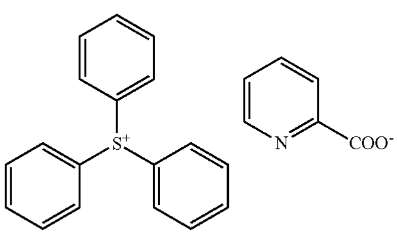
(PA-51)
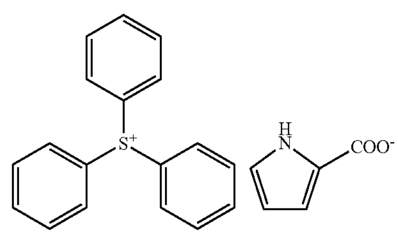
(PA-52)
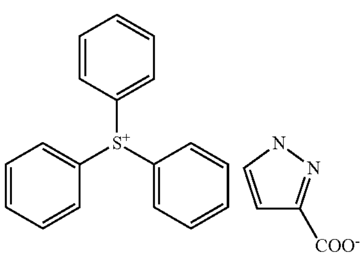
(PA-53)
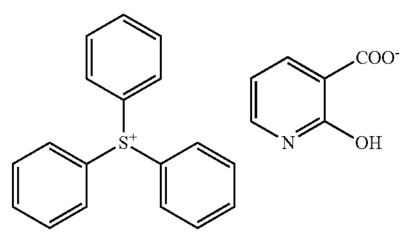
(PA-54)
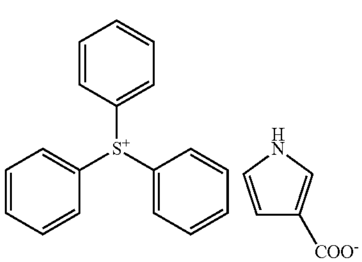
(PA-55)
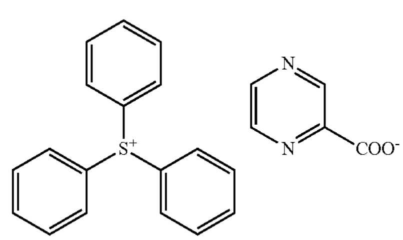

-continued
(PA-56)
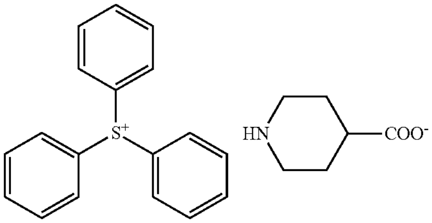
(PA-57)
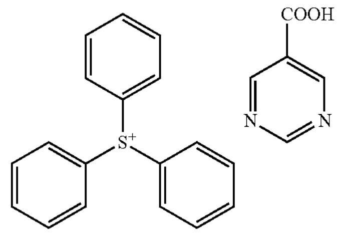
(PA-58)
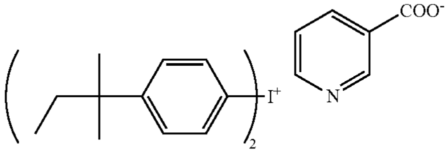
(PA-59)
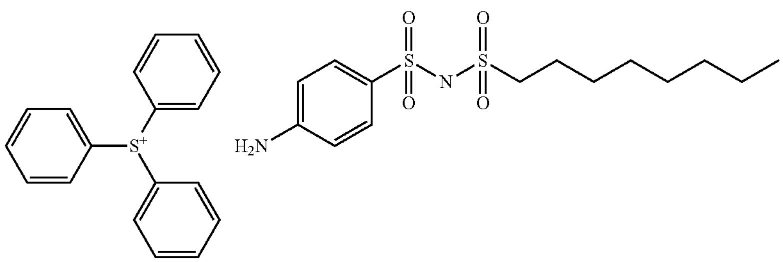
(PA-60)
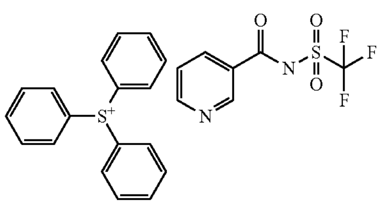
(PA-61)
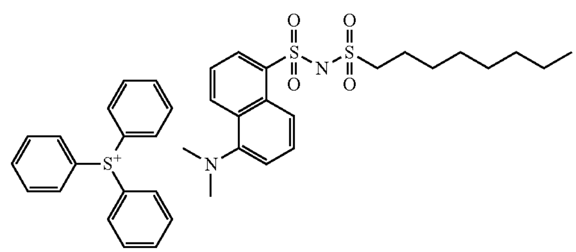
(PA-62)
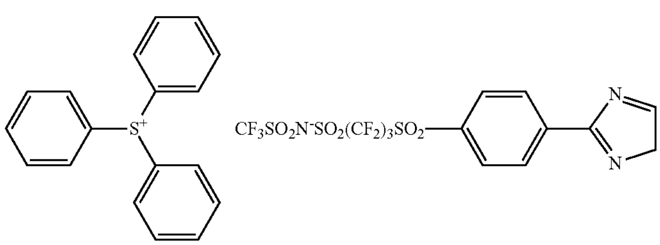
(PA-63)
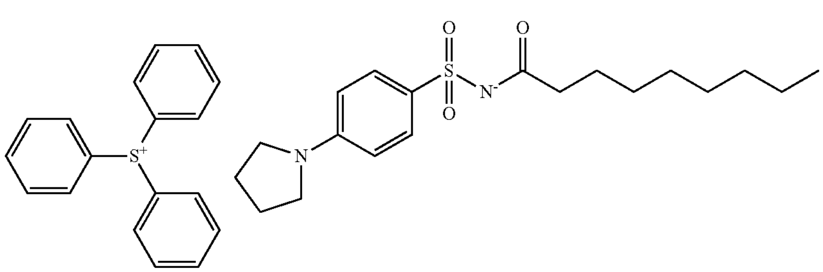

-continued
(PA-64)
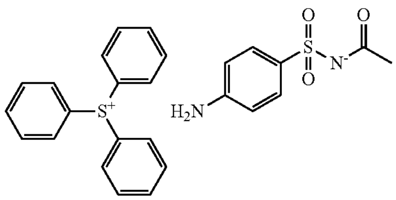
(PA-65)
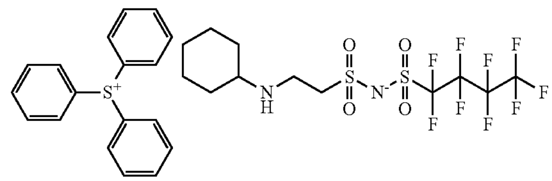
(PA-66)
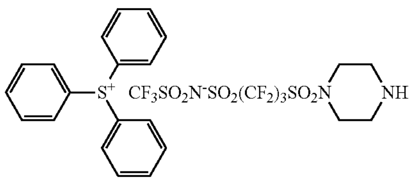
(PA-67)
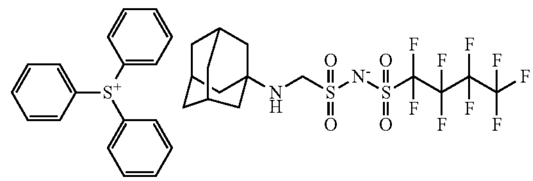
(PA-68)
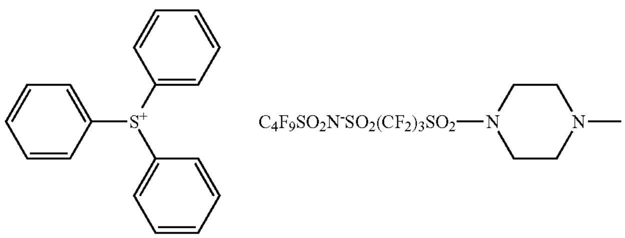
(PA-69)
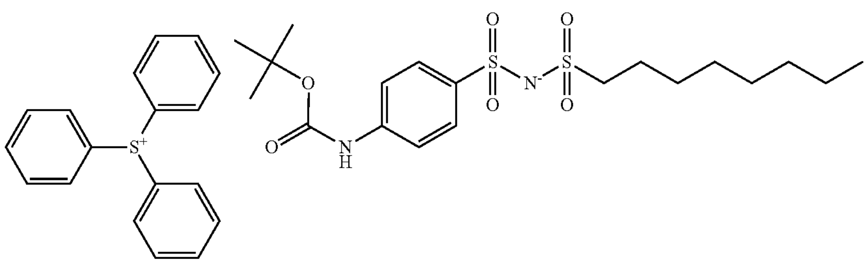
(PA-70)
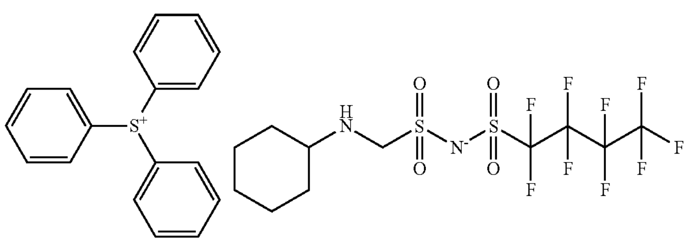
(PA-71)
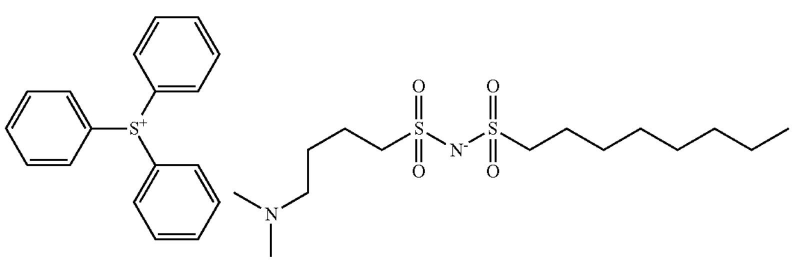
(PA-72)
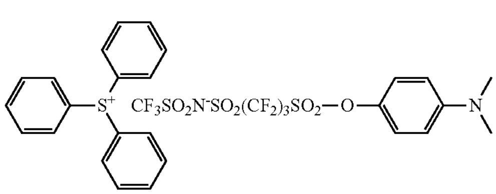
(PA-73)
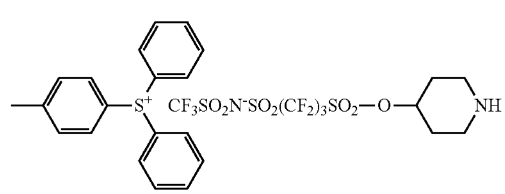

-continued
(PA-74)
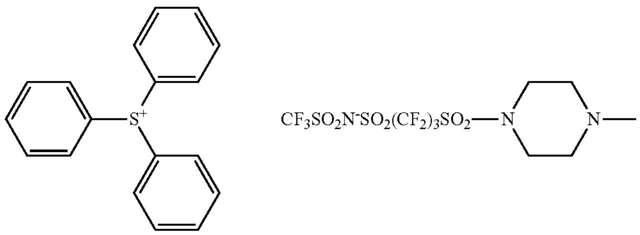
(PA-75)
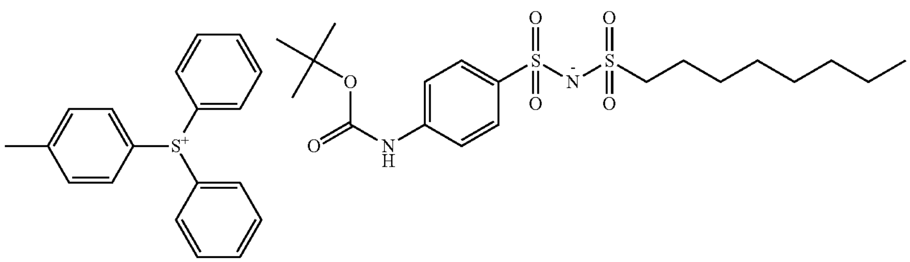
(PA-76)
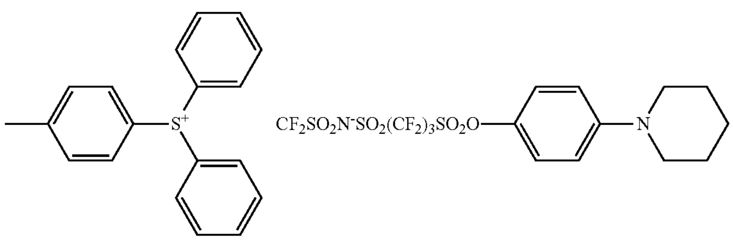
(PA-77)
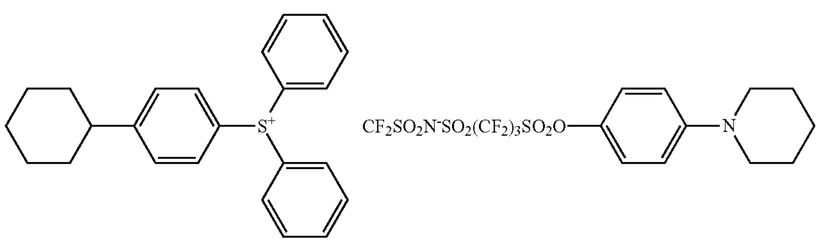
(PA-78)
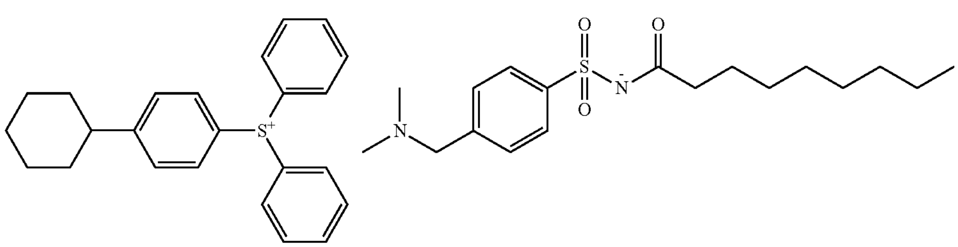
(PA-79)
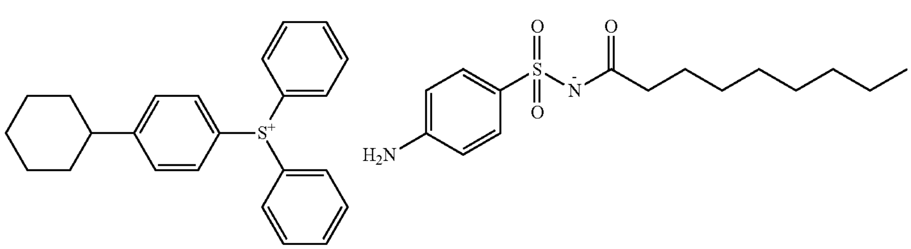

-continued
(PA-80)
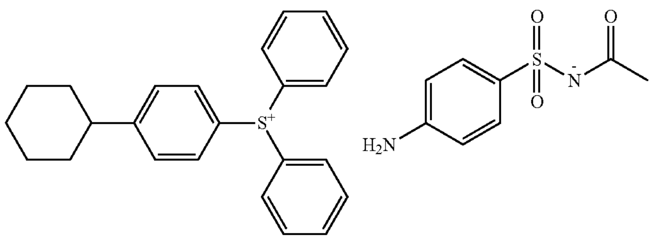
(PA-81)
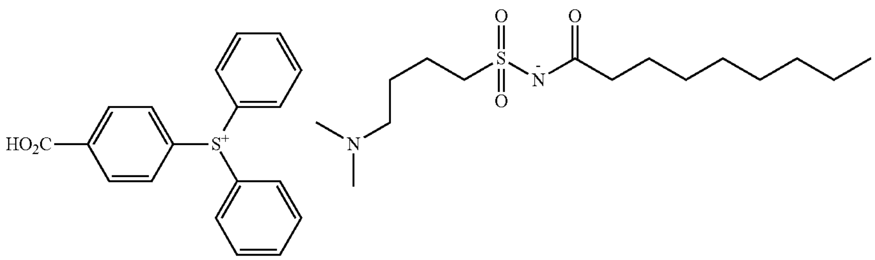
(PA-82)
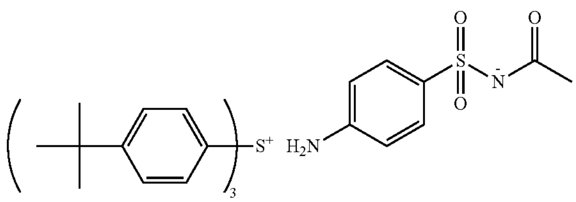
(PA-83)
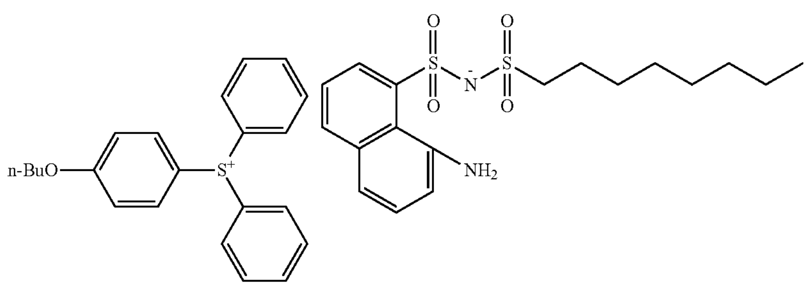
(PA-84)
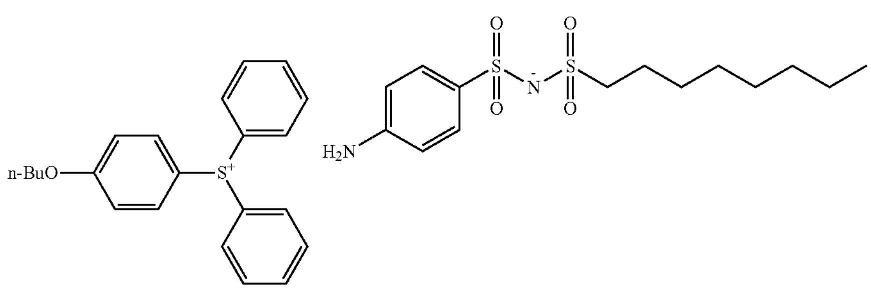
(PA-85)
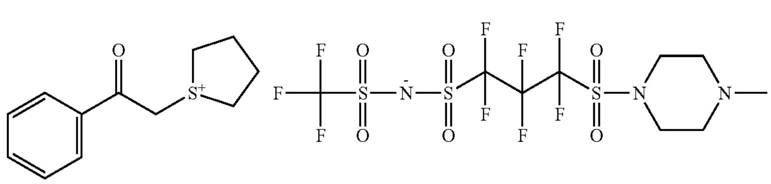

-continued
(PA-86)
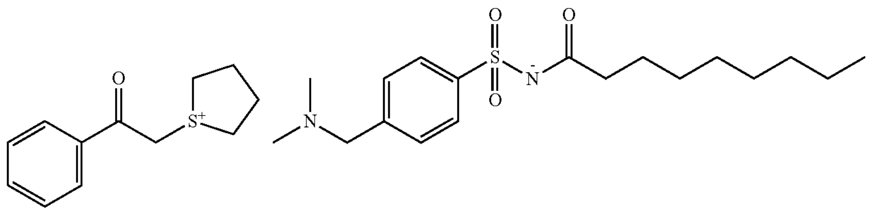
(PA-87)
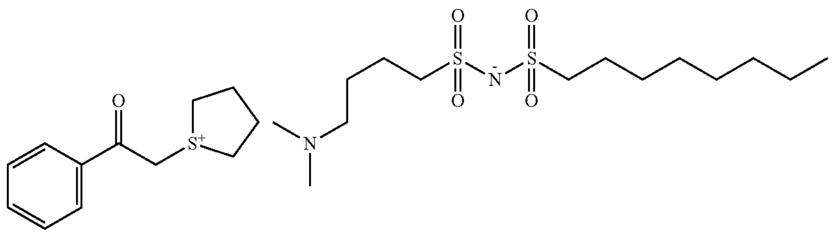
(PA-88)
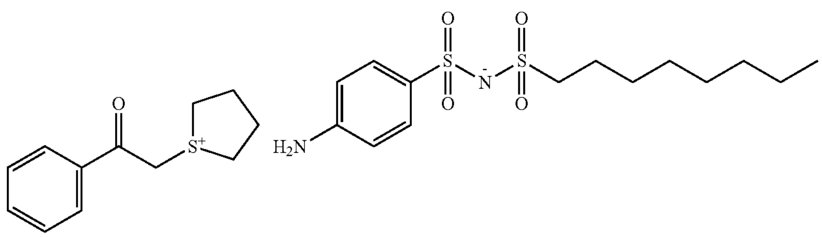
(PA-89)
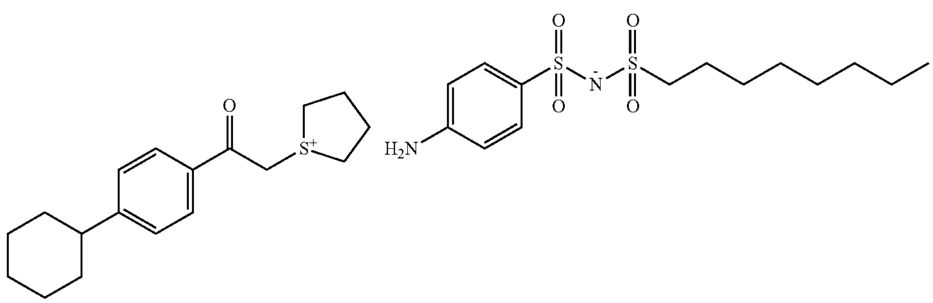
(PA-90)
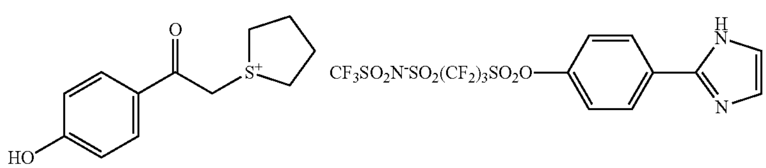
(PA-91)
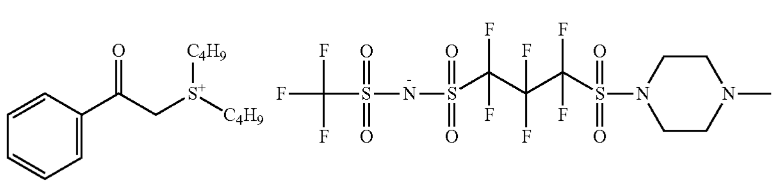
(PA-92)
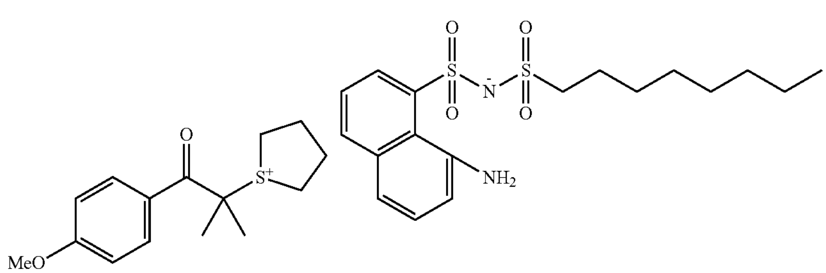

-continued
(PA-93)
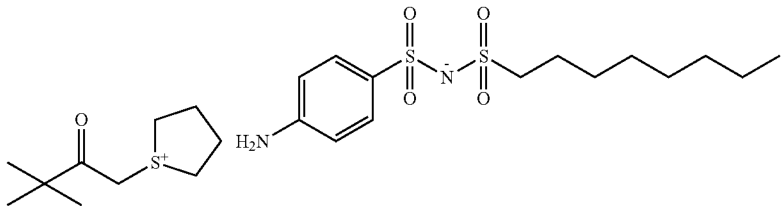
(PA-94)
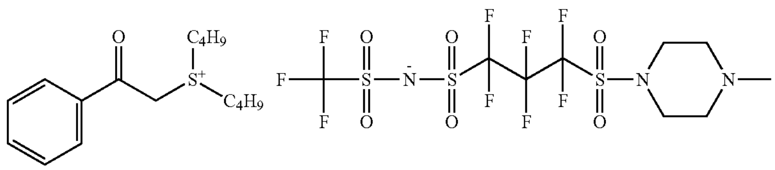
(PA-95)
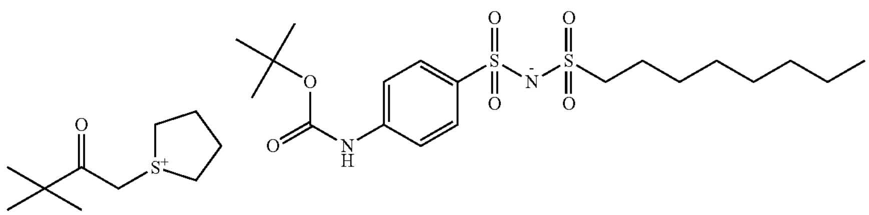
(PA-96)
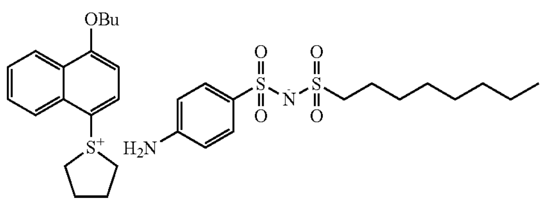
(PA-97)
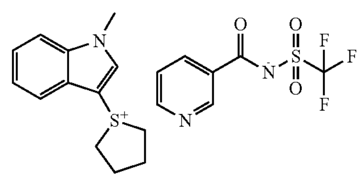
(PA-98)
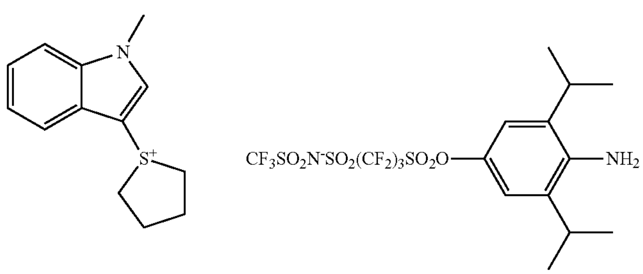
(PA-99)
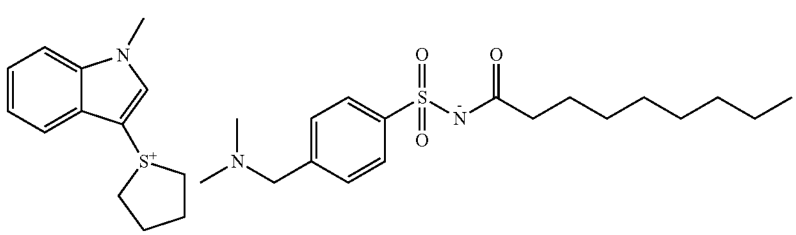
(PA-100)
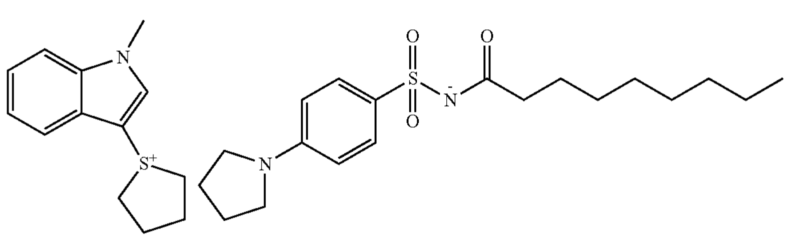

-continued (PA-101)

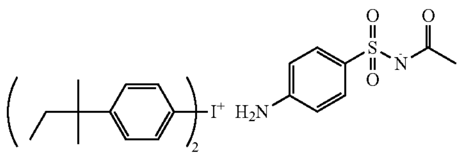

(PA-102)

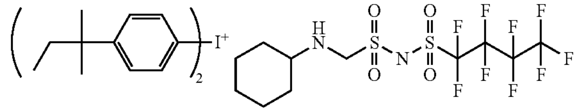

In the present invention, a compound (PA) other than the compound capable of generating a compound represented by formula (PA-1) can be also appropriately selected. For example, a compound that is an ionic compound and has a proton acceptor site in the cation moiety may be used. More specifically, examples of such a compound include a compound represented by the following formula (7):

$$\overset{X^-}{(R)_m\!-\!A^+\!-\!(R_N)_n} \quad (7)$$

In the formula, A represents a sulfur atom or an iodine atom.

m represents 1 or 2, and n represents 1 or 2, provided that when A is a sulfur atom, m+n=3 and when A is an iodine atom, m+n=2.

R represents an aryl group.

$R_N$ represents an aryl group substituted with a proton acceptor functional group.

$X^-$ represents a counter anion.

Specific examples of $X^-$ are the same as those of $X^-$ in formula (ZI).

Specific preferred examples of the aryl group of R and $R_N$ include a phenyl group.

Specific examples of the proton acceptor functional group contained in $R_N$ are the same as those of the proton acceptor functional group described above in formula (PA-1).

In the composition of the present invention, the blending ratio of the compound (PA) in the entire composition is preferably from 0.1 to 10 mass %, more preferably from 1 to 8 mass %, based on the total solid content.

(6) Guanidine Compound

The composition of the present invention may further contain a guanidine compound having a structure represented by the following formula:

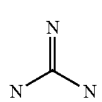

The guanidine compound exhibits strong basicity because thanks to three nitrogens, dispersion of positive electric charges of a conjugate acid is stabilized.

As for the basicity of the guanidine compound (A) for use in the present invention, the pKa of the conjugate acid is preferably 6.0 or more, more preferably from 7.0 to 20.0 in view of high neutralization reactivity with an acid and excellent roughness characteristics, and still more preferably from 8.0 to 16.0.

Such strong basicity makes it possible to suppress diffusion of an acid and contribute to formation of an excellent pattern profile.

The "pKa" as used herein is pKa in an aqueous solution and described, for example, in *Kagaku Binran* (*Chemical Handbook*) (*II*) (4th revised edition, compiled by The Chemical Society of Japan, Maruzen (1993)), and as this value is lower, the acid strength is higher. Specifically, the acid dissociation constant at 25° C. is measured using an aqueous infinite dilution solution, whereby pKa in an aqueous solution can be actually measured. Alternatively, a value based on Hammett's substituent constants and data base containing values known in publications can be determined by computation using the following software package 1. The pKa values referred to in the description of the present invention all are a value determined by computation using this software package.

Software Package 1: Advanced Chemistry Development (ACD/Labs) Software V8.14 for Solaris (1994-2007 ACD/Labs)

In the present invention, the log P is a logarithmic value of the n-octanol/water partition coefficient (P) and is an effective parameter capable of characterizing the hydrophilicity/hydrophobicity for compounds over a wide range. The partition coefficient is generally determined by computation but not from experiments and in the present invention, a value computed using CS ChemDraw Ultra Ver. 8.0 software package (Crippen's fragmentation method) is employed.

The log P of the guanidine compound (A) is preferably 10 or less. With this value or less, the compound can be uniformly incorporated in the resist film.

The log P of the guanidine compound (A) for use in the present invention is preferably from 2 to 10, more preferably from 3 to 8, still more preferably 4 to 8.

The guanidine compound (A) for use in the present invention preferably contains no nitrogen atom except for in the guanidine structure.

Specific examples of the guanidine compound are illustrated below, but the present invention is not limited thereto.

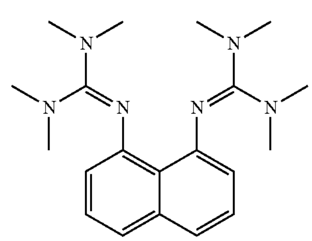

Log P: 4.29

-continued
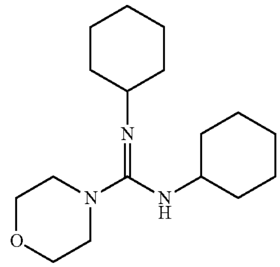
Log P: 3.32
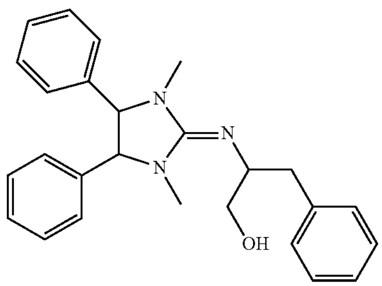
Log P: 5.66
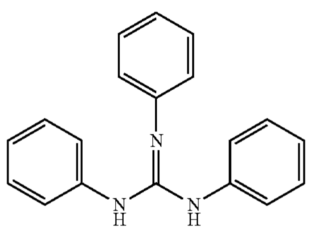
Log P: 5.24
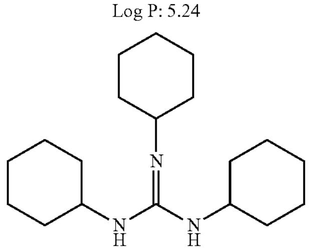
Log P: 4.89
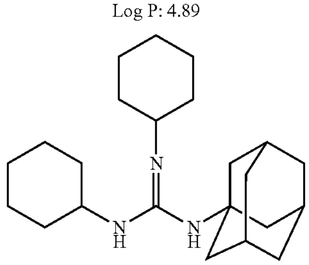
Log P:5.17
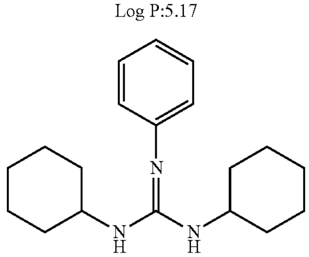
Log P: 5
-continued
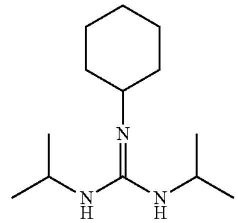
Log P: 3.1
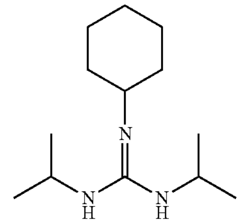
Log P: 3.1
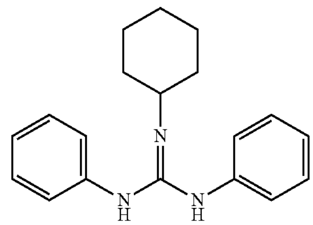
Log P: 5.12
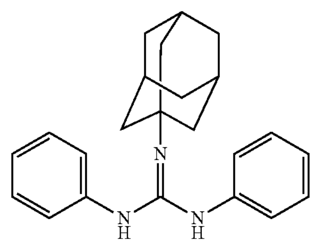
Log P: 5.4
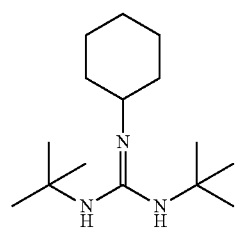
Log P: 3.54
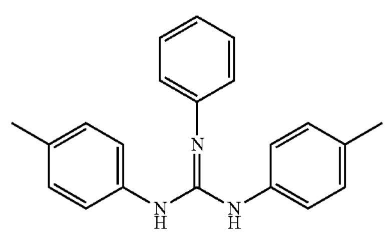
Log P: 6.21
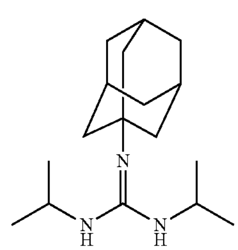
Log P: 3.38

-continued
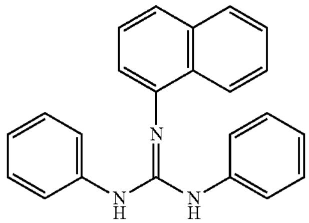
Log P: 6.23
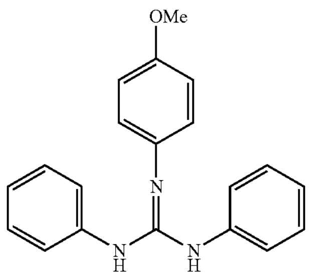
Log P: 5.11
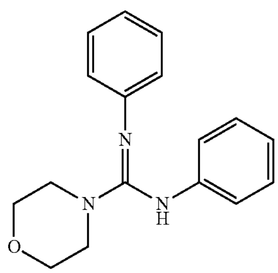
Log P: 3.55
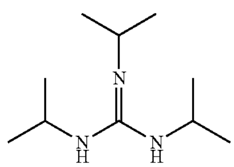
Log P: 2.21
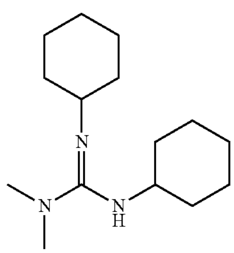
Log P: 3.72
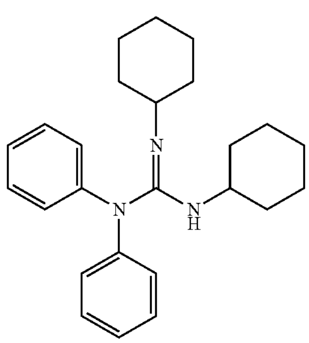
Log P: 7.21
-continued
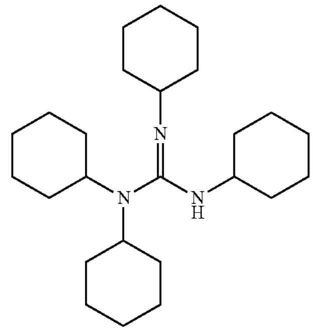
Log P: 6.81
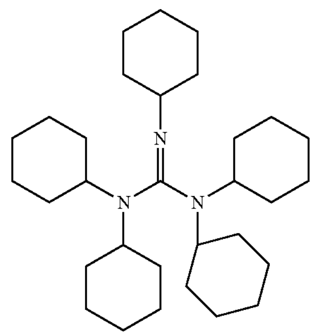
Log P: 8.74
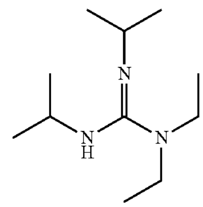
Log P: 2.61
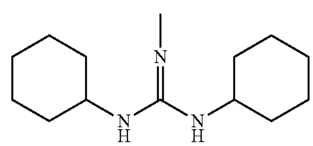
Log P: 3.34
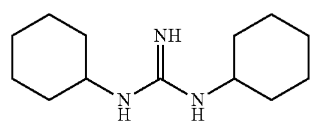
Log P: 3.1
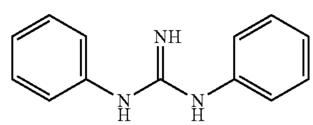
Log P: 3.34
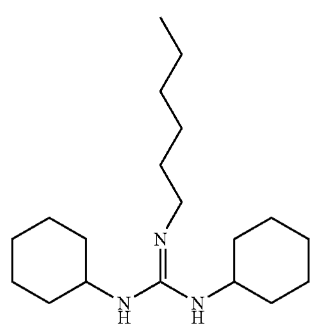
Log P: 5.42

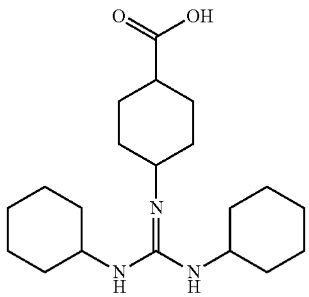
Log P: 4.05
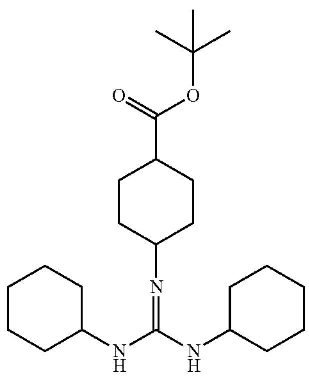
Log P: 5.19
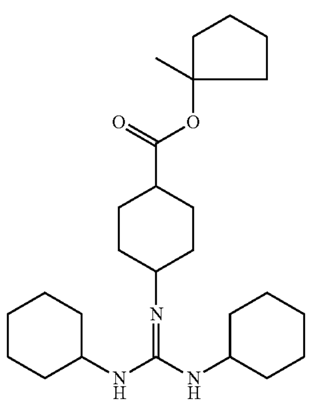
Log P: 5.66
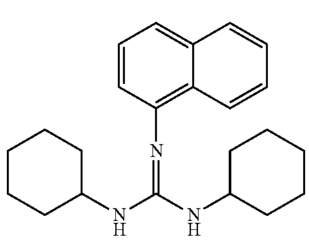
Log P: 6
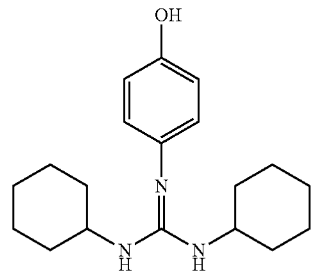
Log P: 4.61
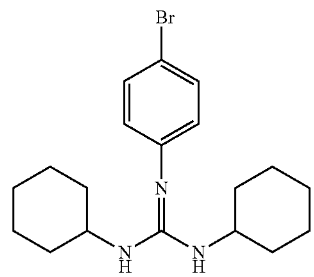
Log P: 5.83
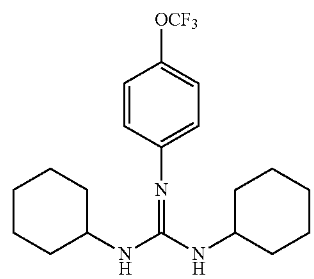
Log P: 6.53
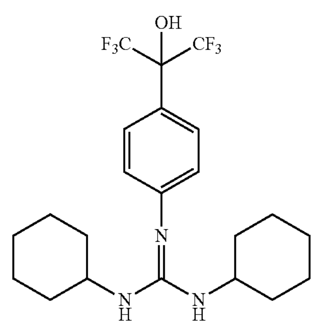
Log P: 6.25
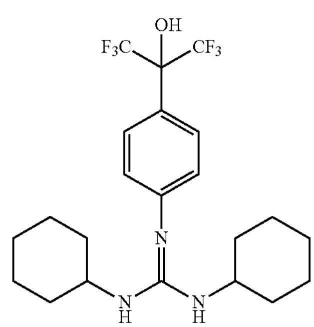
Log P: 6.25

-continued
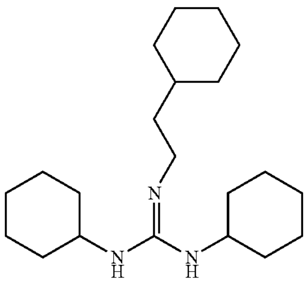
Log P: 5.66
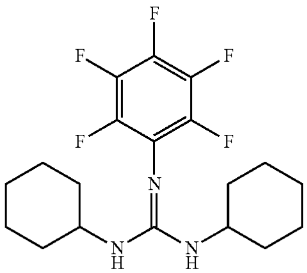
Log P: 5.79
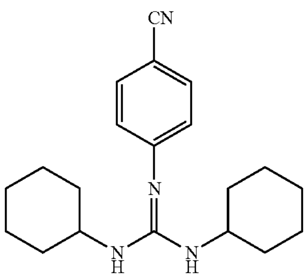
Log P: 5.04
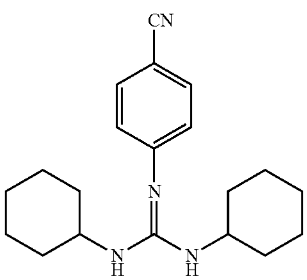
Log P: 5.04
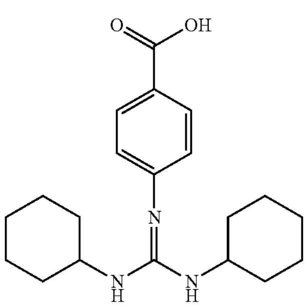
Log P: 4.56
-continued
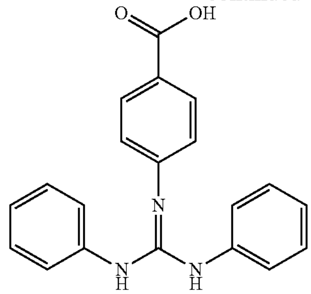
Log P: 4.79
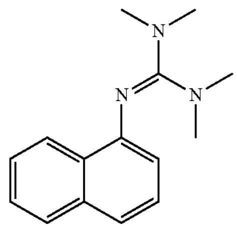
Log P: 3.66
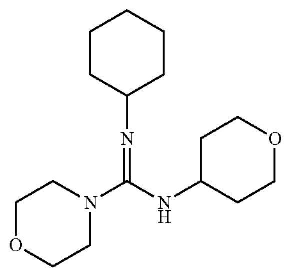
Log P: 1.56
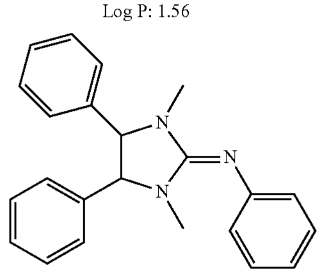
Log P: 5.84
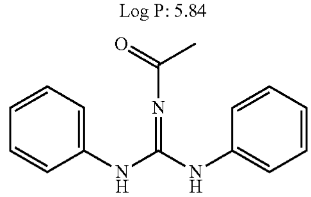
Log P: 3.28
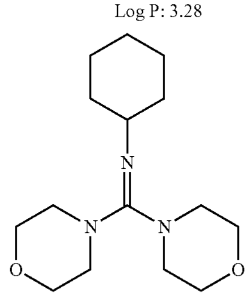
Log P: 1.75

-continued
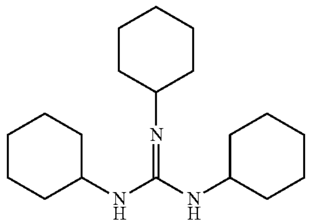
Log P: 4.89
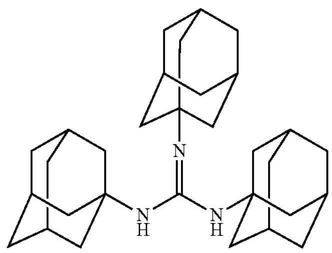
Log P: 5.73
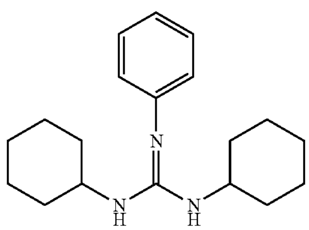
Log P: 5
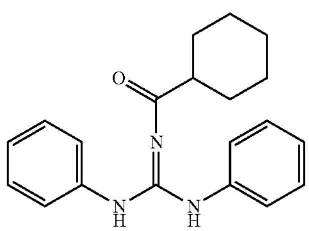
Log P: 5.26
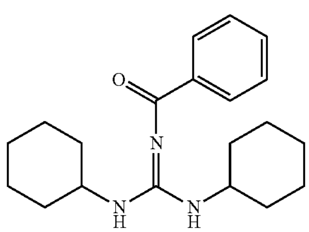
Log P: 4.95
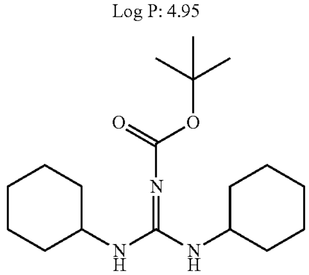
Log P: 4.51
-continued
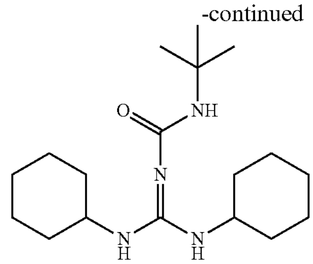
Log P: 3.83
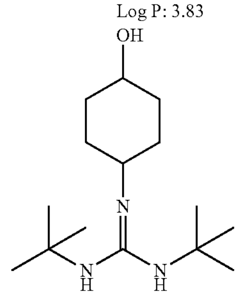
Log P: 2.31
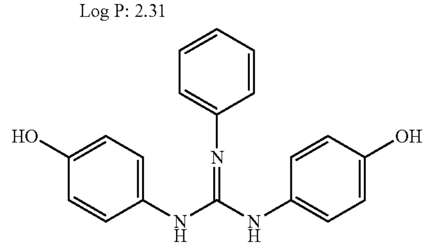
Log P: 4.46
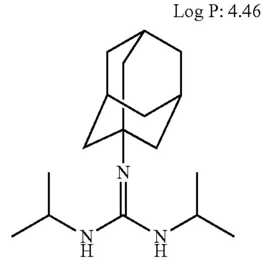
Log P: 3.38
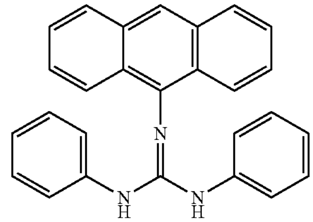
Log P: 7.23
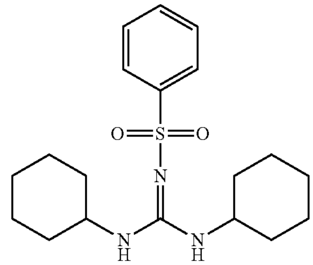
Log P: 4.55

-continued
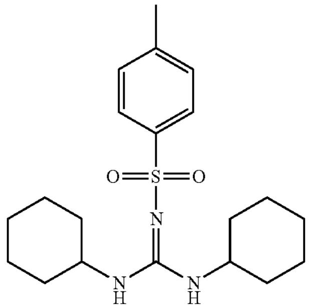
Log P: 5.04
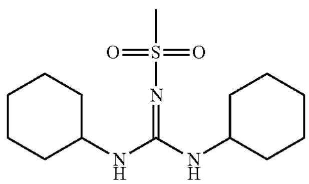
Log P: 2.36
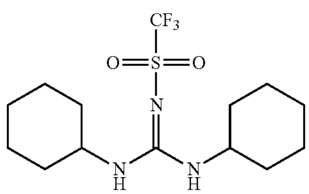
Log P: 4.54
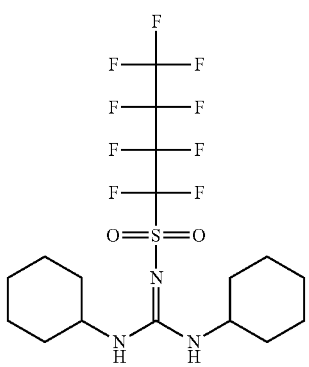
Log P: 6.08
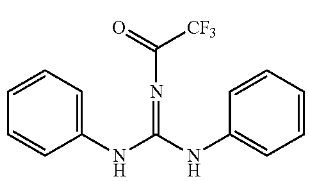
Log P: 4.43
-continued
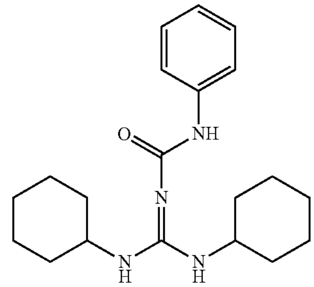
Log P: 4.62
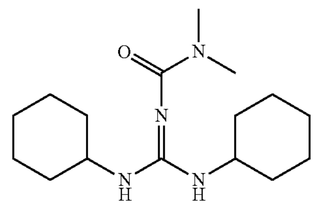
Log P: 3.19
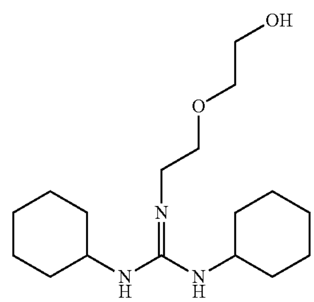
Log P: 2.67
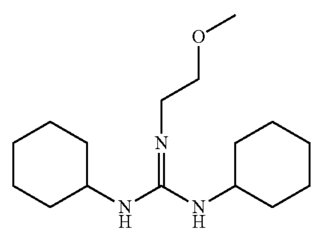
Log P: 3.18
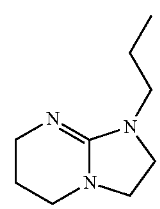
Log P: 1.44
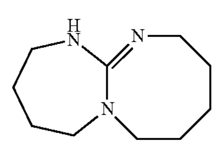
Log P: 1.67
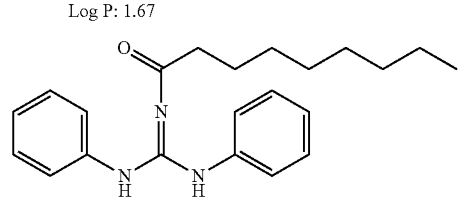
Log P: 6.44

-continued

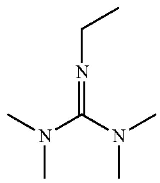

Log P: 1.34

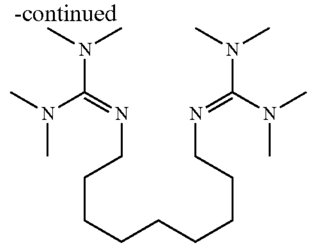

Log P: 4.4

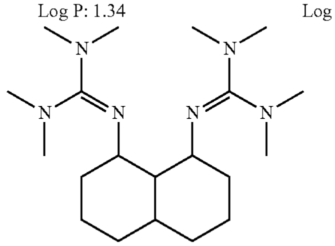

Log P: 3.7

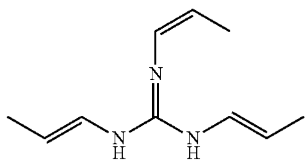

Log P: 3.38

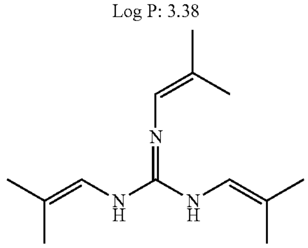

Log P: 3.91

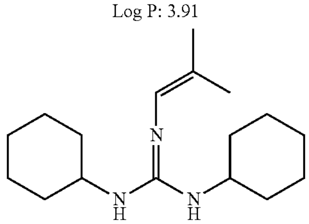

Log P: 4.47

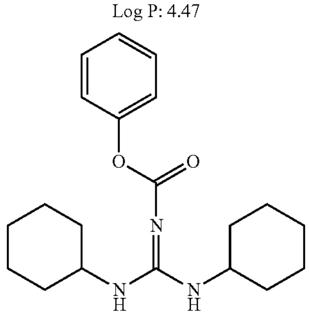

Log P: 5.3

[7] Low Molecular Compound Having a Nitrogen Atom and Having a Group Capable of Leaving by the Action of an Acid The composition of the present invention may contain a low molecular compound having a nitrogen atom and having a group capable of leaving by the action of an acid (hereinafter, sometimes referred to as "low molecular compound (D)" or "compound (D)"). The low molecular compound (D) preferably exhibits basicity after the group capable of leaving by the action of an acid is eliminated.

The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of (D) the low molecular compound having a group capable of leaving by the action of an acid is preferably from 100 to 1,000, more preferably from 100 to 700, still more preferably from 100 to 500.

The compound (D) is preferably an amine derivative having on the nitrogen atom a group capable of leaving by the action of an acid.

The compound (D) may have a protective group-containing carbamate group on the nitrogen atom. The protective group constituting the carbamate group can be represented by the following formula (d-1):

(d-1)

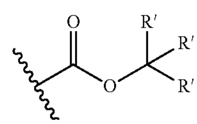

In formula (d-1), each R' independently represents a hydrogen atom, a linear or branched alkyl group, a cycloalkyl group, an aryl group, an aralkyl group or an alkoxyalkyl group. R's may combine with each other to form a ring.

R' is preferably a linear or branched alkyl group, a cycloalkyl group or an aryl group, more preferably a linear or branched alkyl group or a cycloalkyl group.

Specific structures of the protective group are illustrated below.

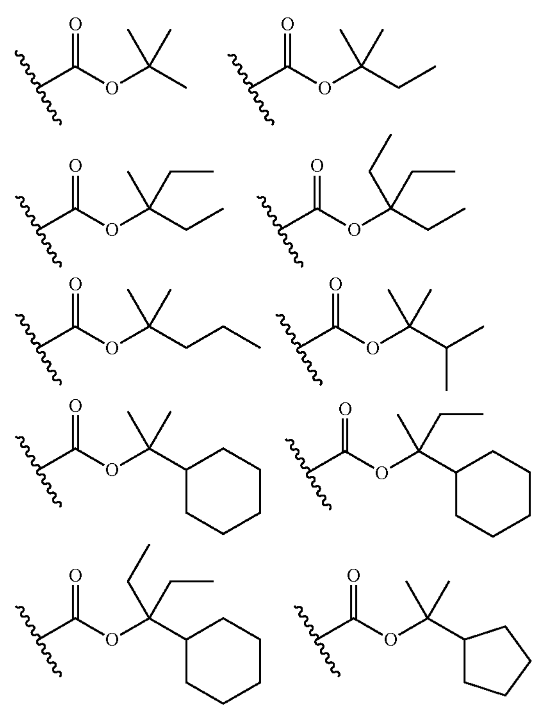

-continued
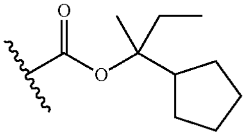
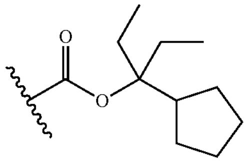
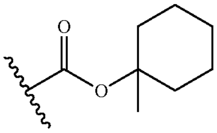
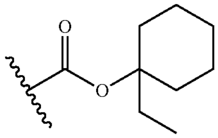
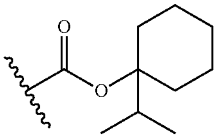
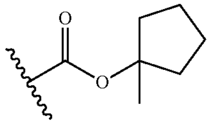
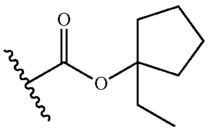
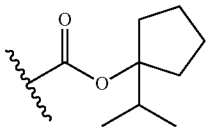
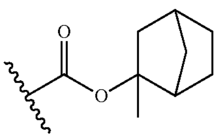
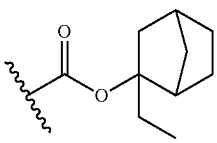
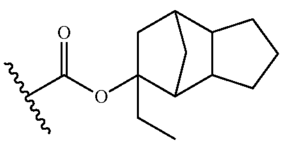
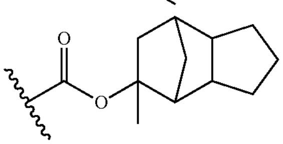
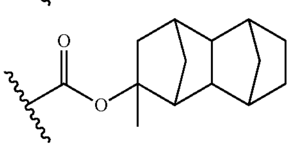
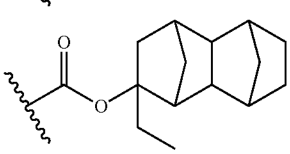
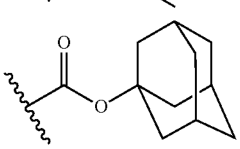
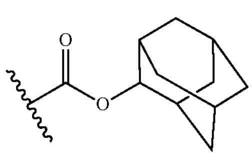
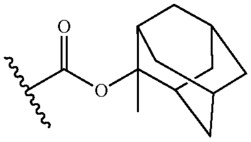
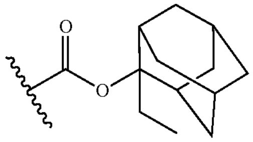
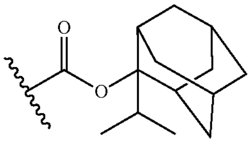
-continued
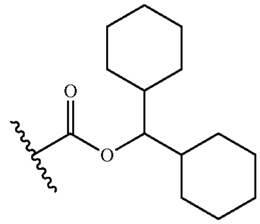
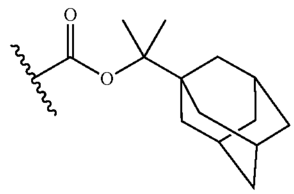
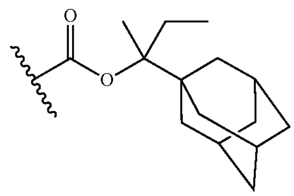
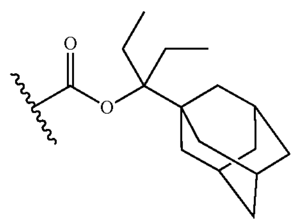
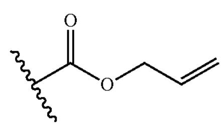
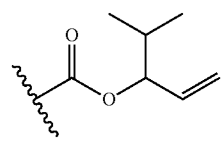
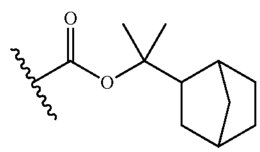
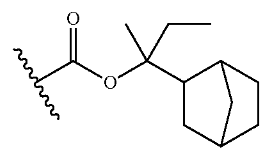
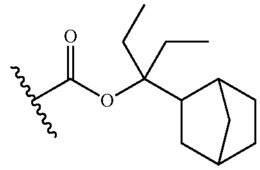
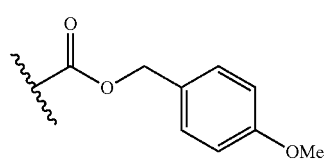
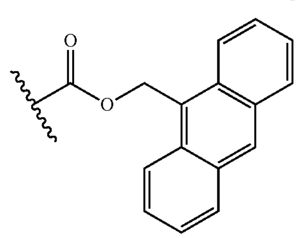

-continued

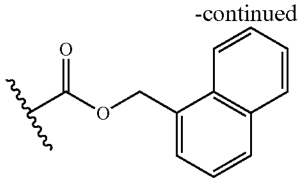

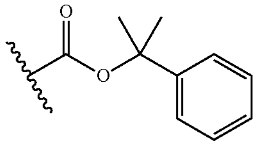

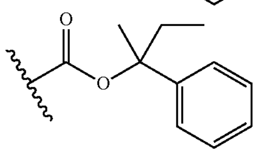

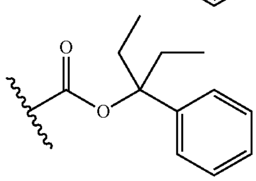

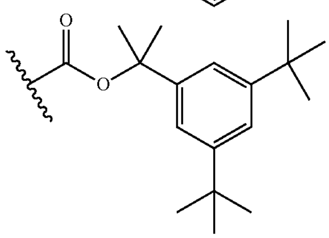

The compound (D) may be also composed by arbitrarily combining the later-described basic compound and the structure represented by formula (d-1).

The compound (D) is more preferably a compound having a structure represented by the following formula (A).

Incidentally, the compound (D) may be a compound corresponding to the above-described basic compound as long as it is a low molecular compound having a group capable of leaving by the action of an acid.

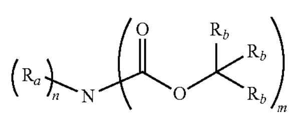

(A)

In formula (A), Ra represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group, an aralkyl group or an alkoxyalkyl group, provided that in —C(Rb)(Rb)(Rb), when one or more Rb's are a hydrogen atom, at least one of the remaining Rb's is a cyclopropyl group, a 1-alkoxyalkyl group or an aryl group.

At least two Rb's may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (A), the alkyl group, cycloalkyl group, aryl group and aralkyl group of Ra and Rb may be substituted with a functional group such as hydroxyl group, cyano group, amino group, pyrrolidino group, piperidino group, morpholino group and oxo group, an alkoxy group, or a halogen atom. The same applies to the alkoxyalkyl group of Rb.

Examples of the alkyl group, cycloalkyl group, aryl group and aralkyl group (these alkyl group, cycloalkyl group, aryl group and aralkyl group may be substituted with the above-described functional group, an alkoxy group or a halogen atom) of Ra and/or Rb include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived groups, cycloalkane-derived groups, aromatic compound-derived groups, heterocyclic compound-derived groups, and functional groups such as hydroxyl group, cyano group, amino group, pyrrolidino group, piperidino group, morpholino group and oxo group.
Specific examples of the low molecular compound particularly preferred in the present invention are illustrated below, but the present invention is not limited thereto.
(D-1)
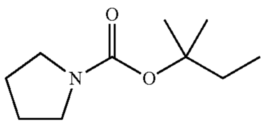
(D-2)
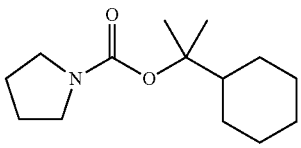
(D-3)
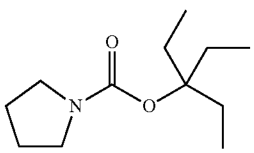
(D-4)
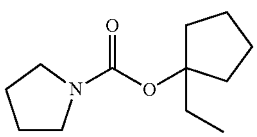
(D-5)
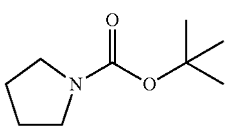
(D-6)
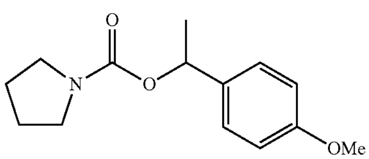
(D-7)
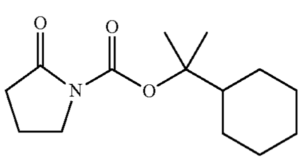
(D-8)
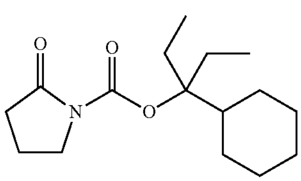
(D-9)
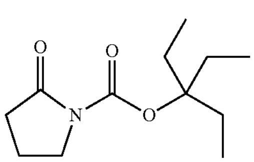
-continued
(D-10)
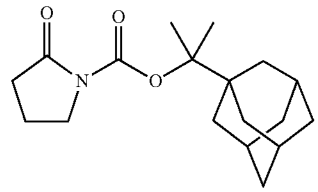
(D-11)
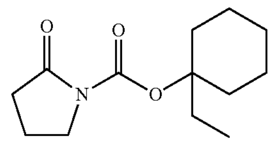
(D-12)
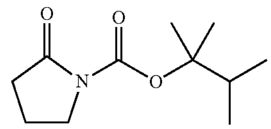
(D-13)
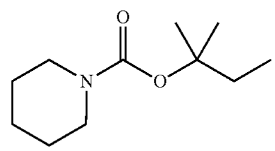
(D-14)
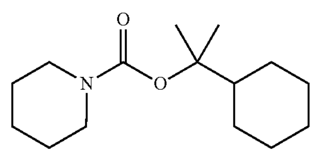
(D-15)
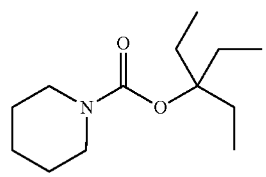
(D-16)
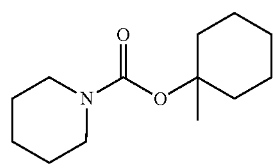
(D-17)
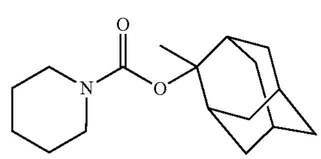
(D-18)
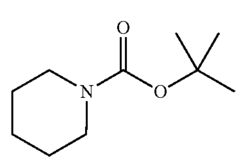
(D-19)
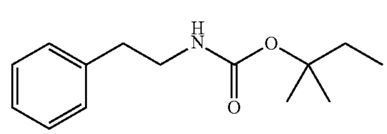

-continued
(D-20)
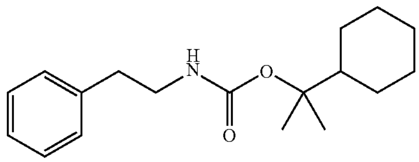
(D-21)
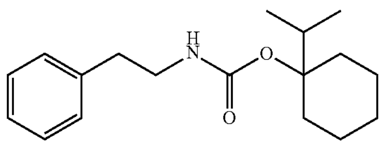
(D-22)
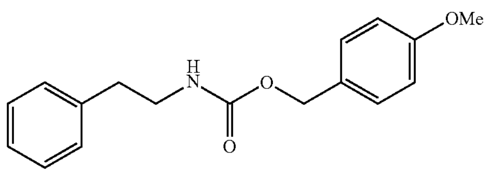
(D-23)
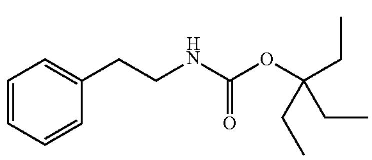
(D-24)
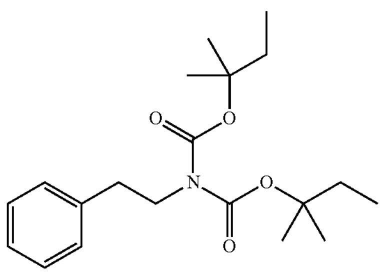
(D-25)
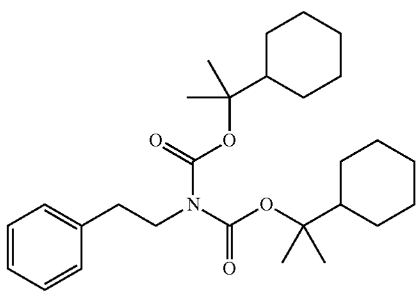
(D-26)
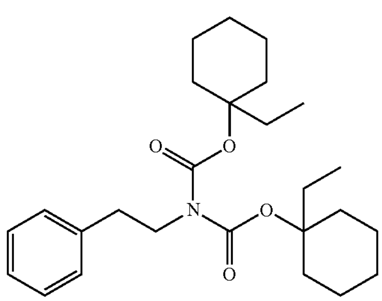
-continued
(D-27)
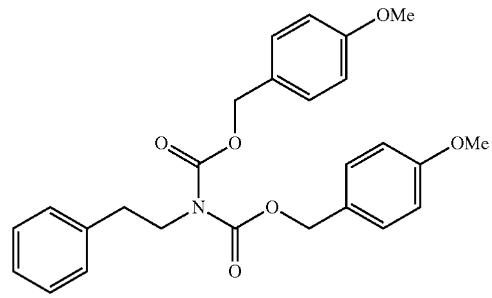
(D-28)
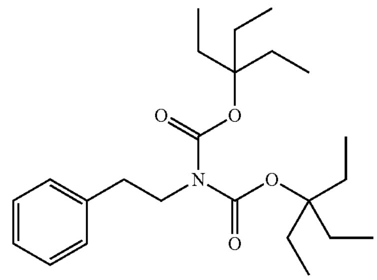
(D-29)
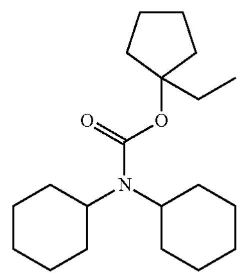
(D-30)
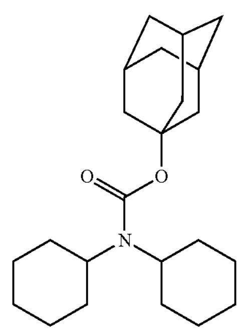
(D-31)
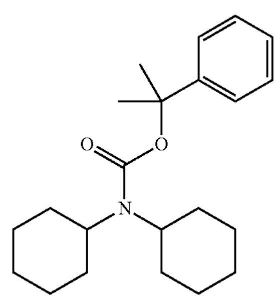

-continued
(D-32)
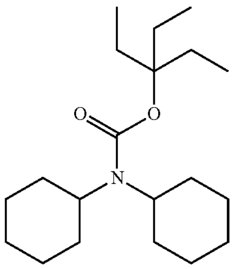
(D-33)
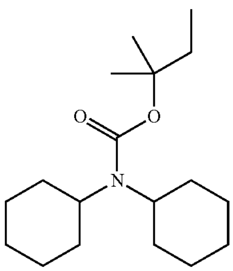
(D-34)
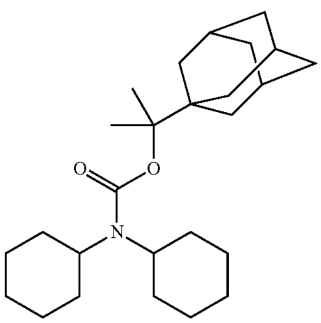
(D-35)
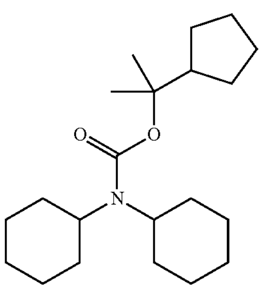
(D-36)
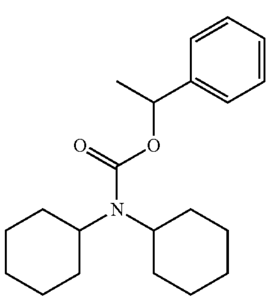
(D-37)
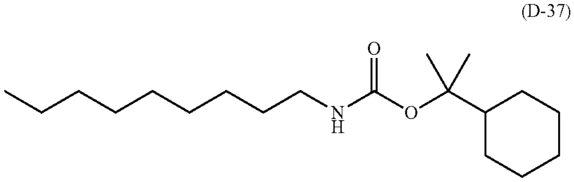
-continued
(D-38)
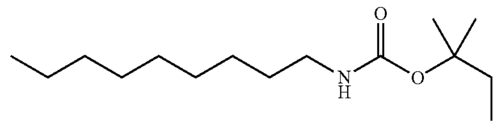
(D-39)
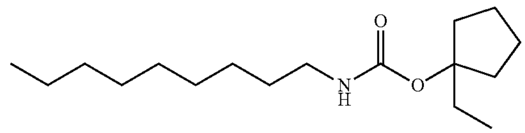
(D-40)
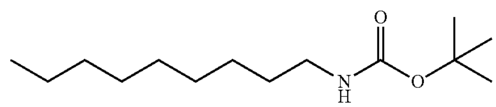
(D-41)
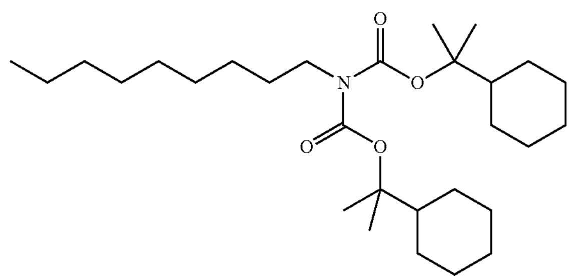
(D-42)
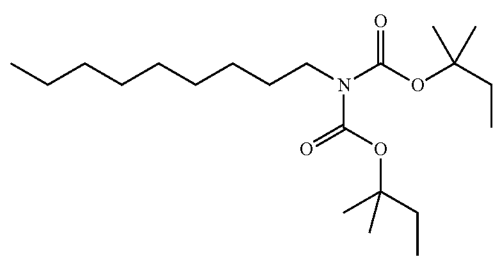
(D-43)
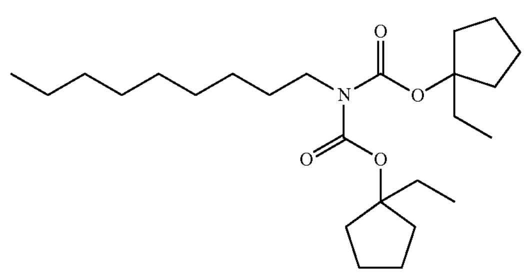
(D-44)
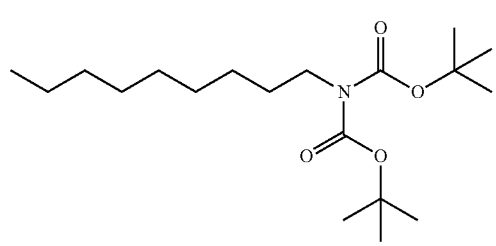

-continued
(D-45)
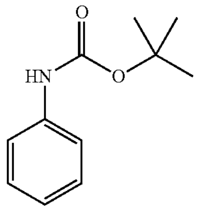
(D-46)
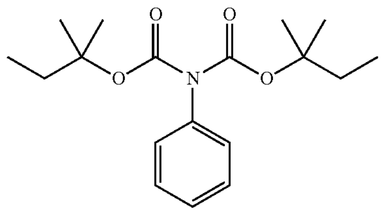
(D-47)
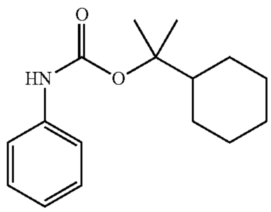
(D-48)
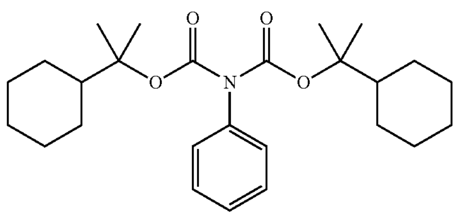
(D-49)
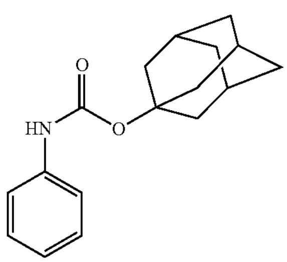
(D-50)
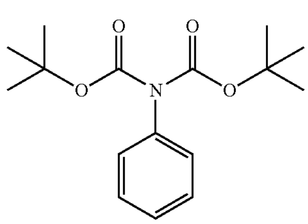
(D-51)
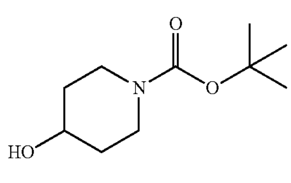
-continued
(D-52)
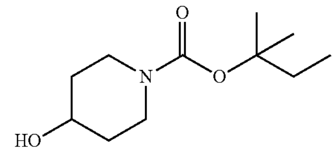
(D-53)
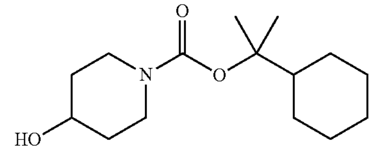
(D-54)
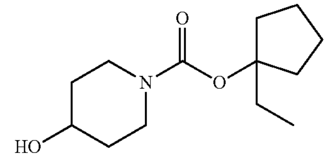
(D-55)
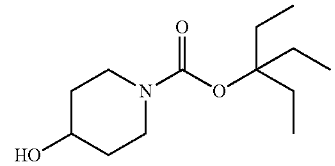
(D-56)
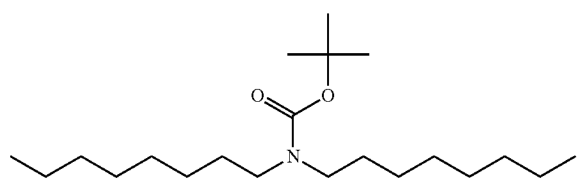
(D-57)
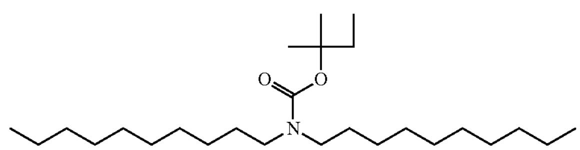
(D-58)
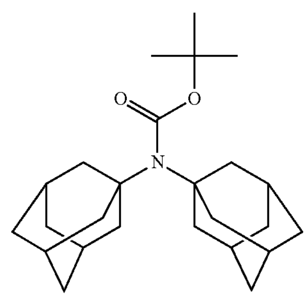
(D-59)
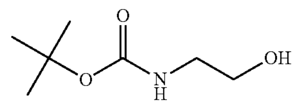
(D-60)
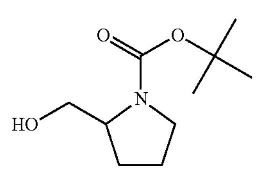

-continued (D-61)

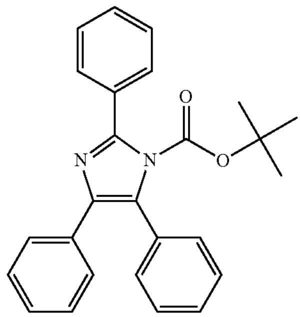

(D-62)

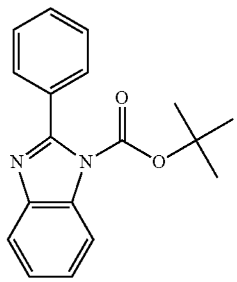

(D-63)

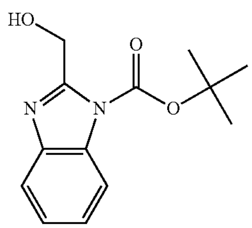

(D-64)

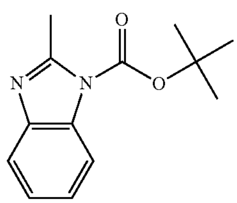

(D-65)

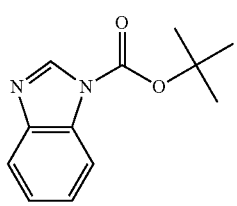

The compound represented by formula (A) may be synthesized by referring to, for example, JP-A-2007-298569 and JP-A-2009-199021.

In the present invention, as for the low molecular weight compound (D), one kind of a compound may be used alone, or two or more kinds of compounds may be mixed and used.

The composition of the present invention may or may not contain the low molecular compound (D), but in the case of containing the compound (D), the content thereof is usually from 0.001 to 20 mass %, preferably from 0.001 to 10 mass %, more preferably from 0.01 to 5 mass %, based on the total solid content of the composition combined with the basic compound.

In the case where the composition of the present invention contains an acid generator, the ratio between the acid generator and the compound (D) used in the composition is preferably acid generator/[compound (D)+basic compound] (by mol)=from 2.5 to 300. That is, the molar ratio is preferably 2.5 or more in view of sensitivity and resolution and preferably 300 or less from the standpoint of suppressing the reduction in resolution due to thickening of the resist pattern over time after exposure until heat treatment. The acid generator/[compound (D)+basic compound] (by mol) is more preferably from 5.0 to 200, still more preferably from 7.0 to 150.

(8) Ionic Compound Represented by Formula (2)

The actinic ray-sensitive or radiation-sensitive resin composition of the present invention contains an ionic compound represented by the following formula (2):

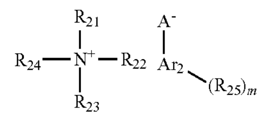

(2)

Each of $R_{21}$, $R_{22}$, $R_{23}$ and $R_{24}$ independently represents a primary or secondary alkyl group or an aryl group.

$A^-$ represents $COO^-$ or $O^-$.

$Ar_2$ represents an (m+1)-valent aromatic ring group not having a substituent other than $A^-$ and $R_{25}$.

$R_{25}$ represents an alkyl group, a cycloalkyl group, a thioalkyl group, an aryl group, a halogen atom, a cyano group, a nitro group, an alkoxy group, a thioalkoxy group, an alkoxycarbonyl group or an alkylaminocarbonyl group. When m is 2 or more, each $R_{25}$ may be the same as or different from every other $R_{25}$, and the plurality of $R_{25}$s may combine with each other to form a ring.

m represents an integer of 0 or more.

The primary or secondary alkyl group of $R_{21}$, $R_{22}$, $R_{23}$ and $R_{24}$ includes a linear or branched alkyl group having a carbon number of 20 or less, such as methyl group, ethyl group, propyl group, isopropyl group, n-butyl group, sec-butyl group, pentyl group, cyclopentyl group, hexyl group, cyclohexyl group, 2-ethylhexyl group, octyl group and dodecyl group, and is preferably a linear alkyl group having a carbon number of 1 to 8, more preferably a methyl group, an ethyl group, a propyl group or an n-butyl group. Because, it is considered that as the steric hindrance around the nitrogen atom in the ionic compound represented by formula (2) is smaller, the interaction with a hydroxyl group in the repeating unit represented by formula (1) in the resin (A) is more strengthened and the ionic compound represented by formula (2) is allowed to be more uniformly present in the resin (A), as a result, the pattern profile is more improved.

The aryl group of $R_{21}$, $R_{22}$, $R_{23}$ and $R_{24}$ includes an aryl group having a carbon number of 6 to 18, such as phenyl group and naphthyl group, and is preferably an aryl group having a carbon number of 6 to 10.

$R_{21}$, $R_{22}$, $R_{23}$ and $R_{24}$ may have a substituent, and examples of the substituent include a hydroxyl group, a halogen atom (fluorine, chlorine, bromine, iodine), an aryl group such as phenyl group and naphthyl group, a nitro group, a cyano group, an amido group, a sulfonamido group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyloxy group, and a carboxy group.

$A^-$ is preferably $COO^-$.

The aromatic ring group represented by $Ar_2$ includes an aromatic ring group having a carbon number of 6 to 18, such as benzene ring and naphthyl ring, and is preferably an aromatic ring group having a carbon number of 6 to 10, more preferably a benzene ring.

The alkyl group represented by $R_{25}$ may have a substituent and is preferably a linear or branched alkyl group having a carbon number of 1 to 15, more preferably an alkyl group having a carbon number of 1 to 10, still more preferably an alkyl group having a carbon number of 1 to 6. Specific examples of the alkyl group of $R_{25}$ include a methyl group, an ethyl group, a propyl group, an isopropyl group, an n-butyl group, a sec-butyl group, a tert-butyl group, a neopentyl group, a hexyl group, a 2-ethylhexyl group, an octyl group, and a dodecyl group. The alkyl group of $R_{111}$ to $R_{113}$ is preferably a methyl group, an ethyl group, an isopropyl group, an n-butyl group or a tert-butyl group, more preferably a methyl group.

The cycloalkyl group represented by $R_{25}$ may have a substituent or may be monocyclic or polycyclic and is preferably a cycloalkyl group having a carbon number of 3 to 15, more preferably a cycloalkyl group having a carbon number of 3 to 10, still more preferably a cycloalkyl group having a carbon number of 3 to 6. Specific examples of the cycloalkyl group of $R_{25}$ include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of $R_{25}$ is preferably a cyclohexyl group.

The aryl group represented by $R_{25}$, which may have a substituent, is preferably an aryl group having a carbon number of 6 to 15, more preferably an aryl group having a carbon number of 6 to 12, and also includes a structure where a plurality of aromatic rings are connected to each other through a single bond (such as biphenyl group and terphenyl group). Specific examples of the aryl group of $R_{25}$ include a phenyl group, a naphthyl group, an anthranyl group, a biphenyl group, and a terphenyl group. The aryl group of $R_{25}$ is preferably a phenyl group.

The halogen atom represented by $R_{25}$ is preferably a chlorine atom, a bromine atom or a fluorine atom.

The alkyl group in the thioalkyl group, alkoxy group, thioalkoxy group, alkoxycarbonyl group or alkylaminocarbonyl group represented by $R_{25}$ as the same meaning as the alkyl group represented by $R_{25}$, and the preferred range thereof is also the same. The thioalkyl group, alkoxy group, thioalkoxy group, alkoxycarbonyl group or alkylaminocarbonyl group represented by $R_{25}$ may have a substituent.

Examples of the substituent which the alkyl group, cycloalkyl group, aryl group, thioalkyl group, alkoxy group, thioalkoxy group, alkoxycarbonyl group or alkylaminocarbonyl group of $R_{25}$ may further have include a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), a heterocyclic group (preferably having a carbon number of 4 to 15), an alkoxycarbonyl group (preferably having a carbon number of 2 to 7), an acyl group (preferably having a carbon number of 2 to 12), and an alkoxycarbonyloxy group (preferably having a carbon number of 2 to 7). Examples of the heterocyclic group as the substituent which may be further substituted on the alkyl group, cycloalkyl group, aryl group, thioalkyl group, alkoxy group, thioalkoxy group, alkoxycarbonyl group or alkylaminocarbonyl group of $R_{25}$ include a pyridyl group, a pyrazyl group, a tetrahydropyranyl group, a tetrahydropyranyl group, a tetrahydrothiophene group, a piperidyl group, a piperazyl group, a furanyl group, a pyranyl group, and a chromanyl group.

In the case where a plurality of $R_{25}$s are present, the plurality of $R_{25}$s may combine with each other to form a ring, and the ring formed includes a tetrahydrofuran ring.

$R_{25}$ is preferably a methyl group, an ethyl group, an n-butyl group, a tert-butyl group, a cyclohexyl group, a phenyl group, a pyranyl group, a chlorine atom, a bromine atom, a fluorine atom, a methoxy group, an ethoxy group, a butoxy group, a thiomethyl group, a nitro group, a methoxycarbonyl group, a tert-butoxycarbonyl group, an isopropylaminocarbonyl group or a methylcarbonylamino group, more preferably a cyclohexyl group, a fluorine atom or a methoxy group.

m is preferably an integer of 0 to 3, more preferably an integer of 0 to 2, still more preferably 0 or 1.

Specific examples of the cation moiety in the ionic compound represented by formula (2) are illustrated below, but the present invention is not limited thereto.

(B1-1)

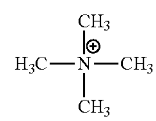

(B1-2)

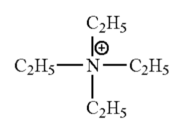

(B1-3)

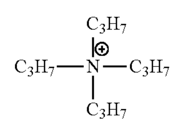

(B1-4)

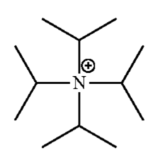

(B1-5)

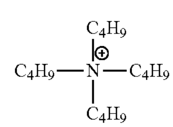

(B1-6)

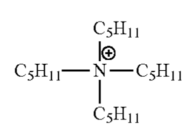

(B1-7)

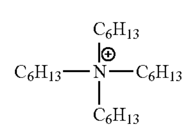

-continued
(B1-8)
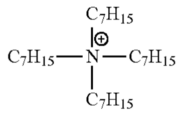
(B1-9)
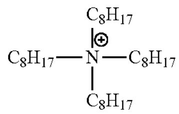
(B1-10)
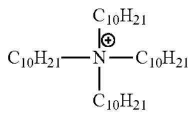
(B1-11)
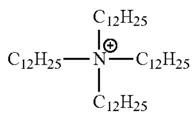
(B1-12)
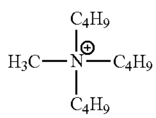
(B1-13)
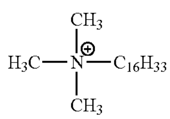
(B1-14)
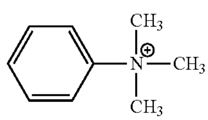
(B1-15)
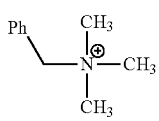
(B1-16)
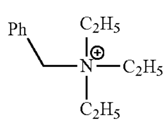
(B1-17)
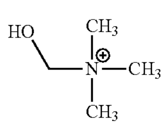
(B1-18)
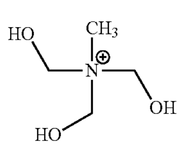
(B1-19)
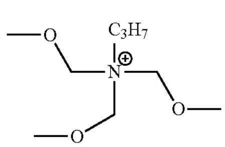
-continued
(B1-20)
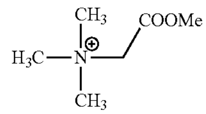
Specific examples of the anion moiety in the ionic compound represented by formula (2) are illustrated below, but the present invention is not limited thereto.
(B2-1)
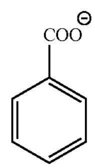
(B2-2)
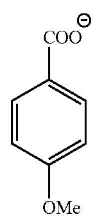
(B2-3)
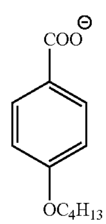
(B2-4)
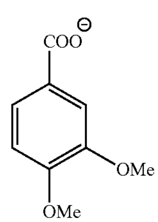
(B2-5)
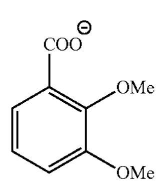
(B2-6)
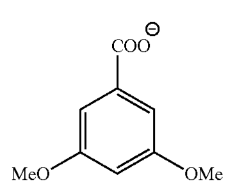

-continued
(B2-7)
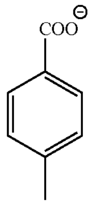
(B2-8)
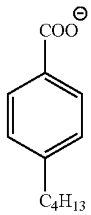
(B2-9)
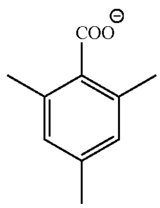
(B2-10)
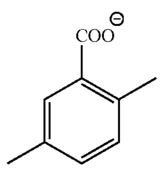
(B2-11)
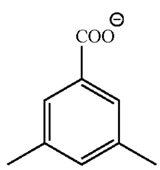
(B2-12)
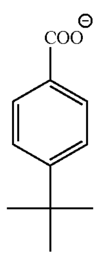
(B2-13)
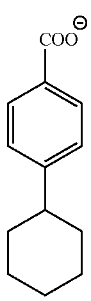
-continued
(B2-14)
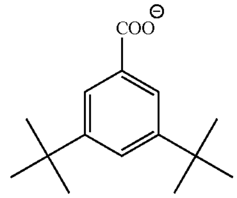
(B2-15)
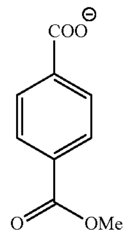
(B2-16)
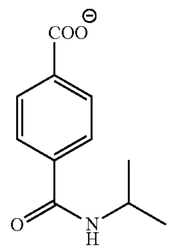
(B2-17)
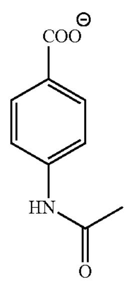
(B2-18)
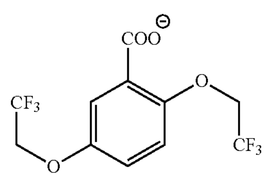
(B2-19)
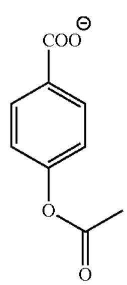

-continued
(B2-20)
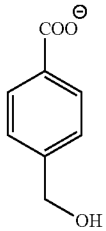
(B2-21)
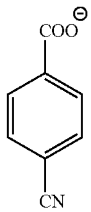
(B2-22)
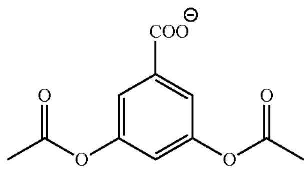
(B2-23)
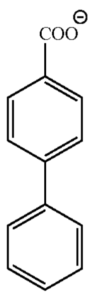
(B2-24)
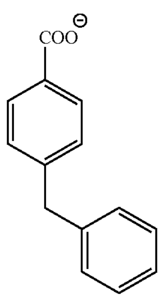
(B2-25)
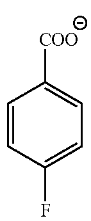
(B2-26)
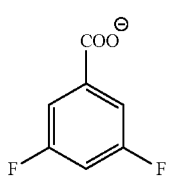
-continued
(B2-27)
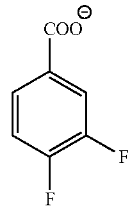
(B2-28)
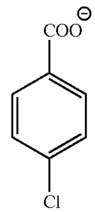
(B2-29)
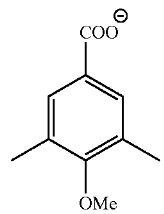
(B2-30)
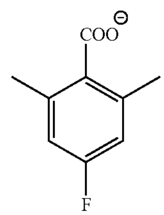
(B2-31)
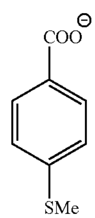
(B2-32)
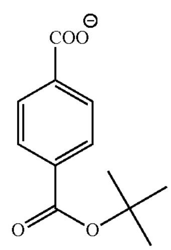
(B2-33)
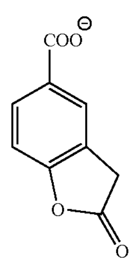

-continued
(B2-34)
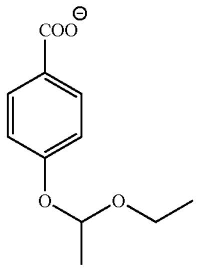
(B2-35)
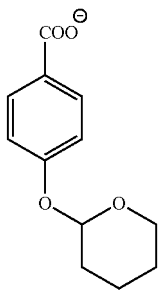
(B2-36)
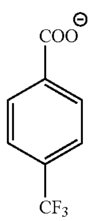
(B2-37)
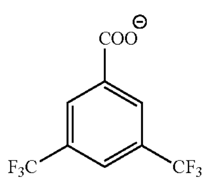
(B2-38)
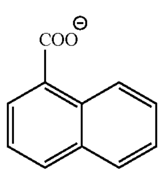
(B2-39)
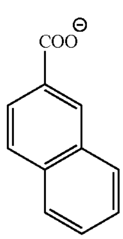
(B2-40)
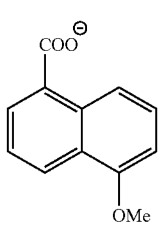
-continued
(B2-41)
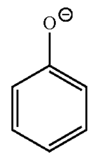
(B2-42)
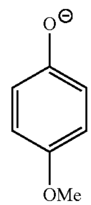
(B2-43)
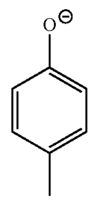
(B2-44)
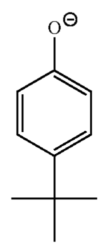
(B2-45)
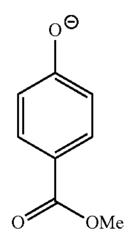
(B2-46)
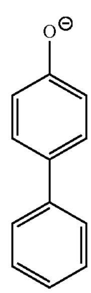
(B2-47)
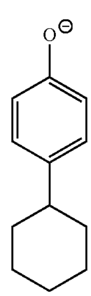

-continued
(B2-48)
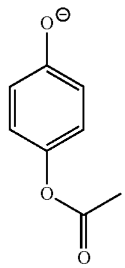
(B2-49)
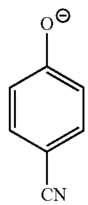
(B2-50)
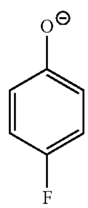
(B2-51)
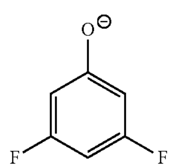
(B2-52)
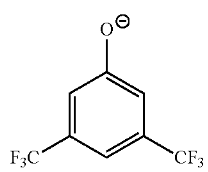
(B2-53)
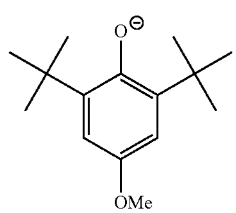
(B2-54)
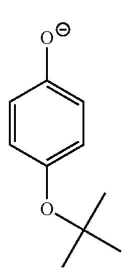
-continued
(B2-55)
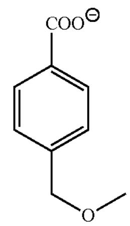
(B2-56)
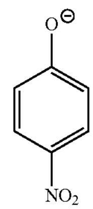
(B2-57)
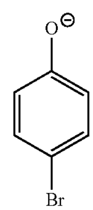
(B2-58)
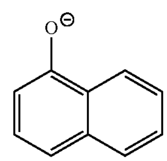
(B2-59)
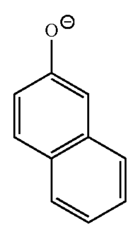
(B2-60)
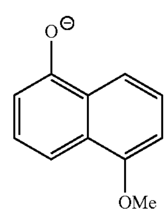
Specific examples of the ionic compound represented by formula (2) are shown in Table 1 below.
TABLE 1
| Basic Compound | Cation Structure | Anion Structure |
|---|---|---|
| B-1 | B1-1 | B2-1 |
| B-2 | B1-1 | B2-2 |
| B-3 | B1-1 | B2-9 |
| B-4 | B1-1 | B2-13 |
| B-5 | B1-1 | B2-15 |
| B-6 | B1-1 | B2-19 |
| B-7 | B1-1 | B2-25 |
| B-8 | B1-1 | B2-41 |
| B-9 | B1-1 | B2-51 |

TABLE 1-continued

| Basic Compound | Cation Structure | Anion Structure |
|---|---|---|
| B-10 | B1-1 | B2-58 |
| B-11 | B1-2 | B2-4 |
| B-12 | B1-2 | B2-14 |
| B-13 | B1-2 | B2-38 |
| B-14 | B1-2 | B2-45 |
| B-15 | B1-2 | B2-55 |
| B-16 | B1-3 | B2-3 |
| B-17 | B1-3 | B2-10 |
| B-18 | B1-3 | B2-33 |
| B-19 | B1-3 | B2-49 |
| B-20 | B1-3 | B2-54 |
| B-21 | B1-4 | B2-5 |
| B-22 | B1-4 | B2-22 |
| B-23 | B1-4 | B2-48 |
| B-24 | B1-5 | B2-1 |
| B-25 | B1-5 | B2-13 |
| B-26 | B1-5 | B2-20 |
| B-27 | B1-5 | B2-26 |
| B-28 | B1-5 | B2-34 |
| B-29 | B1-5 | B2-39 |
| B-30 | B1-5 | B2-41 |
| B-31 | B1-5 | B2-42 |
| B-32 | B1-5 | B2-51 |
| B-33 | B1-5 | B2-59 |
| B-34 | B1-6 | B2-7 |
| B-35 | B1-6 | B2-36 |
| B-36 | B1-7 | B2-1 |
| B-37 | B1-7 | B2-11 |
| B-38 | B1-7 | B2-28 |
| B-39 | B1-7 | B2-32 |
| B-40 | B1-7 | B2-43 |
| B-41 | B1-8 | B2-8 |
| B-42 | B1-8 | B2-44 |
| B-43 | B1-9 | B2-1 |
| B-44 | B1-9 | B2-16 |
| B-45 | B1-9 | B2-41 |
| B-46 | B1-9 | B2-47 |
| B-47 | B1-10 | B2-2 |
| B-48 | B1-10 | B2-12 |
| B-49 | B1-10 | B2-31 |
| B-50 | B1-10 | B2-42 |
| B-51 | B1-10 | B2-56 |
| B-52 | B1-11 | B2-1 |
| B-53 | B1-11 | B2-21 |
| B-54 | B1-11 | B2-27 |
| B-55 | B1-11 | B2-52 |
| B-56 | B1-12 | B2-1 |
| B-57 | B1-12 | B2-17 |
| B-58 | B1-12 | B2-23 |
| B-59 | B1-12 | B2-37 |
| B-60 | B1-13 | B2-17 |
| B-61 | B1-13 | B2-37 |
| B-62 | B1-13 | B2-50 |
| B-63 | B1-14 | B2-17 |
| B-64 | B1-14 | B2-23 |
| B-65 | B1-14 | B2-35 |
| B-66 | B1-14 | B2-50 |
| B-67 | B1-15 | B2-1 |
| B-68 | B1-15 | B2-2 |
| B-69 | B1-15 | B2-25 |
| B-70 | B1-15 | B2-41 |
| B-71 | B1-16 | B2-19 |
| B-72 | B1-16 | B2-38 |
| B-73 | B1-16 | B2-45 |
| B-74 | B1-16 | B2-53 |
| B-75 | B1-17 | B2-1 |
| B-76 | B1-17 | B2-12 |
| B-77 | B1-17 | B2-17 |
| B-78 | B1-17 | B2-41 |
| B-79 | B1-17 | B2-50 |
| B-80 | B1-18 | B2-18 |
| B-81 | B1-18 | B2-24 |
| B-82 | B1-18 | B2-37 |
| B-83 | B1-18 | B2-53 |
| B-84 | B1-19 | B2-1 |
| B-85 | B1-19 | B2-24 |
| B-86 | B1-19 | B2-41 |
| B-87 | B1-19 | B2-57 |

TABLE 1-continued

| Basic Compound | Cation Structure | Anion Structure |
|---|---|---|
| B-88 | B1-20 | B2-1 |
| B-89 | B1-20 | B2-41 |
| B-90 | B1-20 | B2-60 |

As for the ionic compound represented by formula (2), one kind may be used alone, or two or more kinds may be used in combination. The content of the ionic compound represented by formula (2) is preferably from 0.001 to 10 mass %, more preferably from 0.01 to 5 mass %, based on the total solid content in the actinic ray-sensitive or radiation-sensitive resin composition of the present invention.

Other examples of the basic compound which can be used in the composition of the present invention include compounds synthesized in Examples of JP-A-2002-363146 and compounds described in paragraph 0108 of JP-A-2007-298569.

A photosensitive basic compound may be also used as the basic compound. Examples of the photosensitive basic compound which can be used include compounds described in JP-T-2003-524799 (the term "JP-T" as used herein means a "published Japanese translation of a PCT patent application") and *J. Photopolym. Sci. & Tech.*, Vol. 8, pp. 543-553 (1995).

The molecular weight of the basic compound is usually from 100 to 1,500, preferably from 150 to 1,300, more preferably from 200 to 1,000.

One kind of these basic compounds may be used alone, or two or more kinds thereof may be used in combination.

In the case where the composition of the present invention contains a basic compound, the content thereof is preferably from 0.01 to 8.0 mass %, more preferably from 0.1 to 5.0 mass %, still more preferably from 0.2 to 4.0 mass %, based on the total solid content of the composition.

The molar ratio of the basic compound to the photoacid generator is preferably from 0.01 to 10, more preferably from 0.05 to 5, still more preferably from 0.1 to 3. If the molar ratio is excessively large, the sensitivity and/or resolution may be reduced, whereas if the molar ratio is excessively small, thinning of the pattern may occur between exposure and heating (post-baking). The molar ratio is more preferably from 0.05 to 5, still more preferably from 0.1 to 3. In this molar ratio, the amount of the photoacid generator is based on the total amount of the repeating unit (B) of the resin and the photoacid generator that may be further contained in the resin.

[5] Surfactant

The actinic ray-sensitive or radiation-sensitive composition of the present invention may further contain a surfactant. Among others, the surfactant is preferably a fluorine-containing and/or silicon-containing surfactant.

Examples of the fluorine-containing and/or silicon-containing surfactant include Megaface F176 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and Polysiloxane Polymer KP-341 produced by Shin-Etsu Chemical Co., Ltd.

A surfactant other than the fluorine-containing and/or silicon-containing surfactant may be also used. Examples of this surfactant include polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

In the case where the composition of the present invention further contains a surfactant, the amount used thereof is preferably from 0.0001 to 2 mass %, more preferably from 0.001 to 1 mass %, based on the total solid content of the composition.

[6] Other Additives (Dye)

The actinic ray-sensitive or radiation-sensitive composition of the present invention may further contain a dye. Preferred dyes include, for example, an oil dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries, Ltd.), Crystal Violet (CI 42555), Methyl Violet (CI 42535), Rhodamine B (CI 45170B), Malachite Green (CI 42000), and Methylene Blue (CI 52015).

(Photo-Base Generator)

The actinic ray-sensitive or radiation-sensitive composition of the present invention may further contain a photo-base generator. When a photo-base generator is contained, a more excellent pattern can be formed.

Examples of the photo-base generator include compounds described in JP-A-4-151156, JP-A-4-162040, JP-A-5-197148, JP-A-5-5995, JP-A-6-194834, JP-A-8-146608, JP-A-10-83079 and European Patent No. 622682.

Preferred photo-base generators specifically include 2-nitrobenzyl carbamate, 2,5-dinitrobenzylcyclohexyl carbamate, N-cyclohexyl-4-methylphenylsulfonamide, and 1,1-dimethyl-2-phenylethyl-N-isopropyl carbamate.

(Antioxidant)

The actinic ray-sensitive or radiation-sensitive composition of the present invention may further contain an antioxidant. When an antioxidant is contained, the organic material can be prevented from oxidation in the presence of oxygen.

Examples of the antioxidant include a phenol-based antioxidant, an antioxidant composed of an organic acid derivative, a sulfur-containing antioxidant, a phosphorus-based antioxidant, an amine-based antioxidant, an antioxidant composed of an amine-aldehyde condensate, and an antioxidant composed of an amine-ketone condensate. Among these antioxidants, a phenol-based antioxidant and an antioxidant composed of an organic acid derivative are preferably used. When such an antioxidant is used, the function as an antioxidant can be brought out without deteriorating the performance of the composition.

As the phenol-based antioxidant, for example, substituted phenols and bis-, tris- and poly-phenols can be used.

Examples of the substituted phenols include 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butylanilino)-2,4-bis.octyl-thio-1,3,5-triazine, n-octadecyl-3-(4'-hydroxy-3',5'-di-tert-butyl.phenyl)propionate, octylated phenol, aralkyl-substituted phenols, alkylated p-cresol, and hindered phenol.

Examples of the bis-, tris- and poly-phenols include 4,4'-dihydroxydiphenyl, methylenebis(dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-alphamethyl-benzyl-p-cresol), methylene-crosslinked polyhydric alkylphenol, 4,4'-butylidenebis-(3-methyl-6-tert-butylphenol), 1,1-bis-(4-hydroxyphenyl)-cyclohexane, 2,2'-dihydroxy-3,3'-di-α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl) benzene, tris-(2-methyl-4-hydroxy-5-tert-butylphenyl) butane, and tetrakis-[methylene-3-(3',5'-di-tert-butyl-4'-hydroxyphenyl)propionate]methane.

Preferred antioxidants include 2,6-di-tert-butyl-4-methylphenol, 4-hydroxymethyl-2,6-di-tert-butylphenol, 2,2'-methylenebis(4-methyl-6-tert-butylphenol), butylhydroxyanisole, tert-butylhydroquinone, 2,4,5-trihydroxybutyrophenone, nordihydro-guaiaretic acid, propyl gallate, octyl gallate, lauryl gallate, and isopropyl citrate. Among these, 2,6-di-tert-butyl-4-methylphenol, 4-hydroxymethyl-2,6-di-tert-butylphenol, butylhydroxyanisole and tert-butylhydroquinone are more preferred, and 2,6-di-tert-butyl-4-methylphenol and 4-hydroxymethyl-2,6-di-tert-butylphenol are still more preferred.

One kind of an antioxidant may be used alone, or two or more kinds of antioxidants may be used in combination.

In the case of incorporating an antioxidant into the composition of the present invention, the amount added thereof is preferably 1 ppm or more, more preferably 5 ppm or more, still more preferably 10 ppm or more, yet still more preferably 50 ppm or more, even yet still more preferably 100 ppm or more, and most preferably from 100 to 1,000 ppm.

[7] Solvent

The actinic ray-sensitive or radiation-sensitive composition of the present invention may further contain a solvent. As the solvent, an organic solvent is typically used. Examples of the organic solvent include an alkylene glycol monoalkyl ether carboxylate, an alkylene glycol monoalkyl ether, an alkyl lactate ester, an alkyl alkoxypropionate, a cyclic lactone (preferably having a carbon number of 4 to 10), a monoketone compound (preferably having a carbon number of 4 to 10) which may contain a ring, an alkylene carbonate, an alkyl alkoxyacetate, and an alkyl pyruvate.

Preferred examples of the alkylene glycol monoalkyl ether carboxylate include propylene glycol monomethyl ether acetate (PGMEA, another name: 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Examples of the alkylene glycol monoalkyl ether include propylene glycol monomethyl ether (PGME, another name: 1-methoxy-2-propanol), propylene glycol monoethyl ether, propylene glycol monopropyl ether, propylene glycol monobutyl ether, ethylene glycol monomethyl ether, and ethylene glycol monoethyl ether.

Examples of the alkyl lactate ester include methyl lactate, ethyl lactate, propyl lactate, and butyl lactate.

Examples of the alkyl alkoxypropionate include ethyl 3-ethoxypropionate, methyl 3-methoxypropionate, methyl 3-ethoxypropionate, and ethyl 3-methoxypropionate.

Examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Examples of the alkylene carbonate include propylene carbonate, vinylene carbonate, ethylene carbonate, and butylene carbonate.

Examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Examples of the alkyl pyruvate include methyl pyruvate, ethyl pyruvate, and propyl pyruvate.

As the solvent, a solvent having a boiling point of 130° C. or more at ordinary temperature under atmospheric pressure is preferably used. Specific examples thereof include cyclopentanone, γ-butyrolactone, cyclohexanone, ethyl lactate, ethylene glycol monoethyl ether acetate, PGMEA, ethyl 3-ethoxypropionate, ethyl pyruvate, 2-ethoxyethyl acetate, 2-(2-ethoxyethoxy)ethyl acetate, and propylene carbonate.

One kind of these solvents may be used alone, or two or more kinds thereof may be mixed and used. In the latter case, a mixed solvent of a solvent containing a hydroxyl group and a solvent not containing a hydroxyl group is preferably used.

Examples of the solvent containing a hydroxyl group include ethylene glycol, ethylene glycol monomethyl ether, ethylene glycol monoethyl ether, propylene glycol, PGME, propylene glycol monoethyl ether, and ethyl lactate. Among these, PGME and ethyl lactate are preferred.

Examples of the solvent not containing a hydroxyl group include PGMEA, ethyl ethoxypropionate, 2-heptanone, γ-butyrolactone, cyclohexanone, butyl acetate, N-methylpyrrolidone, N,N-dimethylacetamide, and dimethylsulfoxide. Among these, propylene glycol monomethyl ether acetate, ethyl ethoxypropionate, 2-heptanone, γ-butyrolactone, cyclohexanone and butyl acetate are preferred, and PGMEA, ethyl ethoxypropionate and 2-heptanone are more preferred.

In the case of using a mixed solvent of a solvent containing a hydroxyl group and a solvent not containing a hydroxyl group, the mass ratio therebetween is preferably from 1/99 to 99/1, more preferably from 10/90 to 90/10, still more preferably from 20/80 to 60/40.

Incidentally, when a mixed solvent containing 50 mass % or more of a hydroxyl group-free solvent is used, particularly excellent coating uniformity can be achieved. Also, the solvent is preferably a mixed solvent of PGMEA and one or more kinds of other solvents.

The content of the solvent in the actinic ray-sensitive or radiation-sensitive composition of the present invention may be appropriately adjusted according to the desired film thickness or the like, but the content is generally adjusted such that the total solid content concentration of the composition becomes from 0.5 to 30 mass %, preferably from 1.0 to 20 mass %, more preferably from 1.5 to 10 mass %.

[8] Pattern Forming Method

The present invention relates to an actinic ray-sensitive or radiation-sensitive film (hereinafter, sometimes referred to as "resist film") formed using the above-described composition of the present invention. Furthermore, the pattern forming method of the present invention includes steps of exposing and developing the actinic ray-sensitive or radiation-sensitive film above.

The composition of the present invention is typically used as follows. That is, the composition of the present invention is typically coated on a support such as substrate to form a film. The thickness of the film is preferably from 0.02 to 0.1 μm. The method for coating the composition on a substrate is preferably spin coating, and the rotation speed of spin coating is preferably from 1,000 to 3,000 rpm.

For example, the composition is coated on such a substrate (e.g., silicon/silicon dioxide-coated substrate, silicon nitride and chromium-deposited quartz substrate) as used in the production of a precision integrated circuit device, an imprint mold or the like, by using a spinner, a coater or the like. By drying the coating, an actinic ray-sensitive or radiation-sensitive film can be formed.

The resist film is irradiated with an actinic ray or radiation, then preferably baked (heated), and further subjected to development and rinsing, whereby a good pattern can be obtained.

It is also preferred to include, after film formation, a pre-baking step (PB) before entering the exposure step.

Furthermore, it is also preferred to include a post-exposure baking step (PEB) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

Examples of the actinic ray or radiation include infrared light, visible light, ultraviolet light, far ultraviolet light, X-ray, and electron beam. An actinic ray or radiation having, for example, a wavelength of 250 nm or less, particularly 220 nm or less, is preferred. Such an actinic ray or radiation includes, for example, KrF excimer laser (248 nm), ArF excimer laser (193 nm), $F_2$ excimer laser (157 nm), X-ray, and electron beam. The actinic ray or radiation is preferably, for example, KrF excimer laser, electron beam, X-ray or EUV light, more preferably electron beam, X-ray or EUV light.

That is, the present invention also relates to an actinic ray-sensitive or radiation-sensitive resin composition for KrF excimer laser, electron beam, X-ray or EUV light (preferably for electron beam, X-ray or EUV light).

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type composed of a light absorber and a polymer material. A commercially available organic antireflection film such as DUV30 Series and DUV-40 Series produced by Brewer Science, Inc. and AR-2, AR-3 and AR-5 produced by Shipley Co., Ltd. may be also used as the organic antireflection film.

In the development step, an alkali developer is usually used.

Examples of the alkali developer include an alkaline aqueous solution containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

In the alkali developer, alcohols and/or a surfactant may be added each in an appropriate amount.

The concentration of the alkali developer is usually from 0.1 to 20 mass %. The pH of the alkali developer is usually from 10.0 to 15.0.

As for the rinsing solution, pure water is used, and an appropriate amount of a surfactant may be added thereto before use.

The composition of the present invention may be also used for a process where after coating, film formation and exposure, the film is developed using a developer containing an organic solvent as the main component to obtain a negative pattern. As this process, a process described, for example, in JP-A-2010-217884 may be used.

As the organic developer, a polar solvent such as ester-based solvent (e.g., butyl acetate, ethyl acetate), ketone-based solvent (e.g., 2-heptanone, cyclohexanone), alcohol-based solvent, amide-based solvent and ether-based solvent, and a hydrocarbon-based solvent may be used. The water content ratio in the entire organic developer is preferably less than 10 mass %, and it is more preferred to contain substantially no water.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddling method), a method of spraying the developer on the substrate surface (spraying method), and a method of continuously ejecting the developer on the substrate spinning at a constant speed while scanning a developer ejecting nozzle at a constant rate (dynamic dispense method) may be applied.

In the rinsing step, the wafer after development is rinsed using a rinsing solution. The method for the rinsing treatment is not particularly limited but, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method) may be applied. Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. The developer and rinsing solution remaining between patterns and in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

After the development step or rinsing step, a treatment of removing the developer or rinsing solution adhering on the pattern by a supercritical fluid may be performed.

Also, an imprint mold may be produced using the composition of the present invention. For details, refer to, for example, Japanese Patent 4,109,085, JP-A-2008-162101, and "Yoshihiko Hirai (compiler), *Nanoimprint no Kiso to Gijutsu Kaihatsu•Oyo Tenkai-Nanoimprint no Kiban Gijutsu to Saishin no Gijutsu Tenkai* (*Basic and Technology Expansion•Application Development of Nanoimprint-Substrate Technology of Nanoimprint and Latest Technology Expansion*), Frontier Shuppan".

The present invention also relates to a method for manufacturing an electronic device, comprising the above-described pattern forming method of the present invention, and an electronic device manufactured by this manufacturing method.

The electronic device of the present invention is suitably mounted on electric electronic equipment (such as home electronic device, OA•media-related device, optical device and communication device).

EXAMPLES

Reference Synthesis Example 1

Synthesis of Modified Polyhydroxystyrene Compound (PHS-M1)

30.0 g of poly(p-hydroxystyrene) (VP-2500, produced by Nippon Soda Co., Ltd.) as a polyhydroxystyrene compound was dissolved in 120 g of acetone and after adding 4.42 g of 1-chloromethylnaphthalene, 4.14 g (2 equivalents relative to 1-chloromethylnaphthalene) of potassium carbonate and 1.12 g (0.5 equivalents relative to 1-chloromethylnaphthalene, the mixture was refluxed for 4 hours. About a half amount of acetone was removed by distillation in an evaporator and thereafter, 200 mL of ethyl acetate and then 200 mL of 1 N hydrochloric acid were added with stirring. The reaction product was transferred to a separating funnel and after removing the aqueous layer, the organic layer was washed with 200 mL of 1 N hydrochloric acid and then with 200 mL of distilled water. Thereafter, the organic layer was concentrated in an evaporator. Through these operations, a 10% naphthylmethylated polyp-hydroxystyrene) was obtained.

Reference Synthesis Example 2

Synthesis of Meta-Polyhydroxystyrene (MHS)

A 2 L-volume flask as a reaction vessel was dried under reduced pressure and thereafter, in a nitrogen atmosphere, 1,500 g of a tetrahydrofuran solution subjected to a distillation dehydration treatment was poured into the flask and cooled to −75° C. Subsequently, 13.5 g of s-butyllithium (a cyclohexane solution: 1 N) was poured and furthermore, 235 g of m-tert-butoxystyrene subjected to a distillation dehydration treatment using metallic sodium was poured dropwise. At this time, the inner temperature of the reaction solution was kept from rising to −65° C. or more. After the reaction for 30 minutes, 10 g of methanol was poured to stop the reaction, and the temperature of the reaction solution was raised to room temperature. The obtained reaction solution was concentrated under reduced pressure, and an operation of pouring 800 g of methanol, stirring the solution and after standing still, removing the methanol layer as the upper layer was repeated three times to remove metallic Li. The polymer solution as the lower layer was concentrated, and 840 mL of acetone and 13.3 g of an aqueous hydrochloric acid solution (15 mass %) were added thereto. The resulting solution was heated to 40° C. and after a deprotection reaction for 5 hours, neutralized using 37 g of pyridine. The reaction solution was concentrated, then dissolved in 0.6 L of acetone and precipitated in a solution containing 7.0 L of water, and the obtained white solid was filtered and then dried at 40° C. under reduced pressure to obtain 138 g of a white polymer.

Synthesis Example 1

Synthesis of Resin (P-1)

(Synthesis of Chloroether Compound)

In a 300 mL-volume eggplant-type flask equipped with a Dean-Stark tube, 10.51 g of isovaleraldehyde, 12.35 g of ethanol, 1.41 g of camphorsulfonic acid and 100 mL of heptane were added, and refluxing was performed for 8 hours. After returning the temperature to room temperature, 3.1 g of triethylamine was added and stirred, and the organic layer was washed with saturated sodium bicarbonate water twice and with distilled water once. By removing heptane and unreacted ethanol under the condition of reduced-pressure heating, Compound 1 shown below was obtained as an acetal compound.

Subsequently, 11.47 g of acetyl chloride was added to the entire amount of Compound 1 obtained, and the mixture was stirred in a water bath at 45° C. for 4 hours. After returning the temperature to room temperature, unreacted acetyl chloride was removed under the reduced pressure condition, whereby Compound C1-1 shown below was obtained as a chloroether compound.

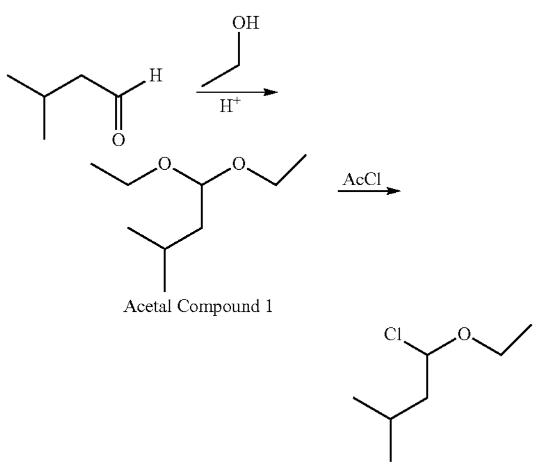

Cl-1

(Synthesis of Resin (P-1))

10.0 g of poly(p-hydroxystyrene) (VP-2500, produced by Nippon Soda Co., Ltd.) as a polyhydroxystyrene compound was dissolved in 50 g of tetrahydrofuran (THF) and after adding 8.85 g of triethylamine, the mixture was stirred in an ice water bath. To the reaction solution, 5.01 g of Compound C1-1 obtained above was added dropwise, and the mixture was stirred for 4 hours. A small amount of the reaction solution was sampled and measured for $^1$H-NMR, as a result, the protection ratio was 39.2%. The reaction was stopped by adding distilled water. THF was removed by distillation under reduced pressure, and the reaction product was dissolved in ethyl acetate. The obtained organic layer was washed with distilled water five times, and the organic layer was added dropwise to 1.5 L of hexane. The obtained precipitate was separated by filtration, then washed with a small amount of hexane and dissolved in 35 g of propylene glycol monomethyl ether acetate (PGMEA), and a low boiling point solvent was removed from the obtained solution in an evaporator to obtain 48.7 g of a PGMEA solution (28.1 mass %) of Resin (P-1).

With respect to the obtained Resin (P-1), the compositional ratio (molar ratio) of Resin (P-1) was calculated by $^1$H-NMR measurement. Also, the weight average molecular weight (Mw: in terms of polystyrene), number average molecular weight (Mn: in terms of polystyrene) and polydispersity (Mw/Mn, hereinafter sometimes referred to as "PDI") of Resin (P-1) were calculated by GPC (solvent: N-methylpyrrolidone (NMP)) measurement. These results are shown in the chemical formulae later.

Synthesis Examples 2 to 12

Synthesis of Resins (P-2) to (P-12)

Figure 2:
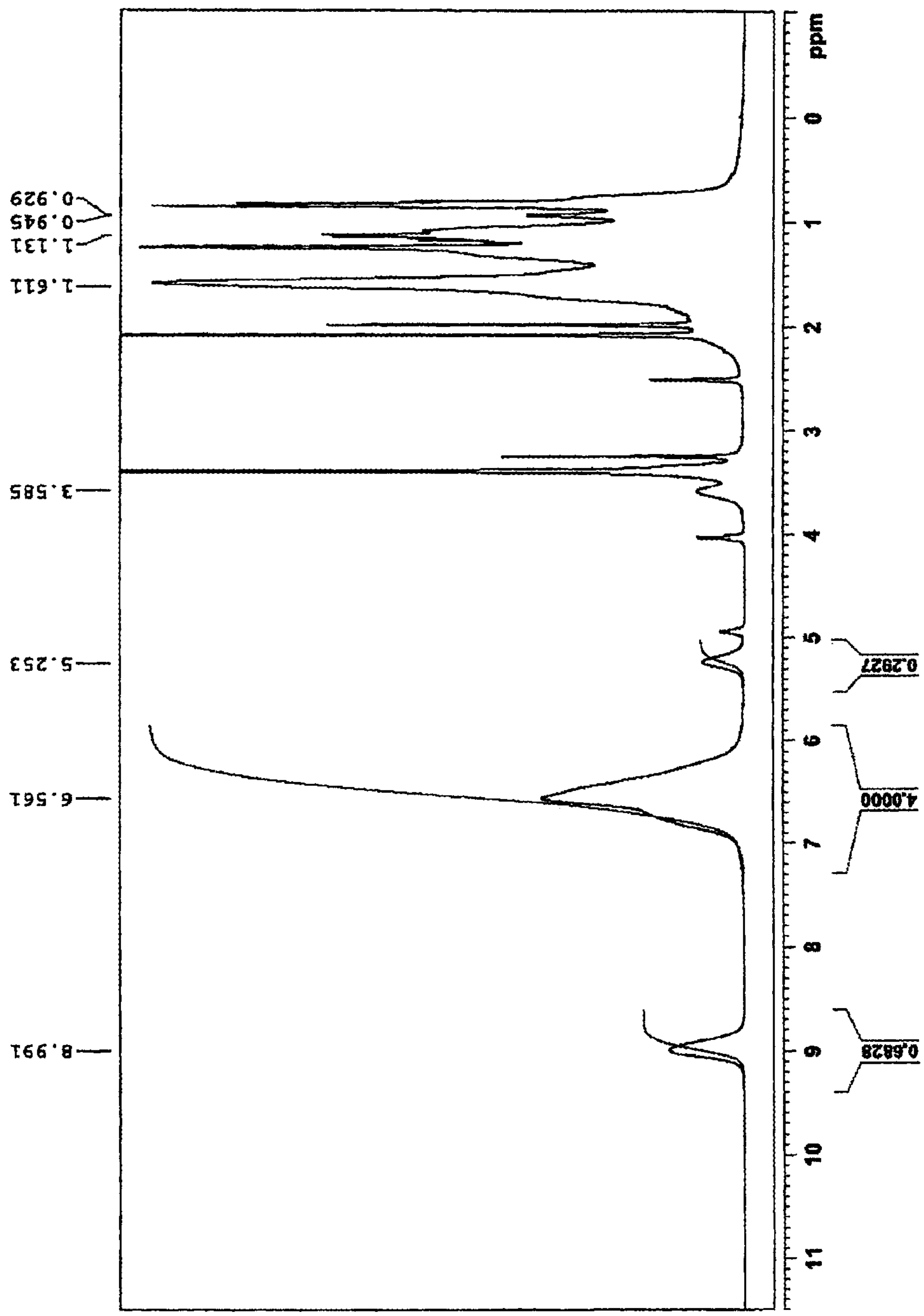
FIG. 2 is a view showing a $^{1}$H-NMR chart of Resin (P-4) synthesized in Example.
Figure 3:
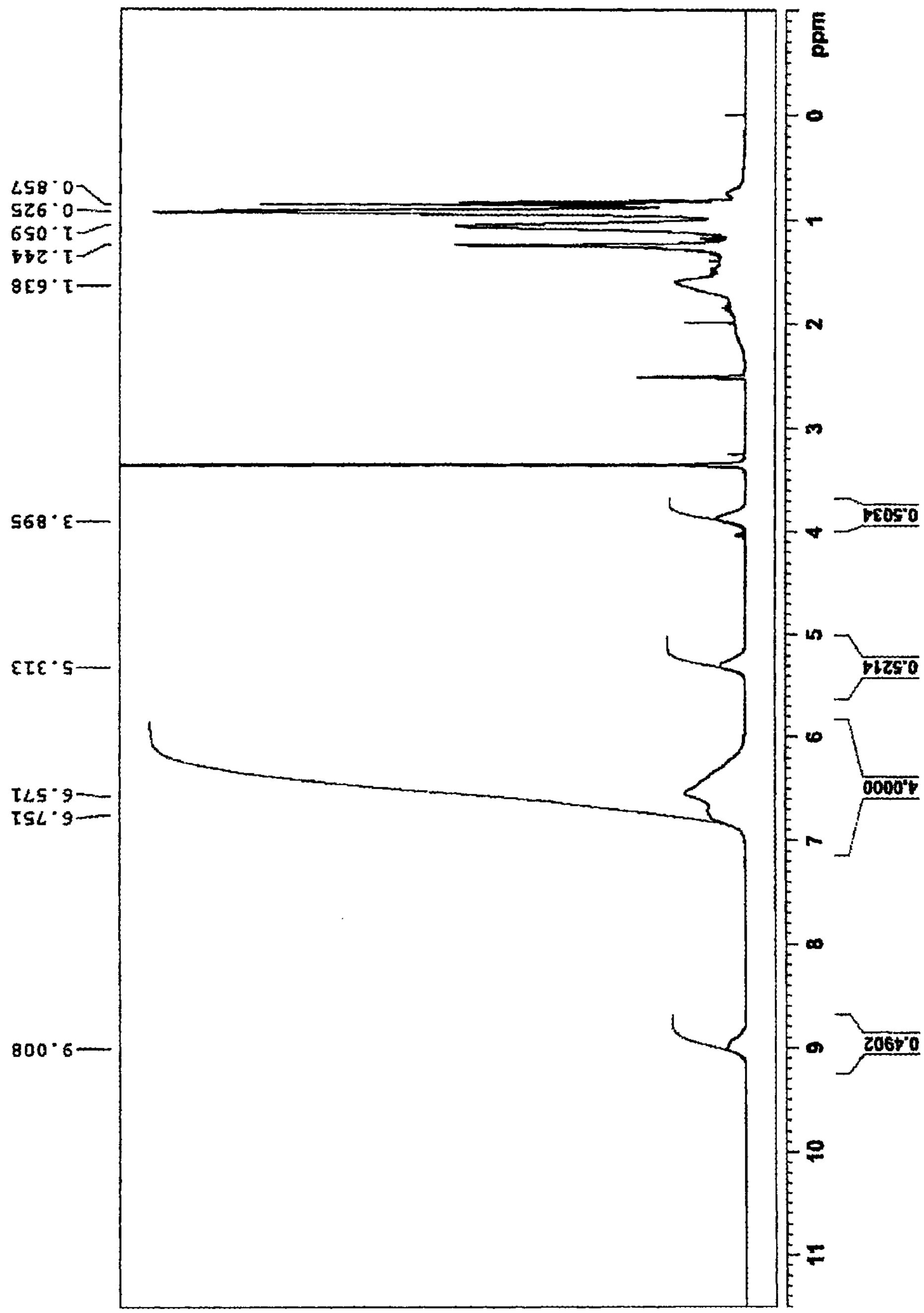
FIG. 3 is a view showing a $^{1}$H-NMR chart of Resin (P-5) synthesized in Example.
Figure 4:
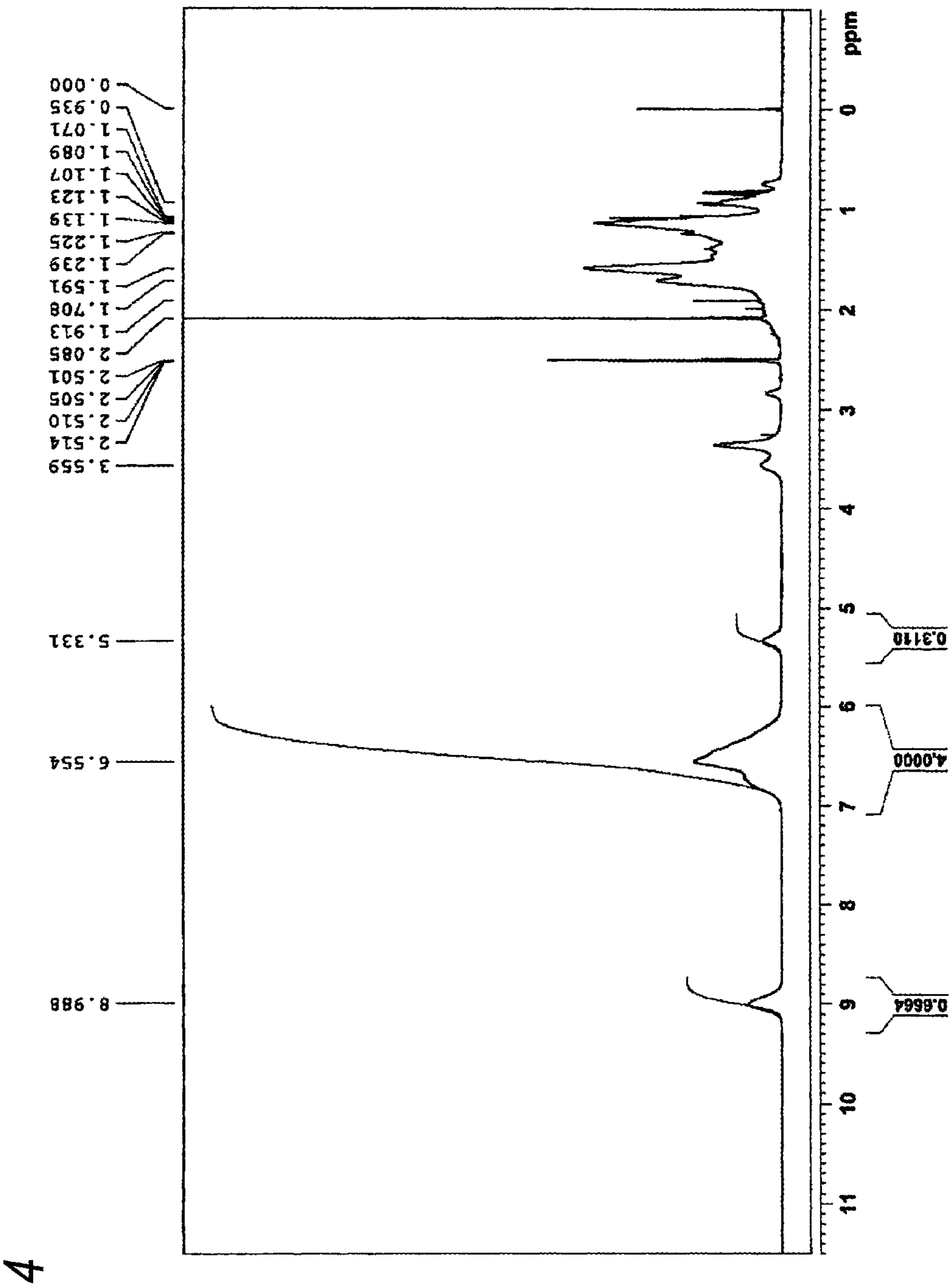
FIG. 4 is a view showing a $^{1}$H-NMR chart of Resin (P-6) synthesized in Example.
Figure 5:
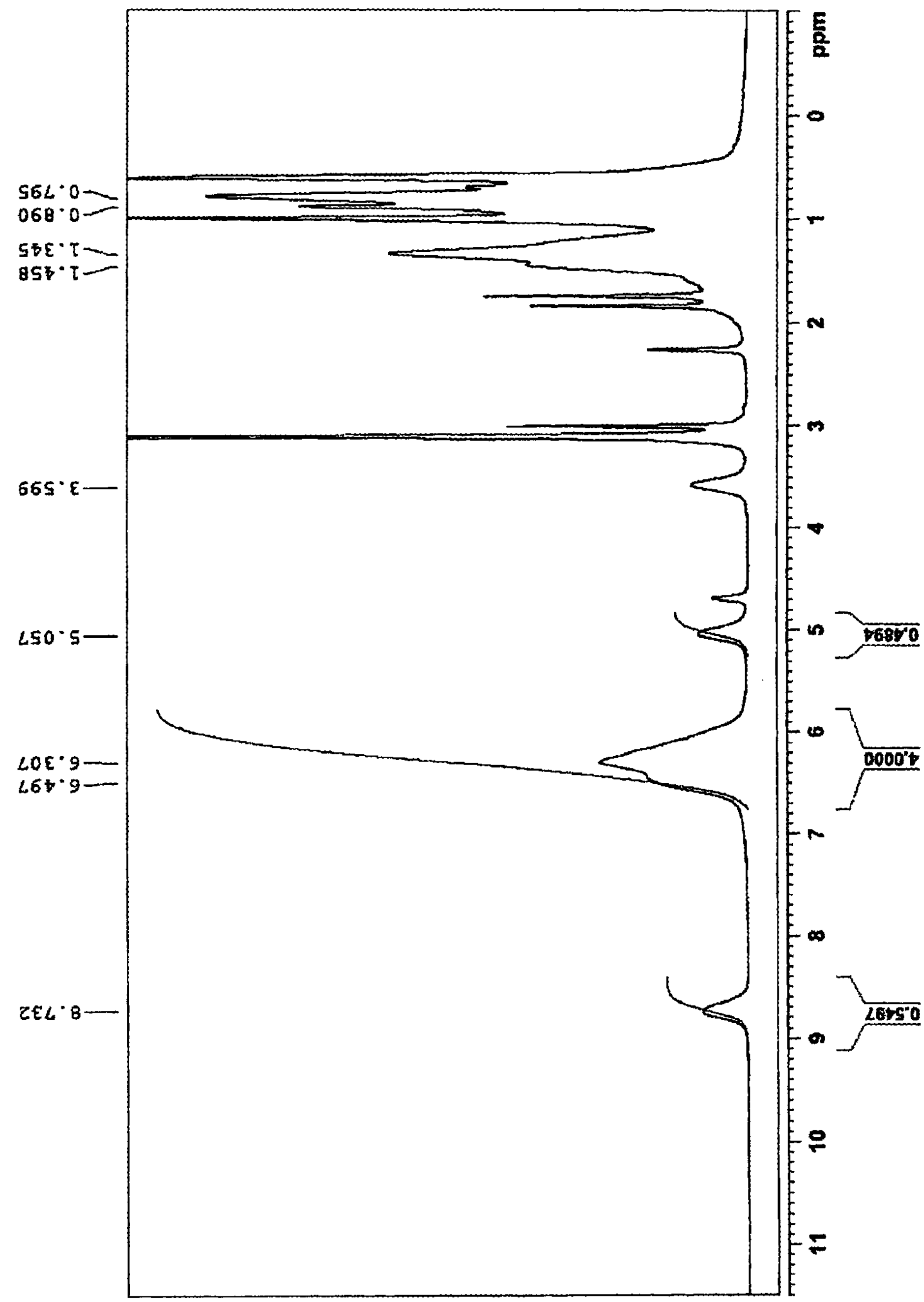
FIG. 5 is a view showing a $^{1}$H-NMR chart of Resin (P-7) synthesized in Example.

Resins (P-2) to (P-12) were synthesized by the same method as in Synthesis Example 1 except for appropriately changing the polyhydroxystyrene compound and chloroether compound used. The polyhydroxystyrene compound and chloroether compound used for the synthesis are shown in Table below. Incidentally, the chloroether compound was synthesized through an acetal compound by using a corresponding aldehyde compound as the starting material, similarly to Synthesis Example 1. The $^1$H-NMR charts of Resin (P-3), Resin (P-4), Resin (P-5), Resin (P-6) and Resin (P-7) are shown in FIGS. 1 to 5, respectively.

Cl-2

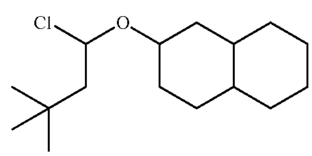

Cl-3

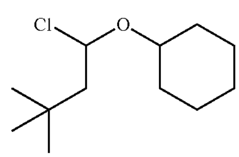

Cl-4

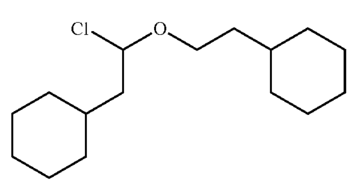

Cl-5

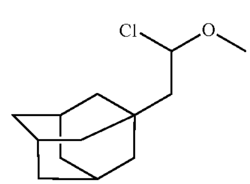

-continued

Cl-6

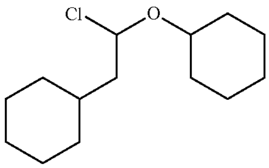

Cl-7

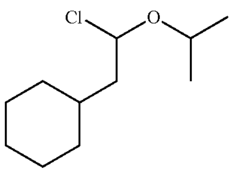

Cl-8

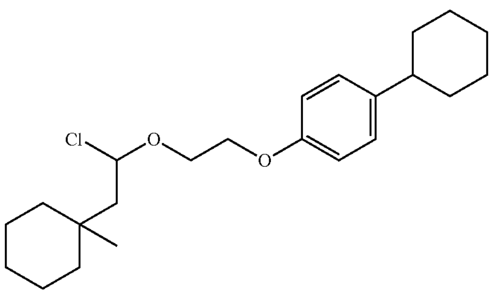

Cl-9

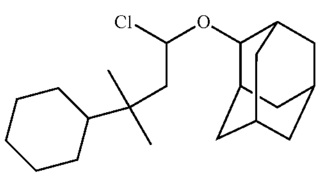

Cl-10

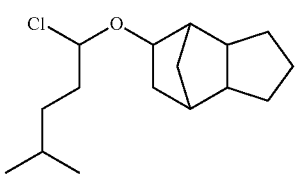

Cl-11

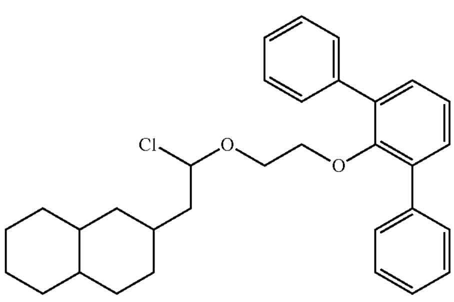

Cl-12

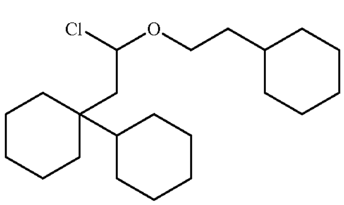

-continued

Cl-13

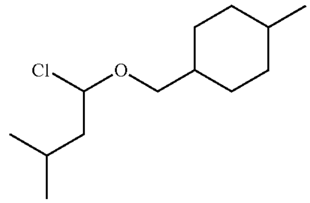

Cl-14

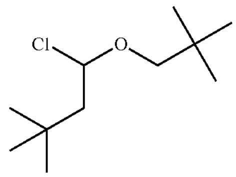

Cl-15

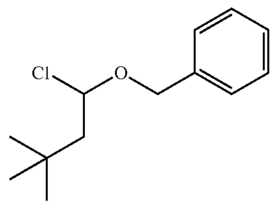

Cl-16

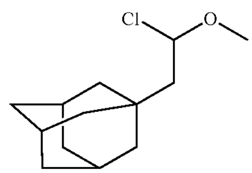

Cl-17

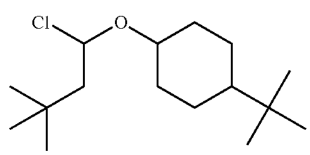

Cl-18

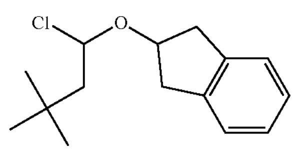

TABLE 2

| | Resin | Polyhydroxystyrene Compound | Chloroether Compound |
|---|---|---|---|
| Synthesis Example 2 | P-2 | VP-2500 | C1-2 |
| Synthesis Example 3 | P-3 | VP-2500 | C1-3 |
| Synthesis Example 4 | P-4 | VP-2500 | C1-4 |
| Synthesis Example 5 | P-5 | PHS-M1 | C1-5 |
| Synthesis Example 6 | P-6 | VP-2500 | C1-6 |
| Synthesis Example 7 | P-7 | VP-2500 | C1-7 |
| Synthesis Example 8 | P-8 | VP-2500 | C1-8 |
| Synthesis Example 9 | P-9 | PHS-M1 | C1-9 |
| Synthesis Example 10 | P-10 | VP-2500 | C1-10 |
| Synthesis Example 11 | P-11 | VP-8000 | C1-11 |
| Synthesis Example 12 | P-12 | MHS | C1-12 |

"VP-8000" is a polyhydroxystyrene compound produced by Nippon Soda Co., Ltd.

The polymer structure, weight average molecular weight (Mw) and polydispersity (Mw/Mn) (PDI) of each of Resins (P-1) to (P-12) are shown below. Also, the compositional ratio of respective repeating units in the polymer structure is shown by molar ratio.

-continued
P-1
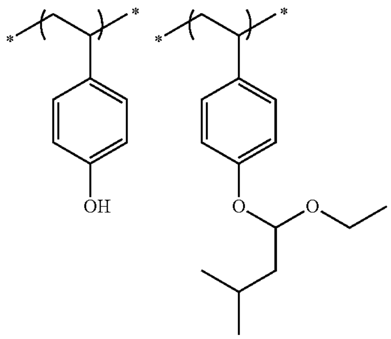
Compositional ratio: 60/40
Mw: 5800
PDI: 1.21
P-2
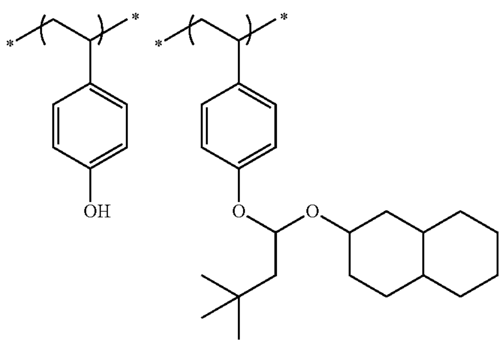
Compositional ratio: 70/30
Mw: 6300
PDI: 1.25
P-3
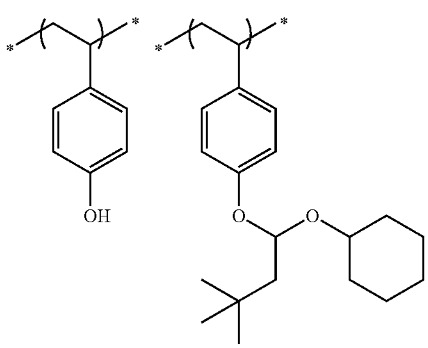
Compositional ratio: 60/40
Mw: 5800
PDI: 1.23
P-4
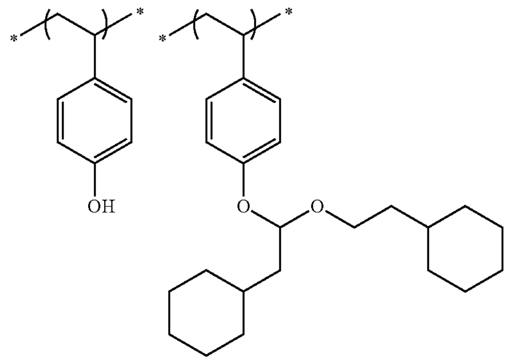
Compositional ratio: 70/30
Mw: 6400
PDI: 1.19
P-5
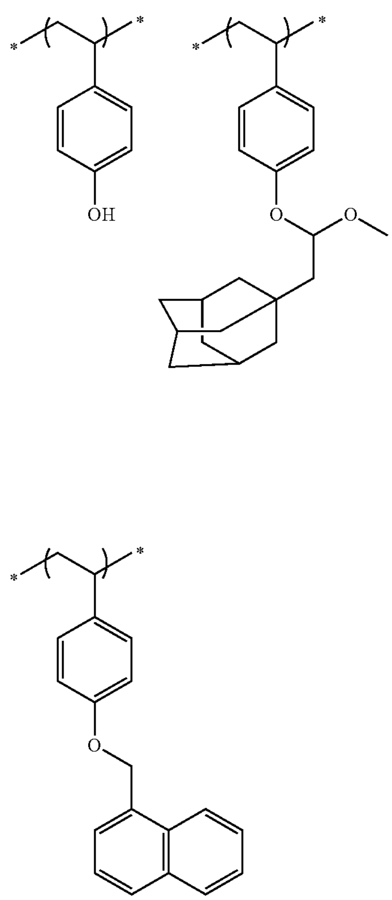
Compositional ratio: 55/35/10
Mw: 6300
PDI: 1.30

-continued
P-6
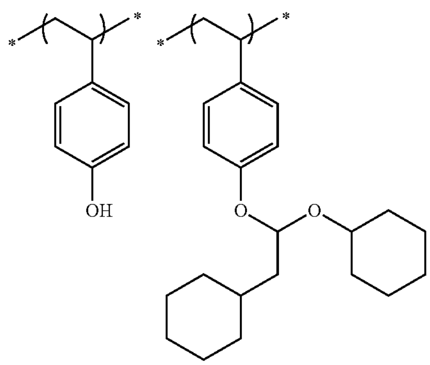
Compositional
ratio: 69/31
Mw: 6200
PDI: 1.25
P-7
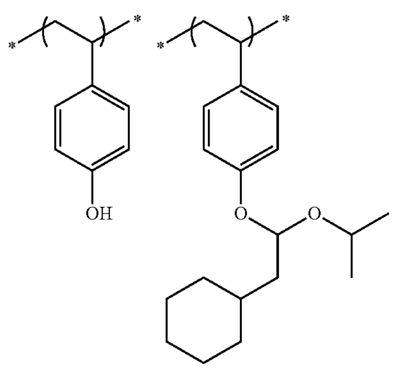
Compositional
ratio: 52/48
Mw: 6000
PDI: 1.18
P-8
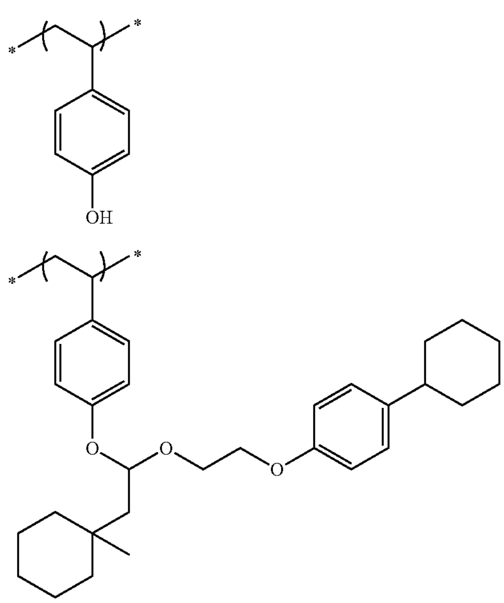
Compositional
ratio: 75/25
Mw: 6500
PDI: 1.15
-continued
P-9
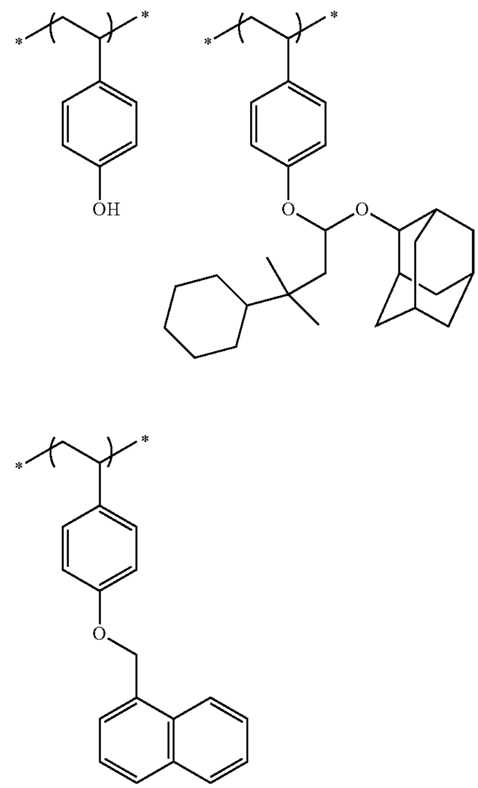
Compositional
ratio: 60/30/10
Mw: 5900
PDI: 1.25
P-10
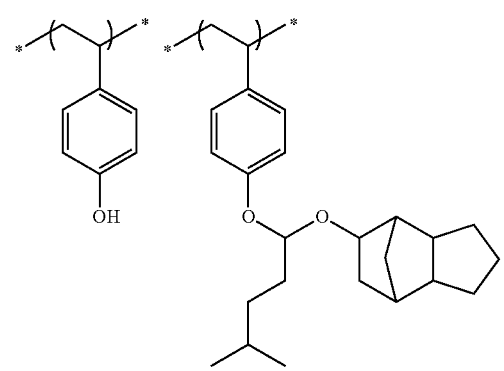
Compositional
ratio: 68/32
Mw: 6400
PDI: 1.30
P-11
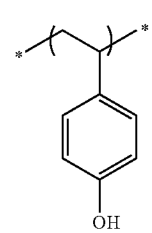

-continued

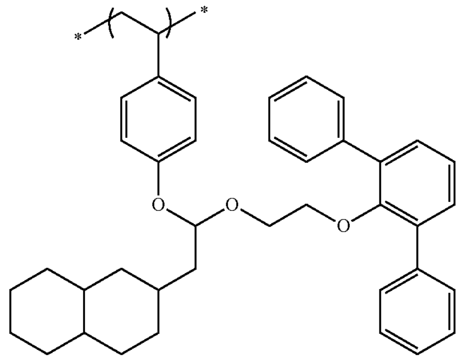

Compositional
ratio: 52/48
Mw: 12500
PDI: 1.12

P-12

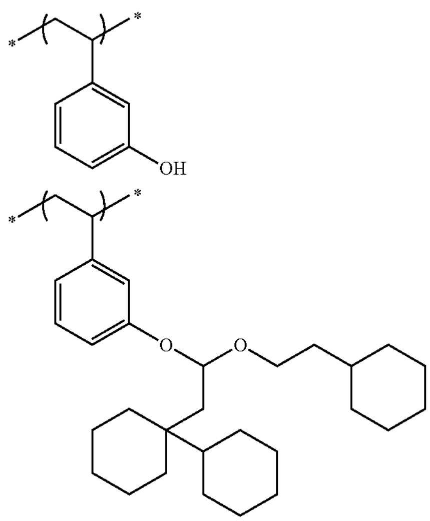

Compositional
ratio: 56/44
Mw: 11000
PDI: 1.15

Synthesis Example 13

Synthesis of Resin (P-13)

13.7 g of Resin (P-1) before being dissolved in PGMEA was dissolved in 50 g of tetrahydrofuran (THF) and after adding 8.85 g of triethylamine, the mixture was stirred in an ice water bath. To the reaction solution, 2.27 g of Chloroether Compound $C_{1-4}$ was added dropwise, and the mixture was stirred for 4 hours. A small amount of the reaction solution was sampled and measured for $^1$H-NMR, as a result, the total protection ratio was 49.2%. The reaction was stopped by adding distilled water. THF was removed by distillation under reduced pressure, and the reaction product was dissolved in ethyl acetate. The obtained organic layer was washed with distilled water five times, and the organic layer was added dropwise to 1.5 L of hexane. The obtained precipitate was separated by filtration, then washed with a small amount of hexane and dissolved in 35 g of propylene glycol monomethyl ether acetate (PGMEA), and a low boiling point solvent was removed from the obtained solution in an evaporator to obtain 50.7 g of a PGMEA solution (31.0 mass %) of Resin (P-13).

Synthesis Examples 14 to 16

Synthesis of Resins (P-14) to (P-16)

Resins (P-14) to (P-16) were synthesized by the same method as in Synthesis Example 13 except for changing the resin where a part of hydrogen atom in a phenolic hydroxyl group is protected by a protective group, and the chloroether compound, which were used for the reaction.

The polymer structure, weight average molecular weight (Mw) and polydispersity (Mw/Mn) (PDI) of each of Resins (P-13) to (P-16) are shown below. Also, the compositional ratio of respective repeating units in the polymer structure is shown by molar ratio.

P-13

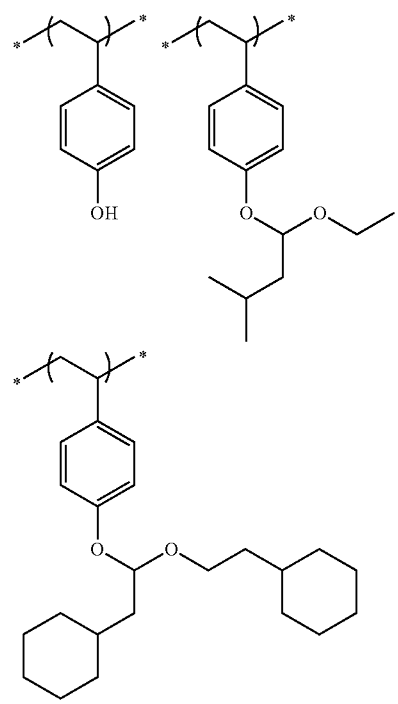

Compositional
ratio: 50/40/10
Mw: 5900
PDI: 1.25

P-14

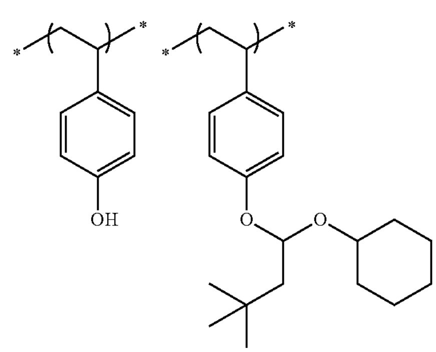

-continued

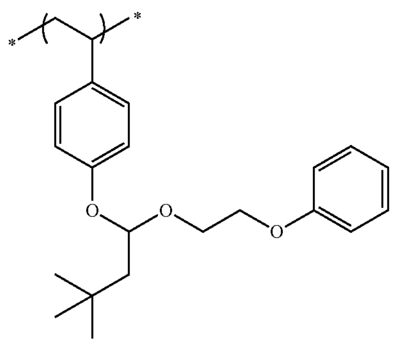

Compositional ratio: 52/28/20
Mw: 6000
PDI: 1.25

P-15

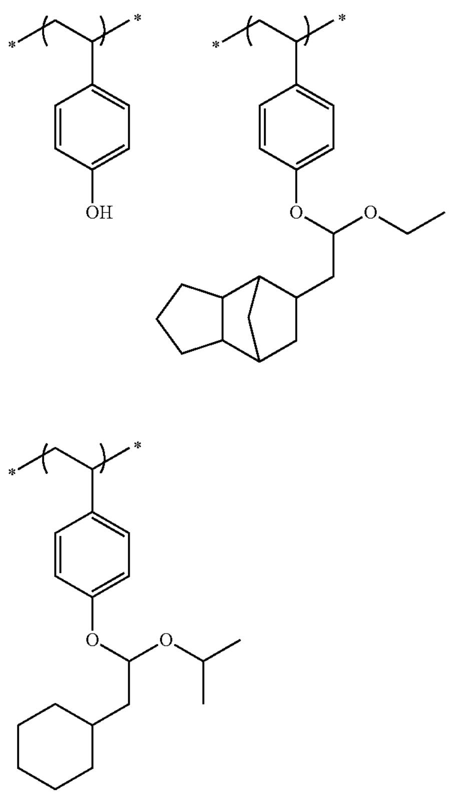

Compositional ratio: 50/25/25
Mw: 6200
PDI: 1.18

P-16

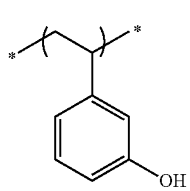

-continued

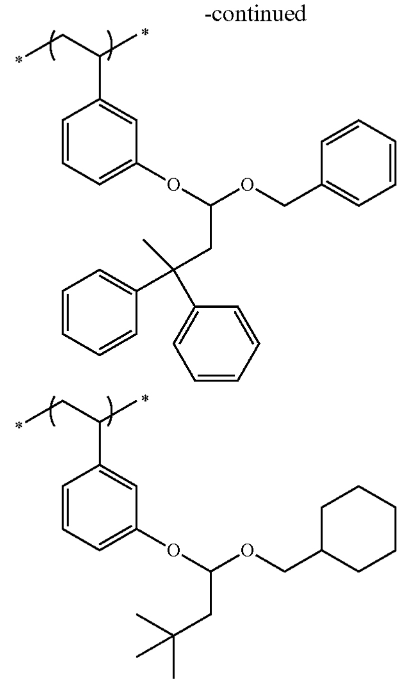

Compositional ratio: 52/28/20
Mw: 7500
PDI: 1.20

Synthesis Example 19

Synthesis of Resin (P-19)

13.7 g of Resin (P-3) before being dissolved in PGMEA was dissolved in 40 g of N,N-dimethylformamide (DMF) and after adding 6.58 g of pyridine, 0.92 g of 2-sulfobenzoic anhydride (hereinafter, sometimes simply referred to as SN-1) as a sulfonating agent and 122 mg of N,N-dimethylaminopyridine, the mixture was stirred at room temperature for 5 hours. The reaction solution was transferred to a separating funnel containing 100 mL of ethyl acetate, and the organic layer was washed with 100 mL of saturated brine five times. Furthermore, the organic layer was concentrated in an evaporator to remove ethyl acetate.

The obtained polymer was dissolved in 30 mL of tetrahydrofuran (THF) and 10 mL of methanol and after adding 1.72 g of triphenylsulfonium bromide (hereinafter, sometimes simply referred to as PG-1) as a PAG precursor, the mixture was stirred at room temperature for 3 hours. The reaction solution was concentrated in an evaporator and then re-dissolved in 100 mL of ethyl acetate, and the organic layer was washed with 100 mL of distilled water five times. The organic layer was concentrated, then dissolved in 50 mL of acetone and added dropwise to 700 mL of a mixed solution of distilled water:methanol=15:1 (volume ratio). The solid obtained by removing the supernatant solution was dissolved in 50 mL of ethyl acetate, and the resulting solution was added dropwise to 700 mL of hexane. The precipitate obtained by removing the supernatant was dissolved in 32 g of PGMEA, and a low boiling solvent was removed from the obtained solution in an evaporator to obtain 49.4 g of a PGMEA solution (35.2 mass %) of Resin (P-19).

Synthesis Example 20

Synthesis of Resin (P-20)

27.4 g of Resin (P-3) before being dissolved in PGMEA was dissolved in 20 g of THF and 20 g of methylene chloride and after adding 20 g of an aqueous 1 N-NaOH solution, 1.2 g of tetrabutylammonium hydrogensulfate and 10.2 g of sodium pentafluorobenzenesulfonate, the mixture was stirred at room temperature for 2 hours. To the reaction solution, 11.5 g of triphenylsulfonium bromide and 10 mL of methanol were further added, and the resulting mixture was stirred at room temperature for 1 hour. The reaction solution was transferred to a separating funnel containing 300 mL of ethyl acetate, and the organic layer was washed with 50 mL of distilled water five times. Furthermore, the organic layer was concentrated in an evaporator, and the obtained polymer was dissolved in 300 mL of acetone. This solution was added dropwise to 3,000 g of hexene and reprecipitated, and the precipitate obtained by removing the supernatant was dissolved in 32 g of PGMEA. A low boiling point solvent was removed from the obtained solution in an evaporator to obtain 50.5 g of a PGMEA solution (36.6 mass %) of Resin (P-20).

Synthesis Examples 21 to 26

Synthesis of Resins (P-21) to (P-26)

Resins (P-21) to (P-26) were synthesized in accordance with the methods described in Synthesis Example 19 and Synthesis Example 20.

The polymer structure, weight average molecular weight (Mw) and polydispersity (Mw/Mn) (PDI) of each of Resins (P-19) to (P-26) are shown below. Also, the compositional ratio of respective repeating units in the polymer structure is shown by molar ratio.

P-19

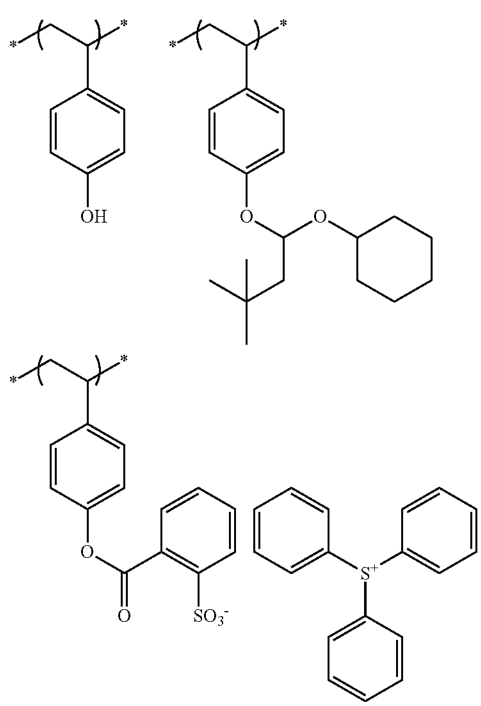

Compositional ratio: 45/40/15
Mw: 12000
PDI: 1.17

-continued

P-20

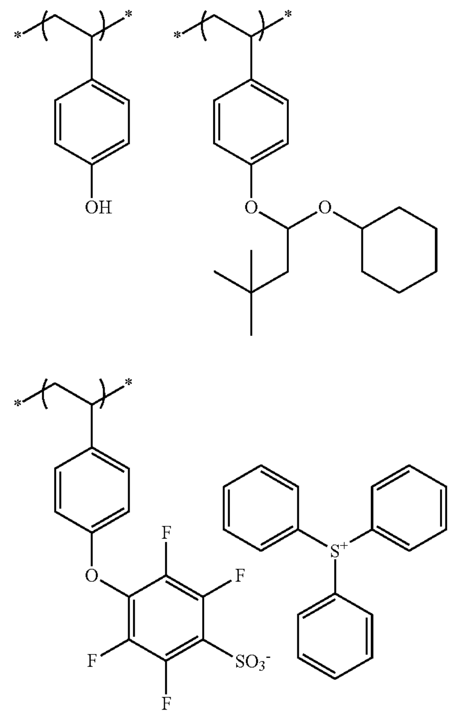

Compositional ratio: 43/40/17
Mw: 12800
PDI: 1.19

P-21

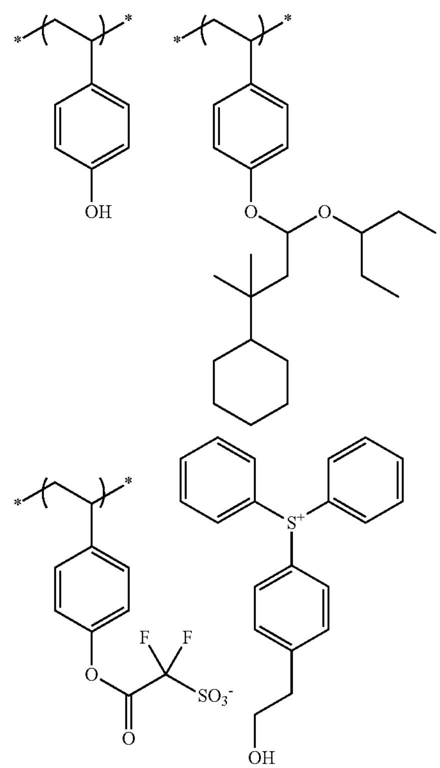

Compositional ratio: 60/33/7
Mw: 10000
PDI: 1.16

-continued
P-22
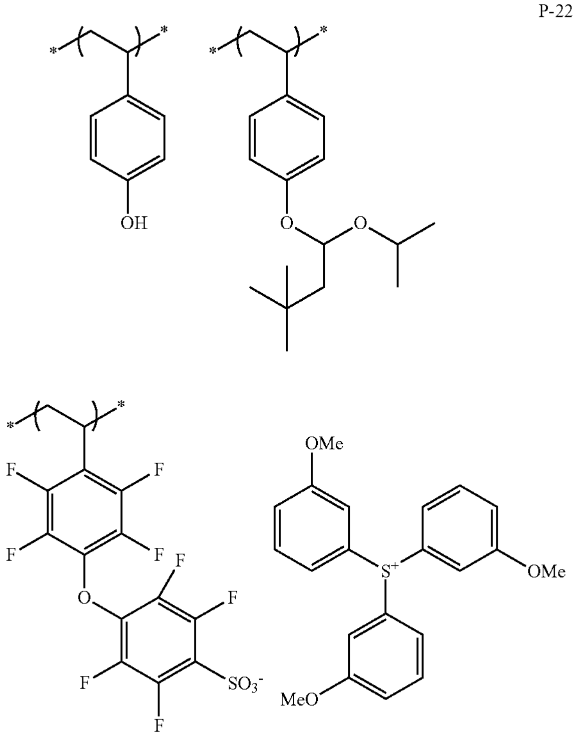
Compositional ratio: 54/30/16
Mw: 13200
PDI: 1.10
P-23
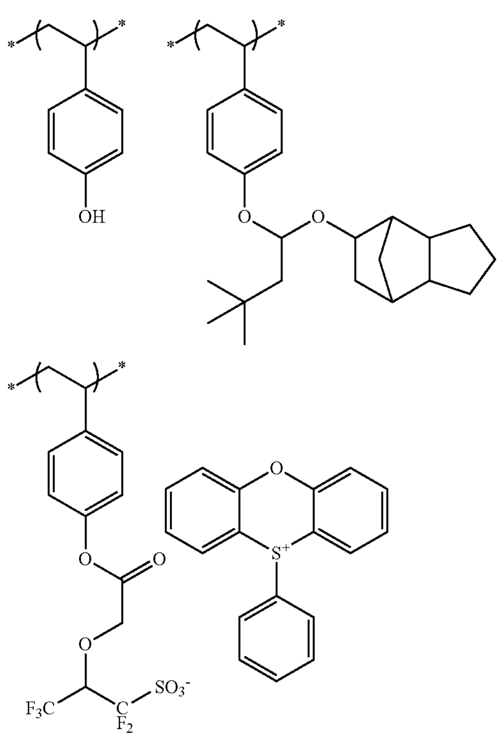
Compositional ratio: 45/40/15
Mw: 12600
PDI: 1.20
-continued
P-24
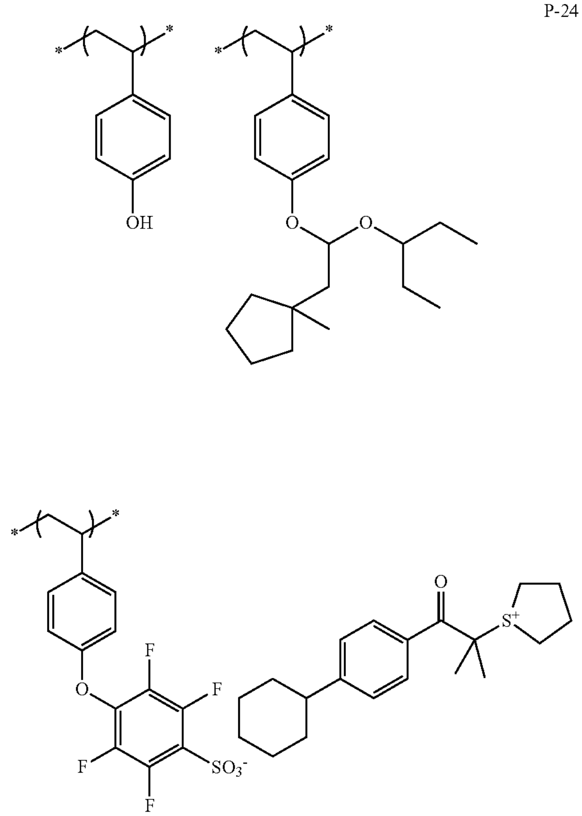
Compositional ratio: 40/50/10
Mw: 11000
PDI: 1.22
P-25
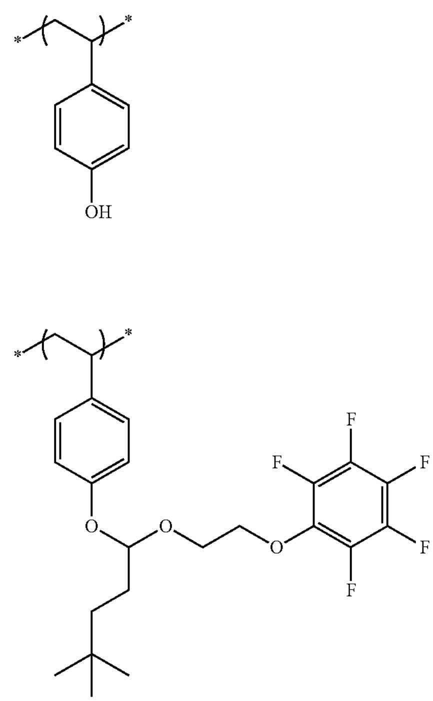

-continued

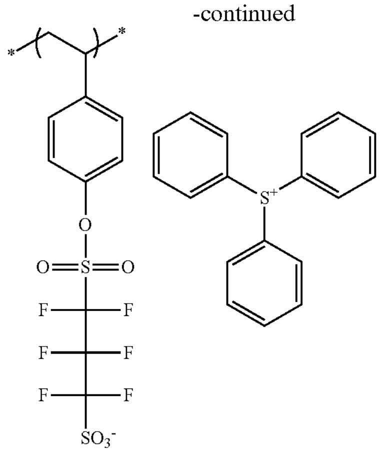

Compositional ratio: 65/20/15
Mw: 13000
PDI: 1.26

P-26

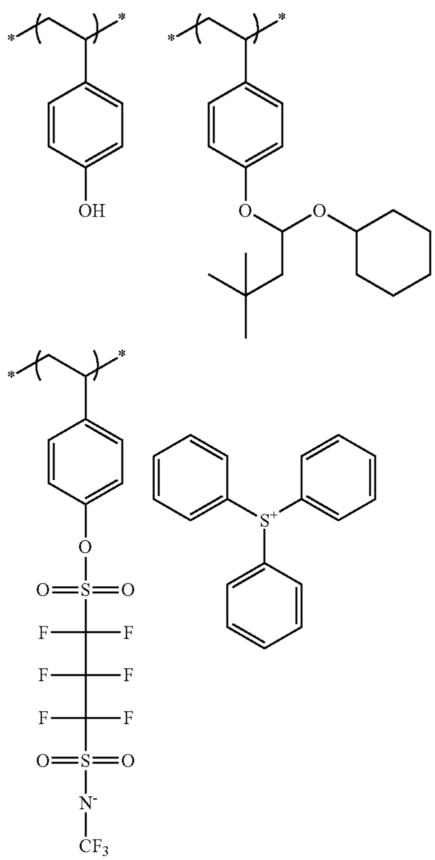

Compositional ratio: 61/34/5
Mw: 13800
PDI: 1.30

Synthesis Example 35

Synthesis of Resin (P-35)

11.0 g of 1-methoxy-2-propanol was heated at 70° C. in a nitrogen stream, and while stirring this solution, a mixed solution containing 10.0 g of Monomer (M-1) shown below, 18.8 g of Monomer (M-2), 43.96 g of 1-methoxy-2-propanol and 6.35 g of dimethyl 2,2'-azobisisobutyrate [V-601, produced by Wako Pure Chemical Industries, Ltd.] was added dropwise over 2 hours. After the completion of dropwise addition, the solution was further stirred at 70° C. for 4 hour. The reaction solution was left standing to cool, then reprecipitated from a large amount of hexane/ethyl acetate and vacuum-dried to obtain 17.28 g of Resin (P-35).

M-1

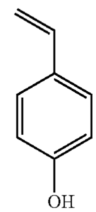

M-2

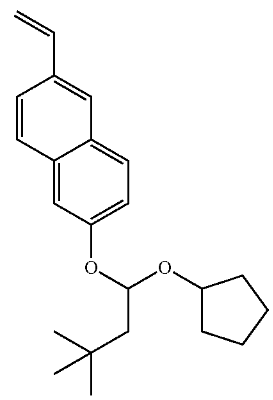

Synthesis Examples 17, 18, 27 to 34, and 38 to 42

Synthesis of Resin (P-17), Resin (P-18), Resins (P-27) to (P-34) and Resins (P-38) to (P-42)

Resin (P-17), Resin (P-18), Resins (P-27) to (P-34) and Resins (P-38) to (P-42) were synthesized in accordance with the method described in Synthesis Example 35.

The polymer structure, weight average molecular weight (Mw) and polydispersity (Mw/Mn) (PDI) of each of Resin (P-17), Resin (P-18), Resins (P-27) to (P-35) and Resins (P-38) to (P-42) are shown below. Also, the compositional ratio of respective repeating units in the polymer structure is shown by molar ratio.

P-17

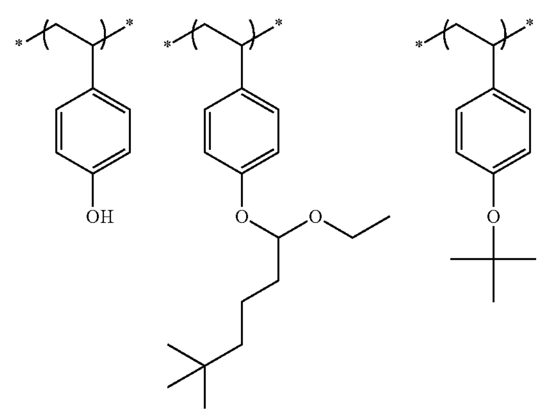

Compositional ratio: 52/28/20
Mw: 6300
PDI: 1.20

-continued
P-18
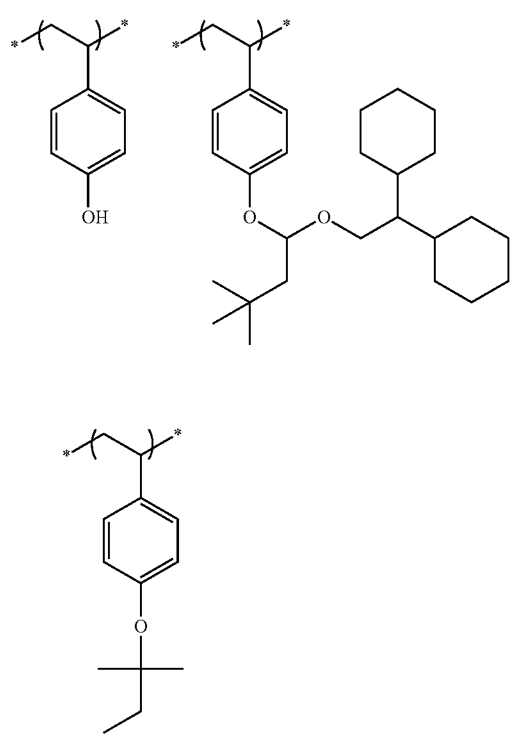
Compositional ratio: 53/30/15
Mw: 6500
PDI: 1.25
P-27
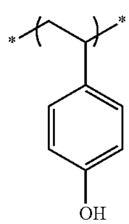
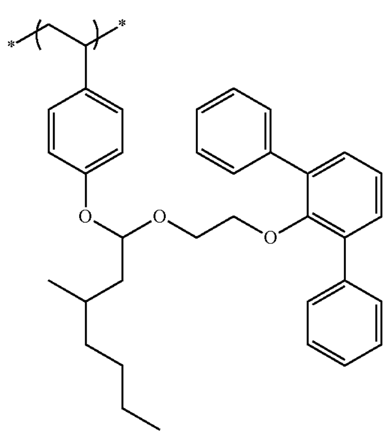
-continued
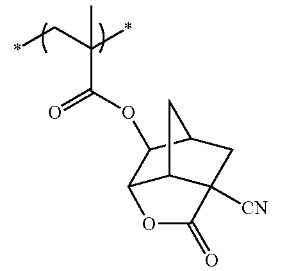
Compositional ratio: 42/20/38
Mw: 7200
PDI: 1.52
P-28
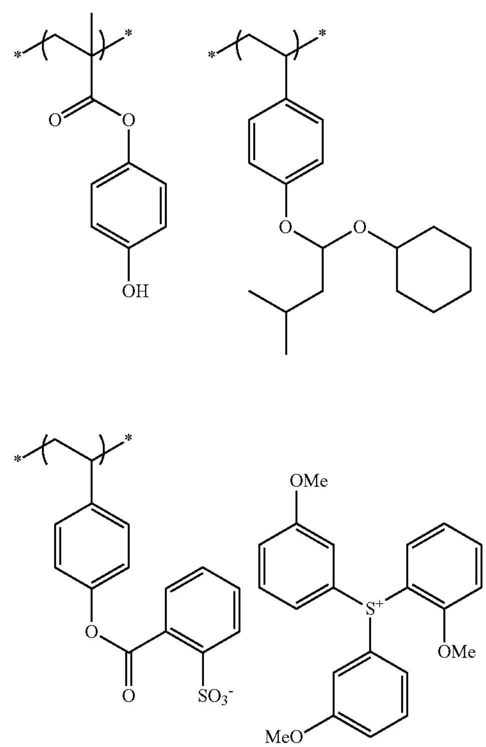
Compositional ratio: 34/55/11
Mw: 12600
PDI: 1.60
P-29
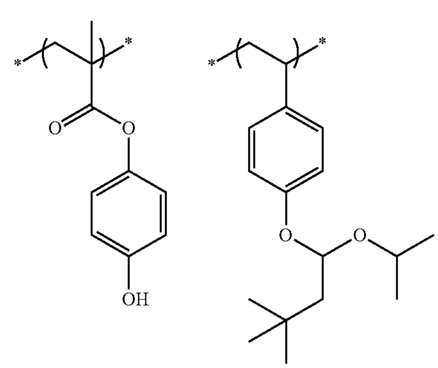

-continued
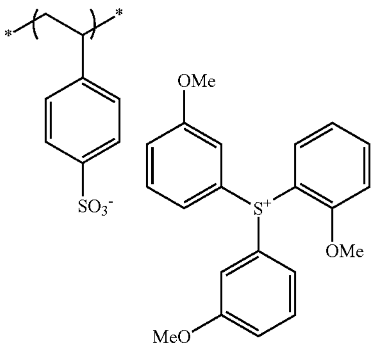
Compositional ratio: 39/56/5
Mw: 11700
PDI: 1.56
P-30
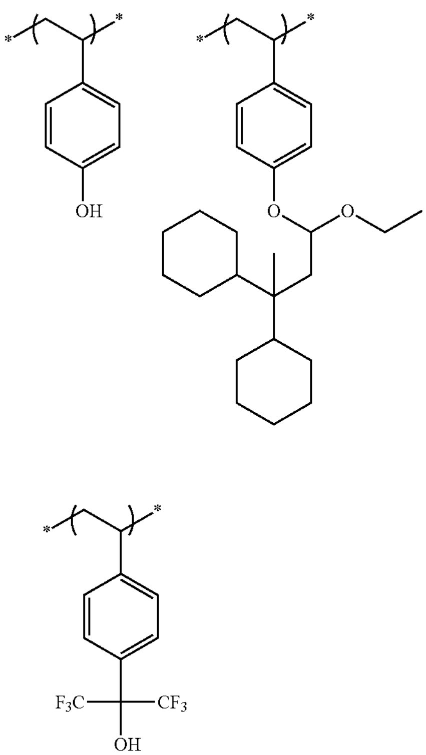
Compositional ratio: 42/21/37
Mw: 5800
PDI: 1.44
P-31
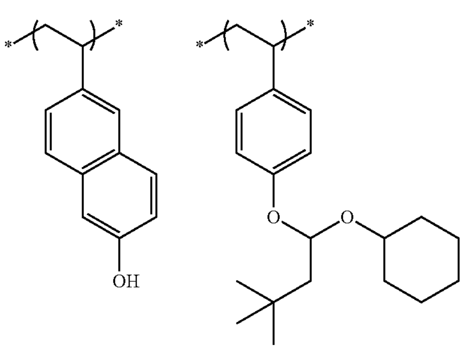
-continued
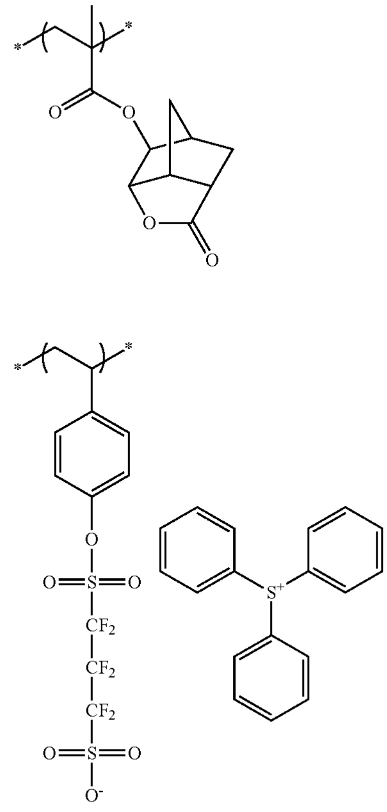
Compositional ratio: 41/40/10/9
Mw: 13400
PDI: 1.63
P-32
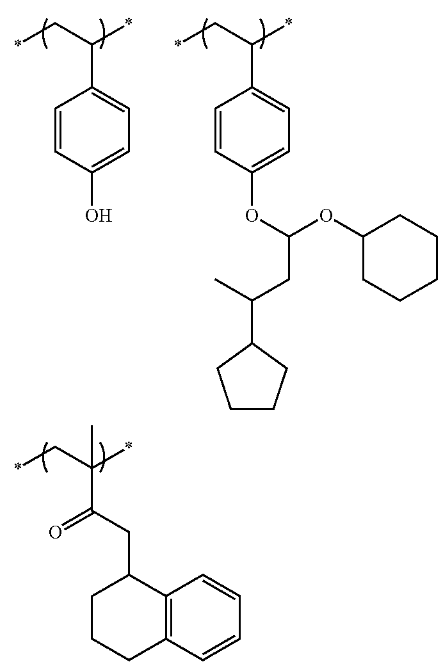
Compositional ratio: 39/42/19
Mw: 6200
PDI: 1.49

-continued
P-33
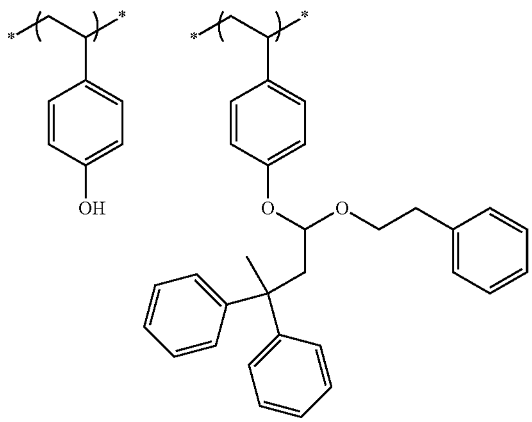
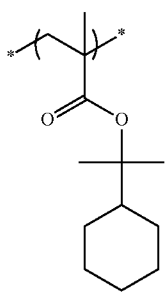
Compositional ratio: 60/20/20
Mw: 6400
PDI: 1.68
P-34
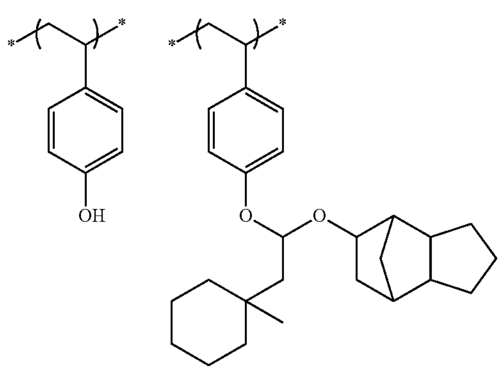
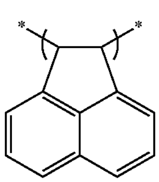
-continued
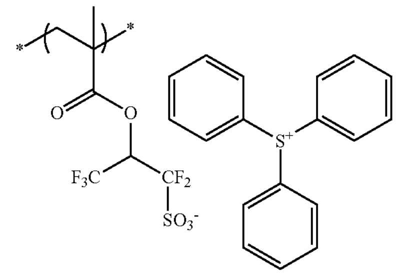
Compositional ratio: 30/45/10/15
Mw: 11800
PDI: 1.55
P-35
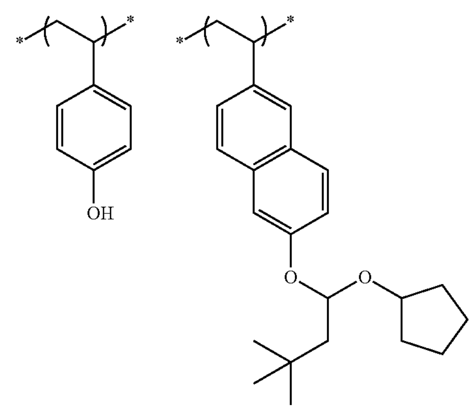
Compositional ratio: 60/40
Mw: 5400
PDI: 1.66
P-38
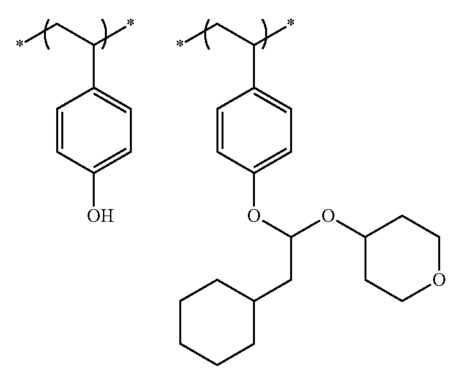
Compositional ratio: 60/40
Mw: 6300
PDI: 1.20

-continued

P-39

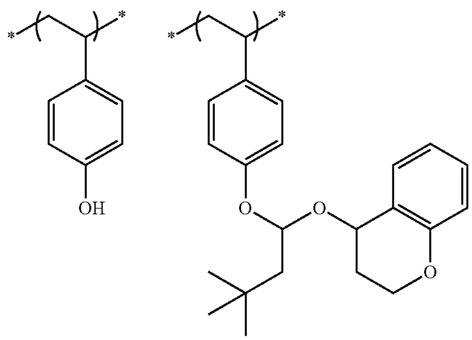

Compositional ratio: 55/45
Mw: 6500
PDI: 1.13

P-40

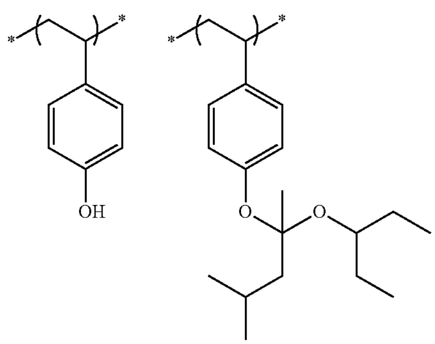

Compositional ratio: 63/37
Mw: 5900
PDI: 1.23

P-41

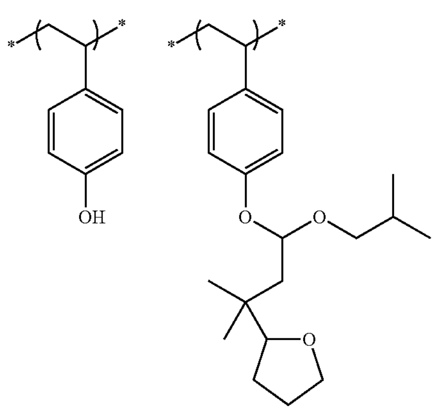

Compositional ratio: 55/45
Mw: 6200
PDI: 1.25

-continued

P-42

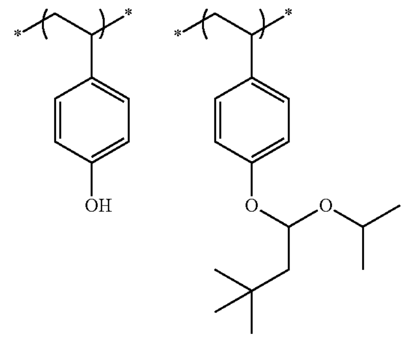

Compositional ratio: 48/52
Mw: 6000
PDI: 1.18

Synthesis Examples 43 to 48

Synthesis of Resins (P-43) to (P-48)

Resins (P-43) to (P-48) were synthesized by the same method as in Synthesis Example 1 except for appropriately changing the polyhydroxystyrene compound and chloroether compound used.

TABLE 3

| | Resin | Polyhydroxystyrene Compound | Chloroether Compound |
|---|---|---|---|
| Synthesis Example 43 | P-43 | VP-2500 | C1-13 |
| Synthesis Example 44 | P-44 | VP-2500 | C1-14 |
| Synthesis Example 45 | P-45 | VP-2500 | C1-15 |
| Synthesis Example 46 | P-46 | VP-2500 | C1-16 |
| Synthesis Example 47 | P-47 | VP-2500 | C1-17 |
| Synthesis Example 48 | P-48 | VP-2500 | C1-18 |

The polymer structure, weight average molecular weight (Mw) and polydispersity (Mw/Mn) (PDI) of each of Resins (P-43) to (P-48) are shown below. Also, the compositional ratio of respective repeating units in the polymer structure is shown by molar ratio.

P-43

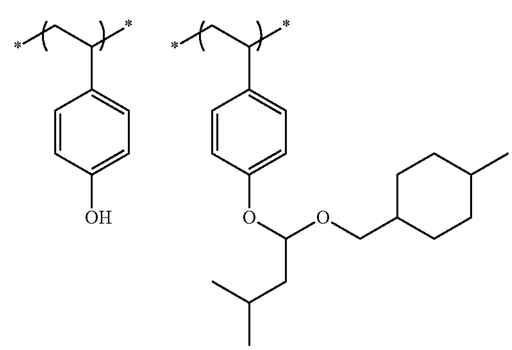

Compositional ratio: 70/30
Mw: 6200
PDI: 1.16

-continued

P-44

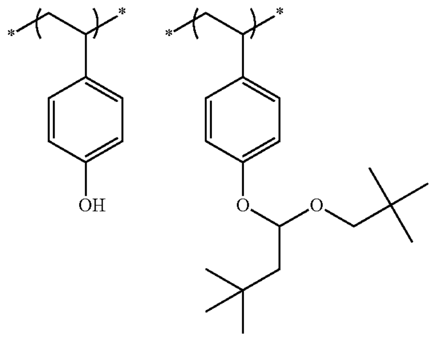

Compositional ratio: 72/28
Mw: 6100
PDI: 1.22

P-45

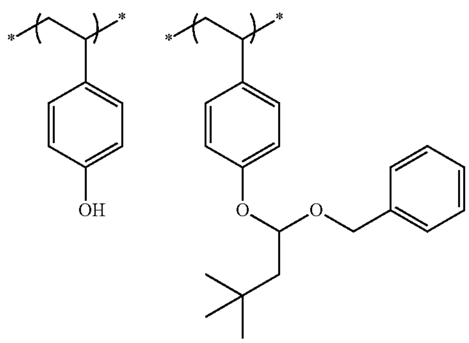

Compositional ratio: 65/35
Mw: 6500
PDI: 1.18

P-46

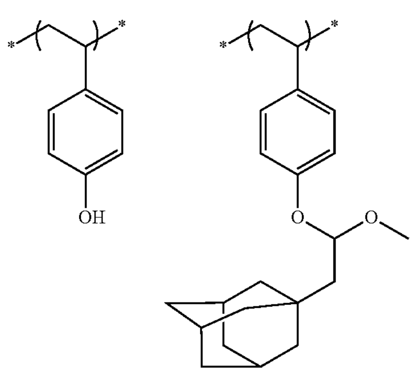

Compositional ratio: 80/20
Mw: 6800
PDI: 1.21

-continued

P-47

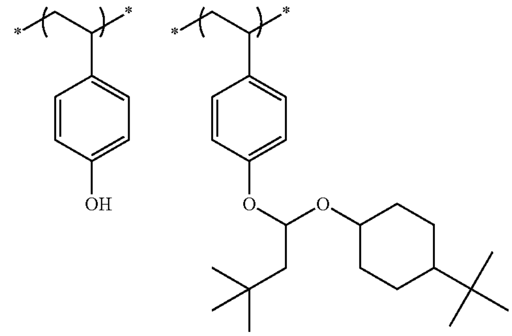

Compositional ratio: 78/22
Mw: 5900
PDI: 1.19

P-48

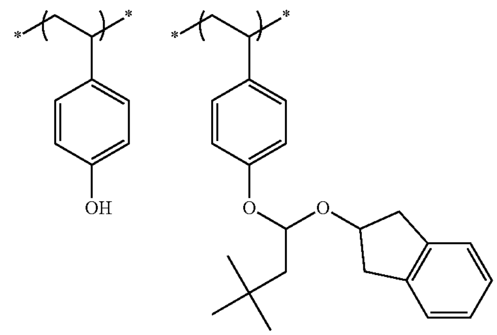

Compositional ratio: 80/20
Mw: 6200
PDI: 1.23

Synthesis Examples 49 to 52

Synthesis of Resins (P-49) to (P-52)

Resins (P-49) to (P-52) were synthesized in accordance with the methods described in Synthesis Examples 19 and 20.

The polymer structure, weight average molecular weight (Mw) and polydispersity (Mw/Mn) (PDI) of each of Resins (P-49) to (P-52) are shown below. Also, the compositional ratio of respective repeating units in the polymer structure is shown by molar ratio.

P-49

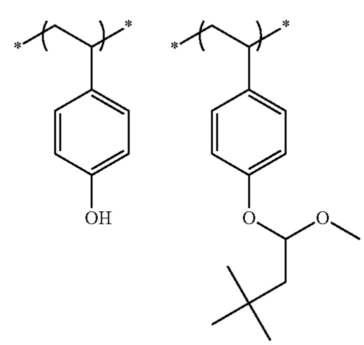

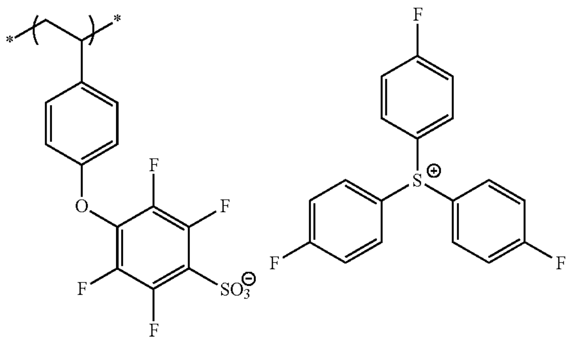
Compositional ratio: 40/51/9
Mw: 11100
PDI: 1.22
P-50
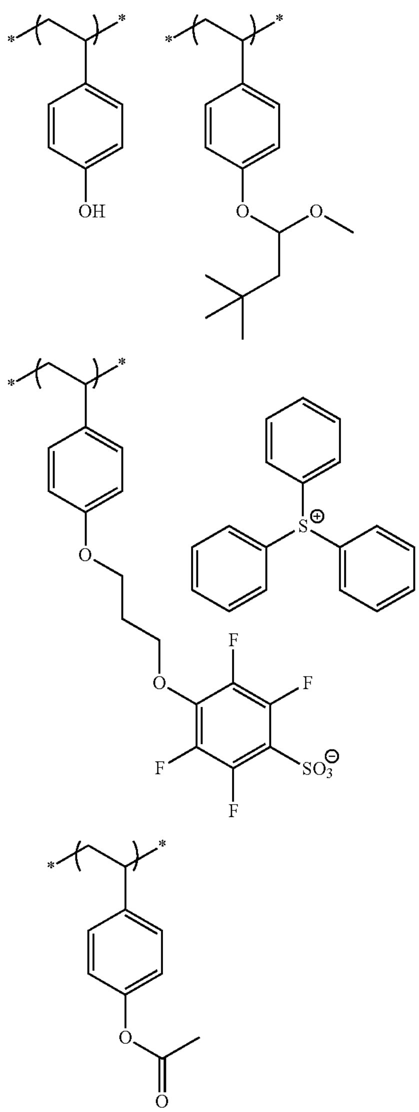
Compositional ratio: 40/45/10/5
Mw: 10800
PDI: 1.18
P-51
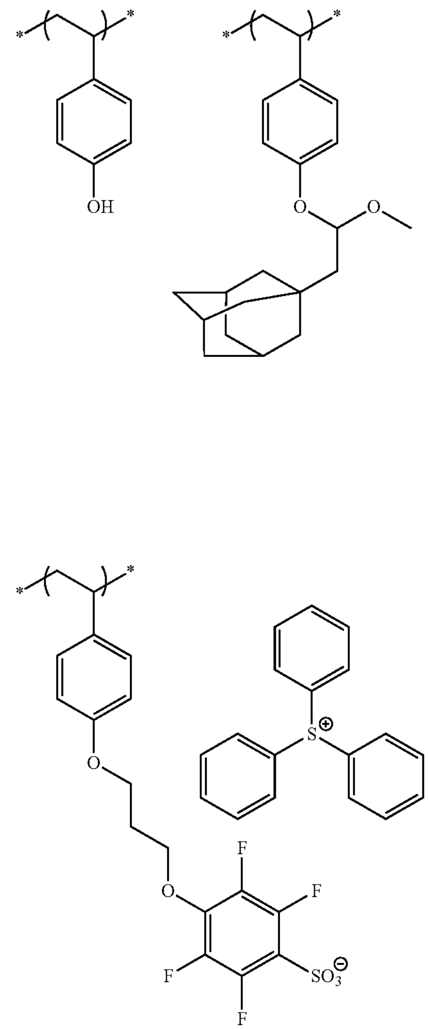
Compositional ratio: 55/35/10
Mw: 11800
PDI: 1.19
P-52
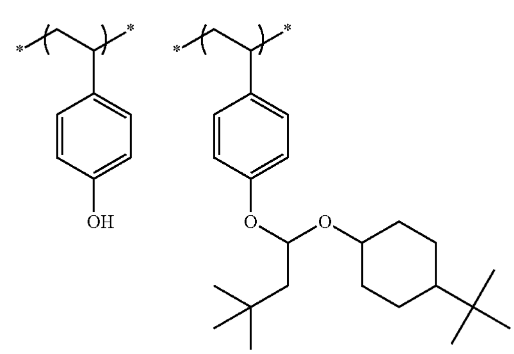

-continued

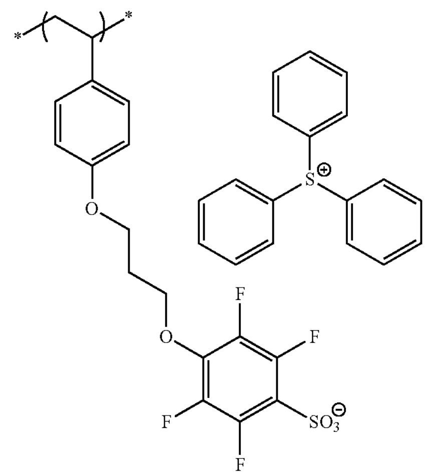

Compositional ratio: 55/35/10
Mw: 11800
PDI: 1.19

Synthesis Examples 36 and 37

Synthesis of Compounds (P-36) to (P-37)

Compounds (P-36) and (P-37) were synthesized by the same method as in Synthesis Example 1 except for changing the polyhydroxystyrene compound to 4-tert-butylcalix[8] arene or 1,3,5-tri(1',1'-di(4-hydroxyphenyl)ethyl)benzene and changing the chloroether compound. In the following formulae, * indicates a bond to the oxygen atom in the phenolic hydroxyl group.

P-36

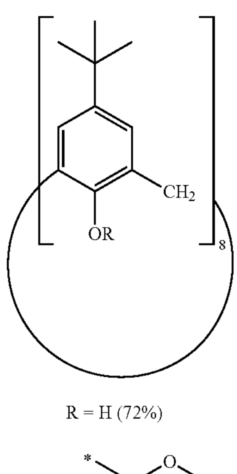

R = H (72%)

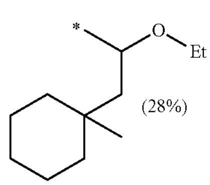

(28%)

-continued

P-37

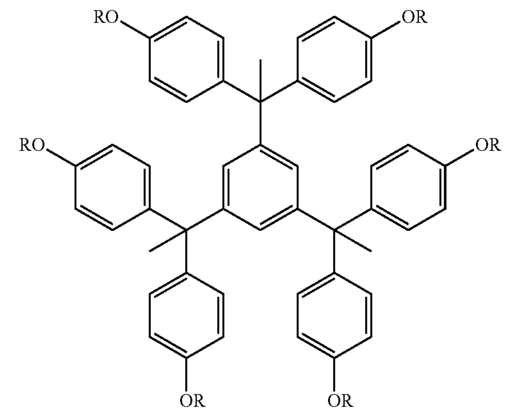

R = H (67%)

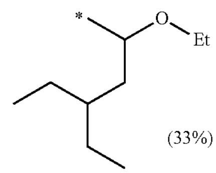

(33%)

In Examples, Resins (RP-1) to (RP-4) used together with the resin above are as follows. Also, Resins (R-1) to (R-5) shown below ere used for Comparative Examples. The polymer structure, weight average molecular weight (Mw) and polydispersity (Mw/Mn) (PDI) of each of Resins (RP-1) to (RP-4) and Resins (R-1) to (R-5) are shown below. Also, the compositional ratio of respective repeating units in the polymer structure is shown by molar ratio.

RP-1

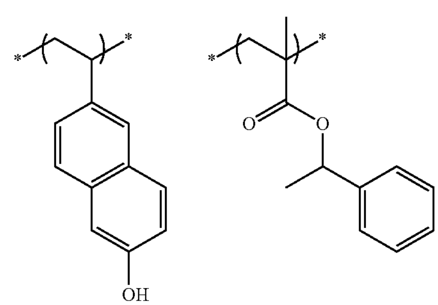

Compositional ratio: 35/65
Mw: 9200
PDI: 1.60

RP-2

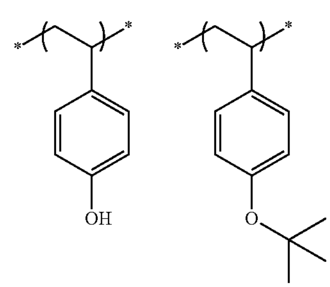

Compositional ratio: 50/50
Mw: 5800
PDI: 1.12

RP-3
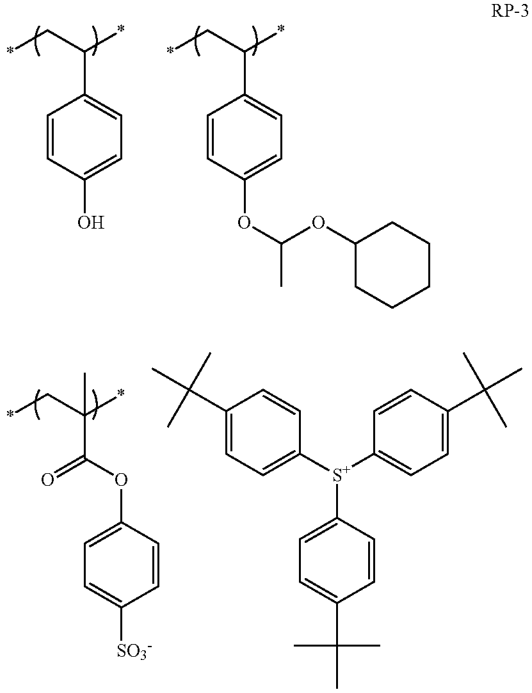
Compositional ratio: 50/40/10
Mw: 14000
PDI: 2.10
RP-4
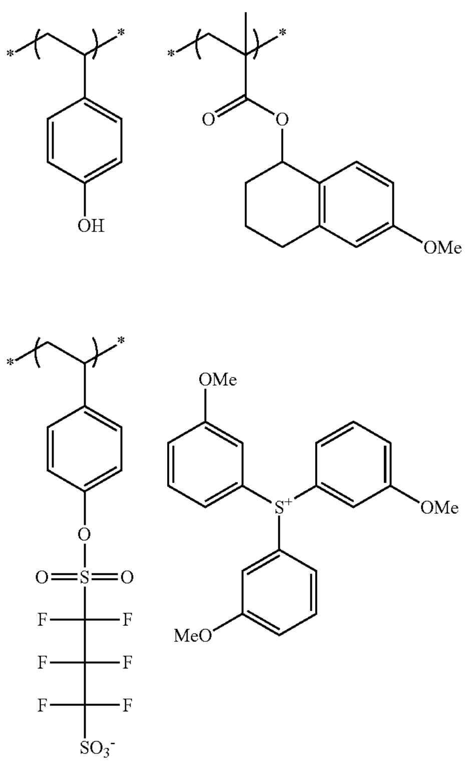
Compositional ratio: 65/20/15
Mw: 15000
PDI: 1.92
R-1
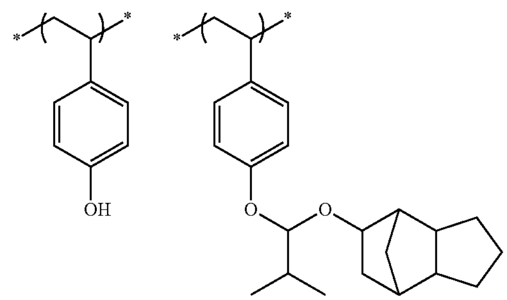
Compositional ratio: 67/33
Mw: 6700
PDI: 1.23
R-2
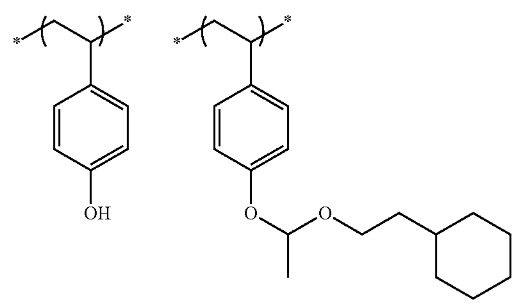
Compositional ratio: 57/43
Mw: 6300
PDI: 1.17
R-3
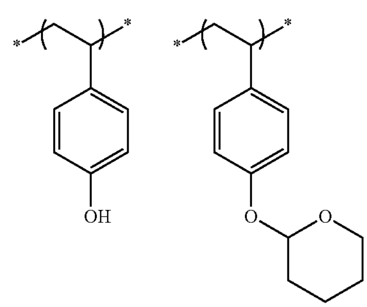
Compositional ratio: 50/50
Mw: 5900
PDI: 1.12
R-4
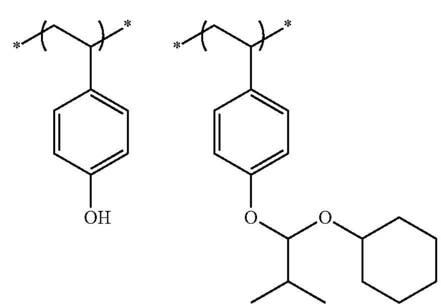

-continued
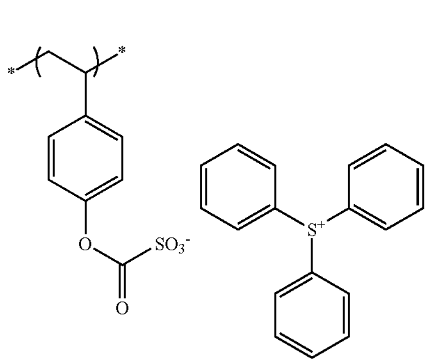
Compositional ratio: 45/40/15
Mw: 12000
PDI: 1.19
-continued
R-5
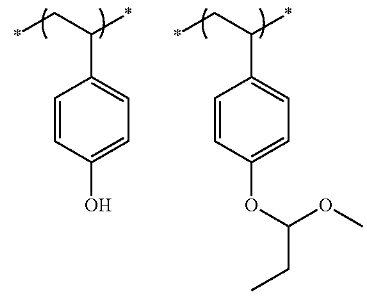
Compositional ratio: 50/50
Mw: 6200
PDI: 1.22
[Photoacid Generator]
As the photoacid generator, the compounds represented by the following formulae were used.
PAG-1
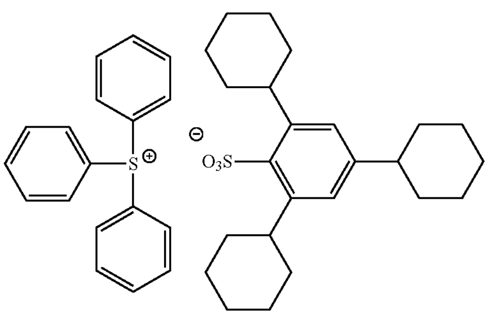
PAG-2
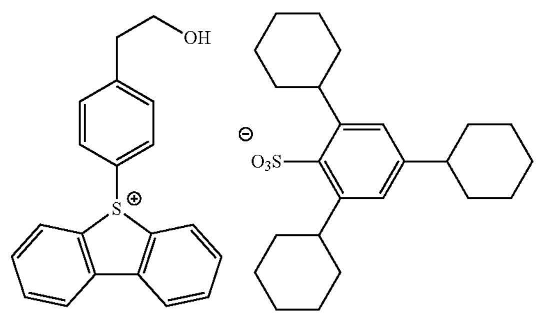
PAG-3
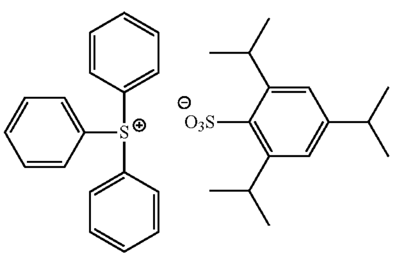
PAG-4
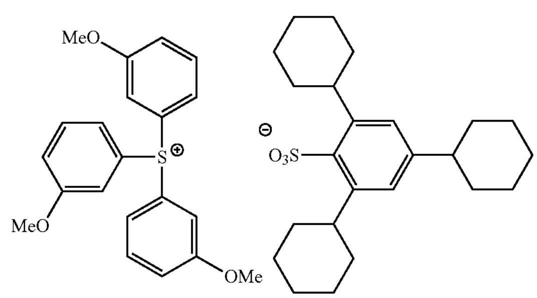
PAG-5
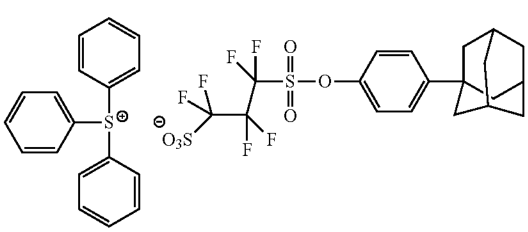
PAG-6
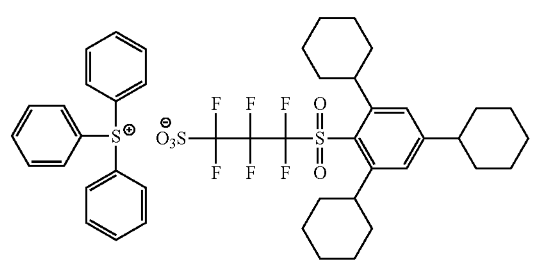

-continued
PAG-7
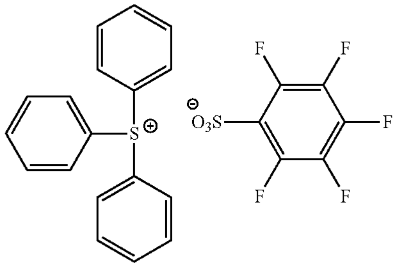
PAG-8
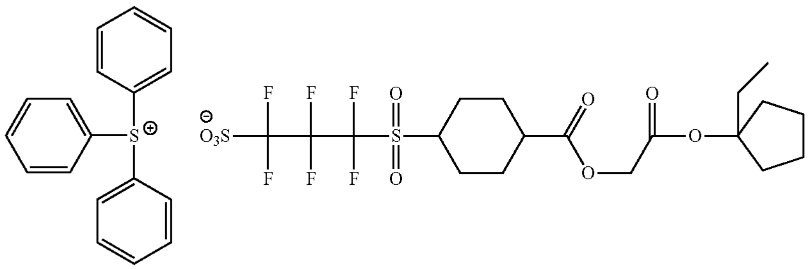
[Basic Compound]
As the basic compound, any one of the following compounds (N-1) to (N-11) was used.
N-1
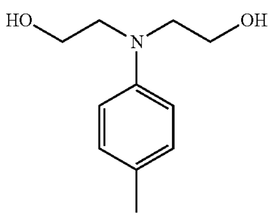
N-2
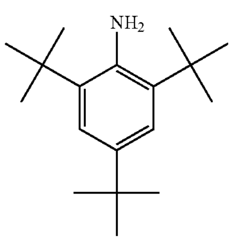
N-3
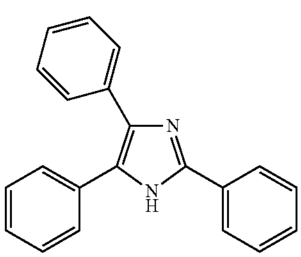
N-4
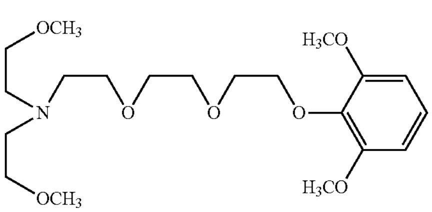
-continued
N-5
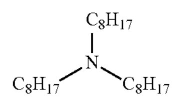
N-6
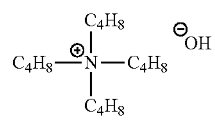
N-7
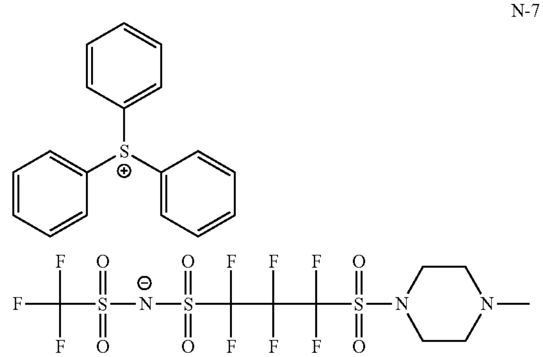
N-8
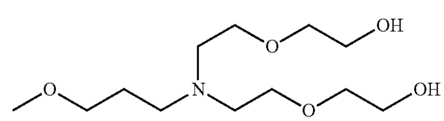
N-9
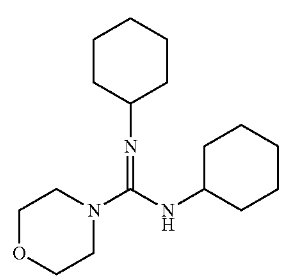

-continued

N-10

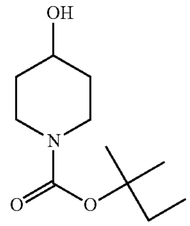

N-11

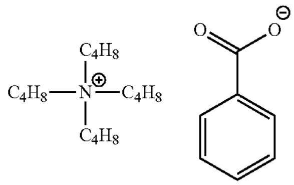

Synthesis Example 53

Compound N-7

Compound (N-7) comes under the compound (PA) and was synthesized based on the description in paragraph [0354] of JP-A-2006-330098.

[Surfactant and Solvent]

As the surfactant, the following W-1 to W-3 were used.

W-1: Megaface R08 (produced by Dainippon Ink & Chemicals, Inc., fluorine- and silicon-containing)

W-2: Polysiloxane Polymer KP-341 (produced by Shin-Etsu Chemical Co., Ltd.; silicon-containing)

W-3: Troysol S-366 (produced by Troy Chemical; fluorine-containing)

As the solvent, the following S1 and S2 were appropriately mixed and used.

S1: PGMEA (b.p.=146° C.)

S2: PGME (b.p.=120° C.)

<Evaluation of Resist>

The components shown in Tables 4 and 5 below were dissolved in the solvent to prepare a solution having a solid content concentration of 4 mass %, and this solution was filtered through a polytetrafluoroethylene filter having a pore size of 0.10 μm to prepare an actinic ray-sensitive or radiation-sensitive resin composition (resist composition). The actinic ray-sensitive or radiation-sensitive resin composition was evaluated by the following methods, and the results are shown in Tables 4 and 5.

With respect to each of the components in the Tables below, when a plurality of kinds were used, the ratio is the mass ratio.

(Exposure Condition 1: EB (Electron Beam) Exposure) Examples 1-1 to 1-68 and Comparative Examples 1-1 to 1-5:

The actinic ray-sensitive or radiation-sensitive resin composition prepared was uniformly coated on a hexamethyldisilazane-treated silicon substrate by using a spin coater and dried under heating on a hot plate at 120° C. for 90 seconds to form an actinic ray-sensitive or radiation-sensitive film (resist film) having a thickness of 100 nm. This actinic ray-sensitive or radiation-sensitive film was irradiated with an electron beam by using an electron beam irradiation apparatus (HL750, manufactured by Hitachi, Ltd., accelerating voltage: 50 KeV). Immediately after the irradiation, the resist film was baked on a hot plate at 110° C. for seconds, then developed at 23° C. for 60 seconds by using an aqueous tetramethylammonium hydroxide solution having a concentration of 2.38 mass %, rinsed with pure water for 30 seconds, and spin-dried to obtain a resist pattern.

(Exposure Condition 2: EUV (Extreme-Ultraviolet Ray) Exposure) Examples 2-1 to 2-68 and Comparative Examples 2-1 to 2-5:

The actinic ray-sensitive or radiation-sensitive resin composition prepared was uniformly coated on a hexamethyldisilazane-treated silicon substrate by using a spin coater and dried under heating on a hot plate at 120° C. for 90 seconds to form an actinic ray-sensitive or radiation-sensitive film (resist film) having a thickness of 100 nm. The wafer coated with this resist film was patternwise exposed using an EUV exposure apparatus (Micro Exposure Tool, manufactured by Exitech, NA: 0.3, Quadrupole, outer sigma: 0.68, inner sigma: 0.36) through an exposure mask (line/space=1/1). Immediately after the exposure, the resist film was baked on a hot plate at 110° C. for 90 seconds, then developed at 23° C. for 60 seconds by using an aqueous tetramethylammonium hydroxide solution having a concentration of 2.38 mass %, rinsed with pure water for 30 seconds, and spin-dried to obtain a resist pattern.

(Evaluation of Sensitivity (EB Exposure))

The cross-sectional profile of the obtained pattern was observed using a scanning electron microscope (S-9220, manufactured by Hitachi, Ltd.), and the minimum irradiation energy below which the line-and-space pattern (line:space=1:1) having a line width of 100 nm is not resolved was taken as the sensitivity. A smaller value indicates higher sensitivity.

(Evaluation of Sensitivity (EUV Exposure))

The cross-sectional profile of the obtained pattern was observed using a scanning electron microscope (S-9220, manufactured by Hitachi, Ltd.), and the minimum irradiation energy below which the line-and-space pattern (line:space=1:1) having a line width of 50 nm is not resolved was taken as the sensitivity. A smaller value indicates higher sensitivity.

(Evaluation of Resolution)

The limiting resolution (the minimum line width below which the line and the space were not separated and resolved) at the irradiation dose giving the sensitivity above was taken as the resolution.

(Evaluation of Exposure Latitude (EL) (EB Exposure))

The exposure dose when reproducing a line-and-space pattern (line:space=1:1) having a line width of 100 nm was taken as an optimum exposure dose. The exposure dose range allowing for a pattern size of 100 nm±20% when changing the exposure dose was determined, and this value was divided by the optimum exposure dose and expressed in percentage. As the value is larger, the performance change due to change in the exposure dose is smaller and the exposure latitude is better.

(Evaluation of Exposure Latitude (EL) (EUV Exposure))

The exposure dose when reproducing a line-and-space pattern (line:space=1:1) having a line width of 50 nm was taken as an optimum exposure dose. The exposure dose range allowing for a pattern size of 50 nm±10% when changing the exposure dose was determined, and this value was divided by the optimum exposure dose and expressed in percentage. As the value is larger, the performance change due to change in the exposure dose is smaller and the exposure latitude is better.

(Evaluation of Pattern Profile (EB Exposure))

The cross-sectional profile of the line-and-space pattern (line:space=1:1) with a line width of 100 nm at the irradiation dose giving the sensitivity above was observed using a scanning electron microscope (S-4300, manufactured by Hitachi, Ltd.) and evaluated at respective levels of "rectangular", "slightly tapered", "slightly reverse tapered", "tapered", and "reverse tapered".

(Evaluation of Pattern Profile (EUV Exposure))

The cross-sectional profile of the line-and-space pattern (line:space=1:1) with a line width of 50 nm at the irradiation dose giving the sensitivity above was observed using a scanning electron microscope (S-4300, manufactured by Hitachi, Ltd.) and evaluated at respective levels of “rectangular”, “slightly tapered”, “slightly reverse tapered”, “tapered”, and “reverse tapered”.

(Outgas Performance: Percentage Variation in Film Thickness Due to Exposure)

The resist film was irradiated with an electron beam or an extreme-ultraviolet ray at an irradiation dose 2.0 times the irradiation dose giving the sensitivity above, and the film thickness after exposure but before post-baking was measured. The percentage variation based on the film thickness when not exposed was determined according to the following formula. A smaller value indicates better performance.

Percentage variation in film thickness (%)=[(film thickness when not exposed−film thickness after exposure)/film thickness when not exposed]×100

These measurement results are shown in Tables 4 and 5. In Tables 4 and 5, the concentration of each component means “mass %” based on the total solid content of the composition.

TABLE 4

| | Acid-Decomposable Compound (mass %) | Photoacid Generator (mass %) | Basic Compound (mass %) | Solvent (mass ratio) | Surfactant (mass %) | Resolution (nm) | EL (%) | Sensitivity (μC/cm$^2$) | Profile | Outgas Performance |
|---|---|---|---|---|---|---|---|---|---|---|
| Example 1-1 | P-1 (64.35) | PAG-1 (35) | N-1 (0.6) | S1/S2 (80/20) | W-3 (0.05) | 50 | 20 | 28.0 | rectangular | 3.5 |
| Example 1-2 | P-2 (64.35) | PAG-1 (35) | N-9 (0.6) | S1/S2 (80/20) | W-3 (0.05) | 62.5 | 20 | 26.5 | rectangular | 4.0 |
| Example 1-3 | P-2 (64.35) | PAG-7 (35) | N-6 (0.6) | S1/S2 (80/20) | W-3 (0.05) | 62.5 | 21 | 21.1 | rectangular | 3.9 |
| Example 1-4 | P-3 (64.35) | PAG-1 (35) | N-8 (0.6) | S1/S2 (80/20) | W-3 (0.05) | 50 | 20 | 22.1 | rectangular | 2.1 |
| Example 1-5 | P-3 (64.35) | PAG-6 (35) | N-6 (0.6) | S1/S2 (80/20) | W-3 (0.05) | 50 | 21 | 22.3 | rectangular | 2.0 |
| Example 1-6 | P-4 (64.35) | PAG-4 (35) | N-9 (0.6) | S1/S2 (80/20) | W-3 (0.05) | 37.5 | 19 | 24.5 | rectangular | 1.2 |
| Example 1-7 | P-5 (64.35) | PAG-4 (35) | N-9 (0.6) | S1/S2 (80/20) | W-2 (0.05) | 37.5 | 19 | 25.1 | rectangular | 1.2 |
| Example 1-8 | P-6 (64.35) | PAG-2 (35) | N-8 (0.6) | S1/S2 (80/20) | W-3 (0.05) | 37.5 | 20 | 21.3 | rectangular | 1.8 |
| Example 1-9 | P-6 (64.35) | PAG-6 (35) | N-3 (0.6) | S1/S2 (80/20) | W-3 (0.05) | 37.5 | 21 | 22.1 | rectangular | 1.8 |
| Example 1-10 | P-7 (64.65) | PAG-4 (35) | N-10 (0.3) | S1/S2 (80/20) | W-3 (0.05) | 37.5 | 21 | 15.3 | rectangular | 2.2 |
| Example 1-11 | P-7 (64.35) | PAG-5 (35) | N-8 (0.6) | S1/S2 (80/20) | W-3 (0.05) | 37.5 | 23 | 22.1 | rectangular | 2.2 |
| Example 1-12 | P-7 (64.35) | PAG-6 (35) | N-3 (0.6) | S1/S2 (80/20) | W-3 (0.05) | 37.5 | 23 | 23.1 | rectangular | 2.5 |
| Example 1-13 | P-8 (64.35) | PAG-1 (35) | N-10 (0.6) | S1/S2 (80/20) | W-3 (0.05) | 37.5 | 20 | 21.4 | rectangular | 2.0 |
| Example 1-14 | P-9 (64.35) | PAG-1 (35) | N-4 (0.6) | S1/S2 (80/20) | W-2 (0.05) | 50 | 23 | 21.4 | rectangular | 2.6 |
| Example 1-15 | P-10 (64.35) | PAG-1 (35) | N-4 (0.6) | S1/S2 (80/20) | W-3 (0.05) | 72.5 | 22 | 23.6 | rectangular | 4.0 |
| Example 1-16 | P-11 (64.35) | PAG-1 (35) | N-4 (0.6) | S1/S2 (80/20) | W-3 (0.05) | 37.5 | 23 | 21.3 | rectangular | 2.3 |
| Example 1-17 | P-12 (64.35) | PAG-1 (35) | N-4 (0.6) | S1/S2 (80/20) | W-1 (0.05) | 37.5 | 21 | 22.1 | rectangular | 1.9 |
| Example 1-18 | P-13 (64.35) | PAG-8 (35) | N-4 (0.6) | S1/S2 (80/20) | W-3 (0.05) | 50 | 19 | 22.1 | rectangular | 3.2 |
| Example 1-19 | P-14 (64.35) | PAG-8 (35) | N-4 (0.6) | S1/S2 (80/20) | W-3 (0.05) | 62.5 | 21 | 23.1 | rectangular | 3.5 |
| Example 1-20 | P-15 (64.35) | PAG-1 (35) | N-4 (0.6) | S1/S2 (80/20) | W-2 (0.05) | 37.5 | 23 | 21.3 | rectangular | 2.3 |
| Example 1-21 | P-16 (64.35) | PAG-1 (35) | N-4 (0.6) | S1/S2 (80/20) | W-3 (0.05) | 62.5 | 20 | 24.1 | rectangular | 4.2 |
| Example 1-22 | P-17 (64.35) | PAG-1 (35) | N-4 (0.6) | S1/S2 (80/20) | W-1 (0.05) | 75 | 21 | 22.7 | rectangular | 3.6 |
| Example 1-23 | P-18 (64.35) | PAG-1 (35) | N-4 (0.6) | S1/S2 (80/20) | W-3 (0.05) | 62.5 | 22 | 21.9 | rectangular | 4.0 |
| Example 1-24 | P-19 (99.35) | — | N-4 (0.6) | S1/S2 (50/50) | W-3 (0.05) | 50 | 19 | 21.7 | rectangular | 2.0 |
| Example 1-25 | P-20 (99.35) | — | N-4 (0.6) | S1/S2 (50/50) | W-3 (0.05) | 37.5 | 19 | 22.5 | rectangular | 1.3 |
| Example 1-26 | P-21 (99.35) | — | N-4 (0.6) | S1/S2 (50/50) | W-3 (0.05) | 50 | 21 | 22.6 | rectangular | 2.0 |
| Example 1-27 | P-22 (97.95) | — | N-8 (2) | S1/S2 (50/50) | W-3 (0.05) | 50 | 24 | 21.6 | rectangular | 4.2 |
| Example 1-28 | P-22 (97.95) | — | N-6 (2) | S1/S2 (50/50) | W-3 (0.05) | 50 | 24 | 20.4 | rectangular | 3.4 |
| Example 1-29 | P-23 (99.35) | — | N-7 (0.6) | S1/S2 (50/50) | W-3 (0.05) | 50 | 19 | 19.4 | rectangular | 2.5 |
| Example 1-30 | P-24 (99.35) | — | N-8 (0.6) | S1/S2 (50/50) | W-3 (0.05) | 37.5 | 22 | 21.4 | rectangular | 2.1 |
| Example 1-31 | P-25 (99.35) | — | N-3 (0.6) | S1/S2 (50/50) | W-3 (0.05) | 75 | 19 | 22.1 | rectangular | 3.7 |
| Example 1-32 | P-26 (99.35) | — | N-4 (0.6) | S1/S2 (50/50) | W-3 (0.05) | 62.5 | 22 | 21.9 | rectangular | 3.5 |
| Example 1-33 | P-27 (64.35) | PAG-4 (35) | N-3 (0.6) | S1/S2 (80/20) | W-3 (0.05) | 62.5 | 23 | 20.9 | rectangular | 2.9 |
| Example 1-34 | P-28 (99.35) | — | N-10 (0.6) | S1/S2 (50/50) | W-3 (0.05) | 62.5 | 21 | 21.4 | rectangular | 2.9 |
| Example 1-35 | P-29 (98.95) | — | N-10 (1) | S1/S2 (50/50) | W-3 (0.05) | 62.5 | 23 | 20.1 | rectangular | 3.0 |
| Example 1-36 | P-29 (98.95) | — | N-7 (1) | S1/S2 (50/50) | W-3 (0.05) | 62.5 | 24 | 19.9 | rectangular | 3.5 |
| Example 1-37 | P-30 (64.35) | PAG-4 (35) | N-1 (0.6) | S1/S2 (50/50) | W-3 (0.05) | 50 | 23 | 21.4 | rectangular | 2.1 |
| Example 1-38 | P-31 (64.35) | PAG-4 (35) | N-8 (0.6) | S1/S2 (80/20) | W-3 (0.05) | 62.5 | 22 | 21.5 | rectangular | 3.6 |
| Example 1-39 | P-32 (64.35) | PAG-4 (35) | N-3 (0.6) | S1/S2 (80/20) | W-3 (0.05) | 37.5 | 21 | 23.6 | rectangular | 3.6 |
| Example 1-40 | P-33 (64.35) | PAG-4 (35) | N-3 (0.6) | S1/S2 (80/20) | W-3 (0.05) | 62.5 | 23 | 24.1 | rectangular | 1.4 |
| Example 1-41 | P-34 (99.35) | — | N-3 (0.6) | S1/S2 (50/50) | W-3 (0.05) | 37.5 | 22 | 22.1 | rectangular | 2.6 |
| Example 1-42 | P-35 (64.35) | PAG-4 (35) | N-3 (0.6) | S1/S2 (80/20) | W-3 (0.05) | 62.5 | 19 | 22.1 | rectangular | 3.5 |
| Example 1-43 | P-37 (64.35) | PAG-4 (35) | N-3 (0.6) | S1/S2 (80/20) | W-3 (0.05) | 75 | 19 | 23.1 | rectangular | 3.2 |
| Example 1-44 | P-38 (64.35) | PAG-4 (35) | N-3 (0.6) | S1/S2 (80/20) | W-3 (0.05) | 37.5 | 21 | 21.0 | rectangular | 2.0 |
| Example 1-45 | P-39 (64.35) | PAG-4 (35) | N-3 (0.6) | S1/S2 (80/20) | W-3 (0.05) | 37.5 | 23 | 22.1 | rectangular | 3.2 |
| Example 1-46 | P-40 (64.35) | PAG-4 (35) | N-3 (0.6) | S1/S2 (80/20) | W-3 (0.05) | 62.5 | 23 | 29.6 | rectangular | 3.2 |
| Example 1-47 | P-3/RP-2 (32.00/32.35) | PAG-4 (35) | N-3 (0.6) | S1/S2 (80/20) | W-3 (0.05) | 50 | 24 | 23.1 | rectangular | 3.9 |
| Example 1-48 | P-3/RP-4 (44.35/20) | PAG-4 (35) | N-3 (0.6) | S1/S2 (80/20) | W-3 (0.05) | 50 | 22 | 24.1 | rectangular | 4.1 |
| Example 1-49 | P-6/RP-1 (32.00/32.35) | PAG-4 (35) | N-3 (0.6) | S1/S2 (80/20) | W-3 (0.05) | 50 | 23 | 26.5 | rectangular | 2.0 |
| Example 1-50 | P-6/RP-3 (44.35/20) | PAG-4 (35) | N-3 (0.6) | S1/S2 (80/20) | W-3 (0.05) | 50 | 24 | 19.5 | rectangular | 2.6 |
| Example 1-51 | P-3 (64.35) | PAG-1/PAG-4 (20/15) | N-3 (0.6) | S1/S2 (80/20) | W-3 (0.05) | 37.5 | 19 | 20.4 | rectangular | 2.7 |
| Example 1-52 | P-6 (64.4) | PAG-4 (35) | N-3 (0.6) | S1/S2 (80/20) | — | 50 | 23 | 20.4 | rectangular | 3.2 |
| Example 1-53 | P-41 (64.4) | PAG-4 (35) | N-3 (0.6) | S1/S2 (80/20) | — | 37.5 | 22 | 19.4 | rectangular | 1.9 |
| Example 1-54 | P-42 (64.4) | PAG-4 (35) | N-3 (0.6) | S1/S2 (80/20) | — | 37.5 | 19 | 19.0 | rectangular | 3.5 |
| Comparative Example 1-1 | R-1 (64.35) | PAG-1 (35) | N-6 (0.6) | S1/S2 (80/20) | W-3 (0.05) | 100 | 15 | 45.2 | reverse tapered | 7.6 |

TABLE 4-continued

| | Acid-Decomposable Compound (mass %) | Photoacid Generator (mass %) | Basic Compound (mass %) | Solvent (mass ratio) | Surfactant (mass %) | Resolution (nm) | EL (%) | Sensitivity (μC/cm²) | Profile | Outgas Performance |
|---|---|---|---|---|---|---|---|---|---|---|
| Comparative Example 1-2 | R-2 (64.35) | PAG-1 (35) | N-6 (0.6) | S1/S2 (80/20) | W-3 (0.05) | 87.5 | 16 | 30.1 | tapered | 5.7 |
| Comparative Example 1-3 | R-3 (64.35) | PAG-1 (35) | N-6 (0.6) | S1/S2 (80/20) | W-3 (0.05) | 87.5 | 16 | 40.2 | slightly tapered | 6.9 |
| Comparative Example 1-4 | R-4 (99.35) | — | N-6 (0.6) | S1/S2 (50/50) | W-3 (0.05) | 100 | 16 | 46.9 | reverse tapered | 7.2 |
| Comparative Example 1-5 | R-5 (64.4) | PAG-1 (35) | N-6 (0.6) | S1/S2 (80/20) | — | 90.5 | 16 | 30.5 | slightly tapered | 6.3 |
| Example 1-55 | P-43 (64.35) | PAG-2 (35) | N-10 (0.6) | S1/S2 (50/50) | W-3 (0.05) | 50 | 22 | 21.4 | rectangular | 3.7 |
| Example 1-56 | P-44 (64.35) | PAG-1 (35) | N-3 (0.6) | S1/S2 (50/50) | W-3 (0.05) | 42 | 19 | 22.1 | rectangular | 3.3 |
| Example 1-57 | P-44 (64.35) | PAG-8 (35) | N-11 (0.6) | S1/S2 (50/50) | W-3 (0.05) | 39 | 22 | 21.9 | rectangular | 3.4 |
| Example 1-58 | P-45 (64.35) | PAG-1 (35) | N-3 (0.6) | S1/S2 (80/20) | W-3 (0.05) | 45 | 23 | 20.9 | rectangular | 3.1 |
| Example 1-59 | P-45 (64.35) | PAG-5 (35) | N-11 (0.6) | S1/S2 (50/50) | W-3 (0.05) | 42 | 21 | 21.4 | rectangular | 3.0 |
| Example 1-60 | P-46 (64.35) | PAG-1 (35) | N-6 (1) | S1/S2 (50/50) | W-3 (0.05) | 37 | 23 | 20.1 | rectangular | 1.8 |
| Example 1-61 | P-46 (64.35) | PAG-4 (35) | N-11 (0.6) | S1/S2 (50/50) | W-3 (0.05) | 36 | 24 | 19.9 | rectangular | 1.9 |
| Example 1-62 | P-47 (64.35) | PAG-1 (35) | N-6 (0.6) | S1/S2 (50/50) | W-3 (0.05) | 42 | 23 | 21.4 | rectangular | 2.2 |
| Example 1-63 | P-47 (64.35) | PAG-4 (35) | N-11 (0.6) | S1/S2 (80/20) | W-3 (0.05) | 40 | 22 | 21.5 | rectangular | 2.1 |
| Example 1-64 | P-48 (64.35) | PAG-1 (35) | N-8 (0.6) | S1/S2 (80/20) | W-3 (0.05) | 50 | 17 | 23.6 | rectangular | 3.0 |
| Example 1-65 | P-49 (99.35) | — | N-6 (0.6) | S1/S2 (80/20) | W-3 (0.05) | 44 | 21 | 19.5 | rectangular | 1.2 |
| Example 1-66 | P-50 (99.35) | — | N-11 (0.6) | S1/S2 (80/20) | W-3 (0.05) | 37 | 25 | 18.5 | rectangular | 1.9 |
| Example 1-67 | P-51 (99.35) | — | N-6 (0.6) | S1/S2 (80/20) | W-3 (0.05) | 36 | 23 | 22.2 | rectangular | 2.0 |
| Example 1-68 | P-52 (99.35) | — | N-11 (0.6) | S1/S2 (80/20) | W-3 (0.05) | 42 | 21 | 22.5 | rectangular | 2.2 |

TABLE 5

| | Acid-Decomposable Compound (mass %) | Photoacid Generator (mass %) | Basic Compound (mass %) | Solvent (mass ratio) | Surfactant (mass %) | Resolution (nm) | EL (%) | Sensitivity (mJ/cm²) | Profile | Outgas Performance |
|---|---|---|---|---|---|---|---|---|---|---|
| Example 2-1 | P-1 (62.95) | PAG-1 (35) | N-1 (2) | S1/S2 (80/20) | W-3 (0.05) | 28 | 20 | 20.3 | rectangular | 4.0 |
| Example 2-2 | P-2 (62.95) | PAG-1 (35) | N-9 (2) | S1/S2 (80/20) | W-3 (0.05) | 28 | 23 | 19.6 | rectangular | 3.5 |
| Example 2-3 | P-2 (62.95) | PAG-7 (35) | N-6 (2) | S1/S2 (80/20) | W-3 (0.05) | 26 | 22 | 20.2 | rectangular | 1.9 |
| Example 2-4 | P-3 (62.95) | PAG-4 (35) | N-8 (2) | S1/S2 (80/20) | W-3 (0.05) | 26 | 23 | 12.8 | rectangular | 1.2 |
| Example 2-5 | P-3 (62.95) | PAG-6 (35) | N-6 (2) | S1/S2 (80/20) | W-3 (0.05) | 28 | 21 | 13.5 | rectangular | 1.9 |
| Example 2-6 | P-4 (62.95) | PAG-2 (35) | N-1 (2) | S1/S2 (80/20) | W-3 (0.05) | 24 | 19 | 11.2 | rectangular | 2.3 |
| Example 2-7 | P-5 (62.95) | PAG-6 (35) | N-3 (2) | S1/S2 (80/20) | W-2 (0.05) | 22 | 21 | 12.3 | rectangular | 2.1 |
| Example 2-8 | P-6 (62.95) | PAG-2 (35) | N-8 (2) | S1/S2 (80/20) | W-3 (0.05) | 22 | 23 | 13.5 | rectangular | 2.1 |
| Example 2-9 | P-6 (62.95) | PAG-6 (35) | N-3 (2) | S1/S2 (80/20) | W-3 (0.05) | 22 | 20 | 12.8 | rectangular | 1.2 |
| Example 2-10 | P-7 (60.95) | PAG-4 (35) | N-10 (4) | S1/S2 (80/20) | W-3 (0.05) | 22 | 21 | 18.6 | rectangular | 2.9 |
| Example 2-11 | P-7 (62.95) | PAG-8 (35) | N-8 (2) | S1/S2 (80/20) | W-3 (0.05) | 22 | 22 | 13.2 | rectangular | 1.4 |
| Example 2-12 | P-7 (62.95) | PAG-6 (35) | N-3 (2) | S1/S2 (80/20) | W-3 (0.05) | 22 | 20 | 11.2 | rectangular | 2.4 |
| Example 2-13 | P-8 (63.95) | PAG-2 (35) | N-2 (1) | S1/S2 (80/20) | W-3 (0.05) | 24 | 19 | 12.6 | rectangular | 2.1 |
| Example 2-14 | P-9 (63.95) | PAG-1 (35) | N-3 (1) | S1/S2 (80/20) | W-2 (0.05) | 26 | 22 | 8.2 | rectangular | 3.6 |
| Example 2-15 | P-10 (62.95) | PAG-2 (35) | N-4 (2) | S1/S2 (80/20) | W-3 (0.05) | 30 | 19 | 12.6 | rectangular | 3.7 |
| Example 2-16 | P-11 (62.95) | PAG-5 (35) | N-3 (2) | S1/S2 (80/20) | W-3 (0.05) | 24 | 22 | 13.2 | rectangular | 1.4 |
| Example 2-17 | P-12 (62.95) | PAG-6 (35) | N-3 (2) | S1/S2 (80/20) | W-1 (0.05) | 22 | 23 | 14.0 | rectangular | 2.0 |
| Example 2-18 | P-13 (62.95) | PAG-7 (35) | N-3 (2) | S1/S2 (80/20) | W-3 (0.05) | 28 | 21 | 12.9 | rectangular | 4.0 |
| Example 2-19 | P-14 (62.95) | PAG-3 (35) | N-3 (2) | S1/S2 (80/20) | W-3 (0.05) | 26 | 19 | 11.9 | rectangular | 3.7 |
| Example 2-20 | P-15 (62.95) | PAG-4 (35) | N-3 (2) | S1/S2 (80/20) | W-2 (0.05) | 22 | 23 | 12.6 | rectangular | 2.2 |
| Example 2-21 | P-16 (62.95) | PAG-5 (35) | N-3 (2) | S1/S2 (80/20) | W-3 (0.05) | 26 | 18 | 11.5 | rectangular | 3.5 |
| Example 2-22 | P-17 (62.95) | PAG-6 (35) | N-4 (2) | S1/S2 (80/20) | W-1 (0.05) | 30 | 19 | 13.2 | rectangular | 4.0 |
| Example 2-23 | P-18 (62.95) | PAG-4 (35) | N-4 (2) | S1/S2 (80/20) | W-3 (0.05) | 28 | 23 | 13.6 | rectangular | 3.5 |
| Example 2-24 | P-19 (97.95) | — | N-5 (2) | S1/S2 (50/50) | W-3 (0.05) | 24 | 22 | 12.7 | rectangular | 3.6 |
| Example 2-25 | P-20 (97.95) | — | N-6 (2) | S1/S2 (50/50) | W-3 (0.05) | 22 | 21 | 12.6 | rectangular | 2.2 |
| Example 2-26 | P-21 (97.95) | — | N-6 (2) | S1/S2 (50/50) | W-3 (0.05) | 24 | 23 | 14.2 | rectangular | 2.5 |
| Example 2-27 | P-22 (97.95) | — | N-8 (2) | S1/S2 (50/50) | W-3 (0.05) | 28 | 22 | 11.0 | rectangular | 3.2 |
| Example 2-28 | P-22 (97.95) | — | N-6 (2) | S1/S2 (50/50) | W-3 (0.05) | 28 | 19 | 10.9 | rectangular | 3.8 |
| Example 2-29 | P-23 (97.95) | — | N-6 (2) | S1/S2 (50/50) | W-3 (0.05) | 26 | 19 | 15.4 | rectangular | 3.6 |
| Example 2-30 | P-24 (97.95) | — | N-6 (2) | S1/S2 (50/50) | W-3 (0.05) | 24 | 24 | 12.3 | rectangular | 2.1 |
| Example 2-31 | P-25 (97.95) | — | N-6 (2) | S1/S2 (50/50) | W-3 (0.05) | 30 | 19 | 12.3 | rectangular | 3.2 |
| Example 2-32 | P-26 (97.95) | — | N-6 (2) | S1/S2 (50/50) | W-3 (0.05) | 28 | 19 | 14.0 | rectangular | 3.5 |
| Example 2-33 | P-27 (62.95) | PAG-4 (35) | N-6 (2) | S1/S2 (80/20) | W-3 (0.05) | 28 | 19 | 13.1 | rectangular | 3.9 |
| Example 2-34 | P-28 (97.95) | — | N-6 (2) | S1/S2 (50/50) | W-3 (0.05) | 28 | 21 | 12.1 | rectangular | 3.9 |
| Example 2-35 | P-29 (98.95) | — | N-10 (1) | S1/S2 (50/50) | W-3 (0.05) | 28 | 23 | 11.4 | rectangular | 3.8 |
| Example 2-36 | P-29 (98.95) | — | N-7 (1) | S1/S2 (50/50) | W-3 (0.05) | 28 | 23 | 10.9 | rectangular | 4.1 |
| Example 2-37 | P-30 (62.95) | PAG-4 (35) | N-6 (2) | S1/S2 (50/50) | W-3 (0.05) | 26 | 21 | 12.0 | rectangular | 2.6 |
| Example 2-38 | P-31 (62.95) | PAG-4 (35) | N-6 (2) | S1/S2 (80/20) | W-3 (0.05) | 28 | 22 | 13.2 | rectangular | 3.9 |
| Example 2-39 | P-32 (62.95) | PAG-4 (35) | N-6 (2) | S1/S2 (80/20) | W-3 (0.05) | 24 | 21 | 14.0 | rectangular | 4.2 |
| Example 2-40 | P-33 (62.95) | PAG-4 (35) | N-6 (2) | S1/S2 (80/20) | W-3 (0.05) | 28 | 19 | 12.5 | rectangular | 2.4 |
| Example 2-41 | P-34 (97.95) | — | N-6 (2) | S1/S2 (50/50) | W-3 (0.05) | 22 | 19 | 13.6 | rectangular | 3.5 |
| Example 2-42 | P-35 (62.95) | PAG-5 (35) | N-6 (2) | S1/S2 (80/20) | W-3 (0.05) | 28 | 20 | 12.7 | rectangular | 4.1 |

TABLE 5-continued

| | Acid-Decomposable Compound (mass %) | Photoacid Generator (mass %) | Basic Compound (mass %) | Solvent (mass ratio) | Surfactant (mass %) | Resolution (nm) | EL (%) | Sensitivity (mJ/cm$^2$) | Profile | Outgas Performance |
|---|---|---|---|---|---|---|---|---|---|---|
| Example 2-43 | P-36 (62.95) | PAG-3 (35) | N-6 (2) | S1/S2 (80/20) | W-3 (0.05) | 24 | 20 | 14.3 | rectangular | 1.7 |
| Example 2-44 | P-38 (64.35) | PAG-4 (35) | N-3 (0.6) | S1/S2 (80/20) | W-3 (0.05) | 22 | 21 | 13.2 | rectangular | 2.5 |
| Example 2-45 | P-39 (64.35) | PAG-4 (35) | N-3 (0.6) | S1/S2 (80/20) | W-3 (0.05) | 22 | 23 | 12.3 | rectangular | 3.6 |
| Example 2-46 | P-40 (64.35) | PAG-4 (35) | N-3 (0.6) | S1/S2 (80/20) | W-3 (0.05) | 28 | 24 | 18.2 | rectangular | 4.1 |
| Example 2-47 | P-3/RP-2 (32.00/32.35) | PAG-4 (35) | N-3 (0.6) | S1/S2 (80/20) | W-3 (0.05) | 24 | 22 | 14.2 | rectangular | 3.5 |
| Example 2-48 | P-3/RP-4 (44.35/20) | PAG-4 (35) | N-3 (0.6) | S1/S2 (80/20) | W-3 (0.05) | 26 | 24 | 13.5 | rectangular | 3.6 |
| Example 2-49 | P-6/RP-1 (32.00/32.35) | PAG-4 (35) | N-3 (0.6) | S1/S2 (80/20) | W-3 (0.05) | 26 | 23 | 17.0 | rectangular | 2.5 |
| Example 2-50 | P-6/RP-3 (44.35/20) | PAG-4 (35) | N-3 (0.6) | S1/S2 (80/20) | W-3 (0.05) | 24 | 19 | 11.2 | rectangular | 2.1 |
| Example 2-51 | P-3 (64.35) | PAG-1/PAG-4 (20/15) | N-3 (0.6) | S1/S2 (80/20) | W-3 (0.05) | 22 | 18 | 11.8 | rectangular | 2.2 |
| Example 2-52 | P-6 (64.4) | PAG-4 (35) | N-3 (0.6) | S1/S2 (80/20) | — | 28 | 21 | 12.3 | rectangular | 3.4 |
| Example 2-53 | P-41 (64.4) | PAG-4 (35) | N-3 (0.6) | S1/S2 (80/20) | — | 22 | 23 | 11.2 | rectangular | 1.9 |
| Example 2-54 | P-42 (64.4) | PAG-4 (35) | N-3 (0.6) | S1/S2 (80/20) | — | 22 | 22 | 14.2 | rectangular | 3.4 |
| Comparative Example 2-1 | R-1 (62.95) | PAG-1 (35) | N-6 (2) | S1/S2 (80/20) | W-3 (0.05) | 36 | 15 | 35.4 | reverse tapered | 9.6 |
| Comparative Example 2-2 | R-2 (62.95) | PAG-1 (35) | N-6 (2) | S1/S2 (80/20) | W-3 (0.05) | 34 | 14 | 20.1 | tapered | 7.5 |
| Comparative Example 2-3 | R-3 (62.95) | PAG-1 (35) | N-6 (2) | S1/S2 (80/20) | W-3 (0.05) | 34 | 16 | 30.1 | slightly tapered | 8.9 |
| Comparative Example 2-4 | R-4 (97.95) | — | N-6 (2) | S1/S2 (50/50) | W-3 (0.05) | 38 | 17 | 32.5 | reverse tapered | 8.4 |
| Comparative Example 2-5 | R-5 (64.35) | PAG-1 (35) | N-11 (0.6) | S1/S2 (80/20) | W-3 (0.05) | 33 | 15 | 22 | slightly tapered | 5.5 |
| Example 2-55 | P-43 (64.35) | PAG-2 (35) | N-10 (0.6) | S1/S2 (50/50) | W-3 (0.05) | 28 | 21 | 13.8 | rectangular | 3.9 |
| Example 2-56 | P-44 (64.35) | PAG-1 (35) | N-3 (0.6) | S1/82 (50/50) | W-3 (0.05) | 26 | 20 | 12.0 | rectangular | 4.1 |
| Example 2-57 | P-44 (64.35) | PAG-8 (35) | N-11 (0.6) | S1/82 (50/50) | W-3 (0.05) | 28 | 23 | 12.5 | rectangular | 3.5 |
| Example 2-58 | P-45 (64.35) | PAG-1 (35) | N-3 (0.6) | S1/S2 (80/20) | W-3 (0.05) | 23 | 23 | 11.8 | rectangular | 2.9 |
| Example 2-59 | P-45 (64.35) | PAG-5 (35) | N-11 (0.6) | S1/S2 (50/50) | W-3 (0.05) | 22 | 24 | 11.5 | rectangular | 3.0 |
| Example 2-60 | P-46 (63.95) | PAG-1 (35) | N-6 (1) | S1/S2 (50/50) | W-3 (0.05) | 20 | 23 | 12.3 | rectangular | 1.8 |
| Example 2-61 | P-46 (64.35) | PAG-4 (35) | N-11 (0.6) | S1/S2 (50/50) | W-3 (0.05) | 19 | 25 | 12.8 | rectangular | 2.0 |
| Example 2-62 | P-47 (64.35) | PAG-1 (35) | N-6 (0.6) | S1/S2 (50/50) | W-3 (0.05) | 22 | 22 | 13.1 | rectangular | 2.1 |
| Example 2-63 | P-47 (64.35) | PAG-4 (35) | N-11 (0.6) | S1/S2 (80/20) | W-3 (0.05) | 23 | 22 | 12.5 | rectangular | 1.8 |
| Example 2-64 | P-48 (64.35) | PAG-1 (35) | N-8 (0.6) | S1/S2 (80/20) | W-3 (0.05) | 28 | 19 | 13.1 | rectangular | 3.0 |
| Example 2-65 | P-49 (99.35) | — | N-6 (0.6) | S1/S2 (80/20) | W-3 (0.05) | 24 | 22 | 12.5 | rectangular | 2.2 |
| Example 2-66 | P-50 (99.35) | — | N-11 (0.6) | S1/S2 (80/20) | W-3 (0.05) | 18 | 24 | 11.8 | rectangular | 1.8 |
| Example 2-67 | P-51 (99.35) | — | N-6 (0.6) | S1/S2 (80/20) | W-3 (0.05) | 19 | 22 | 10.8 | rectangular | 2.2 |
| Example 2-68 | P-52 (99.35) | — | N-11 (0.6) | S1/S2 (80/20) | W-3 (0.05) | 21 | 20 | 11.8 | rectangular | 2.4 |

As apparent from the results shown in the Tables above, the actinic ray-sensitive or radiation-sensitive resin composition of the present invention satisfies all of high resolution, high sensitivity, good pattern profile and good exposure latitude at the same time in the EB exposure, as compared with Comparative Examples 1-1 to 1-5 using Resins R-1 to R-5 not having a group where the hydrogen atom in a phenolic hydroxyl group is substituted for by a group represented by formula (1).

Furthermore, it is apparent that the actinic ray-sensitive or radiation-sensitive resin composition of the present invention satisfies all of high resolution, high sensitivity, good pattern profile and good exposure latitude at the same time also in the EUV exposure, as compared with Comparative Examples 2-1 to 2-5 using Resins R-1 to R-5 not having a group where the hydrogen atom in a phenolic hydroxyl group is substituted for by a group represented by formula (1).

INDUSTRIAL APPLICABILITY

According to the present invention, an actinic ray-sensitive or radiation-sensitive composition satisfying all of high resolution (e.g., high resolving power), high sensitivity, good pattern profile and good exposure latitude (EL) at the same time, an actinic ray-sensitive or radiation-sensitive film using the composition, a pattern forming method, a manufacturing method of an electronic device, an electronic device and a resin, can be provided.

This application is based on a Japanese patent application filed on Nov. 30, 2011 (Japanese Patent Application No. 2011-263004) and a Japanese patent application filed on Nov. 29, 2012 (Japanese Patent Application No. 2012-261119), and the contents thereof are incorporated herein by reference.

The invention claimed is:

1. An actinic ray-sensitive or radiation-sensitive composition comprising (P) a compound having a phenolic hydroxyl group and a group formed by substituting for the hydrogen atom in a phenolic hydroxyl group by a group represented by the following formula (1):

(1)

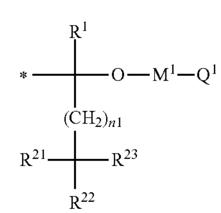

wherein $R^1$ represents a hydrogen atom or an alkyl group;

each of $R^{21}$ to $R^{23}$ independently represents a hydrogen atom, an alkyl group, a cycloalkyl group, an aryl group, an aralkyl group or a heterocyclic group, and each of at least two members of $R^{21}$ to $R^{23}$ independently represents an alkyl group, a cycloalkyl group, an aryl group, an aralkyl group or a heterocyclic group;

at least two of $R^{21}$ to $R^{23}$ may combine with each other to form a ring, provided that it is not allowed to form a ring by combining at least one of $R^{21}$ to $R^{23}$ with $M^1$ or $Q^1$;

n1 represents an integer of 1 or more;

$M^1$ represents a single bond or a divalent linking group;

$Q^1$ represents an alkyl group, a cycloalkyl group, an aryl group or a heterocyclic group;

when $M^1$ is a divalent linking group, $Q^1$ may combine with $M^1$ through a single bond or another linking group to form a ring; and

* represents a bond to the oxygen atom in the phenolic hydroxyl group.

2. The actinic ray-sensitive or radiation-sensitive composition according to claim 1, wherein the compound (P) is a resin having a repeating unit represented by the following formula (2):

(2)

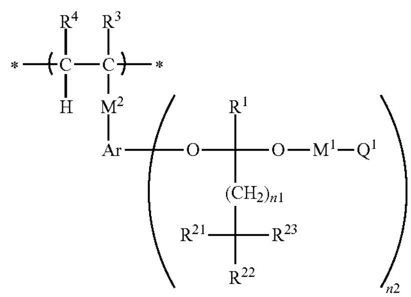

wherein $R^1$, $R^{21}$, $R^{22}$, $R^{23}$, $M^1$, $Q^1$ and n1 have the same meanings as $R^1$, $R^{21}$, $R^{22}$, $R^{23}$, $M^1$, $Q^1$ and n1 in formula (1), respectively, and each of at least two members of $R^{21}$ to $R^{23}$ independently represents an alkyl group, a cycloalkyl group, an aryl group, an aralkyl group or a heterocyclic group;

at least two of $R^{21}$ to $R^{23}$ may combine with each other to form a ring, provided that it is not allowed to form a ring by combining at least one of $R^{21}$ to $R^{23}$ with $M^1$ or $Q^1$;

when $M^1$ is a divalent linking group, $Q^1$ may combine with $M^1$ through a single bond or another linking group to form a ring;

$R^3$ represents a hydrogen atom or an alkyl group;

$R^4$ represents a hydrogen atom or an alkyl group, $R^4$ and $M^2$ or Ar may combine with each other to form a ring, and in this case, $R^4$ represents an alkylene group;

$M^2$ represents a single bond or a divalent linking group and in the case of combining with $R^4$ to form a ring, represents a trivalent linking group;

Ar represents a (n2+1)-valent aromatic ring group and in the case of combining with $R^4$ to form a ring, represents a (n2+2)-valent aromatic ring group;

n2 represents an integer of 1 to 5; and when n2 is an integer of 2 or more, each of n2 groups in the parenthesis may be the same as or different from every other group.

3. The actinic ray-sensitive or radiation-sensitive composition according to claim 1, wherein in formula (1), each of $R^{21}$ to $R^{23}$ independently an alkyl group.

4. The actinic ray-sensitive or radiation-sensitive composition according to claim 1, wherein in formula (1), at least two of $R^{21}$ to $R^{23}$ combine with each other to form a ring or at least one of $R^{21}$ to $R^{23}$ is a cycloalkyl group.

5. The actinic ray-sensitive or radiation-sensitive composition according to claim 1, wherein in formula (1), $R^1$ is a hydrogen atom.

6. The actinic ray-sensitive or radiation-sensitive composition according to claim 1, wherein in formula (1), n1 is 1.

7. The actinic ray-sensitive or radiation-sensitive composition according to claim 1, wherein in formula (1), the group represented by $-M^1-Q^1$ is an unsubstituted alkyl group, a cycloalkyl group-substituted alkyl group, a cycloalkyl group, an aralkyl group, an aryloxyalkyl group or a heterocyclic group.

8. The actinic ray-sensitive or radiation-sensitive composition according to claim 1, wherein the compound (P) is a resin in which the first-recited phenolic hydroxyl group in claim 1 is included in a repeating unit represented by the following formula (5) or (6):

(5)

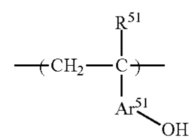

(6)

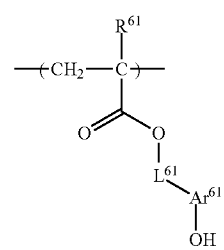

wherein each of $R^{51}$ and $R^{61}$ independently represents a hydrogen atom or a methyl group, each of $Ar^{51}$ and $Ar^{61}$ independently represents an arylene group, and $L^{61}$ represents a single bond or an alkylene group.

9. The actinic ray-sensitive or radiation-sensitive composition according to claim 1, wherein the compound (P) further contains a non-decomposable repeating unit represented by the following formula (3):

(3)

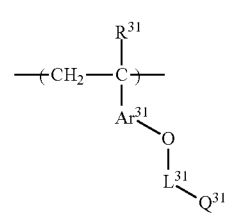

wherein $R^{31}$ represents a hydrogen atom or a methyl group, $Ar^{31}$ represents an arylene group, $L^{31}$ represents a single bond or a divalent linking group, and $Q^{31}$ represents a cycloalkyl group or an aryl group.

10. The actinic ray-sensitive or radiation-sensitive composition according to claim 1, wherein the compound (P) is a resin further containing a repeating unit represented by the following formula (4):

(4)

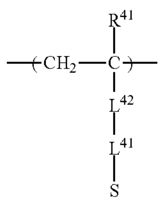

wherein $R^{41}$ represents a hydrogen atom or a methyl group, $L^{41}$ represents a single bond or a divalent linking group, $L^{42}$ represents a divalent linking group, and S represents a structural moiety capable of decomposing upon irradiation with an actinic ray or radiation to generate an acid on the side chain.

11. A resist film formed using the actinic ray-sensitive or radiation-sensitive composition according to claim 1.

12. A pattern forming method comprising steps of exposing and developing the resist film according to claim 11.

13. A resin having a repeating unit represented by the following formula (2A) and a repeating unit represented by the following formula (5A):

(5A)

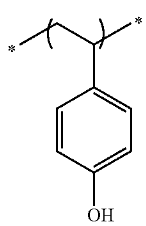

(2A)

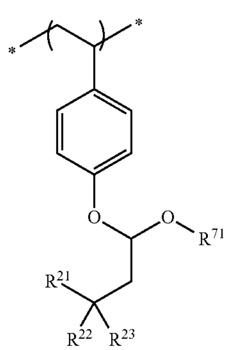

wherein in formula (2A), each of $R^{21}$ to $R^{23}$ independently represents a hydrogen atom, an alkyl group, a cycloalkyl group, an aryl group, an aralkyl group or a heterocyclic group, each of at least two members of $R^{21}$ to $R^{23}$ independently represents an alkyl group, a cycloalkyl group, an aryl group, an aralkyl group or a heterocyclic group, at least two of $R^{21}$ to $R^{23}$ may combine with each other to form a ring, provided that it is not allowed to form a ring by combining at least one of $R^{21}$ to $R^{23}$ with $R^{71}$, and $R^{71}$ represents an unsubstituted alkyl group, a cycloalkyl group-substituted alkyl group, a cycloalkyl group, an aralkyl group, an aryloxyalkyl group or a heterocyclic group.

14. The actinic ray-sensitive or radiation-sensitive composition according to claim 1, wherein the carbon number of the group represented by —$C(R^{21})(R^{22})(R^{23})$ is 7 or more.

15. The actinic ray-sensitive or radiation-sensitive composition according to claim 1, wherein the actinic ray-sensitive or radiation-sensitive resin composition contains (D) a low molecular compound having a nitrogen atom and having a group capable of leaving by the action of an acid.

16. The actinic ray-sensitive or radiation-sensitive composition according to claim 1, wherein the actinic ray-sensitive or radiation-sensitive resin composition contains an ionic compound represented by the following formula (2):

(2)

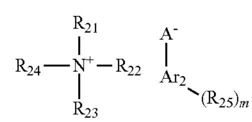

wherein each of $R_{21}$, $R_{22}$, $R_{23}$ and $R_{24}$ independently represents a primary or secondary alkyl group or an aryl group;

$A^-$ represents $COO^-$ or $O^-$;

$Ar_2$ represents an (m+1)-valent aromatic ring group not having a substituent other than $A^-$ and $R_{25}$;

$R_{25}$ represents an alkyl group, a cycloalkyl group, a thioalkyl group, an aryl group, a halogen atom, a cyano group, a nitro group, an alkoxy group, a thioalkoxy group, an alkoxycarbonyl group or an alkylaminocarbonyl group, and when m is 2 or more, each $R_{25}$ may be the same as or different from every other $R_{25}$, and the plurality of $R_{25}$s may combine with each other to form a ring; and m represents an integer of 0 or more.

* * * * *